US011152418B2

(12) United States Patent
Kameshima et al.

(10) Patent No.: US 11,152,418 B2
(45) Date of Patent: Oct. 19, 2021

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventors: Takatoshi Kameshima, Kanagawa (JP); Hideto Hashiguchi, Kanagawa (JP); Ikue Mitsuhashi, Kanagawa (JP); Hiroshi Horikoshi, Tokyo (JP); Reijiroh Shohji, Tokyo (JP); Minoru Ishida, Tokyo (JP); Tadashi Iijima, Kanagawa (JP); Masaki Haneda, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 53 days.

(21) Appl. No.: 16/498,739

(22) PCT Filed: Mar. 23, 2018

(86) PCT No.: PCT/JP2018/011570
§ 371 (c)(1),
(2) Date: Sep. 27, 2019

(87) PCT Pub. No.: WO2018/186197
PCT Pub. Date: Oct. 11, 2018

(65) Prior Publication Data

US 2021/0104572 A1 Apr. 8, 2021

(30) Foreign Application Priority Data

Apr. 4, 2017 (JP) ............................ JP2017-074809
Aug. 17, 2017 (JP) ............................ JP2017-157637

(51) Int. Cl.
*H01L 27/146* (2006.01)
*H01L 23/48* (2006.01)

(52) U.S. Cl.
CPC ...... *H01L 27/14636* (2013.01); *H01L 23/481* (2013.01); *H01L 27/14634* (2013.01)

(58) Field of Classification Search
CPC ............. H01L 27/14636; H01L 23/481; H01L 27/14634
See application file for complete search history.

(56) References Cited

U.S. PATENT DOCUMENTS 7,164,113 B2 * 1/2007 Inokuma .............. H04N 5/2253 250/208.1
9,666,626 B2 * 5/2017 Kishi ................ H01L 27/14638
(Continued)

FOREIGN PATENT DOCUMENTS

| | | |
|---|---|---|
| JP | 2014-099582 | 5/2014 |
| JP | 2015-135938 | 7/2015 |
| JP | 2016-171297 | 9/2016 |

OTHER PUBLICATIONS

International Search Report prepared by the Japan Patent Office dated May 24, 2018, for International Application No. PCT/JP2018/011570.

*Primary Examiner* — Dale E Page
*Assistant Examiner* — Wilner Jean Baptiste
(74) *Attorney, Agent, or Firm* — Sheridan Ross P.C.

(57) ABSTRACT

There is provided a solid-state imaging device including first, second, and third substrates stacked in this order. The first substrate includes a first semiconductor substrate and a first wiring layer. A pixel unit is formed on the first semiconductor substrate. The second substrate includes a second semiconductor substrate and a second wiring layer. The third substrate includes a third semiconductor substrate and a third wiring layer. A first coupling structure couples two of
(Continued)

the first, second, and third substrates to each other includes a via. The via has a structure in which electrically-conductive materials are embedded in one through hole and another through hole, or a structure in which films including electrically-conductive materials are formed on inner walls of the through holes. The one through hole exposes a first wiring line in one of the wiring layers. The other through hole exposes a second wiring line in another wiring layer.

13 Claims, 210 Drawing Sheets

(56) References Cited

U.S. PATENT DOCUMENTS

| | | | |
|---|---|---|---|
| 2015/0270307 | A1 | 9/2015 | Umebayashi et al. |
| 2016/0284753 | A1 | 9/2016 | Komai et al. |
| 2020/0091217 | A1 * | 3/2020 | Horikoshi ............... H01L 24/06 |

* cited by examiner

SOLID-STATE IMAGING DEVICE AND ELECTRONIC APPARATUS

TECHNICAL FIELD

The present disclosure relates to a solid-state imaging device and an electronic apparatus.

BACKGROUND ART

Solid-state imaging devices have been developed each of which has a structure in which a pixel chip provided with a pixel unit, a logic chip mounted with a logic circuit, and the like are stacked. The logic circuit executes various kinds of signal processing related to the operation of the solid-state imaging device. For example, PTL 1 discloses a three-layer stacked solid-state imaging device in which a pixel chip, a logic chip, and a memory chip mounted with a memory circuit are stacked. The memory circuit holds a pixel signal acquired by a pixel unit of the pixel chip.

Note that, when describing the structure of a solid-state imaging device, this specification also refers, as "substrates," to components each including, in combination, a semiconductor substrate having a pixel chip, a logic chip, or a memory chip formed thereon, and a multi-layered wiring layer formed on the semiconductor substrate. The "substrates" are then referred to as "first substrate." "second substrate," "third substrate." . . . in order rom the upper side (side from which observation light comes) to the lower side of the stack structure to distinguish the substrates from each other. Note that the stacked solid-state imaging device is manufactured by stacking the respective substrates in the wafer state, and then dicing the stacked substrates into a plurality of stacked solid-state imaging devices (i.e., stacked solid-state imaging device chips). This specification assumes for the sake of convenience that the "substrates" may mean the wafer state before dicing, or the chip state after dicing.

CITATION LIST

Patent Literature

PTL 1: Japanese Unexamined Patent Application Publication No. 2014-99582

SUMMARY OF THE INVENTION

Problem to be Solved by the Invention

Several methods have been devised of electrically coupling the respective signal lines included in the upper and lower substrates to each other and electrically coupling the respective power supply lines included in the upper and lower substrates to each other in a stacked solid-state imaging device as described in PTL 1. Examples of the methods include a method of coupling signal lines to each other and coupling power supply lines to each other outside chips through a pad, a method of coupling signal lines to each other and coupling power supply lines to each other inside chips with a TSV (Through-Silicon Via), and the like. It is not necessarily the case that variations of the methods of electrically coupling the signal lines included in the substrates to each other and electrically coupling the power supply lines included in the substrates to each other have been examined in detail so far. Detailed examination of such variations may possibly provide an insight into the appropriate structures to obtain a solid-state imaging device that exhibits higher performance.

Accordingly, the present disclosure proposes a novel and improved solid-state imaging device and electronic apparatus that allow performance to be further improved.

Means for Solving the Problem

According to the present disclosure, there is provided a solid-state imaging device including a first substrate, a second substrate, and a third substrate. The first substrate includes a first semiconductor substrate and a first multi-layered wiring layer stacked thereon. A pixel unit having pixels arranged thereon is formed on the first semiconductor substrate. The second substrate includes a second semiconductor substrate and a second multi-layered wiring layer stacked thereon. The third substrate includes a third semiconductor substrate and a third multi-layered wiring layer stacked thereon. A circuit having a predetermined function is formed on the second semiconductor substrate and the third semiconductor substrate. The first substrate, the second substrate, and the third substrate are stacked in this order. The first substrate and the second substrate are bonded together in a manner that the first multi-layered wiring layer and the second multi-layered wiring layer are opposed to each other. A first coupling structure for electrically coupling two of the first substrate, the second substrate, and the third substrate to each other includes a via. The via has a structure in which electrically-conductive materials are embedded in one through hole and another through hole, or a structure in which films including electrically-conductive materials are formed on inner walls of the through holes. The one through hole is provided to expose a first wiring line included in one of the first multi-layered wiring layer, the second multi-layered wiring layer, and the third multi-layered wiring layer. The other through hole is provided to expose a second wiring line included in one of multi-layered wiring layers other than the multi-layered wiring layer that includes the first wiring line, out of the first multi-layered wiring layer, the second multi-layered wiring layer, and the third multi-layered wiring layer.

According to the present disclosure, there is provided an electronic apparatus including a solid-state imaging device that electronically shoots an image of an object to be observed. The solid-state imaging device includes a first substrate, a second substrate, and a third substrate. The first substrate includes a first semiconductor substrate and a first multi-layered wiring layer stacked thereon. A pixel unit having pixels arranged thereon is formed on the first semiconductor substrate. The second substrate includes a second semiconductor substrate and a second multi-layered wiring layer stacked thereon. The third substrate includes a third semiconductor substrate and a third multi-layered wiring layer stacked thereon. A circuit having a predetermined function is formed on the second semiconductor substrate and the third semiconductor substrate. The first substrate, the second substrate, and the third substrate are stacked in this order. The first substrate and the second substrate are bonded together in a manner that the first multi-layered wiring layer and the second multi-layered wiring layer are opposed to each other. A first coupling structure for electrically coupling two of the first substrate, the second substrate, and the third substrate to each other includes a via. The via has a structure in which electrically-conductive materials are embedded in one through hole and another through hole, or a structure in which films including electrically-conductive materials are formed on inner walls of the through holes. The one through hole is provided to expose a first wiring line included in one of the first multi-layered wiring layer, the second multi-layered wiring layer, and the third multi-layered wiring layer. The other through hole is provided to expose a second wiring line included in one of multi-layered wiring layers other than the multi-layered wiring layer that includes the first wiring line, out of the first multi-layered wiring layer, the second multi-layered wiring layer, and the third multi-layered wiring layer.

According to the present disclosure, in the solid-state imaging device configured by stacking three substrates, the first substrate and the second substrate are bonded to each other face-to-face (the detail thereof is described later), and a via (i.e., a twin contact type via between two layers or between three layers described later) is provided which has a structure in which electrically-conductive materials are embedded in one through hole and another through hole, or a structure in which films including electrically-conductive materials are formed on inner walls of the through holes. The one through hole is provided to expose the first wiring line included in one of the first multi-layered wiring layer of the first substrate, the second multi-layered wiring layer of the second substrate, and the third multi-layered wiring layer of the third substrate. The other through hole is provided to expose the second wiring line included in one of multi-layered wiring layers other than the multi-layered wiring layer that includes the first wiring line, out of the first multi-layered wiring layer, the second multi-layered wiring layer, and the third multi-layered wiring layer. According to this configuration, various coupling structures are provided, as a second coupling structure for electrically coupling the respective signal lines provided in the second substrate and the third substrate to each other and the respective power supply lines provided in the second substrate and the third substrate to each other, and/or a third coupling structure for electrically coupling the respective signal lines provided in the first substrate and the third substrate to each other and the respective power supply lines provided in the first substrate and the third substrate to each other. This makes it possible to achieve a wide variety of variations of the coupling structures. Hence, it is possible to achieve a superior solid-state imaging device that allows for further improvement of performance.

Effects of the Invention

As described above, according to the present disclosure, it is possible to further improve the performance of the solid-state imaging device. Note that the above-described effects are not necessarily limitative. In addition to or in place of the above effects, there may be achieved any of the effects described in the present specification or other effects that may be grasped from the present specification

BRIEF DESCRIPTION OF THE DRAWINGS

FIG. 18D is a vertical cross-sectional view of a schematic configuration of the solid-state imaging device according to the thirteenth configuration example of the present embodiment.

FIG. 18E is a vertical cross-sectional view of a schematic configuration of the solid-state imaging device according to the thirteenth configuration example of the present embodiment.

FIG. 18F is a vertical cross-sectional view of a schematic configuration of the solid-state imaging device according to the thirteenth configuration example of the present embodiment.

FIG. 18G is a vertical cross-sectional view of a schematic configuration of the solid-state imaging device according to the thirteenth configuration example of the present embodiment.

FIG. 19A is a vertical cross-sectional view of a schematic configuration of a solid-state imaging device according to a fourteenth configuration example of the present embodiment.

FIG. 19B is a vertical cross-sectional view of a schematic configuration of the solid-state imaging device according to the fourteenth configuration example of the present embodiment.

FIG. 19C is a vertical cross-sectional view of a schematic configuration of the solid-state imaging device according to the fourteenth configuration example of the present embodiment.

FIG. 19D is a vertical cross-sectional view of a schematic configuration of the solid-state imaging device according to the fourteenth configuration example of the present embodiment.

FIG. 19E is a vertical cross-sectional view of a schematic configuration of the solid-state imaging device according to the fourteenth configuration example of the present embodiment.

FIG. 19F is a vertical cross-sectional view of a schematic configuration of the solid-state imaging device according to the fourteenth configuration example of the present embodiment.

FIG. 19G is a vertical cross-sectional view of a schematic configuration of the solid-state imaging device according to the fourteenth configuration example of the present embodiment.

FIG. 19H is a vertical cross-sectional view of a schematic configuration of the solid-state imaging device according to the fourteenth configuration example of the present embodiment.

Figure 19A:
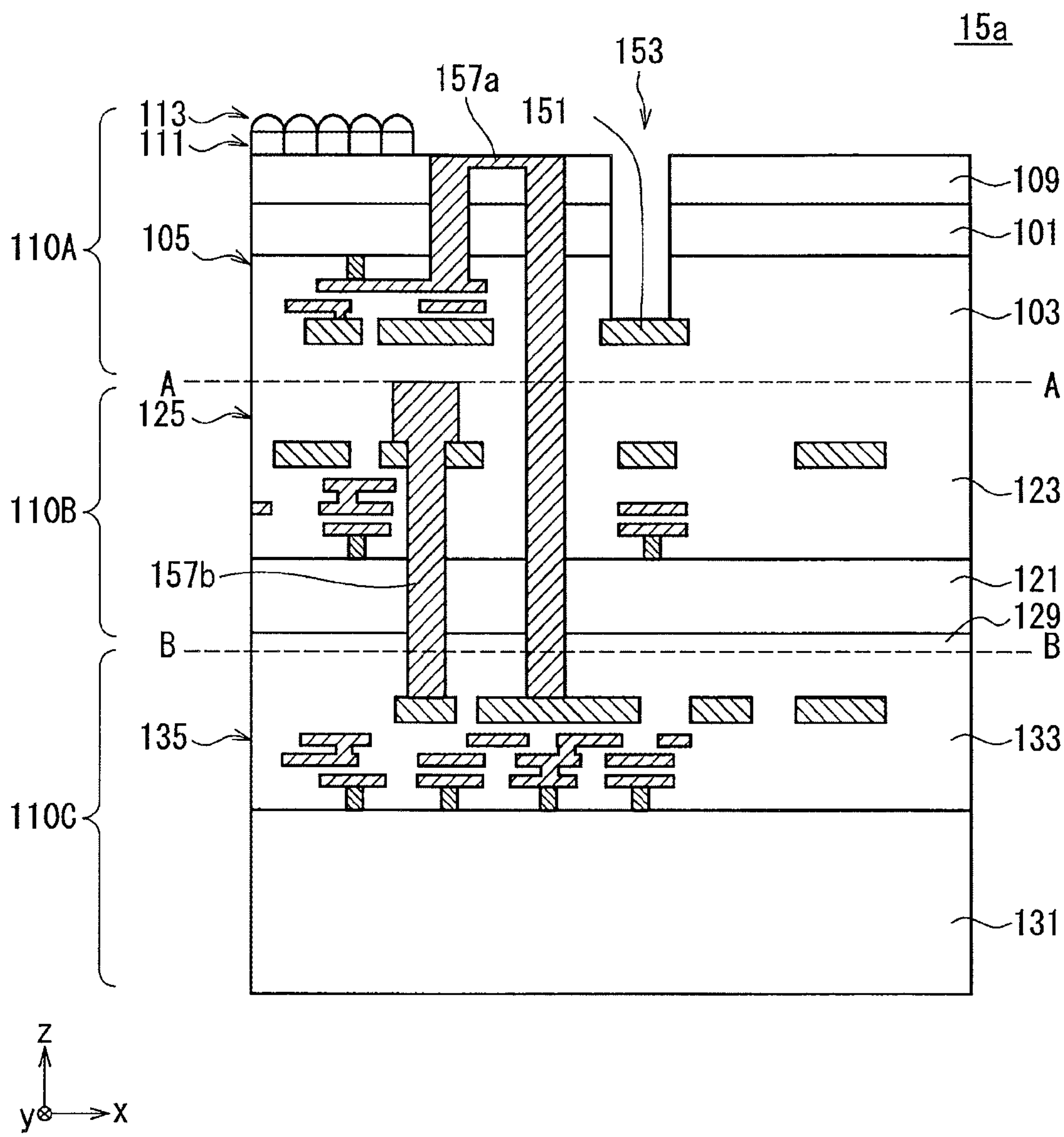
Figure 19B:
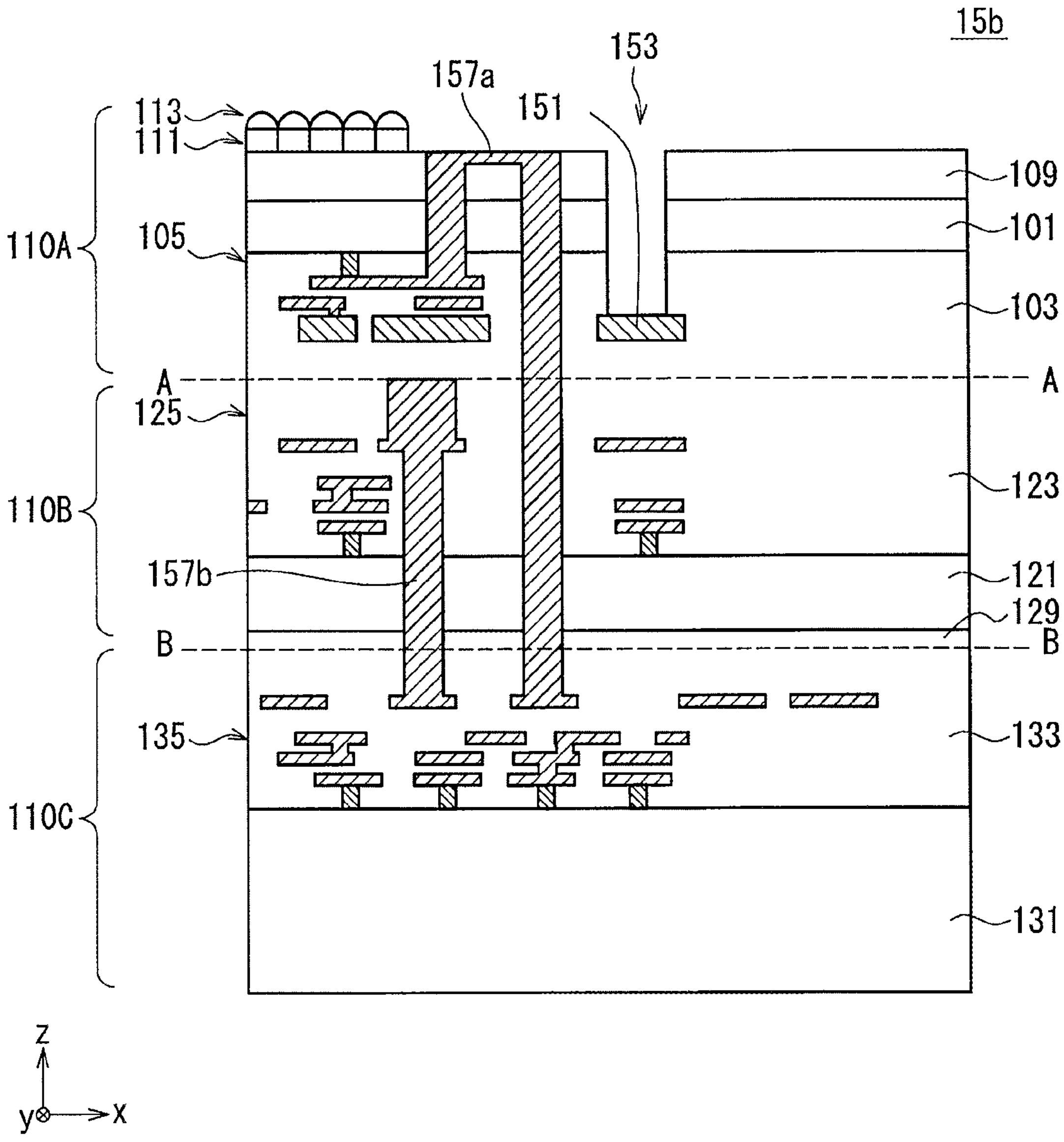
Figure 19C:
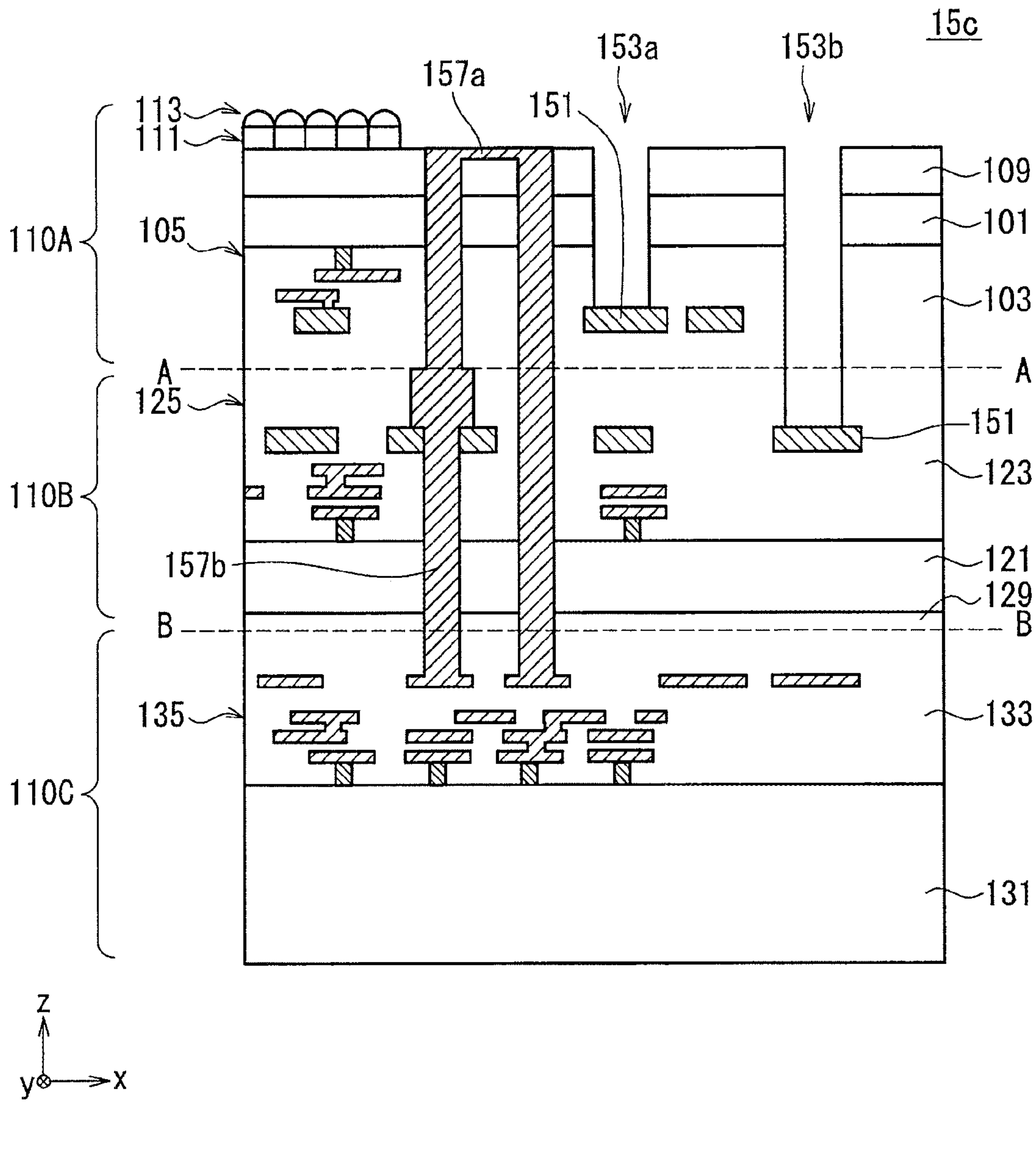
Figure 19D:
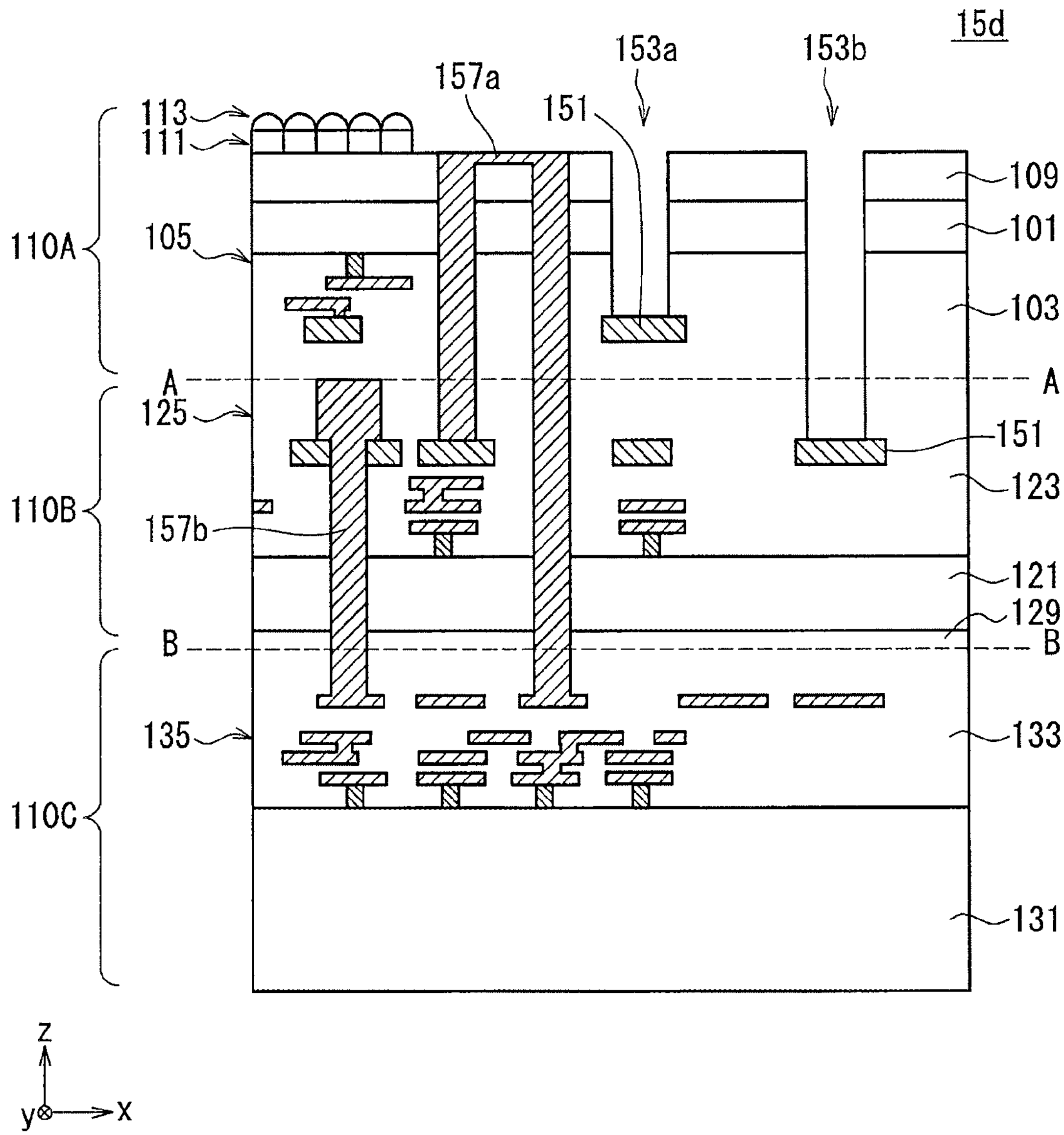
Figure 19E:
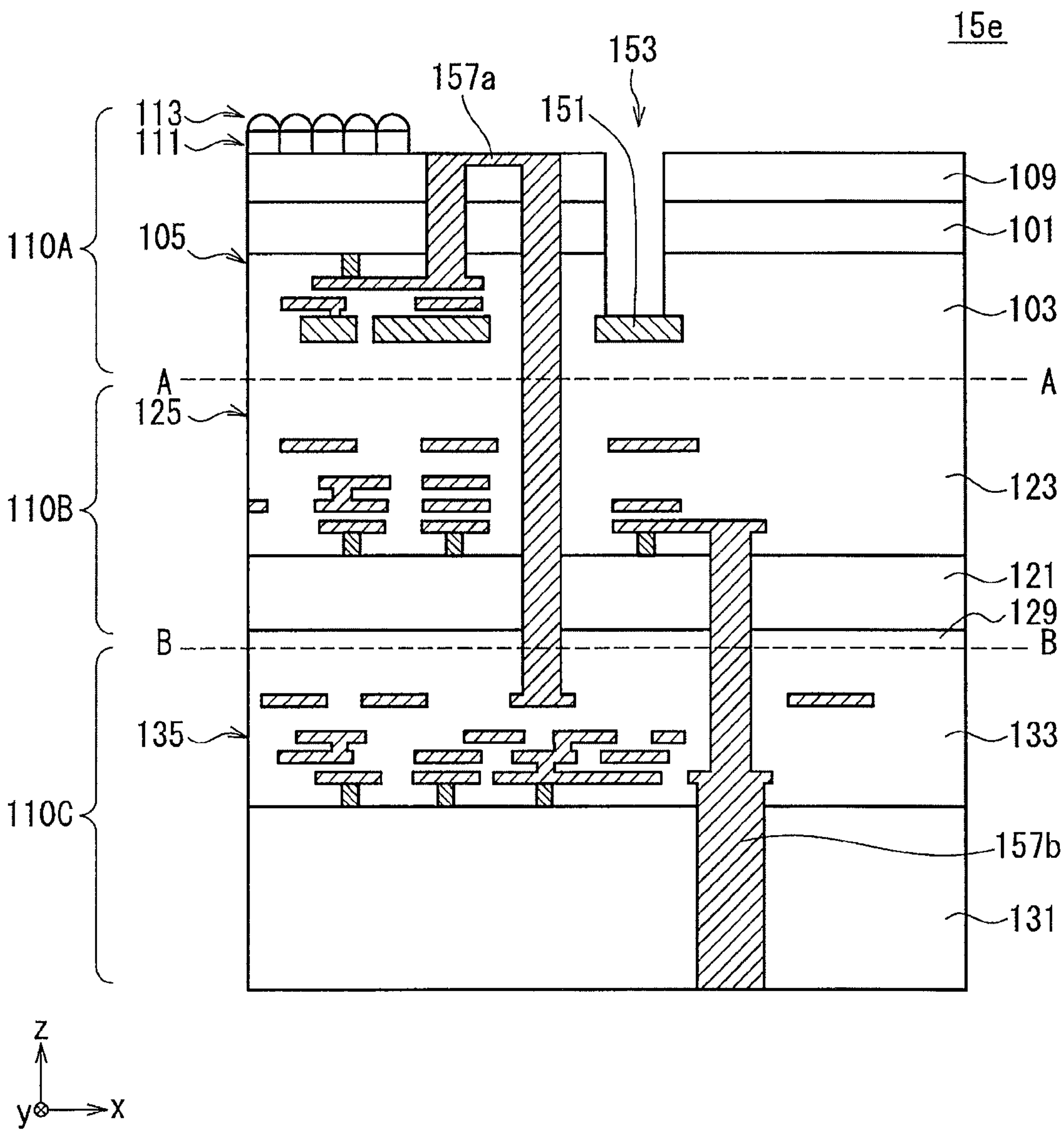
Figure 19F:
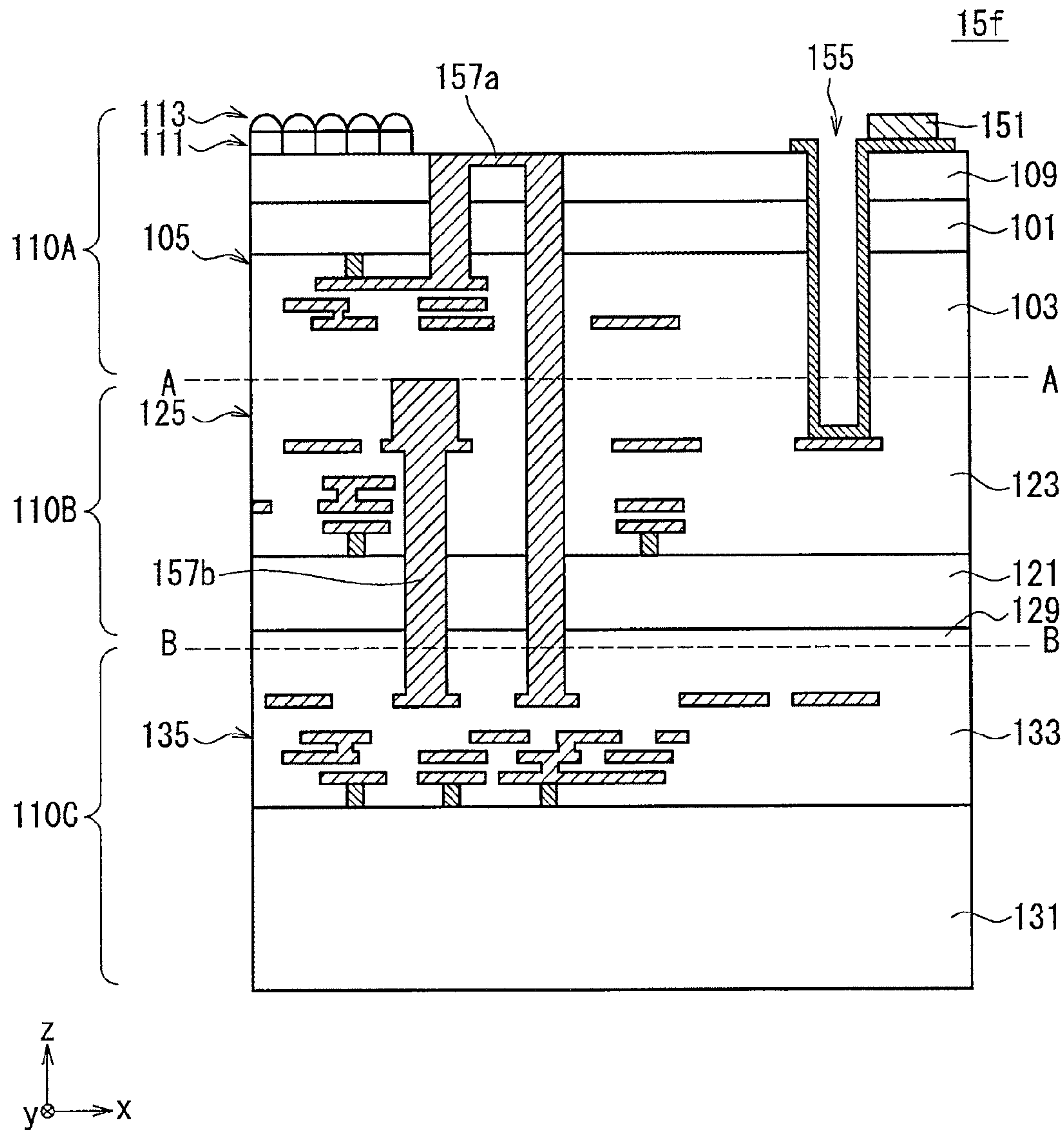
Figure 19G:
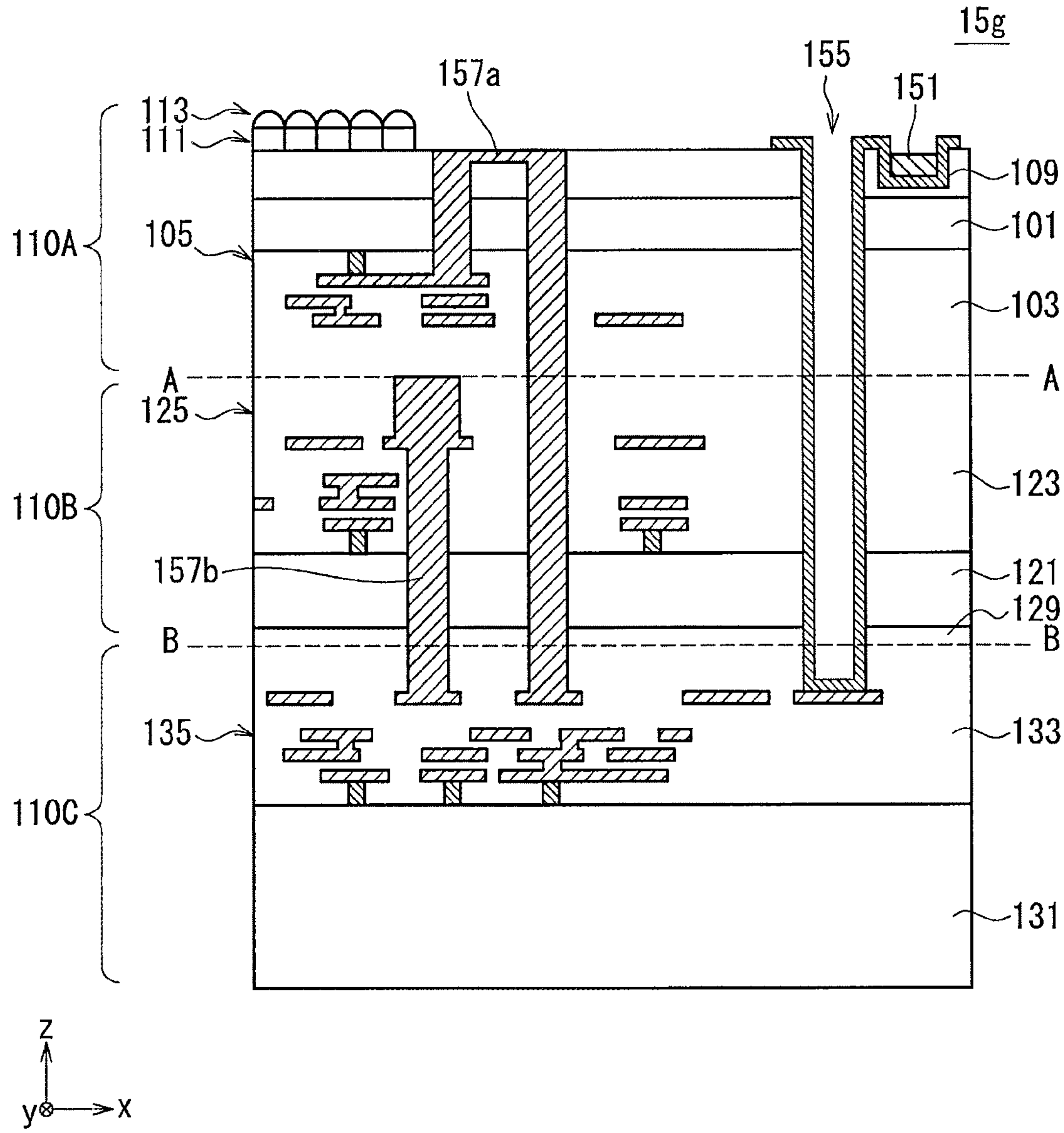
Figure 19H:
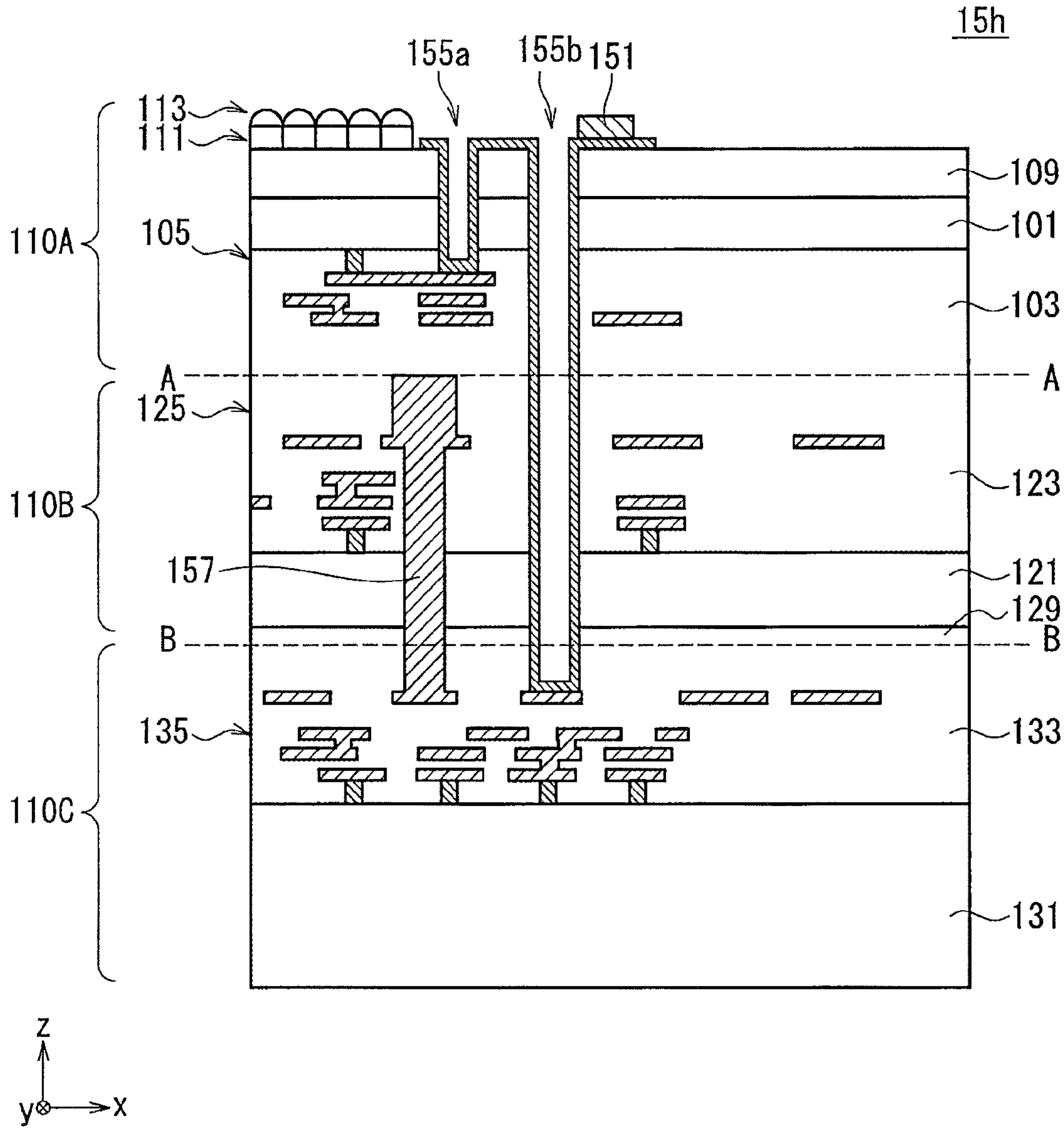
Figure 19I:
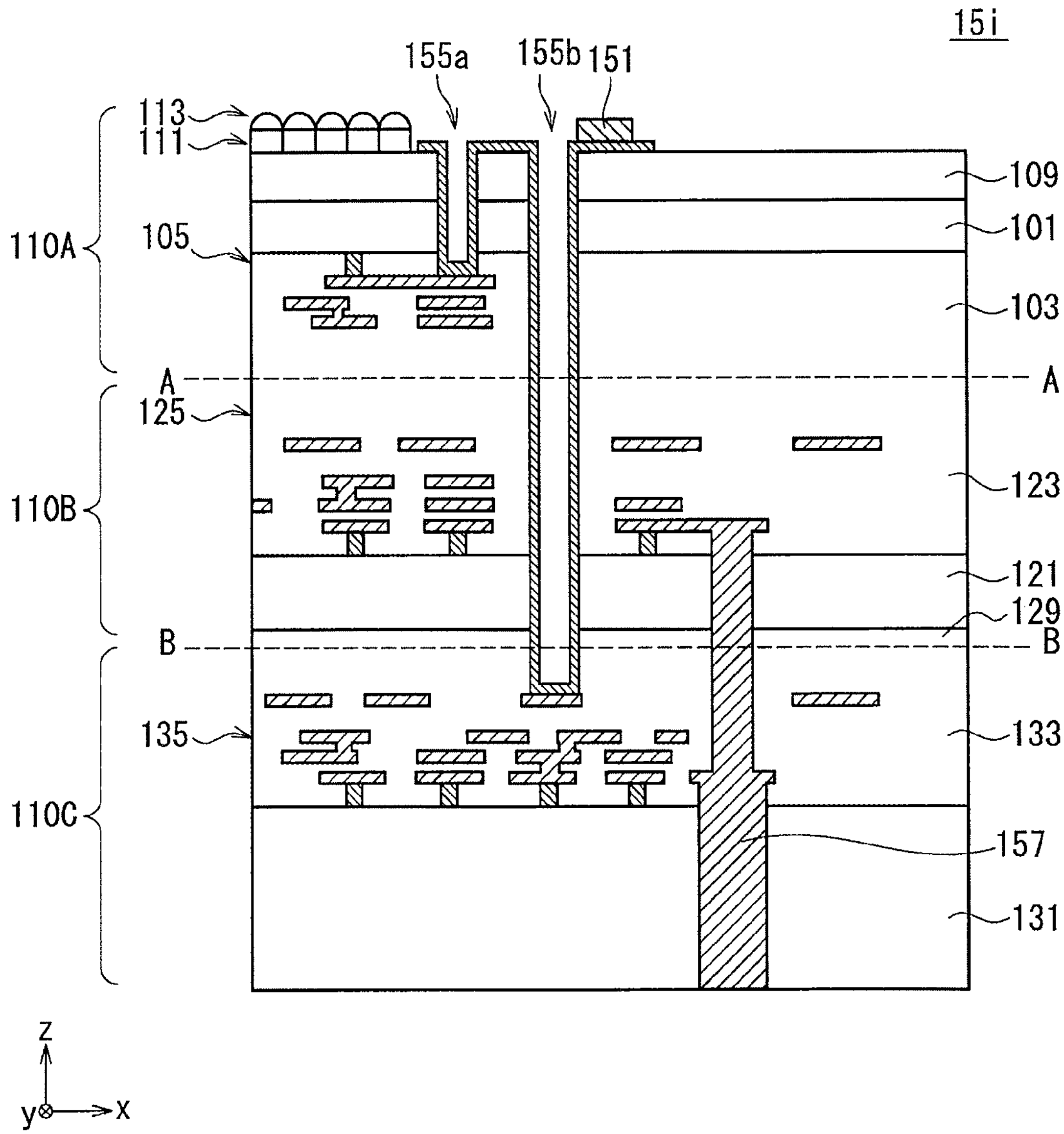

FIG. 19I is a vertical cross-sectional view of a schematic configuration of the solid-state imaging device according to the fourteenth configuration example of the present embodiment.

Figure 19J:
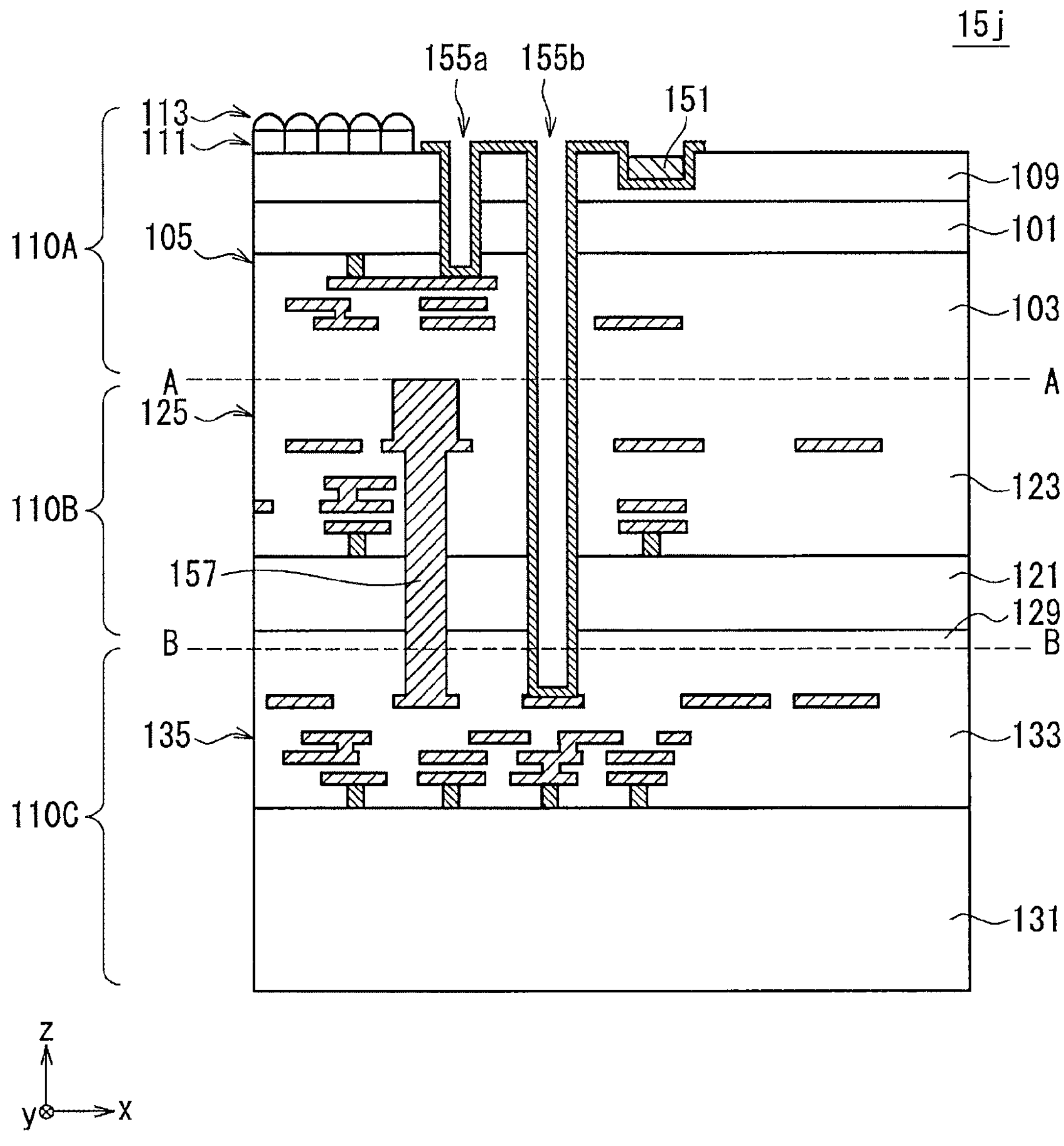

FIG. 19J is a vertical cross-sectional view of a schematic configuration of the solid-state imaging device according to the fourteenth configuration example of the present embodiment.

Figure 19K:
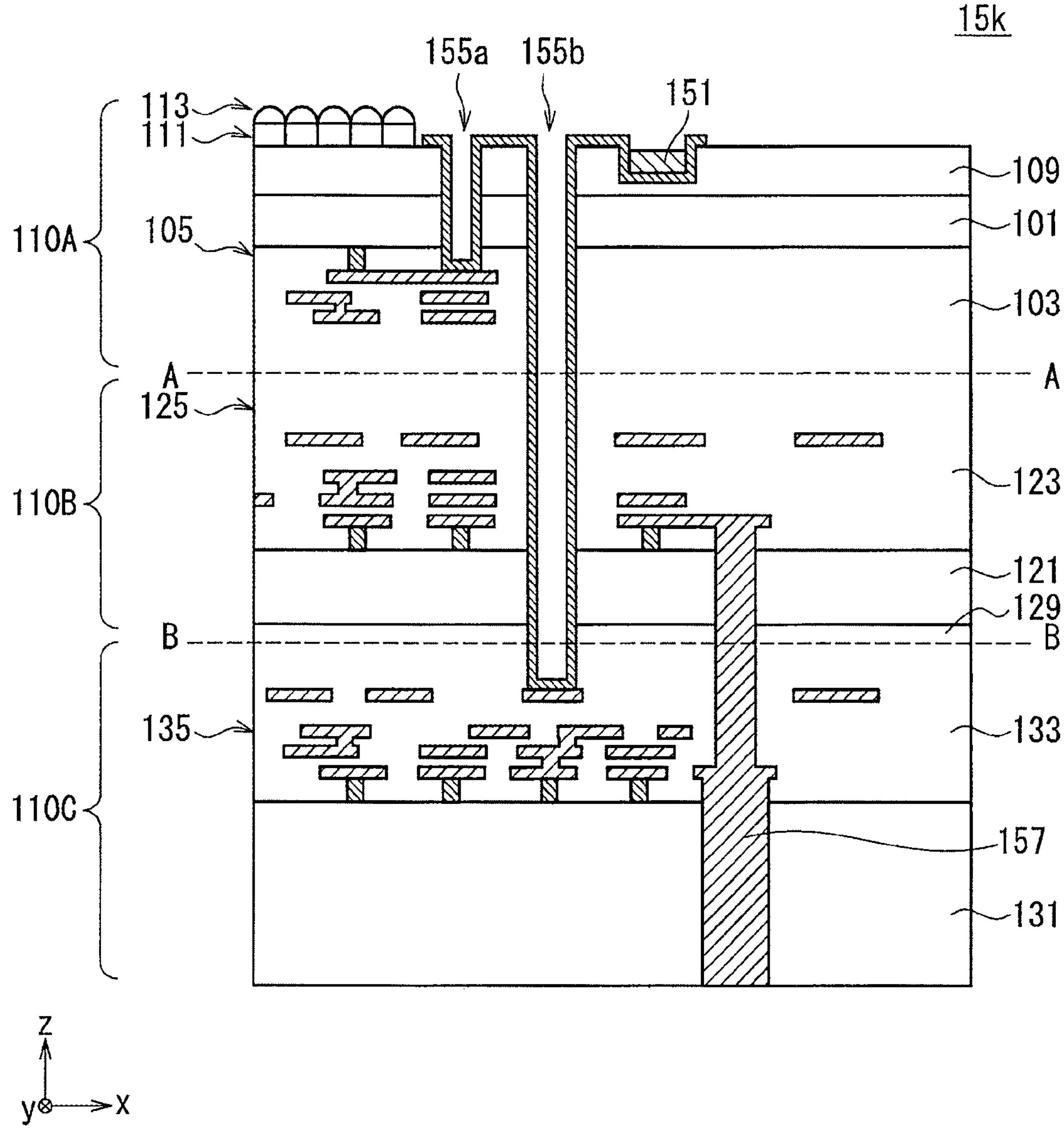

FIG. 19K is a vertical cross-sectional view of a schematic configuration of the solid-state imaging device according to the fourteenth configuration example of the present embodiment.

Figure 20A:
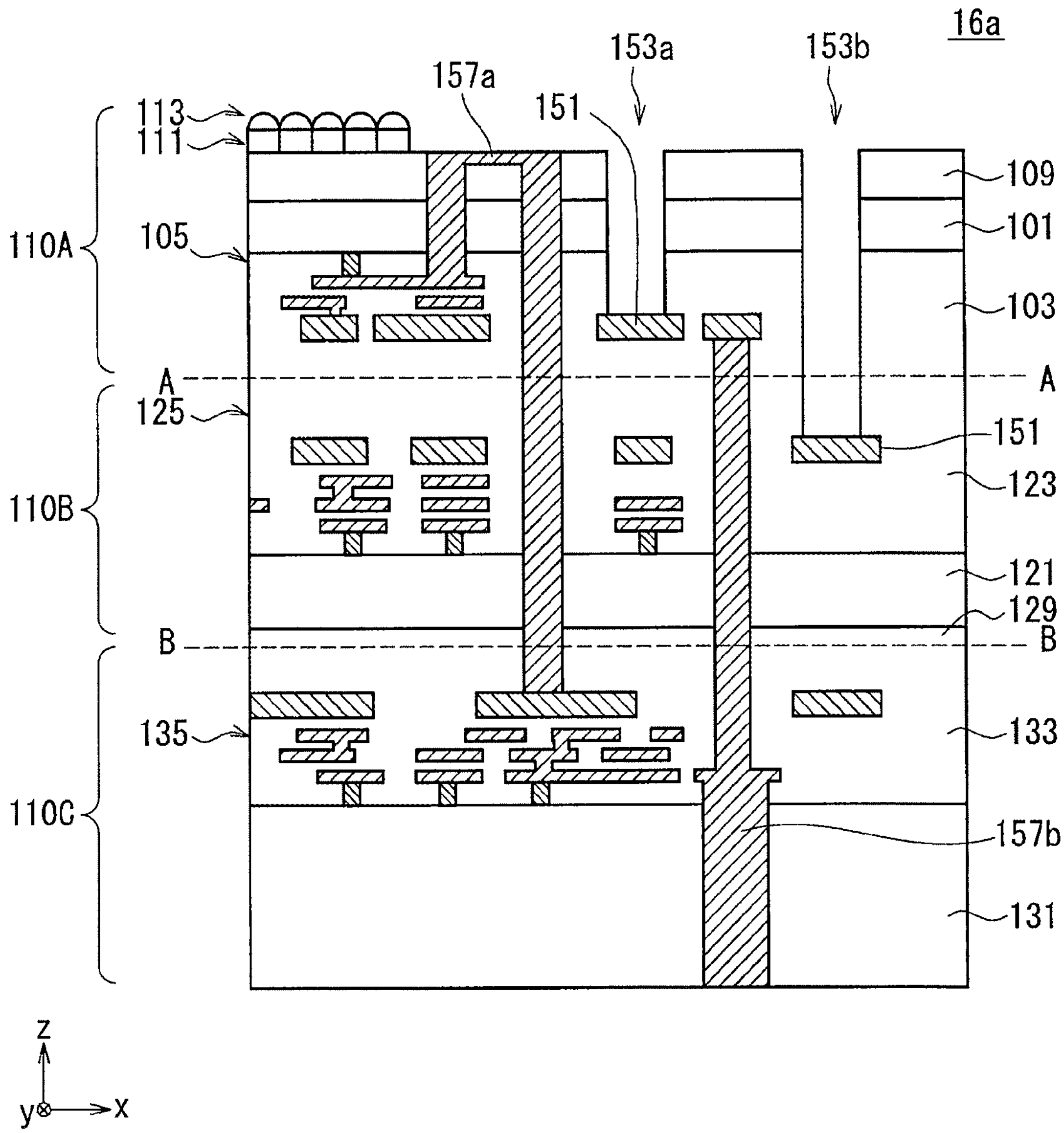

FIG. 20A is a vertical cross-sectional view of a schematic configuration of a solid-state imaging device according to a fifteenth configuration example of the present embodiment.

Figure 20B:
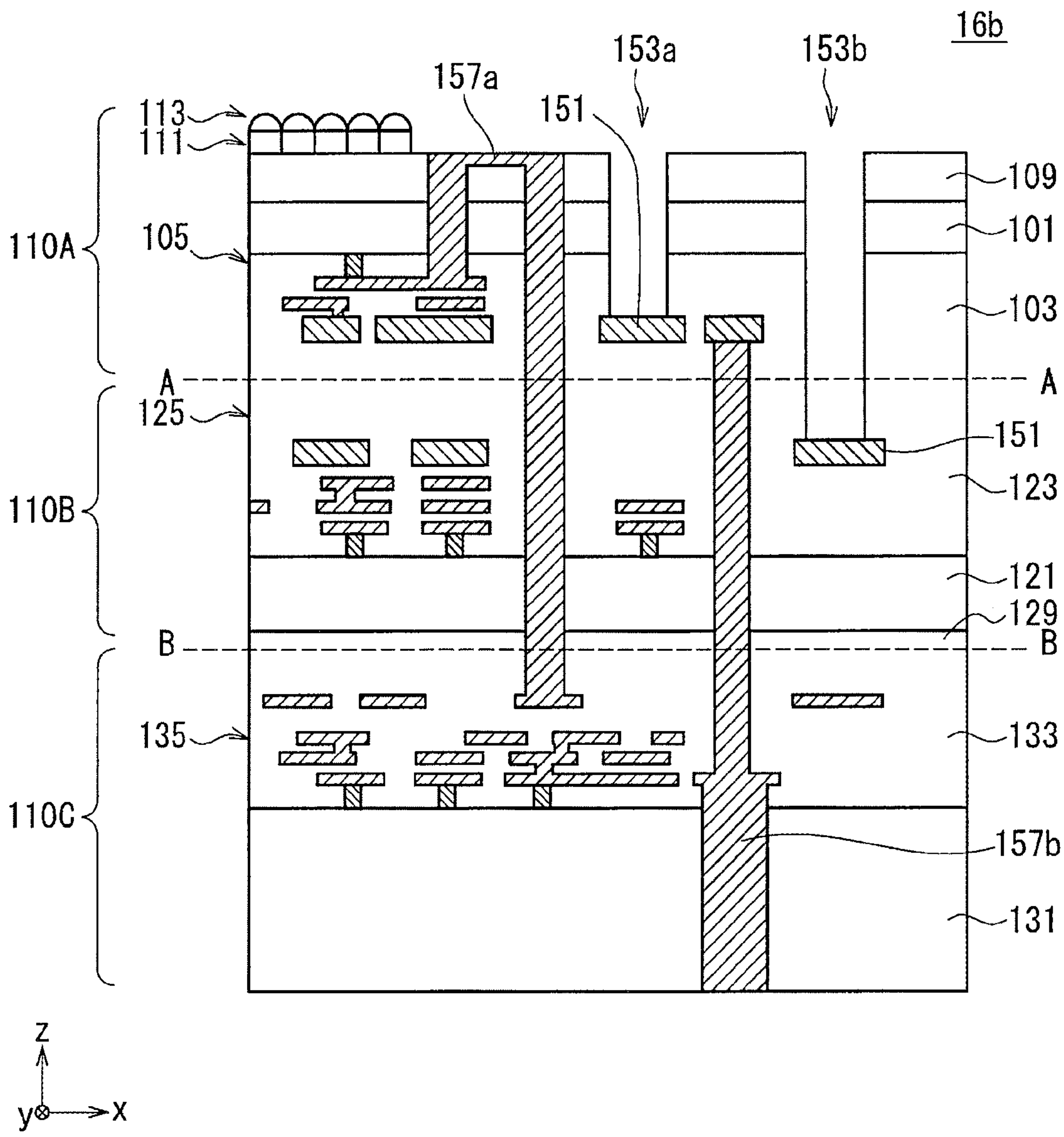

FIG. 20B is a vertical cross-sectional view of a schematic configuration of the solid-state imaging device according to the fifteenth configuration example of the present embodiment.

Figure 20C:
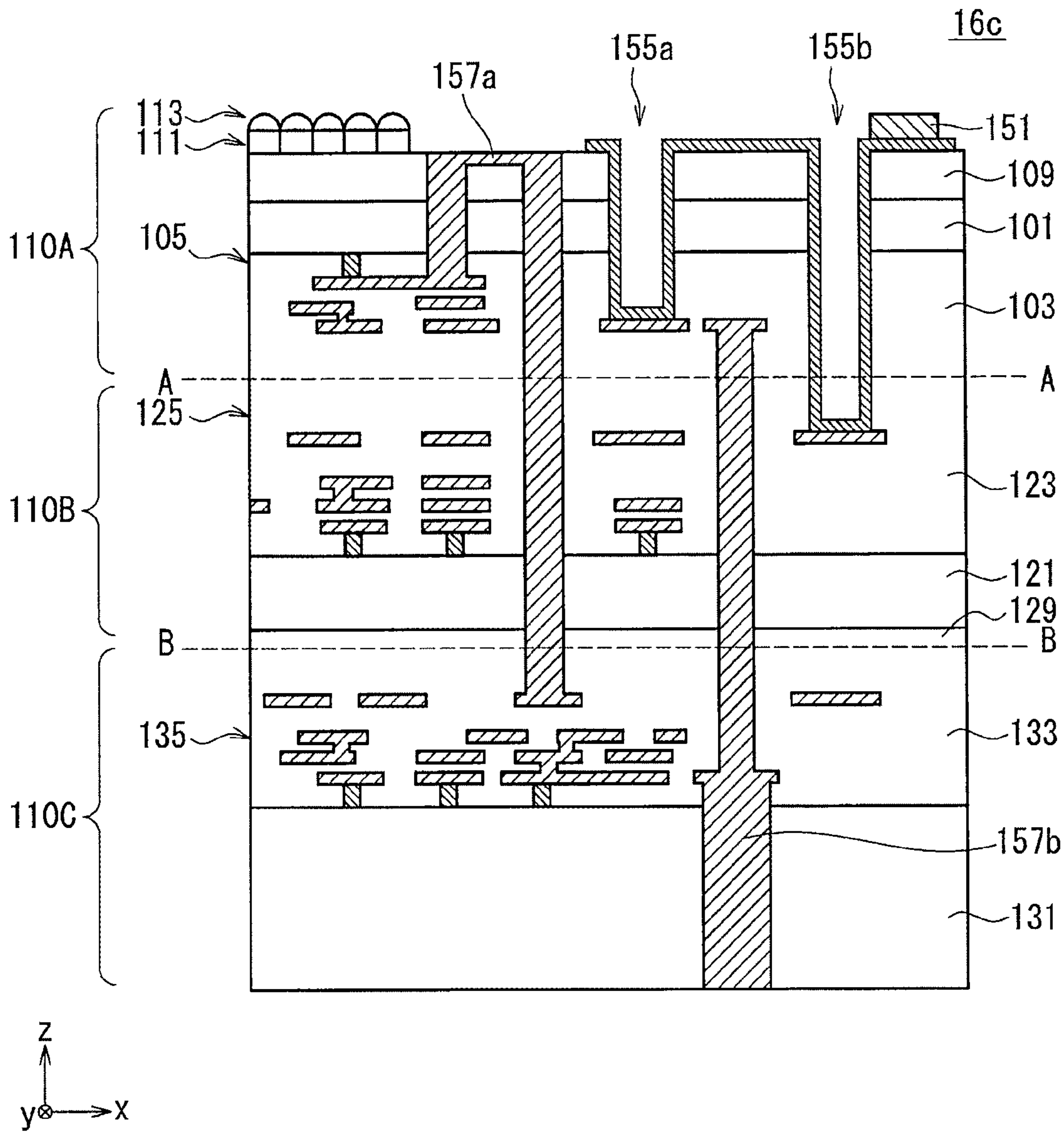

FIG. 20C is a vertical cross-sectional view of a schematic configuration of the solid-state imaging device according to the fifteenth configuration example of the present embodiment.

Figure 20D:
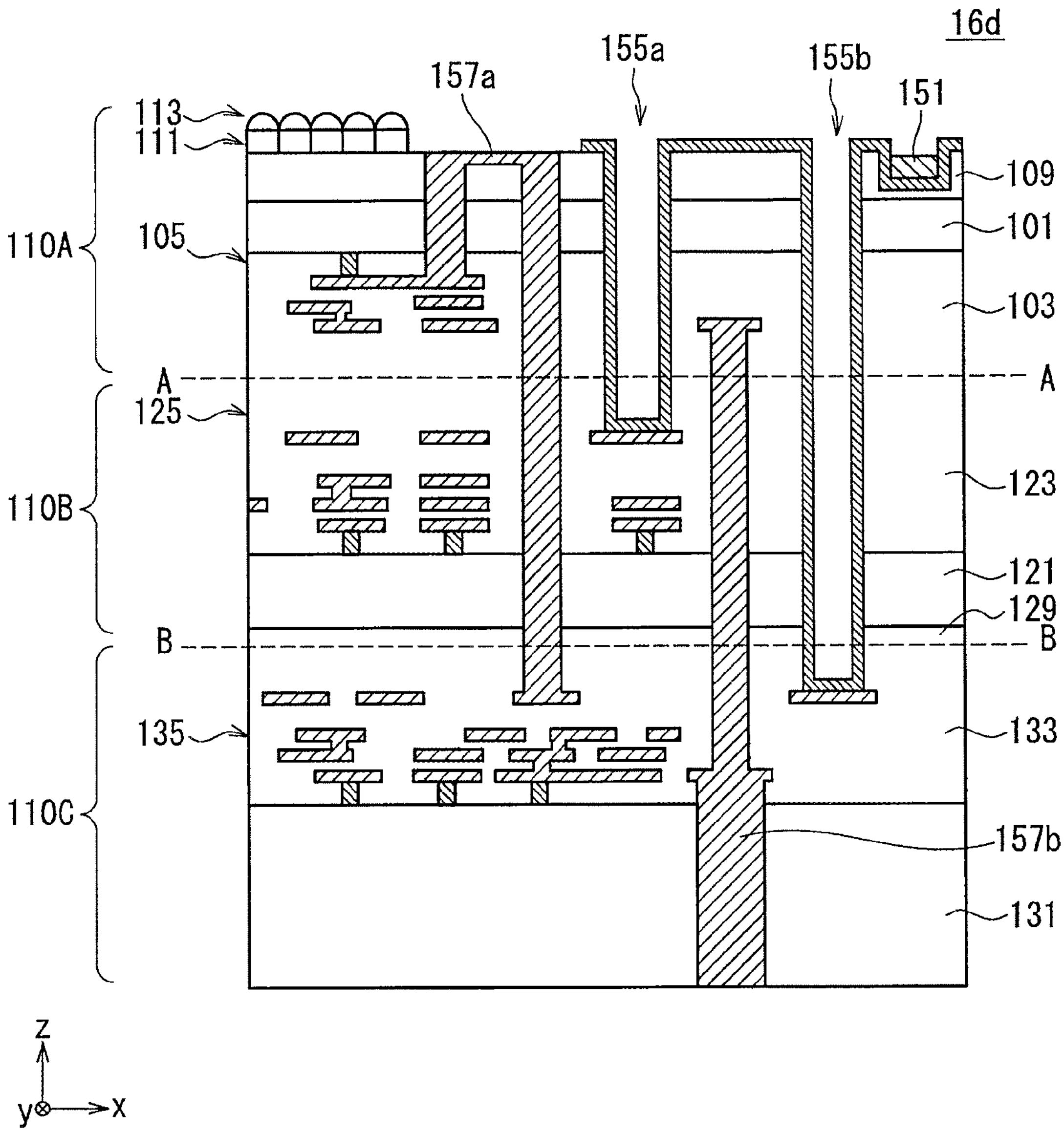

FIG. 20D is a vertical cross-sectional view of a schematic configuration of the solid-state imaging device according to the fifteenth configuration example of the present embodiment.

Figure 20E:
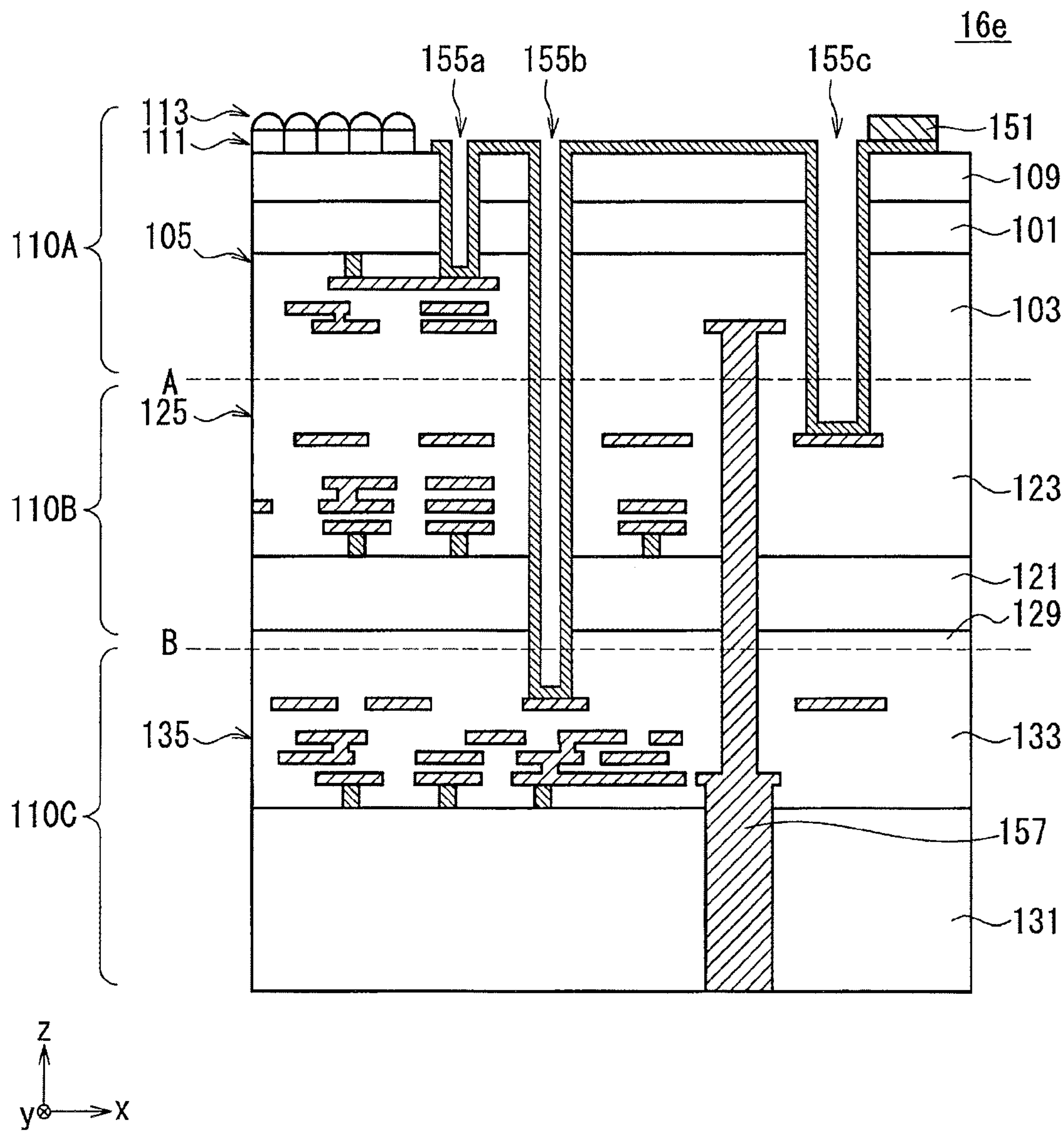

FIG. 20E is a vertical cross-sectional view of a schematic configuration of the solid-state imaging device according to the fifteenth configuration example of the present embodiment.

Figure 20F:
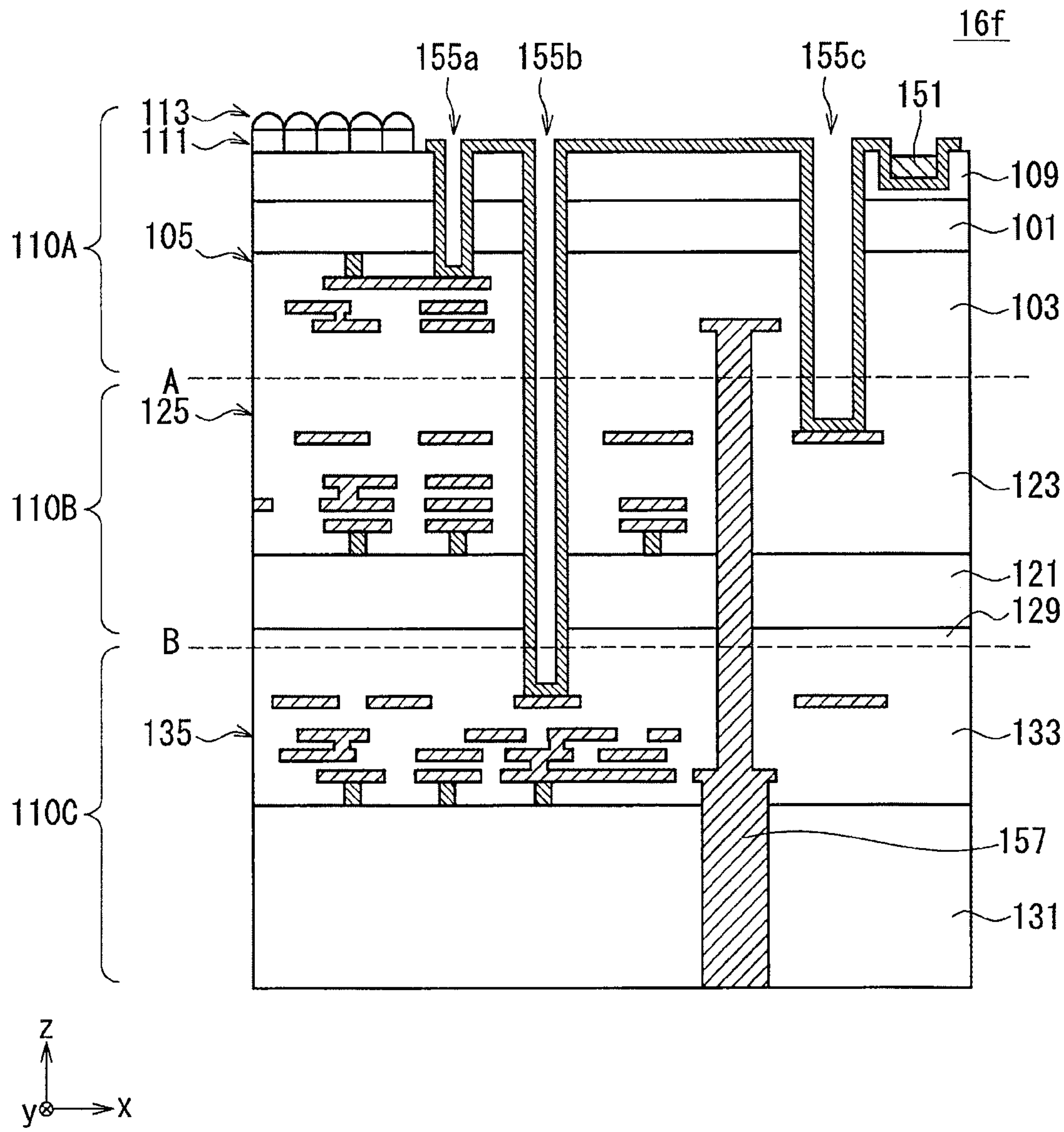

FIG. 20F is a vertical cross-sectional view of a schematic configuration of the solid-state imaging device according to the fifteenth configuration example of the present embodiment.

Figure 20G:
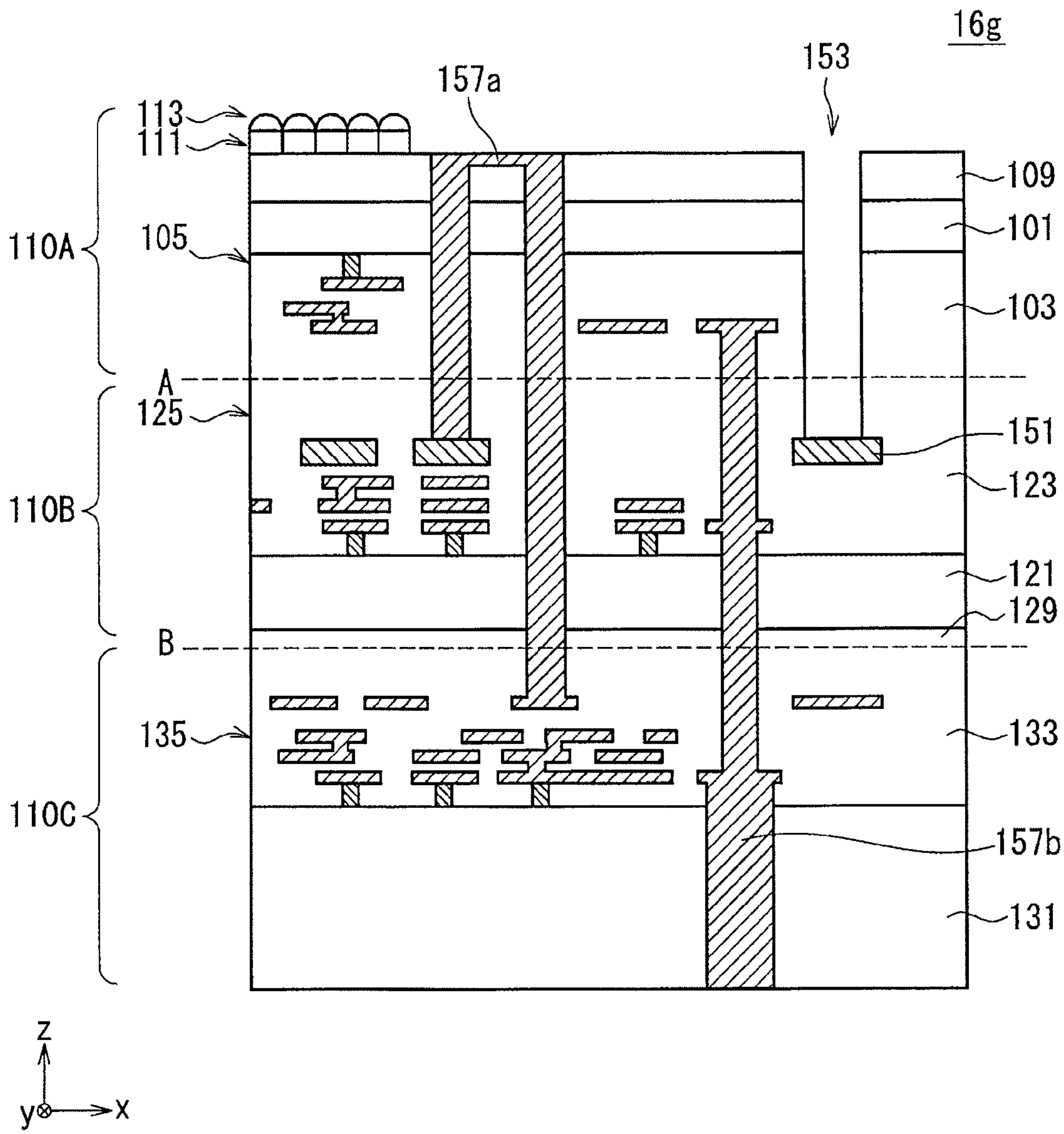

FIG. 20G is a vertical cross-sectional view of a schematic configuration of the solid-state imaging device according to the fifteenth configuration example of the present embodiment.

Figure 21A:
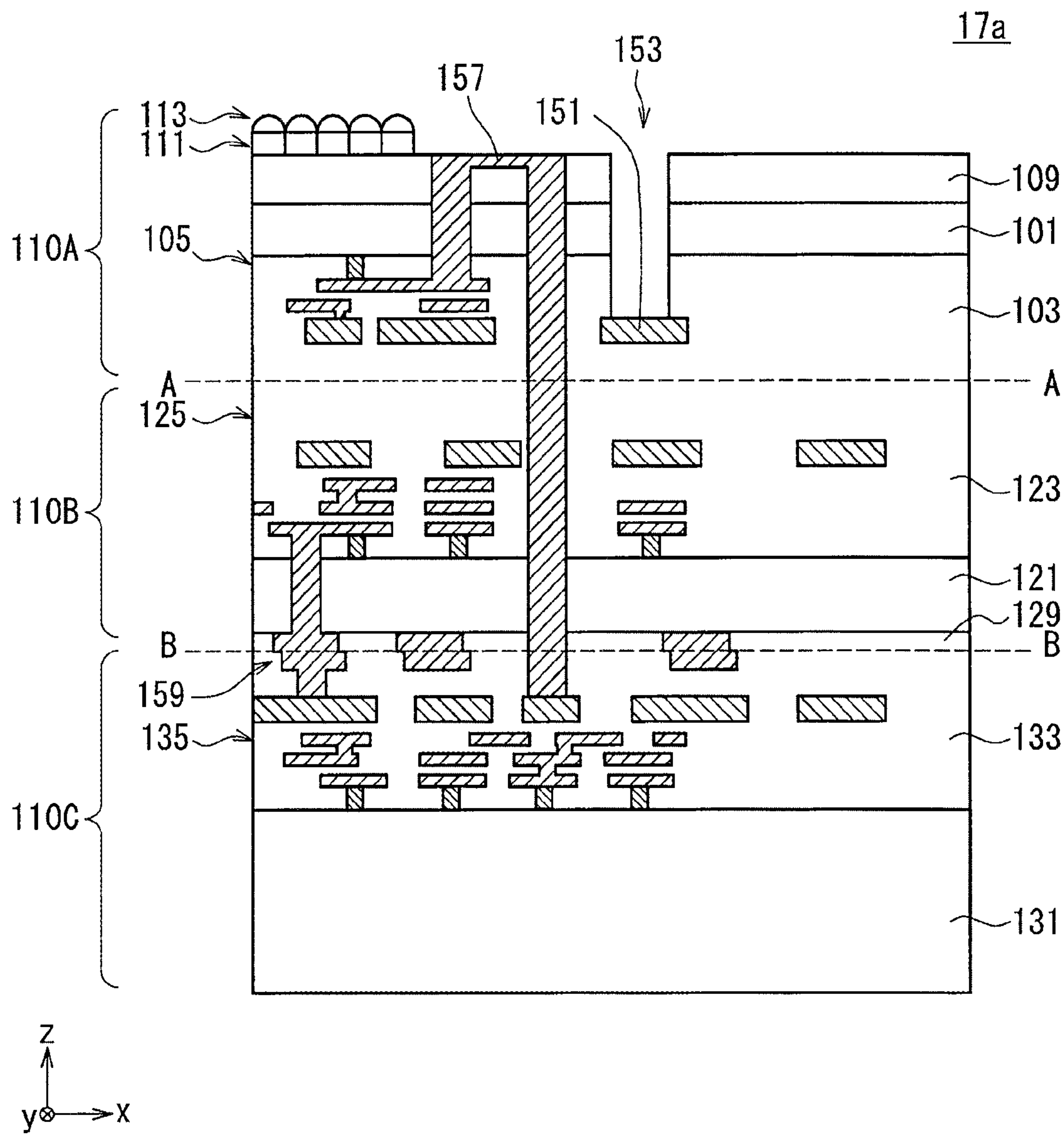

FIG. 21A is a vertical cross-sectional view of a schematic configuration of a solid-state imaging device according to a sixteenth configuration example of the present embodiment.

Figure 21B:
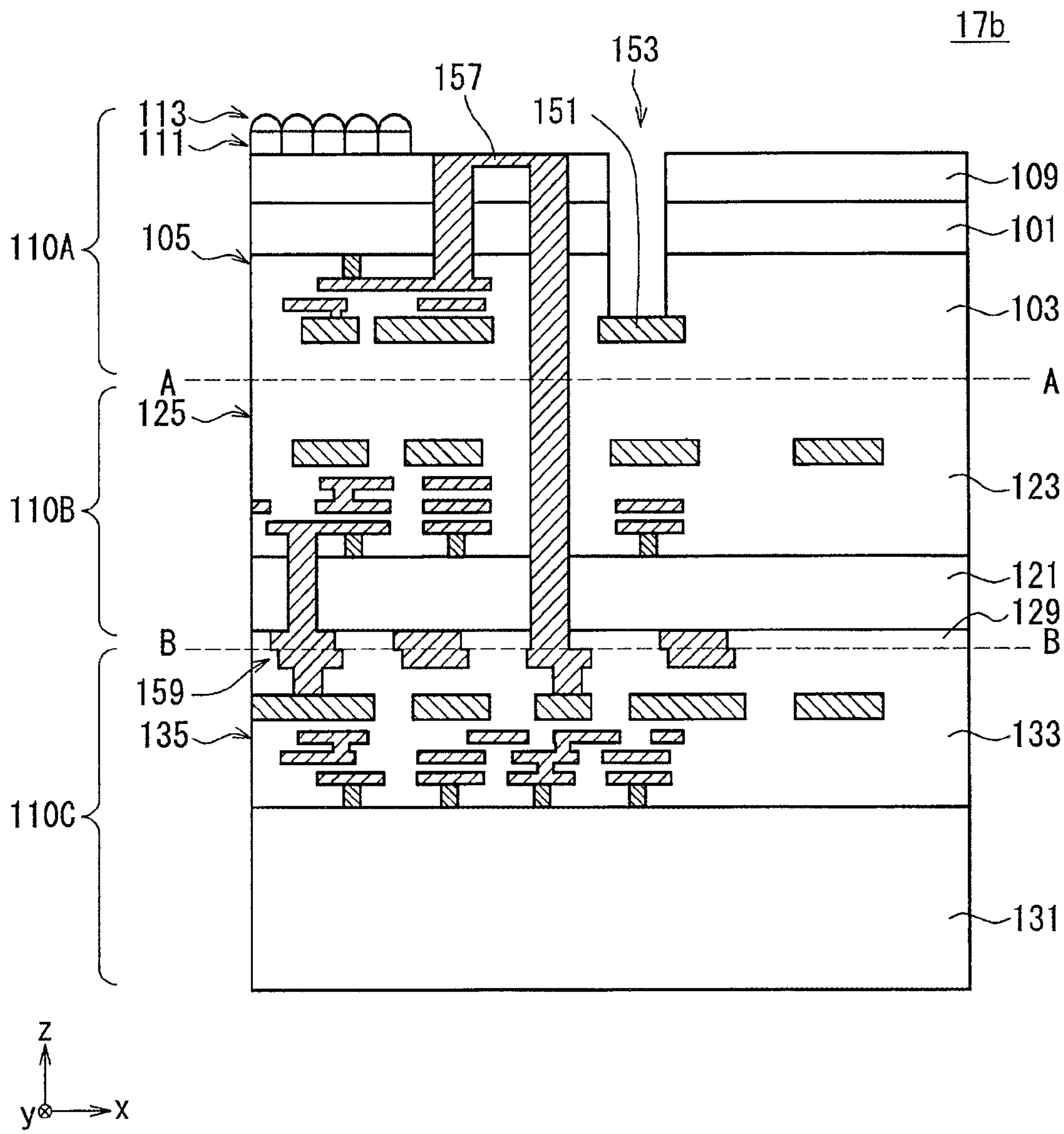

FIG. 21B is a vertical cross-sectional view of a schematic configuration of the solid-state imaging device according to the sixteenth configuration example of the present embodiment.

Figure 21C:
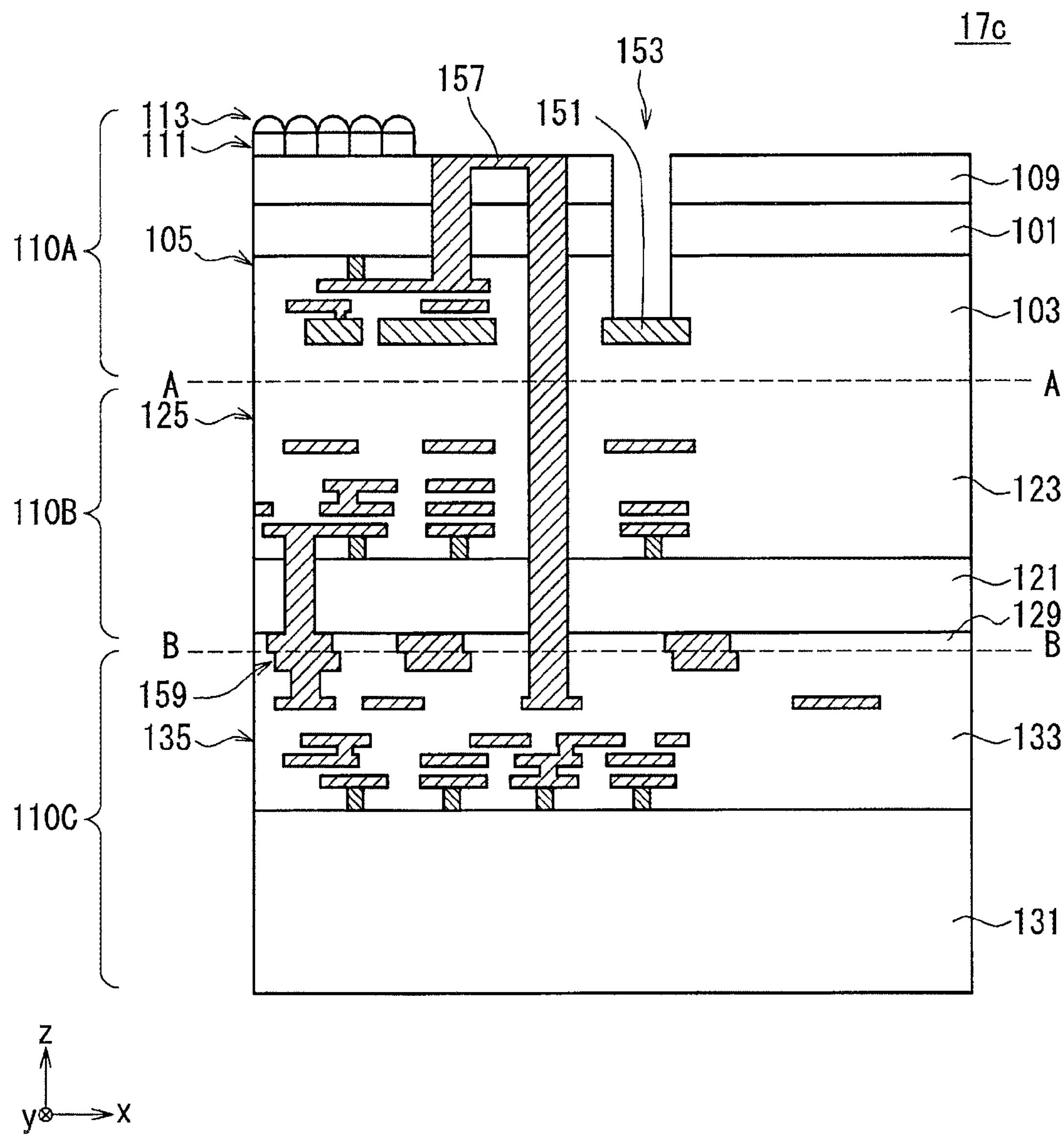

FIG. 21C is a vertical cross-sectional view of a schematic configuration of the solid-state imaging device according to the sixteenth configuration example of the present embodiment.

Figure 21D:
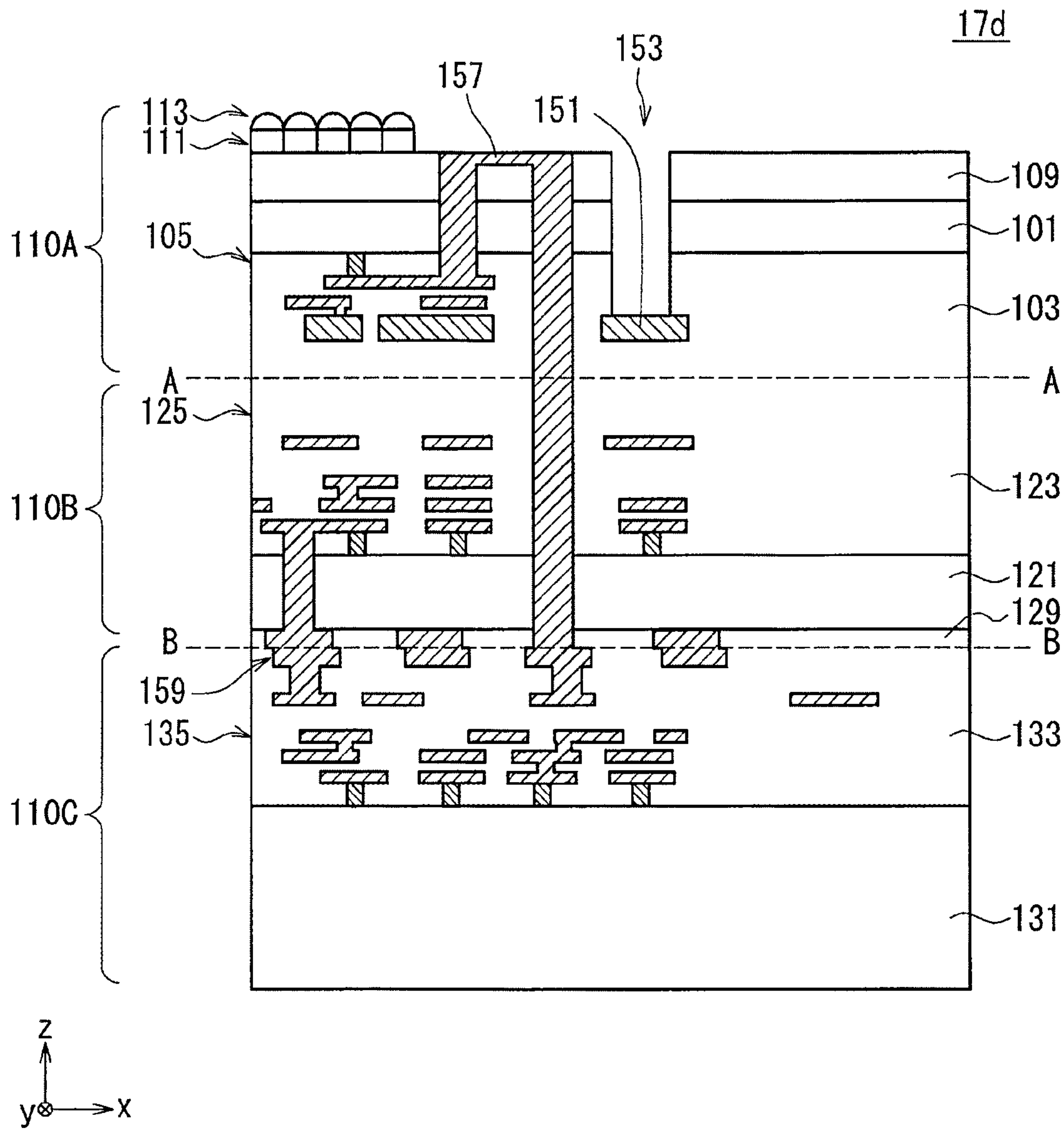

FIG. 21D is a vertical cross-sectional view of a schematic configuration of the solid-state imaging device according to the sixteenth configuration example of the present embodiment.

Figure 21E:
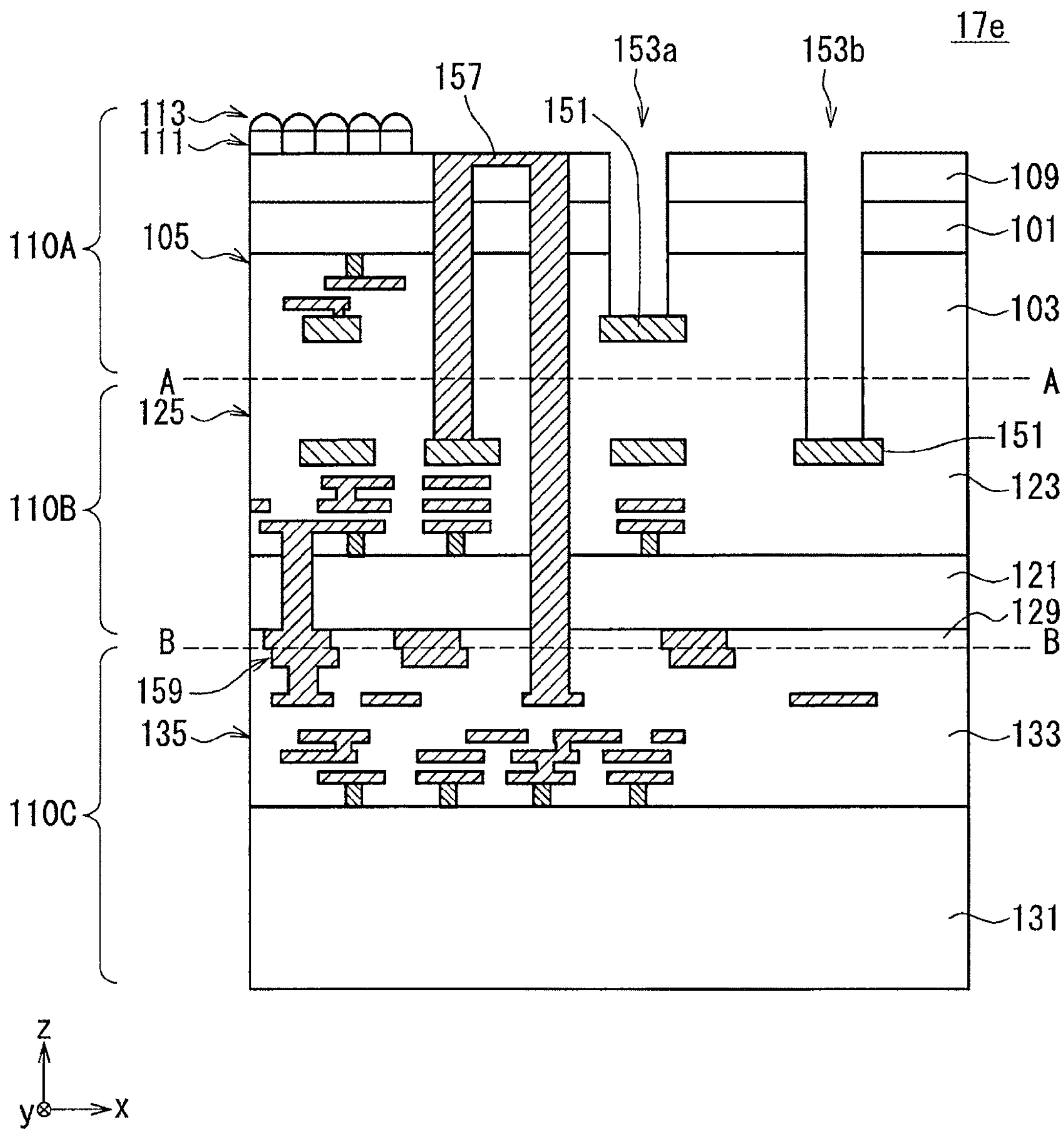

FIG. 21E is a vertical cross-sectional view of a schematic configuration of the solid-state imaging device according to the sixteenth configuration example of the present embodiment.

Figure 21F:
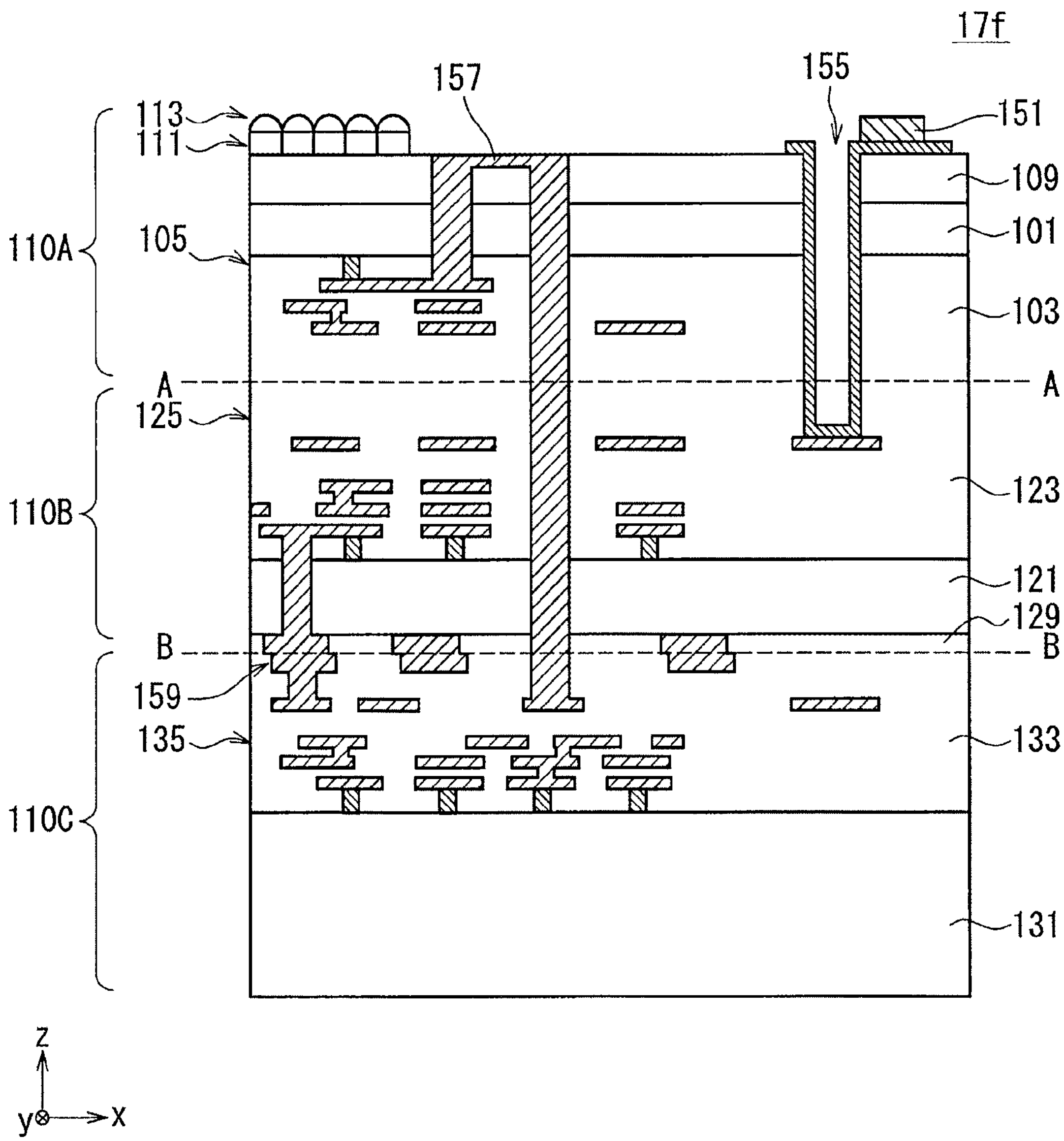

FIG. 21F is a vertical cross-sectional view of a schematic configuration of the solid-state imaging device according to the sixteenth configuration example of the present embodiment.

Figure 21G:
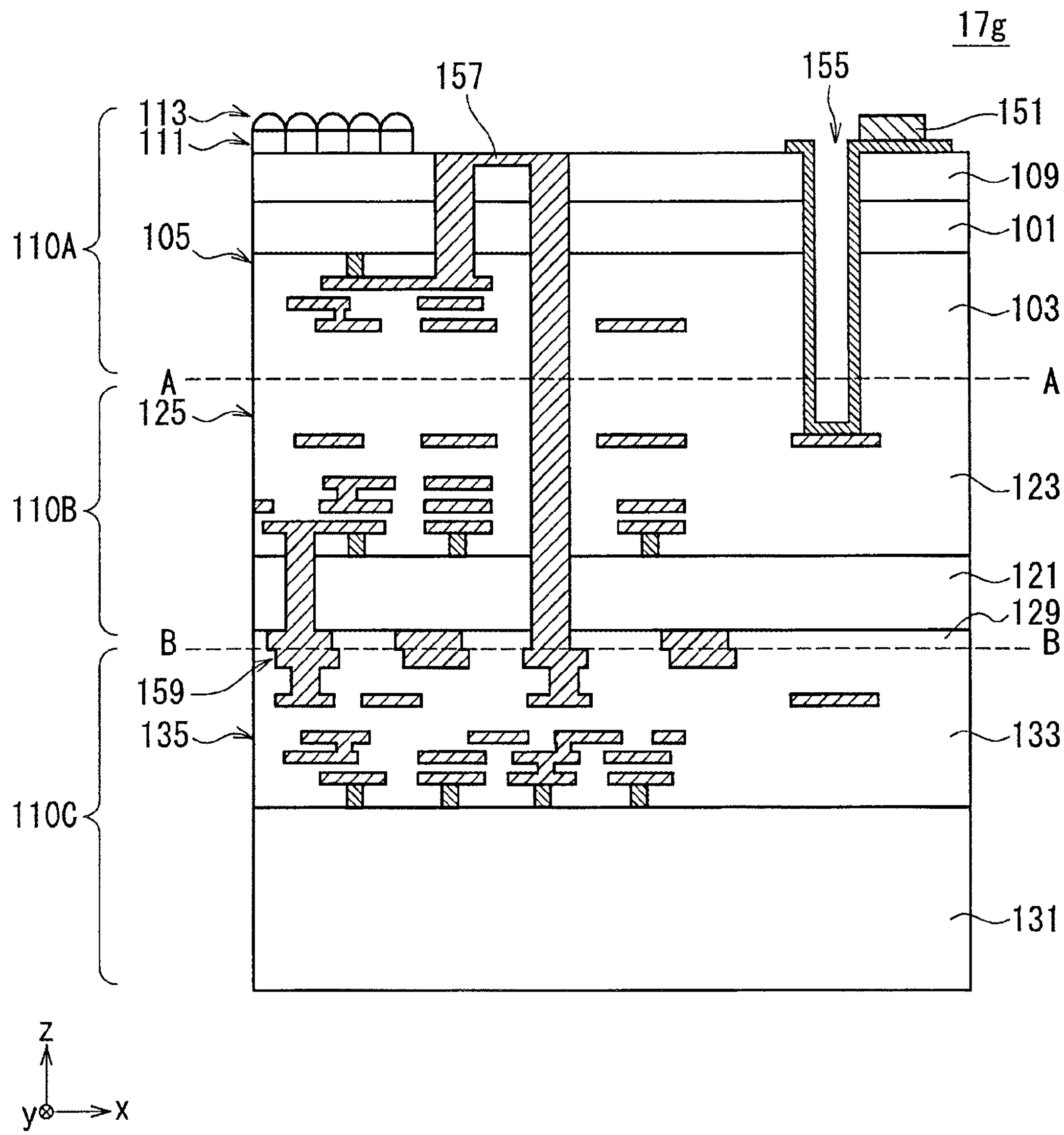

FIG. 21G is a vertical cross-sectional view of a schematic configuration of the solid-state imaging device according to the sixteenth configuration example of the present embodiment.

Figure 21H:
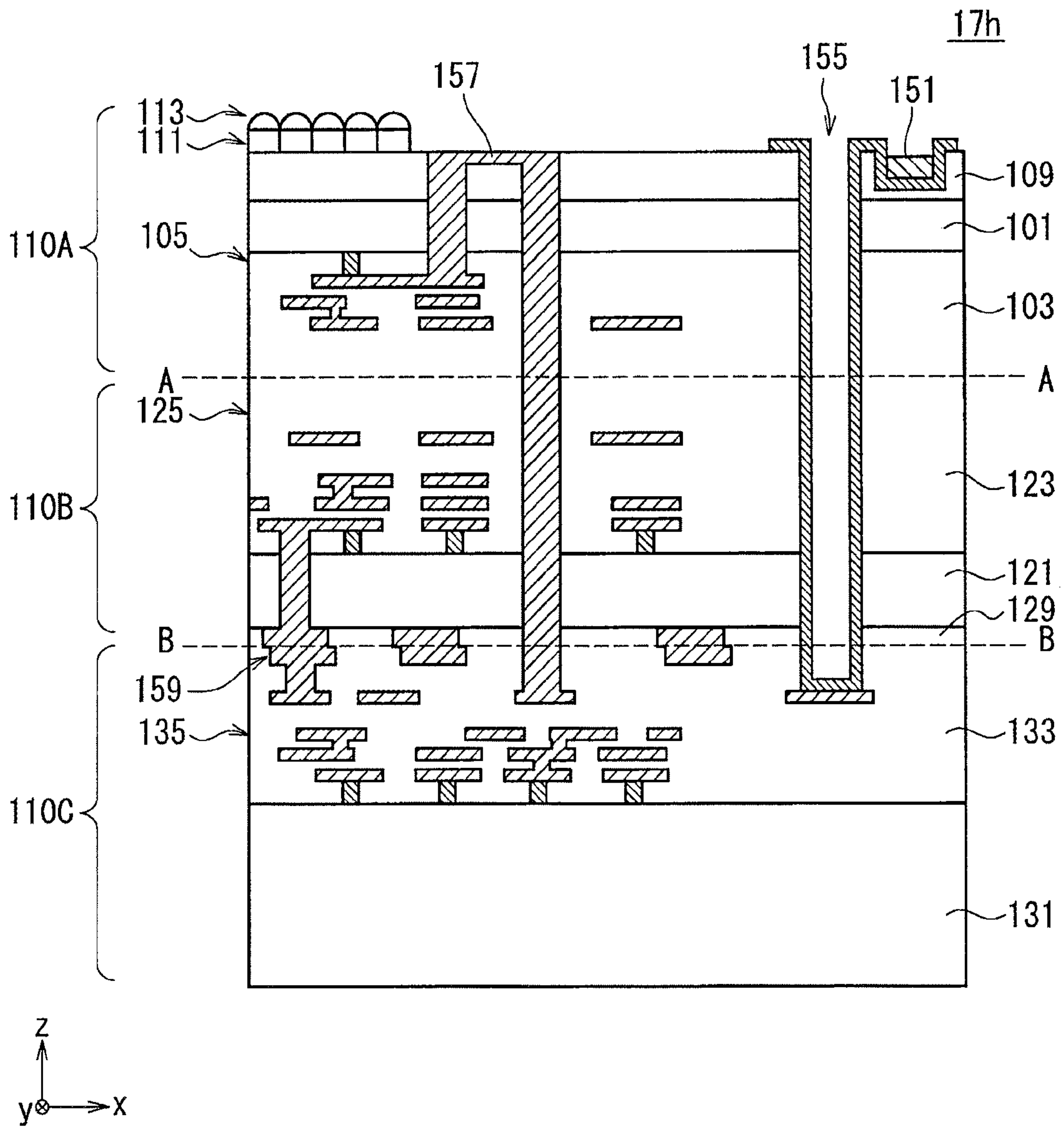

FIG. 21H is a vertical cross-sectional view of a schematic configuration of the solid-state imaging device according to the sixteenth configuration example of the present embodiment.

Figure 21I:
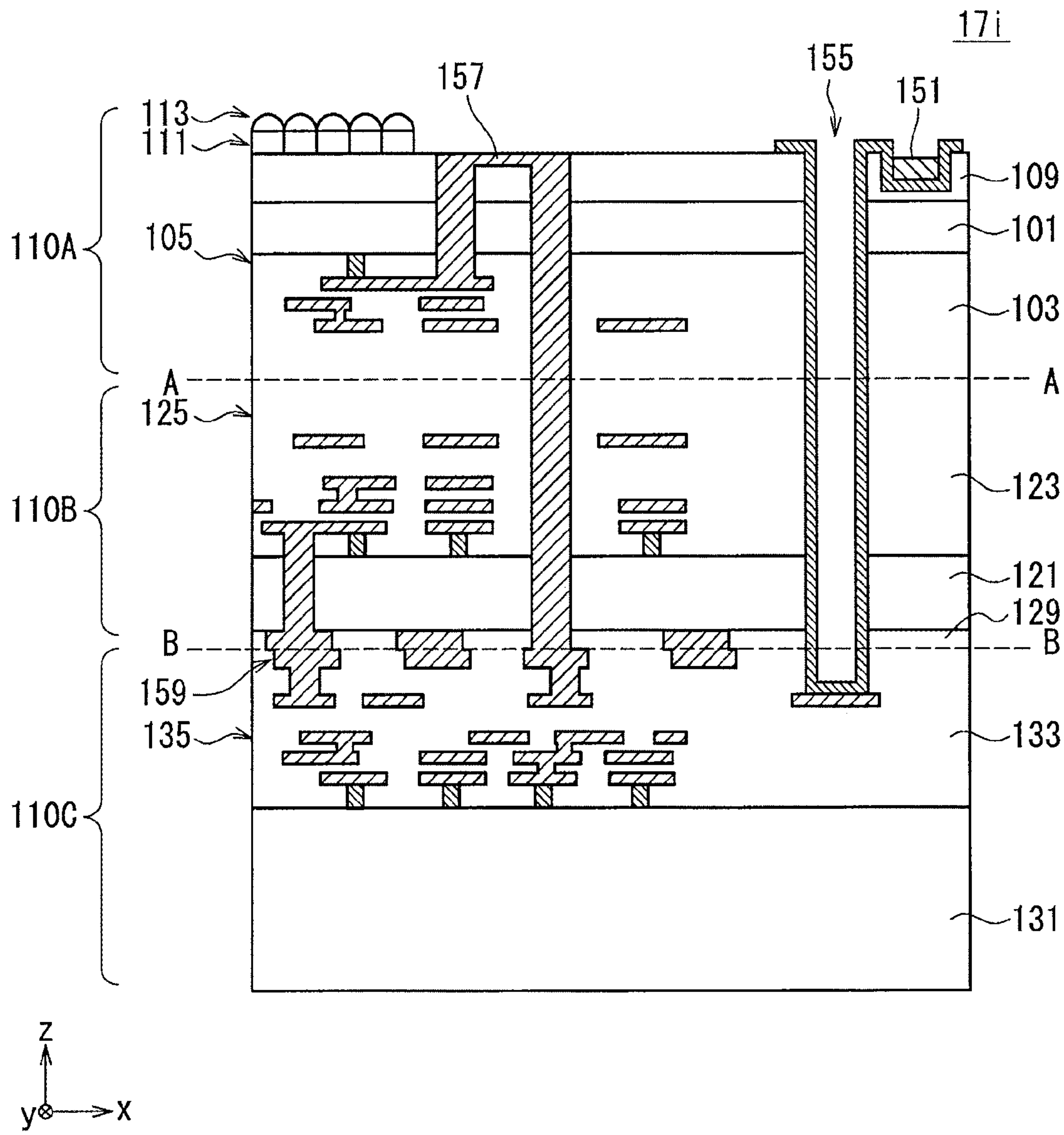

FIG. 21I is a vertical cross-sectional view of a schematic configuration of the solid-state imaging device according to the sixteenth configuration example of the present embodiment.

Figure 21J:
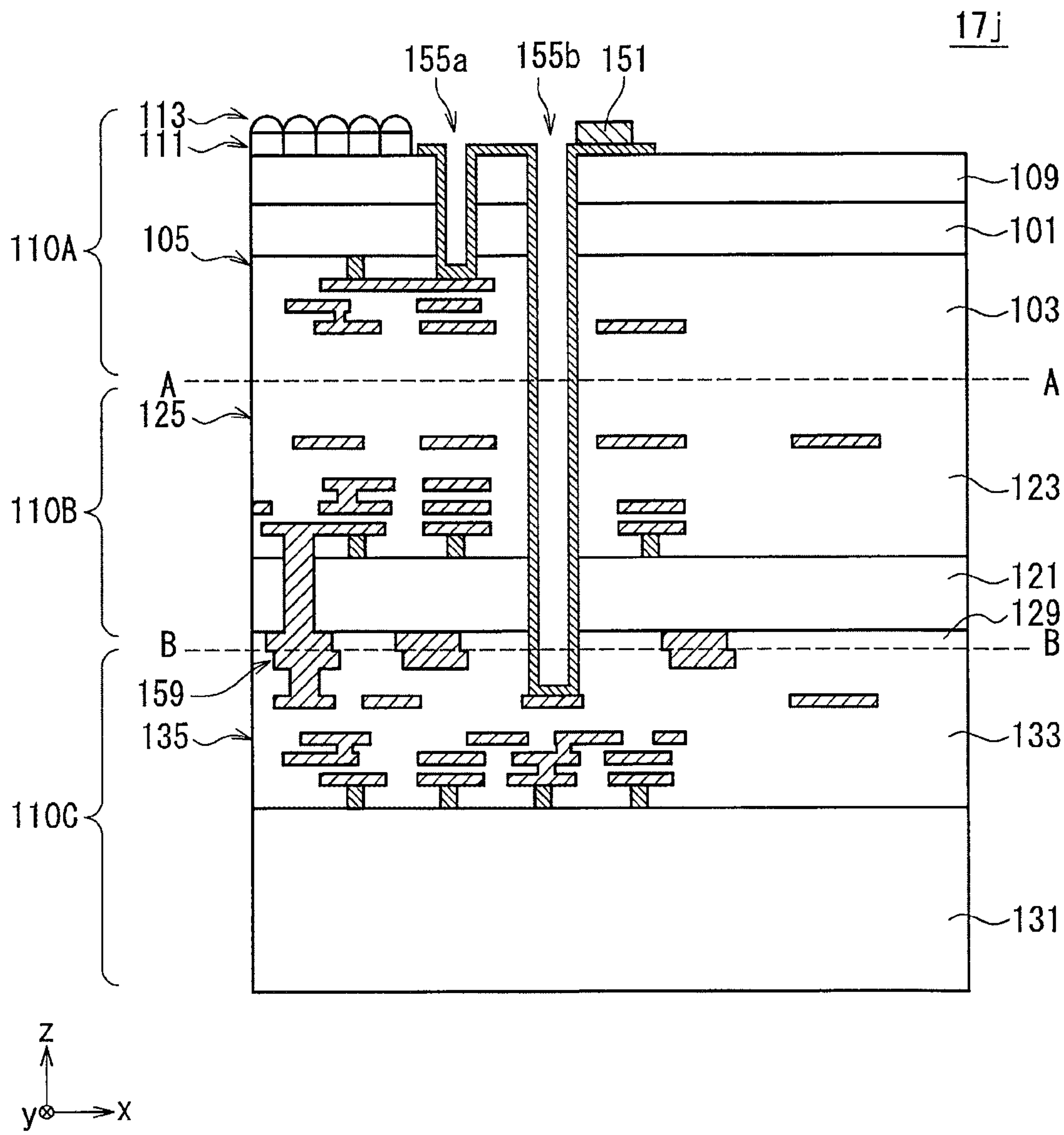

FIG. 21J is a vertical cross-sectional view of a schematic configuration of the solid-state imaging device according to the sixteenth configuration example of the present embodiment.

Figure 21K:
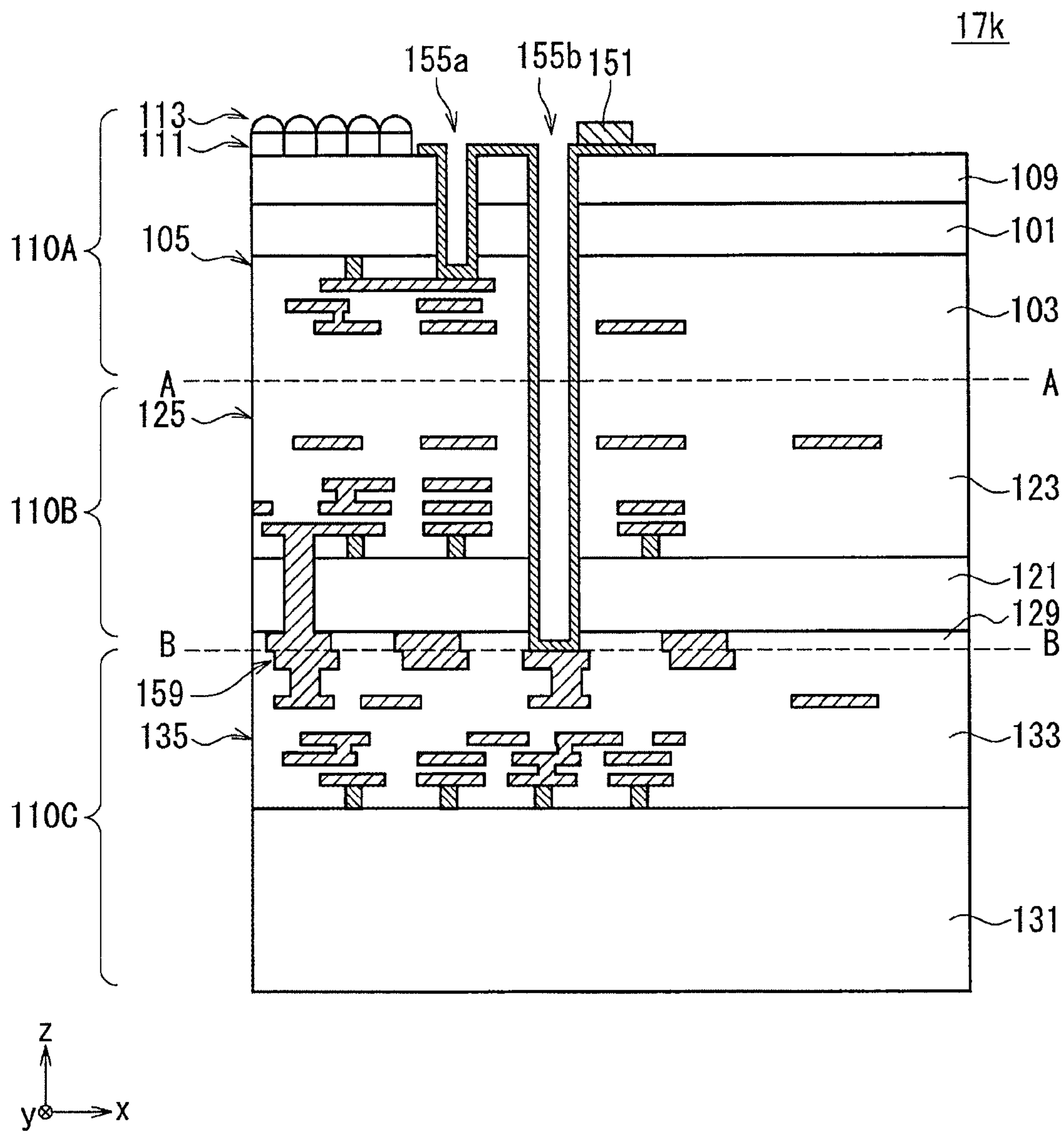

FIG. 21K is a vertical cross-sectional view of a schematic configuration of the solid-state imaging device according to the sixteenth configuration example of the present embodiment.

Figure 21L:
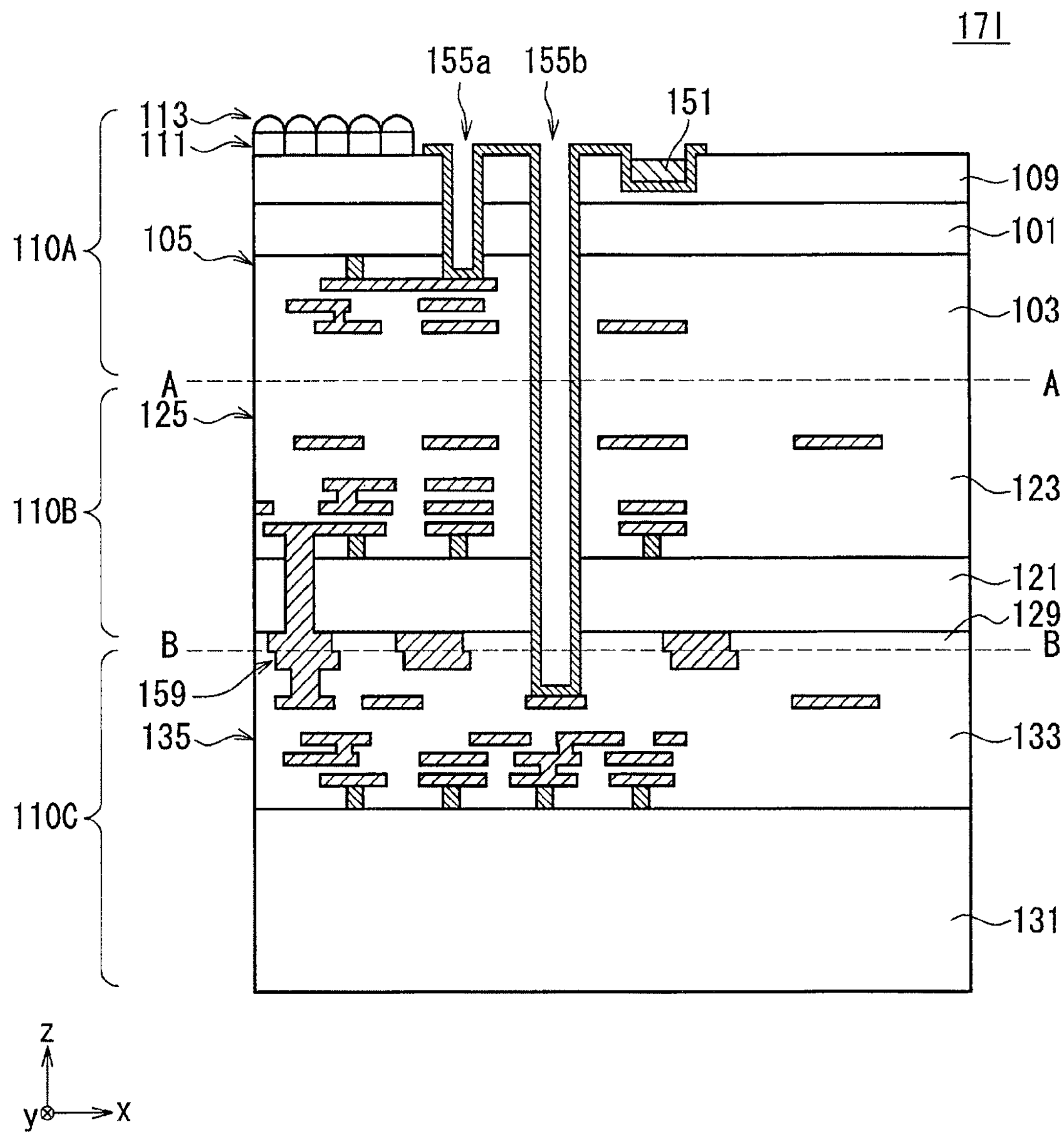

FIG. 21L is a vertical cross-sectional view of a schematic configuration of the solid-state imaging device according to the sixteenth configuration example of the present embodiment.

Figure 21M:
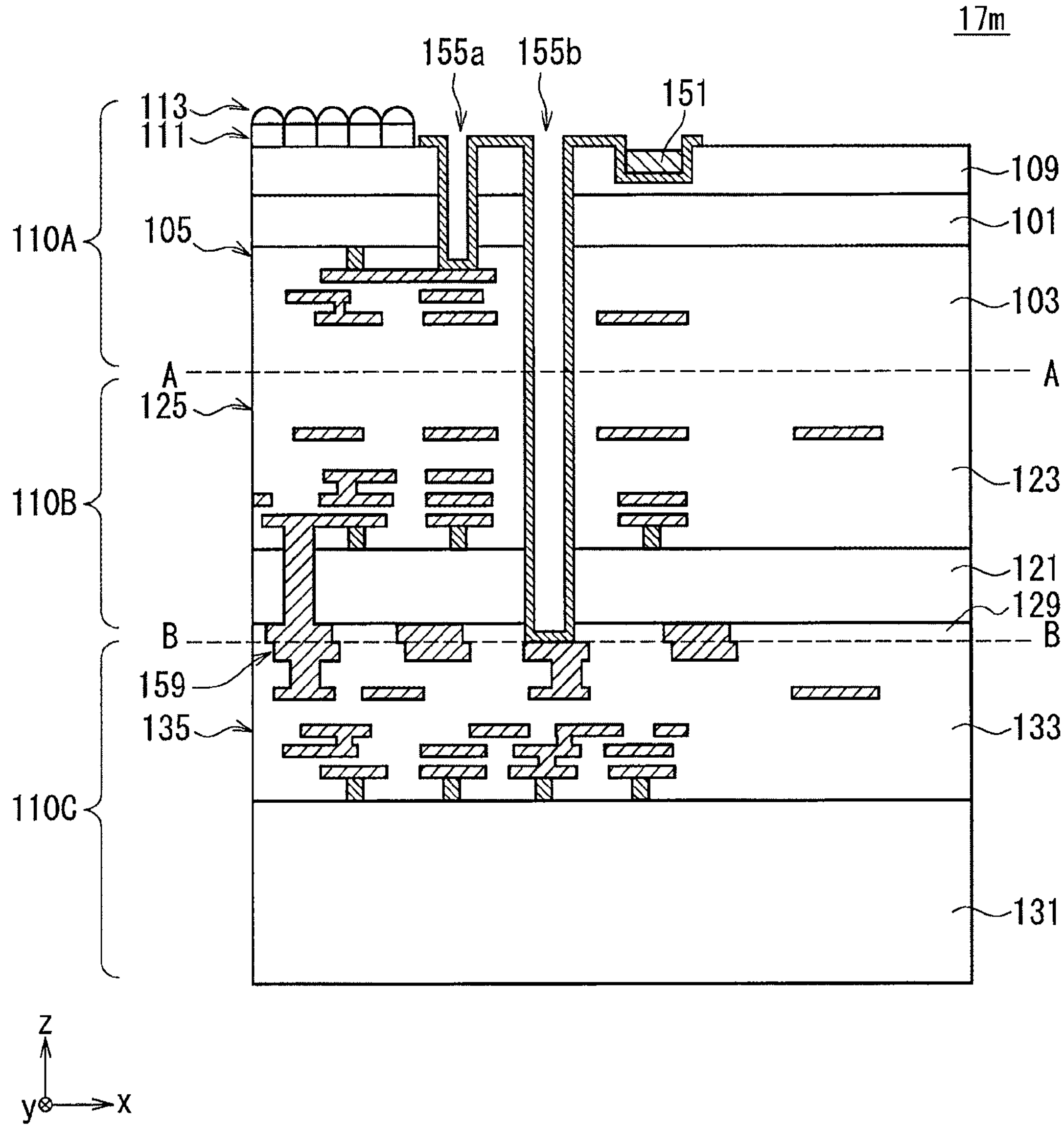

FIG. 21M is a vertical cross-sectional view of a schematic configuration of the solid-state imaging device according to the sixteenth configuration example of the present embodiment.

Figure 22A:
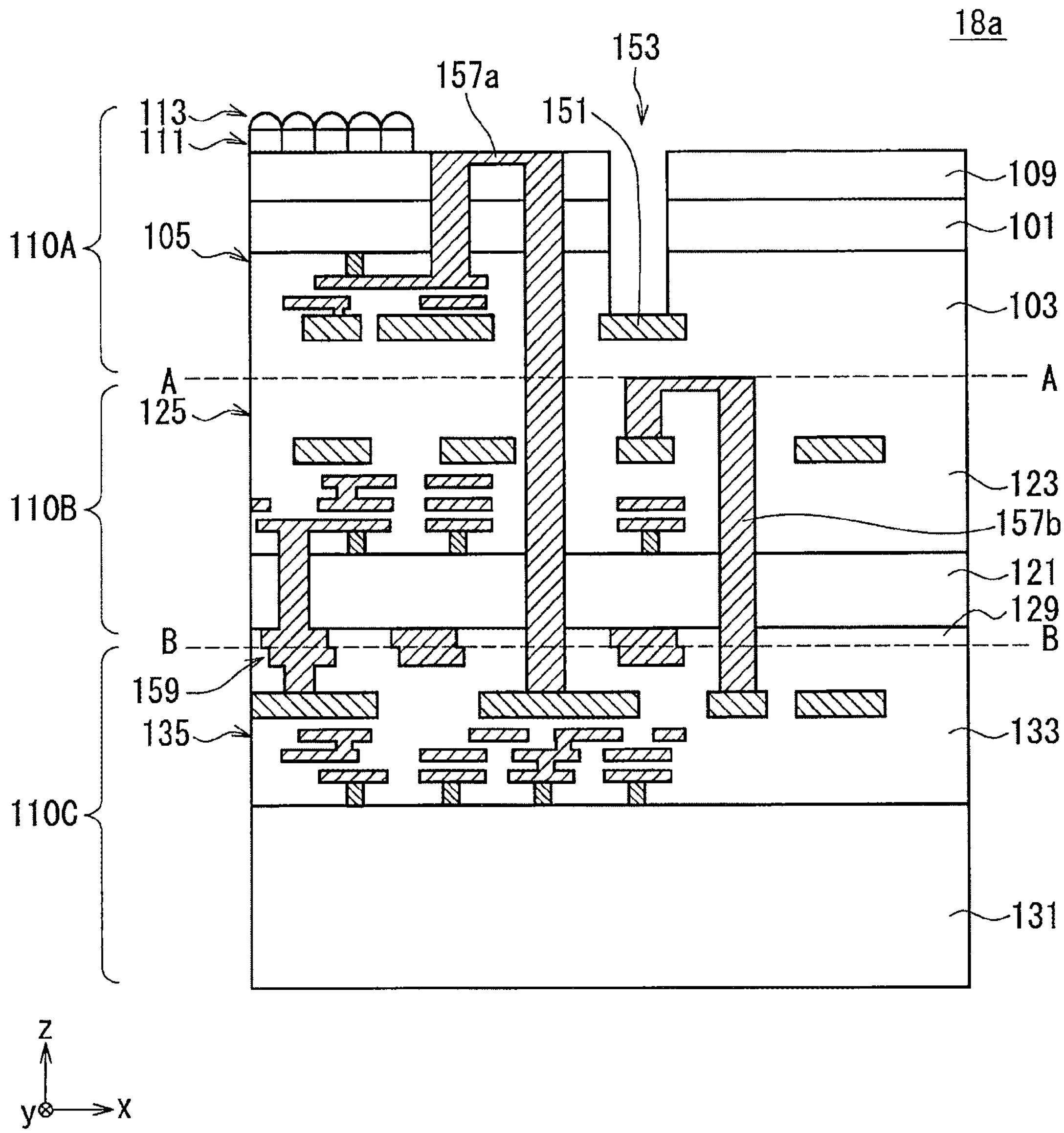

FIG. 22A is a vertical cross-sectional view of a schematic configuration of a solid-state imaging device according to a seventeenth configuration example of the present embodiment.

Figure 22B:
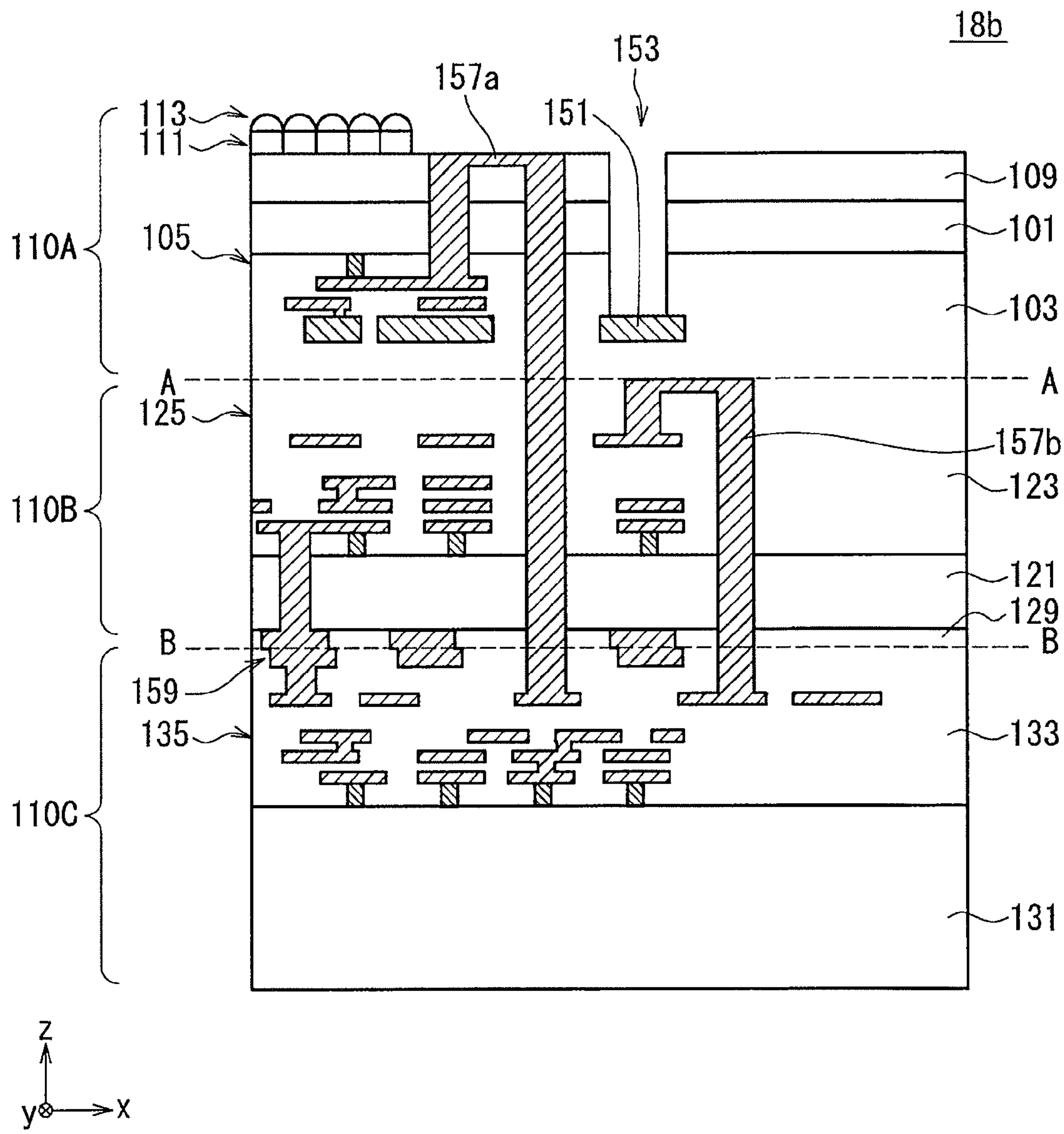

FIG. 22B is a vertical cross-sectional view of a schematic configuration of the solid-state imaging device according to the seventeenth configuration example of the present embodiment.

Figure 22C:
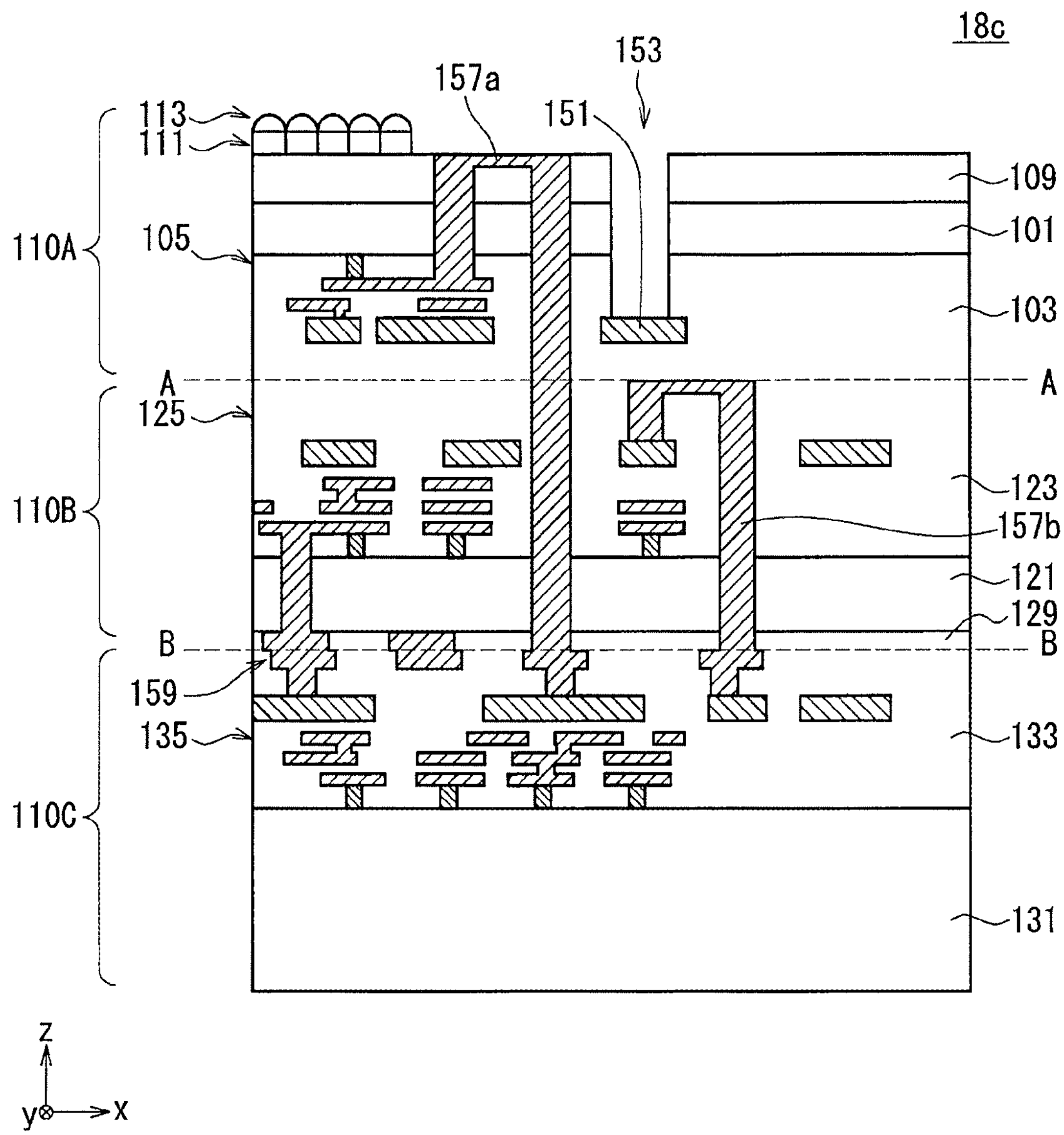

FIG. 22C is a vertical cross-sectional view of a schematic configuration of the solid-state imaging device according to the seventeenth configuration example of the present embodiment.

Figure 22D:
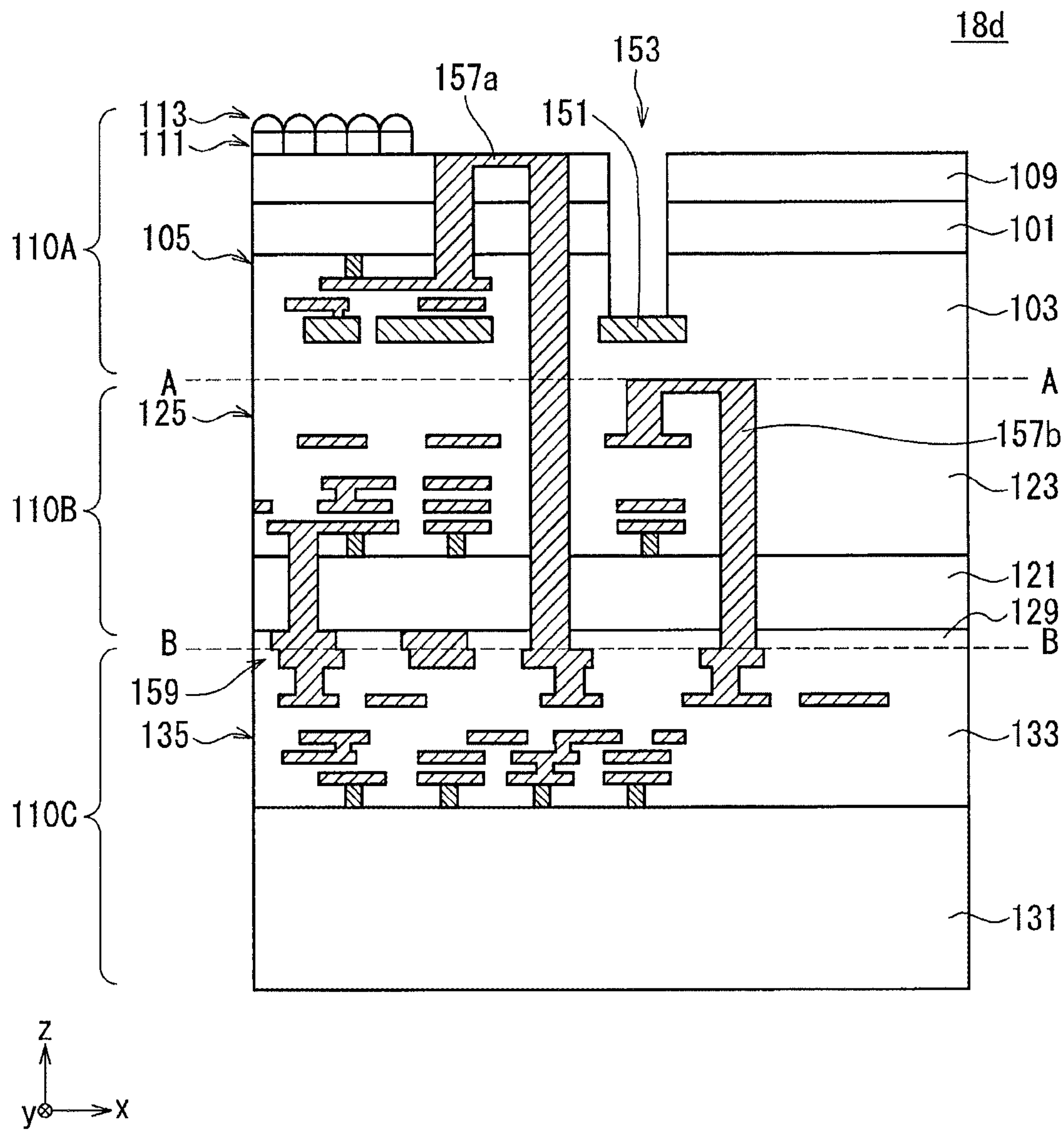

FIG. 22D is a vertical cross-sectional view of a schematic configuration of the solid-state imaging device according to the seventeenth configuration example of the present embodiment.

Figure 22E:
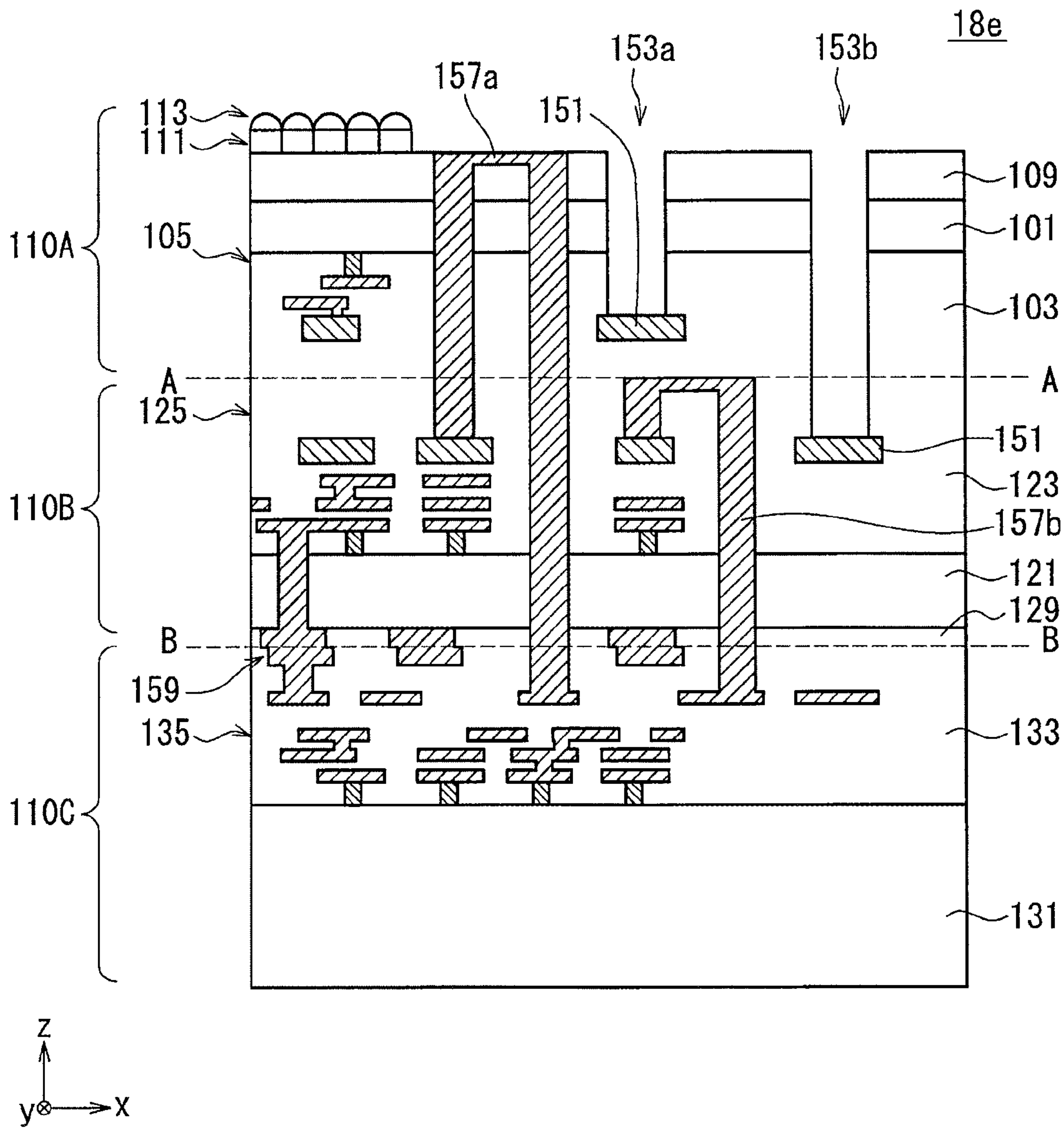

FIG. 22E is a vertical cross-sectional view of a schematic configuration of the solid-state imaging device according to the seventeenth configuration example of the present embodiment.

Figure 22F:
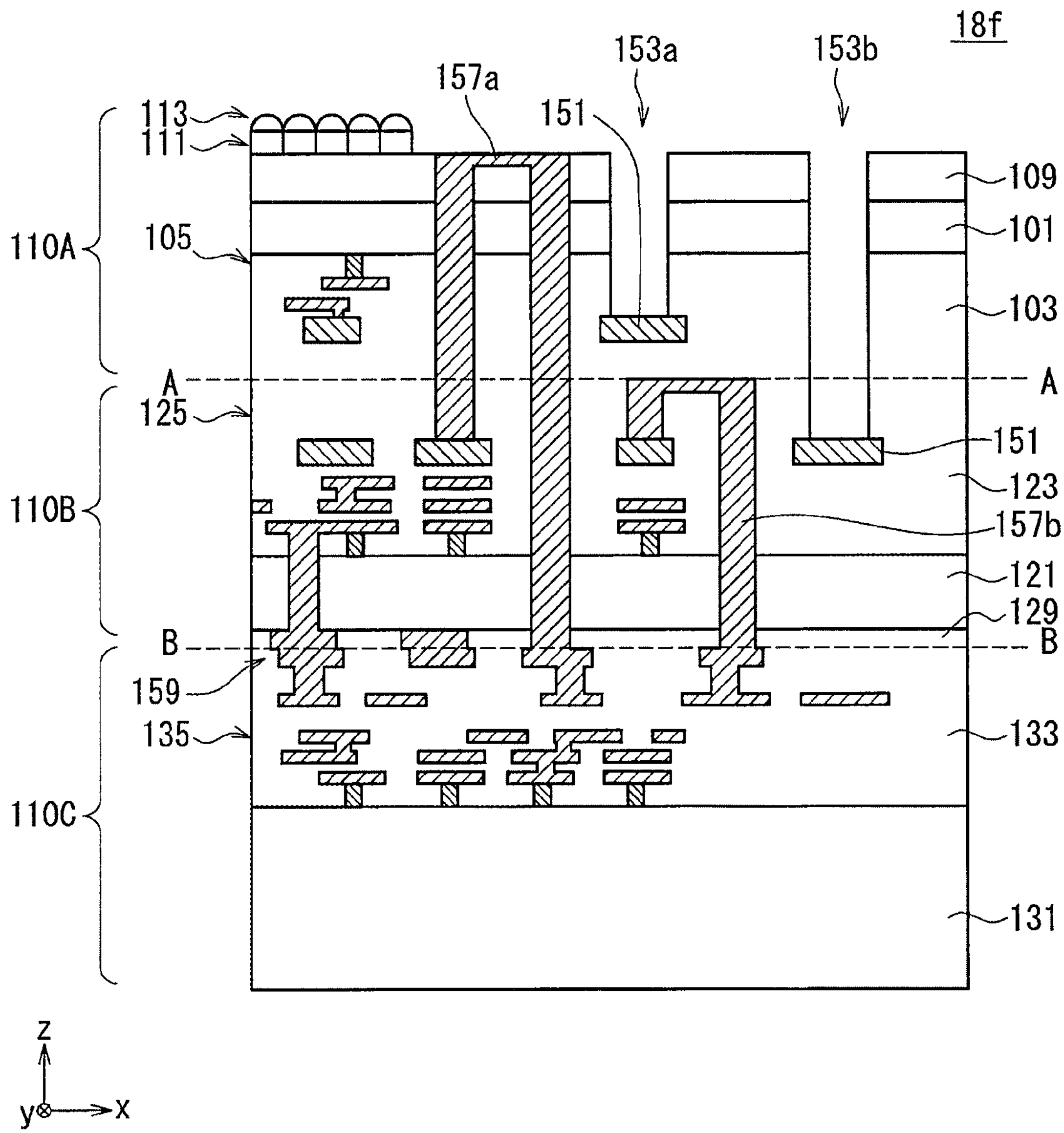

FIG. 22F is a vertical cross-sectional view of a schematic configuration of the solid-state imaging device according to the seventeenth configuration example of the present embodiment.

Figure 22G:
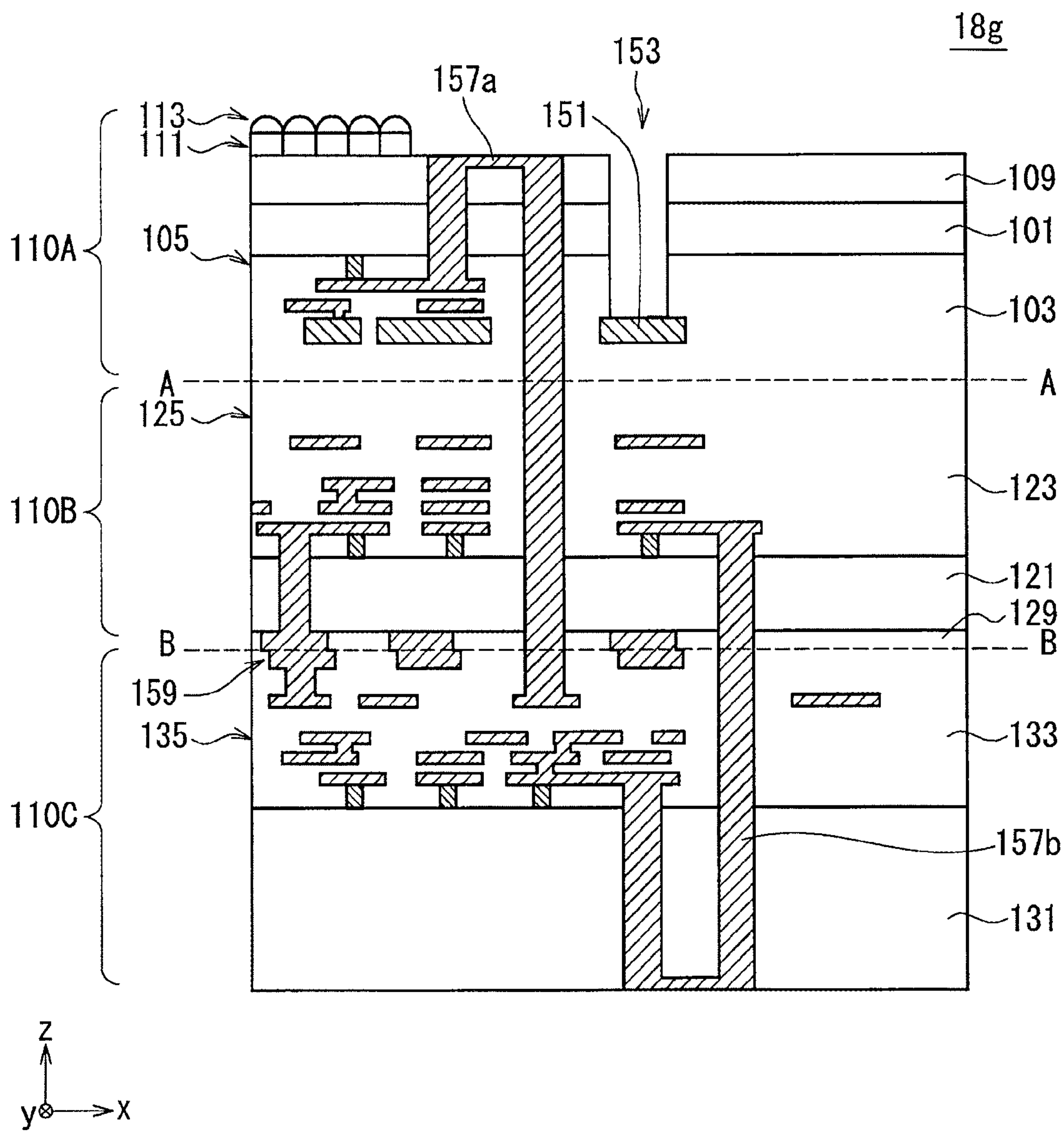

FIG. 22G is a vertical cross-sectional view of a schematic configuration of the solid-state imaging device according to the seventeenth configuration example of the present embodiment.

Figure 22H:
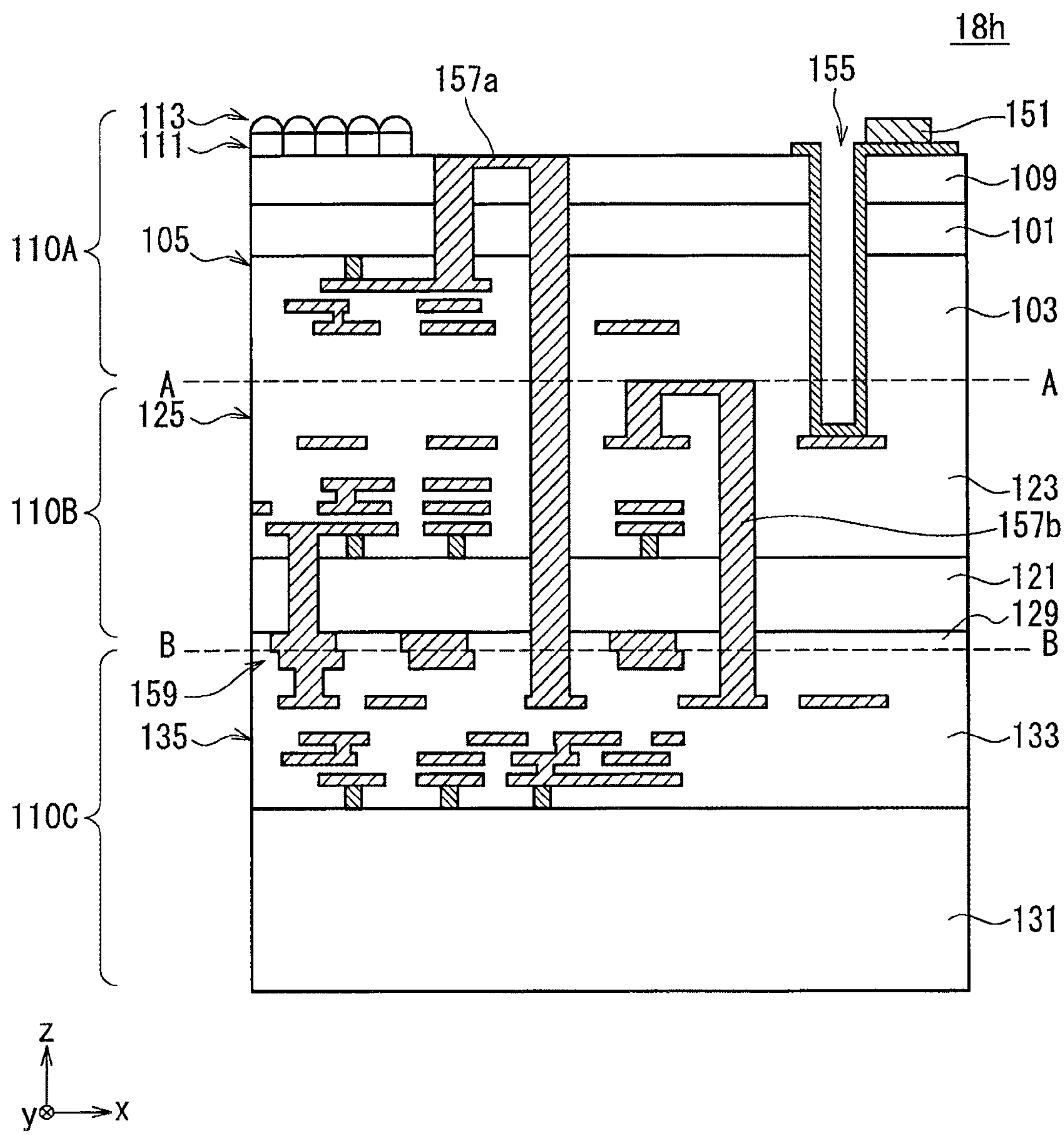

FIG. 22H is a vertical cross-sectional view of a schematic configuration of the solid-state imaging device according to the seventeenth configuration example of the present embodiment.

Figure 22I:
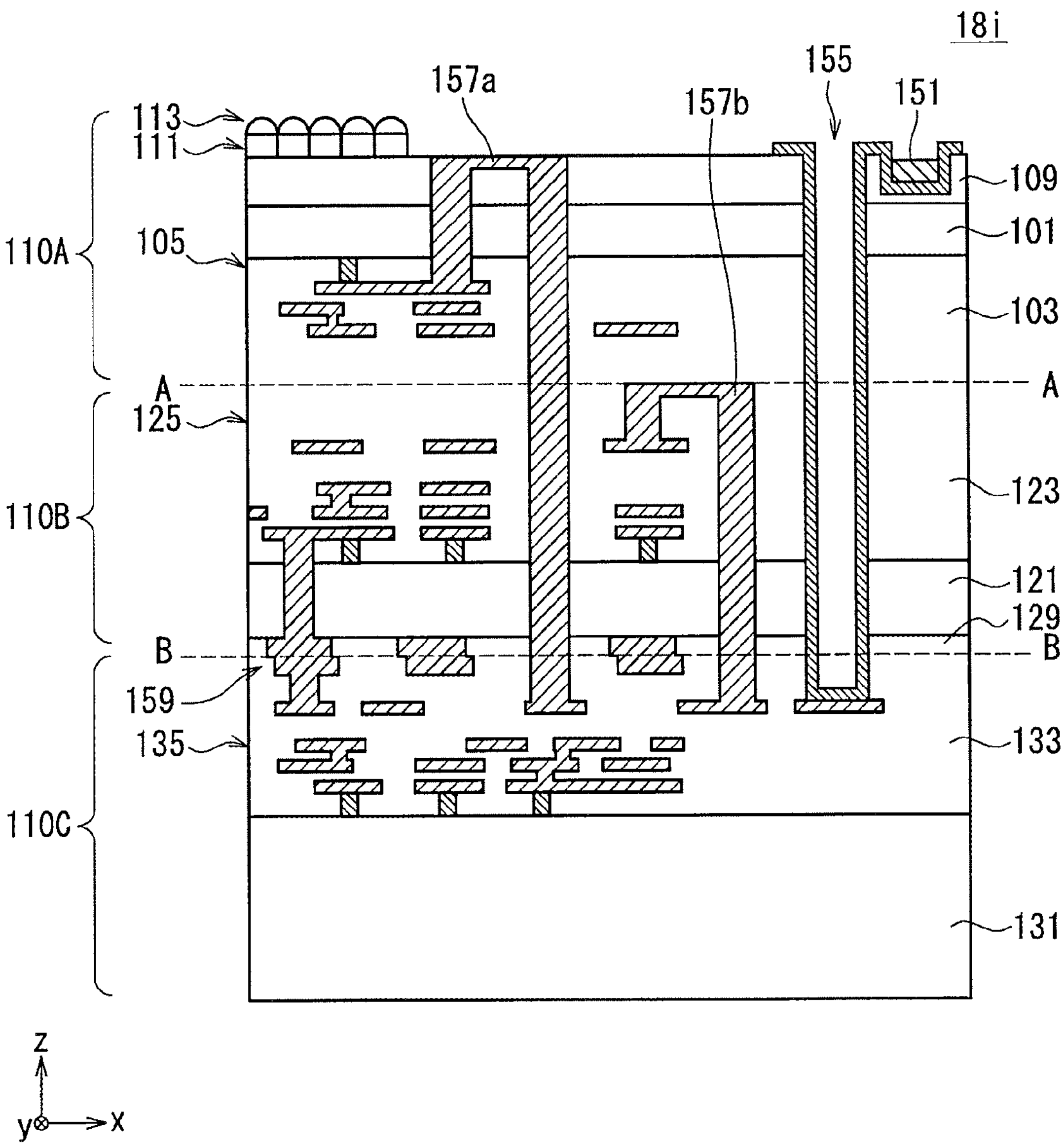

FIG. 22I is a vertical cross-sectional view of a schematic configuration of the solid-state imaging device according to the seventeenth configuration example of the present embodiment.

Figure 22J:
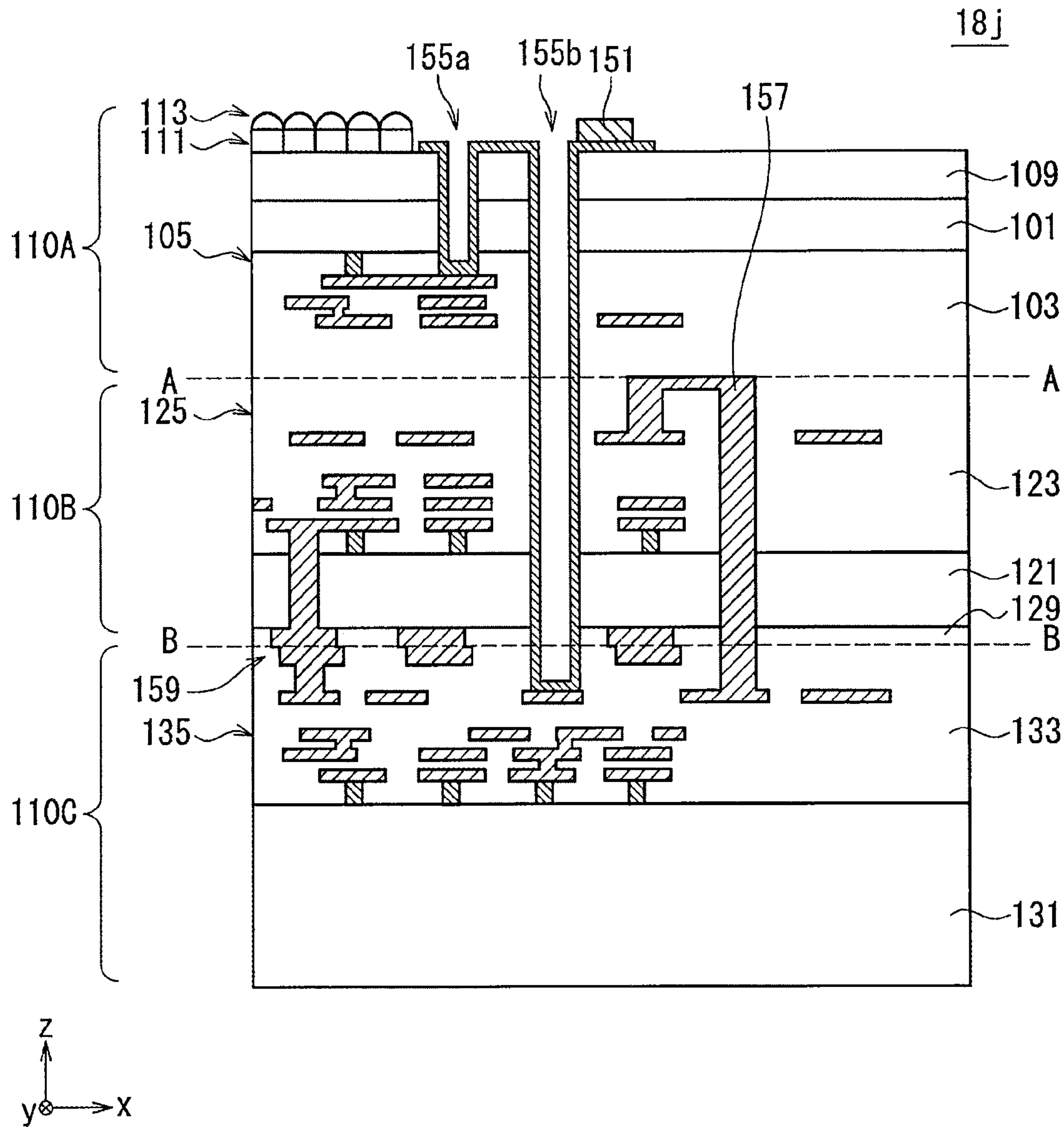

FIG. 22J is a vertical cross-sectional view of a schematic configuration of the solid-state imaging device according to the seventeenth configuration example of the present embodiment.

Figure 22K:
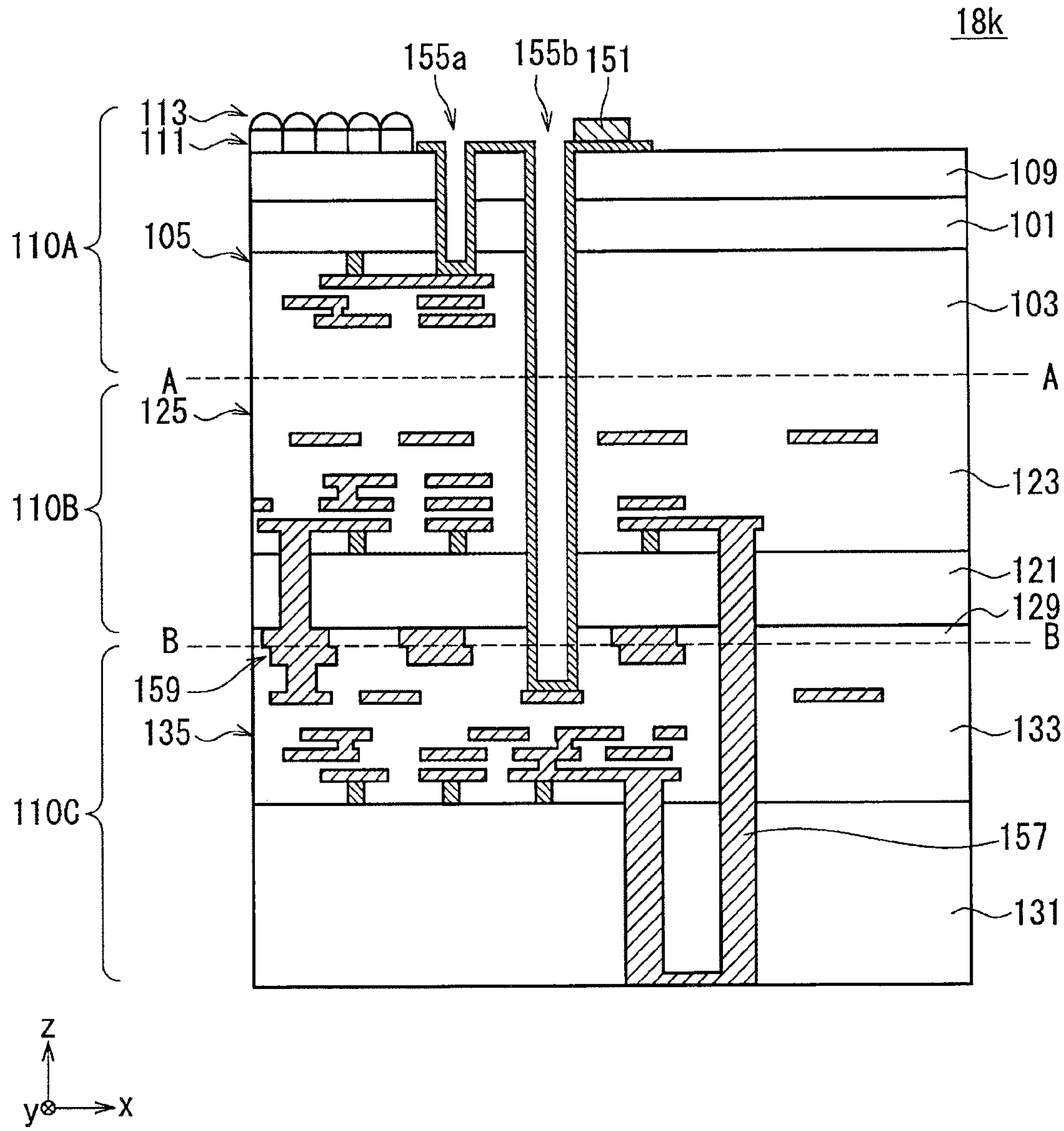

FIG. 22K is a vertical cross-sectional view of a schematic configuration of the solid-state imaging device according to the seventeenth configuration example of the present embodiment.

Figure 22L:
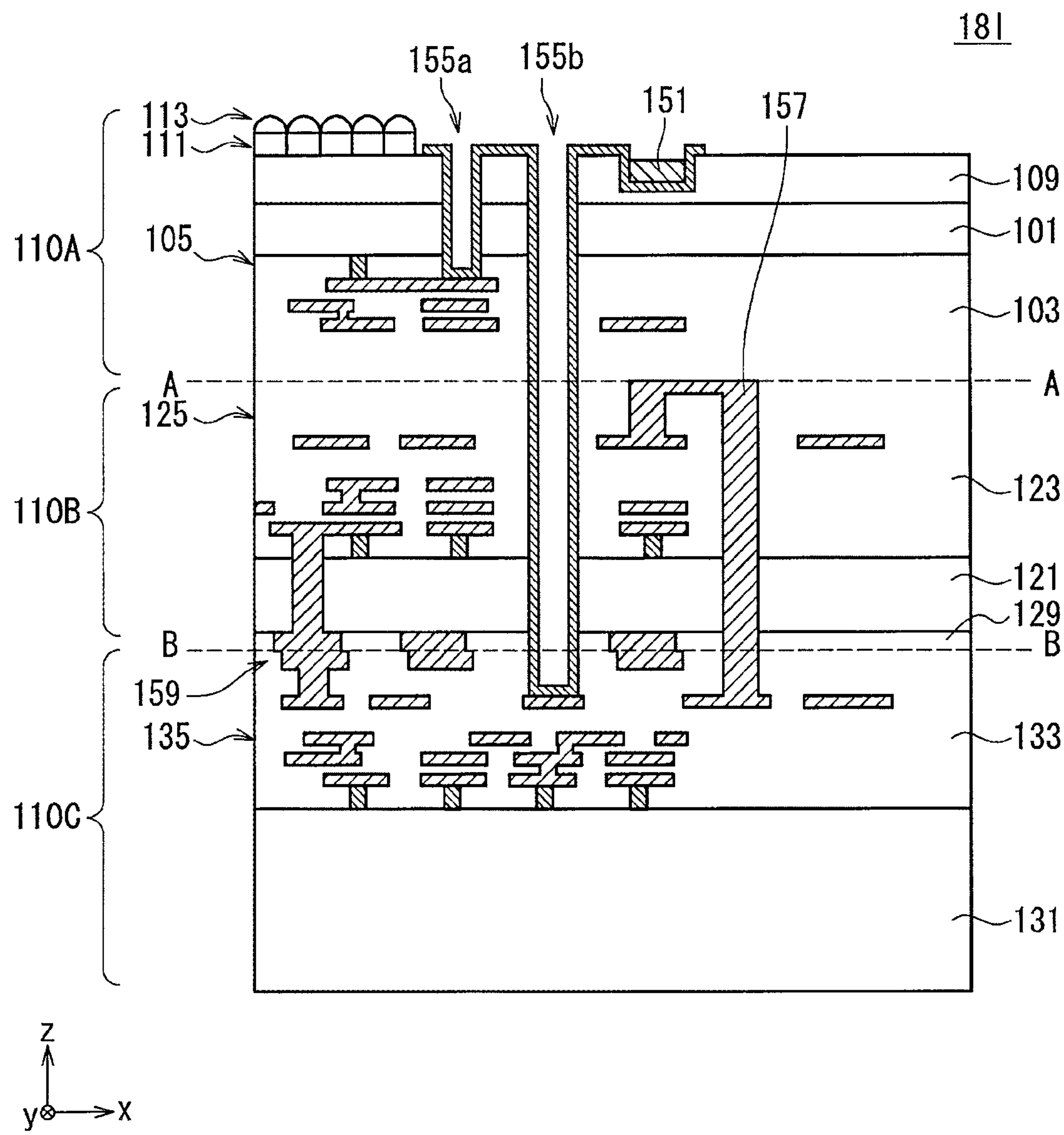

FIG. 22L is a vertical cross-sectional view of a schematic configuration of the solid-state imaging device according to the seventeenth configuration example of the present embodiment.

Figure 22M:
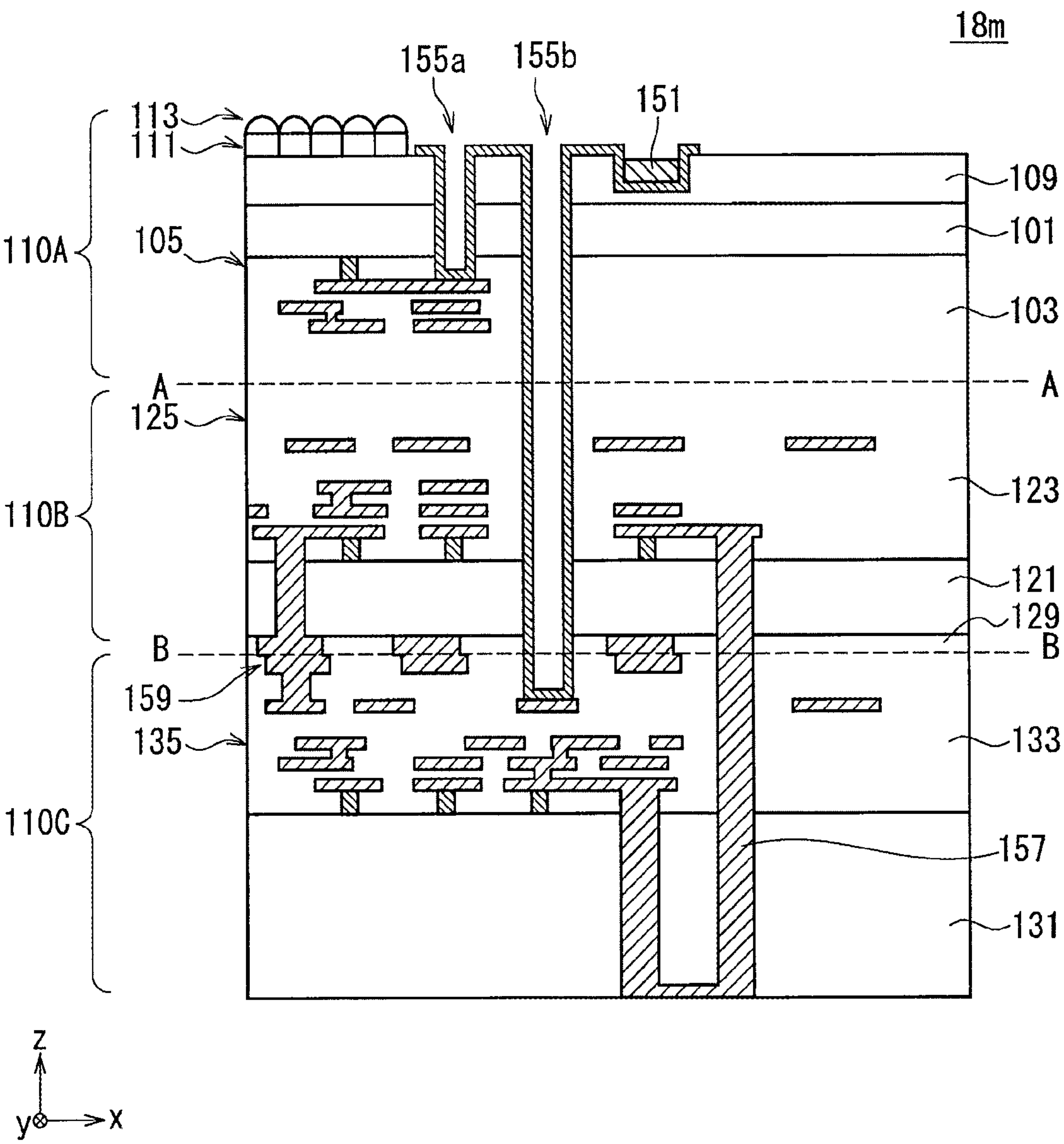

FIG. 22M is a vertical cross-sectional view of a schematic configuration of the solid-state imaging device according to the seventeenth configuration example of the present embodiment.

Figure 23A:
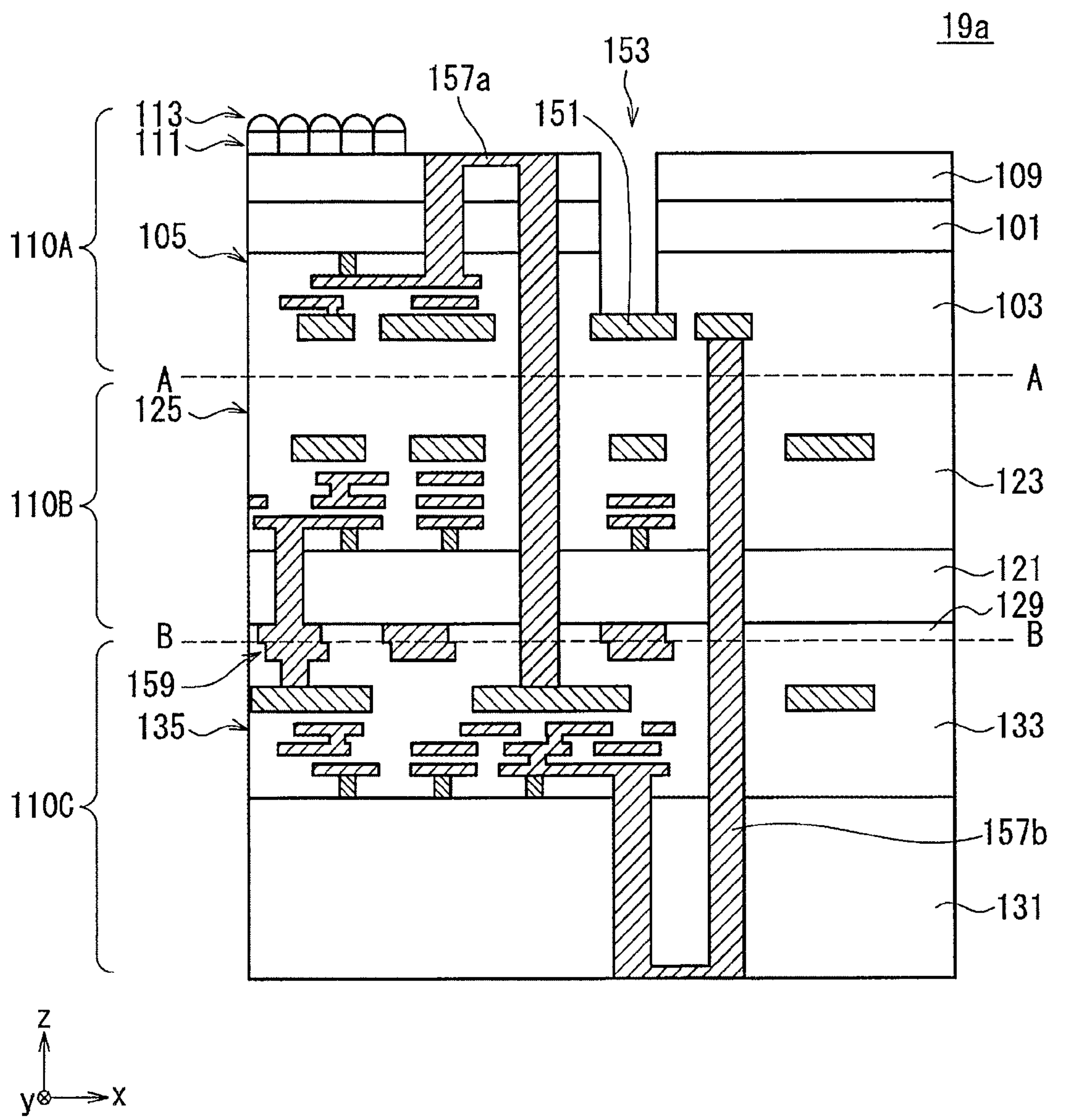

FIG. 23A is a vertical cross-sectional view of a schematic configuration of a solid-state imaging device according to an eighteenth configuration example of the present embodiment.

Figure 23B:
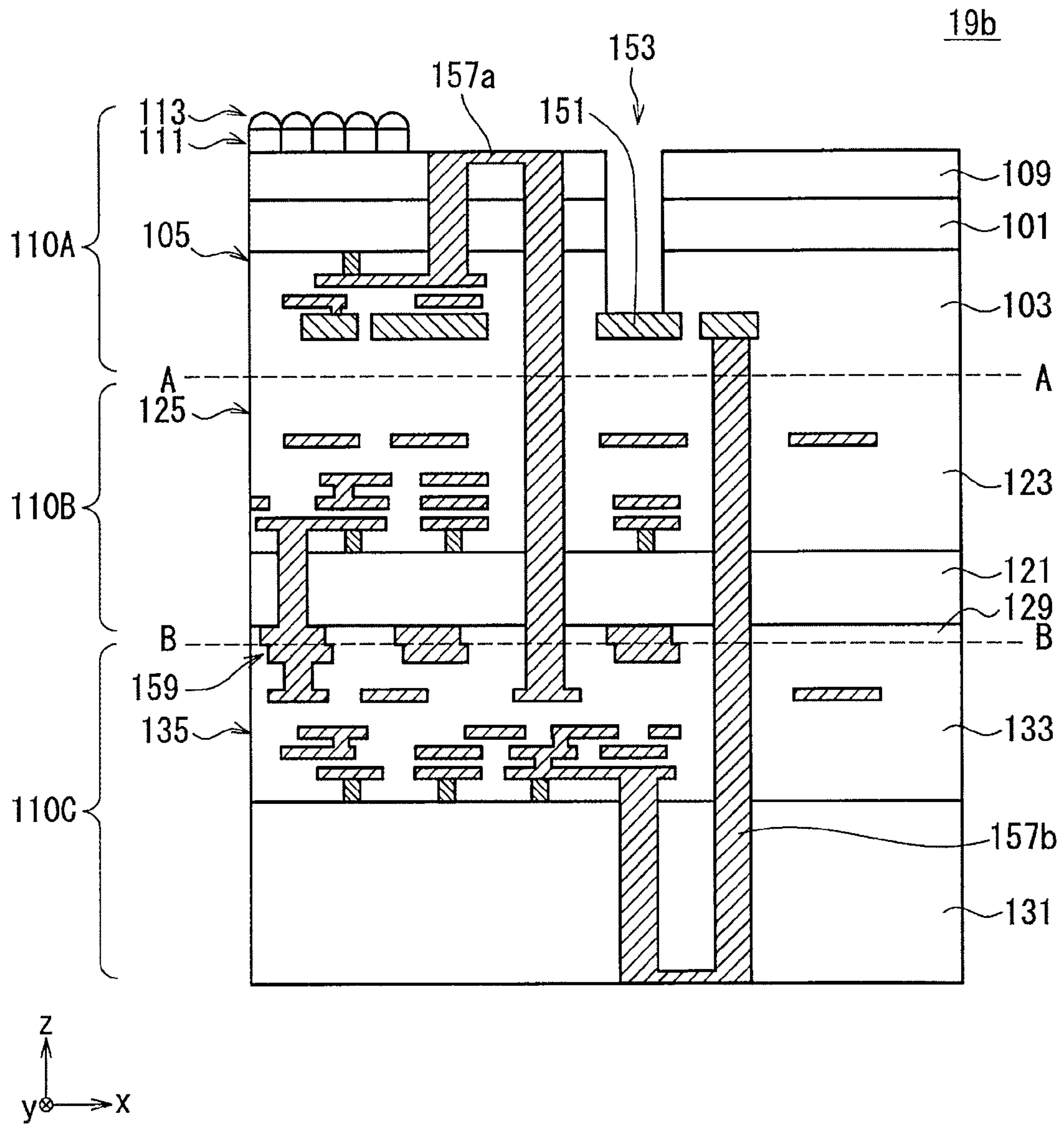

FIG. 23B is a vertical cross-sectional view of a schematic configuration of the solid-state imaging device according to the eighteenth configuration example of the present embodiment.

Figure 23C:
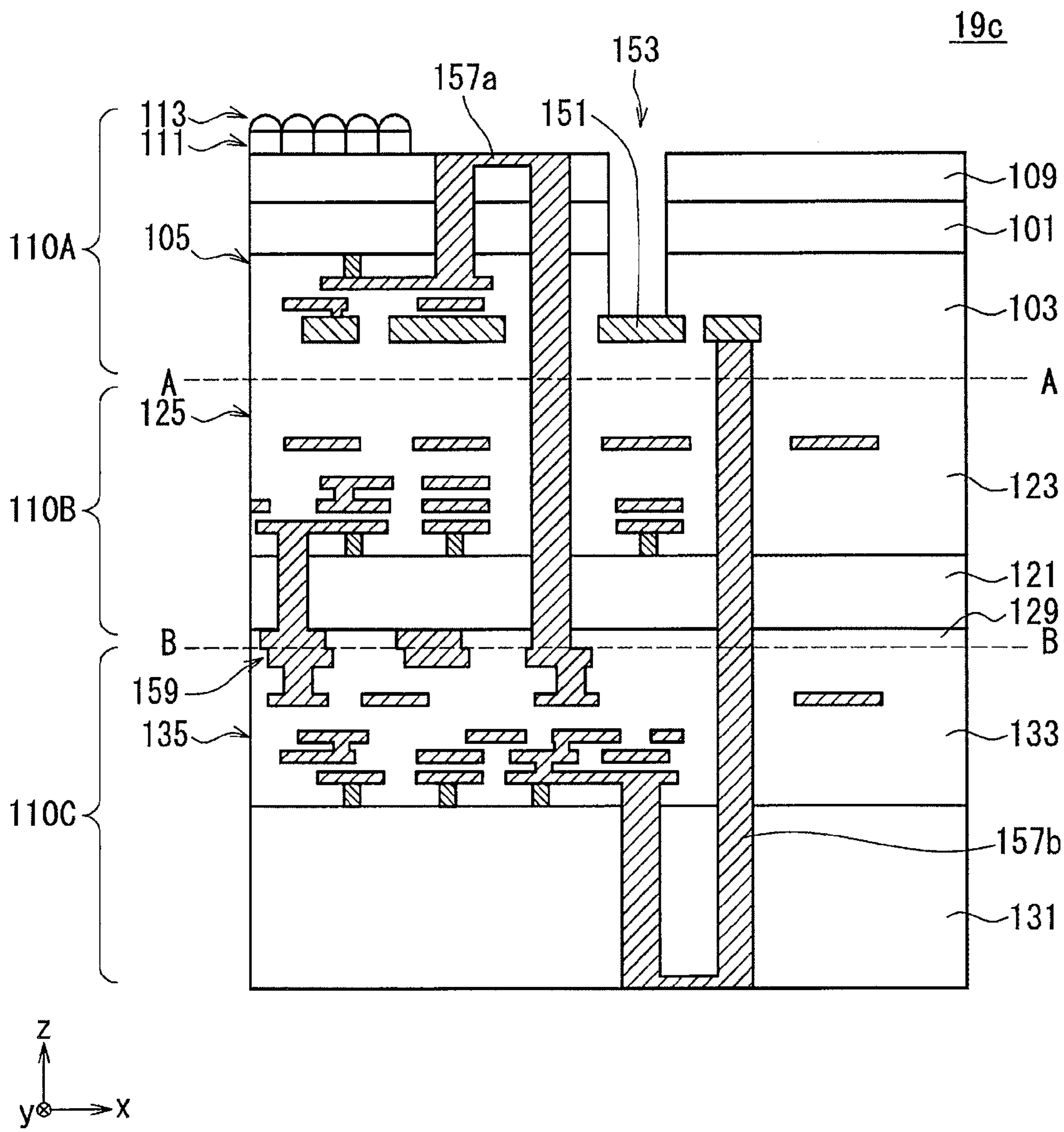

FIG. 23C is a vertical cross-sectional view of a schematic configuration of the solid-state imaging device according to the eighteenth configuration example of the present embodiment.

Figure 23D:
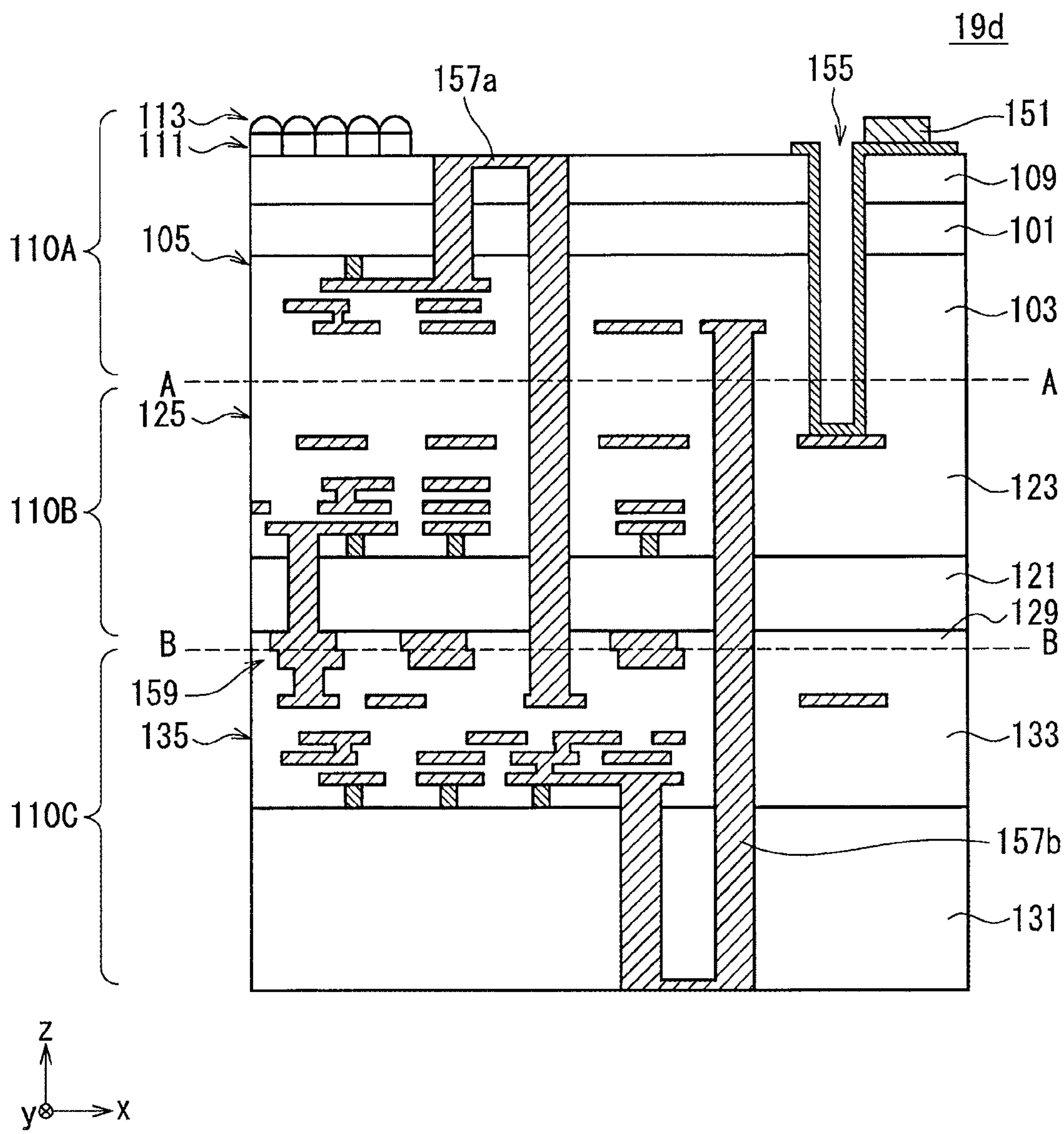

FIG. 23D is a vertical cross-sectional view of a schematic configuration of the solid-state imaging device according to the eighteenth configuration example of the present embodiment.

Figure 23E:
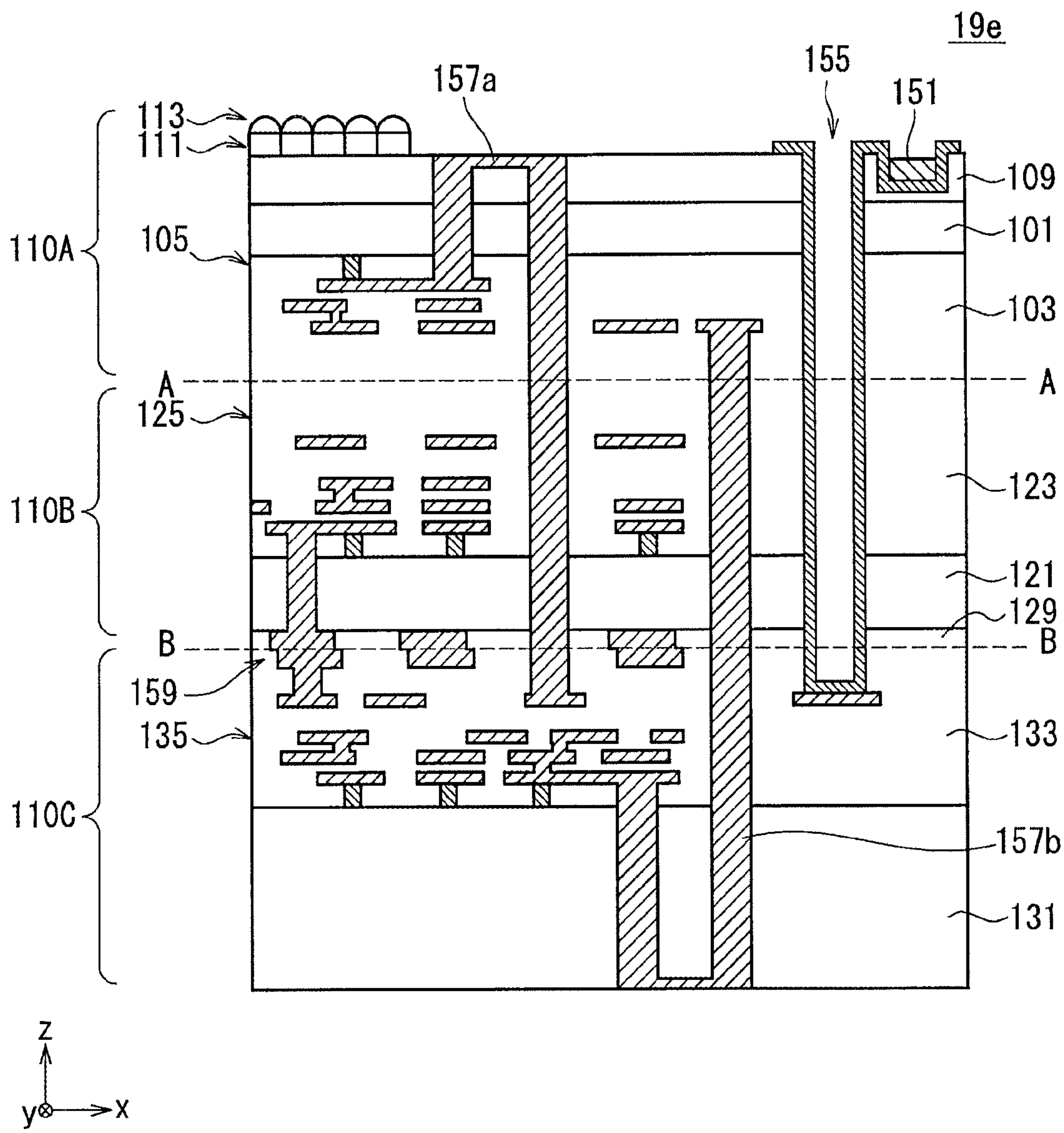

FIG. 23E is a vertical cross-sectional view of a schematic configuration of the solid-state imaging device according to the eighteenth configuration example of the present embodiment.

Figure 23F:
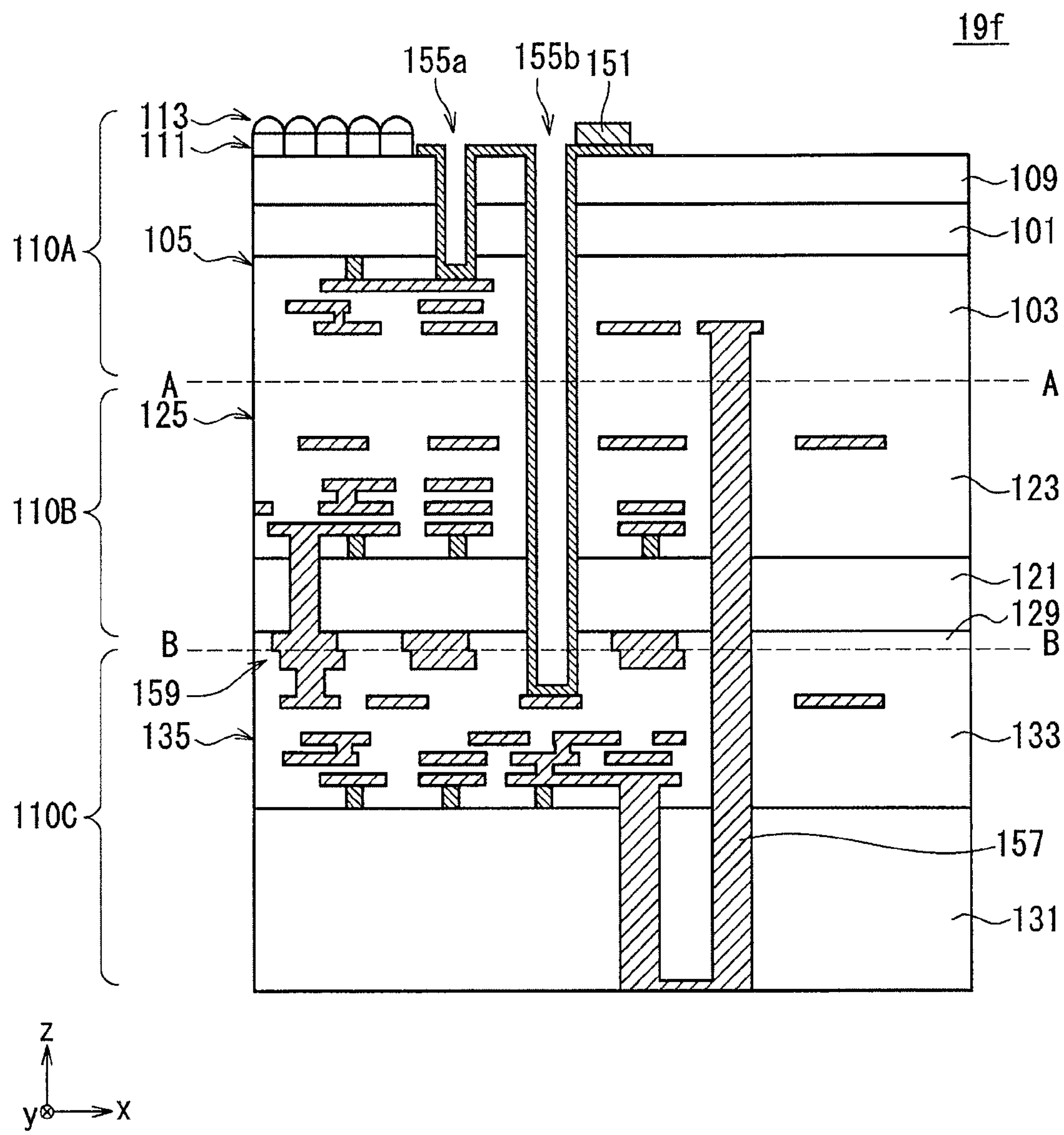

FIG. 23F is a vertical cross-sectional view of a schematic configuration of the solid-state imaging device according to the eighteenth configuration example of the present embodiment.

Figure 23G:
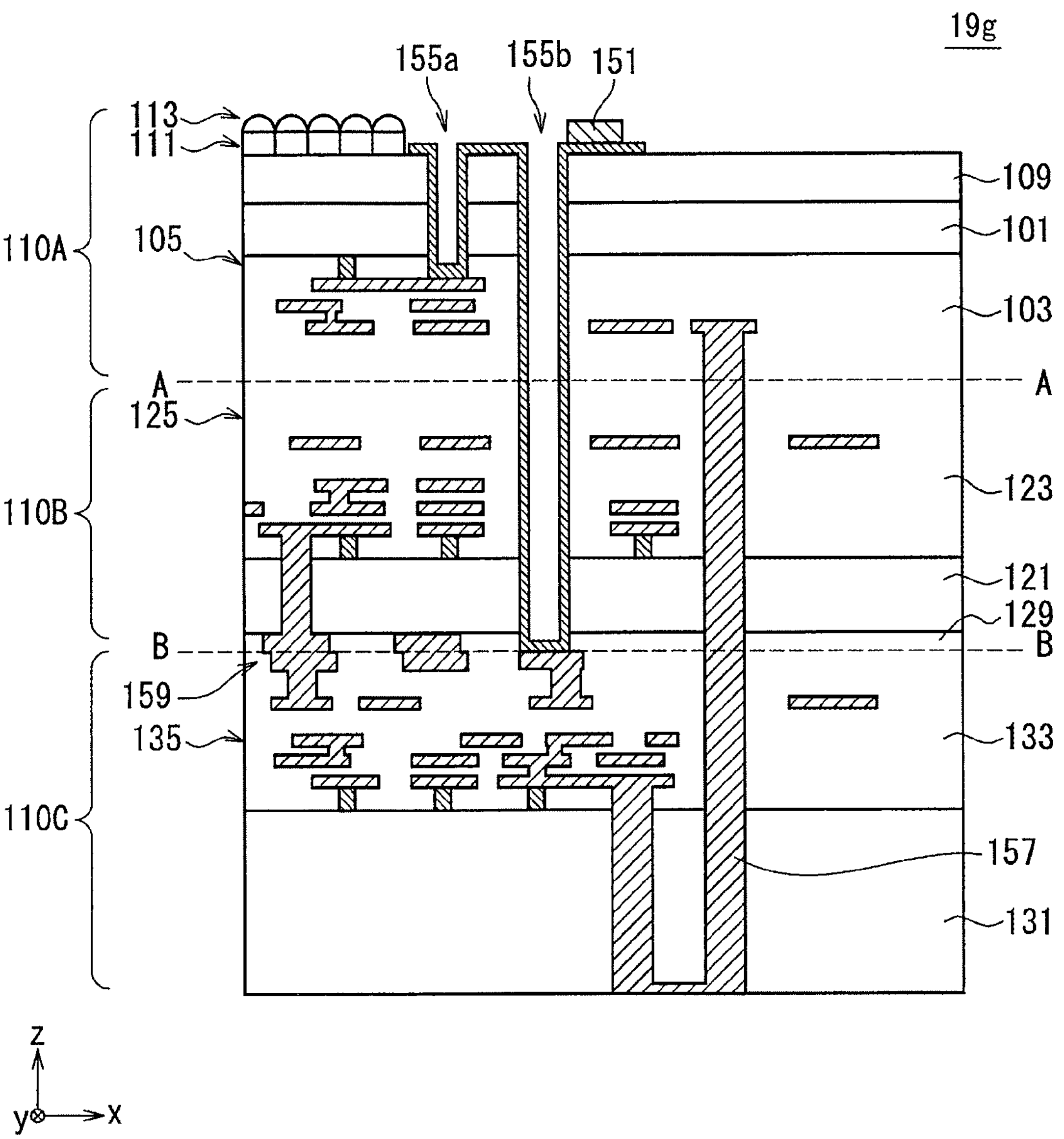

FIG. 23G is a vertical cross-sectional view of a schematic configuration of the solid-state imaging device according to the eighteenth configuration example of the present embodiment.

Figure 23H:
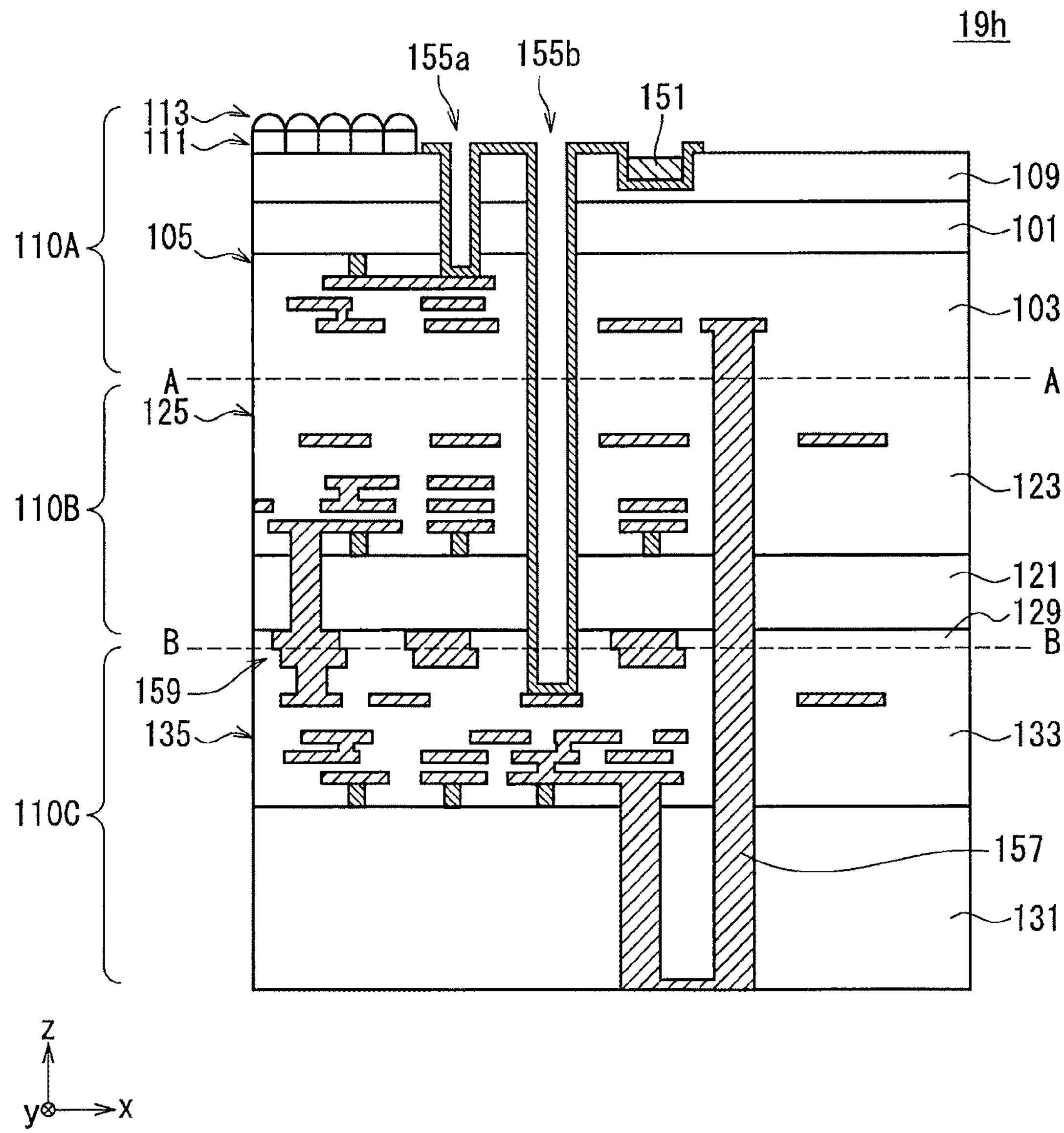

FIG. 23H is a vertical cross-sectional view of a schematic configuration of the solid-state imaging device according to the eighteenth configuration example of the present embodiment.

Figure 23I:
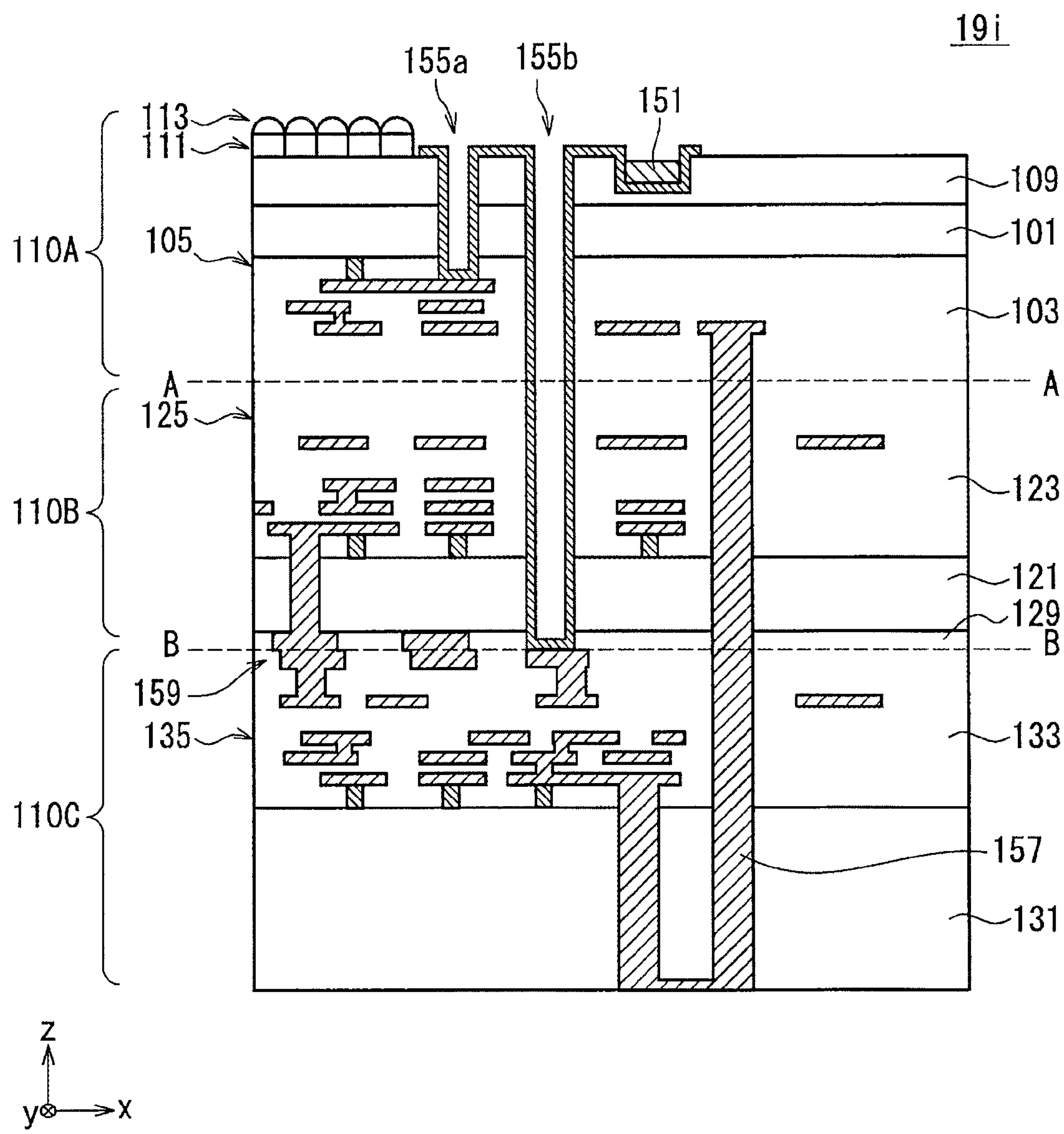

FIG. 23I is a vertical cross-sectional view of a schematic configuration of the solid-state imaging device according to the eighteenth configuration example of the present embodiment.

Figure 23J:
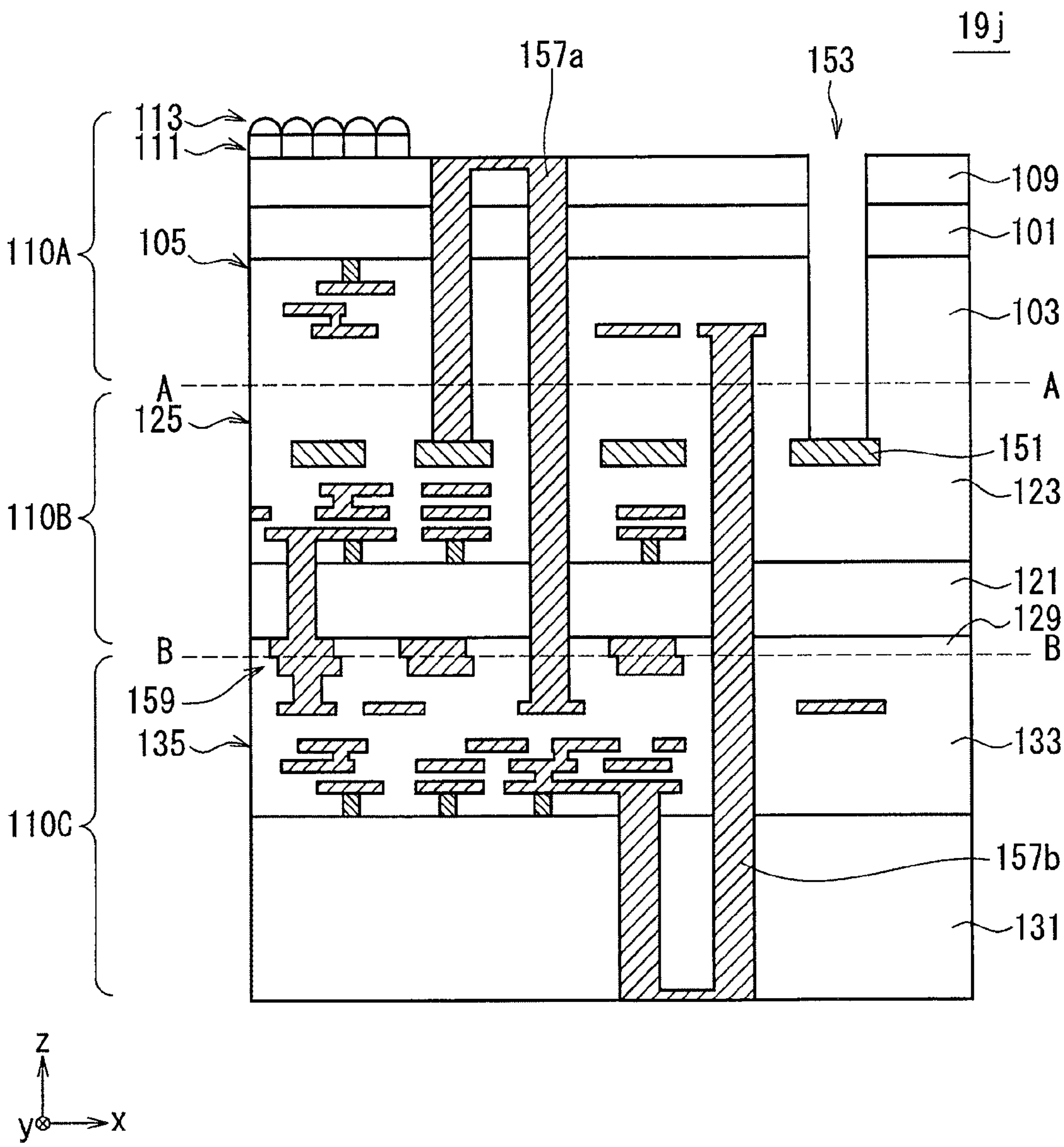

FIG. 23J is a vertical cross-sectional view of a schematic configuration of the solid-state imaging device according to the eighteenth configuration example of the present embodiment.

Figure 23K:
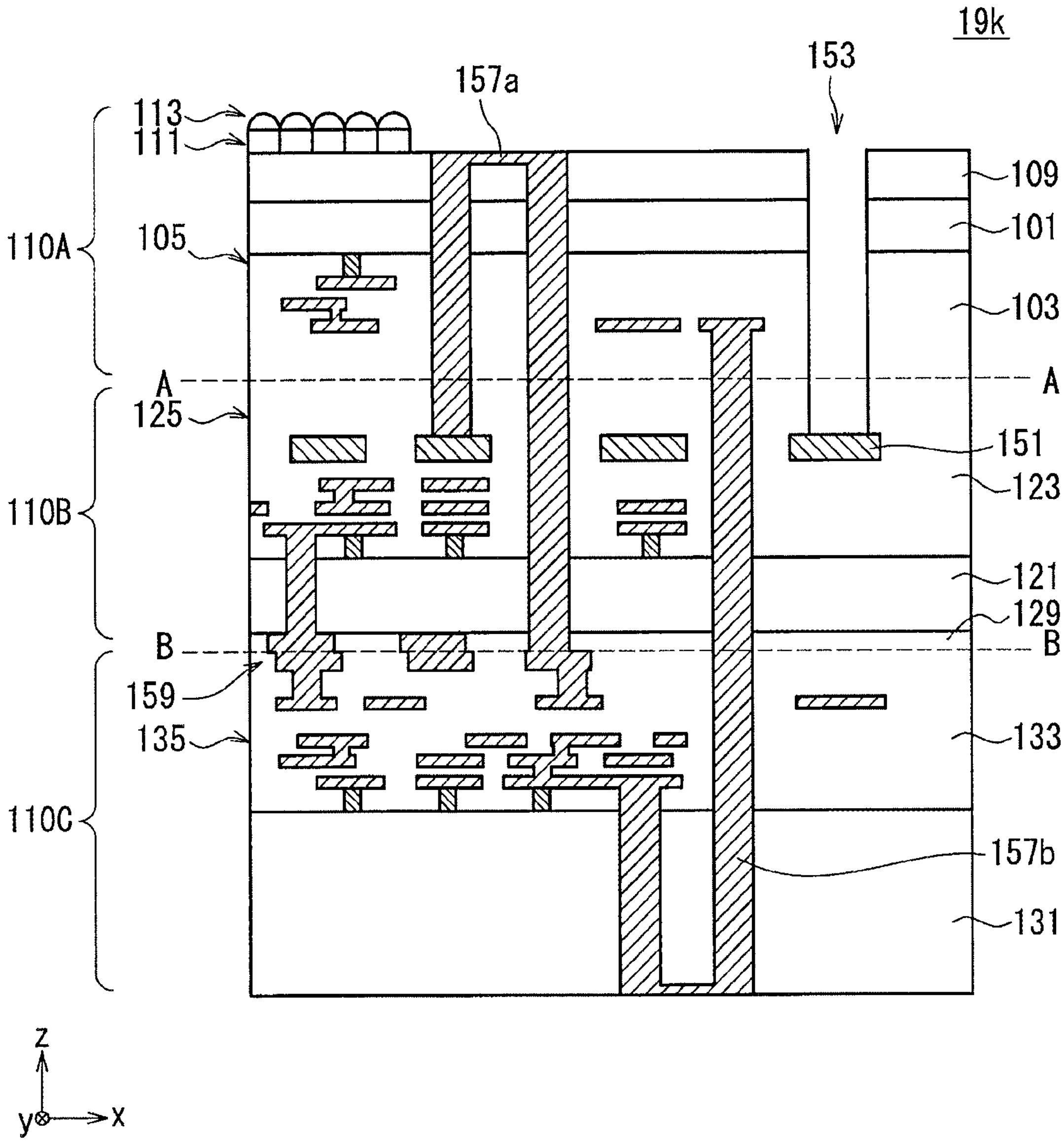

FIG. 23K is a vertical cross-sectional view of a schematic configuration of the solid-state imaging device according to the eighteenth configuration example of the present embodiment.

Figure 24A:
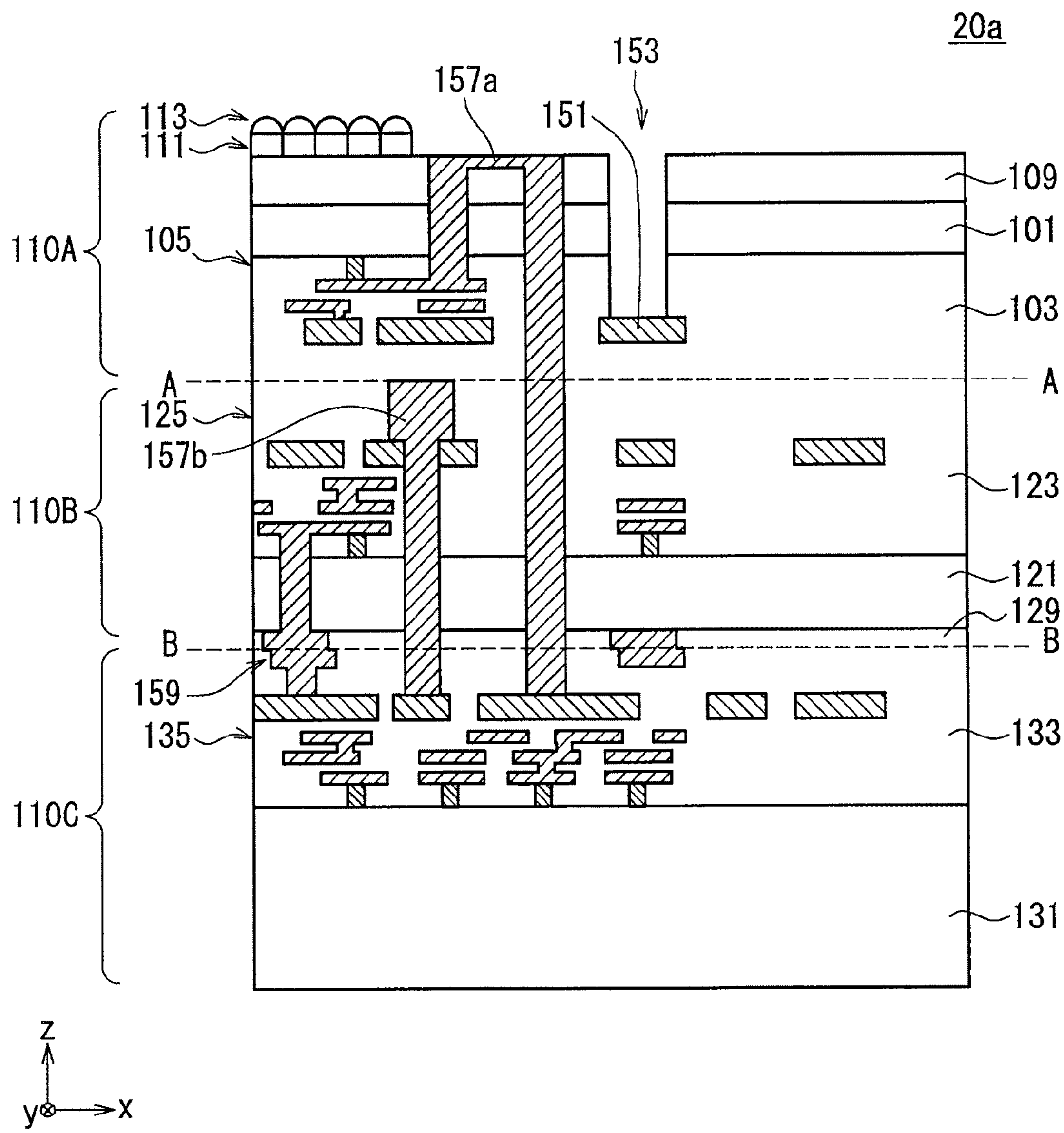

FIG. 24A is a vertical cross-sectional view of a schematic configuration of a solid-state imaging device according to a nineteenth configuration example of the present embodiment.

Figure 24B:
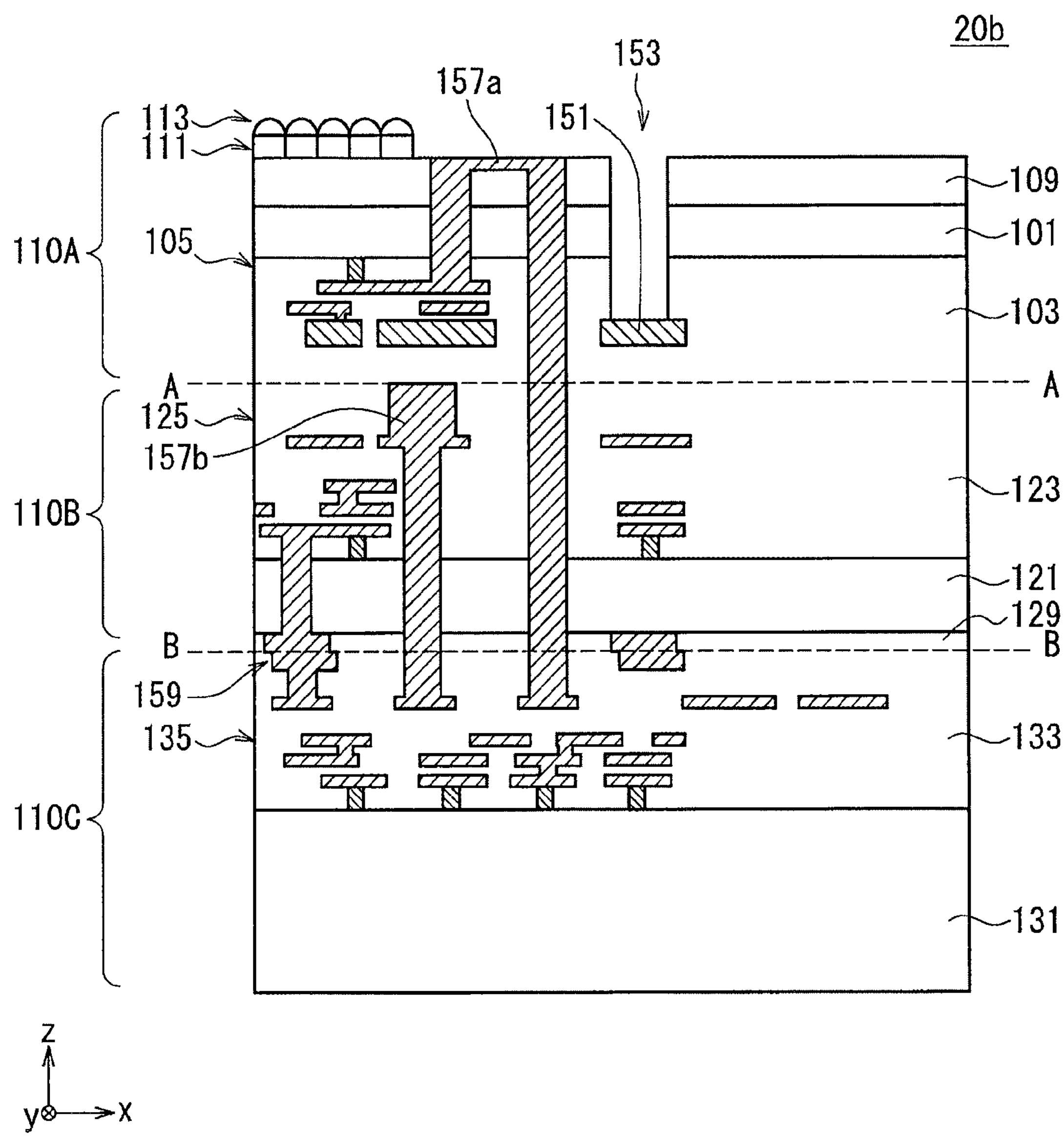

FIG. 24B is a vertical cross-sectional view of a schematic configuration of the solid-state imaging device according to the nineteenth configuration example of the present embodiment.

Figure 24C:
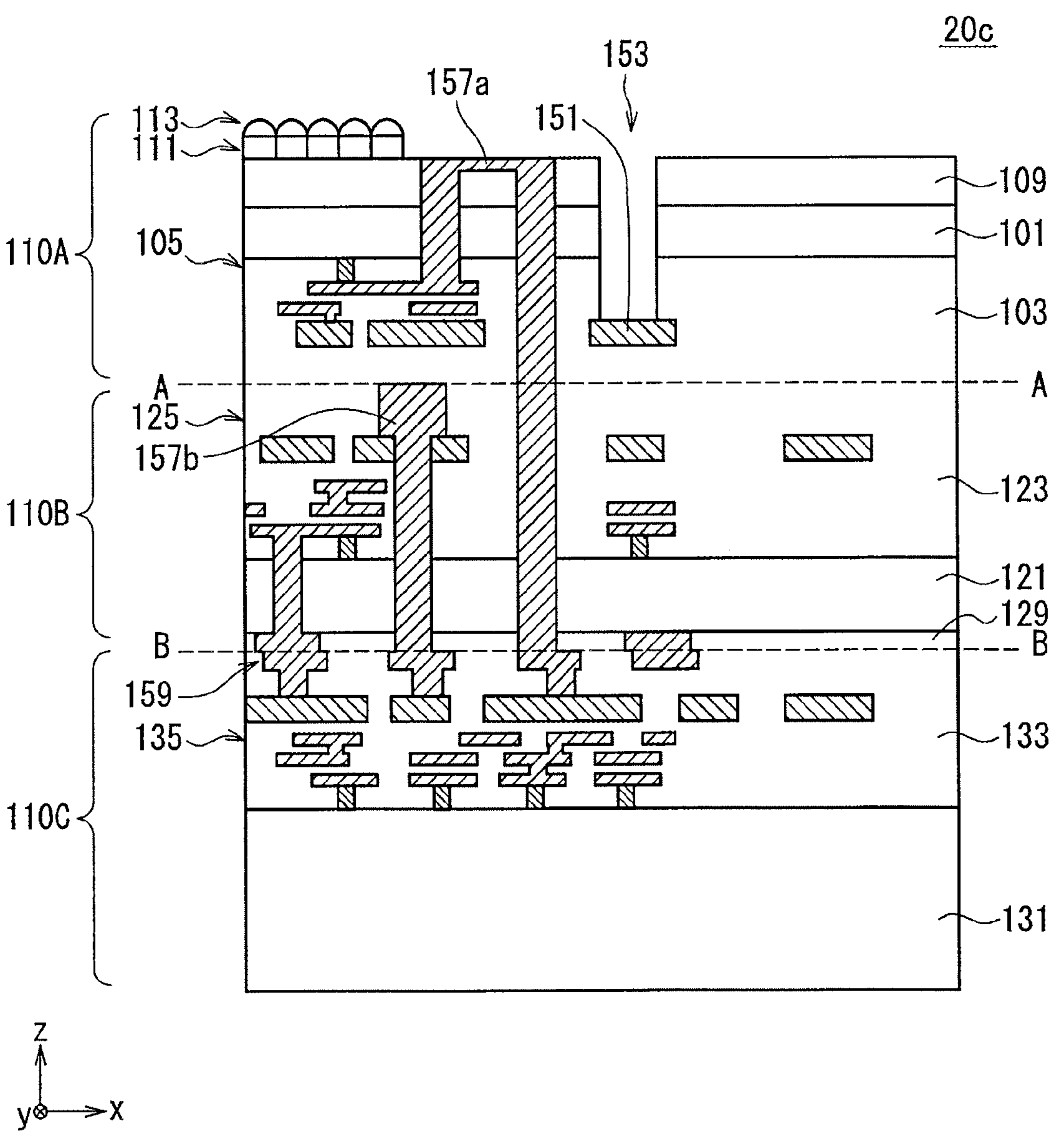

FIG. 24C is a vertical cross-sectional view of a schematic configuration of the solid-state imaging device according to the nineteenth configuration example of the present embodiment.

Figure 24D:
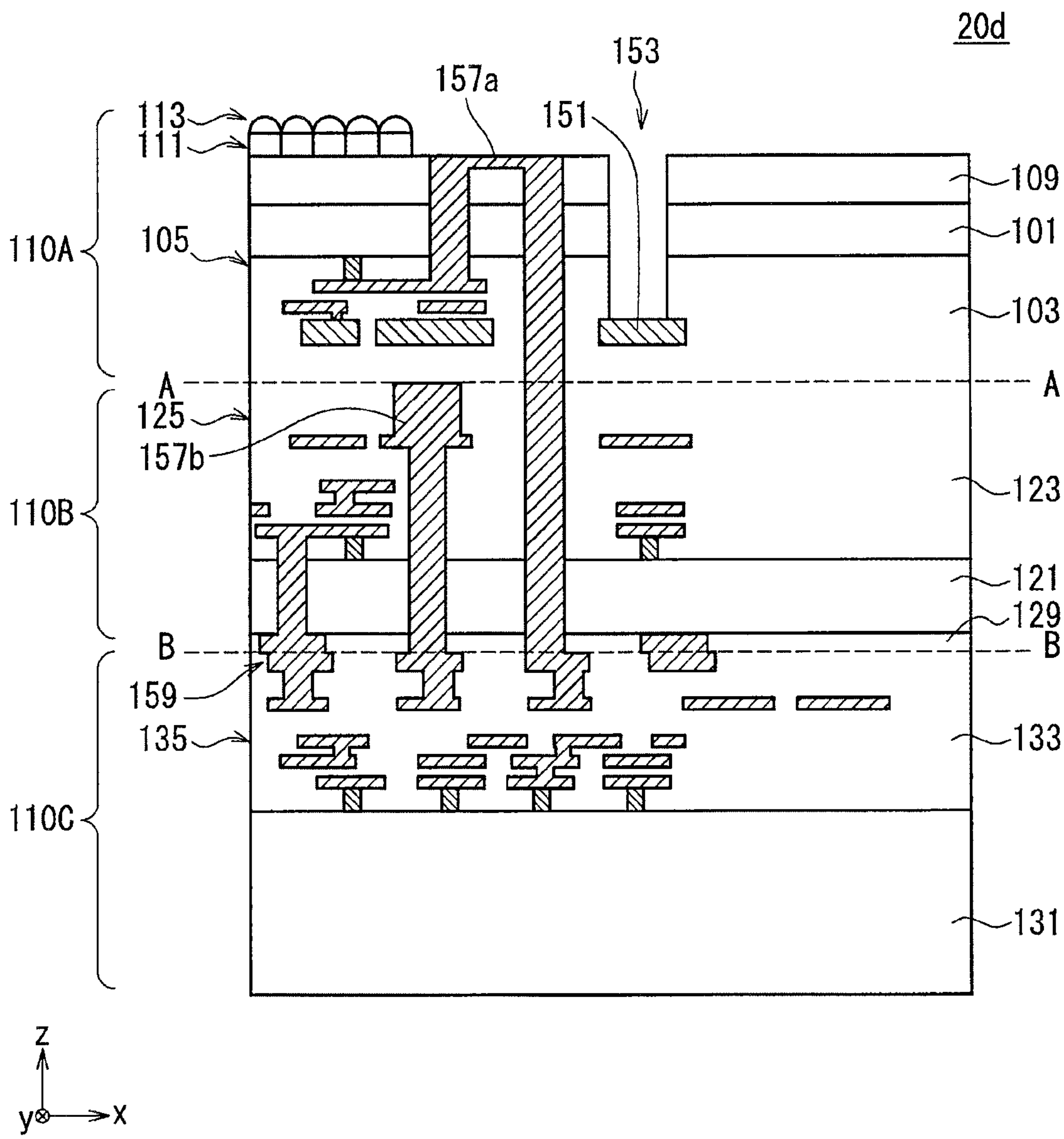

FIG. 24D is a vertical cross-sectional view of a schematic configuration of the solid-state imaging device according to the nineteenth configuration example of the present embodiment.

Figure 24E:
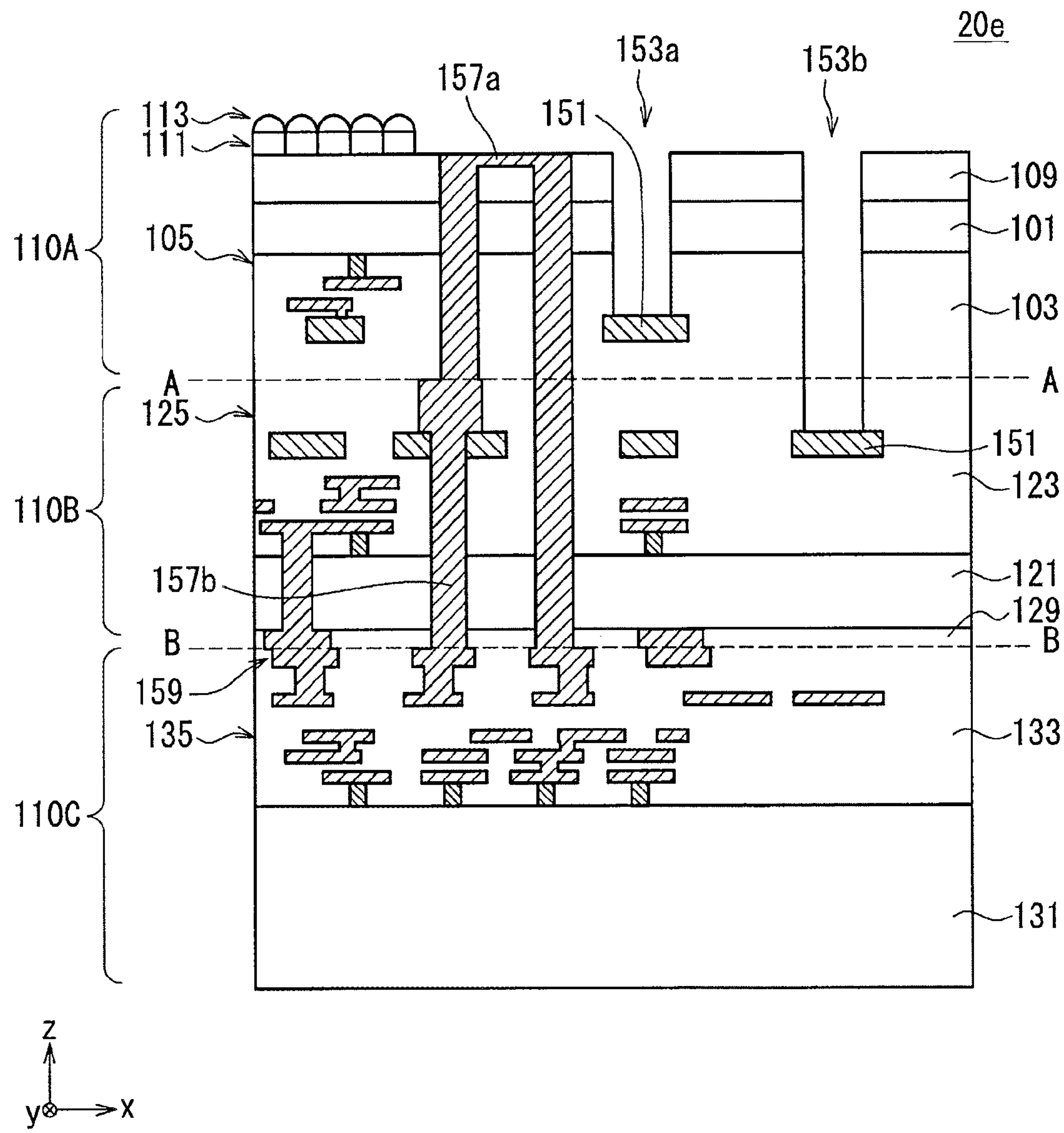

FIG. 24E is a vertical cross-sectional view of a schematic configuration of the solid-state imaging device according to the nineteenth configuration example of the present embodiment.

Figure 24F:
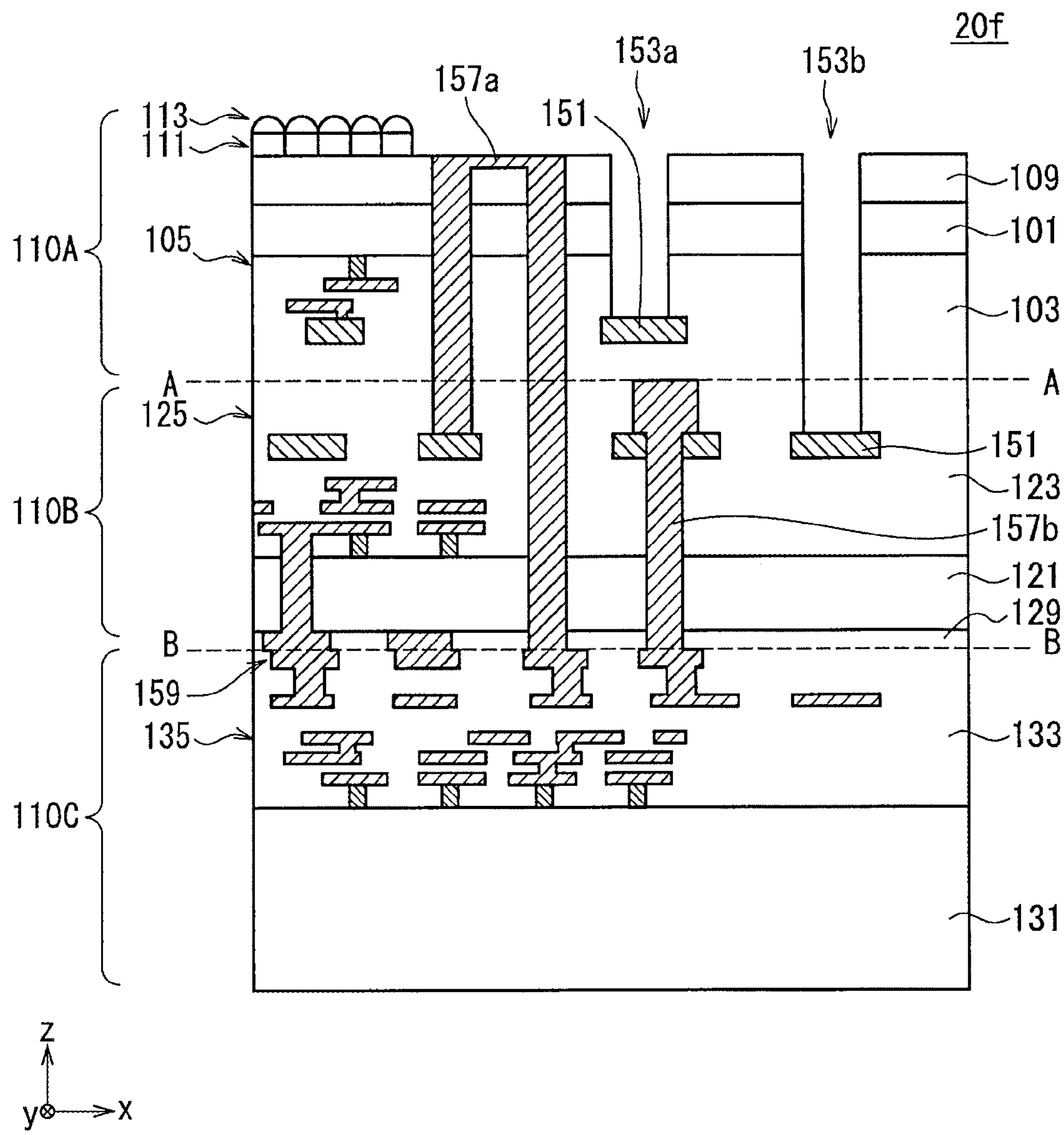

FIG. 24F is a vertical cross-sectional view of a schematic configuration of the solid-state imaging device according to the nineteenth configuration example of the present embodiment.

Figure 24G:
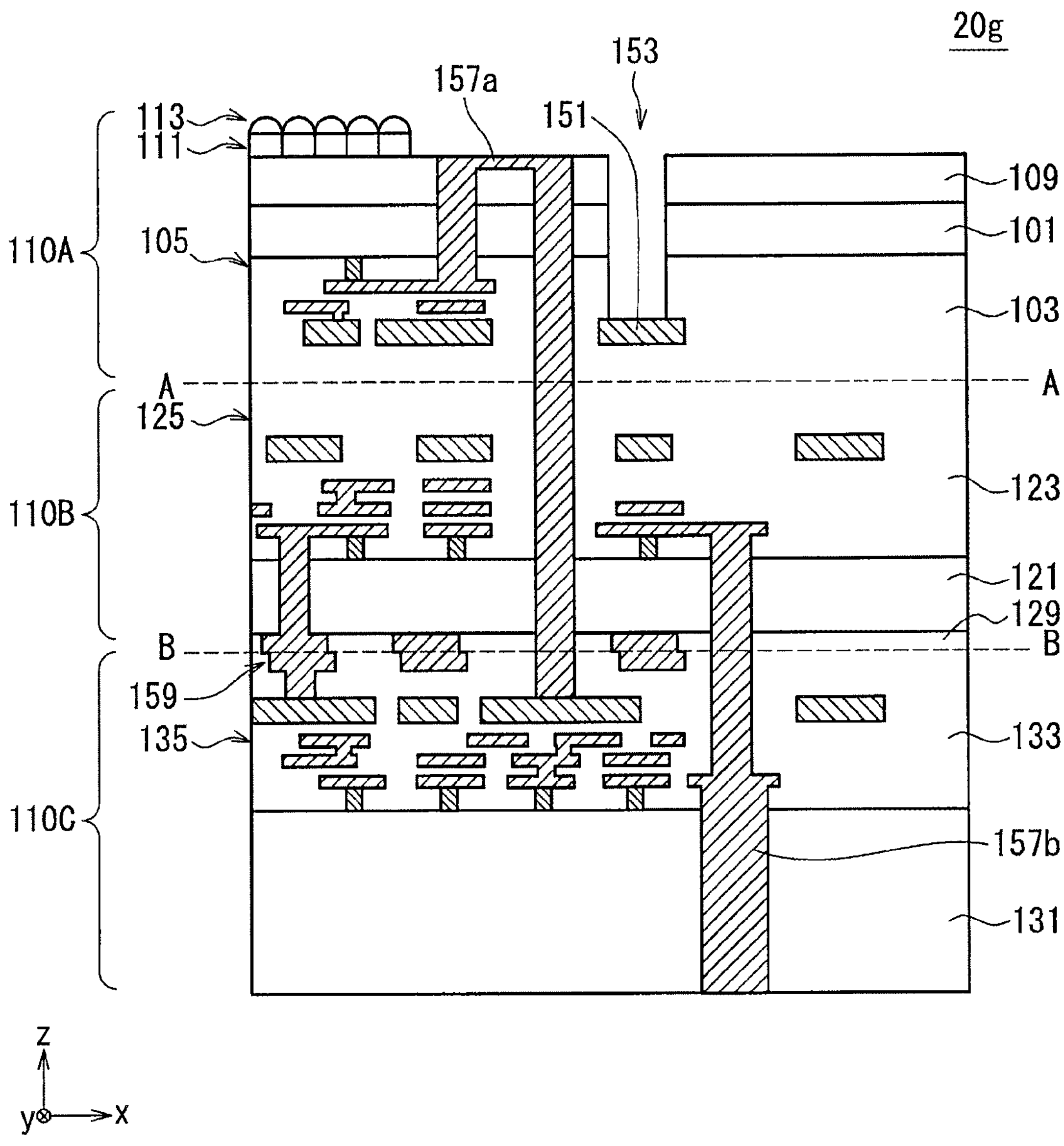

FIG. 24G is a vertical cross-sectional view of a schematic configuration of the solid-state imaging device according to the nineteenth configuration example of the present embodiment.

Figure 24H:
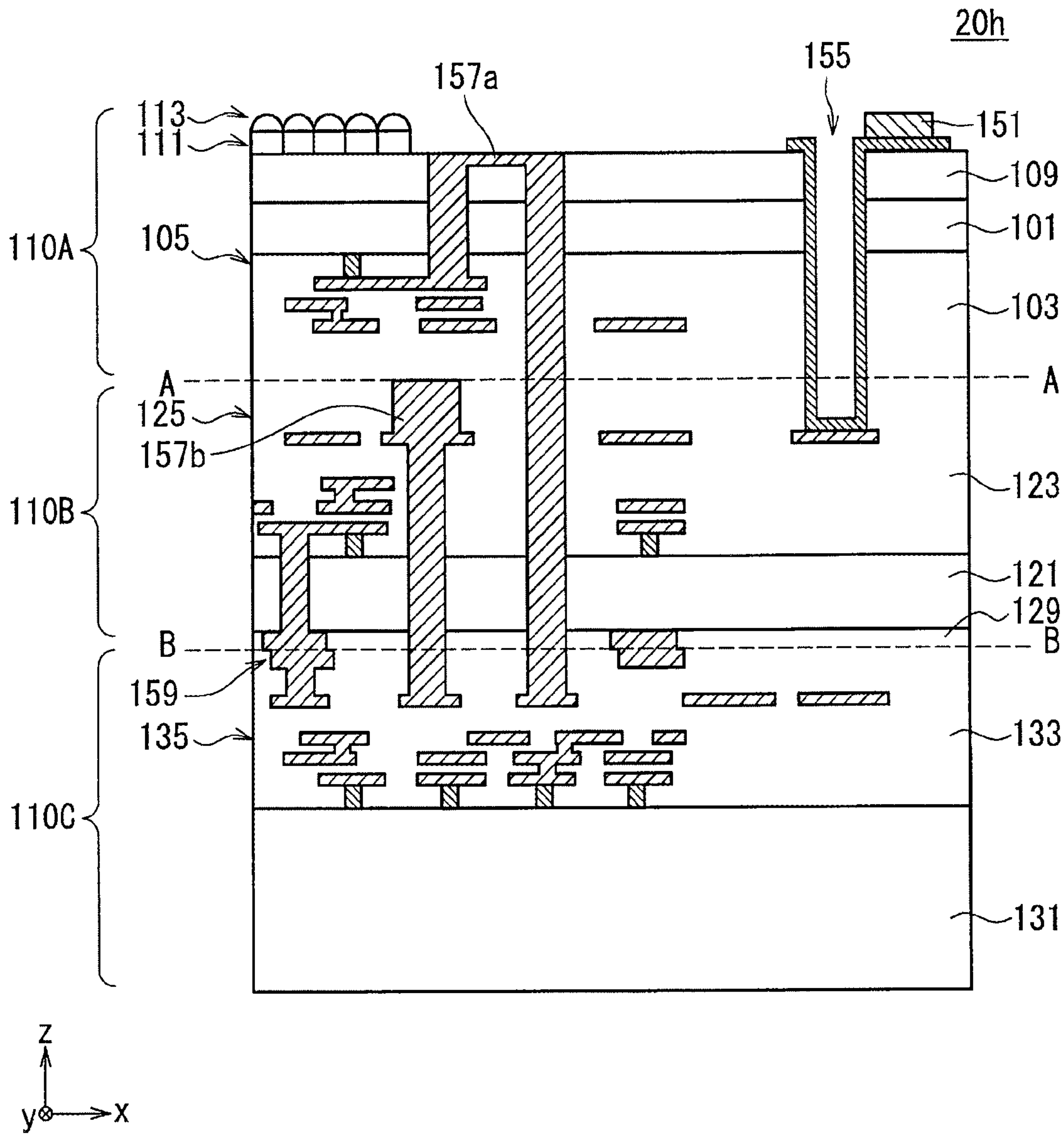

FIG. 24H is a vertical cross-sectional view of a schematic configuration of the solid-state imaging device according to the nineteenth configuration example of the present embodiment.

Figure 24I:
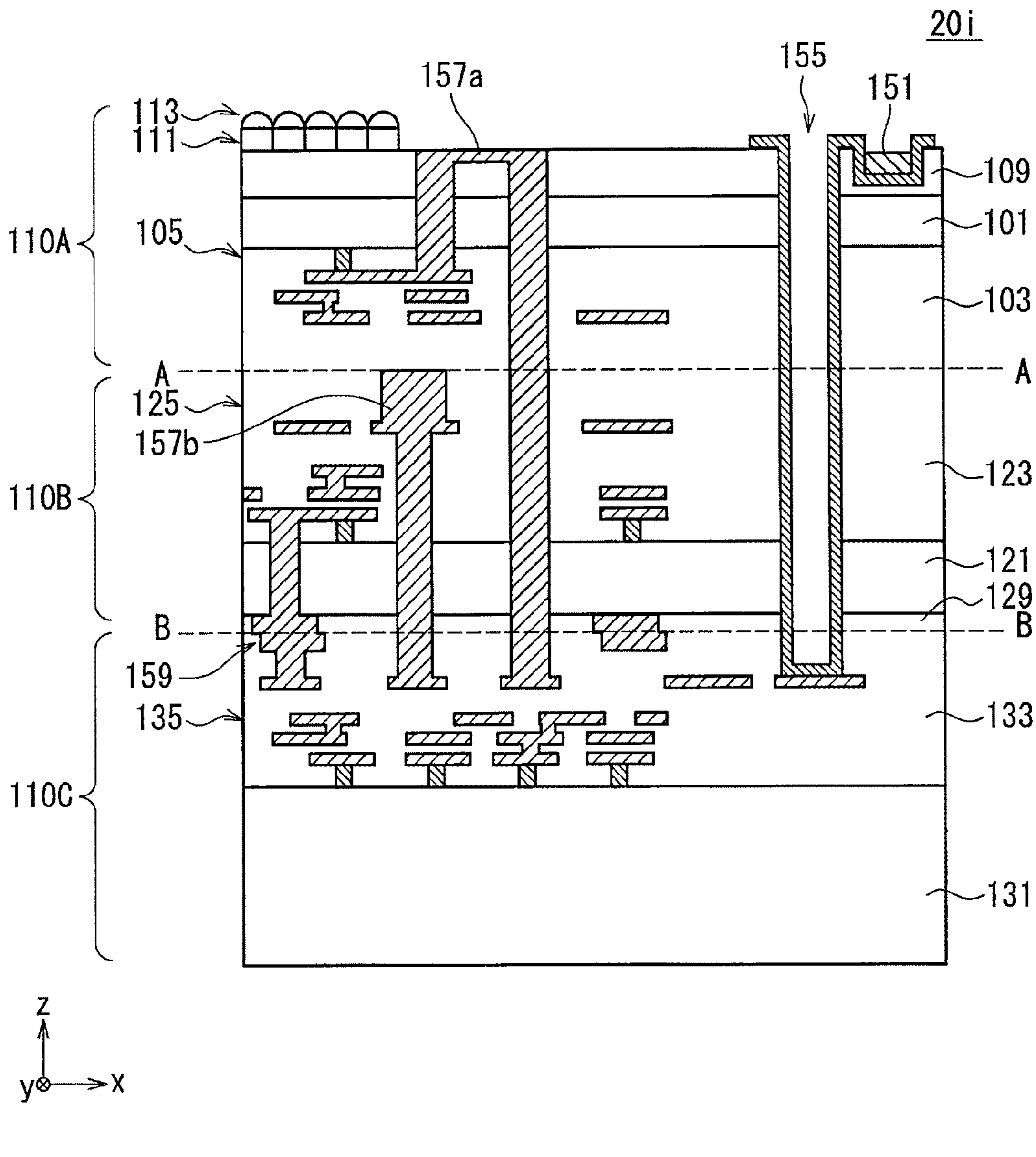

FIG. 24I is a vertical cross-sectional view of a schematic configuration of the solid-state imaging device according to the nineteenth configuration example of the present embodiment.

Figure 24J:
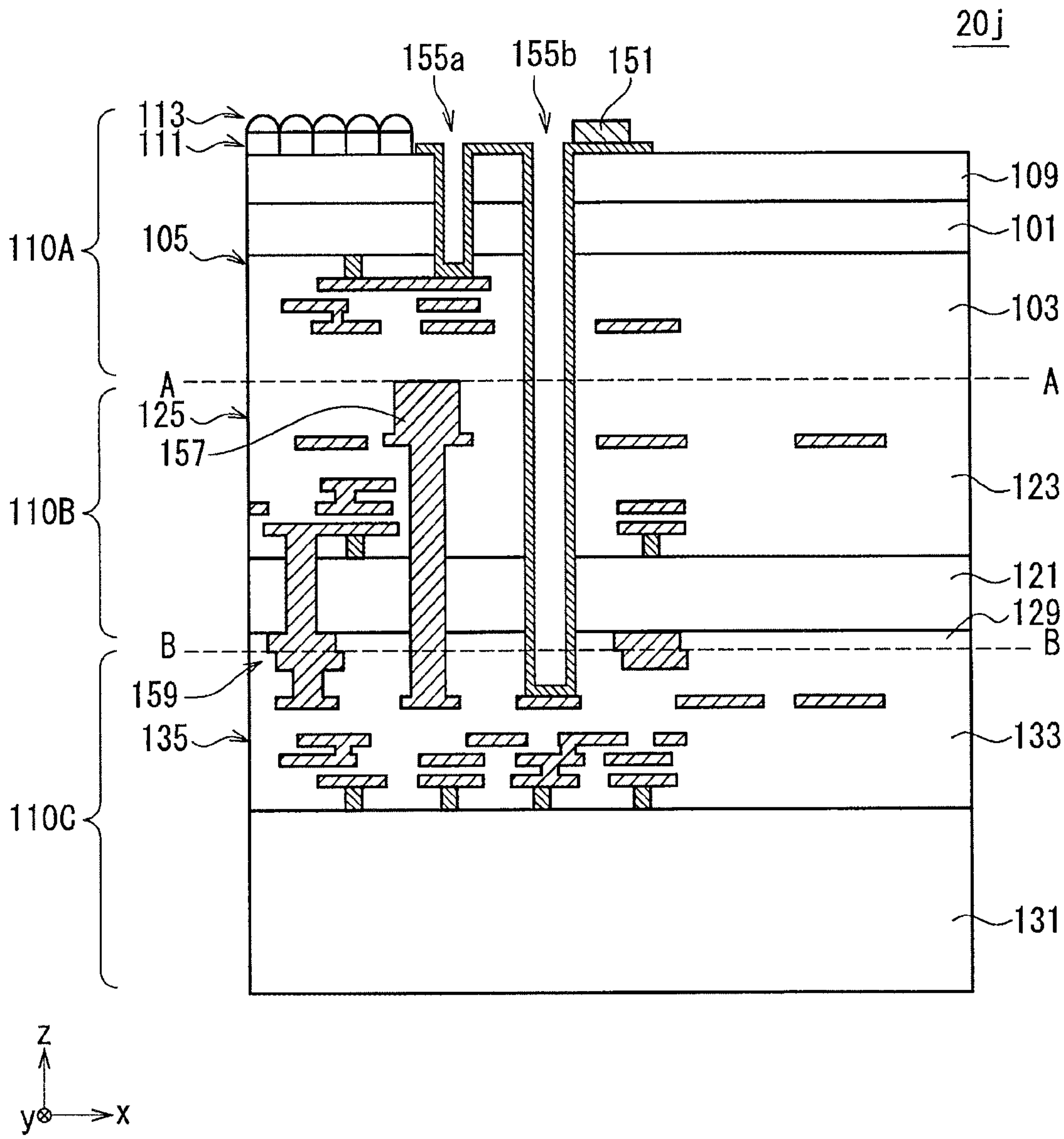

FIG. 24J is a vertical cross-sectional view of a schematic configuration of the solid-state imaging device according to the nineteenth configuration example of the present embodiment.

Figure 24K:
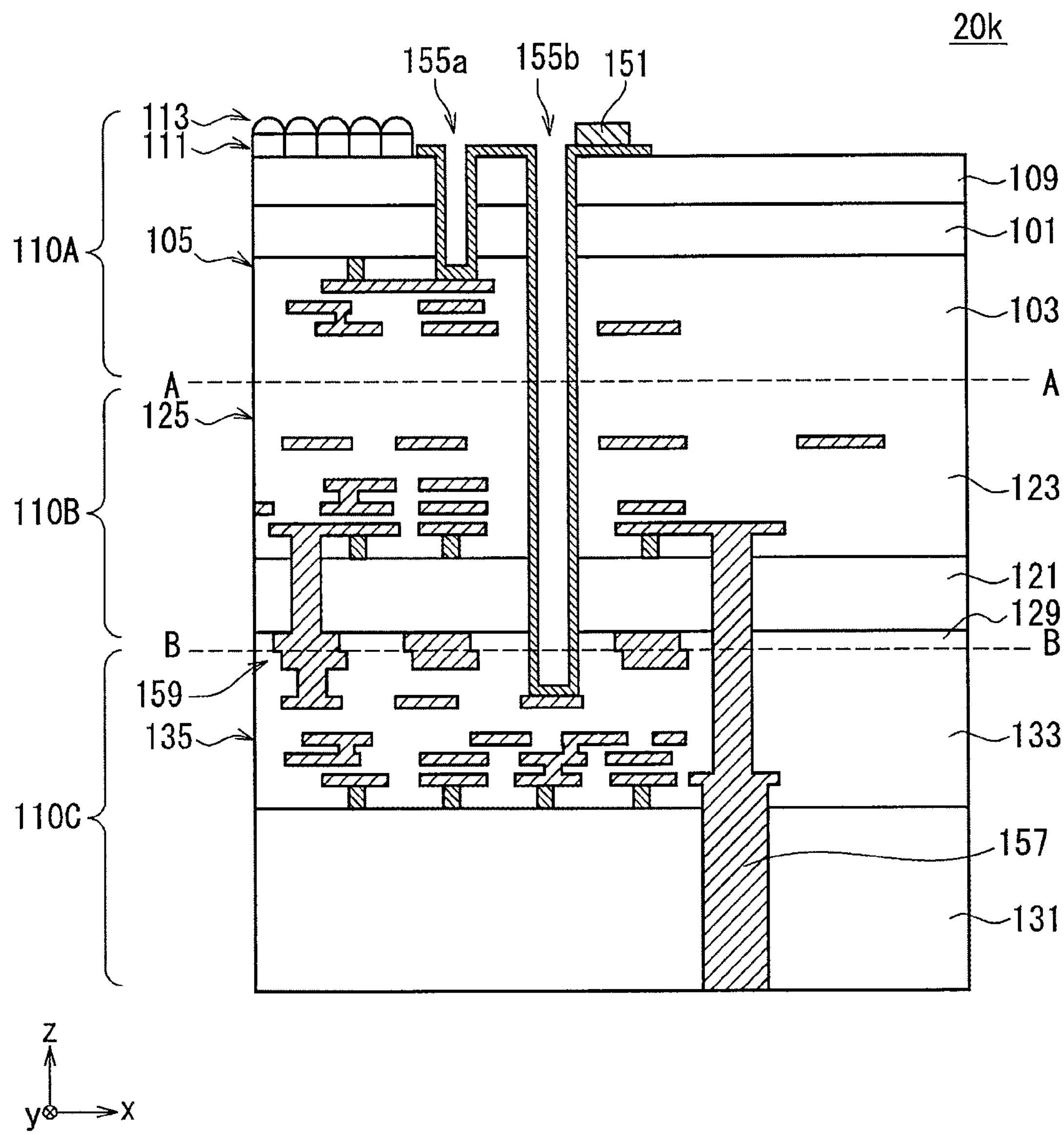

FIG. 24K is a vertical cross-sectional view or a schematic configuration of the solid-state imaging device according to the nineteenth configuration example of the present embodiment.

Figure 24L:
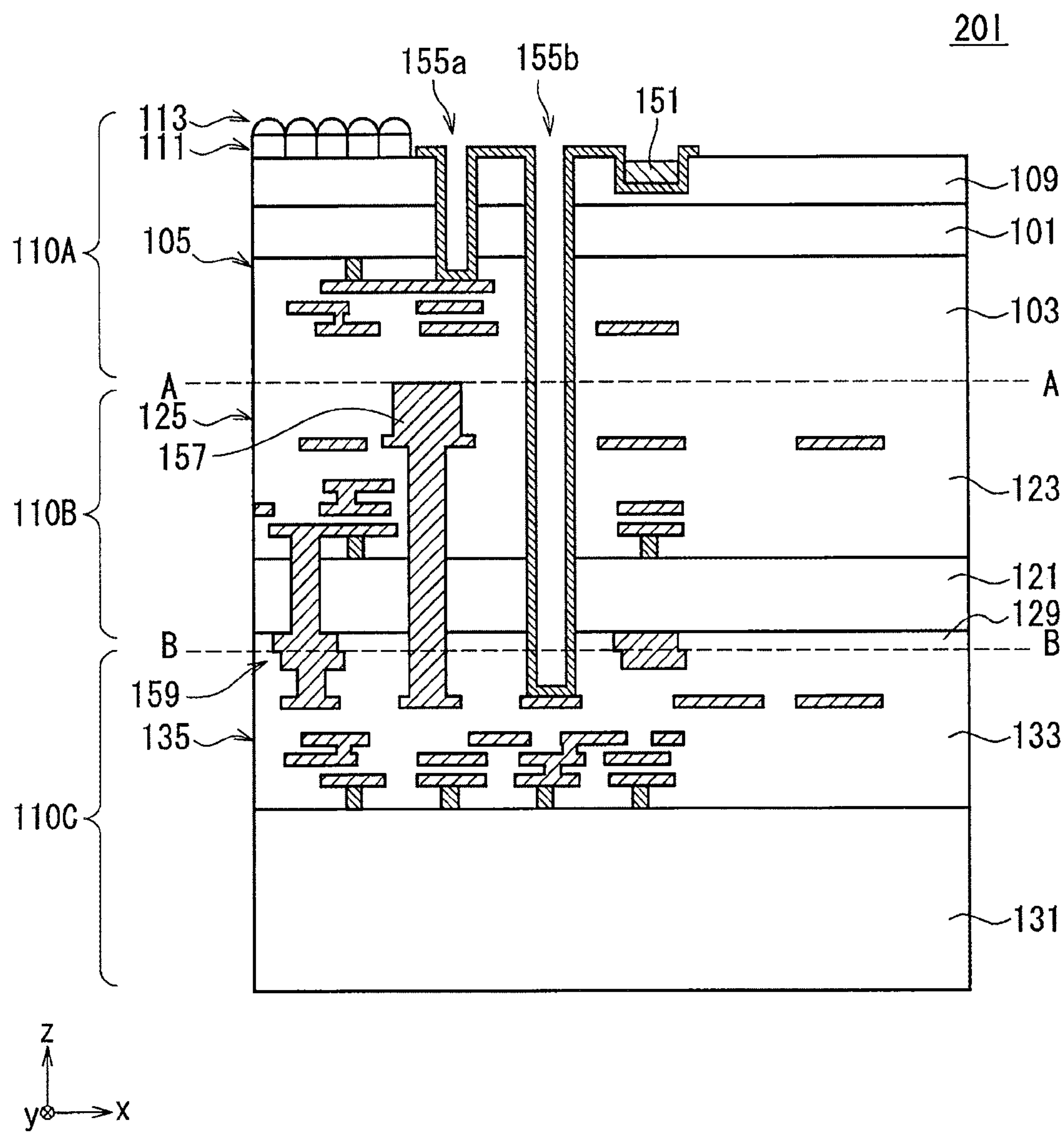

FIG. 24L is a vertical cross-sectional view of a schematic configuration of the solid-state imaging device according to the nineteenth configuration example of the present embodiment.

Figure 24M:
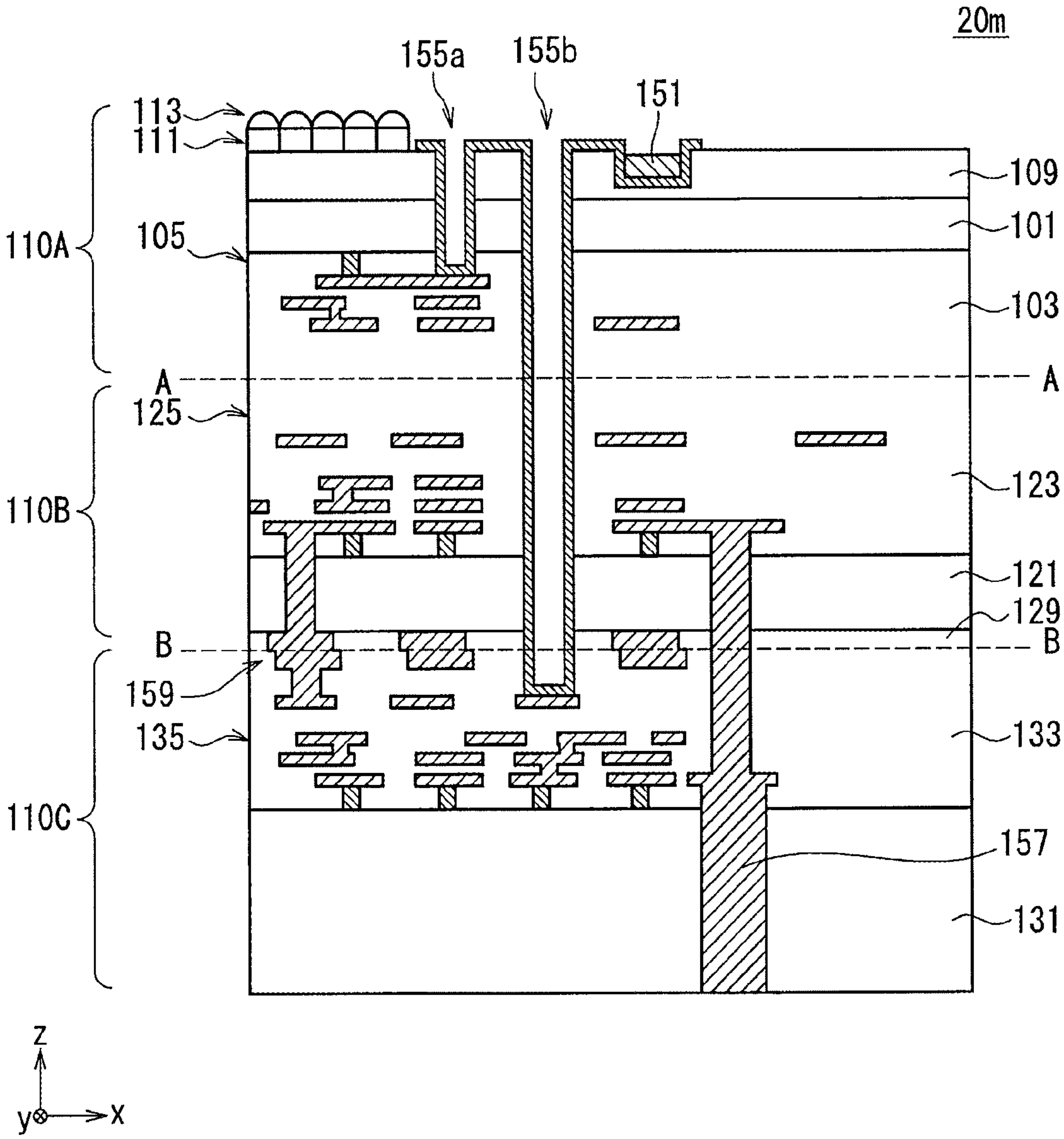

FIG. 24M is a vertical cross-sectional view of a schematic configuration of the solid-state imaging device according to the nineteenth configuration example of the present embodiment.

Figure 25A:
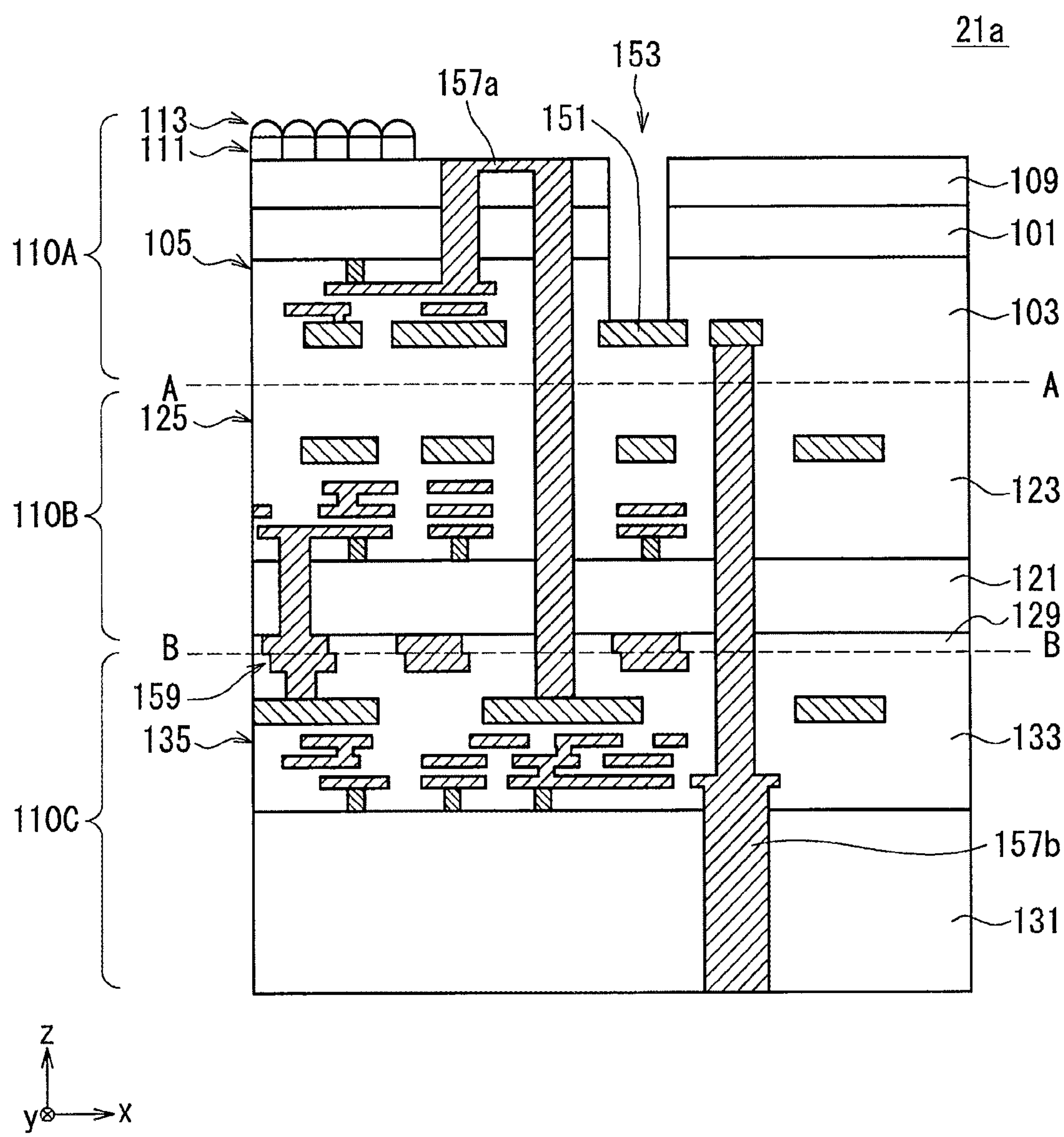

FIG. 25A is a vertical cross-sectional view of a schematic configuration of a solid-state imaging device according to a twentieth configuration example of the present embodiment.

Figure 25B:
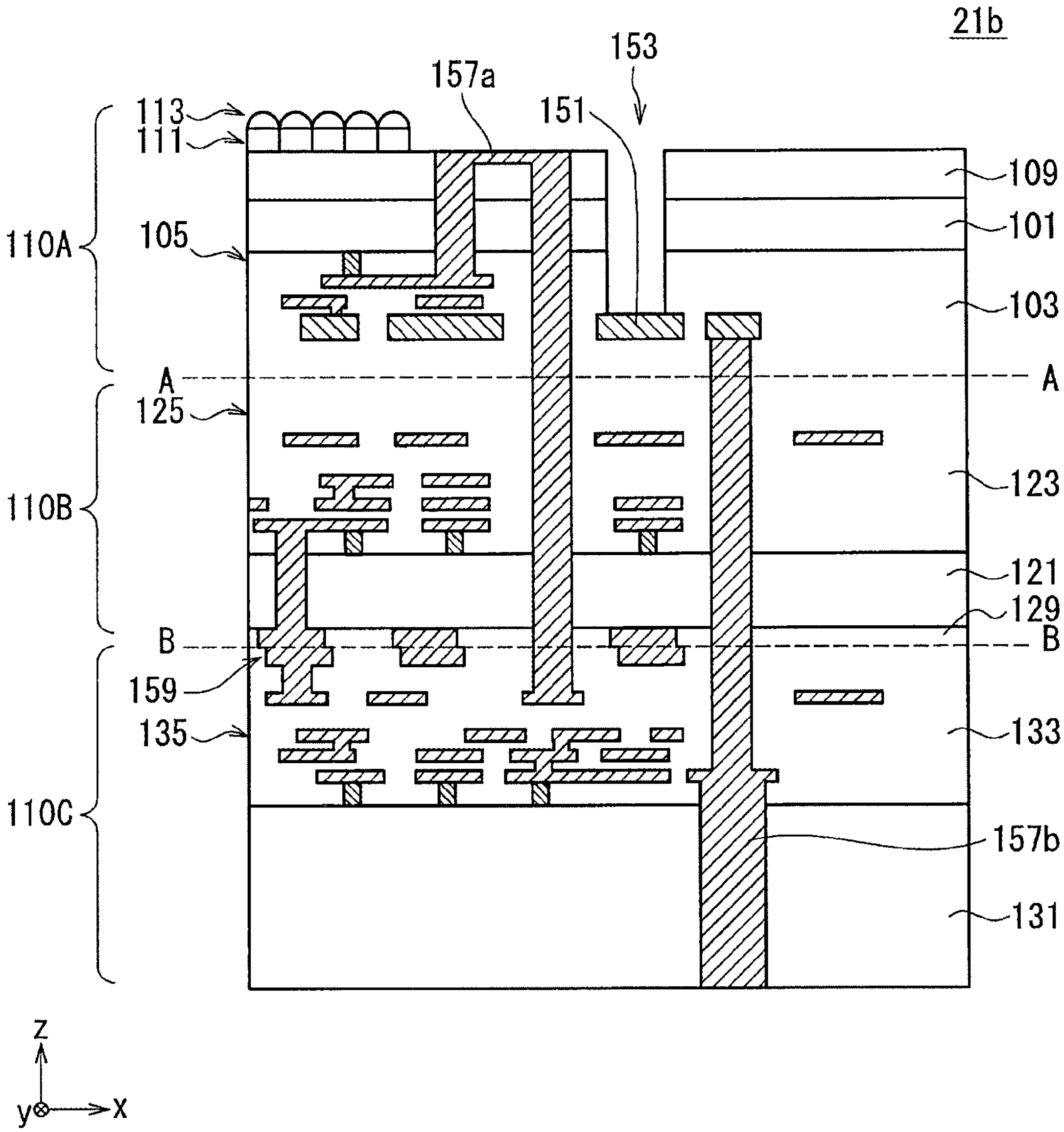

FIG. 25B is a vertical cross-sectional view of a schematic configuration of the solid-state imaging device according to the twentieth configuration example of the present embodiment.

Figure 25C:
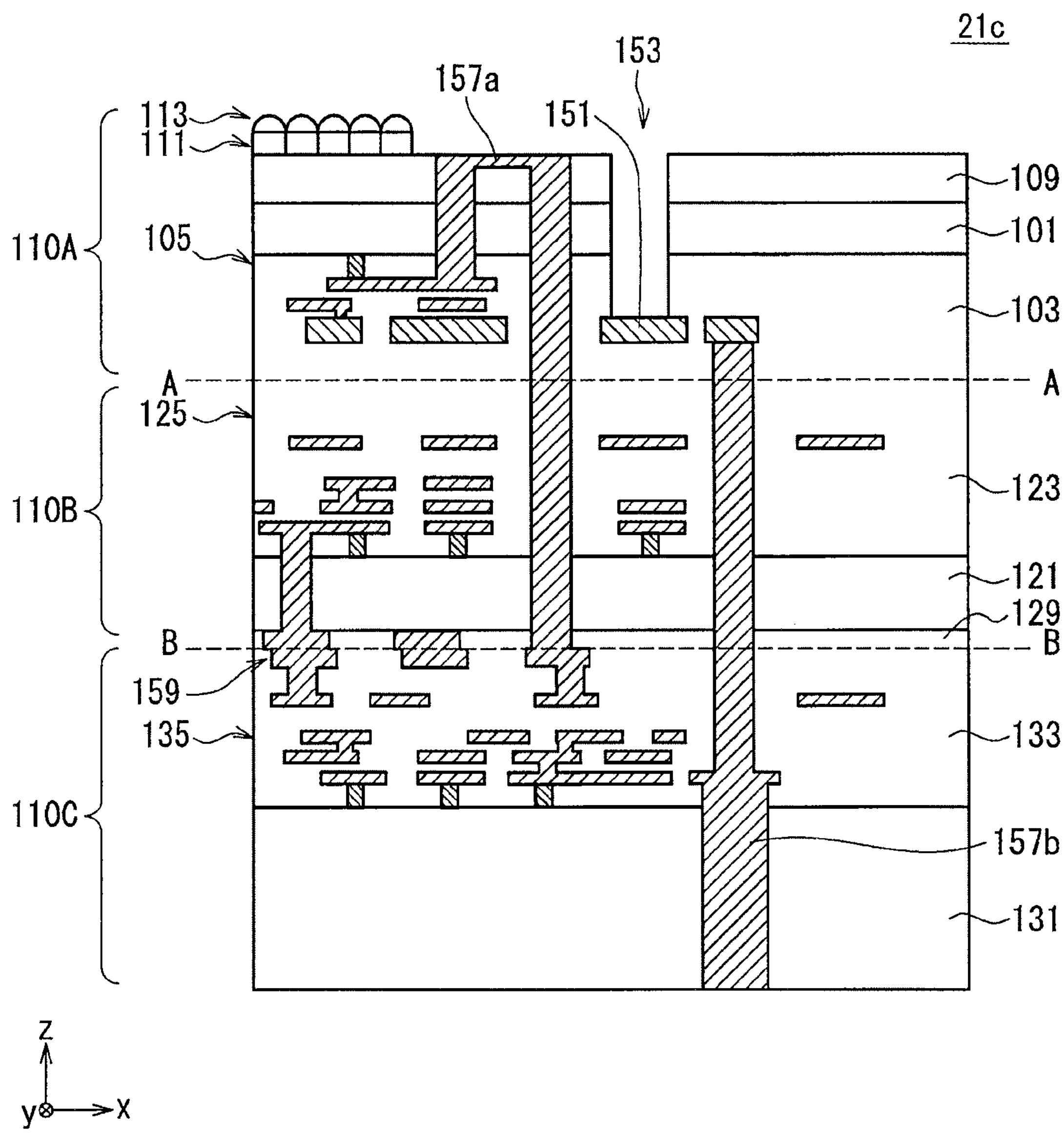

FIG. 25C is a vertical cross-sectional view of a schematic configuration of the solid-state imaging device according to the twentieth configuration example of the present embodiment.

Figure 25D:
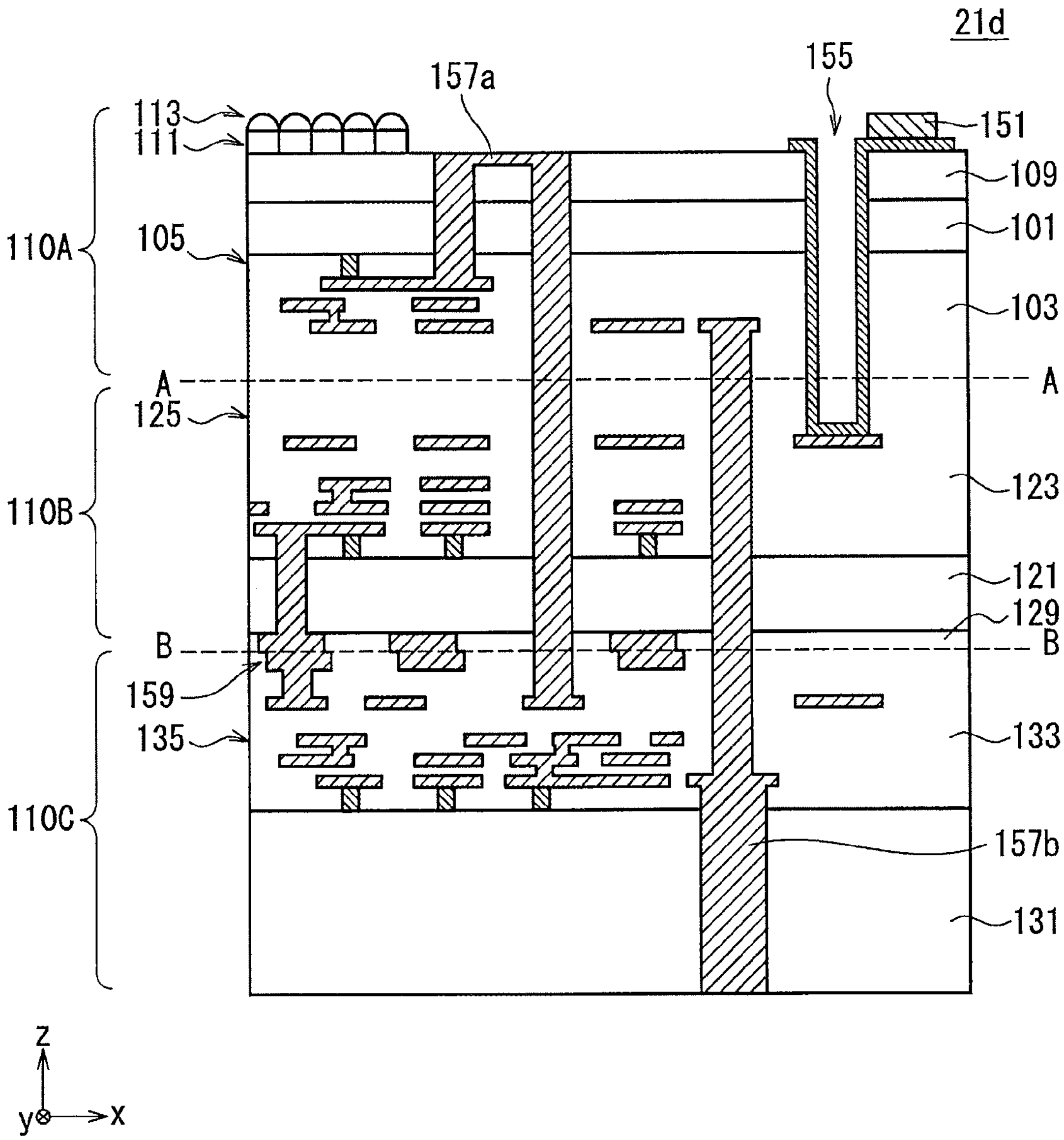

FIG. 25D is a vertical cross-sectional view of a schematic configuration of the solid-state imaging device according to the twentieth configuration example of the present embodiment.

Figure 25E:
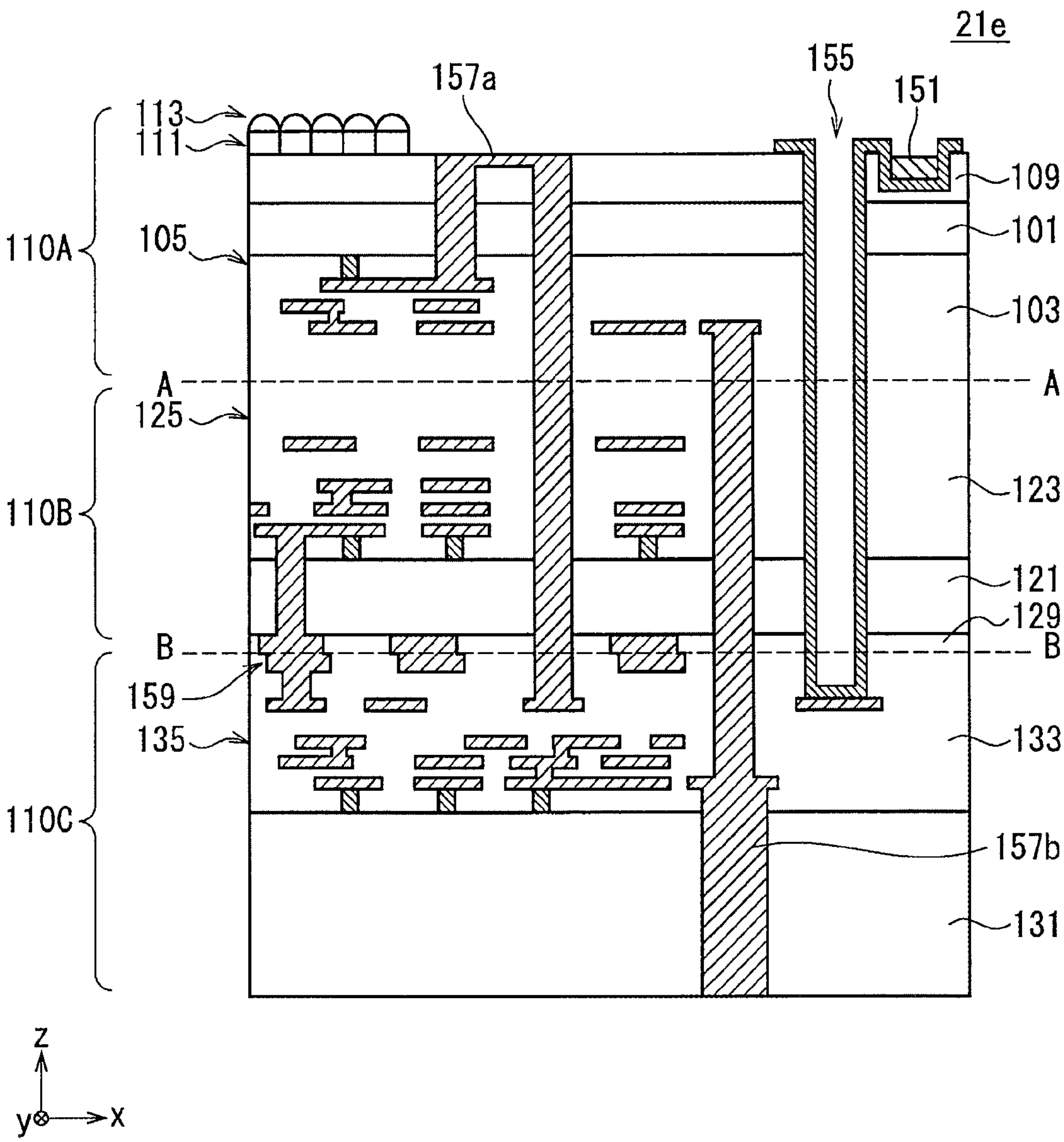

FIG. 25E is a vertical cross-sectional view of a schematic configuration of the solid-state imaging device according to the twentieth configuration example of the present embodiment.

Figure 25F:
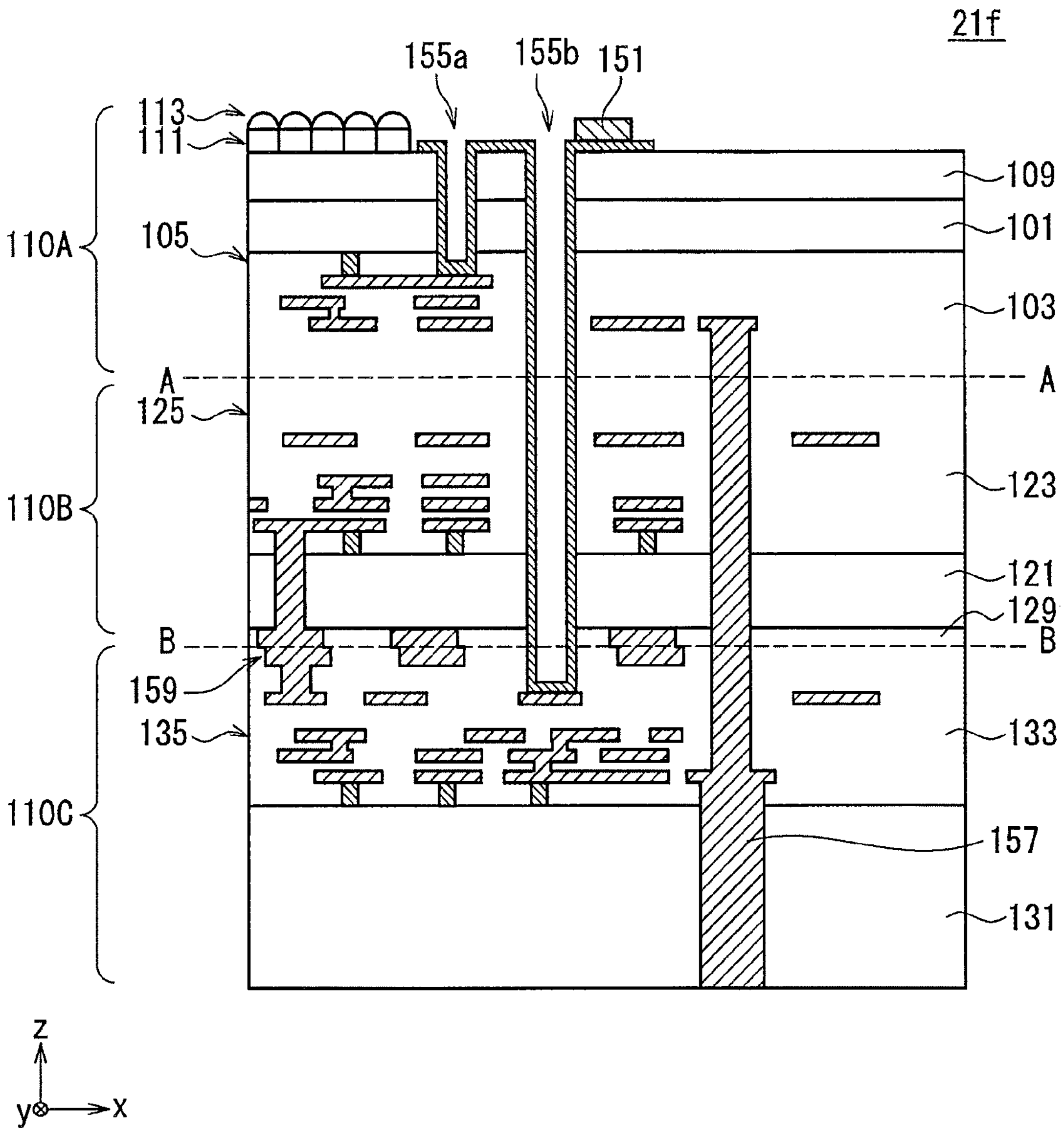

FIG. 25F is a vertical cross-sectional view of a schematic configuration of the solid-state imaging device according to the twentieth configuration example of the present embodiment.

Figure 25G:
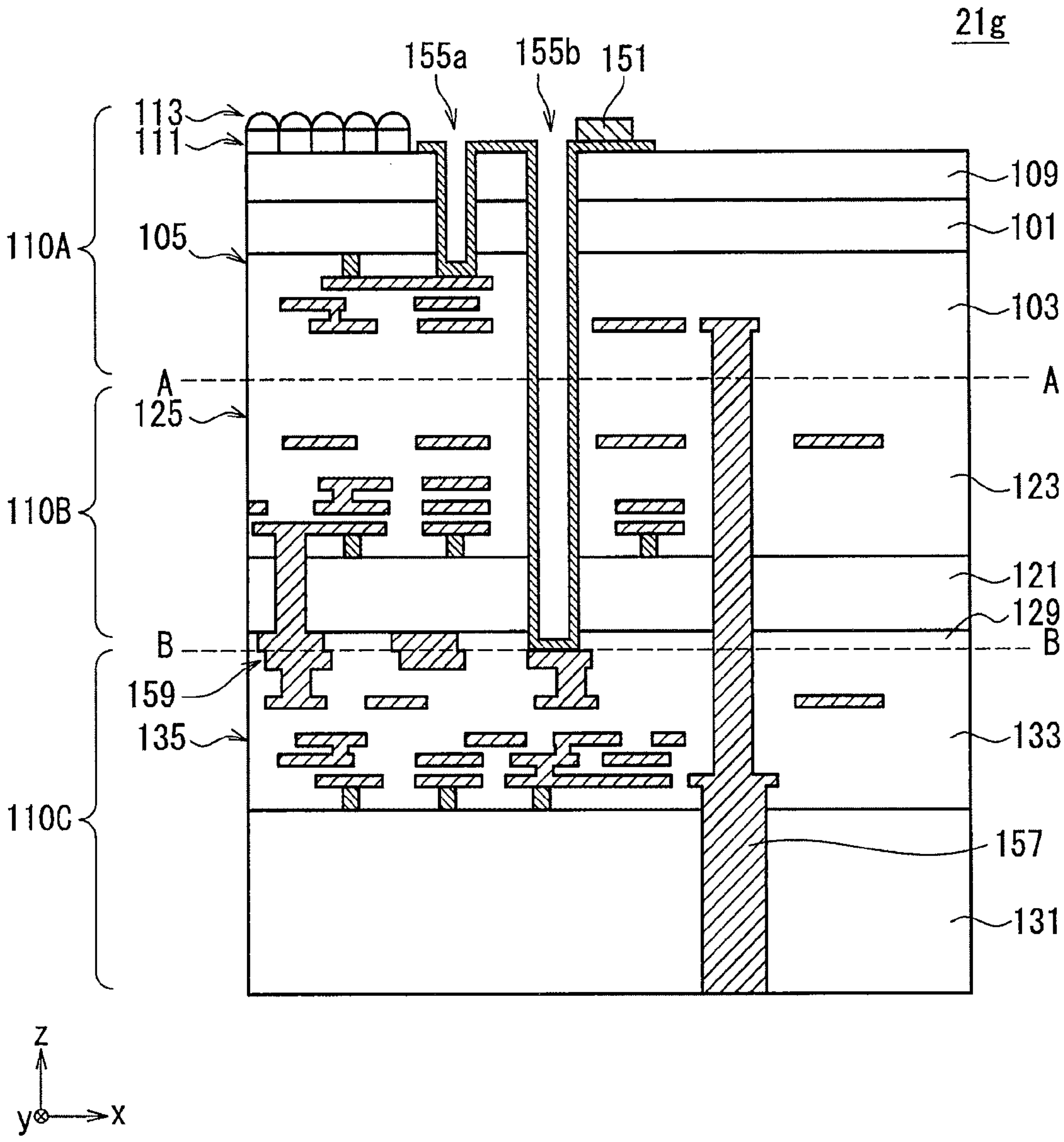

FIG. 25G is a vertical cross-sectional view of a schematic configuration of the solid-state imaging device according to the twentieth configuration example of the present embodiment.

Figure 25H:
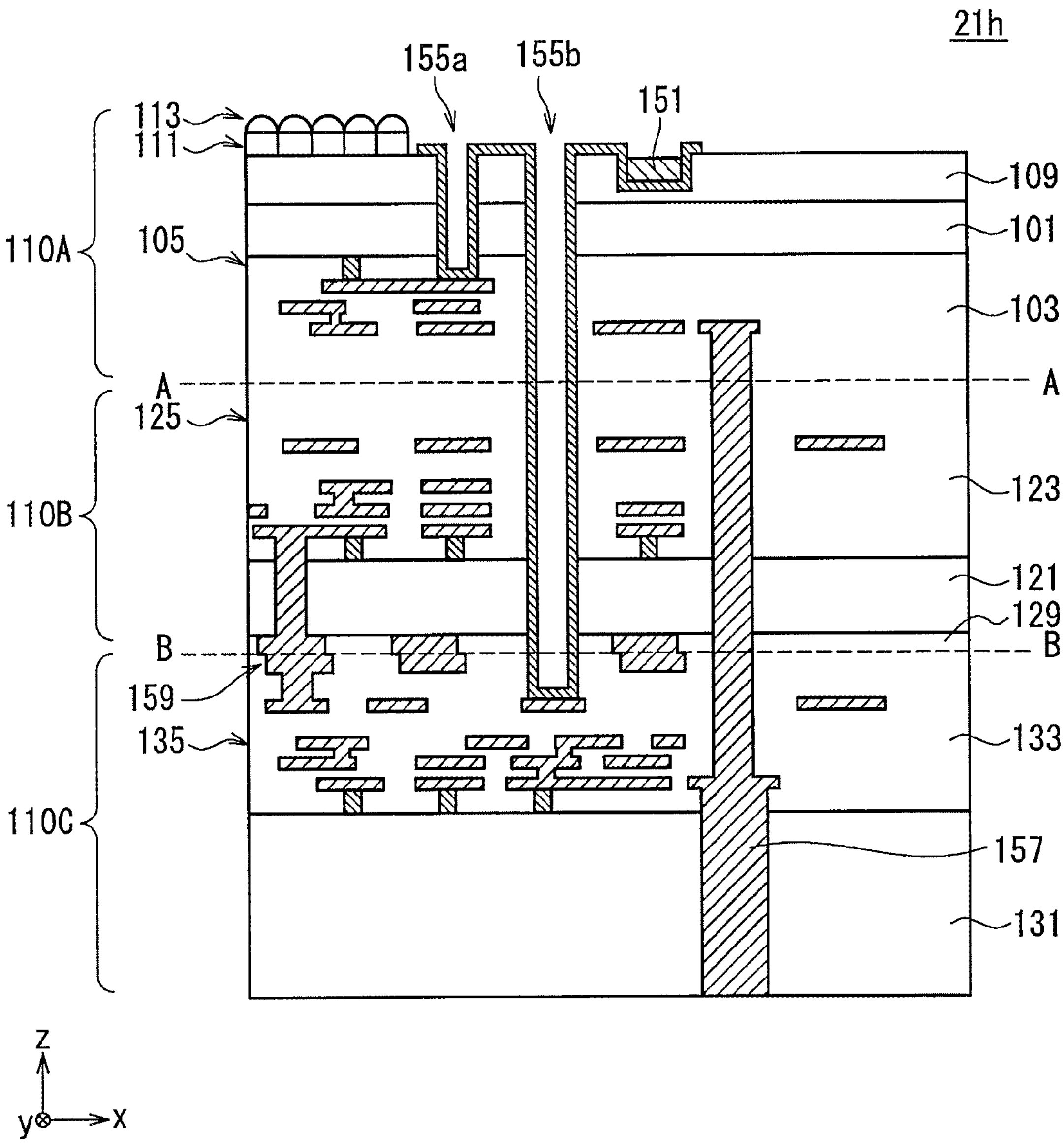

FIG. 25H is a vertical cross-sectional view of a schematic configuration of the solid-state imaging device according to the twentieth configuration example of the present embodiment.

Figure 25I:
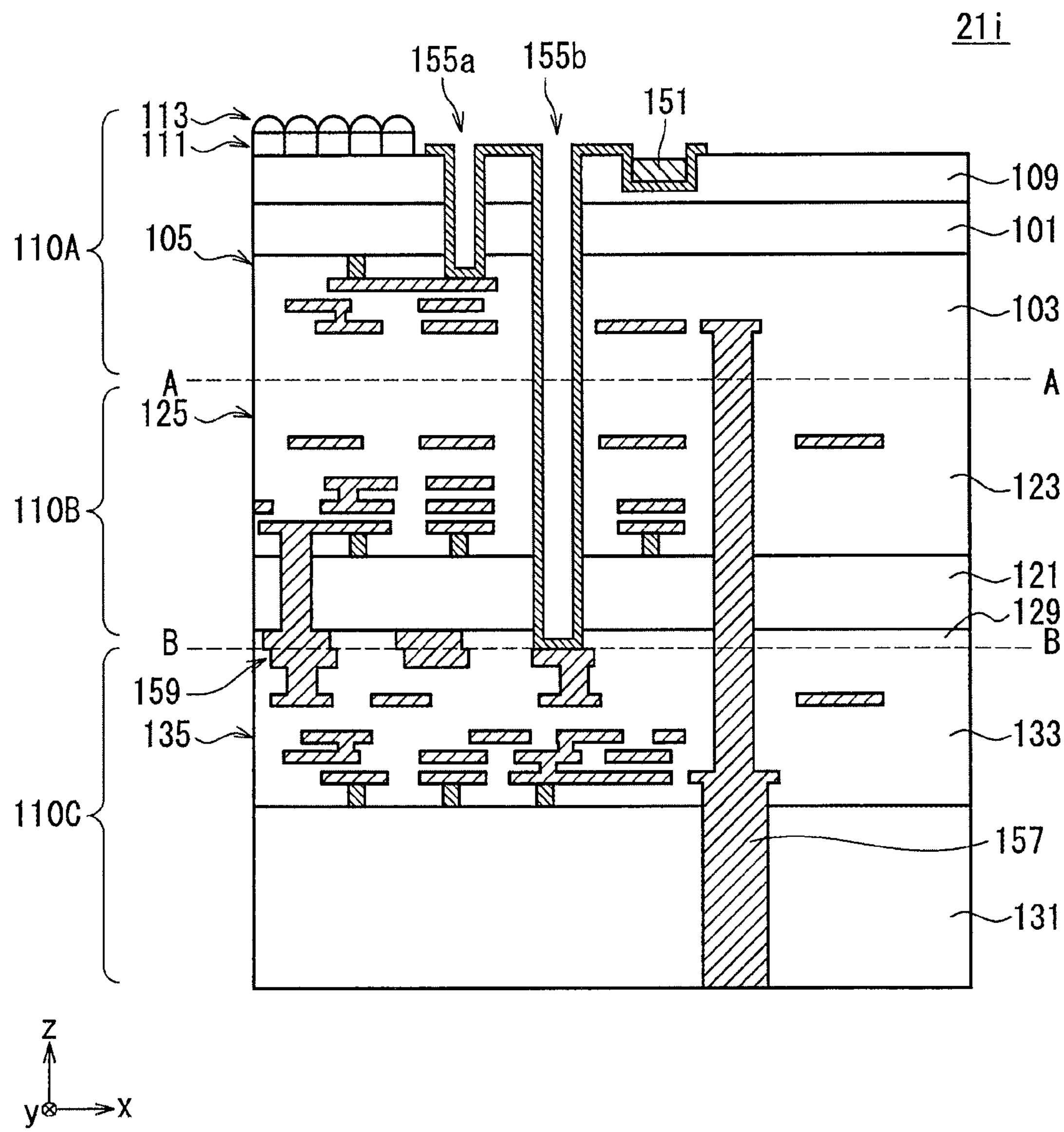

FIG. 25I is a vertical cross-sectional view of a schematic configuration of the solid-state imaging device according to the twentieth configuration example of the present embodiment.

Figure 25J:
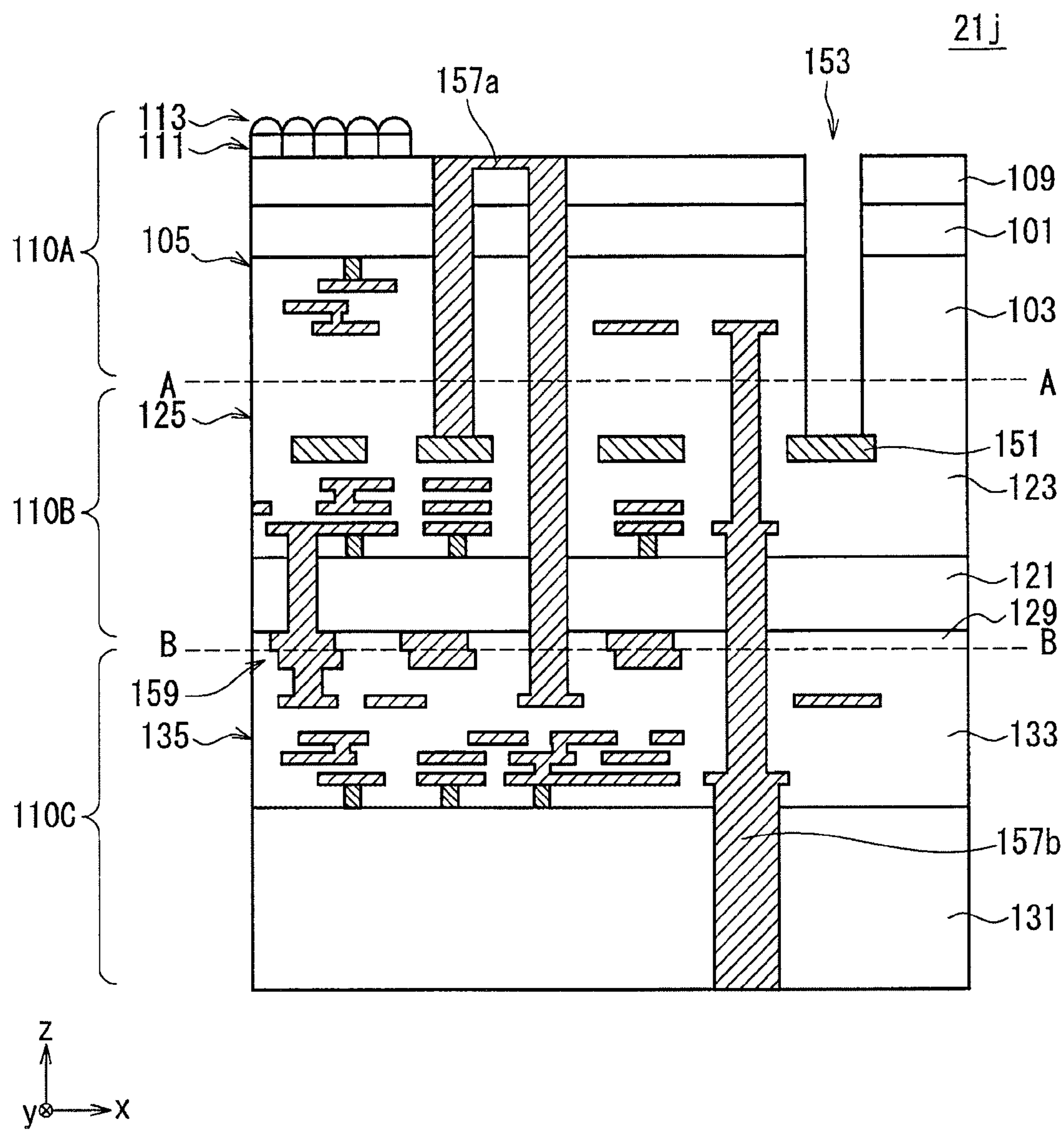

FIG. 25J is a vertical cross-sectional view of a schematic configuration of the solid-state imaging device according to the twentieth configuration example of the present embodiment.

Figure 25K:
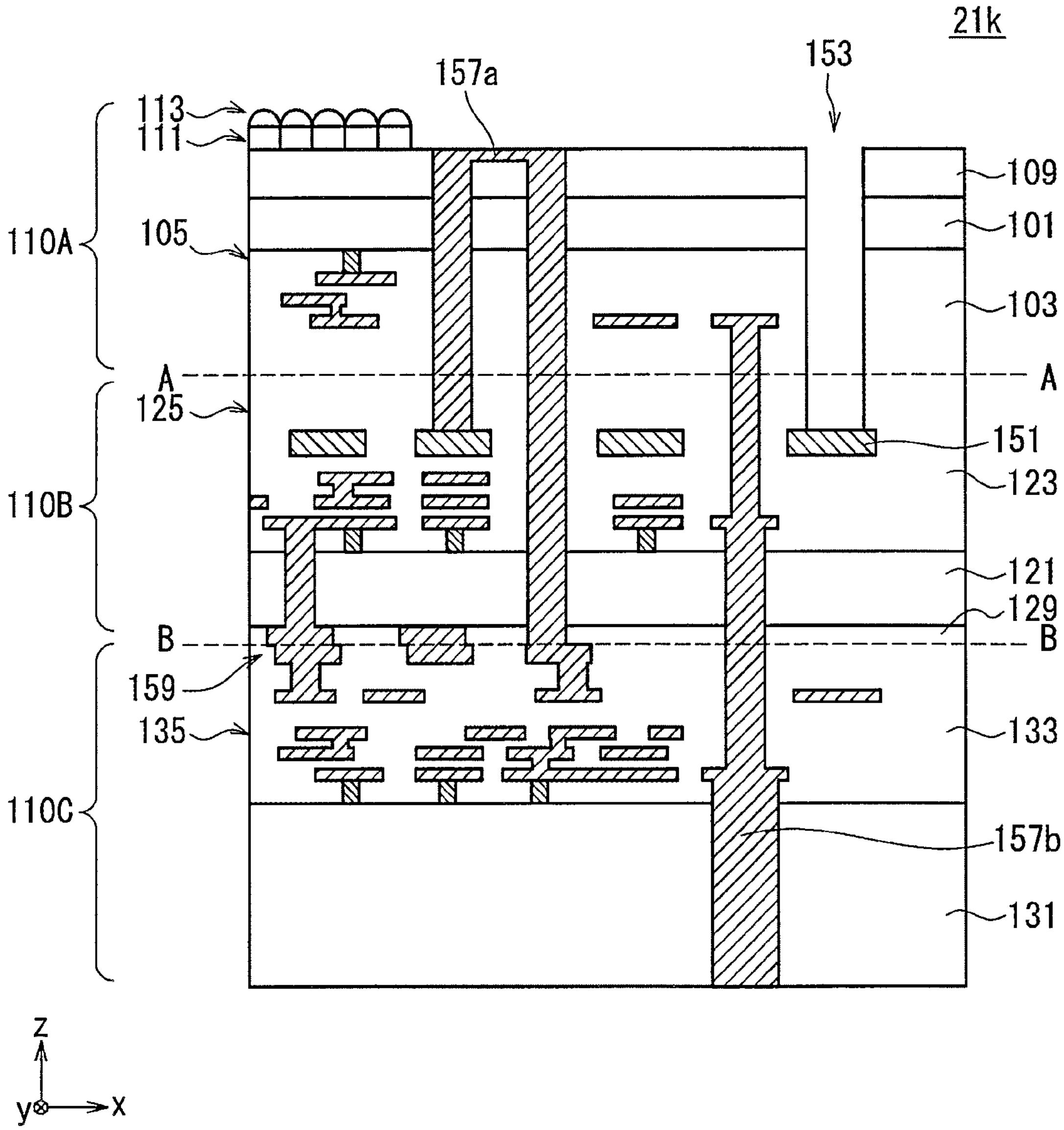

FIG. 25K is a vertical cross-sectional view of a schematic configuration of the solid-state imaging device according to the twentieth configuration example of the present embodiment.

Figure 26A:
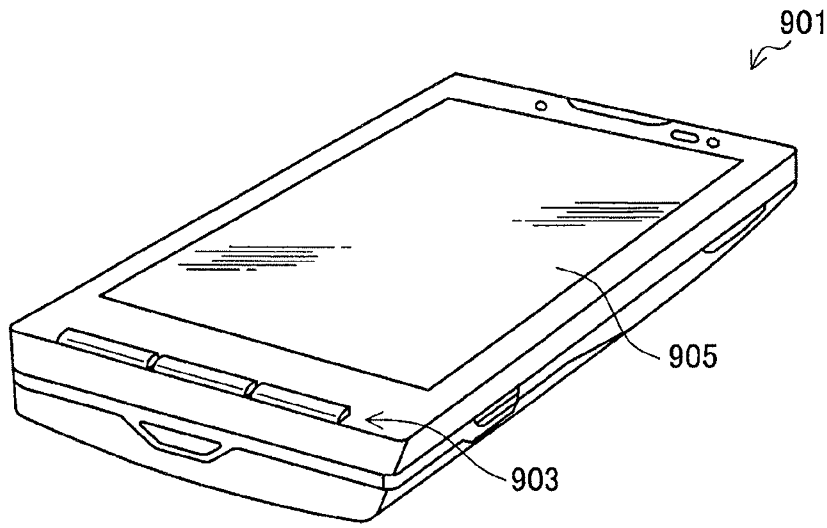

FIG. 26A illustrates appearance of a smartphone which is an example of an electronic apparatus to which the solid-state imaging device according to the present embodiment is applicable.

Figure 26B:
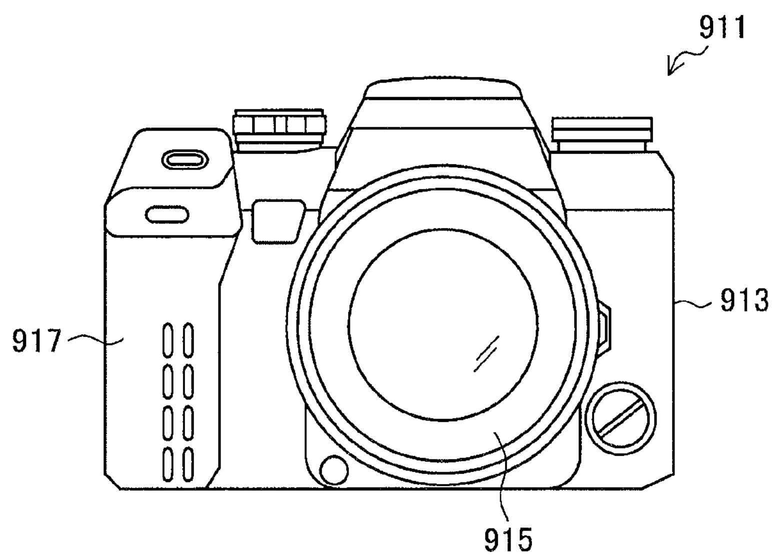

FIG. 26B illustrates appearance of a digital camera which is another example of the electronic apparatus to which the solid-state imaging device according to the present embodiment is applicable.

Figure 26C:
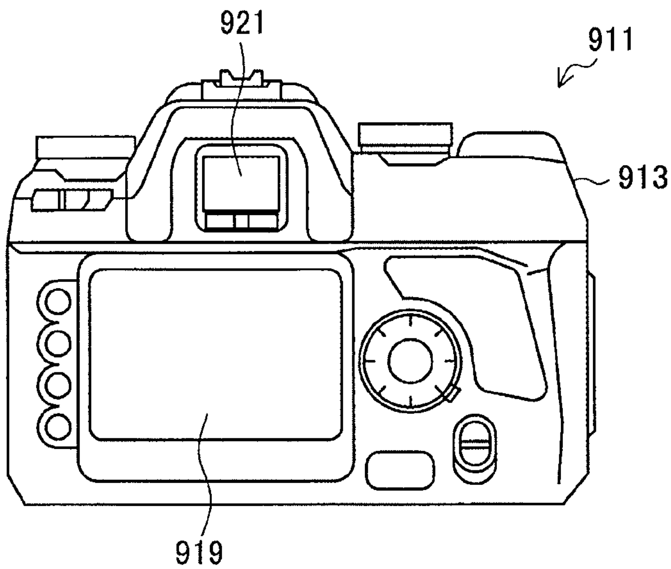

FIG. 26C illustrates appearance of a digital camera which is another example of the electronic apparatus to which the solid-state imaging device according to the present embodiment is applicable.

Figure 27A:
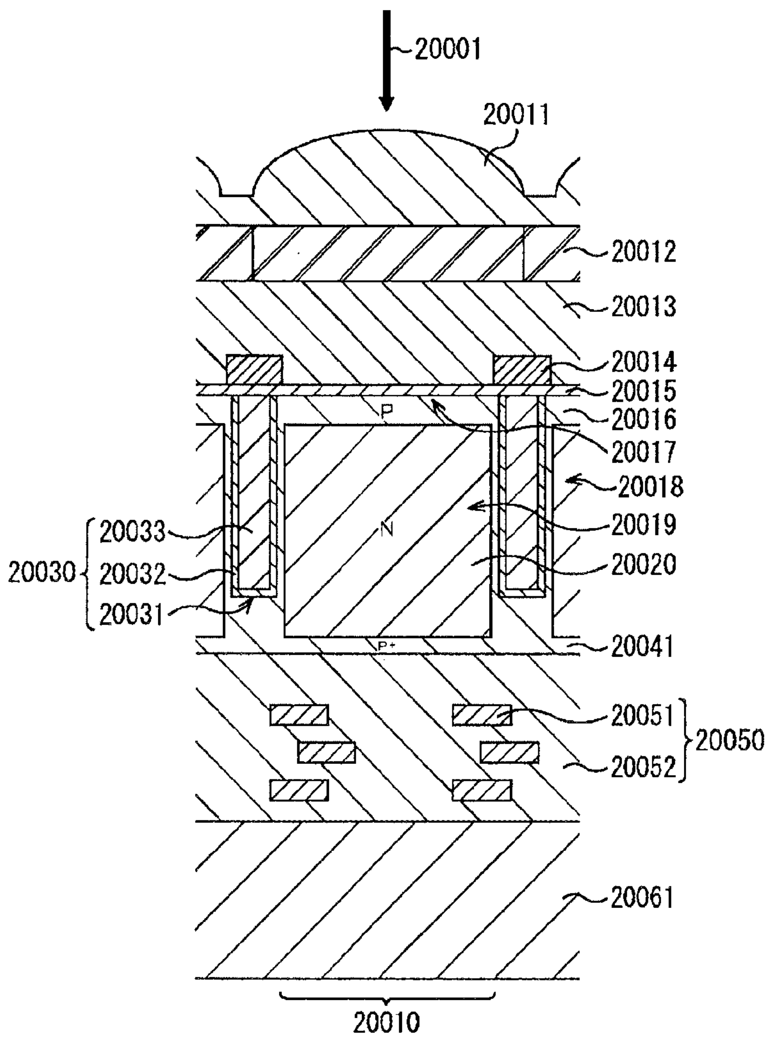

FIG. 27A is a cross-sectional view of a configuration example of a solid-state imaging device to which technology according to the present disclosure is applicable.

Figure 27B:
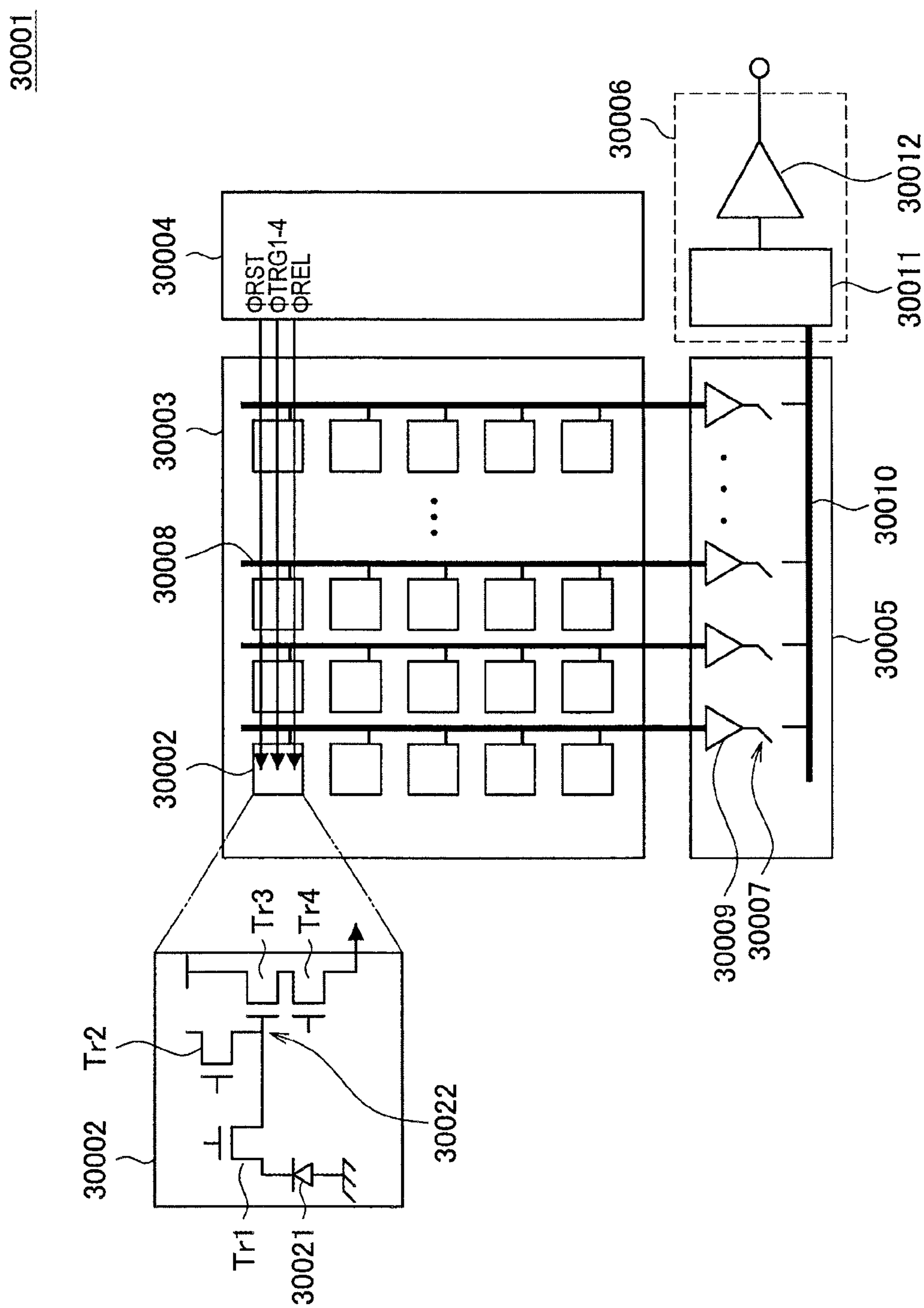

FIG. 27B is an explanatory diagram illustrating a schematic configuration example of the solid-state imaging device to which technology according to the present disclosure is applicable.

Figure 27C:
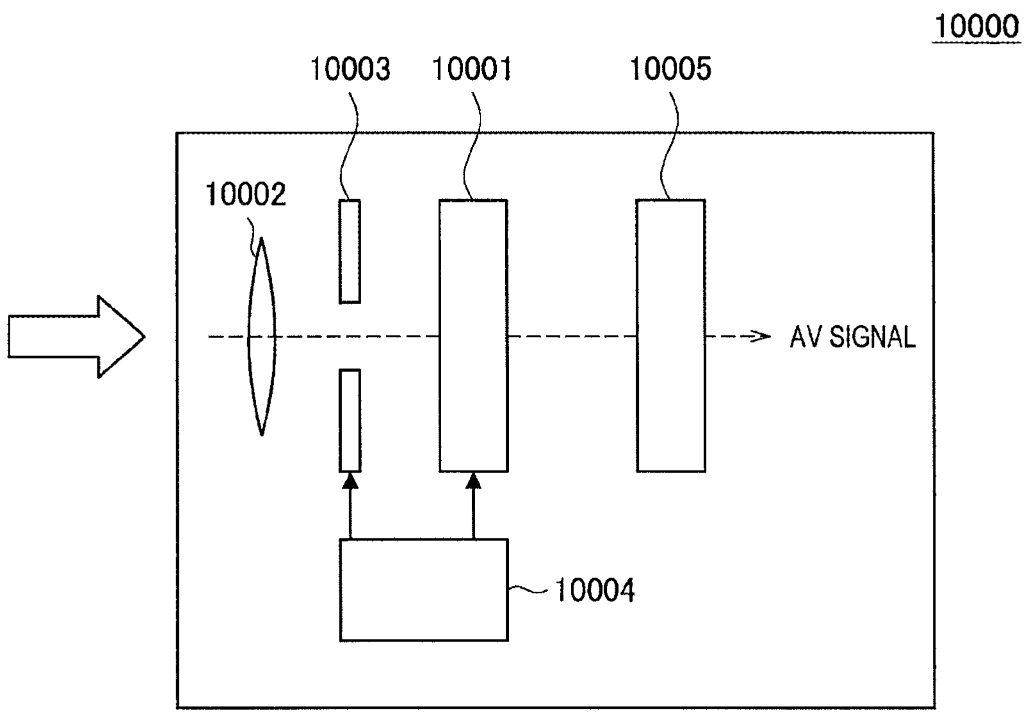

FIG. 27C is an explanatory diagram illustrating a schematic configuration example of a video camera to which technology according to the present disclosure is applicable.

Figure 27D:
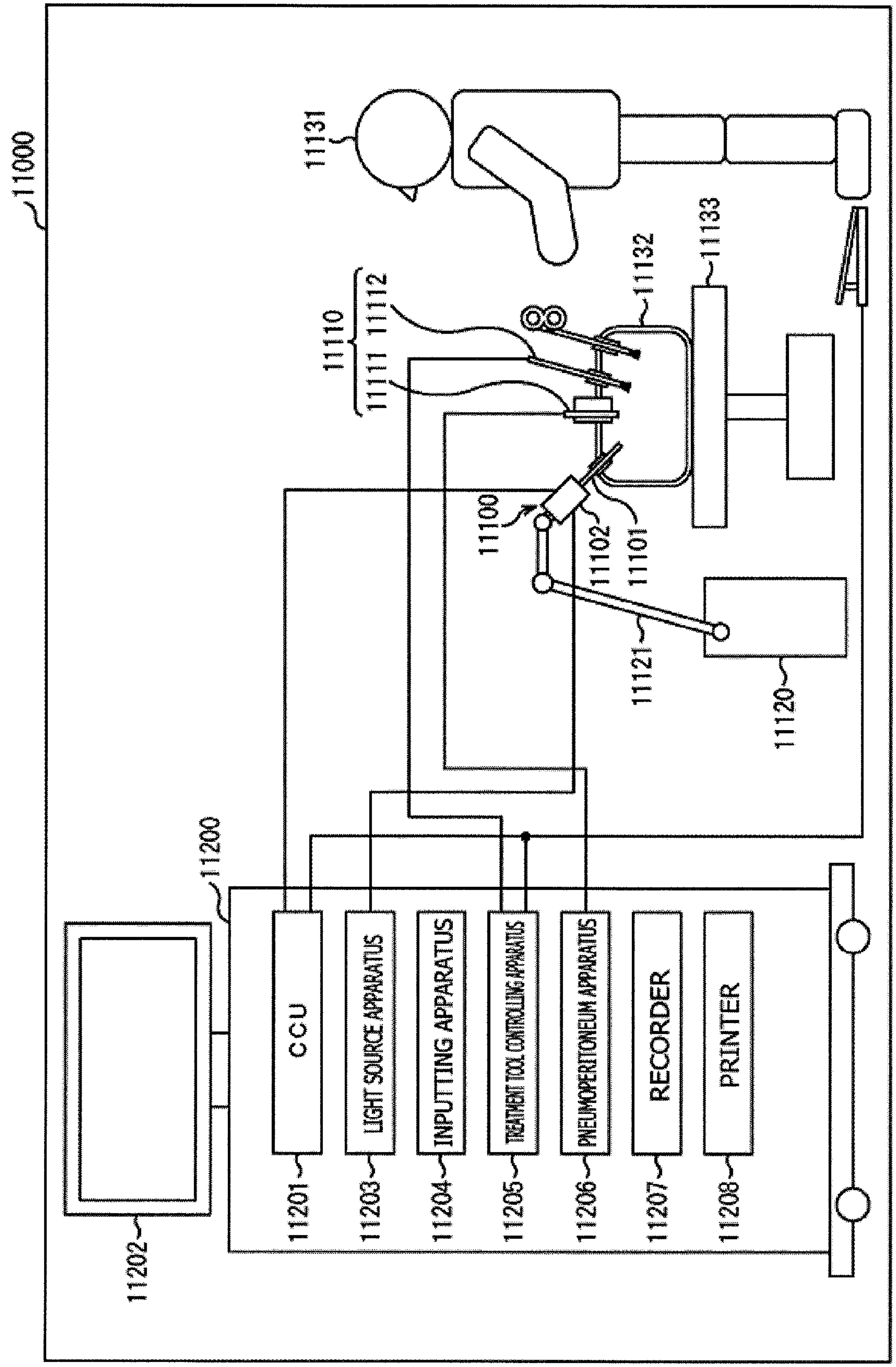

FIG. 27D is a view depicting an example of a schematic configuration of an endoscopic surgery system.

Figure 27E:
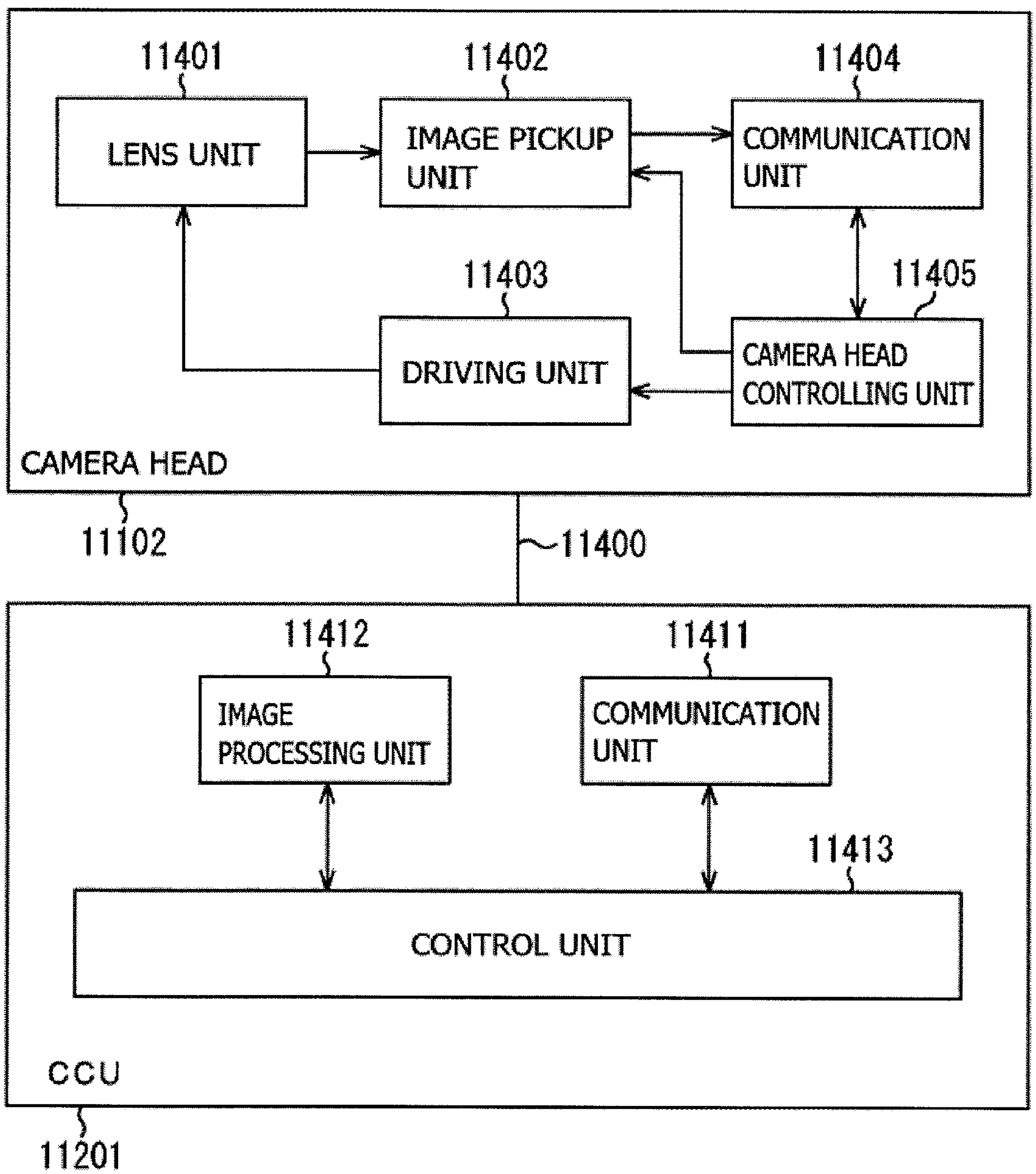

FIG. 27E is a block diagram depicting an example of a functional configuration of a camera head and a camera control unit (CCU).

Figure 27F:
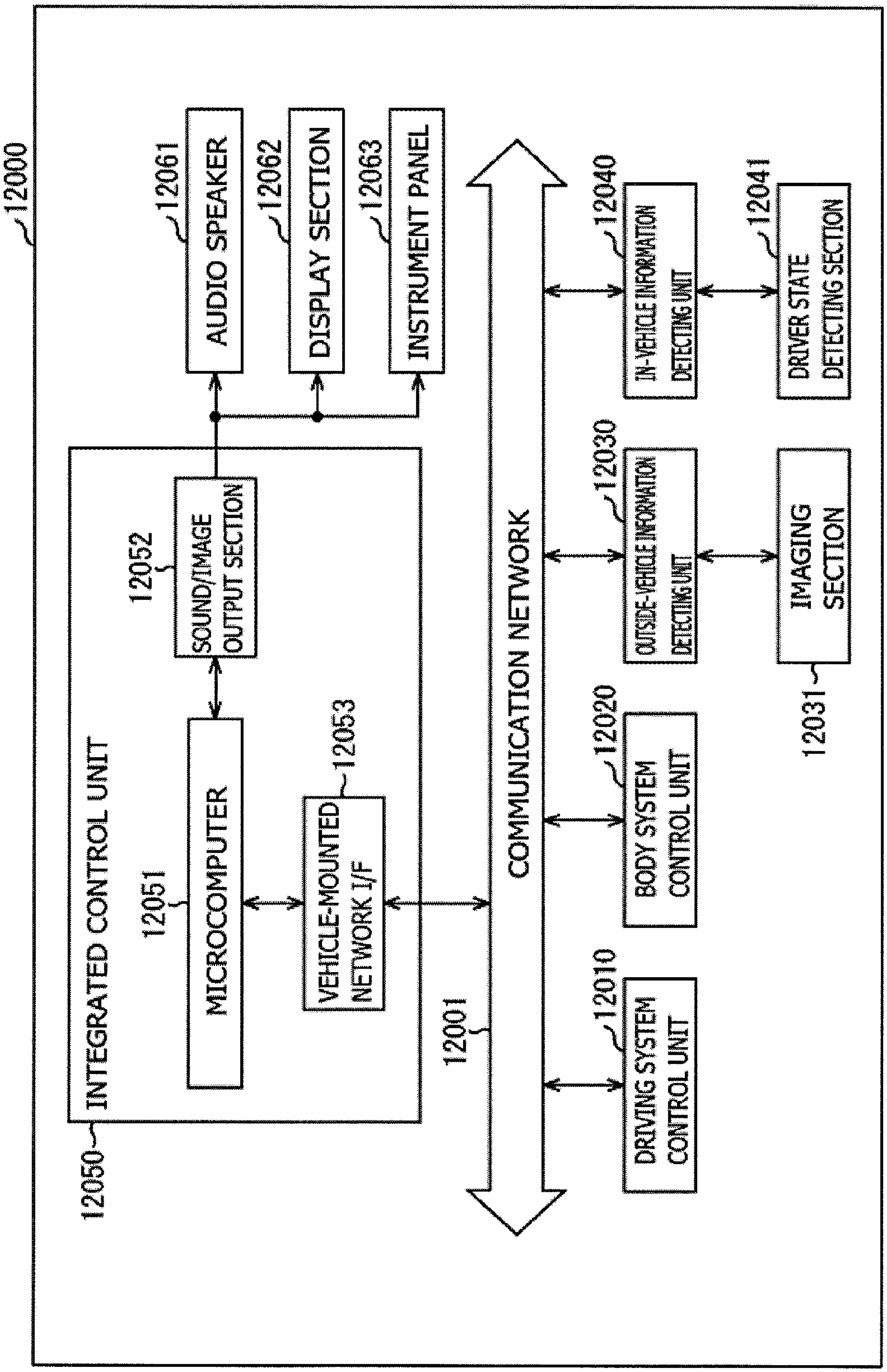

FIG. 27F is a block diagram depicting an example of schematic configuration of a vehicle control system.

Figure 27G:
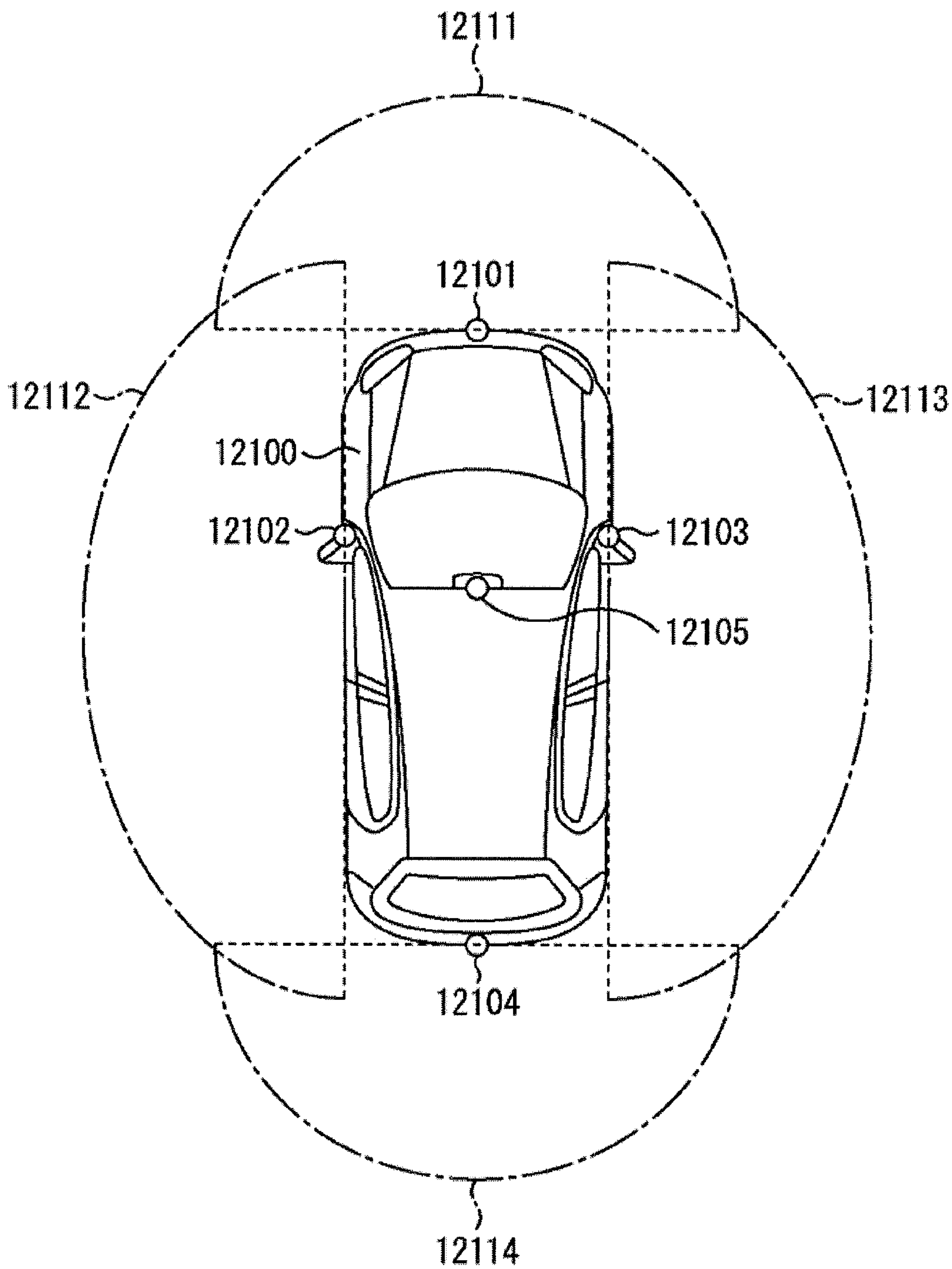

FIG. 27G is a diagram of assistance in explaining an example of installation positions of an outside-vehicle information detecting section and an imaging section.

MODES FOR CARRYING OUT THE INVENTION

Description is given below in detail of preferred embodiments of the present disclosure with reference to attached drawings. Note that, in the present specification and drawings, repeated description is omitted for components substantially having the same functional configuration by assigning the same reference numerals.

In the diagrams described below, sizes of some of the components may be exaggerated for representation for the sake of explanation in some cases. Relative sizes of the components illustrated in the drawings are not necessarily exact representations of magnitude relationships among actual components.

Note that description is given in the following order.

1. Overall Configuration of Solid-State Imaging Device
2. Concerning Disposition of Coupling Structure
3. Concerning Direction of Second Substrate
3-1. Consideration Based on PWELL Area
3-2. Consideration Based on Power Consumption and Disposition of GND Wiring Line
4. Variations of Configuration of Solid-State Imaging Device
4-1. First Configuration Example
4-2. Second Configuration Example
4-3. Third Configuration Example
4-4. Fourth Configuration Example
4-5. Fifth Configuration Example
4-6. Sixth Configuration Example
4-7. Seventh Configuration Example
4-9. Eighth Configuration Example
4-9. Ninth Configuration Example
4-10. Tenth Configuration Example
4-11. Eleventh Configuration Example
4-12. Twelfth Configuration Example
4-13. Thirteenth Configuration Example
4-14. Fourteenth Configuration Example
4-15. Fifteenth Configuration Example
4-16. Sixteenth Configuration Example
4-17. Seventeenth Configuration Example
4-18. Eighteenth Configuration Example
4-19. Nineteenth Configuration Example
4-20. Twentieth Configuration Example
4-21. Summary
5. Application examples
6. Supplement

1. Overall Configuration of Solid-State Imaging Device

Figure 1:
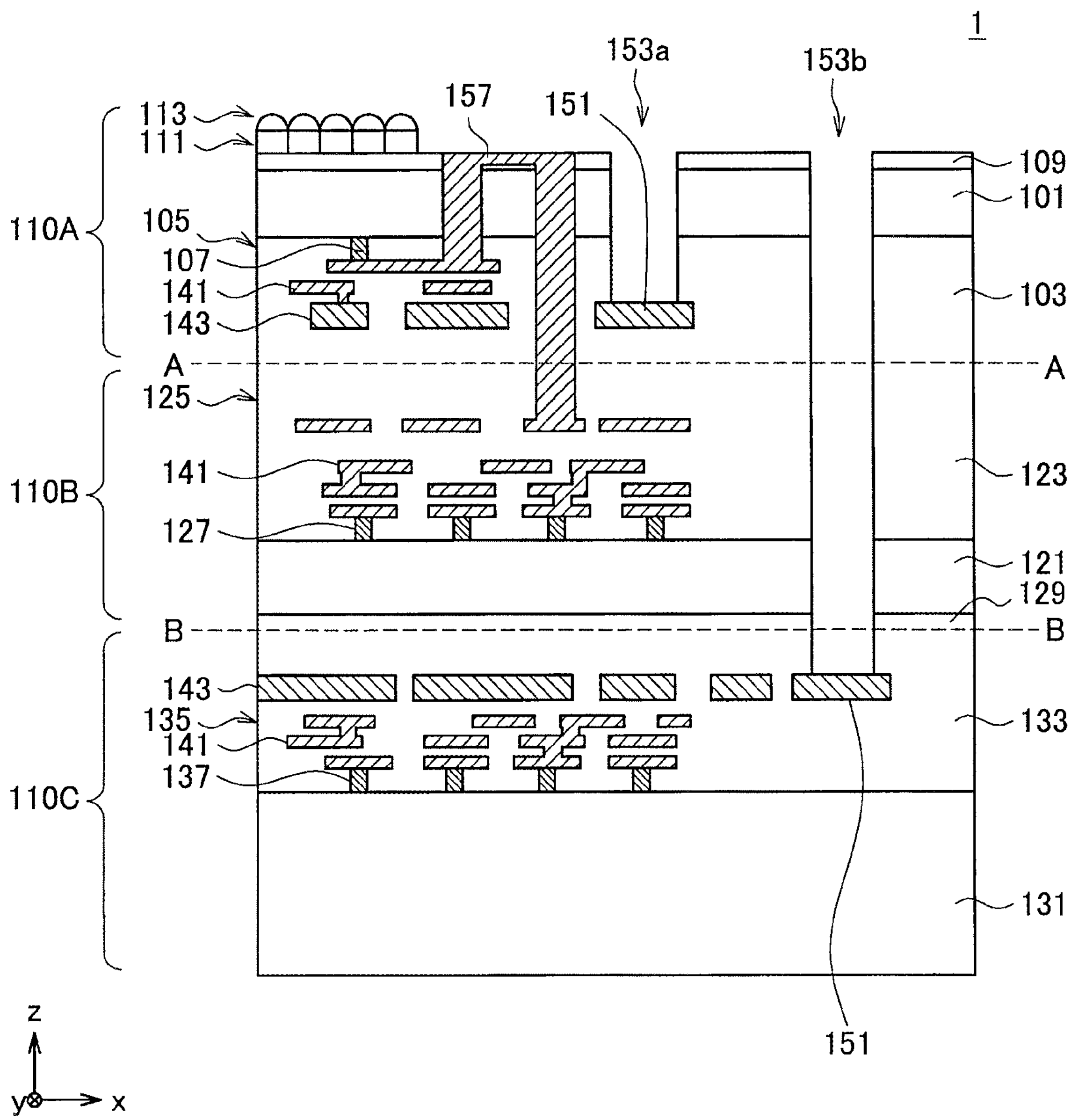
FIG. 1 is a vertical cross-sectional view of a schematic configuration of a solid-state imaging device according to an embodiment of the present disclosure.

FIG. is a vertical cross-sectional view of a schematic configuration of a solid-state imaging device according to an embodiment of the present disclosure. As illustrated in FIG. 1, a solid-state imaging device 1 according to the present embodiment is a three-layer stacked solid-state imaging device including a first substrate 110A, a second substrate 110B, and a third substrate 110C that are stacked. In the diagram, a broken line A-A indicates the bonding surfaces of the first substrate 110A and the second substrate 110B, and a broken line B-B indicates the bonding surfaces of the second substrate 110B and the third substrate 110C. The first substrate 110A is a pixel substrate provided with a pixel unit. The second substrate 11B and the third substrate 110C are provided with circuits for performing various kinds of signal processing related to the operation of the solid-state imaging device 1. The second substrate 110B and the third substrate 110C are, for example, a logic substrate provided with a logic circuit or a memory substrate provided with a memory circuit. The solid-state imaging device 1 is a back-illuminated CMOS (Complementary Mea-Oxide-Semiconductor) image sensor that photoelectrically converts, in a pixel unit, light coming from the back surface side of the first substrate 110A, which is described below. Note that the following describes, for the explanation of FIG. 1, a case where the second substrate 110B is a logic substrate, and the third substrate 110C is a memory substrate, as an example.

It is possible in the stacked solid-state imaging device 1 to more appropriately configure circuits to adapt to the functions of the respective substrates. It is thus easier to allow the solid-state imaging device 1 to exhibit higher performance. It is possible in the illustrated configuration example to appropriately configure the pixel unit in the first substrate 110A, and the logic circuit or the memory circuit in the second substrate 1106 and the third substrate 110C to adapt to the functions of the respective substrates. This makes it possible to achieve the solid-state imaging device 1 that exhibits high performance.

In the following, a direction in which the first substrate 110A, the second substrate 110B, and the third substrate 110C are stacked is also referred to as a z-axis direction. Further, a direction in which the first substrate 110A is positioned in the v-axis direction is defined as a positive direction of the z-axis. Further, two directions orthogonal to each other on a plane (horizontal plane) that is vertical to the z-axis direction are also referred to as an x-axis direction and a y-axis direction, respectively. In addition, in the following, out of two surfaces of the semiconductor substrates 101, 121, and 131 described later that are opposed to a substrate main surface direction, a surface on side where a functional component such as a transistor is provided or a surface on side where multi-layered wiring layers 105, 125, and 135 described later for operation of the functional component is provided, in each of the substrates, is also referred to as a front surface (font side surface), and the other surface opposed to the surface is also referred to as a back surface (back side surface). In each of the substrates, side provided with the front surface is also referred to as a front surface side (front side), and side provided with the back surface is also referred to as a back surface side (back side).

The first substrate 110A mainly includes a semiconductor substrate 101 including, for example, silicon (Si), and the multi-layered wiring layer 105 formed on the semiconductor substrate 101. A pixel unit in which pixels are two-dimensionally arranged and a pixel signal processing circuit that processes a pixel signal are mainly formed on the semiconductor substrate 101. Each of the pixels mainly includes a photodiode (PD) that receives light (observation light) from an observation target and performs photoelectric conversion, and a drive circuit including a transistor or the like that reads out an electric signal (pixel signal) corresponding to the observation light acquired by the PD. In the pixel signal processing circuit, various types of signal processing such as analog-to-digital conversion (AD conversion) are performed on the pixel signal. Note that, in the present embodiment, the pixel unit is not limited to a pixel unit in which pixels are arranged two-dimensionally; pixels may be arranged three-dimensionally. Further, in the present embodiment, a substrate including a material other than a semiconductor may be used instead of the semiconductor substrate 101. For example, a sapphire substrate may be used instead of the semiconductor substrate 101. In this case, a mode may be employed, in which a film that performs photoelectric conversion (e.g., an organic photoelectric conversion film) is deposited on the sapphire substrate to form a pixel.

An insulating film 103 is stacked on a front surface of the semiconductor substrate 101 on which the pixel unit and the pixel signal processing circuit are formed. Inside the insulating film 103, there is formed the multi-layered wiring layer 105 that includes signal line wiring lines for transmitting various signals such as a pixel signal and a drive signal for driving a transistor of a drive circuit. The multi-layered wiring layer 105 further includes a power supply wiring line, a ground wiring line (GND wiring line), and the like. Note that, in the following, for the sake of simplicity, the signal line wiring may be simply referred to as a signal line, in some cases. In addition, the power supply wiring line and the GND wiring line are collectively referred to as a power supply line, in some cases. A lowermost wiring line of the multi-layered wiring layer 105 may be electrically coupled to the pixel unit or the pixel signal processing circuit by a contact 107 in which an electrically-conductive material such as tungsten (W) is embedded. Actually, a plurality of wiring layers may be formed by repeating formation of an interlayer insulating film having a predetermined thickness and formation of the wiring layer. However, in FIG. 1, for the sake of simplicity, these multilayer interlayer insulating films are collectively referred to as the insulating film 103, and the plurality of wiring layers is collectively referred to as the multi-layered wiring layer 105.

Note that a pad 151 functioning as an external input/output unit (VO unit) that exchanges various signals with the outside may be formed in the multi-layered wiring layer 105. The pad 151 may be provided along the outer periphery of the chip.

The second substrate 110B is, for example, a logic substrate. The second substrate 110B mainly includes a semiconductor substrate 121 including Si, for example, and the multi-layered wiring layer 125 formed on the semiconductor substrate 121. A logic circuit is formed on the semiconductor substrate 121. In the logic circuit, various types of signal processing related to the operation of the solid-state imaging device 1 are executed. For example, in the logic circuit, control of a drive signal for driving the pixel unit of the first substrate 110A (i.e., driving control of the pixel unit) and exchange of signals with the outside may be controlled. Note that, in the present embodiment, a substrate including a material other than a semiconductor may be used instead of the semiconductor substrate 121. For example, a sapphire substrate may be used instead of the semiconductor substrate 121. In this case, a mode may be employed, in which a semiconductor film (e.g., a Si film) is deposited on the sapphire substrate and a logic circuit is formed in the semiconductor film.

An insulating film 123 is stacked on the front surface of the semiconductor substrate 121 on which the logic circuit is formed. The multi-layered wiring layer 125 for transmitting various signals related to the operation of the logic circuit is formed inside the insulating film 123. The multi-layered wiring layer 125 further includes a power supply wiring line, a GND wiring line, and the like. The lowermost wiring line of the multi-layered wiring layer 125 may be electrically coupled to the logic circuit by a contact 127 in which an electrically-conductive material such as W is embedded, for example. Note that, similarly to the insulating film 103 and the multi-layered wiring layer 105 of the first substrate 110A, the insulating film 123 of the second substrate 110B may also be a collective term of interlayer insulating films in a plurality of layers, and the multi-layered wiring layer 125 may be a collective term of wiring layers in a plurality of layers.

The third substrate 110C is, for example, a memory substrate. The third substrate 110C mainly includes the semiconductor substrate 131 including, for example, Si, and the multi-layered wiring layer 135 formed on the semiconductor substrate 131. A memory circuit is formed on the semiconductor substrate 131. The memory circuit temporarily holds a pixel signal acquired by the pixel unit of the first substrate 110A and subjected to AD conversion by the pixel signal processing circuit. Temporarily holding a pixel signal in the memory circuit enables a global shutter, and allows the pixel signal to be read out from the solid-state imaging device 1 to the outside at higher speed. Therefore, even at the time of high-speed shooting, it is possible to shoot an image of higher quality in which distortion is suppressed. Note that, in the present embodiment, a substrate including a material other than a semiconductor may be used instead of the semiconductor substrate 131. For example, a sapphire substrate may be used instead of the semiconductor substrate 131. In this case, a mode may be employed, in which a film (e.g., a phase-change material film) for formation of a memory element is deposited on the sapphire substrate, and a memory circuit is formed using the film.

An insulating film 133 is stacked on a front surface of the semiconductor substrate 131 on which the memory circuit is formed. The multi-layered wiring layer 135 for transmitting various signals related to the operation of the memory circuit is formed inside the insulating film 133. The multi-layered wiring layer 135 further includes a power supply wiring line, a GND wiring line, and the like. The lowermost wiring line of the multi-layered wiring layer 135 may be electrically coupled to the memory circuit by a contact 137 in which an electrically-conductive material such as W is embedded, for example. Note that, similarly to the insulating film 103 and the multi-layered wiring layer 105 of the first substrate 110A, the insulating film 133 of the third substrate 110C may also be a collective term of interlayer insulating films in a plurality of layers, and the multi-layered wiring layer 135 may be a collective term of wiring layers in a plurality of layers.

In the multi-layered wiring layer 135, the pad 151 functioning as an I/O unit that exchanges various signals with the outside may be formed. The pads 151 may be provided along the outer periphery of the chip.

The first substrate 110A, the second substrate 11B, and the third substrate 110C are each manufactured in a wafer state. Thereafter, these substrates are bonded together, and the processes are performed for electrically coupling the respective signal lines in the substrate to each other and the respective power supply lines provided in the respective substrates to each other.

Specifically, first, the first substrate 110A in the wafer state and the second substrate 110B in the wafer state are bonded in a manner that the front surface of the semiconductor substrate 101 (the surface on which the multi-layered wiring layer 105 is provided) of the first substrate 110A and the front surface of the semiconductor substrate 121 (the surface on which the multi-layered wiring layer 125 is provided) of the second substrate 110B are opposed to each other. Hereinafter, such a state in which the two substrates are bonded to each other with the surfaces of the semiconductor substrates opposed to each other is also referred to as Face to Face (F-to-F).

Next, the third substrate 110C in the wafer state is further bonded to the multi-layered structure of the first substrate 110A and the second substrate 110B in the wafer state in a manner that a back surface of the semiconductor substrate 121 of the second substrate 110B (a surface on side opposite to side on which the multi-layered wiring layer 125 is provided) and the front surface of the semiconductor substrate 131 of the third substrate 110C (a surface on side on which the multi-layered wiring layer 135 is provided) are opposed to each other. At this time, the semiconductor substrate 121 is thinned before the bonding step, and an insulating film 129 having a predetermined thickness is formed on the back surface side of the semiconductor substrate 121. Hereinafter, such a state in which the two substrates are bonded with respective front and back surfaces of the semiconductor substrates being opposed to each other is also referred to as Face to Back (F-to-B).

Next, the semiconductor substrate 101 of the first substrate 110A is thinned, and an insulating film 109 is formed on the back surface thereof. TSV 157 is formed in order to electrically couple the signal line in the first substrate 110A and the signal line in the second substrate 110B to each other and the power supply line in the first substrate 110A and the power supply line in the second substrate 110B to each other. Note that, in the present specification, for the sake of simplicity, the wiring line in one substrate and the wiring line in another substrate electrically coupled to each other may be simply abbreviated to the term "one substrate and another substrate are electrically coupled to each other". At this time, when it is expressed "substrates are electrically coupled to each other", the wiring line that is actually electrically coupled may be a signal line or a power supply line. In the present specification, the TSV means a via provided from one surface of any one of the first substrate 110A, the second substrate 110B, and the third substrate 110C to penetrate at least one of the semiconductor substrates 101, 121, or 131. In the present embodiment, as described above, a substrate including a material other than a semiconductor may be used instead of the semiconductor substrates 101, 121, and 131; however, in the present specification, a via provided to penetrate a substrate including such a material other than a semiconductor is also referred to as the TSV for the sake of convenience.

The TSV 157 is formed from the back surface side of the first substrate 110A toward the second substrate 110B, and is so provided as to electrically couple the signal line provided in the first substrate 110A and the signal line provided in the second substrate 110B to each other and the power supply line provided in the first substrate 110A and the power supply line provided in the second substrate 110B to each other. Specifically, the TSV 157 is formed by forming a first through hole exposing a predetermined wiring line in the multi-layered wiring layer 105 of the first substrate 110A and a second through hole different from the first through bole exposing a predetermined wiring line in the multi-layered wiring layer 125 of the second substrate 110B from the back surface side of the first substrate 110A, and by embedding an electrically-conductive material in the first and second through holes. The TSV 157 allows for electrical coupling between the predetermined wiring line in the multi-layered wiring layer 105 of the first substrate 110A and the predetermined wiring line in the multi-layered wiring layer 125 of the second substrate 110B. Note that the TSV that electrically couples the wiring lines of the plurality of substrates in this manner by two different through holes (openings penetrating at least one semiconductor substrate) is also referred to as a twin contact.

In the configuration example illustrated in FIG. 1, the TSV 157 is formed by embedding, in the through hole, a first metal (e.g., copper (Cu)) included in the multi-layered wiring layers 105, 125, and 135 described later. However, the electrically-conductive material included in the TSV 157 may not necessarily be the same as the first metal, and any material may be used as the electrically-conductive material.

After the TSV 157 is formed, a color filter layer 111 (CF layer 111) and a microlens array 113 (ML array 113) are formed on a back surface side of the semiconductor substrate 101 of the first substrate 110A, with the insulating film 109 interposed therebetween.

The CF layer 111 is configured by two-dimensionally arranging a plurality of CFs. The ML array 113 is configured by two-dimensionally arranging a plurality of MLs. The CF layer 111 and the ML array 113 are formed immediately above the pixel unit, and one CF and one ML are arranged for the PD of one pixel.

Each CF of the CF layer 111 has any one color of red, green, and blue, for example. The observation light that has passed through the CF enters the PD of the pixel, and the pixel signal is acquired, whereby the pixel signal of a color component of the color filter is acquired for an observation target (i.e., imaging in color becomes possible). Actually, one pixel corresponding to one CF functions as a sub-pixel, and one pixel may include a plurality of sub-pixels. For example, in the solid-state imaging device 1, one pixel may include four-color sub-pixels of a pixel in which a red CF is provided (i.e., a red pixel), a pixel in which a green CF is provided (i.e., a green pixel), a pixel in which a blue CF is provided (i.e., a blue pixel), and a pixel in which a CF is not provided (i.e., a white pixel). However, in the present specification, for the sake of explanation, a configuration corresponding to one sub-pixel is also simply referred to as a pixel without distinguishing the sub-pixel and the pixel from each other. Note that the method of arranging CFs is not particularly limited, and may be various arrangements such as a delta arrangement, a stripe arrangement, a diagonal arrangement, or a rectangle arrangement, for example.

The ML array 113 is so formed as to allow each ML to be positioned immediately above each CF. Providing the ML array 113 allows the observation light collected by the ML to enter the PD of the pixel through the CF, making it possible to improve light collection efficiency of the observation light and thus to achieve an effect of improving sensitivity of the solid-state imaging device 1.

After the CF layer 111 and the ML array 113 are formed, pad openings 153*a* and 153*b* are formed, respectively, in order to expose the pads 151 provided in the multi-layered wiring layer 105 of the first substrate 110A and the multi-layered wiring layer 135 of the third substrate 110C. The pad opening 153*a* is so formed as to extend from back surface side of the first substrate 110A to a metal surface of the pad 151 provided in the multi-layered wiring layer 105 of the first substrate 110A. The pad opening 153*b* is so formed as to penetrate the first substrate 110A and the second substrate 110B from the back surface side of the first substrate 110A and to reach the metal surface of the pad 151 provided in the multi-layered wiring layer 135 of the third substrate 110C. The pad 151 and other external circuit are electrically coupled to each other through the pad openings 153*a* and 153*b* by, for example, wire bonding. That is, respective signal lines included in the first substrate 110A and the third substrate 110C may be electrically coupled to each other through other external circuit, and respective power supply lines included in the first substrate 110A and the third substrate 110C may be electrically coupled to each other through other external circuit.

In the present specification, in a case where a plurality of pad openings 153 exists in the diagram as illustrated in FIG. 1, the pad openings 153 are distinguished from one another by assigning different alphabets to respective ends of the reference numerals, as in the pad openings 153*a*, 153*b*, . . . for the sake of convenience.

Thereafter, a stacked wafer structure stacked and processed in the wafer state is diced for each individual solid-state imaging device 1, thereby completing the solid-state imaging device 1.

The schematic configuration of the solid-state imaging device 1 has been described above. As described above, in the solid-state imaging device 1, the respective signal lines provided in the first substrate IDA and the second substrate 110B are electrically coupled to each other by the TSV 157, and the respective power supply lines provided in the first substrate 110A and the second substrate 110B are electrically coupled to each other by the TSV 157. The pads 151 exposed by the pad openings 153*a* and 153*b* are coupled to each other via an electrical coupling means such as a wiring line provided outside the solid-state imaging device 1, whereby the respective signal lines provided in the second substrate 110B and the third substrate 110C may be electrically coupled to each other, and the respective power supply lines provided in the second substrate 110B and the third substrate 110C may be electrically coupled to each other. That is, the respective signal lines provided in the first substrate 110A, the second substrate 11B, and the third substrate 110C may be electrically coupled together through the TSV 157, the pad 151, and the pad openings 153*a* and 153*b*, and the respective power supply lines provided in the first substrate 110A, the second substrate 110B, and the third substrate 110C may be electrically coupled together through the TSV 157, the pad 151, and the pad openings 153*a* and 153*b*. Note that, in the present specification, a structure that may electrically couple the respective signal lines as well as the respective power supply lines provided in the substrates to each other, such as the TSV 157, the pad 151, and the pad openings 153*a* and 153*b* illustrated in FIG. 1, is also collectively referred to as a coupling structure. Although not used in the structure illustrated in FIG. 1, an electrode junction structure 159 (a structure that exists on a bonding surface between substrates and is joined in a state in which electrodes respectively formed on the bonding surfaces are in direct contact with each other) described later is also included in the coupling structure.

Note that the multi-layered wiring layer OS of the first substrate 110A, the multi-layered wiring layer 125 of the second substrate 110B, and the multi-layered wiring layer 135 of the third substrate 110C may be configured by stacking a plurality of first metal wiring layers 141 including first metal having a relatively low resistance. The first metal is, for example, copper (Cu). The use of a Cu wiring line makes it possible to exchange signals at a higher speed. However, the pad 151 may include second metal different from the first metal in consideration of adhesiveness. etc. of the wire bonding with wire. Accordingly, in the illustrated configuration example, the multi-layered wiring layer 105 of the first substrate 110A and the multi-layered wiring layer 135 of the third substrate 110C each provided with the pad 151 each include, in the same layer as that of the pad 151, a second metal wiring layer 143 formed by the second metal. The second metal is, for example, aluminum (Al). In addition to the pad 151, the Al wiring line may be used, for example, as a power supply wiring line or a GND wiring line which is generally formed as a wide wiring line.

In addition, the first metal and the second metal are not limited to Cu and Al exemplified above. As the first metal and the second metal, various types of metal may be used. Alternatively, each wiring layer of the multi-layered wiring layers 105, 125, and 135 may include an electrically-conductive material other than metal. It is sufficient for these wiring layers to include an electrically-conductive material, and the material thereof is not limited. Instead of using two types of electrically-conductive materials, all of the multi-layered wiring layers 105, 125, and 135 each including the pad 151 may include the same electrically-conductive material.

In the present embodiment, the TSV 157, and an electrode and a via included in the electrode junction structures 139 described later also include the first metal (e.g., Cu). For example, in a case where the first metal is Cu, these structures may be formed by a damascene method or a dual damascene method. However, the present embodiment is not limited to such an example, and a portion or all of these structures may include a second metal, another metal different from any of the first metal and the second metal, or another non-metallic electrically-conductive material. For example, the via included in the TSV 157 and the electrode junction structures 159 may be formed by embedding a metallic material having a favorable embeddability, such as W, in the openings. In a case where via diameter is relatively small, such a structure using W may be preferably applied in consideration of the embeddability. The TSV 157 may not necessarily be formed by embedding an electrically-conductive material in the through hole, but may include a film of an electrically-conductive material formed on the inner wall (side wall and bottom) of the through hole.

Although illustration is omitted in FIG. 1 and subsequent drawings, in the solid-state imaging device 1, there are insulating materials that electrically insulate the first metal and the second metal from each other at portions illustrated such that the electrically-conductive material such as the first metal and the second metal are in contact with the semiconductor substrates 101, 121, and 131. The insulating material may be, for example, any of various known materials such as silicon oxide ($SiO_2$) or silicon nitride (SiN). The insulating material may be interposed between the electrically-conductive material and each of the semiconductor substrates 101, 121, and 131, or may be inside each of the semiconductor substrates 101, 121, and 131 that are away from the portion where the electrically-conductive material and each of the semiconductor substrates 101, 121, and 131 are in contact with each other. For example, for the TSV 157, an insulating material may exist between the inner walls of the through holes provided in the semiconductor substrates 101, 121, and 131 and the electrically-conductive material embedded in the through holes (i.e., a film of an insulating material may be formed on the inner walls of the through holes). Alternatively, for the TSV 157, insulating materials may exist at portions, inside the semiconductor substrates 101, 121, and 131, away from the through holes provided in the semiconductor substrates 101, 121, and 131 by predetermined distances in the horizontal plane direction. Although illustration is omitted in FIG. 1 and subsequent drawings, in the case where the first metal is Cu, a barrier metal exists in order to prevent Cu from diffusing in portions where Cu is in contact with the semiconductor substrates 101, 121, and 131 or the insulating films 103, 109, 123, 129, and 133. As the barrier metal, various known materials such as titanium nitride (TiN) or tantalum nitride (TaN) may be used.

Further, the specific configurations of the respective components (a pixel unit and a pixel signal processing circuit provided in the first substrate 110A, a logic circuit provided in the second substrate 110B, and a memory circuit provided in the third substrate 110C), the multi-layered wiring layers 105, 125, and 135, and the insulating films 103, 109, 123, 129, and 133 that are formed in the semiconductor substrates 101, 121, and 131 of the respective substrates, and formation methods thereof may be similar to various known configurations and methods. The specific configurations and the formation methods are not thus described here in detail.

For example, it is sufficient for the insulating films 103, 109, 123, 129, and 133 to include materials having an insulating property. The materials thereof are not limited. The insulating films 103, 109, 123, 129, and 133 may include, for example, $SiO_2$, SiN, or the like. In addition, each of the insulating films 103, 109, 123, 129, and 133 does not have to include one type of insulating material, but may include a plurality of types of stacked insulating materials. In addition, for example, as for a region for formation of a wiring line that is required to transmit signals at higher speed in the insulating films 103, 123, and 133, a Low-k material having an insulating property may be used. The use of the Low-k material allows the parasitic capacitance between wiring lines to be reduced, which makes it possible to further contribute to signal transmission at higher speed.

It is possible to apply as appropriate, as the other specific configurations of the respective components formed in the semiconductor substrates 101, 121, and 131 of the respective substrates, the multi-layered wiring layers 105, 125, and 135, and the insulating films 103, 109, 123, 129, and 133, and the other formation methods thereof, for example, those that are described, for example, in PTL 1, which is a prior application filed by the applicant of the present application.

In addition, in the configuration example described above, the first substrate 110A is mounted with a pixel signal processing circuit that performs signal processing such as AD conversion on a pixel signal, but the present embodiment is not limited to the example. A portion or all of the functions of the pixel signal processing circuit may be provided to the second substrate 110B. This case may achieve the solid-state imaging device 1 that performs so-called pixel-by-pixel analog-to-digital conversion (pixel ADC). In the pixel ADC, a pixel signal acquired by a PD provided to each pixel is transmitted to the pixel signal processing circuit of the second substrate 110B for each pixel, and AD conversion is performed for each pixel, for example, in a pixel array in which a plurality of pixels is arrayed in both a column direction and a row direction. This allows pixel signals to be subjected to AD conversion and read out at higher speed as compared with the solid-state imaging device 1 that includes one AD conversion circuit for each column of the pixel array, and performs general column-by-column analog-to-digital conversion (column ADC). In the column ADC, a plurality of pixels included in a column is sequentially subjected to AD conversion. Note that, in a case where the solid-state imaging device 1 is configured to be able to execute the pixel ADC, each pixel is provided with a coupling structure that electrically couples the respective signal lines provided in the first substrate 110A and the second substrate 110B to each other.

In addition, in the configuration example described above, a case where the second substrate 110B is a logic substrate, and the third substrate 110C is a memory substrate has been described. The present embodiment is not, however, limited to such an example. It is sufficient for the second substrate 11B and the third substrate 110C to be substrates having functions other than that of the pixel substrate, and the functions may be optionally determined. For example, the solid-state imaging device 1 does not have to include any memory circuit. In this case, for example, both the second substrate 110B and the third substrate 110C may function as logic substrates. Alternatively, a logic circuit and a memory circuit may be distributed in the second substrate 110B and the third substrate 110C, and these substrates may cooperate to achieve the functions of a logic substrate and a memory substrate. Alternatively, the second substrate 110B may be a memory substrate, and the third substrate 110C may be a logic substrate.

In addition, in the configuration example described above. Si substrates are used as the semiconductor substrates 101, 121, and 131 in the respective substrates, but the present embodiment is not limited to the example. As the semiconductor substrates 101, 121, and 131, other types of semiconductor substrates may be used such as gallium arsenide (GaAs) substrates or silicon carbide (SiC) substrates, for example. Alternatively, as described above, instead of the semiconductor substrates 101, 121, and 131, for example, substrates each including a material other than a semiconductor, such as sapphire substrates may be used.

2. Concerning Disposition of Coupling Structure

As described with reference to FIG. 1, in the solid-state imaging device 1, the respective signal lines included in the substrates may be electrically coupled to each other through the coupling structures, and/or the respective power supply lines included in the substrates may be electrically coupled to each other over a plurality of substrates through the coupling structures. The disposition of these coupling structures in the horizontal plane may be determined as appropriate to improve the performance of the entire solid-state imaging device 1 by considering the configuration, performance, and the like of each of the substrates (chips) Several variations of the disposition of the coupling structures in the solid-slate imaging device 1 in the horizontal plane are described.

Figure 2A:
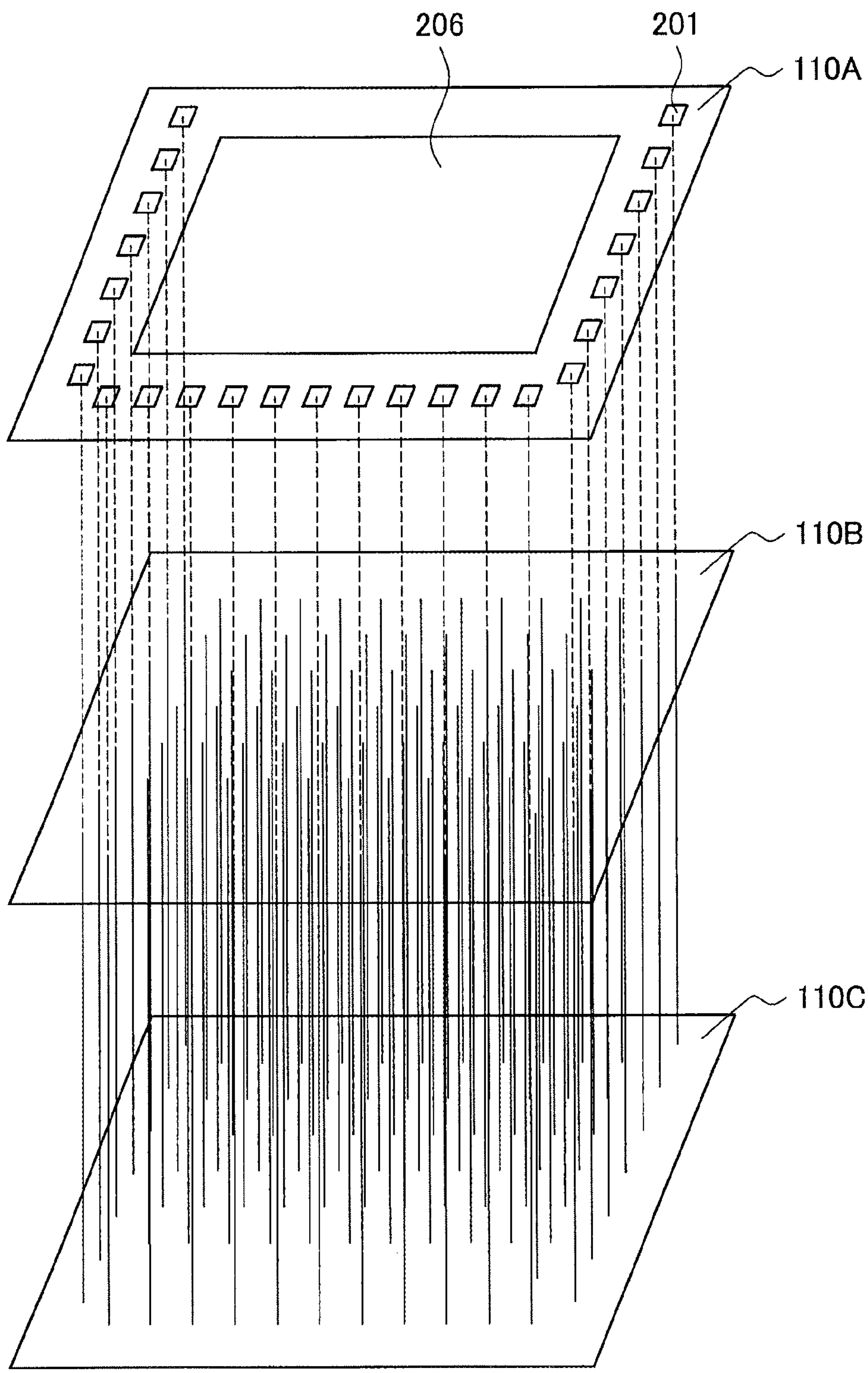
FIG. 2A is an explanatory diagram of an example of disposition of coupling structures in the solid-state imaging device in a horizontal plane.
Figure 2B:
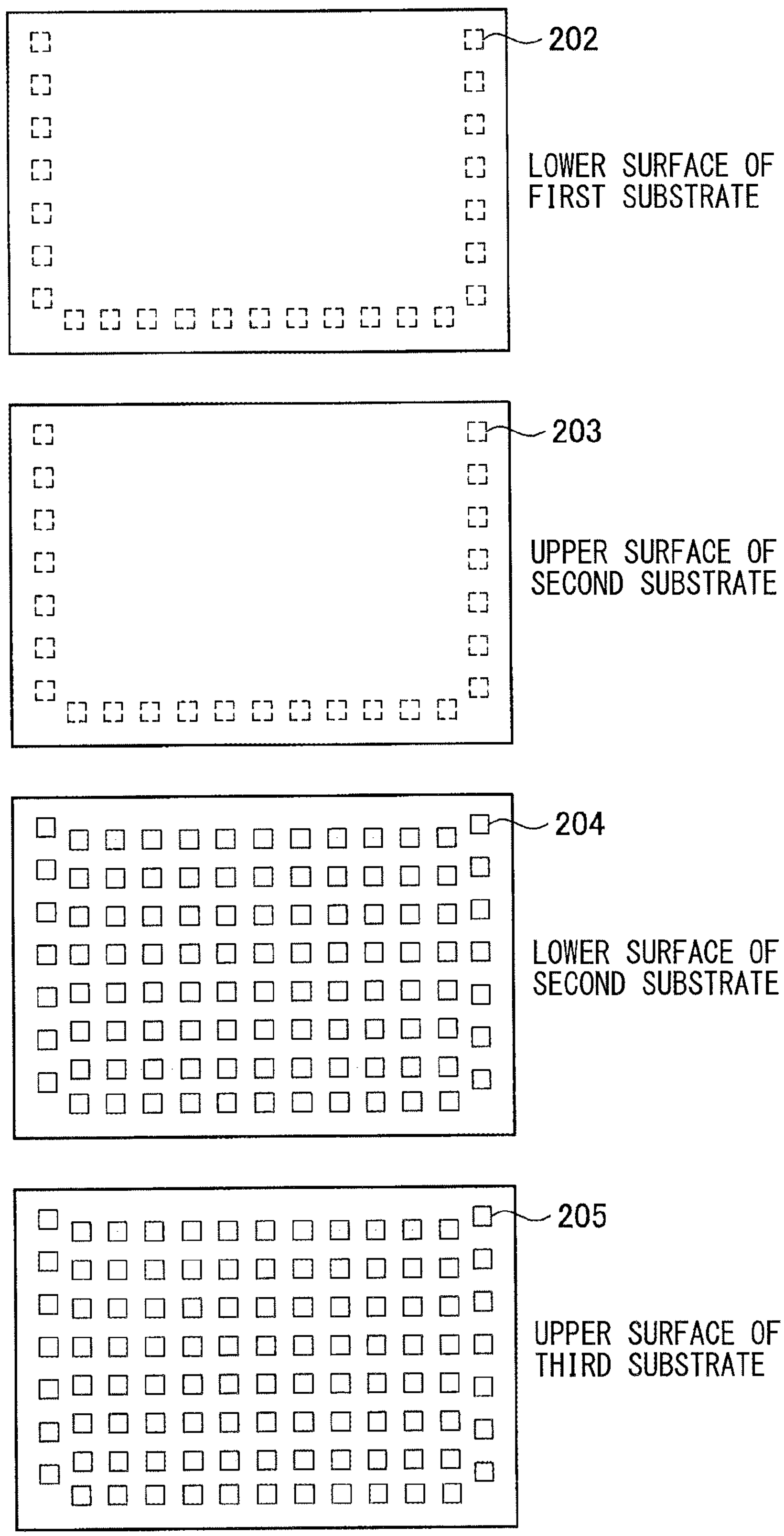
FIG. 2B is an explanatory diagram of an example of disposition of coupling structures in the solid-state imaging device in the horizontal plane.

Each of FIGS. 2A and 2B is an explanatory diagram of an example of the disposition of the coupling structures in the solid-state imaging device 1 in the horizontal plane. FIGS. 2A and 2B each illustrate the disposition of the coupling structures in the solid-state imaging device 1 in a case where a pixel signal processing circuit that performs processing such as AD conversion on a pixel signal is mounted on the first substrate 110A, for example.

FIG. 2A schematically illustrates the first substrate 110A, the second substrate 110B, and the third substrate 110C included in the solid-state imaging device 1. Electrical coupling between the lower surface (surface opposed to the second substrate 110B) of the first substrate 110A and the upper surface (surface opposed to the first substrate 110A) of the second substrate 110B through coupling structures is indicated by a broken line in a simulated manner, and electrical coupling between the lower surface (surface opposed to the third substrate 110C) of the second substrate 110B and the upper surface (surface opposed to the second substrate 110B) of the third substrate 110C through coupling structures is indicated by a solid line in a simulated manner.

On the upper surface of the first substrate 110A, the positions of a pixel unit 206 and a coupling structure 201 are illustrated. The coupling structure 201 functions as an I/O unit for exchanging various signals such as a power supply signal and a GND signal with the outside. Specifically, the coupling structure 201 may be the pad 151 provided to the upper surface of the first substrate 110A. Alternatively, as illustrated in FIG. 1, in a case where the pad 151 is provided in the multi-layered wiring layer 105 of the first substrate 110A, the multi-layered wiring layer 125 of the second substrate 110B, or the multi-layered wiring layer 135 of the third substrate 110C, the coupling structure 201 may be a pad opening 153 provided to expose the pad 151. Alternatively, the coupling structure 201 may be a lead line opening 155 described later. As illustrated in FIG. 2A, the first substrate 110A is provided with the pixel unit 206 in the middle of the chip and the coupling structures 201 included in the I/O unit are disposed around the pixel unit 206 (i.e., along the outer periphery of the chip). In addition, although not illustrated, pixel signal processing circuits may also be disposed around the pixel unit 206.

FIG. 2B schematically illustrates the positions of coupling structures 202 on the lower surface of the first substrate 110A, the positions of coupling structures 203 on the upper surface of the second substrate 110B, the positions of coupling structures 204 on the lower surface of the second substrate 110B, and the positions of coupling structures 205 on the upper surface of the third substrate 110C. These coupling structures 202 to 205 may be each the TSV 157 or the electrode junction structure 159 described later provided between the substrates. Alternatively, as illustrated in FIG. 1, in a case where the pad 151 is provided in the multi-layered wiring layer 125 of the second substrate 110B or the multi-layered wiring layer 135 of the third substrate 110C, it may be the pad opening 153, out of the coupling structures 202 to 205, provided to expose the pad 151 that is positioned immediately below the coupling structure 201. Alternatively, the coupling structures 202 to 205 may be the lead line opening 155 described later. Note that FIG. 2B illustrates the coupling structures 202 to 205 in accordance with the forms of straight lines indicating electrical coupling illustrated in FIG. 2A. That is, the coupling structures 202 on the lower surface of the first substrate 110A and the coupling structures 203 on the upper surface of the second substrate 110 are indicated by broken lines, and the coupling structures 204 on the lower surface of the second substrate 110 and the coupling structures 205 on the upper surface of the third substrate 110C are indicated by solid lines.

As described above, in the illustrated configuration example, pixel signal processing circuits are mounted around the pixel unit 206 of the first substrate 110A. Therefore, pixel signals acquired by the pixel unit 206 are subjected to processing such as AD conversion by the pixel signal processing circuits on the first substrate 110A, and then transmitted to circuits provided on the second substrate 110B. In addition, as described above, the coupling structures 201 included in the I/O unit are also disposed around the pixel unit 206 of the first substrate 110A of the first substrate 110A. Therefore, as illustrated in FIG. 2B, the coupling structures 202 on the lower surface of the first substrate 110A are disposed along the outer periphery of the chip in association with the regions where the pixel signal processing circuits and the/O units exist in order to electrically couple the pixel signal processing circuits and the I/O units to the circuits provided on the second substrate 110B. In addition, the coupling structures 203 on the upper surface of the second substrate 110B are also disposed accordingly along the outer periphery of the chip.

Meanwhile, a logic circuit or a memory circuit mounted on the second substrate 110B and the third substrate 110C may be formed on the entire surface of the chip. The coupling structures 204 on the lower surface of the second substrate 110B and the coupling structures 205 on the upper surface of the third substrate 110C are thus disposed over the entire surface of the chips in association with the position at which the logic circuit or the memory circuit is mounted, as illustrated in FIG. 2B.

Figure 2C:
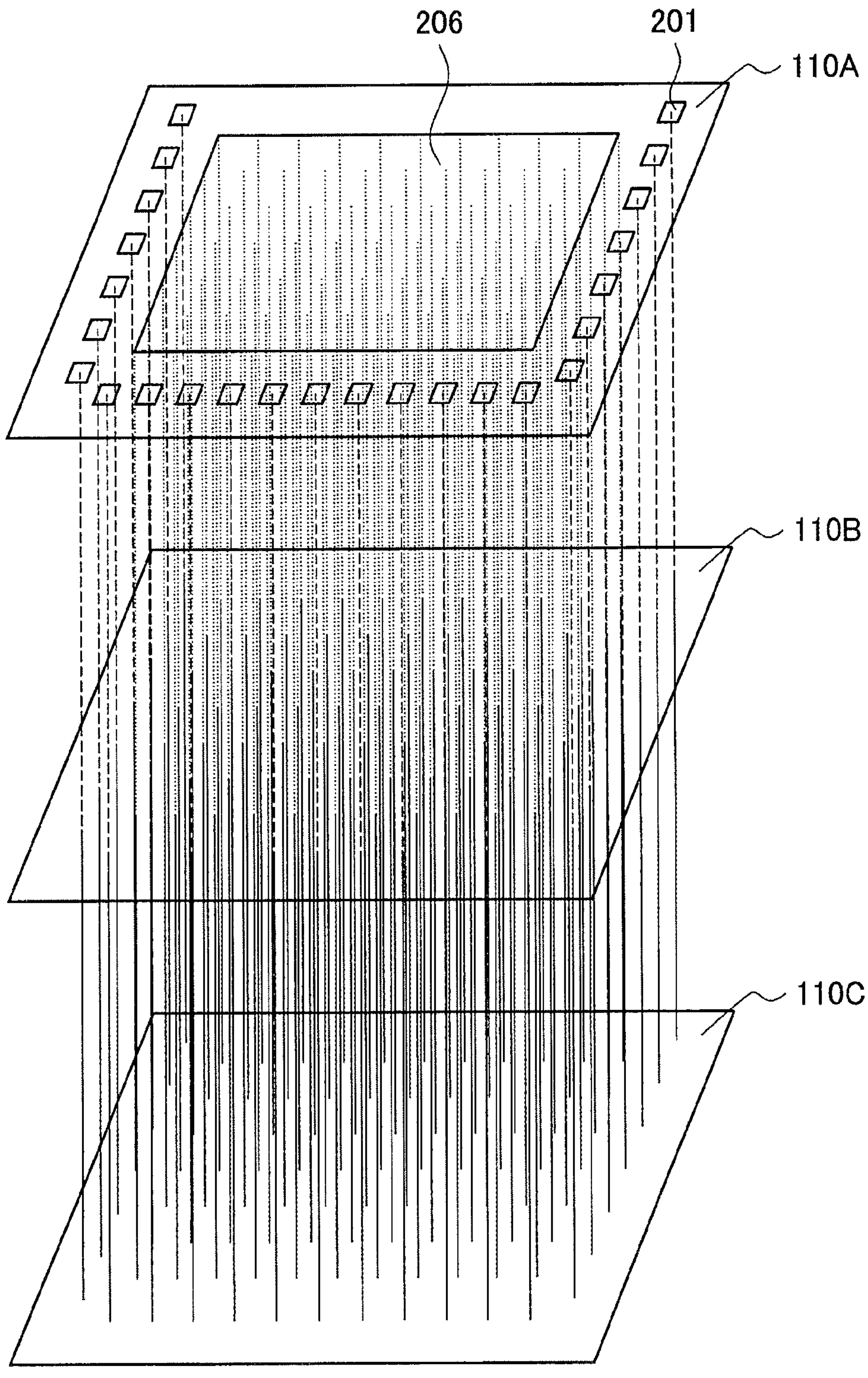
FIG. 2C is an explanatory diagram of another example of disposition of coupling structures in the solid-state imaging device in the horizontal plane.
Figure 2D:
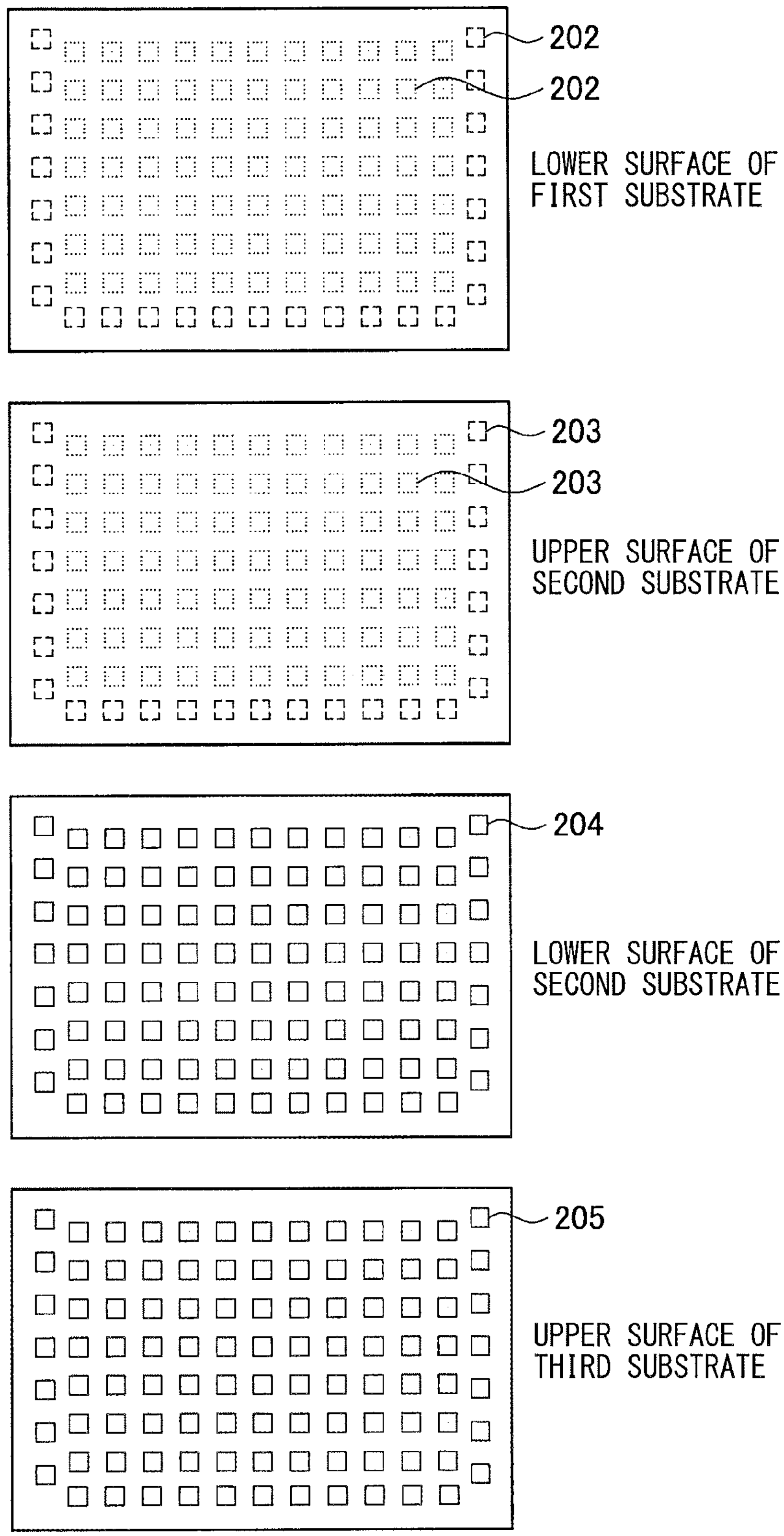
FIG. 2D is an explanatory diagram of another example of disposition of coupling structures in the solid-state imaging device in the horizontal plane.

FIGS. 2C and 2D are each an explanatory diagram of another example of disposition of coupling structures in the solid-state imaging device 1 in the horizontal plane. FIGS. 2C and 2D each illustrate the disposition of coupling structures in a case where, for example, the solid-state imaging device 1 is configured to be able to execute pixel ADC. In this case, a pixel signal processing circuit is mounted on not the first substrate 110A, but the second substrate 110B.

Similarly to FIG. 2A. FIG. 2C schematically illustrates the first substrate 110A, the second substrate 110B, and the third substrate 110C included in the solid-state imaging device 1. Electrical coupling between the lower surface (surface opposed to the second substrate 110B) of the first substrate 110A and the upper surface (surface opposed to the first substrate 110A) of the second substrate 110B through coupling structures is indicated by a broken line or a dotted line in a simulated manner, and electrical coupling between the lower surface (surface opposed to the third substrate 110C) of the second substrate 110B and the upper surface (surface opposed to the second substrate 110B) of the third substrate 110C through coupling structures is indicated by a solid line in a simulated manner. Among the lines indicating electrical coupling between the lower surface of the first substrate 110A and the upper surface of the second substrate 110B, a broken line indicates electrical coupling related to an I/O unit, for example, which also exists in FIG. 2A, and a dotted line indicates electrical coupling related to pixel ADC, which does not exist in FIG. 2A.

Similarly to FIG. 2B, FIG. 2D schematically illustrates the positions of coupling structures 202 on the lower surface of the first substrate 110A, the positions of coupling structures 203 on the upper surface of the second substrate 110B, the positions of coupling structures 204 on the lower surface of the second substrate 110B, and the positions of coupling structures 205 on the upper surface of the third substrate 110C. Note that FIG. 2D illustrates the coupling structures 202 to 205 in accordance with the forms of straight lines indicating electrical coupling illustrated in FIG. 2C. That is, among the coupling structures 202 on the lower surface of the first substrate 110A or the coupling structures 203 on the upper surface of the second substrate 110B, those that correspond to, for example, electrical coupling related to I/O units, which also exists in FIG. 2A, are indicated by broken lines, and those that may correspond to electrical coupling related to pixel ADC are indicated by dotted lines. In contrast, the coupling structures 204 on the lower surface of the second substrate 110B and the coupling structures 205 on the upper surface of the third substrate 110C are indicated by solid lines.

As described above, in the illustrated configuration example, a pixel signal processing circuit is mounted on the second substrate 110B, and the pixel signal processing circuit is configured to be able to perform pixel ADC. That is, a pixel signal acquired by each pixel of the pixel unit 206 is transmitted to the pixel signal processing circuit mounted on the second substrate 110B immediately below for each pixel, and the pixel signal processing circuit performs processing such as AD conversion. As illustrated in FIGS. 2C and 2D, in the configuration example, the coupling structures 202 on the lower surface of the first substrate 110A are thus disposed along the outer periphery of the chip (coupling structures 202 indicated by the broken lines in the diagram) in association with the regions where the I/O units exist in order to transmit signals from the I/O units to the circuits provided on the second substrate 110B, and are disposed over the entire region where the pixel unit 206 exists (coupling structures 202 indicated by the dotted lines in the diagram) in order to transmit a pixel signal from each pixel of the pixel unit 206 to the circuits provided on the second substrate 110B.

The respective signal lines of the second substrate 110B and the third substrate 110C are electrically coupled to each other and the respective power supply lines of the second substrate 110B and the third substrate 110C are electrically coupled to each other similarly to the configuration example illustrated in FIGS. 2A and 2B. As illustrated in FIGS. 2C and 2D, the coupling structures 204 on the lower surface of the second substrate 110B and the coupling structures 205 on the upper sur face of the third substrate 110C are thus disposed over the entire surface of the chips.

Figure 2E:
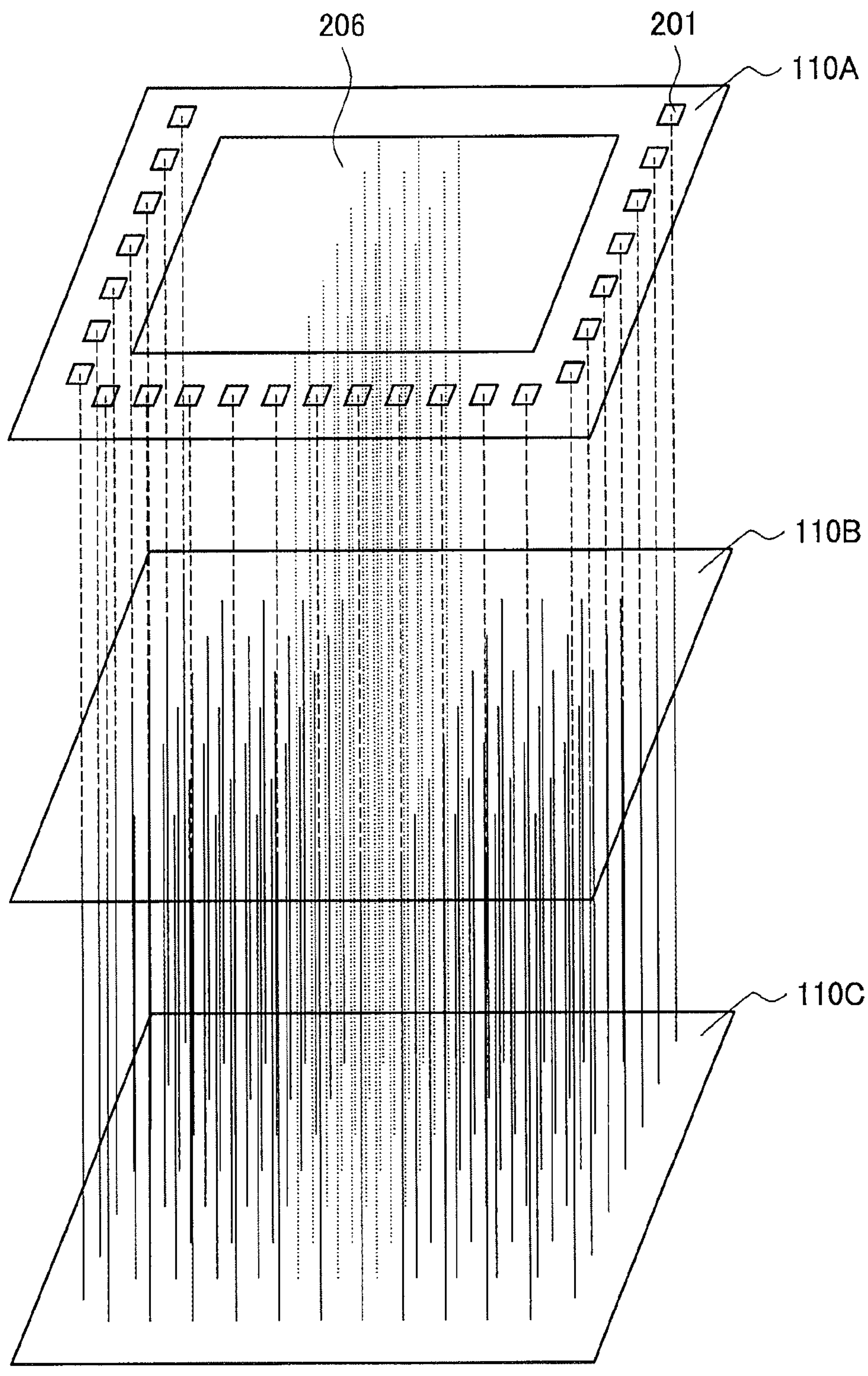
FIG. 2E is an explanatory diagram of yet another example of disposition of coupling structures in the solid-state imaging device in the horizontal plane.
Figure 2F:
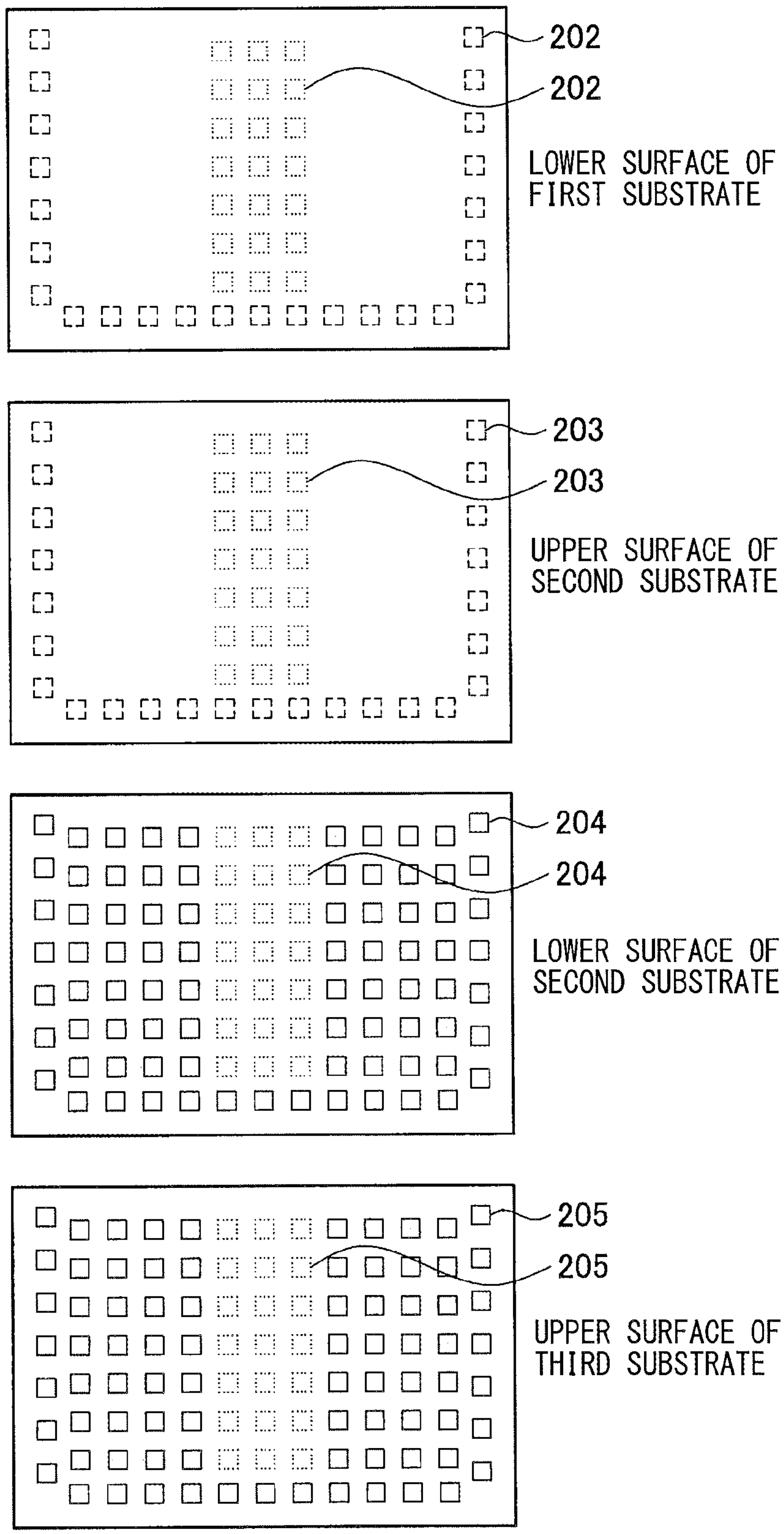
FIG. 2F is an explanatory diagram of yet another example of disposition of coupling structures in the solid-state imaging device in the horizontal plane.

FIGS. 2E and 2F are each an explanatory diagram of yet another example of disposition of coupling structures in the solid-state imaging device 1 in the horizontal plane. FIGS. 2E and 2F each illustrate the disposition of coupling structures in a case where, for example, a memory circuit is mounted on the second substrate 110B.

Similarly to FIG. 2A, FIG. 2E schematically illustrates the first substrate 110A, the second substrate 110B, and the third substrate 110C included in the solid-state imaging device 1. Electrical coupling between the lower surface (surface opposed to the second substrate 110B) of the first substrate 110A and the upper surface (surface opposed to the first substrate 110A) of the second substrate 110B through coupling structures is indicated by a broken line or a dotted line in a simulated manner, and electrical coupling between the lower surface (surface opposed to the third substrate 110C) of the second substrate 110B and the upper surface (surface opposed to the second substrate 110C) of the third substrate 110C through coupling structures is indicated by a solid line or a dotted line in a simulated manner. Among the lines indicating electrical coupling between the lower surface of the first substrate 110A and the upper surface of the second substrate 110B, a broken line indicates electrical coupling related to an I/O unit, for example, which also exists in FIG. 2A, and a dotted line indicates electrical coupling related to a memory circuit, which does not exist in FIG. 2A. In addition, among the lines indicating electrical coupling between the lower surface of the second substrate 110B and the upper surface of the third substrate 110C, the solid lines indicate electrical coupling, which also exists in FIG. 2A, related to signals that are not directly related to the operation of a memory circuit, for example, and the dotted lines indicate electrical coupling, which does not exist in FIG. 2A, related to a memory circuit.

Similarly to FIG. 2B. FIG. 2F schematically illustrates the positions of coupling structures 202 on the lower surface of the first substrate 110A, the positions of coupling structures 203 on the upper surface of the second substrate 110B, the positions of coupling structures 204 on the lower surface of the second substrate 110B, and the positions of coupling structures 205 on the upper surface of the third substrate 110C. Note that FIG. 2F illustrates the coupling structures 202 to 205 in accordance with the forms of straight lines indicating electrical coupling illustrated in FIG. 2E. That is, among the coupling structures 202 on the lower surface of the first substrate 110A or the coupling structures 203 on the upper surface of the second substrate 110B, those that correspond to, for example, electrical coupling related to I/O units, which also exists in FIG. 2A, are indicated by broken lines, and those that may correspond to electrical coupling related to a memory circuit are indicated by dotted lines. In addition, among the coupling structures 204 on the lower surface of the second substrate 110B and the coupling structures 205 on the upper surface of the third substrate 110C, those that correspond to electrical coupling, which exists in FIG. 2A, related to signals that are not directly related to the operation of a memory circuit, for example, are indicated by solid lines, and those that may correspond to electrical coupling related to a memory circuit are indicated by dotted lines.

As described above, in the illustrated configuration example, a memory circuit is mounted on the second substrate 110B. In this case, a pixel signal processing circuit is mounted on the first substrate 110A, and a pixel signal acquired by the pixel unit 206 and subjected to AD conversion by the pixel signal processing circuit on the first substrate 110A may be transmitted to the memory circuit of the second substrate 110 and held in the memory circuit. To read out the pixel signal held in the memory circuit of the second substrate 110B, for example, to the outside, a signal is then transmitted between the memory circuit of the second substrate 110B and a logic circuit of the third substrate 110C.

Therefore, in the configuration example, as the coupling structures 202 on the lower surface of the first substrate 110A, the coupling structures 202 are disposed along the outer periphery of the chip (coupling structures 202 indicated by the broken lines in the diagram) in association with the regions where I/O units and pixel signal processing circuits are mounted in order to transmit signals from the I/O units and the pixel signal processing circuits to the second substrate 110B, and the coupling structures 202 are disposed (coupling structures 202 indicated by the dotted lines in the diagram) for transmitting the pixel signals subjected to AD conversion to a memory circuit of the second substrate 110B. At this time, in order to equalize the delay times, it is desirable that the wiring lengths of the transmission paths of the pixel signals from the circuit of the first substrate 110A to the memory circuit of the second substrate 110B and the wiring lengths of the transmission paths of the signals between the memory circuit of the second substrate 110B and the logic circuit of the third substrate 110C be each equal as much as possible. Thus, for example, as illustrated in FIG. 2F, the coupling structures 202 to 205 for exchanging signals between the circuit of the first substrate 110A and the memory circuit of the second substrate 110B and between the memory circuit of the second substrate 110B and the circuit of the third substrate 110C may be provided to concentrate in the vicinity of the middle of the horizontal plane. However, as long as it is possible to make the wiring lengths substantially uniform, the coupling structures 202 to 205 do not necessarily have to be provided in the vicinity of the middle of the horizontal plane as in the illustrated example.

Several examples of the disposition of coupling structures in the solid-state imaging device 1 in the horizontal plane have been described above. Note that the present embodiment is not limited to the examples described above. Components mounted on the respective substrates of the solid-state imaging device 1 may be determined as appropriate, and the disposition of coupling structures in the solid-state imaging device 1 in the horizontal plane may also be determined as appropriate in accordance with the components. As components mounted on each substrate and the corresponding disposition of coupling structures in the horizontal plane, various known components and dispositions may be applied. In addition, in the examples illustrated in FIGS. 2A to 2F, the coupling structures 201 included in I/O units are disposed along three sides of the outer periphery of the chips, but the present embodiment is not limited to the examples. Various known disposition may also be applied as the disposition of I/O units. For example, the coupling structures 201 included in I/O units may be disposed along one side, two sides, or four sides of the outer periphery of the chips.

3. Concerning Direction of Second Substrate

In the configuration example illustrated in FIG. 1, in the solid-state imaging device 1, the first substrate 110A and the second substrate 110B are bonded together F-to-F (i.e., the front surface side of the second substrate 110B is opposed to the first substrate 110A). Meanwhile, the solid-state imaging device 1 may include the first substrate 110A and the second substrate 110B that are bonded together F-to-B (i.e., the front surface side of the second substrate 110B may be opposed to the third substrate 110C).

The direction of the second substrate 110B may be determined as appropriate to improve the performance of the entire solid-state imaging device 1 by considering, for example, the configuration, performance, and the like of each of the substrates (each of the chips). Here, two concepts for determining the direction of the second substrate 110B are described as an example.

3-1. Consideration Based on PWELL Area

Figure 3A:
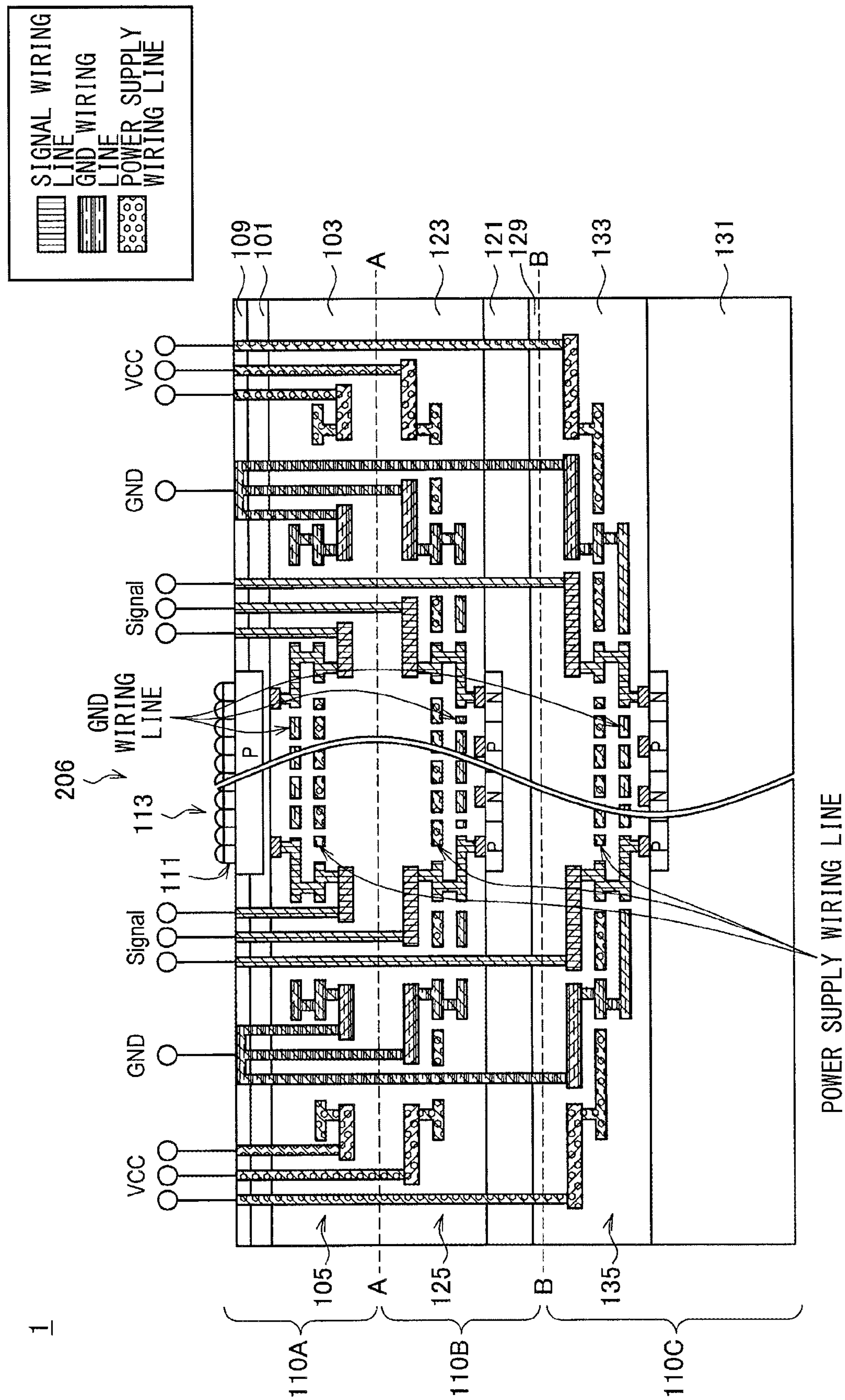
FIG. 3A is a vertical cross-sectional view of a schematic configuration of a solid-state imaging device in which a first substrate and a second substrate are bonded to each other F-to-F.
Figure 3B:
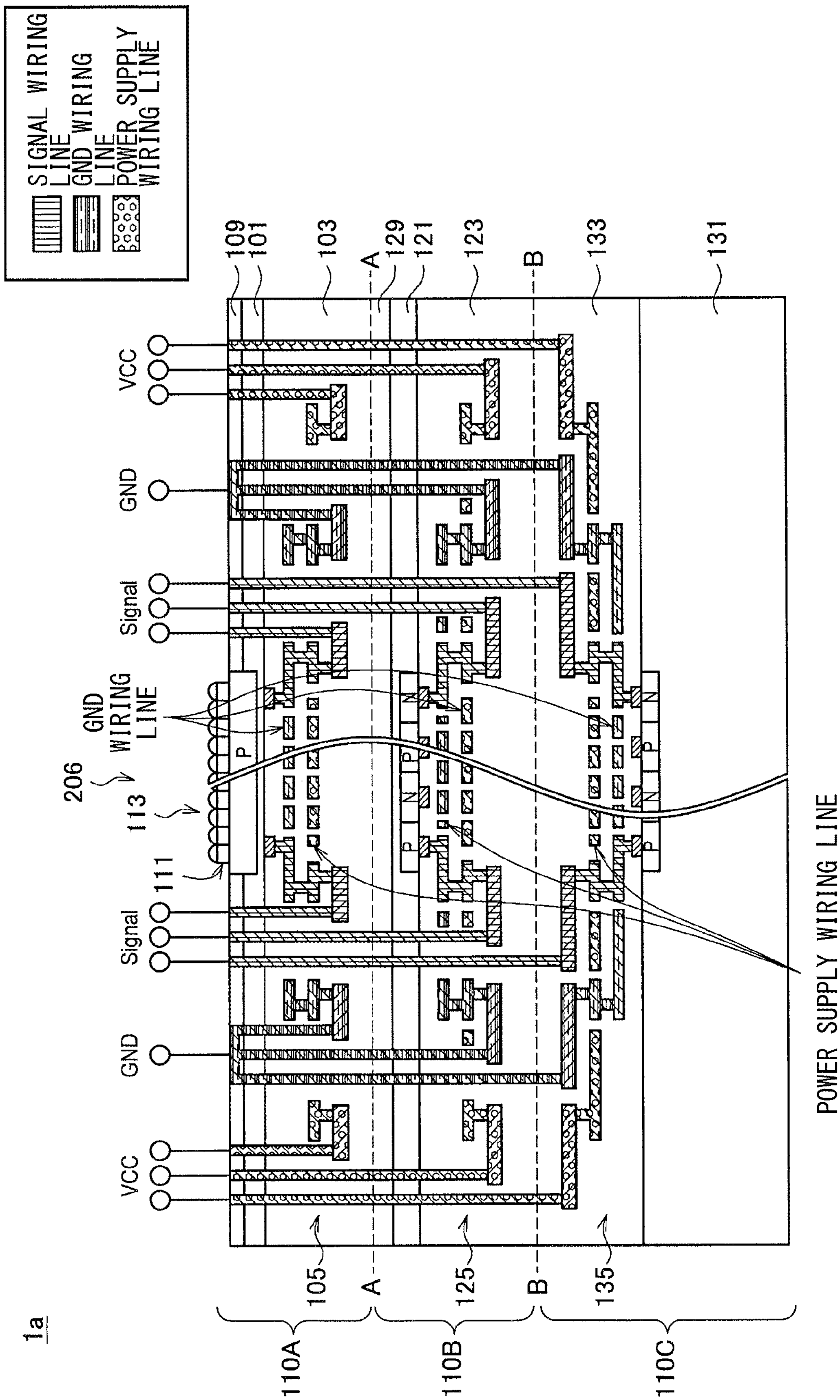
FIG. 3B is a vertical cross-sectional view of a schematic configuration of a solid-state imaging device in which the first substrate and the second substrate are bonded to each other F-to-B.

Similarly to the configuration example illustrated in FIG. 1, FIG. 3A is a vertical cross-sectional view of a schematic configuration of the solid-state imaging device 1 in which the first substrate 110A and the second substrate 110B are bonded together F-to-F. Unlike the configuration example illustrated in FIG. 1. FIG. 3B is a vertical cross-sectional view of a schematic configuration of a solid-state imaging device 1*a* in which the first substrate 110A and the second substrate 110B are bonded together F-to-B. The configuration of the solid-state imaging device 1*a* is similar to that of the solid-state imaging device 1 illustrated in FIG. 1 except that the direction of the second substrate 110B is reversed.

In FIGS. 3A and 3B, the functions (signal lines, GND wiring lines, or power supply wiring lines) of the respective wiring lines included in the multi-layered wiring layers 105, 125, and 135 are represented by assigning superimposed different hatchings to these wiring lines (i.e., hatchings of respective wiring lines are those of the hatchings representing the functions of the wiring lines indicated by the legends illustrated in FIGS. 3A and 3B being superimposed on the hatchings of the respective wiring lines illustrated in FIG. 1 (the same holds true also for FIGS. 4A and 4B described later)). As illustrated, in the solid-state imaging devices 1 and 1*a*, terminals (corresponding to the pads 151 described above) for leading out the signal lines, the GND wiring lines, and the power supply wiring lines to the outside are provided along the outer periphery of the chips. These respective terminals are paired and provided at positions sandwiching the pixel unit 206 in the horizontal plane. Therefore, inside the solid-state imaging devices 1 and 1*a*, the signal lines, the GND wiring lines, and the power supply wiring lines extend to couple these terminals to each other, and spread in the horizontal plane.

In FIGS. 3A and 3B. "P" is attached to PWELLs, and "N" is attached to NWELLs provided in the first substrate 110A, the second substrate 110B, and the third substrate IC. For example, in the illustrated configuration, the PDs included in the respective pixels of the pixel unit are PDs in which N-type diffused regions are formed in the PWELLs in order to read out electrons generated as a result of photoelectric conversion. A transistor of the drive circuit included in each pixel in order to read out electrons generated in the PD is an N-type MOS transistor. Therefore, the WELLs of the pixel unit are PWELLs. In contrast, a logic circuit and a memory circuit provided in the second substrate 110B and the third substrate 110C include CMOS circuits, and PMOS and NMOS are thus mixed. This causes the area of the PWELLs present and the area of the NWELLs present to be substantially the same, for example. Therefore, in the illustrated configuration example, the rust substrate 110A has a larger PWELL area than the second substrate 110B and the third substrate 110C.

Here, in the solid-state imaging devices 1 and 1*a*, a GND electric potential may be imparted to a PWELL. Any configuration in which a PWELL and a power supply wiring line are opposed to each other with an insulator interposed therebetween causes parasitic capacitance to be formed therebetween.

Figure 4A:
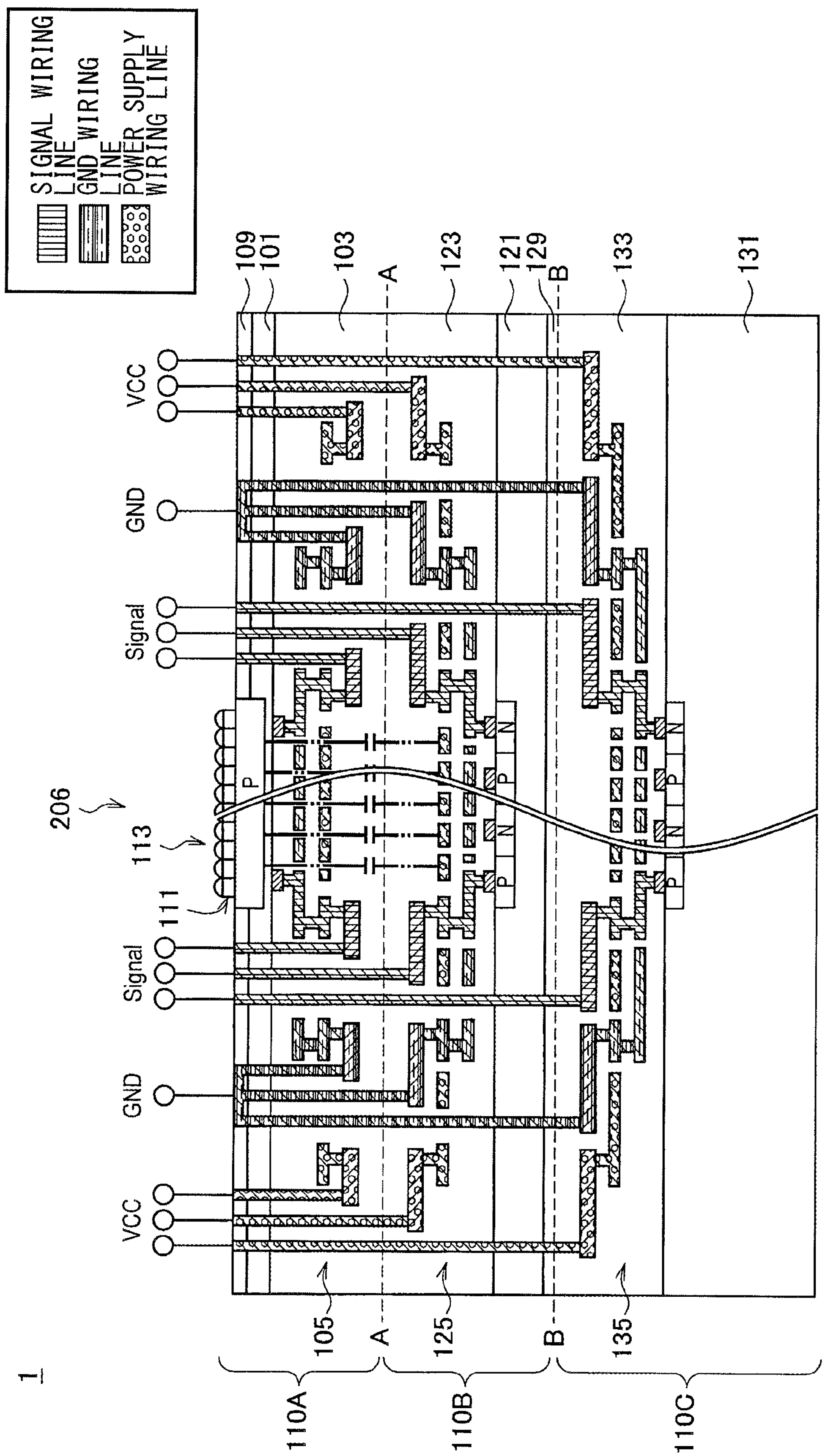
FIG. 4A is an explanatory diagram of a parasitic capacitance between PWELL and a power supply wiring line in the solid-state imaging device illustrated in FIG. 3A.

The parasitic capacitance formed between a PWELL and a power supply wiring line is described with reference to FIGS. 4A and 4B. FIG. 4A is an explanatory diagram of the parasitic capacitance between a PWELL and a power supply wiring line in the solid-state imaging device 1 illustrated in FIG. 3A. FIG. 4A illustrates the parasitic capacitance between the PWELL and the power supply wiring line by a two-dot chain line in a simulated manner. As illustrated in FIG. 4A, in the solid-state imaging device 1, the first substrate 110A and the second substrate 110B are bonded together F-to-F. The PWELLs of the pixel unit of the first substrate 110A and the power supply wiring lines in the multi-layered wiring layer 125 of the second substrate 110B are therefore opposed to each other with insulators, which are included in the insulating films 103 and 123, interposed therebetween, as illustrated. This causes, in that region, parasitic capacitance to be formed therebetween.

Figure 4B:
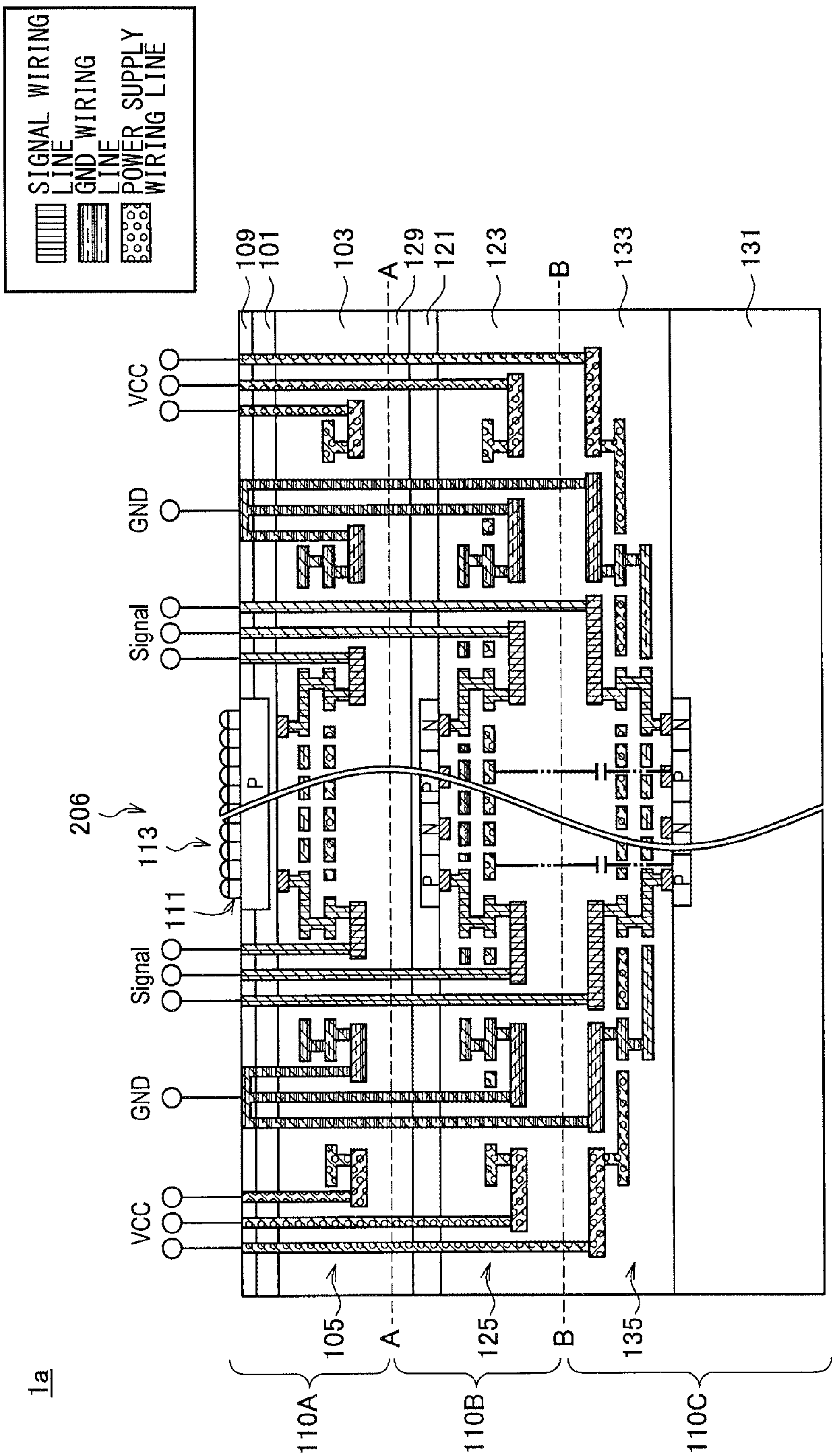
FIG. 4B is an explanatory diagram of a parasitic capacitance between PWELL and a power supply wiring line in the solid-state imaging device illustrated in FIG. 3.

Meanwhile, FIG. 4B is an explanatory diagram of the parasitic capacitance between a PWELL and a power supply wiring line in the solid-state imaging device 1*a* illustrated in FIG. 3B. FIG. 4B illustrates the parasitic capacitance between the PWELL and the power supply wiring line by a two-dot chain line in a simulated manner. As illustrated in FIG. 4B, in the solid-state imaging device 1*a*, the second substrate 110B and the third substrate 110C are bonded together F-to-F. The PWELLs of the logic circuit or the memory circuit of the third substrate 110C and the power supply wiring lines in the multi-layered wiring layer 125 of the second substrate 110B are therefore opposed to each other with insulators, which are included in the insulating films 123 and 133, interposed therebetween, as illustrated. This causes, in that region, parasitic capacitance to be formed therebetween.

It is considered that the parasitic capacitance described above increases as the PWELL area increases. This causes larger parasitic capacitance in the configuration illustrated in FIG. 4A in which the first substrate 110A and the second substrate 110B are bonded together F-to-F than in the configuration illustrated in FIG. 4B in which the first substrate 110A and the second substrate 110B are bonded together F-to-B among the configuration examples illustrated in FIGS. 4A and 4B.

When the parasitic capacitance related to the power supply wiring lines in the second substrate 110B is large, the impedance of the current paths between the power supply and the GND in the second substrate 110B is lowered. It is thus possible to further stabilize the power supply system in the second substrate 110B. Specifically, for example, even in a case where the power consumption fluctuates in accordance with fluctuations in the operation of the circuits on the second substrate 110B, fluctuations in the power supply levels caused by the fluctuations in the power consumption may be suppressed. Even in a case where the circuits related to the second substrate 110B are operated at high speed, it is thus possible to further stabilize the operation, and improve the performance of the entire solid-state imaging device 1.

In this way, when attention is paid to the PWELL area, in the configuration examples illustrated in FIGS. 3A to 4B, the solid-state imaging device 1 in which the first substrate 110A and the second substrate 11B are bonded together F-to-F forms larger parasitic capacitance with respect to the power supply wiring lines of the second substrate 110B than the solid-state imaging device 1*a* in which the first substrate 110A and the second substrate 110B are bonded together F-to-B does, making it possible to achieve higher stability at the time of high-speed operation. That is, it is possible to say that the solid-state imaging device 1 has a more preferable configuration.

Some designs of the respective substrates may, however, cause the third substrate 110C to have a larger PWELL area than that of the first substrate 110A. In this case, it is considered that the configuration of the solid-state imaging device 1*a* in which larger parasitic capacitance is formed between the power supply wiring lines of the second substrate 110B and the PWELLs of the third substrate 110C makes it possible to achieve higher stability at the time of high-speed operation than the solid-state imaging device 1 does.

In summary, when considering the direction of the second substrate 110B on the basis of the PWELL area, it is preferable that the solid-state imaging device 1 be configured in a manner that the front surface side of the second substrate 110B is opposed to the first substrate 110A in a case where the PWELL area of the first substrate 110A is larger than the PWELL area of the third substrate 110C. That is, it is preferable that the solid-state imaging device 1 be configured in a manner that the first substrate 110A and the second substrate 110B are bonded together F-to-F. Conversely, it is preferable that the solid-state imaging device 1*a* be configured in a manner that the front surface side of the second substrate 110B is opposed to the third substrate 110C in a case where the PWELL area of the third substrate 110C is larger than the PWELL area of the first substrate 110A. That is, it is preferable that the solid-state imaging device 1*a* be configured in a manner that the first substrate 110A and the second substrate 110B are bonded together F-to-B.

In the present embodiment, the direction of the second substrate 110B may be determined from such a viewpoint based on PWELL area. The solid-state imaging devices 1 to 21K according to the present embodiment illustrated in FIG. 1 and FIGS. 6A to 25K described later are each configured, for example, to have the PWELL area of the rust substrate 110A larger than the PWELL area of the third substrate 110C, and have the first substrate 110A and the second substrate 110B accordingly bonded together F-to-F. The solid-state imaging devices 1 to 21K thus make it possible to obtain high operation stability even at the time of high-speed operation.

Note that examples of a case where the PWELL area of the first substrate 110A is larger than the PWELL area of the third substrate 110C include a case where only a pixel unit including, in a PWELL, a PD for reading out an electron generated as a result of photoelectric conversion and an NMOS transistor for reading out an electron from the PD is mounted on the first substrate 110A, and various circuits (such as a pixel signal processing circuit, a logic circuit, and a memory circuit) are mounted on the second substrate 110B and the third substrate 110C. Meanwhile, examples of a case where the PWELL area of the third substrate 110C is larger than the PWELL area of the first substrate 110A include a case where a pixel unit and various circuits are mounted together on the first substrate 110A and the area of the first substrate 110A occupied by the various circuits is relatively large.

3-2. Consideration Based on Power Consumption and Disposition of GND Wiring Line Attention has been paid to PWELL area above for the solid-state imaging device 1 illustrated in FIG. 3A and the solid-state imaging device 1*a* illustrated in FIG. 3B. However, attention is now paid to power consumption and the disposition of GND wiring lines in each substrate.

Figure 5A:
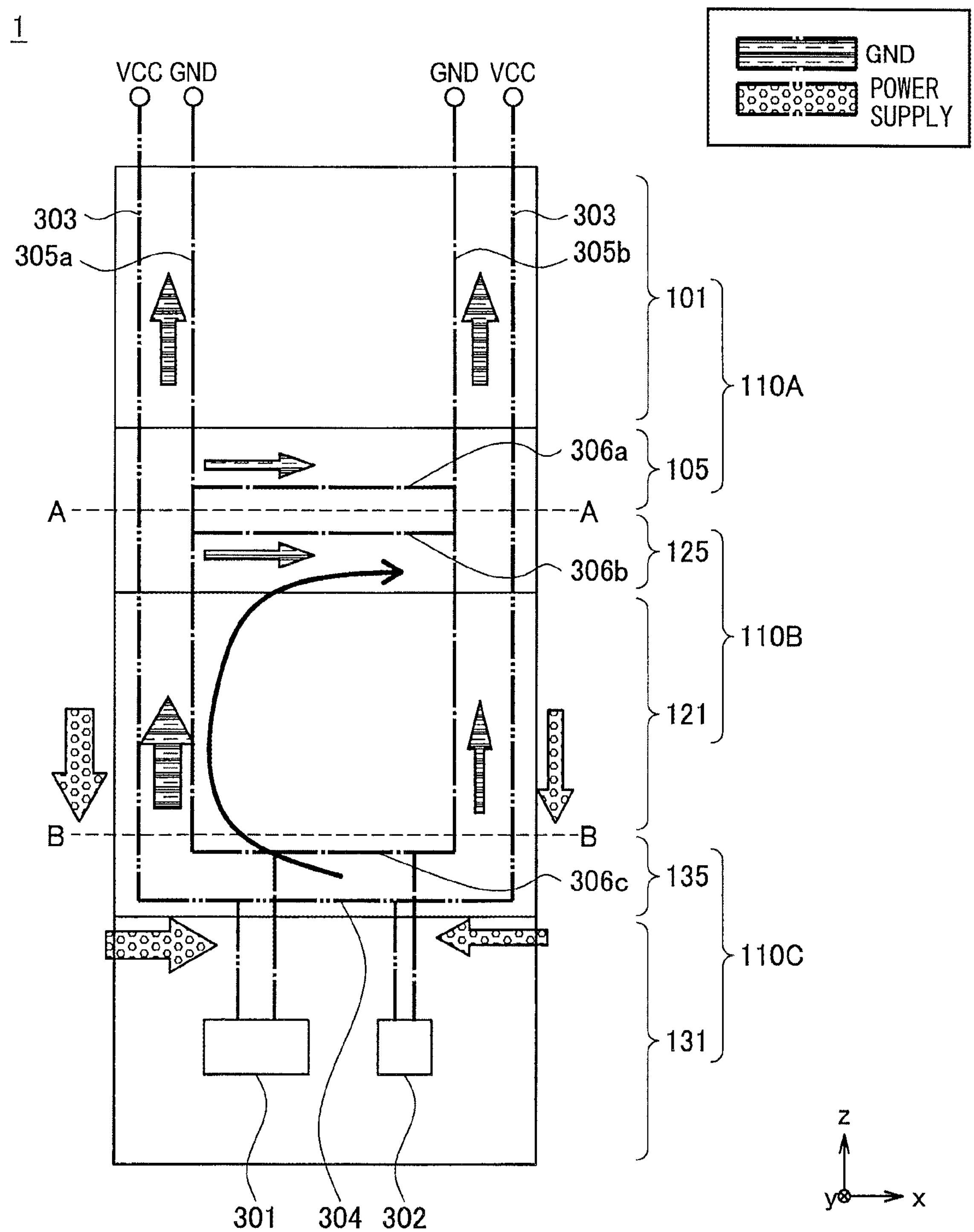
FIG. 5A is a schematic view of disposition of power supply wiring lines and GND wiring lines in the solid-state imaging device illustrated in FIG. 3A.
Figure 5B:
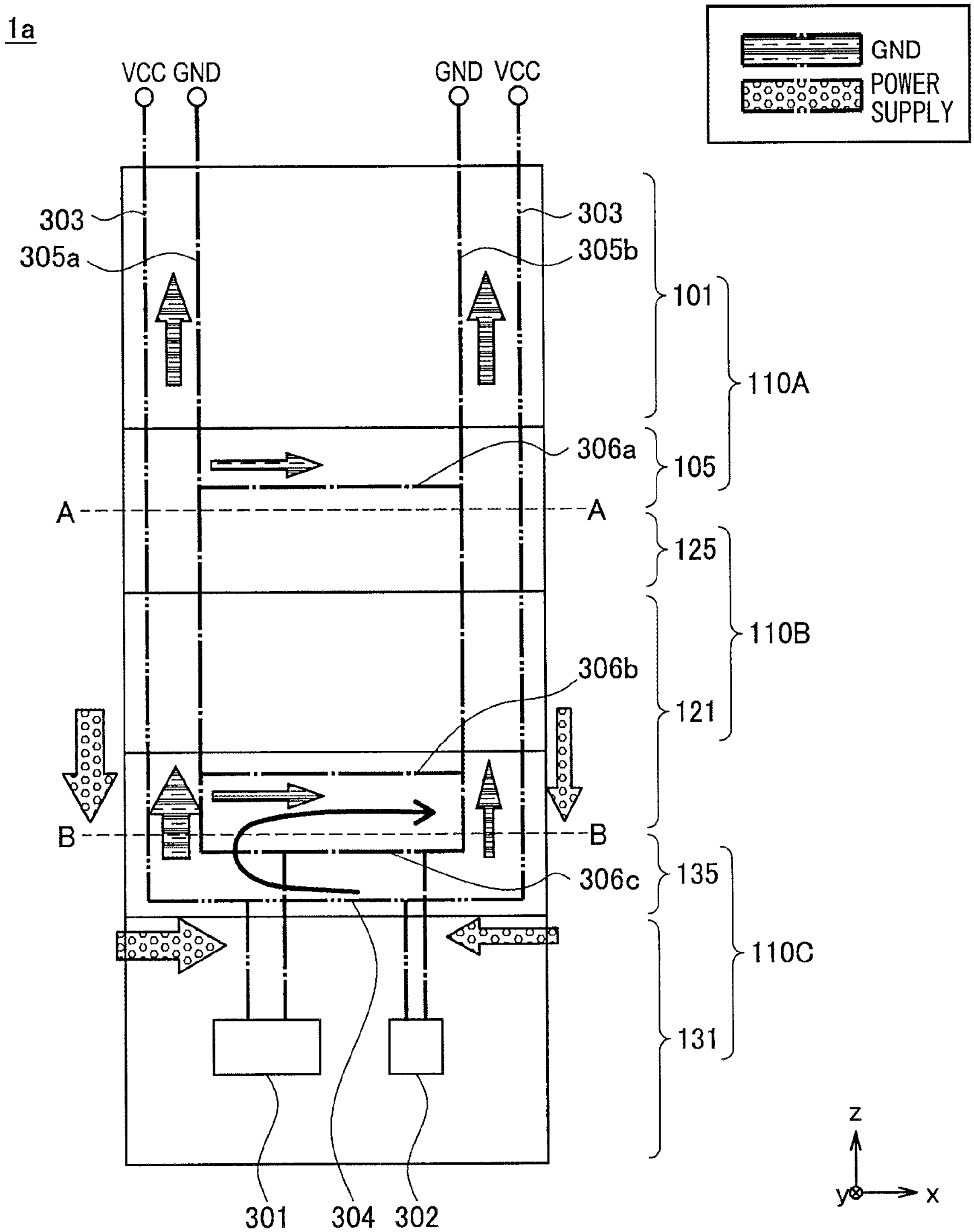
FIG. 5B is a schematic view of disposition of power supply wiring lines and GND wiring lines in the solid-state imaging device illustrated in FIG. 3B.

FIG. 5A is a schematic view of the disposition of power supply wiring lines and GND wiring lines in the solid-state imaging device 1 illustrated in FIG. 3A. FIG. 5 is a schematic view of the disposition of power supply wiring lines and GND wiring lines in the solid-state imaging device 1*a* illustrated in FIG. 3B. FIGS. 5A and 5B simply illustrate the structures of the solid-state imaging devices 1 and 1*a*, and represent the schematic disposition of power supply wiring lines and GND wiring lines by illustrating the power supply wiring lines by two-dot chain lines and illustrating the GND wiring lines by one-dot chain lines. In addition, the size of the arrows in the diagrams represents the amount of currents flowing through the power supply wiring lines and the GND wiring lines in a simulated manner.

It is possible as illustrated in FIGS. 5A and 5B to consider that the power supply wiring lines mainly include vertical power supply wiring lines 303 extending in the x-axis direction from power supply terminals (VCCs) provided on the upper surface of the first substrate 110A (i.e., upper surfaces of the solid-state imaging devices 1 and 1*a*), and horizontal power supply wiring lines 304 extending in the horizontal direction in the multi-layered wiring layer 105 of the first substrate 110A, the multi-layered wiring layer 125 of the second substrate 110B, and the multi-layered wiring layer 135 of the third substrate 110C. The following also refers collectively to the vertical power supply wiring lines 303 and the horizontal power supply wiring lines 304 as power supply wiring lines 303 and 304. Note that the horizontal power supply wiring lines 304 may also exist actually in the multi-layered wiring layer 105 of the first substrate 110A and the multi-layered wiring layer 125 of the second substrate 110B, but are not illustrated in FIGS. 5A and 5B for the sake of simplicity. FIGS. 5A and 5B each illustrate only the horizontal power supply wiring line 304 in the multi-layered wiring layer 135 of the third substrate 110C.

In addition, it is possible to consider that the GND wiring lines mainly include vertical GND wiring lines 305 extending in the z-axis direction from GND terminals provided on the upper surface of the first substrate 110A, and horizontal GND wiring lines 306 extending in the horizontal direction in the multi-layered wiring layer 105 of the first substrate 110A, the multi-layered wiring layer 125 of the second substrate 110B, and the multi-layered wiring layer 135 of the third substrate 110C. The following also refers collectively to the vertical GND wiring lines 305 and the horizontal GND wiring lines 306 as GND wiring lines 305 and 306. Note that the horizontal GND wiring line 306 of the first substrate 110A is also referred to as horizontal GND wiring line 306*a*, the horizontal GND wiring line 306 of the second substrate 110B is also referred to as horizontal GND wiring line 306*b*, and the horizontal GND wiring line 306 of the third substrate 110C is also referred to as horizontal GND wiring line 306*c* to distinguish them.

Here, a case where the power consumption of the third substrate 110C is greater than the power consumption of the first substrate 110A is considered as an example. For example, it is assumed that the third substrate 110C is a logic substrate. The logic circuit is divided into a plurality of circuit blocks, and the circuit blocks that operate may change depending on processing content. That is, during a series of operations in solid-state imaging devices 1 and 1*a*, the locations of the logic circuit that mainly operate may change. Therefore, the locations of the logic circuit through which the power supply currents flow are biased (e.g., the power supply currents are generated due to the charging and discharging of the transistor gate capacitance and the wiring capacitance associated with the operation of the circuit), and moreover the locations may change.

As illustrated in FIGS. 5A and 5B, attention is now paid to two circuit blocks 301 and 302 in the logic circuit of the third substrate 110C. When these two circuit blocks 301 and 302 operate, the current path is formed that passes by the power supply terminal, the power supply wiring lines 303 and 304, the circuit blocks 301 and 302, the GND wiring lines 305 and 306, and the GND terminal.

Here, it is assumed that the power consumption of the circuit block 301 at certain timing is greater than that of the circuit block 302. In this case, as illustrated in FIGS. 5A and 5B, at this timing, more currents are supplied from the power supply wiring lines 303 and 304 to the circuit block 301 than to the circuit block 302. Due to this difference in power consumption, the amount of currents flowing to the vertical GND wiring line 305 through the circuit blocks 301 and 302 also becomes larger in the vertical GND wiring line 305 (which is also referred to as vertical GND wiring line 305*a* to distinguish the vertical GND wiring lines 305) near the circuit block 301 than in the vertical GND wiring line 305 (which is also referred to as a vertical GND wiring line 305*b* to distinguish the vertical GND wiring lines 305) near the circuit block 302.

The first substrate 110A and the second substrate 110B have the horizontal GND wiring lines 306*a* and 306*b*, and the imbalance of the amount of currents between the vertical GND wiring lines 305*a* and 305*b* is thus corrected by the horizontal GND wiring lines 306*a* and 306*b* of the first substrate 110A and the second substrate 110B on the way to the GND terminals on the upper surface of the first substrate 110A. That is, currents flow to the horizontal GND wiring lines 306*a* and 306*b* of the first substrate 110A and the second substrate 110B to correct the imbalance of the amount of currents between the vertical GND wiring lines 305*a* and 305*b*. Accordingly, as indicated by the solid-line arrows in each of FIGS. 5A and 5B, the loop-shaped current path passing by the horizontal power supply wiring line 304, the circuit blocks 301 and 302, the horizontal GND wiring line 306*c*, the vertical GND wiring line 305*a*, and the horizontal GND wiring lines 306*a* and 306*b* is formed in each of the solid-state imaging devices 1 and 1*a*.

At this time, as illustrated in FIG. 5A, in the solid-state imaging device 1 in which the first substrate 110A and the second substrate 110B are bonded together F-to-F, the horizontal GND wiring lines 306*a* and 306*b* of the first substrate 110A and the second substrate 110B are both disposed relatively for from the horizontal power supply wiring line 304 of the third substrate 110C. Therefore, in the loop-shaped current path described above, the opening width of the loop is increased. This increases the inductance of the loop-shaped current path. That is, the impedance becomes high. The stability of the power supply currents may be thus decreased, and the performance of the entire solid-state imaging device 1 may be decreased.

Meanwhile, as illustrated in FIG. 5B, in the solid-state imaging device 1*a* in which the first substrate 110A and the second substrate 110B are bonded together F-to-B, the horizontal GND wiring line 306*a* of the first substrate 110A is disposed relatively far from the horizontal power supply wiring line 304 of the third substrate 110C, but the horizontal GND wiring line 306*b* of the second substrate 110B is disposed relatively close to the horizontal power supply wiring line 304 of the third substrate 110C. Therefore, in the loop-shaped current path described above, the opening width of the loop is decreased. This decreases the inductance of the loop-shaped current path. That is, the impedance becomes low. It is thus possible to further stabilize the power supply currents, and further improve the performance of the entire solid-state imaging device 1.

In this way, when attention is paid to the power consumption and the disposition of GND wiring lines, the solid-state imaging device 1*a* in which the first substrate 110A and the second substrate 110B are bonded together F-to-B is considered to achieve a more stable operation to be performed than the solid-state imaging device 1 in which the first substrate 110A and the second substrate 110B are bonded together F-to-F does in a case where the power consumption of the third substrate 110C is greater than the power consumption of the first substrate 110A. The solid-state imaging device 1*a* allows the horizontal GND wiring line 306*b* of the second substrate 110B to be disposed closer to the horizontal power supply wiring line 304 of the third substrate 110C.

That is, it is possible to say that the solid-state imaging device 1*a* has a more preferable configuration.

Some designs of the respective substrates may, however, cause the first substrate 110A to consume more power than the third substrate 110C does. In this case, a more stable operation is considered expectable from the configuration of the solid-state imaging device 1 that allows the distance to be decreased between the horizontal power supply wiring line of the first substrate 110A and the horizontal ground wiring line 306*b* of the second substrate 110B rather than the solid-state imaging device 1.

In summary, when considering the direction of the second substrate 110B on the basis of the power consumption and the disposition of GND wiring lines, it is preferable that the solid-state imaging device 1 be configured in a manner that the front surface side of the second substrate 110B is opposed to the first substrate 110A in a case where the power consumption of the first substrate 110A is larger than the power consumption of the third substrate 110C. That is, it is preferable that the solid-state imaging device 1 be configured in a manner that the first substrate 110A and the second substrate 110B are bonded together F-to-F. Conversely, it is preferable that the solid-state imaging device 1*a* be configured in a manner that the front surface side of the second substrate 110B is opposed to the third substrate 110C in a case where the power consumption of the third substrate 110C is larger than the power consumption of the first substrate 110A. That is, it is preferable that the solid-state imaging device 1*a* be configured in a manner that the first substrate 110A and the second substrate 110B are bonded together F-to-B.

In the present embodiment, the direction of the second substrate 110B may be determined from such a viewpoint based on the power consumption and the disposition of GND wiring lines. The solid-state imaging devices 1 to 21K according to the present embodiment illustrated in FIG. 1 and FIGS. 6A to 25K described later are each configured, for example, to have the power consumption of the first substrate 110A larger than the power consumption of the third substrate 110C, and have the first substrate 110A and the second substrate 110B to be accordingly bonded together F-to-F. The solid-state imaging devices 1 to 21K may thus achieve a more stable operation.

Note that examples of a case where the power consumption of the third substrate 110C is greater than the power consumption of the first substrate 110A include a case where only a pixel unit is mounted on the first substrate 110A and many circuits (such as a pixel signal processing circuit, a logic circuit, and a memory circuit, for example) are mounted on the second substrate 110B and the third substrate 110C. Specific examples of such a configuration include a configuration in which only a pixel unit is mounted on the first substrate 110A, a pixel signal processing circuit and a memory circuit are mounted on the second substrate 110B, and a logic circuit is mounted on the third substrate 110C. At this time, a digital circuit (such as a digital circuit that, for example, generates a reference voltage for AD conversion) in the pixel signal processing circuit may be mounted on the third substrate 110C. Alternatively, in a case where a memory circuit that is more frequently accessed (e.g., memory circuit into or from which pixel signals are written or read out a plurality of times per frame) is mounted on the third substrate 110C, it is also considered that the third substrate 110C consumes more power.

Meanwhile, examples of a case where the power consumption of the first substrate 110A is greater than the power consumption of the third substrate 110C include a case where a pixel unit and various circuits are mounted together on the first substrate 110A and the area of the first substrate 110A occupied by the various circuits is relatively large. Alternatively, in a case where a memory circuit that is less frequently accessed (e.g., memory circuit into or from which pixel signals are written or read out only once per frame) is mounted on the third substrate 110C, it is also considered that the third substrate 110C consumes less power and the first substrate 110A relatively consumes more power.

Note that, when the power consumption of the first substrate 110A and the power consumption of the third substrate 110C are compared with each other, the power consumption itself may be compared, or other indices that may represent the magnitude of the power consumption may be compared. Examples of the other indices include the number of gates (e.g., 100 gates and 1M gates) mounted on the circuits of each substrate, the operating frequencies (e.g., 100 MHz and 1 GHz) of the circuits of each substrate, and the like.

Figure 5C:
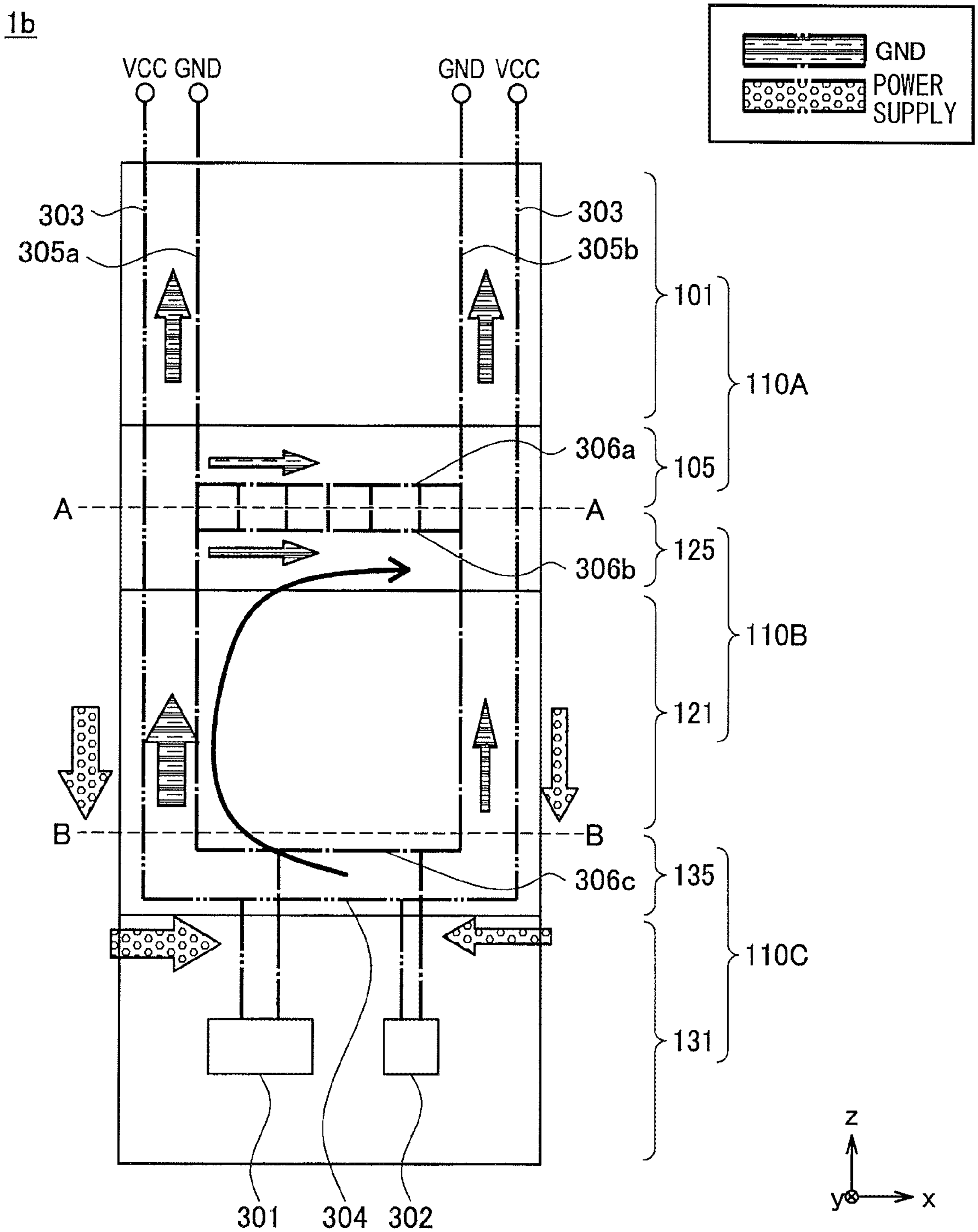
FIG. 5C illustrates a configuration example for reducing impedance in the solid-state imaging device illustrated in FIG. 5A.

Here, as a method for reducing impedance in the loop-shaped current path in the solid-state imaging device 1 illustrated in FIG. 5A in which the first substrate 110A and the second substrate 110B are bonded together F-to-F, as illustrated in FIG. 5C, a method for coupling the horizontal GND wiring line 306*a* of the first substrate 110A and the horizontal GND wiring line 306*b* of the second substrate 110B to each other by using a plurality of wiring lines (i.e., vertical GND wiring lines) extending in the z-axis direction is possible. FIG. 5C illustrates a configuration example for reducing impedance in the solid-state imaging device 1 illustrated in FIG. 5A. Note that a solid-state imaging device 1*b* illustrated in FIG. 5C corresponds to the solid-state imaging device 1 illustrated in FIG. 5A in which the horizontal GND wiring line 306*a* of the first substrate 110A and the horizontal GND wiring line 306*b* of the second substrate 110B are coupled to each other by using a plurality of vertical GND wiring lines, and the other components are similar to those of the solid-state imaging device 1.

Adopting the configuration illustrated in FIG. 5C strengthens the horizontal GND wiring lines 306*a* and 306*b*, and allows the impedance to be reduced in the loop-shaped current path. It is thus considered possible to further improve the performance of the entire solid-state imaging device 1*b*. Note that FIG. 5C illustrates, as an example, a configuration that may allow the impedance of the loop-shaped current path to be reduced in a case where the power consumption of the third substrate 110C is greater than the power consumption of the first substrate 110A, and the first substrate 110A and the second substrate 110B are bonded together F-to-F. Meanwhile, it is sufficient for the horizontal GND wiring line 306*b* of the second substrate 110B and the horizontal GND wiring line 306*c* of the third substrate 110C to be coupled to each other by using a plurality of vertical GND wiring lines in order to reduce the impedance of the loop-shaped current path in a case where the power consumption of the first substrate 110A is greater than the power consumption of the third substrate 110C, and the first substrate 110A and the second substrate 110B are bonded together F-to-B.

However, to achieve the configuration illustrated in FIG. 5C, the multi-layered wiring layer 105 of the first substrate 110A and the multi-layered wiring layer 125 of the second substrate 110B need to be provided with coupling structures for coupling the GND wiring lines thereof to each other. This imposes a constraint that takes into consideration the coupling structures to be provided on the disposition of the GND wiring lines and the disposition of the other wiring lines in the multi-layered wiring layers 105 and 125. Specifically, in the configuration illustrated in FIG. 5C, in the first substrate 110A and the second substrate 110B, the vertical GND wiring lines and the coupling structures for coupling the vertical GND wiring lines between the substrates to each other are distributed not only in the outer peripheral portions of the chips, but also more in the middle portions of the chips in the horizontal plane. The respective wiring lines thus need to be disposed by taking this distribution into consideration. That is, the degree of flexibility in designing the respective wiring lines in the multi-layered wiring layers 105 and 125 is reduced.

In contrast, as described above, in the present embodiment, the impedance of the loop-shaped current path is reduced by adjusting the orientation of the second substrate 110B. This makes it possible, unlike the configuration illustrated in FIG. 5C, to dispose the vertical GND wiring lines to distribute more vertical GND wiring lines in the outer peripheral portions of the chips in the horizontal plane. This makes it possible to reduce the impedance in the current path without reducing the degree of flexibility in designing the wiring lines in the multi-layered wiring layers 105 and 125. That is, it is possible to stabilize the operations of the solid-state imaging devices 1 and 1*a*.

Note that it is possible to determine the density of the vertical GND wiring lines disposed in the outer peripheral portions of the chips and in the middle portions of the chips in the horizontal plane, for example, as follows. For example, in a case where the number of vertical GND wiring lines existing in the one middle region of nine regions obtained by equally dividing a chip as a 3×3 region in the horizontal plane is larger than the number of vertical GND wiring lines existing in the eight peripheral regions, it is possible to determine that the number of vertical GND wiring lines in the middle portion of the chip is large (i.e., it is possible to determine that the configuration of the solid-state imaging device 1*b* illustrated in FIG. 5C may be possibly applied). In contrast, in a case where the number of vertical GND wiring lines existing in the one middle region is smaller than the number of vertical GND wiring lines existing in the eight peripheral regions, it is possible to determine that the number of vertical GND wiring lines in the outer peripheral portion of the chip is large (i.e., it is possible to determine that the configurations of the solid-state imaging devices 1 and 1*a* illustrated in FIG. 5A and FIG. 5B may be possibly applied).

Here, as an example, a case where a chip is equally divided into nine regions in the horizontal plane has been described, but the number of regions obtained by dividing a chip is not limited to the example. The number of regions obtained by dividing a chip may be changed as appropriate into 16 regions of a 4×4 region, 25 regions of a 5×5 region, or the like. It is sufficient for, for example, in a case where a chip is divided into 16 regions as a 4×4 region, the density to be determined from the number of vertical GND wiring lines in four middle regions and 12 peripheral regions. Alternatively, it is sufficient for, in a case where a chip is divided into 25 regions as a 5×5 region, the density to be determined from the number of vertical GND wiring lines in one middle region and 24 peripheral regions, or in nine middle regions and 16 peripheral regions.

4. Variations of Configuration of Solid-State Imaging Device

The configuration of the solid-state imaging device 1 illustrated in FIG. 1 is an example of a solid-state imaging device according to the present embodiment. The solid-state imaging device according to the present embodiment may include a coupling structure different from a coupling structure illustrated in FIG. 1. The following describes another configuration example of the solid-state imaging device according to the present embodiment in which a different coupling structure is included. Note that the components of the respective solid-state imaging devices described below correspond to the components of the solid-state imaging device 1 illustrated in FIG. 1 in which a portion of the components is changed. The components that have already been described with reference to FIG. 1 are not thus described in detail. In addition, each of the diagrams illustrating a schematic configuration of each solid-state imaging device described below omits a portion of the reference numerals attached in FIG. 1 in order to avoid complicating the diagram. In addition, FIG. 1 and each of the subsequent diagrams indicate that members having the same type of hatching include the same material.

In any configuration of the solid-state imaging device according to the present embodiment, at least a twin contact type TSV 157 is provided as in the solid-state imaging device 1 illustrated in FIG. 1. Here, the twin contact refers to a via having a structure in which electrically-conductive materials are embedded in a first through hole exposing a predetermined wiring line and a second through hole different from the first through hole exposing another wiring line different from the predetermined wiring line, or a structure in which films including electrically-conductive materials are formed on an inner wall of the first and second through holes.

Meanwhile, in the solid-state imaging device, all of the respective signal lines as well as all of the respective power supply lines provided in the first substrate 110A, the second substrate 110B, and the third substrate 110C need to be electrically coupled together. Accordingly, the solid-state imaging device may further include, in addition to the TSV 157, another coupling structure for electrically coupling signal lines to each other and power supply lines to each other, between the substrates provided with the respective signal lines and the respective power supply lines that are not each electrically coupled to each other by the TSV 157.

In the present embodiment, the solid-state imaging devices are classified into 20 categories according to specific configurations of these coupling structures.

The first configuration example (FIGS. 6A to 6E) is a configuration example in which a twin contact type TSV 157 between two layers is provided as a coupling structure for electrically coupling respective signal lines provided in the first substrate 110A and the second substrate 110B to each other and respective power supply lines provided in the first substrate 110A and the second substrate 110B to each other, but in which, except for the TSV 157, the twin contact type TSV 157 or shared contact type TSV 157 described later and an electrode junction structure 139 described later do not exist. As used herein, the TSV between two layers means a TSV that is so provided as to electrically couple respective signal lines as well as respective power supply lines to each other, that are provided in two adjacent substrates among the first substrate 110A, the second substrate 110B, and the third substrate 110C.

As described above, the TSV 157 and the electrode junction structure 159 are not provided except for the TSV 157 that electrically couples the respective signal lines provided in the first substrate 110A and the second substrate 110B to each other and the respective power supply lines provided in the first substrate 110A and the second substrate 110B to each other, and thus, in the solid-state imaging device according to the first configuration example, the electrical coupling between the respective signal lines provided in the first substrate 110A and the third substrate 110C and between the respective power supply lines provided in the first substrate 110A and the third substrate 110C and/or the electrical coupling between the respective signal lines provided in the second substrate 110B and the third substrate 110C and between the respective power supply lines provided in the second substrate 110B and the third substrate 110C are achieved through the I/O unit. That is, in the solid-state imaging device according to the first configuration example, together with the TSV 157 that electrically couples the respective signal lines provided in the first substrate 110A and the second substrate 110B to each other and the respective power supply lines provided in the first substrate 110A and the second substrate 110B to each other, a pad 151 that may electrically couple the respective signal lines provided in the first substrate 110A and the third substrate 110C to each other and the respective power supply lines provided in the first substrate 110A and the third substrate 110C to each other, and/or the pad 151 that may electrically couple the respective signal lines provided in the second substrate 11B and the third substrate 110C to each other and the respective power supply lines provided in the second substrate 110B and the third substrate 110C to each other are provided, as other coupling structures. Note that the solid-state imaging device 1 illustrated in FIG. 1 is also included in the first configuration example.

A second configuration example (FIG. 7A to FIG. 7K) is a configuration example in which at least the twin contact type TSV 157 between two layers is further provided as a coupling structure for electrically coupling the respective signal lines provided in the second substrate 110B and the third substrate 110C to each other and the respective power supply lines provided in the second substrate 110B and the third substrate 110C to each other, together with the twin contact type TSV 157 between two layers that electrically couples the respective signal lines provided in the first substrate 110A and the second substrate 110B to each other and the respective power supply lines provided in the first substrate 110A and the second substrate 110B to each other.

A third configuration example (FIGS. 8A to 8G) is a configuration example in which at least a twin contact type TSV 157 between three layers described later is provided as a coupling structure, together with the twin contact type TSV 157 between two layers that electrically couples the respective signal lines provided in the first substrate 110A and the second substrate 110B to each other and the respective power supply lines provided in the first substrate 110A and the second substrate 110B to each other. As used herein, the TSV between three layers means the TSV 157 extending across all of the first substrate 110A, the second substrate 110B, and the third substrate 11C. The twin contact type TSV 157 between three layers formed from the back surface side of the first substrate 110A toward the third substrate 110C may, by means of its structure, electrically couple the respective signal lines provided in the first substrate 110A and the third substrate 110C to each other and the respective power supply lines provided in the first substrate 110A and the third substrate 110C to each other, or the respective signal lines provided in the second substrate 110B and the third substrate 110C to each other and the respective power supply lines provided in the second substrate 110B and the third substrate 110C to each other. In addition, the twin contact type TSV 157 between three layers formed from the back surface side of the third substrate 110C toward the rust substrate 110A may, by means of its structure, electrically couple the respective signal lines provided in the first substrate 110A and the second substrate 110B to each other and the respective power supply lines provided in the first substrate 110A and the second substrate 110B to each other, or the respective signal lines provided in the first substrate 110A and the third substrate 110C to each other and the respective power supply lines provided in the first substrate 110A and the third substrate 110C to each other.

A fourth configuration example (FIGS. 9A to 9K) is a configuration example in which at least a shared contact type TSV 157 between two layers described later is provided as a coupling structure for electrically coupling the respective signal lines provided in the second substrate 110B and the third substrate 110C to each other and the respective power supply lines provided in the second substrate 110B and the third substrate 110C to each other, together with the twin contact type TSV 157 between two layers for electrically coupling the respective signal lines provided in the first substrate 110A and the second substrate 110B to each other and the respective power supply lines provided in the first substrate 110A and the second substrate 110B to each other. Here, the shared contact refers to a via having a structure in which an electrically-conductive material is embedded in one through hole provided to expose a predetermined wiring line in another substrate while exposing a portion of the predetermined wiring line in one substrate, or a structure in which a film including an electrically-conductive material is formed on an inner wall of the through hole.

For example, in a case of forming, from the rear surface side of the first substrate 110A, the shared contact type TSV 157 for electrically coupling the respective signal lines provided in the first substrate 110A and the second substrate 110B to each other and the respective power supply lines provided in the first substrate 110A and the second substrate 110B to each other, a through hole having a larger diameter than the space between the two wiring lines of the same electric potential is first formed, from the rear surface side of the first substrate 110A, by means of dry etching from immediately above the two wiring lines of the same electric potential, with respect to the two wiring lines of the same electric potential arranged at a predetermined interval in the multi-layered wiring layer 105 of the first substrate 110A, and with respect to the wiring line located directly under the space between the two wiring lines of the same electric potential in the multi-layered wiring layer 105 of the first substrate 110A inside the multi-layered wiring layer 125 of the second substrate 110B. At this time, the through hole having a large diameter is so formed as not to expose the two wiring lines of the same electric potential. Next, by photolithography and dry etching, a through hole having a diameter smaller than the space between the two wiring lines of the same electric potential is so formed as to expose the wiring line in the multi-layered wiring layer 125 of the second substrate 110B located immediately below the space between the two wiring lines of the same electric potential. Next, a through hole having a large diameter is grown by etching back, thereby exposing a portion of the two wiring lines of the same electric potential in the multi-layered wiring layer 105 of the first substrate 110A. As a result of the above process, the through hole has a shape that exposes a portion of the two wiring lines of the same electric potential in the multi-layered wiring layer 105 of the first substrate 110A, and exposes the wiring line in the multi-layered wiring layer 125 of the second substrate 110B located immediately below the space between the two wiring lines. The shared contact type TSV 157 may be formed by embedding an electrically-conductive material in the through hole or by forming a film of an electrically-conductive material on the inner wall of the through hole. According to this method, dry etching is not performed on the two wiring lines of the same electric potential upon the formation of the through hole having the large diameter and the through hole having the small diameter, thus making it possible to suppress a situation in which the corners of the two wiring lines of the same electric potential are shaved and occurrence of contamination. Hence, it is possible to achieve the solid-state imaging device 1 with higher reliability.

Note that, in the above examples, the case has been described where the shared contact type TSV 157 for electrically coupling the respective signal lines as well as the respective power supply lines provided in the first substrate 110A and the second substrate 110B to each other is formed from the back surface side of the first substrate 110A. However, the same holds true also for a case where the shared contact type TSV 157 for electrically coupling the respective signal lines as well as the respective power supply lines provided in the second substrate 110B and the third substrate 110C to each other is formed from the front surface side of the second substrate 110B or from the back surface side of the third substrate 110C. In addition, the same holds true also for a case where the shared contact type TSV 157 between three layers described later is formed from the back surface side of the first substrate 110A or from the back surface side of the third substrate 110C. Further, in the above example, the through hole is so provided as to pass through the space between two wiring lines arranged side by side with a predetermined interval, but, for example, a ring-shaped wiring line having an opening may be formed, and a through hole may be so provided as to pass through the opening of the wiring line.

Alternatively, the shared contact type TSV 157 may be formed by a method different from the above method. For example, in the same manner as described above, in a case where the shared contact type TSV 157 for electrically coupling the respective signal lines as well as the respective power supply lines provided in the first substrate 110A and the second substrate 110B to each other is formed from the back surface side of the first substrate 110A, when forming a through hole having a diameter larger than the space between the two wiring lines of the same electric potential in the multi-layered wiring layer 105 of the first substrate 110A from immediately above the two wiring lines of the same electric potential by dry etching, the dry etching may be continued while exposing a portion of the two wiring lines of the same electric potential, instead of stopping the dry etching in the middle, so as not to expose the two wiring lines of the same electric potential. In this case, the etching of the two wiring lines of the same electric potential hardly proceeds for the through hole due to a selective ratio of the etching of an electrically-conductive material (e.g., Cu) included in the two wiring lines of the same electric potential and an insulating material (e.g., $SiO_2$) included in the insulating film 103; etching of the insulating film 103 may proceed in the space between the two wiring lines of the same electric potential. Accordingly, as a result, the through hole has a shape that exposes a portion of the two wiring lines in the multi-layered wiring layer 105 of the first substrate 110A and exposes the wiring line in the multi-layered wiring layer 125 of the second substrate 110B located immediately below the space between the two wiring lines. The shared contact type TSV 157 may be formed by embedding an electrically-conductive material in the through hole formed in this manner or by forming a film of an electrically-conductive material on the inner wall of the through hole.

The shared contact type TSV 157 is not necessarily so provided as to pass through the space between the two wiring lines of the same electric potential or the opening of the ring-shaped wiring line. For example, upon the formation of the through hole, the wiring line located in the upper layer (in the above example, the wiring line in the multi-layered wiring layer 105 of the first substrate 110A) may be a single wiring line. Specifically, for example, in the same manner as described above, in a case of forming, from the back surface side of the first substrate 110A, the shared contact type TSV 157 for electrically coupling the respective signal lines provided in the first substrate 110A and the second substrate 110B to each other and the respective power supply lines provided in the first substrate 110A and the second substrate 110B to each other, the through hole may be formed to expose a portion of a single wiring line in the multi-layered wiring layer 105 of the first substrate 110A and to expose the wiring line in the multi-layered wiring layer 125 of the second substrate 110. The shared contact type TSV 157 may be formed by embedding an electrically-conductive material in the through hole or by forming a film of an electrically-conductive material on the inner wall of the through hole. However, in this embodiment, the single wiring line in the upper layer causes a through hole to be so formed as not to expose the wiring line in the upper layer due to, for example, misalignment or the like, as compared with a case where the number of the above-mentioned wiring line in the upper layer is two or with a case where the above-mentioned wiring line in the upper layer has a ring shape having an opening, thus leading to a concern that a contact failure may be likely to occur. Accordingly, it is preferable that the mode of the single wiring line be applied to a case where a sufficient margin is provided for an overlap between the through hole and the single wiring line in a manner that the contact property between the TSV 157 and the single wiring line may be ensured.

A fifth configuration example (FIGS. 10A to 10G) is a configuration example in which at least the shared contact type TSV 157 between three layers described later is provided as a coupling structure, together with the twin contact type TSV 157 between two layers for electrically coupling the respective signal lines provided in the first substrate 110A and the second substrate 110B to each other and the respective power supply lines provided in the first substrate 110A and the second substrate 110B to each other. The shared contact type TSV 157 between three layers may, by means of its structure, electrically couple the respective signal lines provided in at least two of the first substrate 110A, the second substrate 110B, or the third substrate 110C to each other and the respective power supply lines included in at least two of the first substrate 110A, the second substrate 110B, or the third substrate 110C to each other.

Note that, in the descriptions of the second to fifth configuration examples, as well as the seventh to tenth configuration examples, the twelfth to fifteenth configuration examples, and the seventeenth to twentieth configuration examples, which are described later, there is a case where a plurality of twin contact type or shared contact type TSVs 157 may exist in the diagrams. In such cases, for the sake of convenience, the TSVs 157 are distinguished from one another by assigning different alphabets to the ends of the respective reference numerals, as in TSV 157*a*, TSV 157*b* . . . and so on.

A sixth configuration example (FIGS. 11A to 11F) is a configuration example in which at least the electrode junction structure 159 described later is provided between the second substrate 110B and the third substrate 110C as a coupling structure for electrically coupling the respective signal lines provided in the second substrate 110B and the third substrate 110C to each other and the respective power supply lines provided in the second substrate 110B and the third substrate 110C to each other, together with the twin contact type TSV 157 between two layers for electrically coupling the respective signal lines provided in the first substrate 110A and the second substrate 110B to each other and the respective power supply lines provided in the first substrate 110A and the second substrate 110B to each other. As used herein, the electrode junction structure 159 means a structure in which electrodes formed on respective bonding surfaces of the two substrates are joined to each other in such a state that they are in direct contact with each other.

A seventh configuration example (FIGS. 12A to 12L) is a configuration example in which, there are at least provided, as coupling structures, the electrode junction structure 159 between the second substrate 110B and the third substrate 110C described later and further the twin contact type TSV 157 between two layers for electrically coupling the respective signal lines provided in the second substrate 110B and the third substrate 110C to each other and the respective power supply lines provided in the second substrate 110B and the third substrate 110C to each other, together with the twin contact type TSV 157 between two layers for electrically coupling the respective signal lines provided in the first substrate 110A and the second substrate 110B to each other and the respective power supply lines provided in the first substrate 110A and the second substrate 110B to each other.

An eighth configuration example (FIGS. 13A to 13H) is a configuration example in which the electrode junction structure 159 between the second substrate 110B and the third substrate 110C described later and the twin contact type TSV 157 between three layers described later are at least provided as coupling structures, together with the twin contact type TSV 157 between two layers for electrically coupling the respective signal lines provided in the first substrate 110A and the second substrate 110B to each other and the respective power supply lines provided in the first substrate 110A and the second substrate 110B to each other.

A ninth configuration example (FIGS. 14A to 14K) is a configuration example in which there are at least provided, as coupling structures, the electrode junction structure 159 between the second substrate 110B and the third substrate 110C described later and the shared contact type TSV 157 between two layers described later for electrically coupling the respective signal lines provided in the second substrate 110B and the third substrate 110C to each other and the respective power supply lines provided in the second substrate 110B and the third substrate 110C to each other, together with the twin contact type TSV 157 between two layers for electrically coupling the respective signal lines provided in the first substrate 110A and the second substrate 110B to each other and the respective power supply lines provided in the first substrate 110A and the second substrate 110B to each other.

A tenth configuration example (FIGS. 15A to 15G) is a configuration example in which the electrode junction structure 159 between the second substrate 110B and the third substrate 110C described later and the shared contact type TSV 157 between three layers described later are at least provided as coupling structures, together with the twin contact type TSV 157 between two layers for electrically coupling the respective signal lines provided in the first substrate 110A and the second substrate 110B to each other and the respective power supply lines provided in the first substrate 110A and the second substrate 110B to each other.

An eleventh configuration example (FIGS. 16A to 16G) is a configuration example in which the twin contact type TSV 157 between three layers is provided as a coupling structure, but there is neither the twin contact type or shared contact type TSV 157 nor the electrode junction structure 159 described later except for the TSV 157. In the solid-state imaging device according to the eleventh configuration, the respective signal lines as well as the respective power supply lines are electrically coupled to each other through the I/O unit in the substrates provided with the respective signal lines as well as the respective power supply lines that are not electrically coupled to each other by the TSV 157. That is, in the solid-state imaging device according to the eleventh configuration, the pad 151 is provided, as another coupling structure, for each of the substrates including the signal lines as well as the power supply lines, which are not electrically coupled to each other by the TSV 157, together with the TSV 157.

A twelfth configuration example (FIGS. 17A to 17J) is a configuration example in which at least the twin contact type TSV 157 between two layers is provided as a coupling structure for electrically coupling the respective signal lines provided in the second substrate 110B and the third substrate 110C to each other and the respective power supply lines provided in the second substrate 110B and the third substrate 110C to each other, together with the twin contact type TSV 157 between three layers.

A thirteenth configuration example (FIGS. 18A to 18G) is a configuration example in which at least the twin contact type TSV 157 between three layers is provided as a coupling structure, together with the twin contact type TSV 157 between three layers.

A fourteenth configuration example (FIGS. 19A to 19K) is a configuration example in which at least the shared contact type TSV 157 between two layers described later is provided as a coupling structure for electrically coupling the respective signal lines provided in the second substrate 110B and the third substrate 110C to each other and the respective power supply lines provided in the second substrate 110B and the third substrate 110C to each other together with the twin contact type TSV 157 between three layers.

A fifteenth configuration example in FIGS. 20A to 20G) is a configuration example in which at least the shared contact type TSV 157 between three layers described later is provided as a coupling structure, together with the twin contact type TSV 157 between three layers.

A sixteenth configuration example (FIGS. 21A to 21M) is a configuration example in which at least the electrode junction structure 159 described later is provided between the second substrate 110B and the third substrate 110C as a coupling structure for electrically coupling the respective signal lines provided in the second substrate 110B and the third substrate 110C to each other and the respective power supply lines provided in the second substrate 110B and the third substrate 110C to each other, together with the twin contact type TSV 157 between three layers.

A seventeenth configuration example (FIGS. 22A to 22M) is a configuration example in which there are at least provided, as a coupling structure, the electrode junction structure 159 between the second substrate 110B and the third substrate 110C described later and the twin contact type TSV 157 between two layers for electrically coupling the respective signal lines provided in the second substrate

110B and the third substrate 110C to each other and the respective power supply lines provided in the second substrate 110B and the third substrate 110C to each other, together with the twin contact type TSV 157 between three layers.

An eighteenth configuration example (FIGS. 23A to 23K) is a configuration example in which at least the electrode junction structure 159 between the second substrate 110B and the third substrate 110C described later and further the twin contact type TSV 157 between three layers are provided as coupling structures, together with the twin contact type TSV 157 between three layers.

A nineteenth configuration example (FIGS. 24A to 24M) is a configuration example in which there are at least provided, as coupling structures, the electrode junction structure 159 between the second substrate 110B and the third substrate 110C described later and the shared contact type TSV 157 between two layers for electrically coupling the respective signal lines provided in the second substrate 110B and the third substrate 110C to each other and the respective power supply lines provided in the second substrate 110B and the third substrate 110C to each other described later, together with the twin contact type TSV 157 between three layers.

A twentieth configuration example (FIGS. 25A to 25K) is a configuration example in which at least the electrode junction structure 159 between the second substrate 110B and the third substrate 110C described later and the shared contact type TSV 157 between three layers described later are provided as coupling structures, together with the twin contact type TSV 157 between three layers.

Hereinafter, the first to twentieth configuration examples are described in order. Note that each of the following diagrams illustrates an example of a coupling structure at least included in the solid-state imaging device according to the present embodiment. The configuration illustrated in each of the following diagrams does not mean that the solid-state imaging device according to the present embodiment includes only the illustrated coupling structure, but the solid-state imaging device may have a coupling structure other than the illustrated coupling structure as appropriate. In the following description of each diagram, the first metal wiring layer is, for example, a Cu wiring layer, and the second metal wiring layer is, for example, an Al wiring layer.

4-1. First Configuration Example

FIGS. 6A to 6E are each a vertical cross-sectional view illustrating a schematic configuration of a solid-state imaging device according to a first configuration example of the present embodiment. The solid-state imaging device according to the present embodiment may have each of the configurations illustrated in FIGS. 6A to 6E.

Figure 6A:
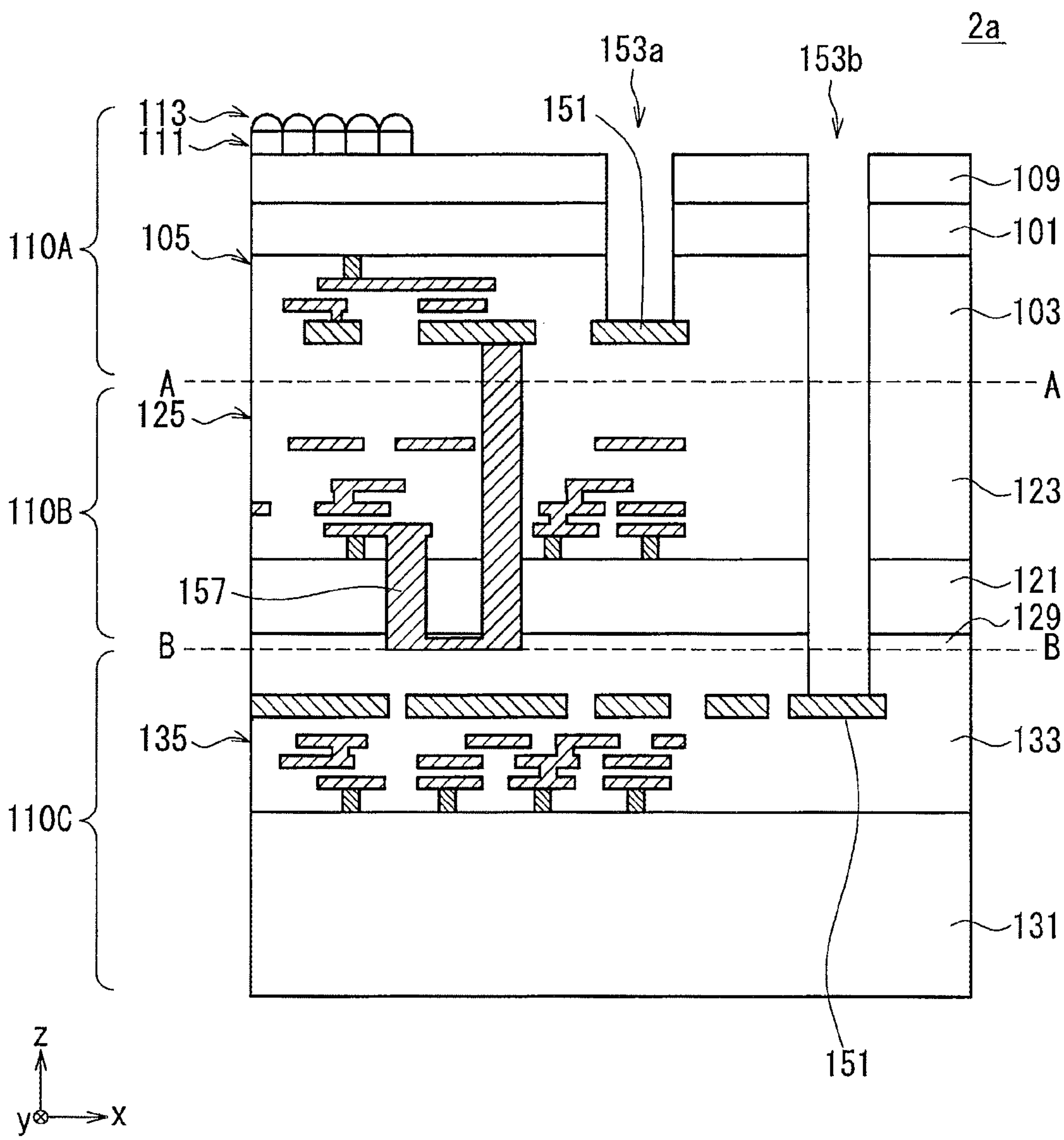
FIG. 6A is a vertical cross-sectional view of a schematic configuration of a solid-state imaging device according to a first configuration example of the present embodiment.

A solid-state imaging device 2*a* illustrated in FIG. 6A includes, as coupling structures, the twin contact type TSV 157 between two layers, the pad 151 provided in the multi-layered wiring layer 105 of the first substrate 110A, the pad opening 153*a* exposing the pad 151, the pad 151 provided in the multi-layered wiring layer 135 of the third substrate 110C, and the pad opening 153*b* exposing the pad 151. The TSV 157 is formed from the back surface side of the second substrate 110B toward the first substrate 110A, and is so provided as to electrically couple the respective signal lines provided in the first substrate 110A and the second substrate 110B to each other and the respective power supply lines provided in the first substrate 110A and the second substrate 110B to each other. In the configuration illustrated in FIG. 6A, a predetermined wiring line of the second metal wiring layer in the multi-layered wiring layer 105 of the first substrate 110A and a predetermined wiring line of the first metal wiring layer in the multi-layered wiring layer 125 of the second substrate 110B are electrically coupled to each other by the TSV 157. The respective signal lines provided in the first substrate 110A and the third substrate 110C and the respective power supply lines provided in the first substrate 110A and the third substrate 110C may be electrically coupled to each other by the pad 151 and the pad openings 153*a* and 153*b*.

Figure 6B:
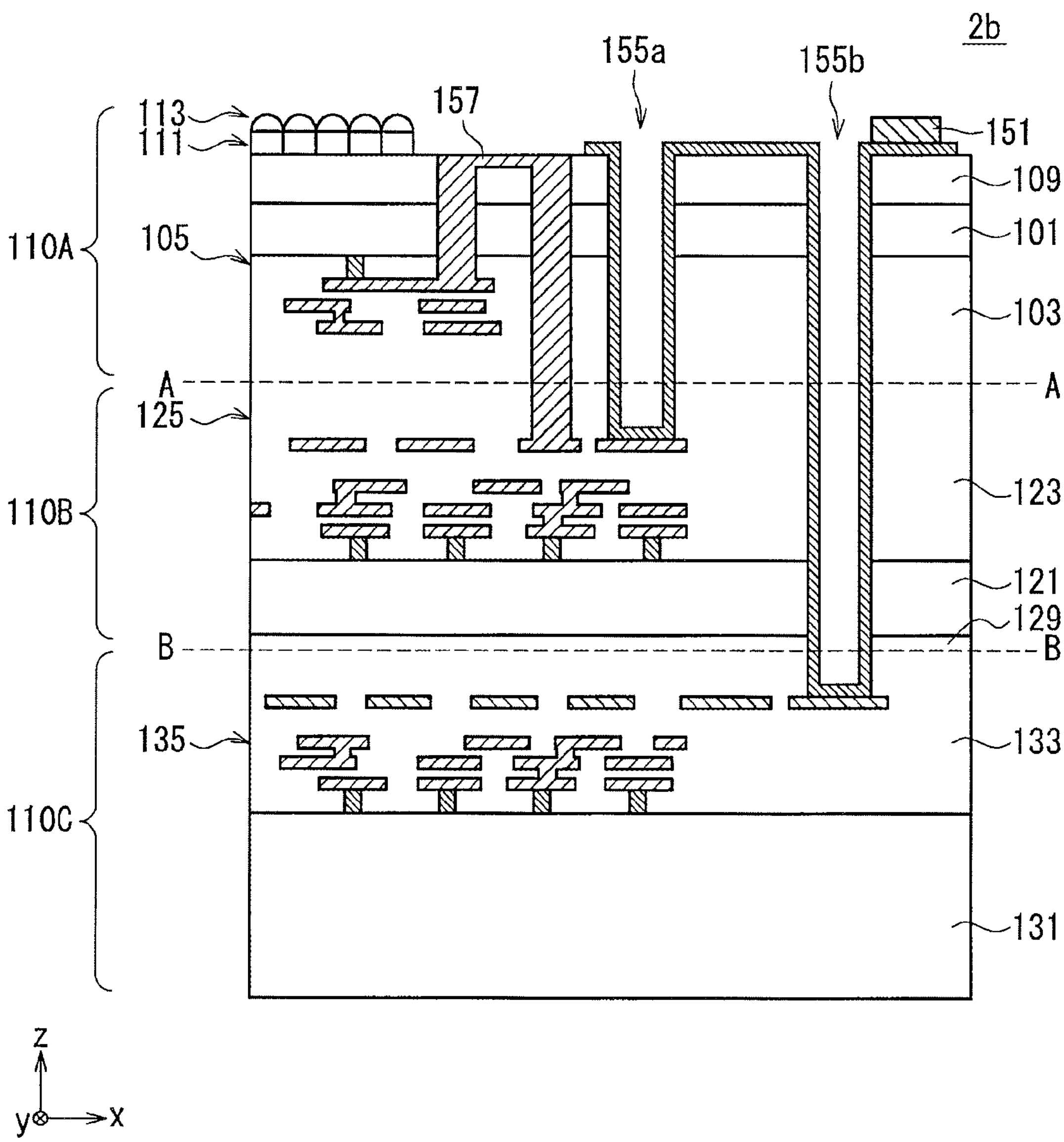
FIG. 6B is a vertical cross-sectional view of a schematic configuration of the solid-state imaging device according to the first configuration example of the present embodiment.

The solid-state imaging device 2*b* illustrated in FIG. 6B includes, as coupling structures, the twin contact type TSV 157 between two layers, a lead line opening 155*a* for leading out the predetermined wiring line in the multi-layered wiring layer 125 of the second substrate 110B, a lead line opening 155*b* for leading out a predetermined wiring line in the multi-layered wiring layer 135 of the third substrate 110C, and the pad 151 disposed on a surface of the back surface side of the first substrate 110A and is electrically coupled to the predetermined wiring lines by the electrically-conductive materials included in the lead line openings 155*a* and 155*b*. The TSV 157 is formed from the back surface side of the first substrate 110A toward the second substrate 110B, and is so provided as to electrically couple the respective signal lines provided in the first substrate 110A and the second substrate 110B to each other and the respective power supply lines provided in the first substrate 110A and the second substrate 110B to each other. In the configuration illustrated in FIG. 6B, the predetermined wiring line of the first metal wiring layer in the multi-layered wiring layer 105 of the first substrate 110A and the predetermined wiring line of the first metal wiring layer in the multi-layered wiring layer 125 of the second substrate 110B are electrically coupled to each other by the TSV 157.

Here, the lead line openings 155*a* and 155*b* are openings for leading out the predetermined wiring lines in the substrates 110A, 110B and 110C (in the illustrated example, the predetermined wiring lines in the second substrate 110B and the third substrate 110C) to the outside. Each of the lead line openings 155*a* and 155*b* has a structure in which an electrically-conductive material (e.g., W) is formed on an inner wall of an opening so formed as to expose a wiring line to be led. The film including the electrically-conductive material is extended from the inside of the lead line openings 155*a* and 155*b* to the surface on the back surface side of the first substrate 110A, as illustrated in the diagram. The pad 151 is formed on the extended film including the electrically-conductive material, and is electrically coupled to the wiring line in the substrate led out by the lead line openings 155*a* and 155*b* by the film including the electrically-conductive material. In the configuration illustrated in FIG. 6B, the lead line opening 155*a* is configured to lead out the predetermined wiring line of the first metal wiring layer in the multi-layered wiring layer 125 of the second substrate 110B, and the lead line opening 155*b* is configured to lead out the predetermined wiring line of the first metal wiring layer in the multi-layered wiring layer 135 of the third substrate 110C. Note that the electrically-conductive material formed on the inner wall of the opening in each of the lead line openings 155*a* and 155*b* is not limited to W: various known electrically-conductive materials may be used as the electrically-conductive material.

In the present specification, as illustrated in FIG. 6B, a structure in which the pad 151 disposed on the back surface side of the first substrate 110A is electrically coupled to the wiring lines led out by the lead line openings 155*a* and 155*b* is also referred to as a lead-out pad structure. In the present specification, a structure in which the pad openings 153*a* and 153*b* are provided for pads 151 formed in the substrate, for example, as illustrated in FIG. 6A, corresponding to the lead-out pad structure, is also referred to as an embedded pad structure (the structure illustrated in FIG. 1 is also the embedded pad structure). The lead-out pad structure may be said to be a structure in which the pad 151 formed in the substrate in the embedded pad structure is led out to the outside of the substrate (on the surface on the back surface side of the first substrate 110A).

In addition, in the configuration illustrated in FIG. 6B, the wiring lines led out by the two lead line openings 155*a* and 155*b* are electrically coupled to the same pad 151 via a film including an electrically-conductive material. That is, one pad 151 is shared by the two lead line openings 155*a* and 155*b*. However, the present embodiment is not limited to such an example. As illustrated in FIG. 6B, in a case where a plurality of lead line openings 155*a* and 155*b* exist, the pad 151 may be provided for each of the lead line openings 155*a* and 155*b*. In this case, the film including the electrically-conductive material included in the lead line opening 155*a* and the film including the electrically-conductive material included in the lead line opening 155*b* are so extended to the surface on the back surface side of the first substrate 110A as to be isolated from each other (i.e., so that both are non-conductive), and the pad 151 may be provided on each of the films.

In the present specification, in a case where a plurality of lead line openings 155 exists in the diagram as illustrated in FIG. 6B, for the sake of convenience, the lead line openings 155 are distinguished from one another by assigning different alphabets to the ends of the respective reference numerals, as in the lead line opening 155*a*, the lead line opening 155*b*, . . . , and so on.

Figure 6C:
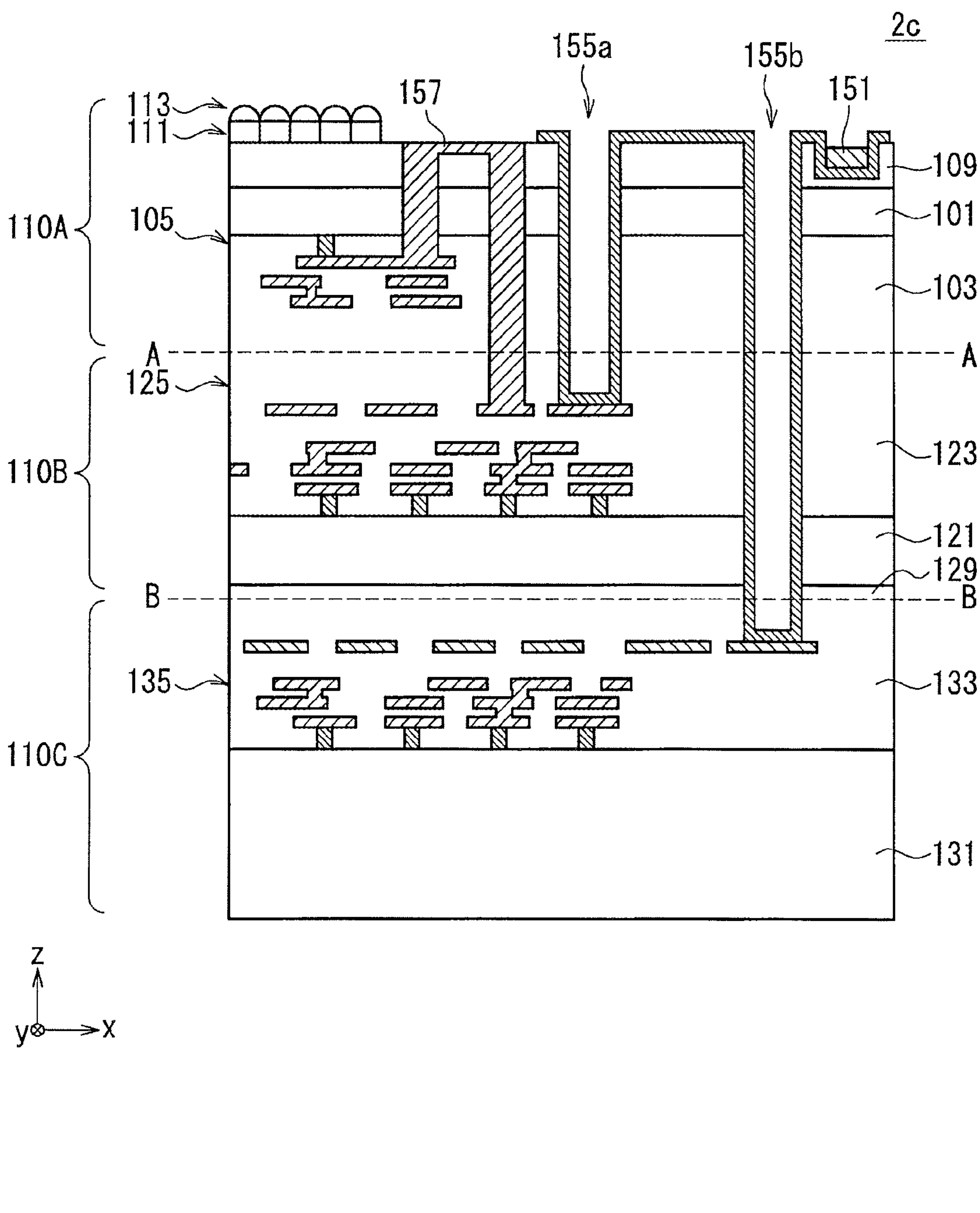
FIG. 6C is a vertical cross-sectional view of a schematic configuration of the solid-state imaging device according to the first configuration example of the present embodiment.

A solid-state imaging device 2*c* illustrated in FIG. 6C corresponds to the solid-state imaging device 2*b* illustrated in FIG. 6B in which the configuration of the lead-out pad structure is changed. Specifically, in the structure illustrated in FIG. 6C, the lead-out pad structure has a structure in which films including an electrically-conductive materials included in the lead line openings 155*a* and 155*b* and the pad 151 formed on the film are both embedded in the insulating film 109 at a portion where the pad 151 is provided.

Note that, in the present specification, the lead-out pad structure in which the pad 151 is embedded in the insulating film 109 on the surface on the back surface side of the first substrate 110A as illustrated in FIG. 6C is also referred to as an embedded type lead-out pad structure. Correspondingly, a lead-out pad structure in which the pad 151 is so provided as not to be embedded in the insulating film 109 on the surface on the back surface side of the first substrate 110A as illustrated in FIG. 6B is also referred to as a non-embedded type lead-out pad structure.

In the configuration illustrated in FIG. 6C, similarly to the configuration illustrated in FIG. 6B, the one pad 151 is shared by the two lead line openings 155*a* and 155*b*. However, the present embodiment is not limited to such an example. Similarly to the non-embedded type lead-out pad structure illustrated in FIG. 6B, also in the embedded type lead-out pad structure, a plurality of pads 151 may be provided to correspond to the respective two lead line openings 155*a* and 155*b*.

Figure 6D:
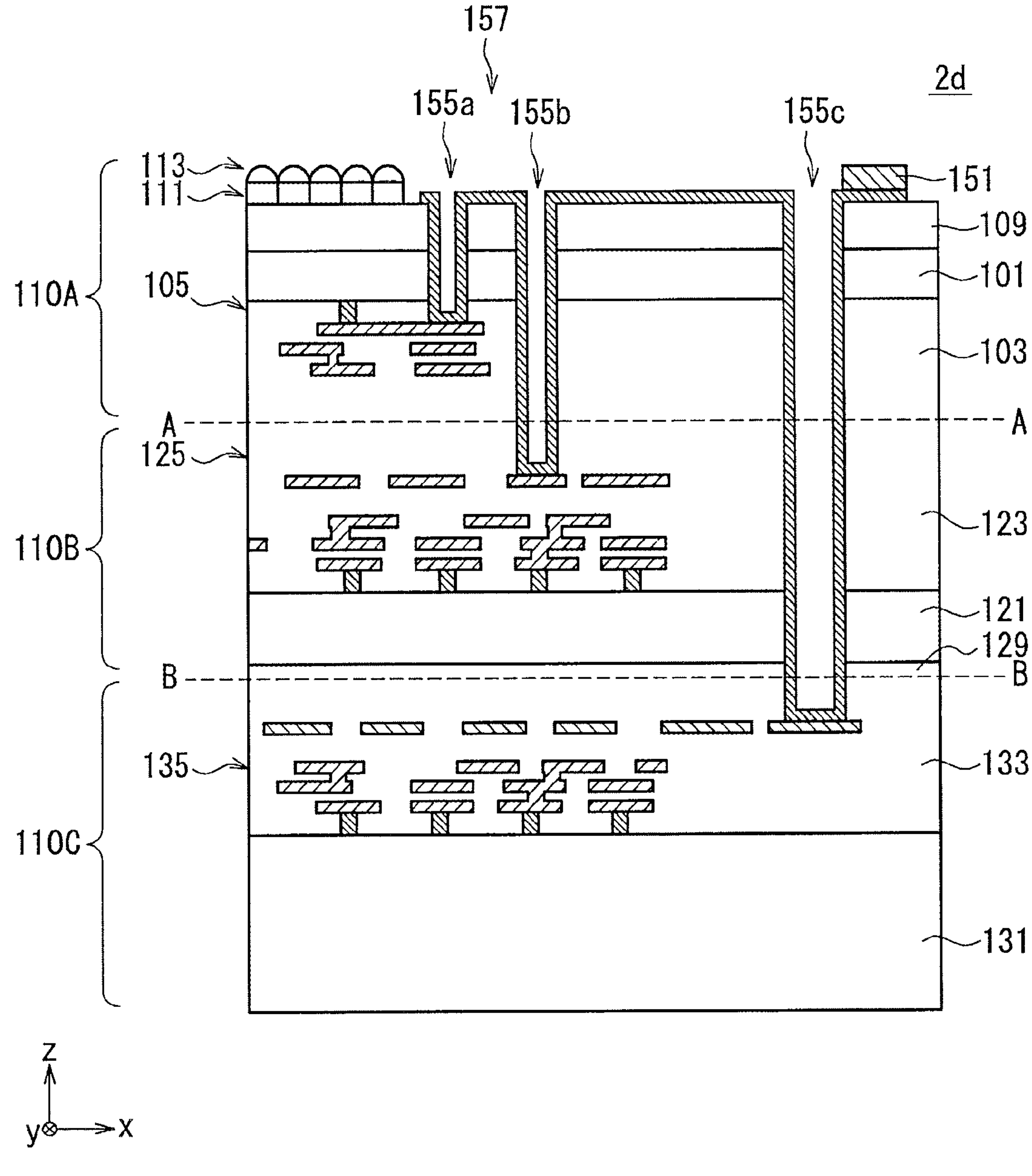
FIG. 6D is a vertical cross-sectional view of a schematic configuration of the solid-state imaging device according to the first configuration example of the present embodiment.

A solid-state imaging device 2*d* illustrated in FIG. 6D includes, as coupling structures, the twin contact type TSV 157 between two layers, a lead-out pad structure for the third substrate 110C (i.e., a lead line opening 155*c* for the predetermined wiring line in the multi-layered wiring layer 135 of the third substrate 110C and the pad 151 on the surface on the back surface side of the first substrate 110A). The TSV 157 is formed from the back surface side of the first substrate 110A toward the second substrate 110B, and is so provided as to electrically couple the respective signal lines provided in the first substrate 110A and the second substrate 110B to each other and the respective power supply lines provided in the first substrate 110A and the second substrate 110B to each other. In the configuration illustrated in FIG. 6D, the predetermined wiring line of the first metal wiring layer in the multi-layered wiring layer 105 of the first substrate 110A and the predetermined wiring line of the first metal wiring layer in the multi-layered wiring layer 125 of the second substrate 110B are electrically coupled to each other by the TSV 157.

Here, unlike the configurations illustrated in FIGS. 6A to 6C, the TSV 157 illustrated in FIG. 6D is configured by forming a film of an electrically-conductive material on the inner wall of the through hole, instead of being configured by embedding the first metal inside the through hole. In the illustrated example, the electrically-conductive material is formed by the same material (e.g., W) as the electrically-conductive material included in the lead line opening 155. As described above, in the present embodiment, the TSV 157 having a configuration in which an electrically-conductive material is embedded in a through hole as illustrated in FIGS. 6A to 6C may be used, or the TSV 157 having a configuration in which a film including an electrically-conductive material is formed on the inner wall of the through hole as illustrated in FIG. 6D may be used. Note that, in the TSV 157, the film of the electrically-conductive material formed on the inner wall of the through hole is not limited to W; various known electrically-conductive materials may be used as the electrically-conductive material. The electrically-conductive material included in the TSV 157 may be a material different from the electrically-conductive material included in the lead line opening 155.

Note that, in the present specification, as illustrated in FIGS. 6A to 6C, the TSV 157 having a configuration in which electrically-conductive materials are embedded in the through holes is also referred to as an embedded type TSV 157. In addition, as illustrated in FIG. 6D, the TSV 157 having a configuration in which a film including an electrically-conductive material is formed on the inner wall of the through hole is also referred to as a non-embedded type TSV 157.

Here, in the configuration illustrated in FIG. 6D, a film including an electrically-conductive material formed on the inner wall of the through hole in the TSV 157 and a film including an electrically-conductive material formed on the inner wall of the opening in the lead line opening 155*c* are integrally formed, and the film including this electrically-conductive material is extended to the surface on the back surface side of the first substrate 110A. The pad 151 is formed on a film including an electrically-conductive material extending to the surface on the back surface side of the first substrate 110A. That is, in the configuration illustrated in FIG. 6D, the TSV 157 and the pad 151 are electrically coupled to each other, moreover, the predetermined wiring line in the multi-layered wiring layer 105 of the first substrate 110A and the predetermined wiring line in the multi-layered wiring layer 125 of the second substrate 110B, which are electrically coupled to each other by the TSV 157, are also electrically coupled to the pad 151.

As described, in the configuration illustrated in FIG. 6D, the twin contact type TSV 157 and the non-embedded type TSV 157 each have a function as the TSV for electrically coupling the respective signal lines provided in the first substrate 110A and the second substrate 110B to each other and the respective power supply lines provided in the first substrate 110A and the second substrate 110B to each other, and each have a function as two lead line openings 155*a* and 155*b* corresponding to the two through holes (i.e., the lead line opening 155*a* for leading out the predetermined wiring line in the multi-layered wiring layer 105 of the first substrate 110A to the pad 151 on the surface on the back surface side of the first substrate 110A, and the lead line opening 155*b* for leading out the predetermined wiring line in the multi-layered wiring layer 125 of the second substrate 110B to the pad 15 on the surface on the back surface side of the first substrate 110A).

Hereinafter, as in the TSV 157 illustrated in FIG. 6D, a structure having in combination the function as the TSV 157 and the function as the lead line openings 155*a* and 155*b* is also described as a TSV dual-use lead line opening. The configuration illustrated in FIG. 6D may be said to be a configuration having, as coupling structures, the TSV dual-use lead line openings 155*a* and 155*b* (i.e., TSV 157) and the lead line opening 155*c*. Note that, in the following diagrams, in order to avoid complicating the diagrams, the description of the symbol "157" denoting the TSV is omitted from the TSV dual-use lead line opening, and that only the symbol "155" denoting the lead line opening is assigned to the TSV dual-use lead line opening.

Figure 6E:
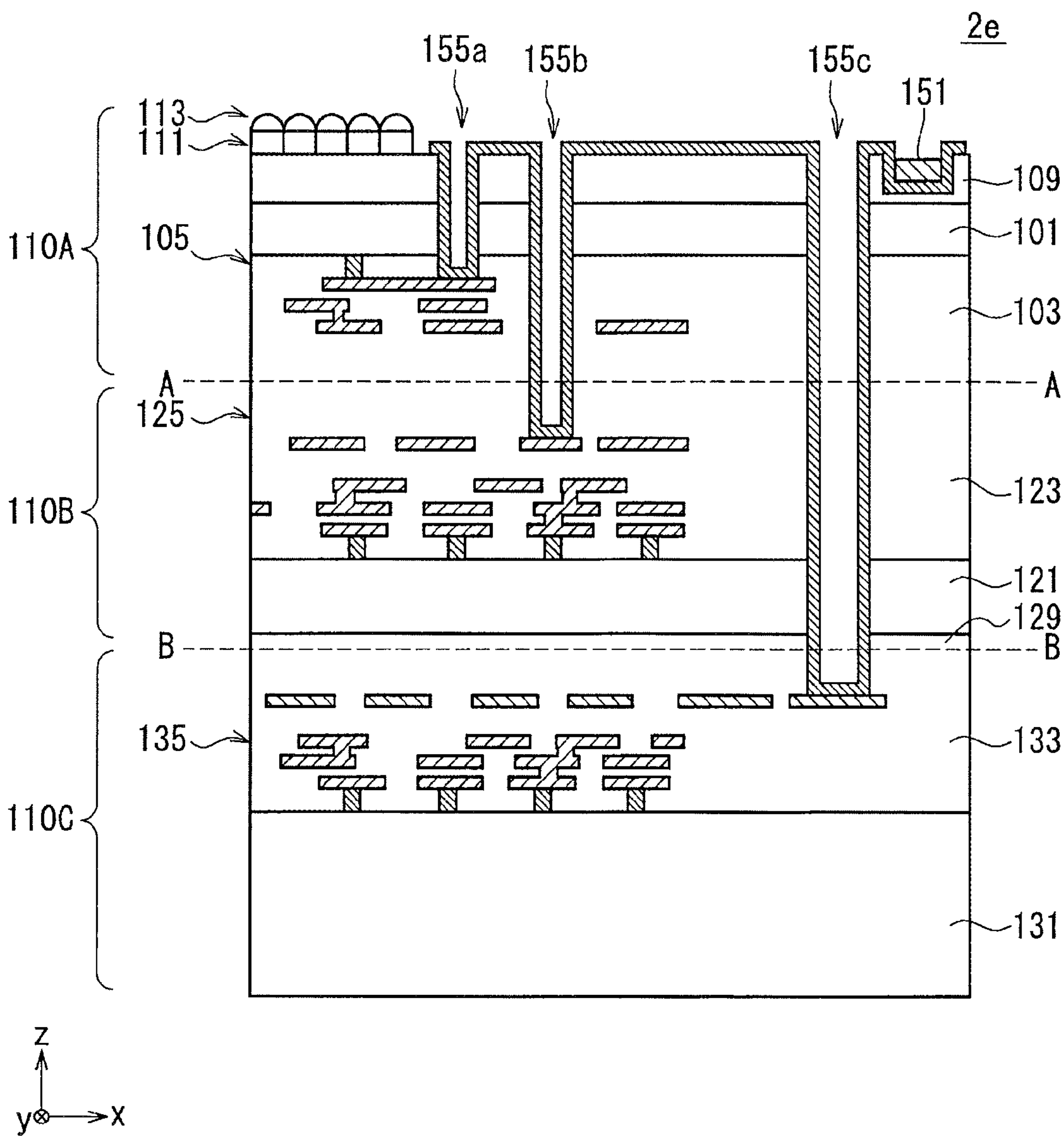
FIG. 6E is a vertical cross-sectional view of a schematic configuration of the solid-state imaging device according to the first configuration example of the present embodiment.

The solid-state imaging device 2*e* illustrated in FIG. 6E corresponds to the solid-state imaging device 2*d* illustrated in FIG. 6D in which the embedded type lead-out pad structure is provided instead of the non-embedded type lead-out pad structure.

The types of wiring lines coupled by the twin contact type TSV 157 between two layers are not limited to the respective configurations illustrated in FIGS. 6A to 6E. The TSV 157 may be coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of the first metal wiring layer and the second metal wiring layer so as to coexist.

In the configuration illustrated in FIG. 6A, the pad 151 is provided in each of the first substrate 110A and the third substrate 110C in the illustrated example, but the present embodiment is not limited to such an example. In the first configuration example, the respective signal lines provided in the first substrate 110A and the second substrate 110B are electrically coupled to each other and the respective power supply lines provided in the first substrate 110A and the second substrate 110B are electrically coupled to each other by the TSV 157. Accordingly, the second substrate 110B and the third substrate 110C or the film substrate 110A and the third substrate 110C each provided with the respective signal lines as well as the respective power supply lines not electrically coupled to each other by the TSV 157 may be each provided with the pad 151 for electrically coupling the respective signal lines to each other and the respective power supply lines to each other. That is, in the configuration illustrated in FIG. 6A, the pad 151 may be provided on each of the second substrate 110B and the third substrate 110C, instead of the illustrated configuration example of the pad 151. Likewise, in each of the configurations illustrated in FIGS. 6B and 6C, the pad 151 is provided in the second substrate 110B and the third substrate 110C in the illustrated examples, but the pad 151 may be provided in the first substrate 110A and the third substrate 110C instead.

In each of the configurations illustrated in FIGS. 6D and 6E, the one pad 151 is shared by the TSV dual-use lead line openings 155*a* and 155*b* and the lead line opening 155*c* in the illustrated example, but the present embodiment is not limited to such an example. In each of these configurations, the one pad 151 may be provided for each of the TSV dual-use lead line openings 155*a* and 155*b* (i.e., for the TSV 157) and the lead line opening 155*c*. In this case, the films including the electrically-conductive materials included in the TSV dual-use lead line openings 155*a* and 155*b* and the film including the electrically-conductive material included in the lead line opening 155*c* may be so extended to the surface on the back surface side of the first substrate 110A as to be isolated from each other (i.e., so that both are non-conductive).

4-2. Second Configuration Example

FIGS. 7A to 7K are each a vertical cross-sectional views of a schematic configuration of a solid-state imaging device according to a second configuration example of the present embodiment. The solid-state imaging device according to the present embodiment may have configurations illustrated in FIGS. 7A to 7K.

Figure 7A:
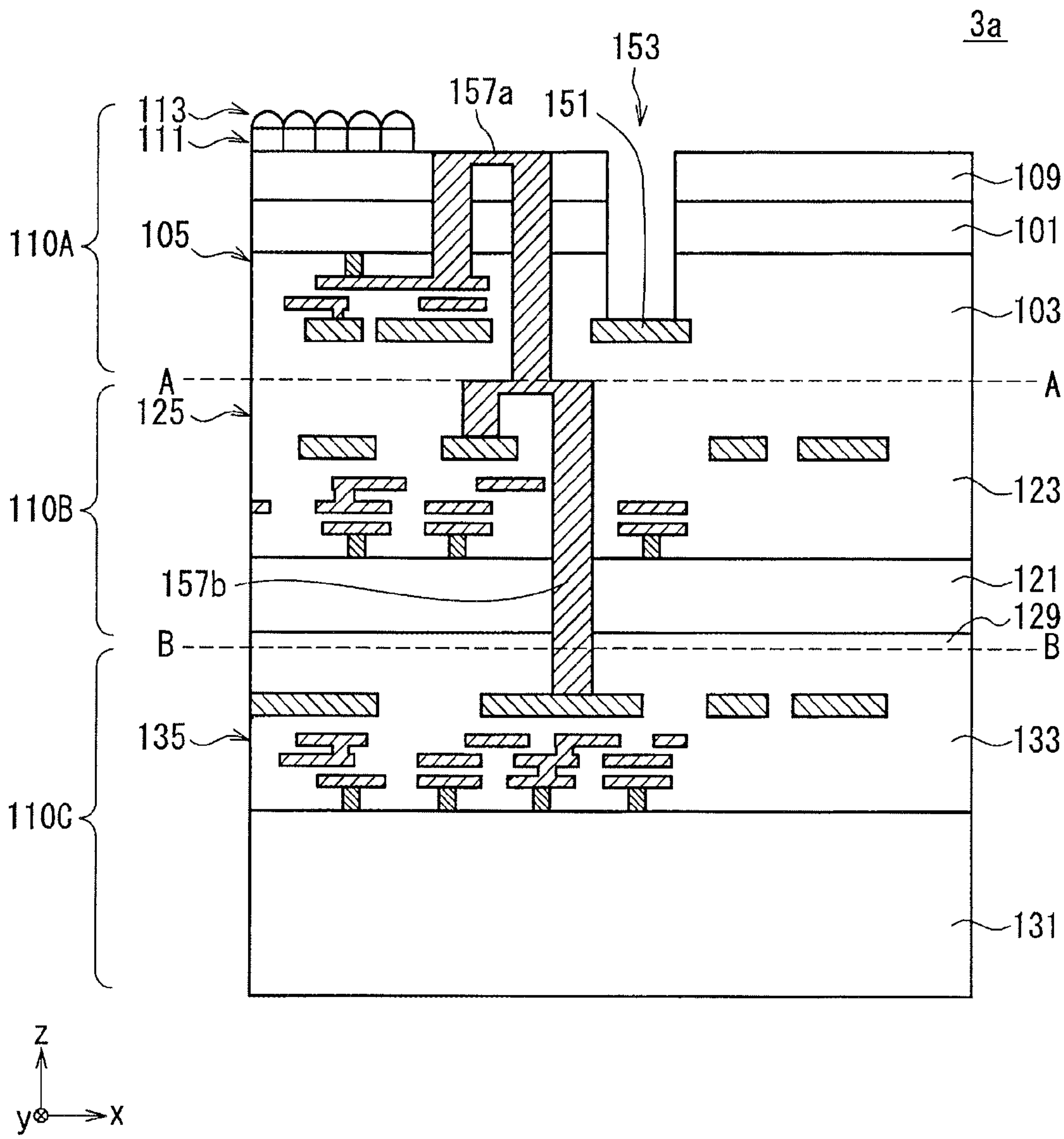
FIG. 7A is a vertical cross-sectional view of a schematic configuration of a solid-state imaging device according to a second configuration example of the present embodiment.

The solid-state imaging device 3*a* illustrated in FIG. 7A includes, as coupling structures, the TSV 157*a* and 157*b* of the twin contact type and the embedded type between two layers, and the embedded pad structure for the first substrate 110A (i.e., the pad 151 provided in the multi-layered wiring layer 105 of the first substrate 110A and the pad opening 153 exposing the pad 151).

The TSV 157*b* is formed from the front surface side of the second substrate 110B toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 7A, the predetermined wiring line of the second metal wiring layer in the multi-layered wiring layer 125 of the second substrate 110B and the predetermined wiring line of the second metal wiring layer in the multi-layered wiring layer 135 of the third substrate 110C are electrically coupled to each other by the TSV 157*b*.

The TSV 157*a* is formed from the back surface side of the first substrate 110A toward the second substrate 110B, and is so provided as to electrically couple the respective signal lines provided in the first substrate 110A and the second substrate 110B to each other and the respective power supply lines provided in the first substrate 110A and the second substrate 110B to each other. In the configuration illustrated in FIG. 7A, one via of the TSV 157*a* is in contact with the predetermined wiring line of the first metallic wiring layer in the multi-layered wiring layer 105 of the first substrate 110A, and the other via is in contact with an upper end of the TSV 157*b*. That is, the TSV 157*a* is so formed as to electrically couple the predetermined wiring line in the multi-layered wiring layer 105 of the first substrate 110A and the TSV 157*b* to each other. Further, the predetermined wiring line in the multi-layered wiring layer 105 of the first substrate 110A, the predetermined wiring lines in the multi-layered wiring layer 125 of the second substrate 110B electrically coupled by the TSV 157*b*, and the predetermined wiring line in the multi-layered wiring layer 135 of the third substrate 110C are electrically coupled together by the TSV 157*a*.

Figure 7B:
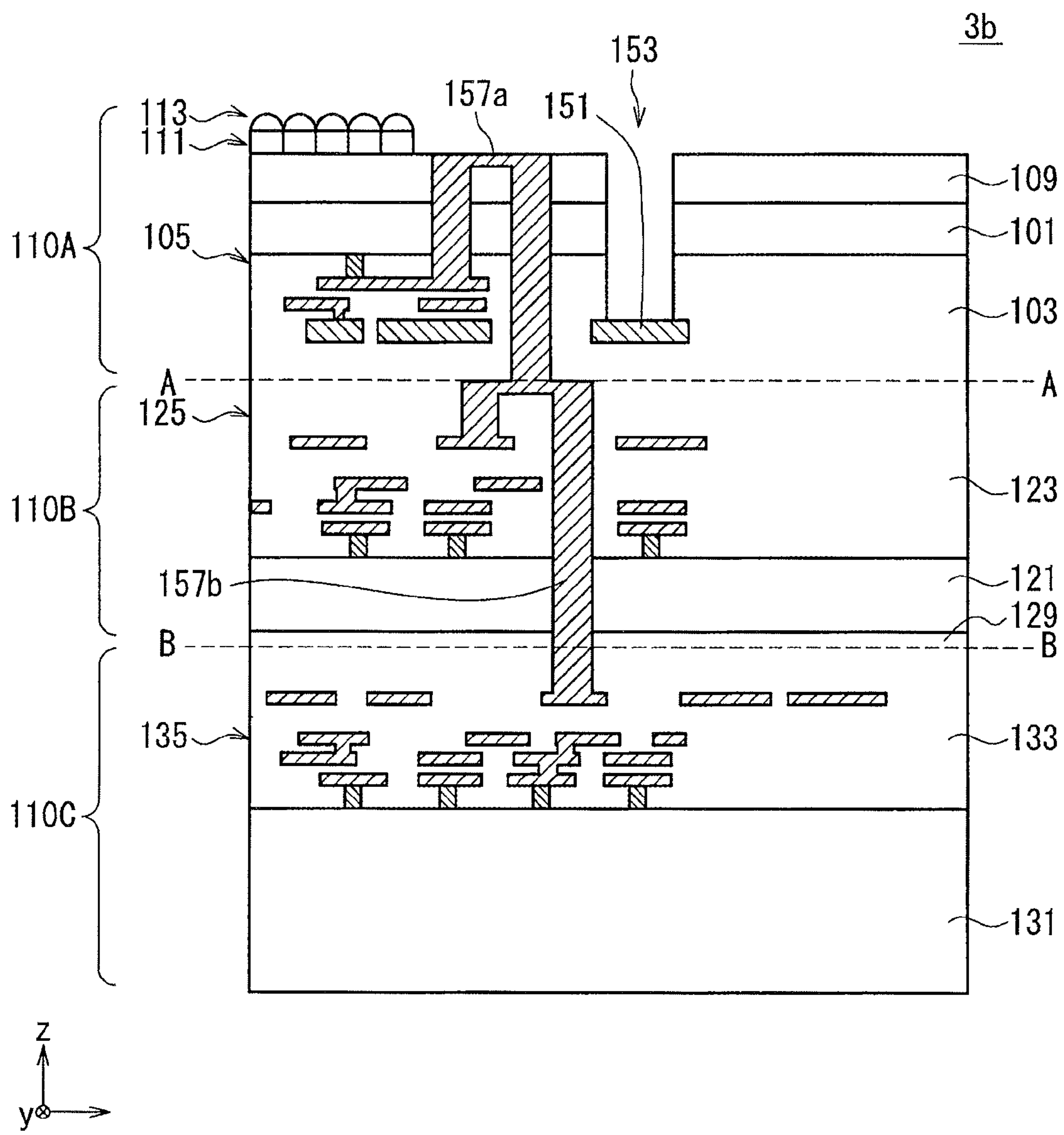
FIG. 7B is a vertical cross-sectional view of a schematic configuration of the solid-state imaging device according to the second configuration example of the present embodiment.

A solid-state imaging device 3*b* illustrated in FIG. 7B corresponds to the solid-state imaging device 3*a* illustrated in FIG. 7A in which the types (materials) of the wiring lines electrically coupled by the TSV 157*b* are changed. Specifically, in the configuration illustrated in FIG. 7B, the predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*.

Figure 7C:
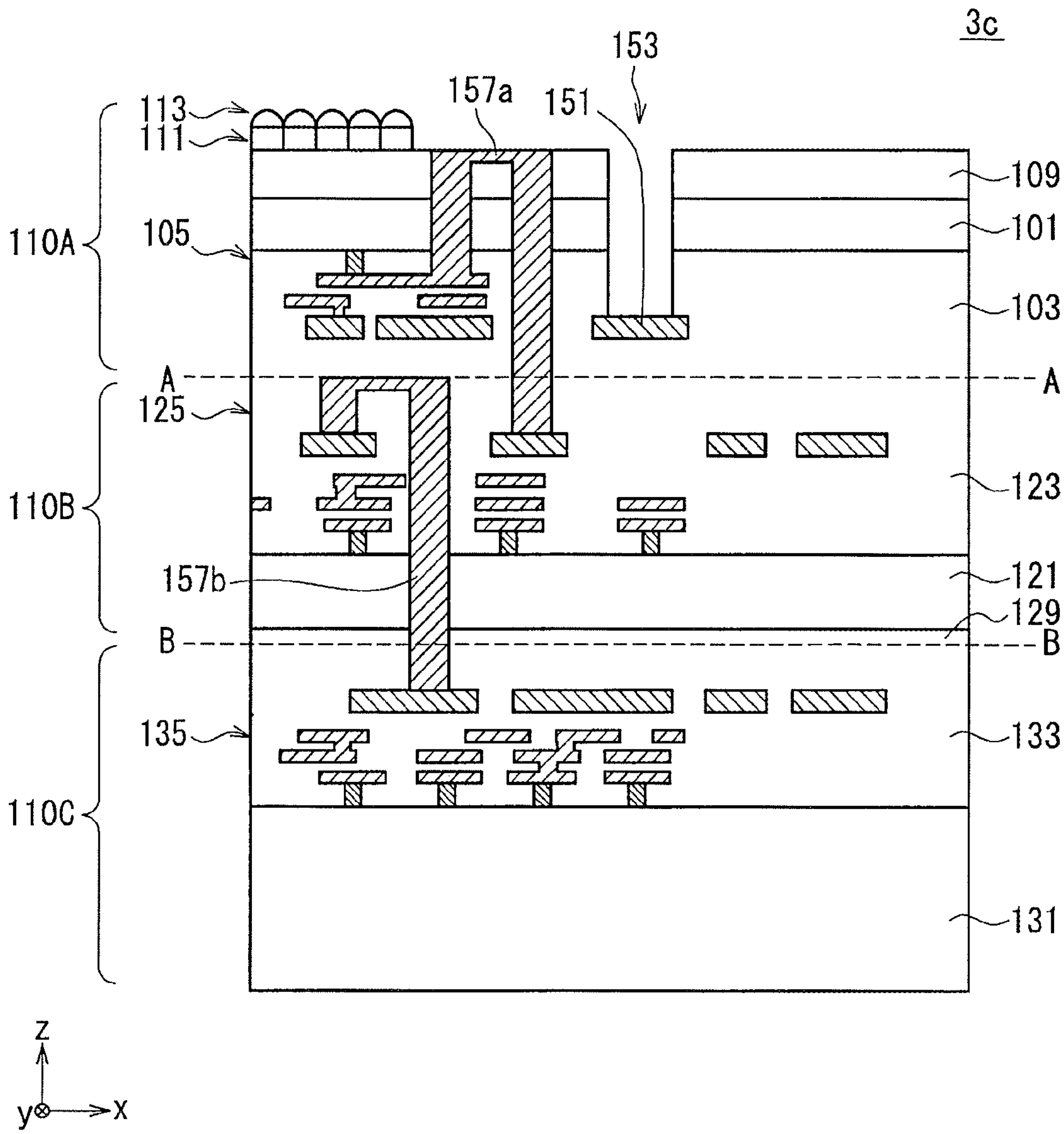
FIG. 7C is a vertical cross-sectional view of a schematic configuration of the solid-state imaging device according to the second configuration example of the present embodiment.

A solid-state imaging device 3*c* illustrated in FIG. 7C corresponds to the solid-state imaging device 3*a* illustrated in FIG. 7A in which the TSV 157*a* structures are changed. Specifically, in the configuration illustrated in FIG. 7A, the TSV 157*a* is so provided as to electrically couple the predetermined wiring line in the multi-layered wiring layer 103 of the first substrate 110A and the TSV 157*b* to each other. However, in the configuration illustrated in FIG. 7C, the TSV 157*a* is so provided as to electrically couple the predetermined wiring line in the multi-layered wiring layer 105 of the first substrate 110A and the predetermined wiring line in the multi-layered wiring layer 125 of the second substrate 101B to each other. In the configuration illustrated in FIG. 7C, the predetermined wiring line of the first metal wiring layer in the multi-layered wiring layer 105 of the first substrate 110A and the predetermined wiring line of the second metal wiring layer in the multi-layered wiring layer 125 of the second substrate 110B are electrically coupled to each other by the TSV 157*a*.

Figure 7D:
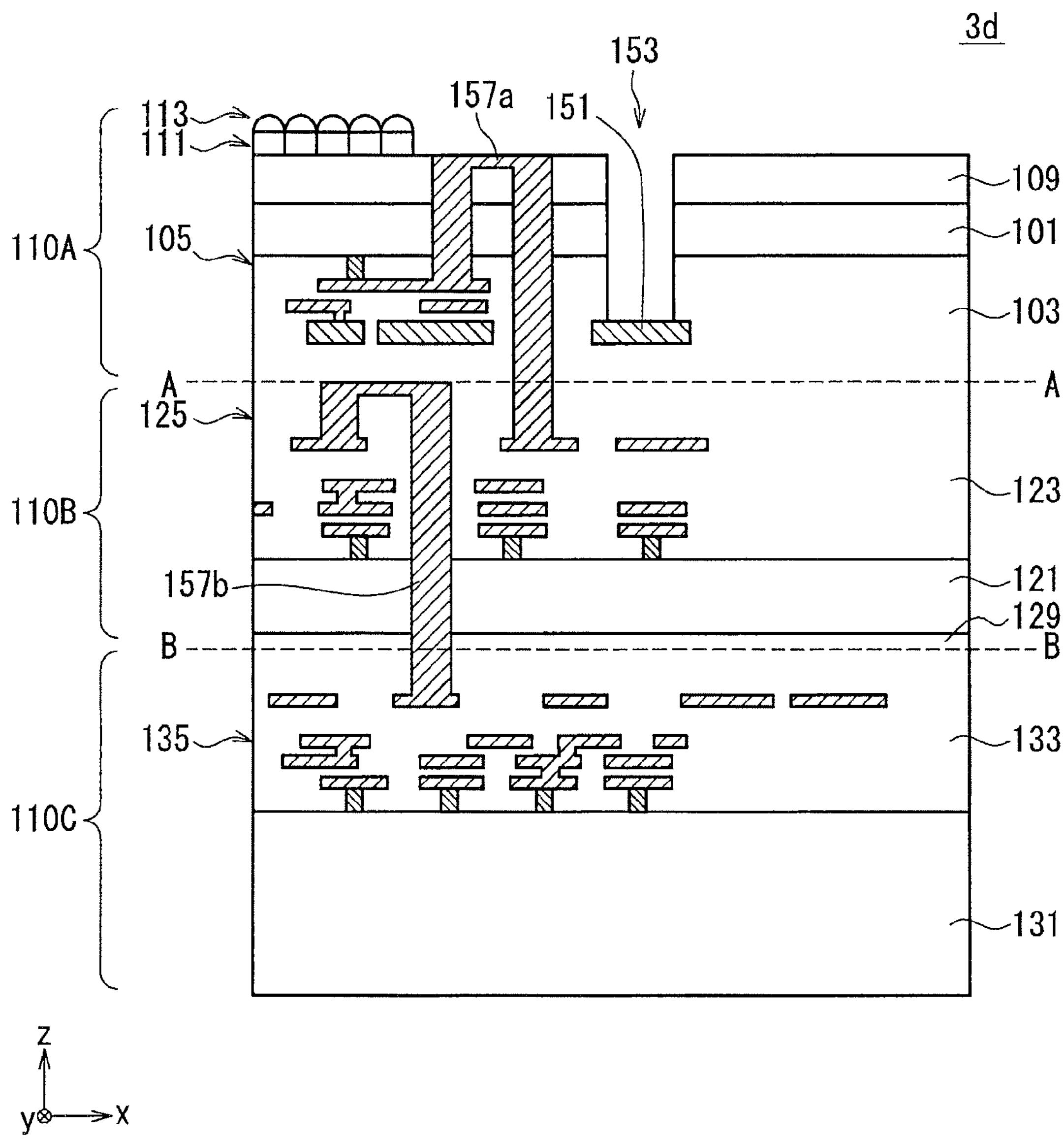
FIG. 7D is a vertical cross-sectional view of a schematic configuration of the solid-state imaging device according to the second configuration example of the present embodiment.

A solid-state imaging device 3*d* illustrated in FIG. 7D corresponds to the solid-state imaging device 3*c* illustrated in FIG. 7C in which the types of wiring lines electrically coupled by the TSV 157*a* and 157*b* are changed. Specifically, in the configuration illustrated in FIG. 7D, the predetermined wiring line of the first metal wiring layer in the multi-layered wiring layer 105 of the first substrate 110A and the predetermined wiring line of the first metal wiring layer in the multi-layered wiring layer 125 of the second substrate 110B are electrically coupled to each other by the TSV 157*a*. The predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*.

Figure 7E:
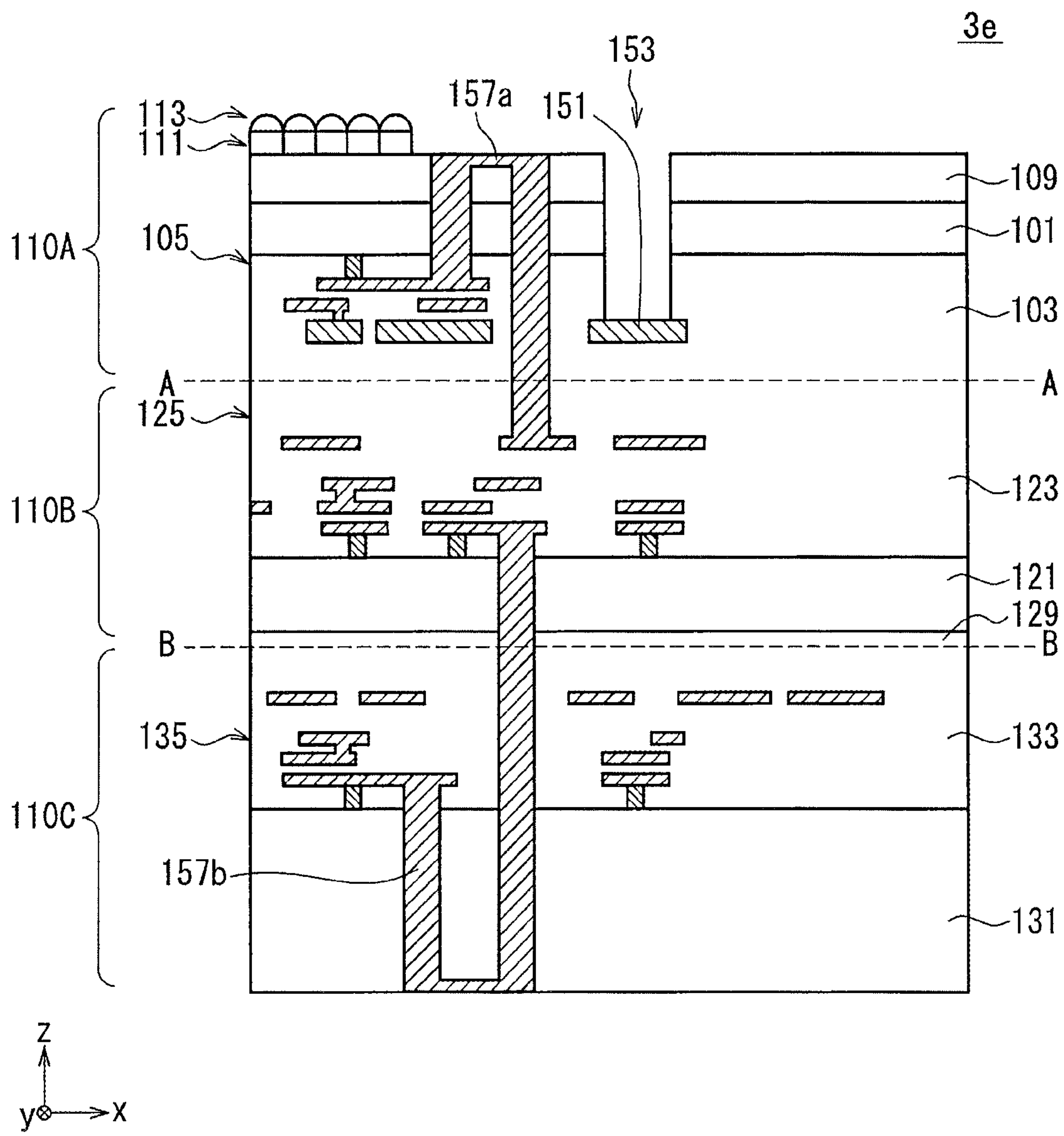
FIG. 7E is a vertical cross-sectional view of a schematic configuration of the solid-state imaging device according to the second configuration example of the present embodiment.

A solid-state imaging device 3*e* illustrated in FIG. 7E corresponds to the solid-state imaging device 3*d* illustrated in FIG. 7D in which the TSV 157*b* structure is changed. Specifically, in the configuration illustrated in FIG. 7E, the TSVb is formed from the back surface side of the third substrate 110C toward the second substrate 110B, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 7E, the predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*.

Figure 7F:
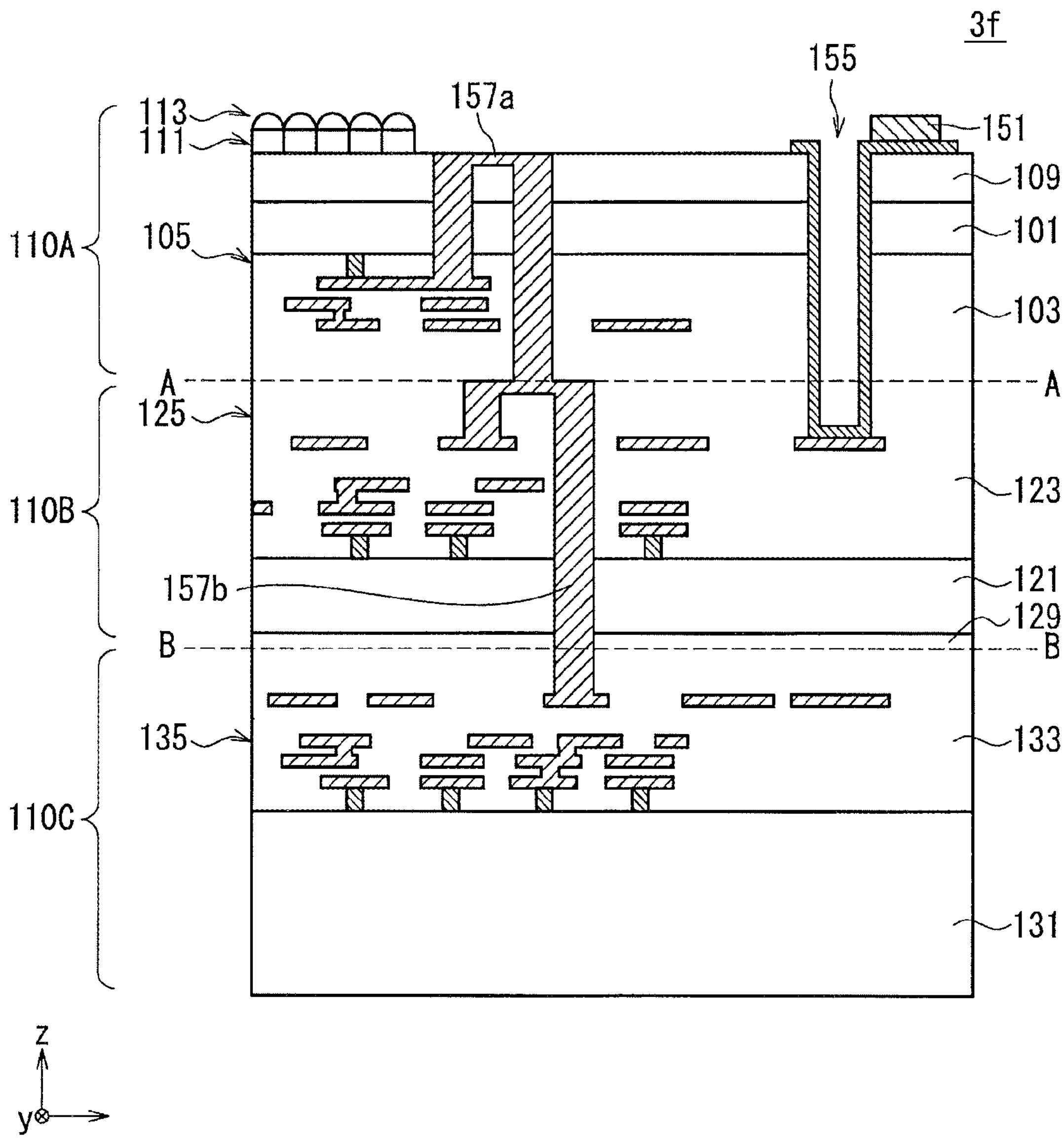
FIG. 7F is a vertical cross-sectional view of a schematic configuration of the solid-state imaging device according to the second configuration example of the present embodiment.

A solid-state imaging device 3*f* illustrated in FIG. 7F corresponds to the solid-state imaging device 3*b* illustrated in FIG. 7B in which the embedded pad structure is changed. Specifically, in the configuration illustrated in FIG. 7F, the non-embedded type lead-out pad structure for the second substrate 110B (i.e., the lead line opening 155 for the predetermined wiring line in the multi-layered wiring layer 125 of the second substrate 111 and the pad 151 on the surface on the back surface side of the first substrate 110A) is provided instead of the embedded pad structure.

Figure 7G:
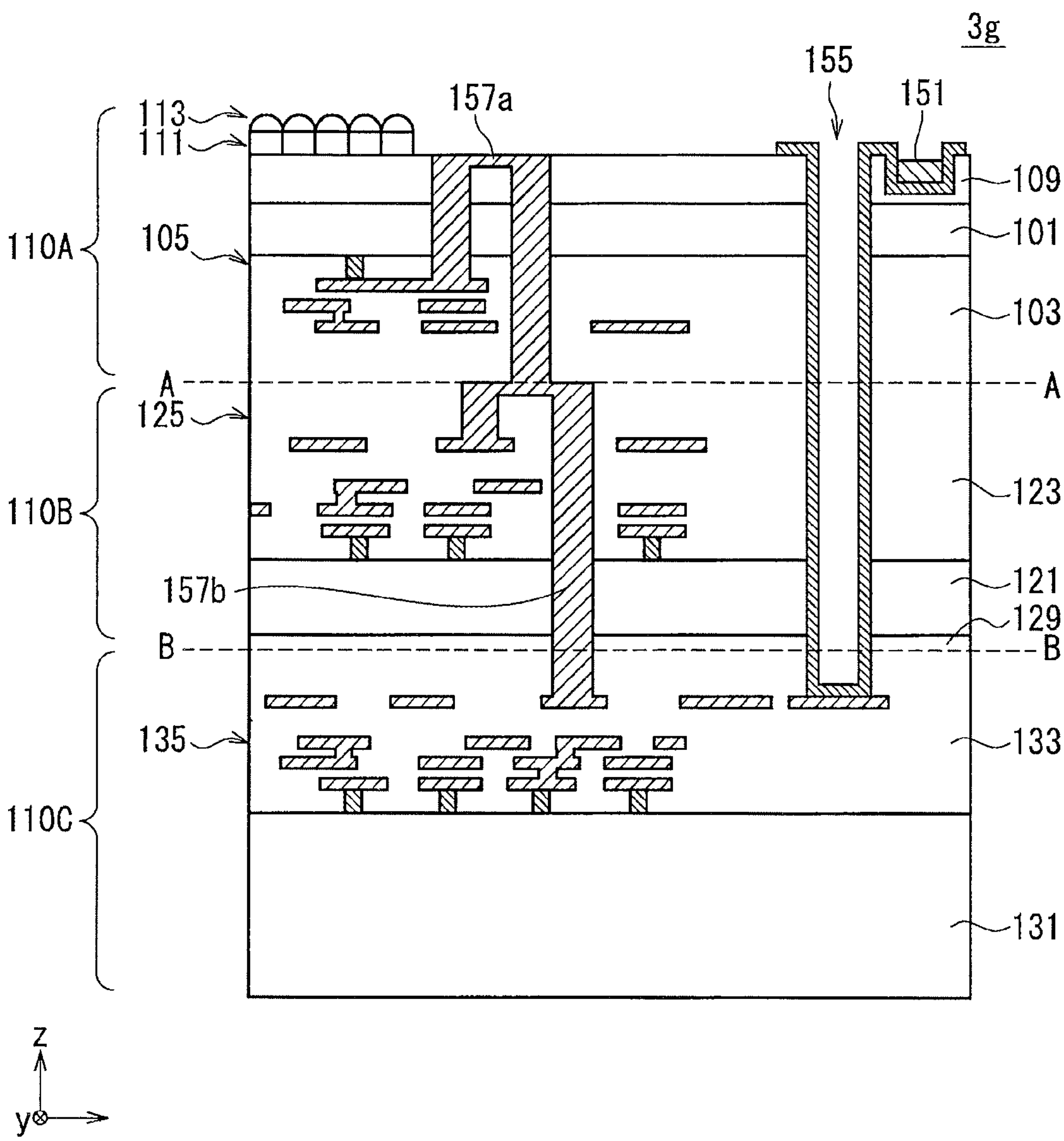
FIG. 7G is a vertical cross-sectional view of a schematic configuration of the solid-state imaging device according to the second configuration example of the present embodiment.

A solid-state imaging device 3*g* illustrated in FIG. 7G corresponds to the solid-state imaging device 3*f* illustrated in FIG. 7P in which the lead-out pad structure is changed. Specifically, in the configuration illustrated in FIG. 7G, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 109 on the surface on the back surface side of the first substrate 110A) is provided instead of the non-embedded type lead-out pad structure for the second substrate 110B.

Figure 7H:
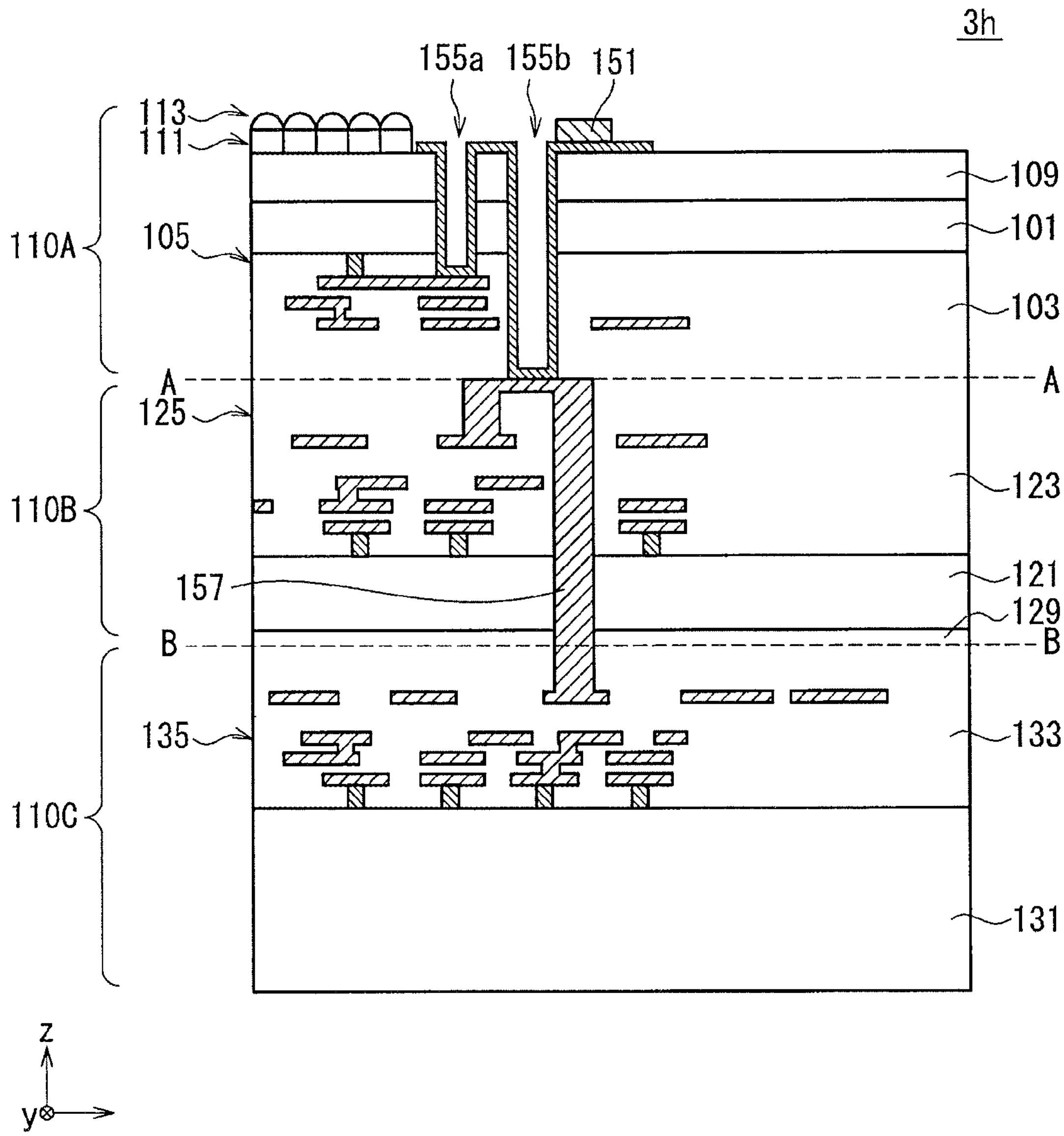
FIG. 7H is a vertical cross-sectional view of a schematic configuration of the solid-state imaging device according to the second configuration example of the present embodiment.
Figure 7I:
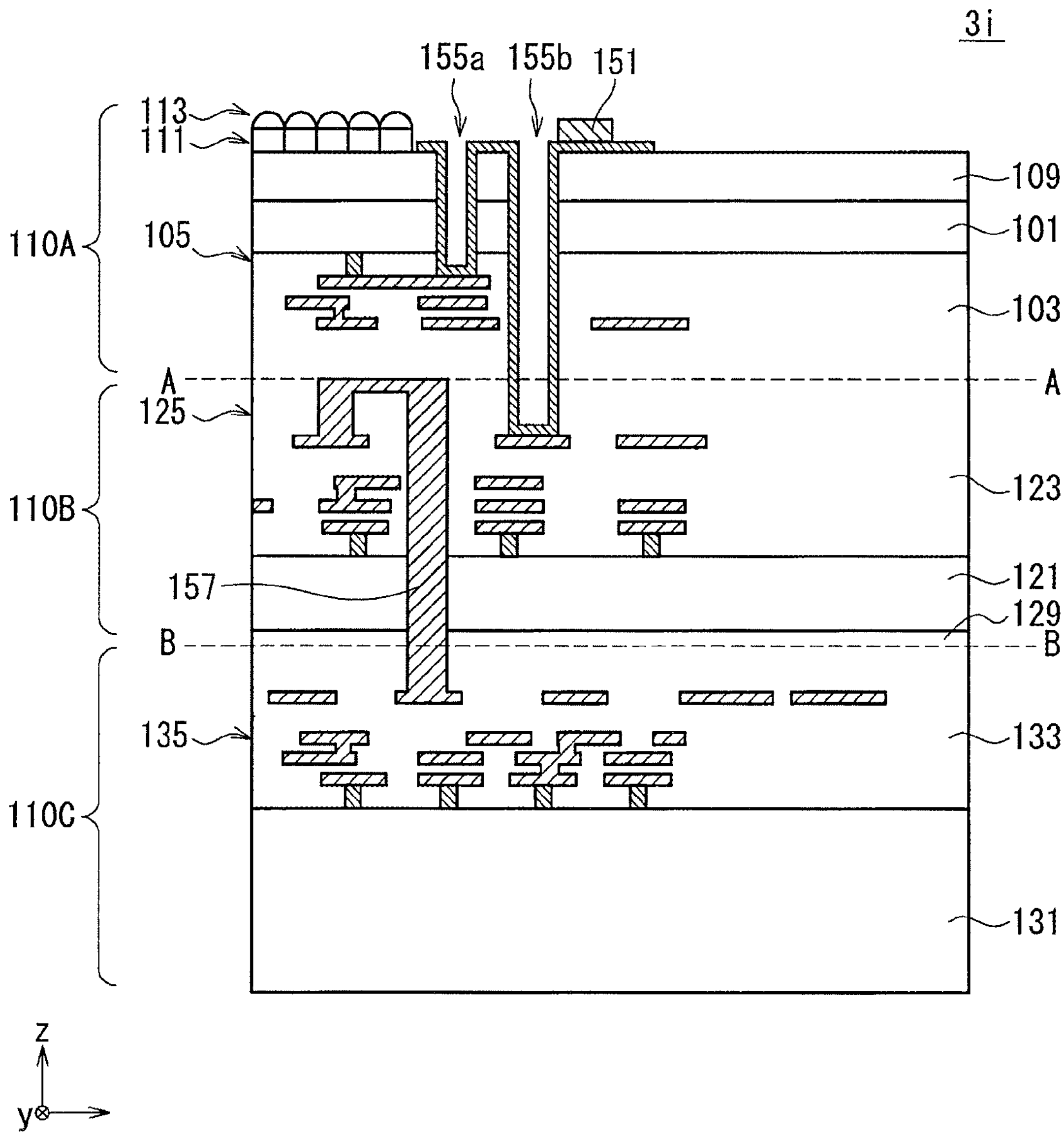
FIG. 7I is a vertical cross-sectional view of a schematic configuration of the solid-state imaging device according to the second configuration example of the present embodiment.
Figure 7J:
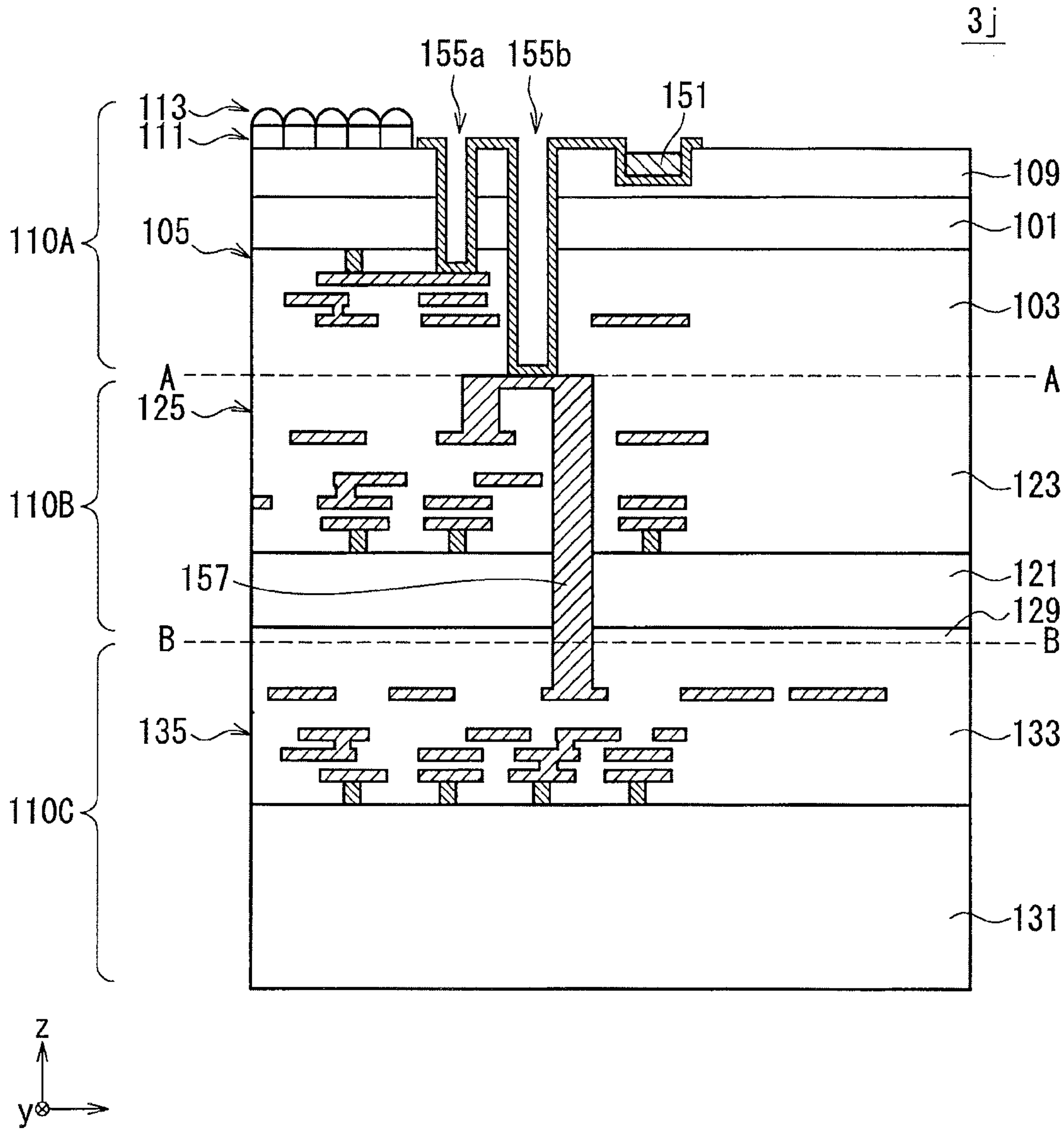
FIG. 7J is a vertical cross-sectional view of a schematic configuration of the solid-state imaging device according to the second configuration example of the present embodiment.

A solid-state imaging device 3*h* illustrated in FIG. 7H corresponds to the solid-state imaging device 3*b* illustrated in FIG. 7B in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded pad structure by changing the embedded type TSV 157*a* to the non-embedded type TSV A solid-state imaging device 3*i* illustrated in FIG. 7I corresponds to the solid-state imaging device 3*d* illustrated in FIG. 7D in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded pad structure by changing the embedded type TSV 157*a* to the non-embedded type TSV.

A solid-state imaging device 3*j* illustrated in FIG. 7 corresponds to the solid-state imaging device 3*h* illustrated in FIG. 7H in which the non-embedded type lead-out pad structure of the TSV dual-use lead line openings 155*a* and 155*b* is changed to the embedded type lead-out pad structure.

Figure 7K:
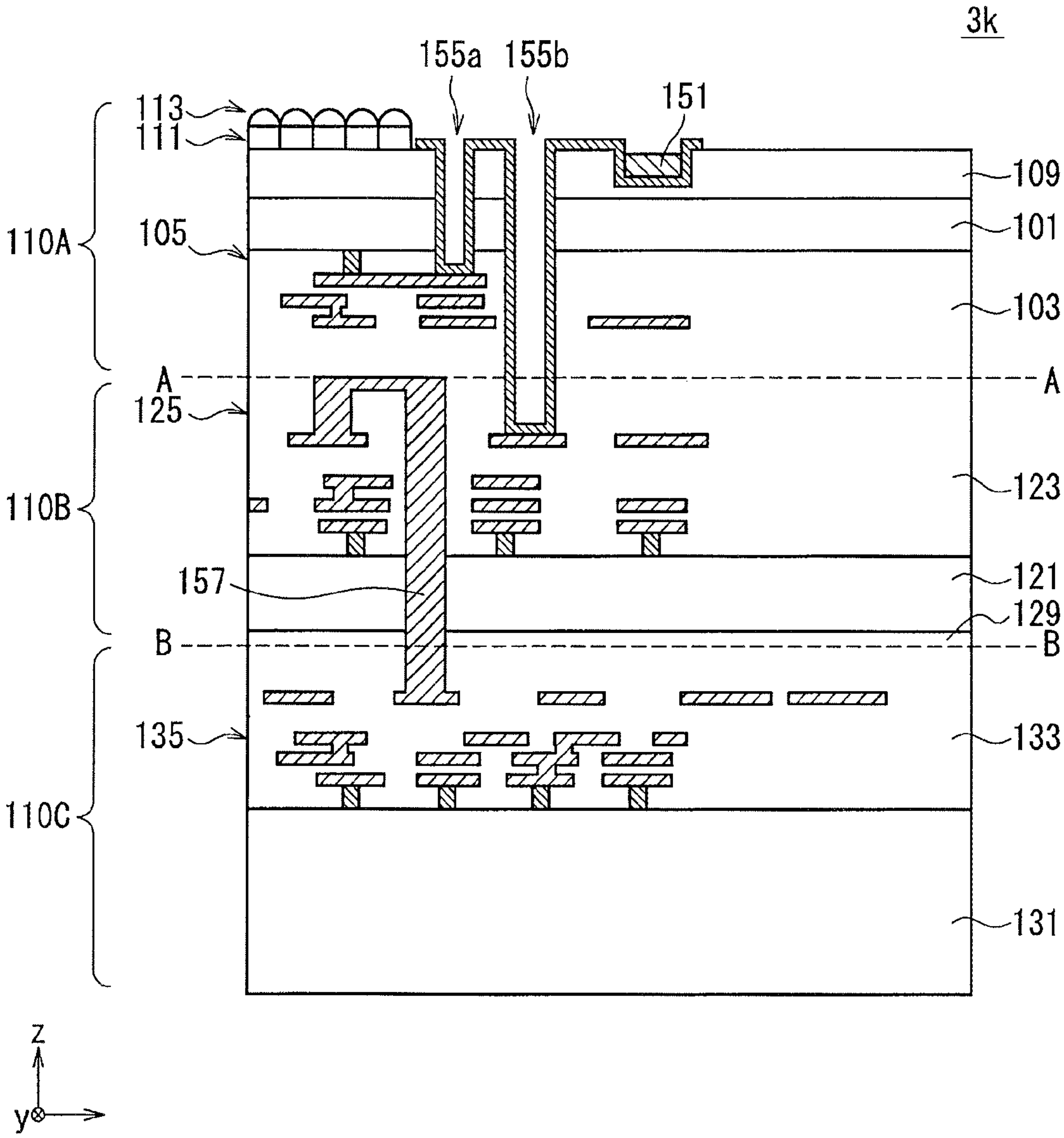
FIG. 7K is a vertical cross-sectional view of a schematic configuration of the solid-state imaging device according to the second configuration example of the present embodiment.

A solid-state imaging device 3*k* illustrated in FIG. 7K corresponds to the solid-state imaging device 3*i* illustrated in FIG. 7I in which the non-embedded type lead-out pad structure of the TSV dual-use lead line openings 155*a* and 155*b* is changed to the embedded type lead-out pad structure.

Note that the types of the wiring lines coupled by the twin contact type TSV 157 between two layers are not limited in each of the configurations illustrated in FIGS. 7A to 7K. The TSV 157 may be coupled to the predetermined wiring line of the first metal wiring layer or may be coupled to the predetermined wiring line of the second metal wiring layer. In addition, each of the multi-layered wiring layers 105, 125, and 135 may each include only the first metal wiring layer, may include only the second metal wiring layer, or may include both of them so as to coexist.

In each of the configurations illustrated in FIGS. 7A to 7G the substrate on which the pad 151 is provided is not limited to the illustrated example. In the second configuration example, the respective signal lines provided in the first substrate 110A and the second substrate 110B are electrically coupled to each other and the respective power supply lines provided in the first substrate 110A and the second substrate 110B are electrically coupled to each other by one TSV 157*a*. The respective signal lines provided in the second substrate 110B and the third substrate 110C are electrically coupled to each other and the respective power supply lines provided in the second substrate 110B and the third substrate 110C are electrically coupled to each other by the other TSV 157*b*. Accordingly, the pad 151 as the coupling structure may not be provided. Thus, for example, in each of the configurations illustrated in FIGS. 7A to 7G, the pad 151 may be provided on any of the substrates 110A, 110B, and 110C to derive a desired signal.

In a case where the lead-out pad structure is provided, the lead-out pad structure may be the non-embedded type or the embedded type. For example, in the configuration illustrated in FIG. 7F, the embedded type lead-out pad structure may be provided instead of the non-embedded type lead-out pad structure. Further, for example, in the configuration illustrated in FIG. 7G the non-embedded type lead-out pad structure may be provided instead of the embedded type lead-out pad structure.

4-3. Third Configuration Example

FIGS. 8A to 8G are each a vertical cross-sectional view of a schematic configuration of a solid-state imaging device according to a third configuration example of the present embodiment. The solid-state imaging device according to the present embodiment may have each of the configurations illustrated in FIGS. 8A to 8G.

A solid-state imaging device 4*a* illustrated in FIG. A includes, as coupling structures, the TSV 157*a* of the twin contact type and the embedded type between two layers, the TSV 157*b* of the twin contact type and the embedded type between three layers, and the embedded pad structure for the first substrate 110A (i.e., the pad 151 provided in the multi-layered wiring layer 105 of the first substrate 110A and the pad opening 153 exposing the pad 151).

The TSV 157*a* is formed from the back surface side of the first substrate 110A toward the second substrate 110B, and is so provided as to electrically couple the respective signal lines provided in the first substrate 110A and the second substrate 110B to each other and the respective power supply lines provided in the rust substrate 110A and the second substrate 110B to each other. In the configuration illustrated in FIG. 8A, the predetermined wiring line of the first metal wiring layer in the multi-layered wiring layer 105 of the first substrate 110A and the predetermined wiring line of the second metal wiring layer in the multi-layered wiring layer 125 of the second substrate 110B are electrically coupled to each other by the TSV 157*a*. Further, the TSV 157*b* is formed from the back surface side of the third substrate 110C toward the first substrate 110A, and is so provided as to electrically couple the respective signal lines provided in the first substrate 110A and the third substrate 110C to each other and the respective power supply lines included in the first substrate 110A and the third substrate 110C to each other. In the configuration illustrated in FIG. 8A, the predetermined wiring line of the second metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*.

Figure 8A:
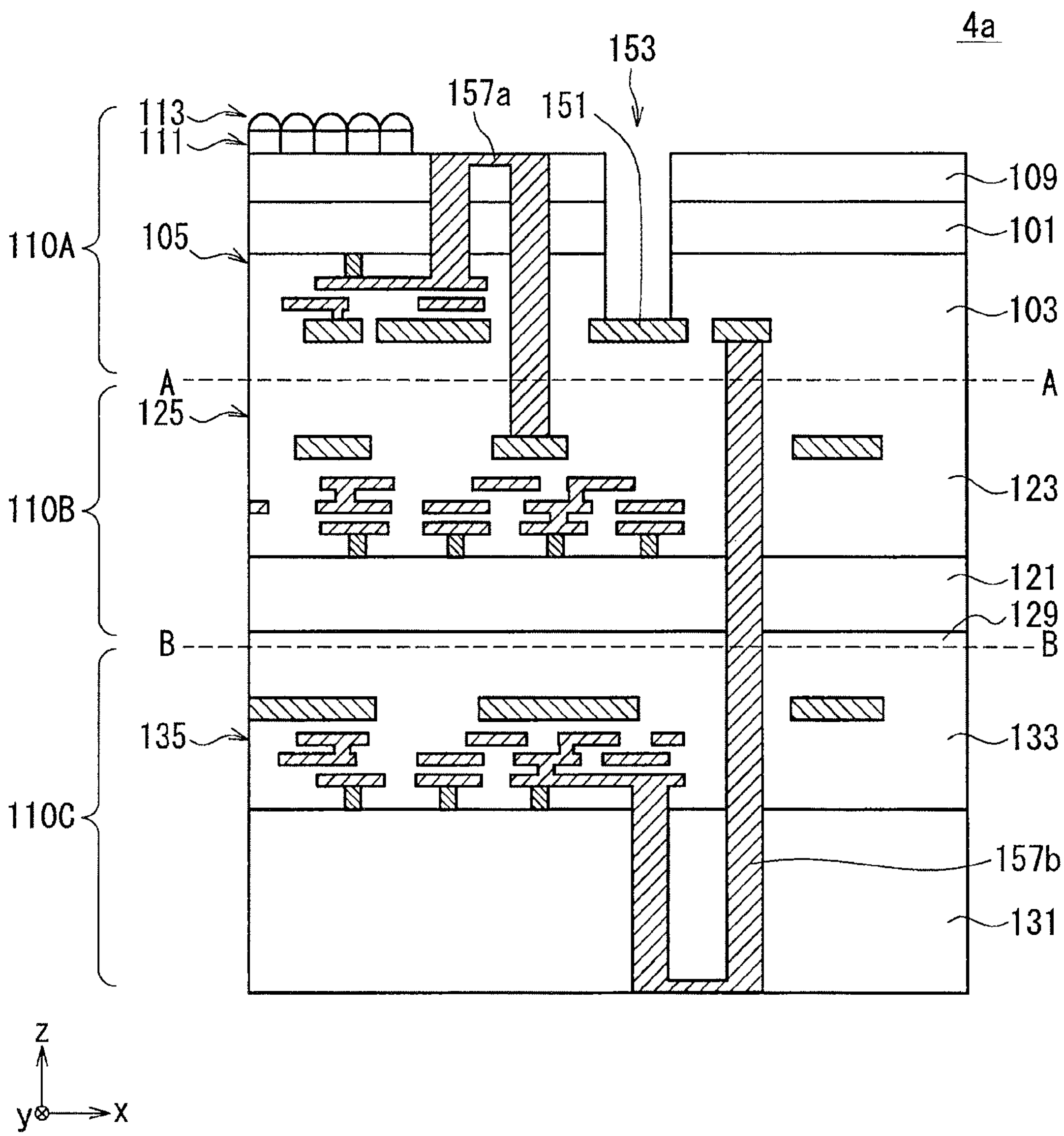
FIG. 8A is a vertical cross-sectional view of a schematic configuration of a solid-state imaging device according to a third configuration example of the present embodiment.
Figure 8B:
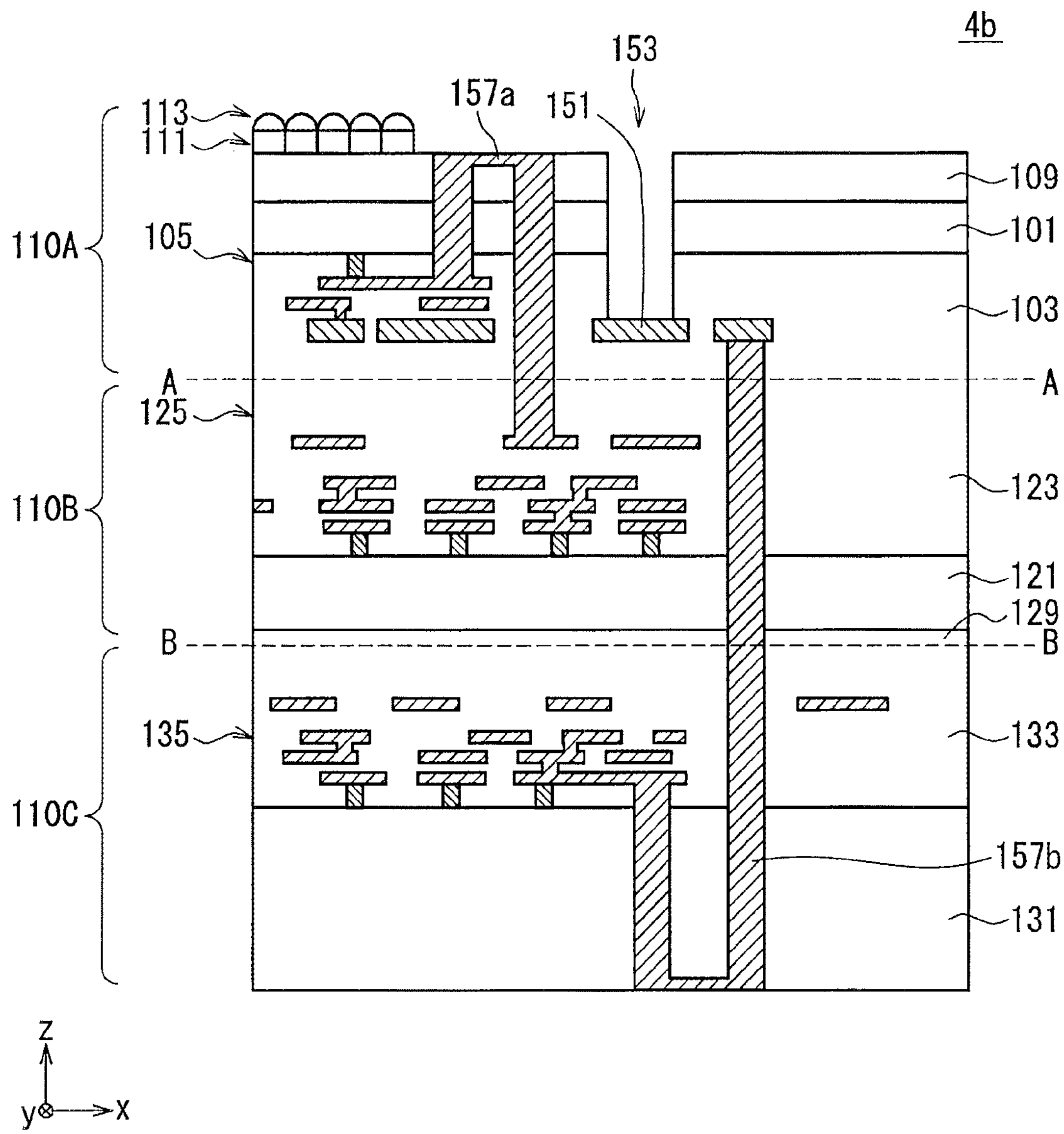
FIG. 8B is a vertical cross-sectional view of a schematic configuration of the solid-state imaging device according to the third configuration example of the present embodiment.

A solid-state imaging device 4*b* illustrated in FIG. 8B corresponds to the solid-state imaging device 4*a* illustrated in FIG. $A in which the types of the wiring lines electrically coupled by the TSV 157*a* are changed. Specifically, in the configuration illustrated in FIG. 8B, the predetermined wiring line of the first metal wiring layer in the multi-layered wiring layer 105 of the first substrate 110A and the predetermined wiring line of the first metal wiring layer in the multi-layered wiring layer 125 of the second substrate 110B are electrically coupled to each other by the TSV 157*a*.

A solid-state imaging device 4*c* illustrated in FIG. MC includes, as coupling structures, the TSV 157*a* of the twin contact type and the embedded type between two layers, the TSV 157*b* of the twin contact type and the embedded type between three layers, the embedded pad structure for the second substrate 110B (i.e., the pad 151 provided in the multi-layered wiring layer 125 of the second substrate 110B and the pad opening 153*a* exposing the pad 151), and the embedded pad structure for the third substrate 110C (i.e., the pad 151 provided in the multi-layered wiring layer 135 of the third substrate 110C and the pad opening 153*b* exposing the pad 151).

The TSV 157*a* is formed from the back surface side of the first substrate 110A toward the second substrate 110, and is so provided as to electrically couple the respective signal lines provided in the first substrate 110A and the second substrate 110B to each other and the respective power supply lines provided in the first substrate 110A and the second substrate 110B to each other. In the configuration illustrated in FIG. 8C, the predetermined wiring line of the first metal wiring layer in the multi-layered wiring layer 105 of the first substrate 110A and the predetermined wiring line of the second metal wiring layer in the multi-layered wiring layer 125 of the second substrate 110B are electrically coupled to each other by the TSV 157*a*. The TSV 157*b* is formed from the back surface side of the third substrate 110C toward the first substrate 110A, and is so provided as to electrically couple the respective signal lines provided in the first substrate 110A and the second substrate 110B to each other and the respective power supply lines provided in the first substrate 110A and the second substrate 110B to each other. In the configuration illustrated in FIG. 8C, the predetermined wiring line of the first metal wiring layer in the multi-layered wiring layer 105 of the first substrate 110A and the predetermined wiring line of the first metal wiring layer in the multi-layered wiring layer 125 of the second substrate 110B are electrically coupled to each other by the TSV 157*b*. In addition, the respective signal lines provided in the second substrate 110B and the third substrate 110C may be electrically coupled to each other and the respective power supply lines provided in the second substrate 110B and the third substrate 110C may be electrically coupled to each other by the two embedded pad structures.

Figure 8C:
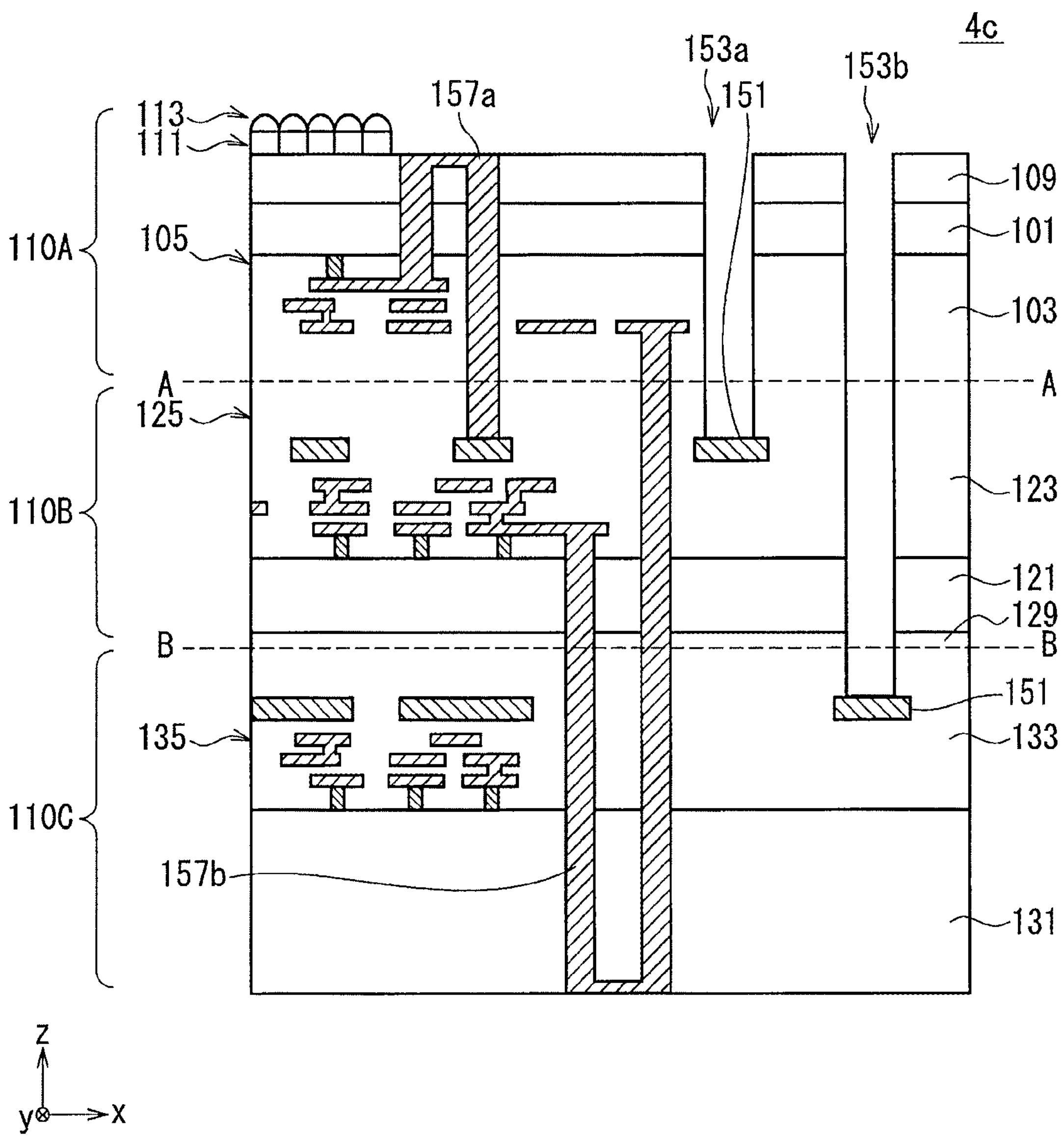
FIG. 8C is a vertical cross-sectional view of a schematic configuration of the solid-state imaging device according to the third configuration example of the present embodiment.
Figure 8D:
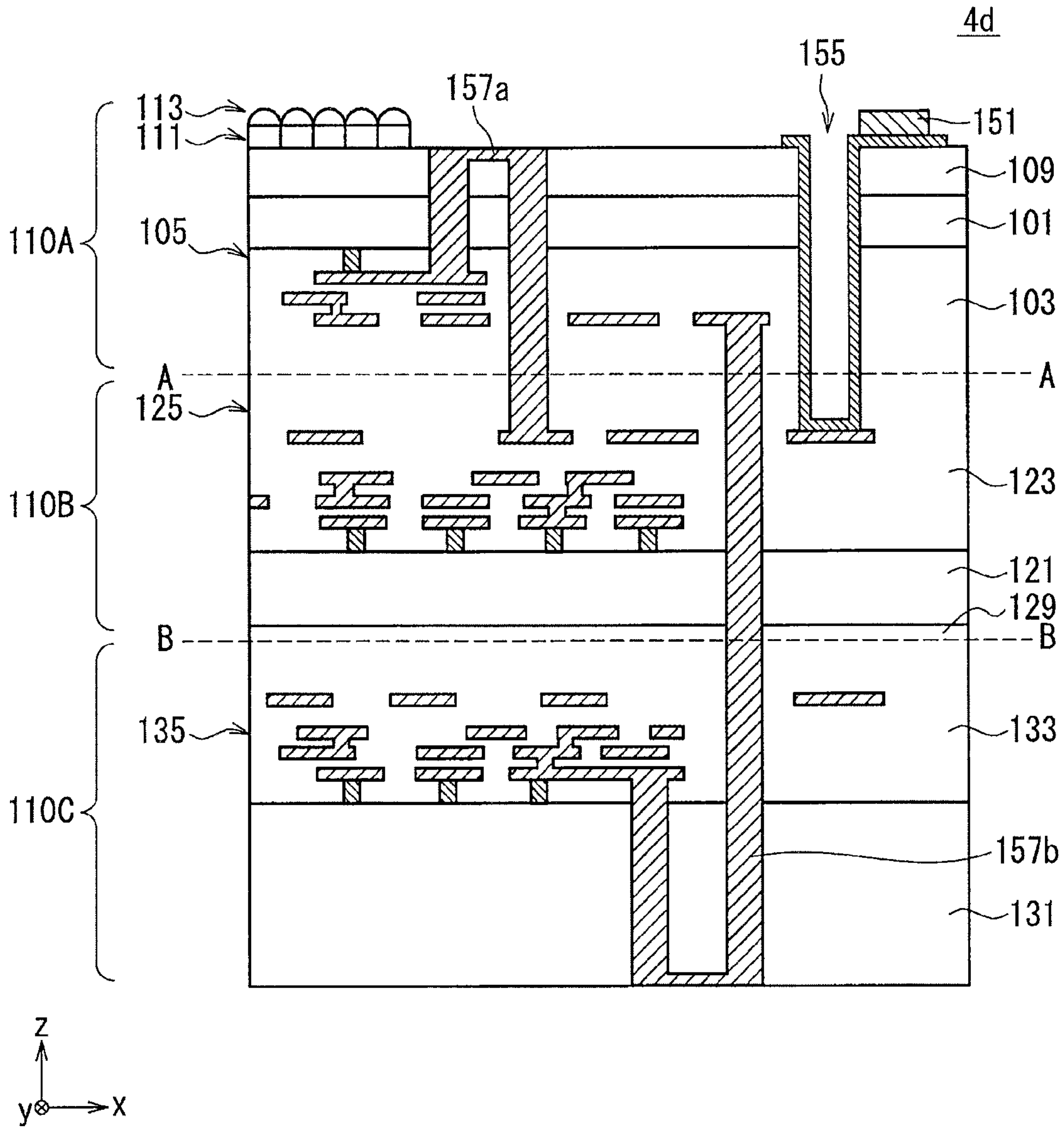
FIG. 8D is a vertical cross-sectional view of a schematic configuration of the solid-state imaging device according to the third configuration example of the present embodiment.

A solid-state imaging device 4*d* illustrated in FIG. 8D corresponds to the solid-state imaging device 4*b* illustrated in FIG. 8B in which the embedded pad structure is changed and the types of the wiring lines electrically coupled by the TSV 157*b* are changed. Specifically, in the configuration illustrated in FIG. 8D, the non-embedded type lead-out pad structure for the second substrate 110B (i.e., the lead line opening 155 for the predetermined wiring line in the multi-layered wiring layer 125 of the second substrate 110B and the pad 151 on the surface on the back surface side of the first substrate 110A) is provided instead of the embedded pad structure. Further, in the configuration illustrated in FIG. 8D, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*.

Figure 8E:
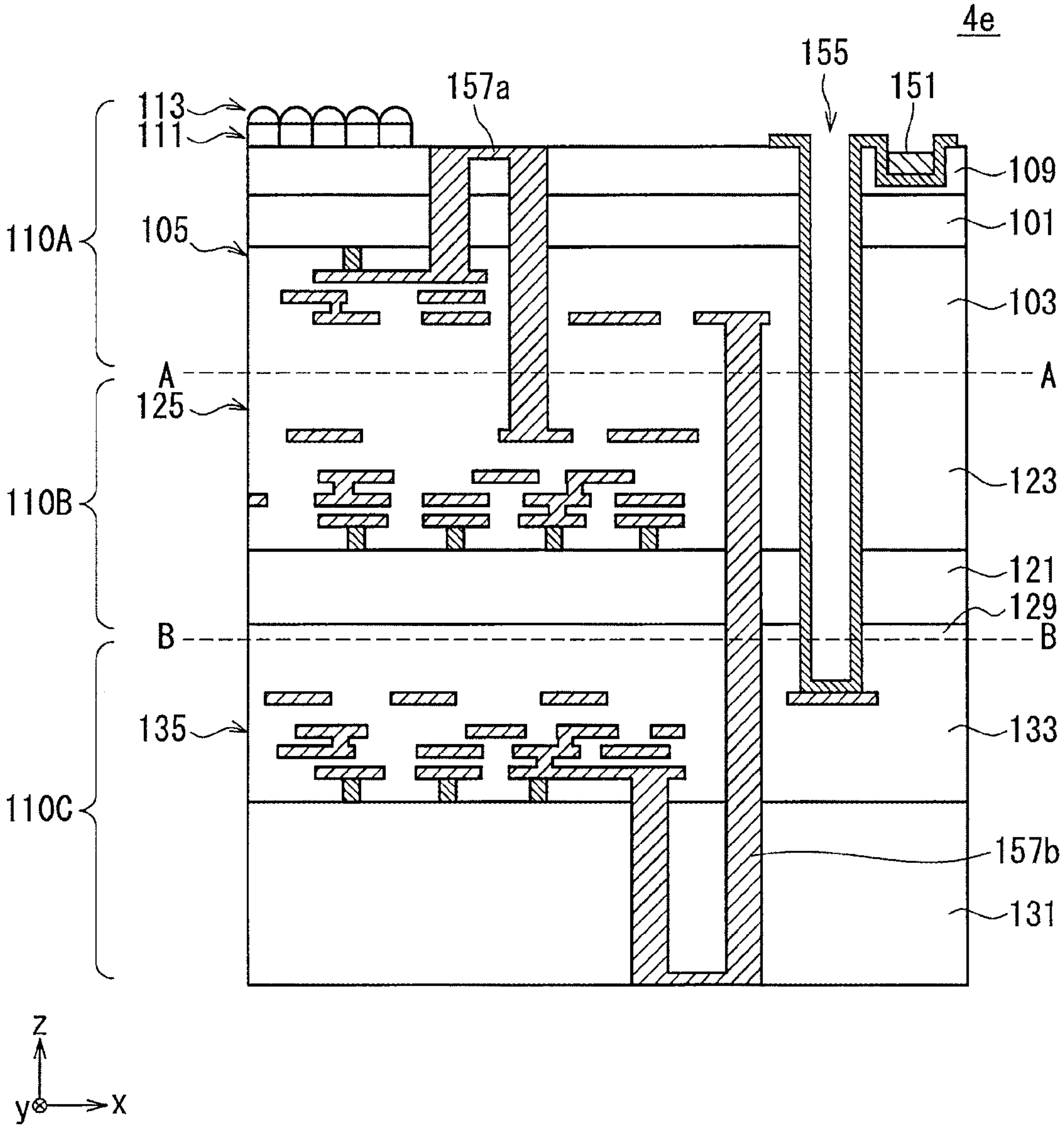
FIG. 8E is a vertical cross-sectional view of a schematic configuration of the solid-state imaging device according to the third configuration example of the present embodiment.

A solid-state imaging device 4*e* illustrated in FIG. 8E corresponds to the solid-state imaging device 4*d* illustrated in FIG. 8D in which the configuration of the lead-out pad structure is changed. Specifically, in the configuration illustrated in FIG. 8E, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 109 on the surface on the back surface side of the first substrate 110A) is provided instead of the non-embedded type lead-out pad structure for the second substrate 110B.

Figure 8F:
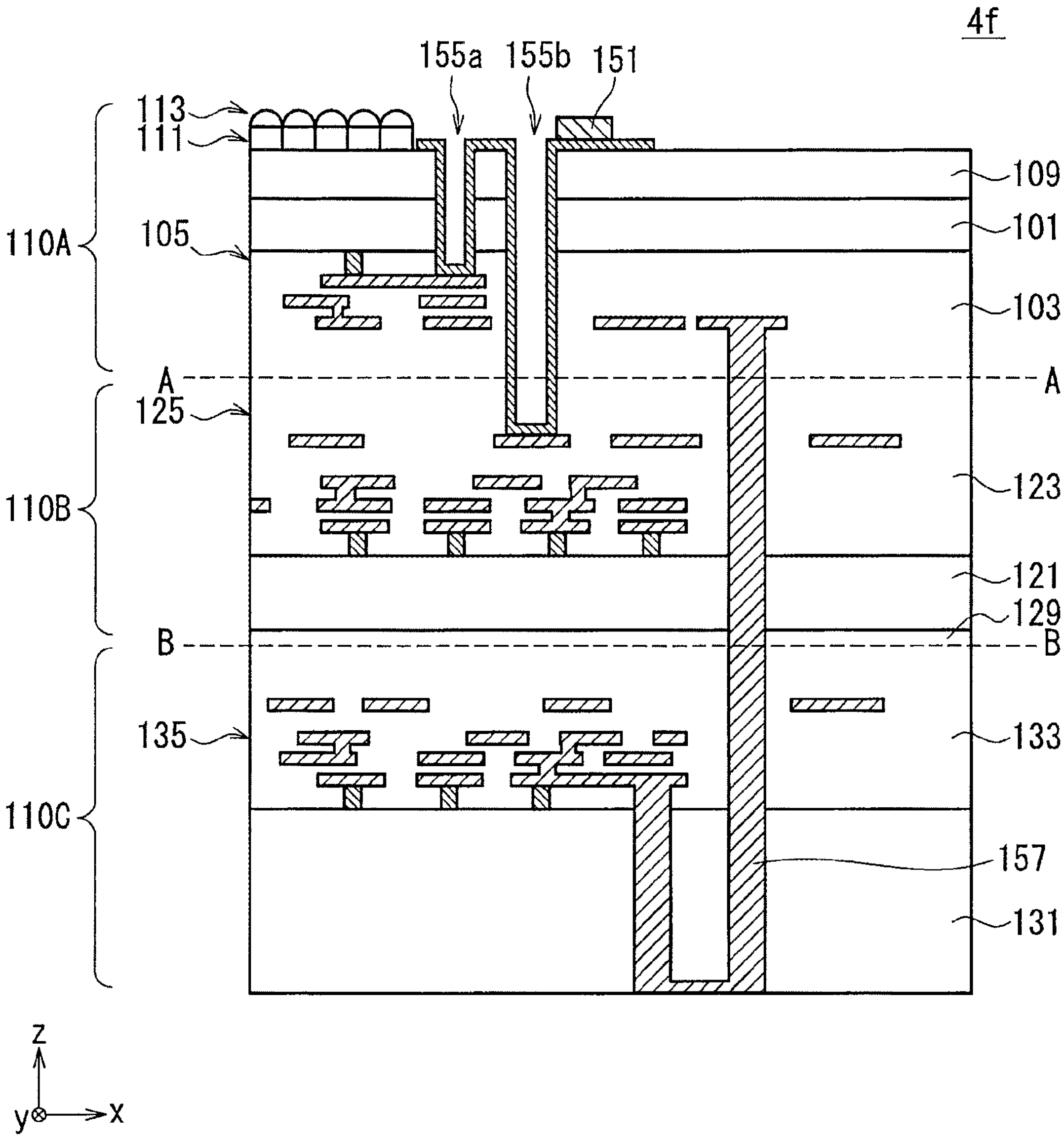
FIG. 8F is a vertical cross-sectional view of a schematic configuration of the solid-state imaging device according to the third configuration example of the present embodiment.

A solid-state imaging device 4*f* illustrated in FIG. 8F corresponds to the solid-state imaging device 4*e* illustrated in FIG. 8E in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 11A) is provided instead of the TSV 157*a* and the embedded type lead-out pad structure by changing the embedded type TSV 157*a* to the non-embedded type TSV.

Figure 8G:
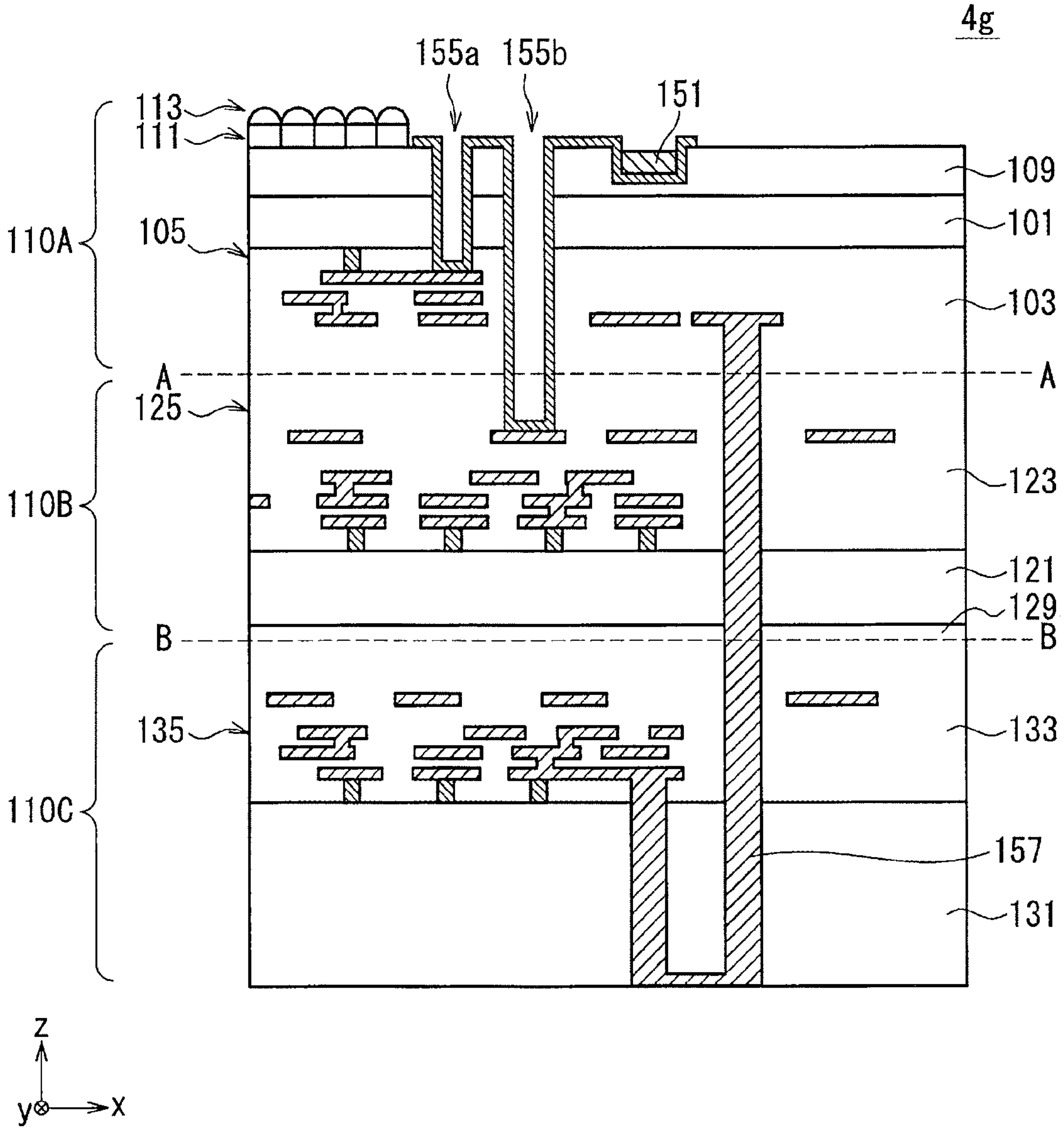
FIG. 8G is a vertical cross-sectional view of a schematic configuration of the solid-state imaging device according to the third configuration example of the present embodiment.

A solid-state imaging device 4*g* illustrated in FIG. 8G corresponds to the solid-state imaging device 4*f* illustrated in FIG. 8F in which the non-embedded type lead-out pad structure of the TSV dual-use lead line openings 155*a* and 155*b* is changed to the embedded type lead-out pad structure.

Note that the types of the wiring lines coupled by the TSVs 157 between two layers and three layers of the twin contact type are not limited to the respective configurations illustrated in FIGS. 8A to 8G These TSVs 157 may be each coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In the configuration illustrated in FIG. 8C, the pad 151 is provided on each of the second substrate 110B and the third substrate 110C in the illustrated example. However, the present embodiment is not limited to such an example. In this configuration, the respective signal lines provided in the first substrate 110A and the second substrate 110B are electrically coupled to each other and the respective power supply lines provided in the first substrate 110A and the second substrate 110B are electrically coupled to each other by the TSVs 157*a* and 157*b*. Accordingly, the second substrate 110B and the third substrate 110C or the first substrate 110A and the third substrate 110C each provided with the signal lines as well as the power supply lines not electrically coupled to each other by the TSV 157*a* or the TSV 157*b* may be each provided with the pad 151 for electrically coupling the respective signal lines to each other and the respective power supply lines to each other. That is, in the respective configurations illustrated in FIG. 8C, the pad 151 may be provided in the first substrate 110A and the third substrate 110C instead of the illustrated configuration example of the pad 151.

In addition, in each of the configurations illustrated in FIG. 8A, FIG. 8B. FIG. 8D. and FIG. 8E, the substrate on which the pad 151 is provided is not limited to the illustrated example. In each of these configurations, the respective signal lines provided in the first substrate 110A and the second substrate 110B are electrically coupled to each other and the respective power supply lines provided in the first substrate 110A and the second substrate 110B are electrically coupled to each other by one TSV 157*a*. The respective signal lines provided in the first substrate 110A and the third substrate 110C are electrically coupled to each other and the respective power supply lines provided in the first substrate 110A and the third substrate 110C are electrically coupled to each other by the other TSV 157*b*. Accordingly, the pad 151 as the coupling structure may not be provided. Thus, for example, in each of the configurations illustrated in FIG. 8A, FIG. 8B. FIG. 8D, and FIG. 8E, the pad 151 may be provided on any of the substrates 110A. 11B, and 110C to derive a desired signal.

In a case where the lead-out pad structure is provided, the lead-out pad structure may be the non-embedded type or the embedded type. For example, in the configuration illustrated in FIG. 8D, the embedded type lead-out pad structure may be provided instead of the non-embedded type lead-out pad structure. Further, for example, in the configuration illustrated in FIG. 8E, the non-embedded type lead-out pad structure may be provided instead of the embedded type lead-out pad structure.

In each of the configurations illustrated in FIGS. 8A to 8G, the TSV 157 of the twin contact type and the embedded type between three layers is formed from the back surface side of the third substrate 110C toward the first substrate 110A, but the present embodiment is not limited to such an example. The TSV 157 may be formed from the back surface side of the first substrate 110A toward the third substrate 110C.

In addition, it is sufficient for the twin contact type TSV 157 between three layers to electrically couple the respective signal lines as well as the respective power supply lines provided in two of the first substrate 110A, the second substrate 110B, and the third substrate 110C to each other in accordance with the direction in which the TSV 157 is formed. The substrates provided with the respective signal lines as well as the respective power supply lines to be electrically coupled to each other by the TSV 157 may be optionally changed.

4-4. Fourth Configuration Example

FIGS. 9A to 9K are each a vertical cross-sectional view of a schematic configuration of a solid-state imaging device according to a fourth configuration example of the present embodiment. The solid-state imaging device according to the present embodiment may have each of the configurations illustrated in FIGS. 9A to 9K.

Figure 9A:
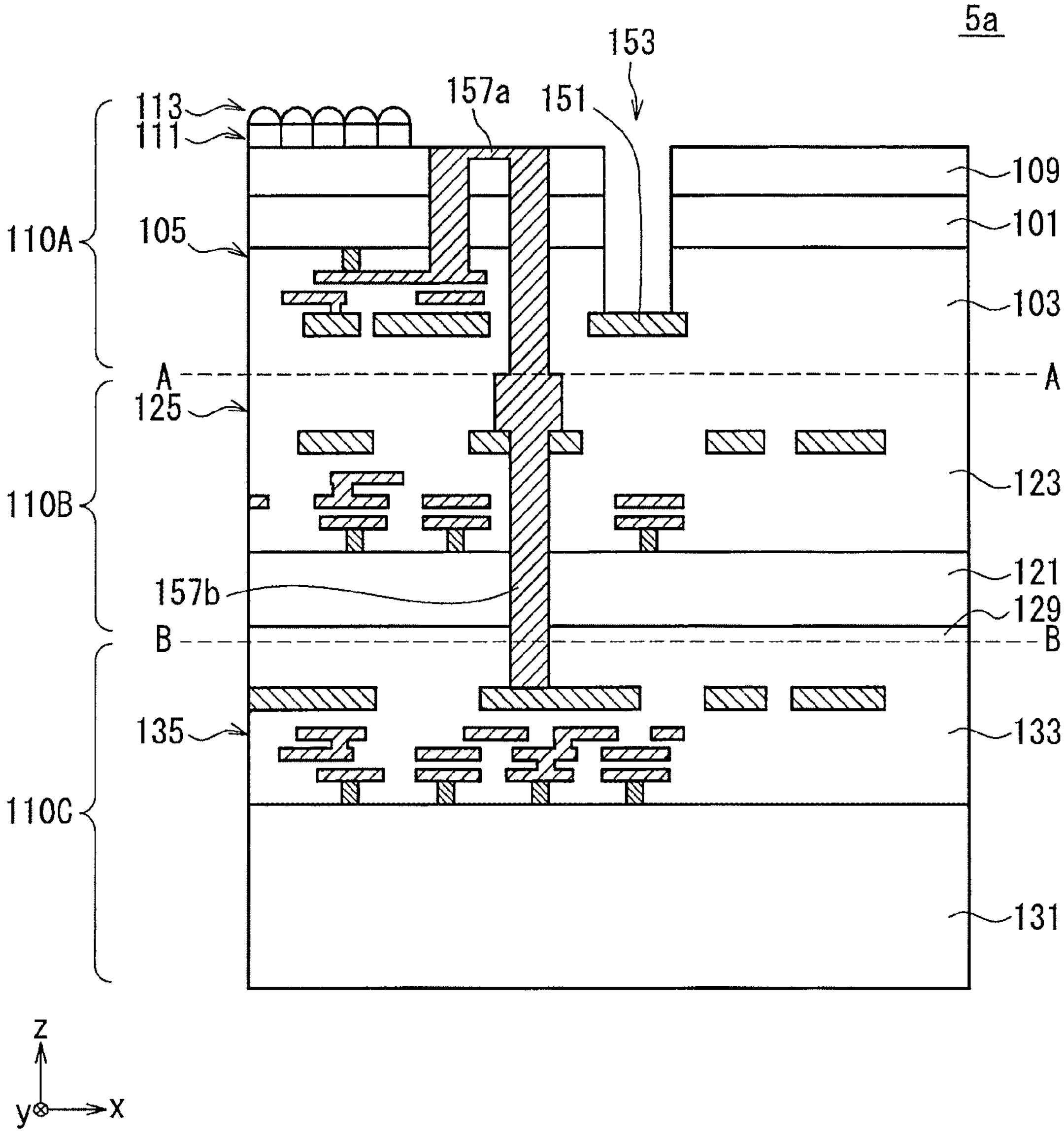
FIG. 9A is a vertical cross-sectional view of a schematic configuration of a solid-state imaging device according to a fourth configuration example of the present embodiment.

A solid-state imaging device 5*a* illustrated in FIG. 9A includes, as coupling structures, the TSV 157*a* of the twin contact type and the embedded type between two layers, the TSV 157*b* of the shared contact type and the embedded type between two layers, and the embedded pad structure for the first substrate 110A (i.e., the pad 151 provided in the multi-layered wiring layer 105 of the first substrate 110A and the pad opening 153 exposing the pad 151).

The TSV 157*b* is formed from the front surface side of the second substrate 110B toward the third substrate 110C, and is so provided as to electrically couple the respective signal lines provided in the second substrate 110B and the third substrate IC to each other and the respective power supply lines provided in the second substrate 110B and the third substrate 110C to each other. In the configuration illustrated in FIG. 9A, the predetermined wiring line of the second metal wiring layer in the multi-layered wiring layer 125 of the second substrate 110B and the predetermined wiring line of the second metal wiring layer in the multi-layered wiring layer 135 of the third substrate 110C are electrically coupled to each other by the TSV 157*b*.

The TSV 157*a* is formed from the back surface side of the first substrate 110A toward the second substrate 110B, and is so provided as to electrically couple the respective signal lines provided in the first substrate 110A and the second substrate 110B to each other and the respective power supply lines provided in the first substrate 110A and the second substrate 110B to each other. In the configuration illustrated in FIG. 9A, one via of the TSV 157*a* is in contact with the predetermined wiring line of the first metallic wiring layer in the multi-layered wiring layer 105 of the first substrate 110A, and the other via is in contact with the upper end of the TSV 157*b*. That is, the TSV 157*a* is so formed as to electrically couple the predetermined wiring line in the multi-layered wiring layer 105 of the first substrate 110A and the TSV 157*b* to each other. Further, the predetermined wiring line in the multi-layered wiring layer 105 of the first substrate 110A, the predetermined wiring lines in the multi-layered wiring layer 125 of the second substrate 110B electrically coupled by the TSV 157*b*, and the predetermined wiring line in the multi-layered wiring layer 135 of the third substrate 110C are electrically coupled together by the TSV 157*a*.

Figure 9B:
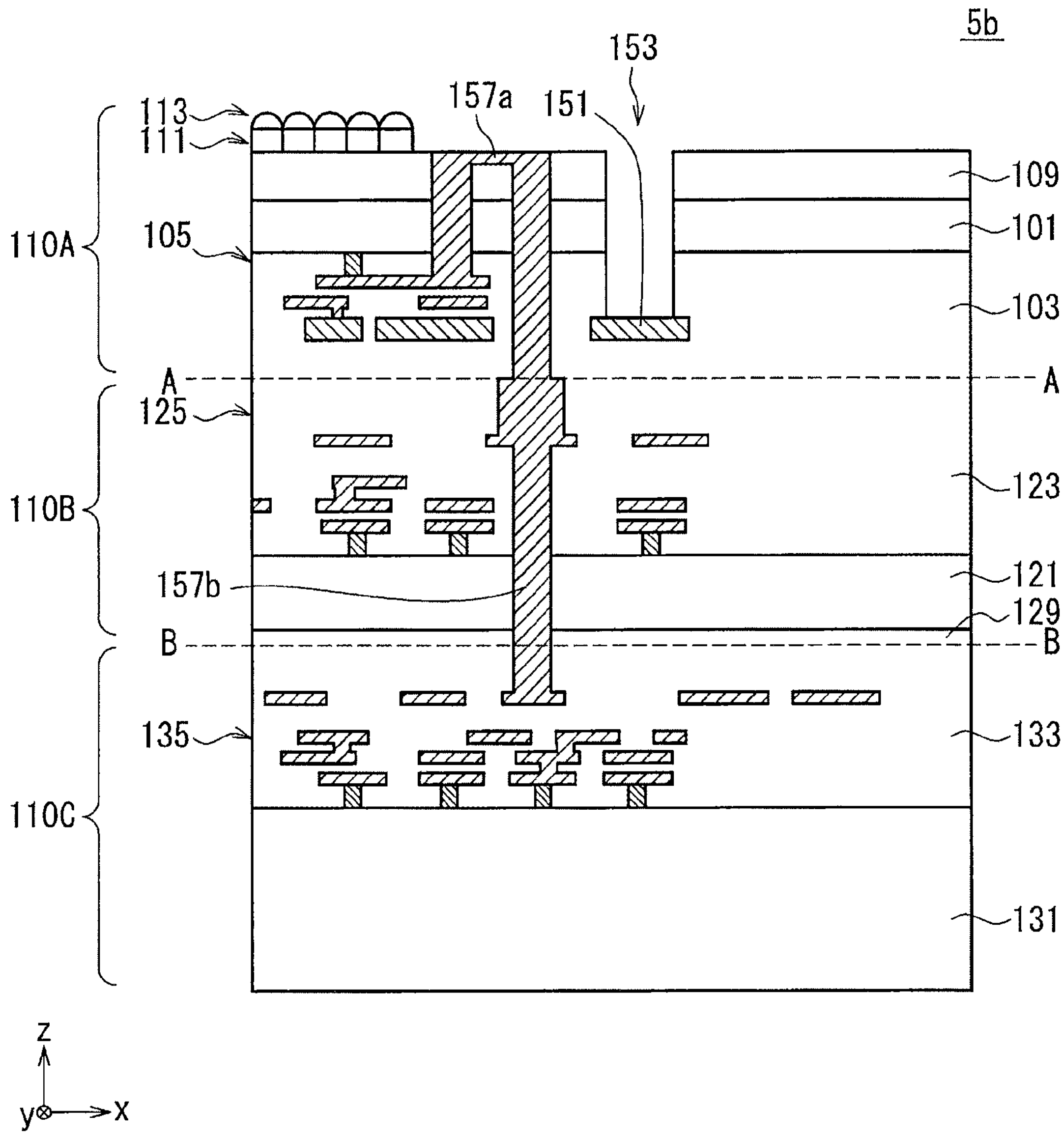
FIG. 9B is a vertical cross-sectional view of a schematic configuration of the solid-state imaging device according to the fourth configuration example of the present embodiment.

A solid-state imaging device 5*b* illustrated in FIG. 9B corresponds to the solid-state imaging device Sa illustrated in FIG. 9A in which the types of the wiring lines electrically coupled by the TSV 157*b* are changed. Specifically, in the configuration illustrated in FIG. 9B, the predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*.

Figure 9C:
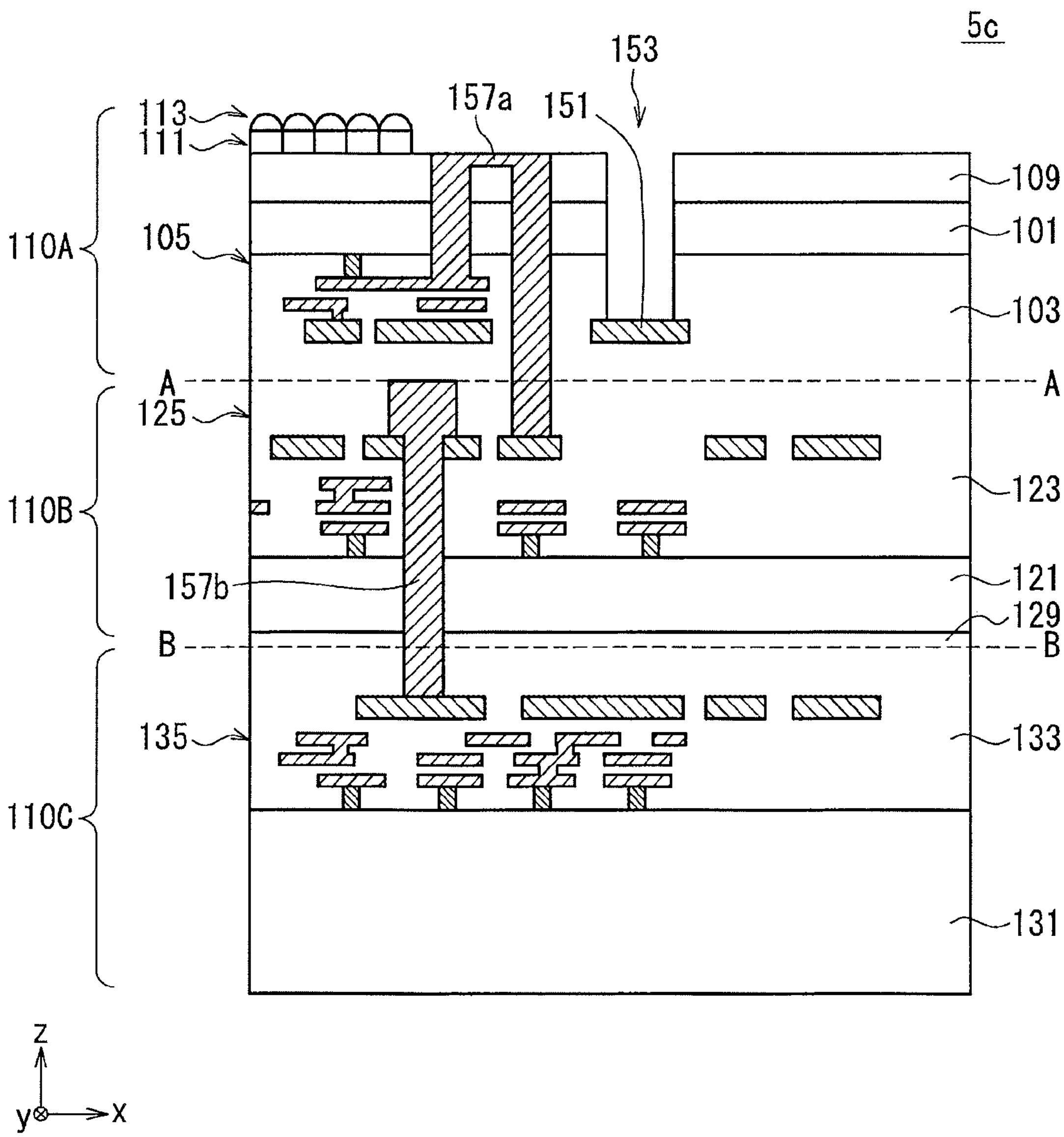
FIG. 9C is a vertical cross-sectional view of a schematic configuration of the solid-state imaging device according to the fourth configuration example of the present embodiment.

A solid-state imaging device 5*c* illustrated in FIG. 9C corresponds to the solid-state imaging device Sa illustrated in FIG. 9A in which the TSV 157*a* structure is changed. Specifically, in the configuration illustrated in FIG. 9A mentioned above, the TSV 157*a* is so provided as to electrically couple the predetermined wiring line in the multi-layered wiring layer 105 of the first substrate 110A and the TSV 157*b* to each other. However, in the configuration illustrated in 9C, the TSV 157*a* is so provided as to electrically couple the predetermined wiring line in the multi-layered wiring layer 105 of the first substrate 110A and the predetermined wiring line in the multi-layered wiring layer 125 of the second substrate 110B to each other. In the configuration illustrated in FIG. 9C, the predetermined wiring line of the first metal wiring layer in the multi-layered wiring layer 105 of the first substrate 110A and the predetermined wiring line of the second metal wiring layer in the multi-layered wiring layer 125 of the second substrate 110B are electrically coupled to each other by the TSV 157*a*.

Figure 9D:
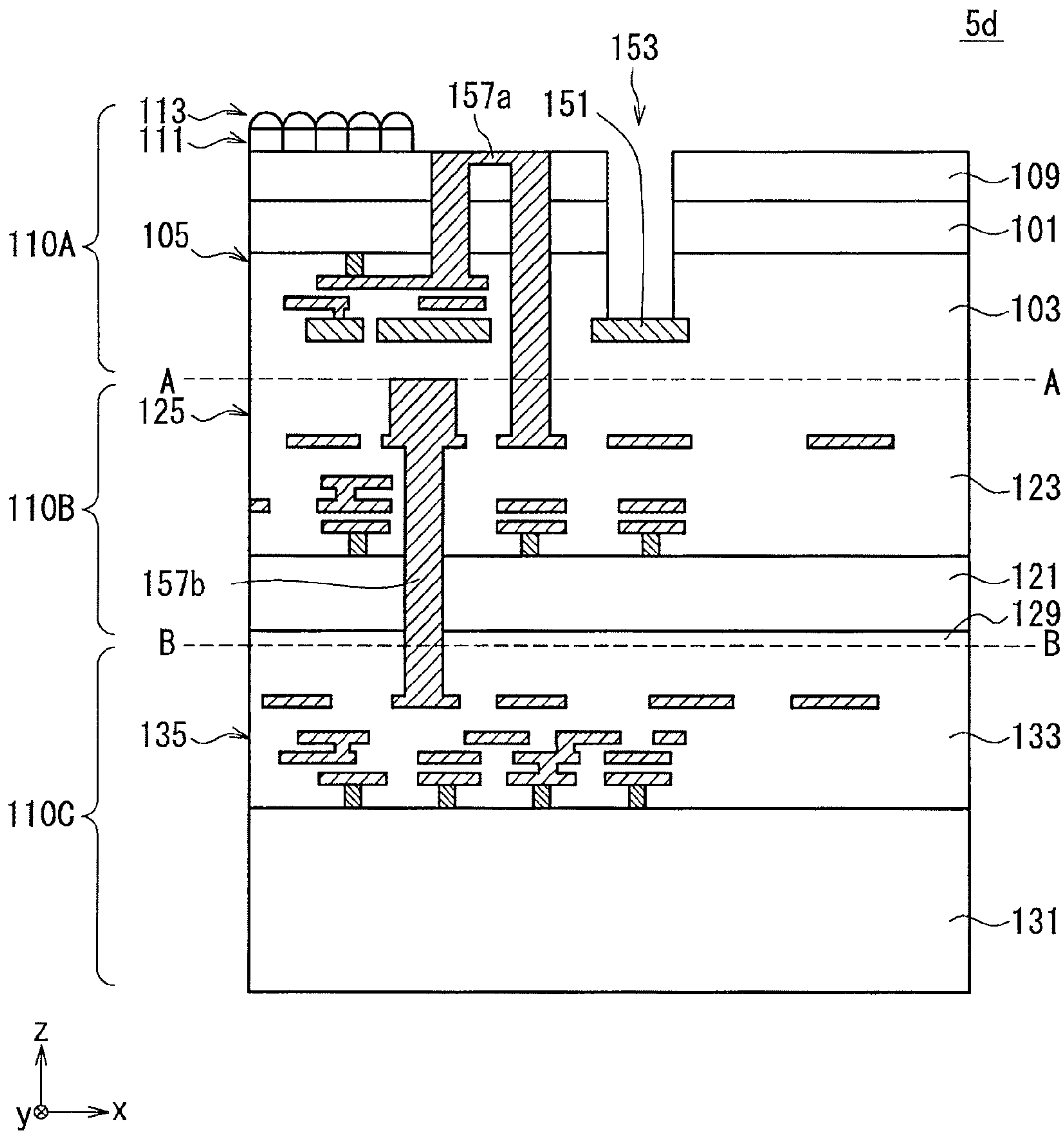
FIG. 9D is a vertical cross-sectional view of a schematic configuration of the solid-state imaging device according to the fourth configuration example of the present embodiment.

A solid-state imaging device 5*d* illustrated in FIG. 9D corresponds to the solid-state imaging device Sc illustrated in FIG. 9C in which the types of the wiring lines electrically coupled by the TSVs 157*a* and 157*b* are changed. Specifically, in the configuration illustrated in FIG. 9D, the predetermined wiring line of the first metal wiring layer in the multi-layered wiring layer 105 of the first substrate 110A and the predetermined wiring line of the first metal wiring layer in the multi-layered wiring layer 125 of the second substrate 110B are electrically coupled to each other by the TSV 157*a*. Further, the predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*.

Figure 9E:
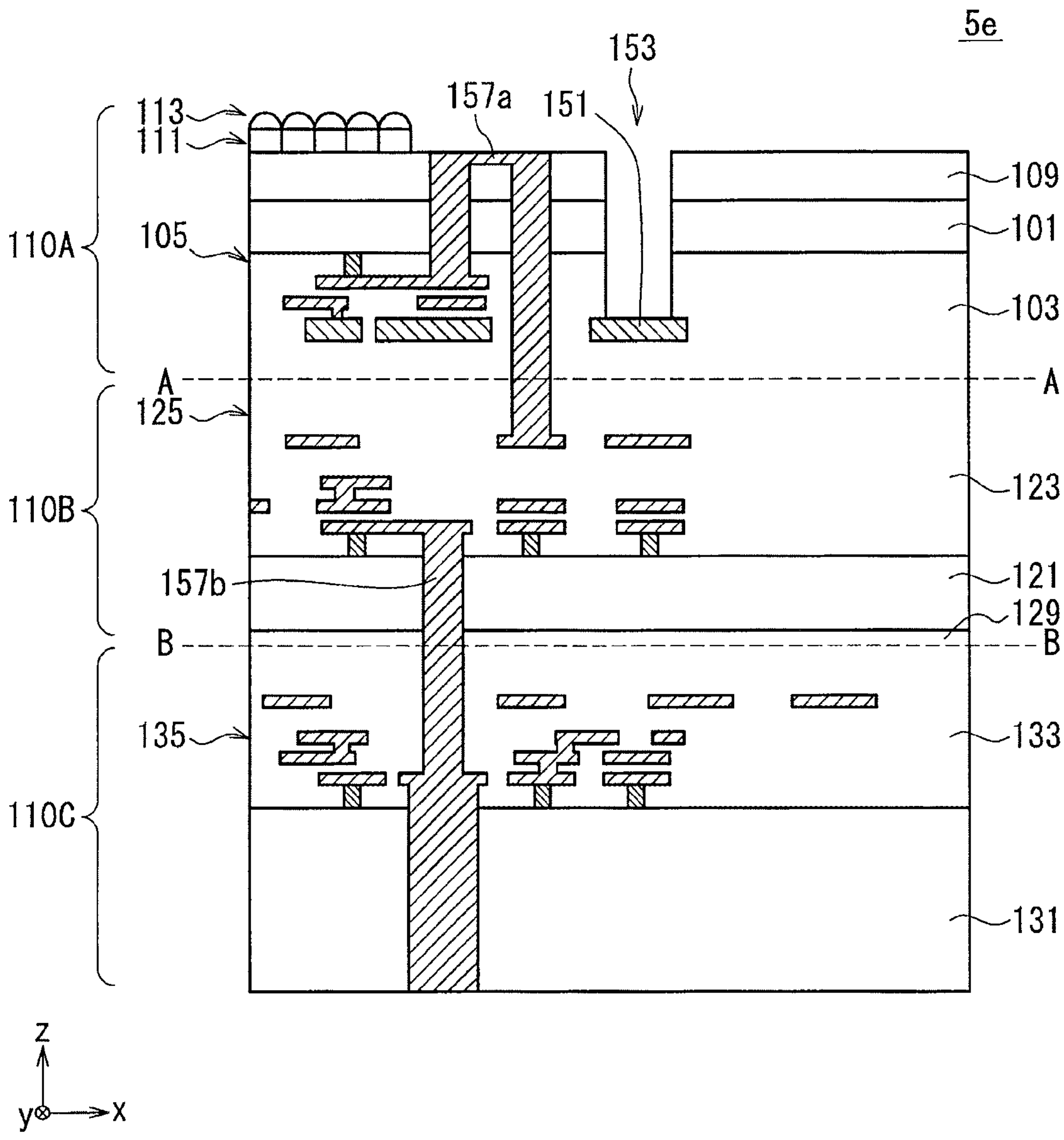
FIG. 9E is a vertical cross-sectional view of a schematic configuration of the solid-state imaging device according to the fourth configuration example of the present embodiment.

A solid-state imaging device Se illustrated in FIG. 9E corresponds to the solid-state imaging device 5*d* illustrated in FIG. 9D in which the TSV 157*b* structure is changed. Specifically, in the configuration illustrated in FIG. 9E, the TSV 157*b* is formed from the back surface side of the third substrate 110C toward the second substrate 110B, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 9E, the predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*.

Figure 9F:
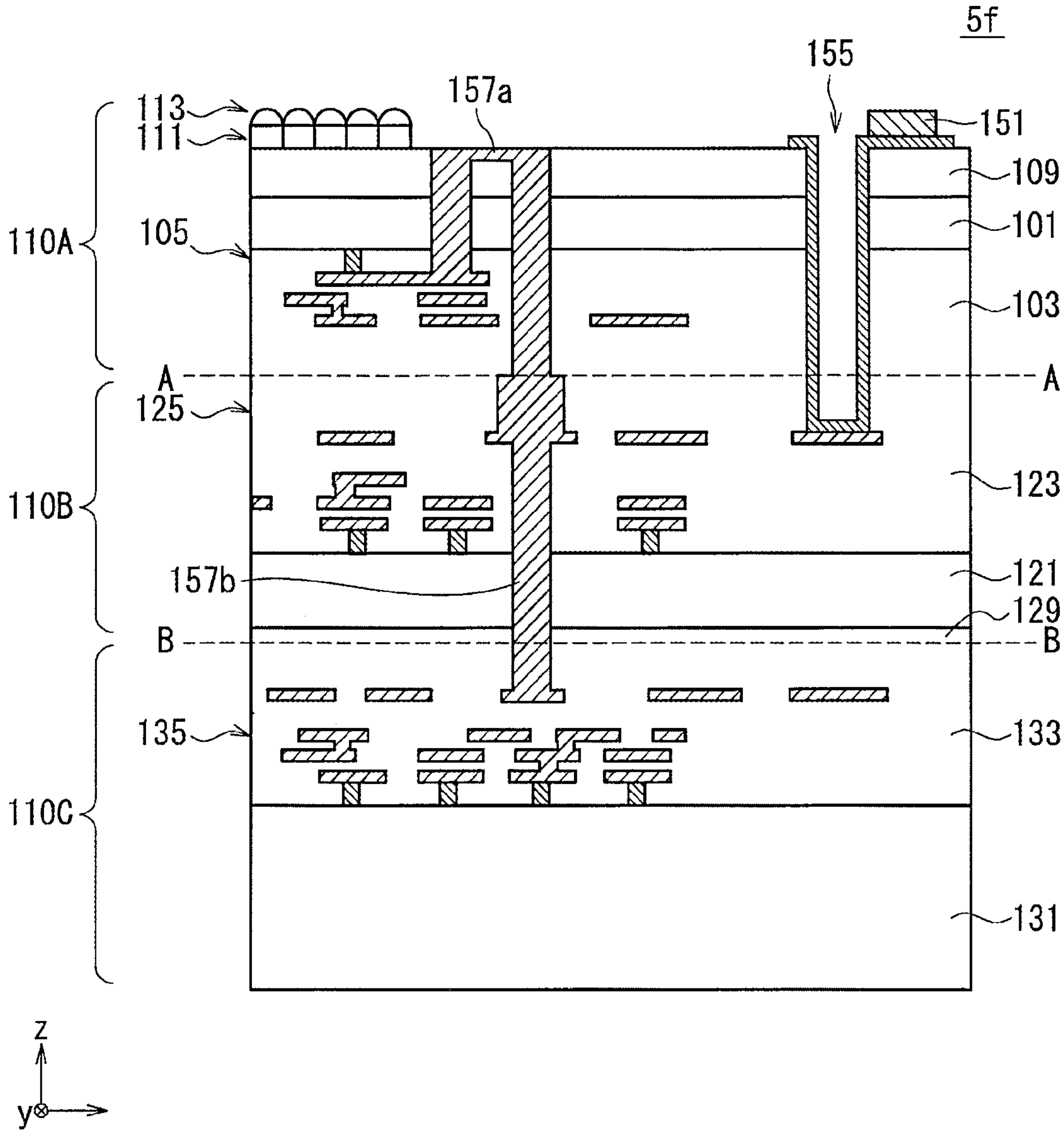
FIG. 9F is a vertical cross-sectional view of a schematic configuration of the solid-state imaging device according to the fourth configuration example of the present embodiment.

A solid-state imaging device 5*f* illustrated in FIG. 9F corresponds to the solid-state imaging device 5*b* illustrated in FIG. 9B in which the embedded pad structure is changed. Specifically, in the configuration illustrated in FIG. 9F, the non-embedded type lead-out pad structure for the second substrate 110B (i.e., the lead line opening 155 for the predetermined wiring line in the multi-layered wiring layer 125 of the second substrate 110B and the pad 151 on the surface on the back surface side of the first substrate 110A) is provided instead of the embedded pad structure.

Figure 9G:
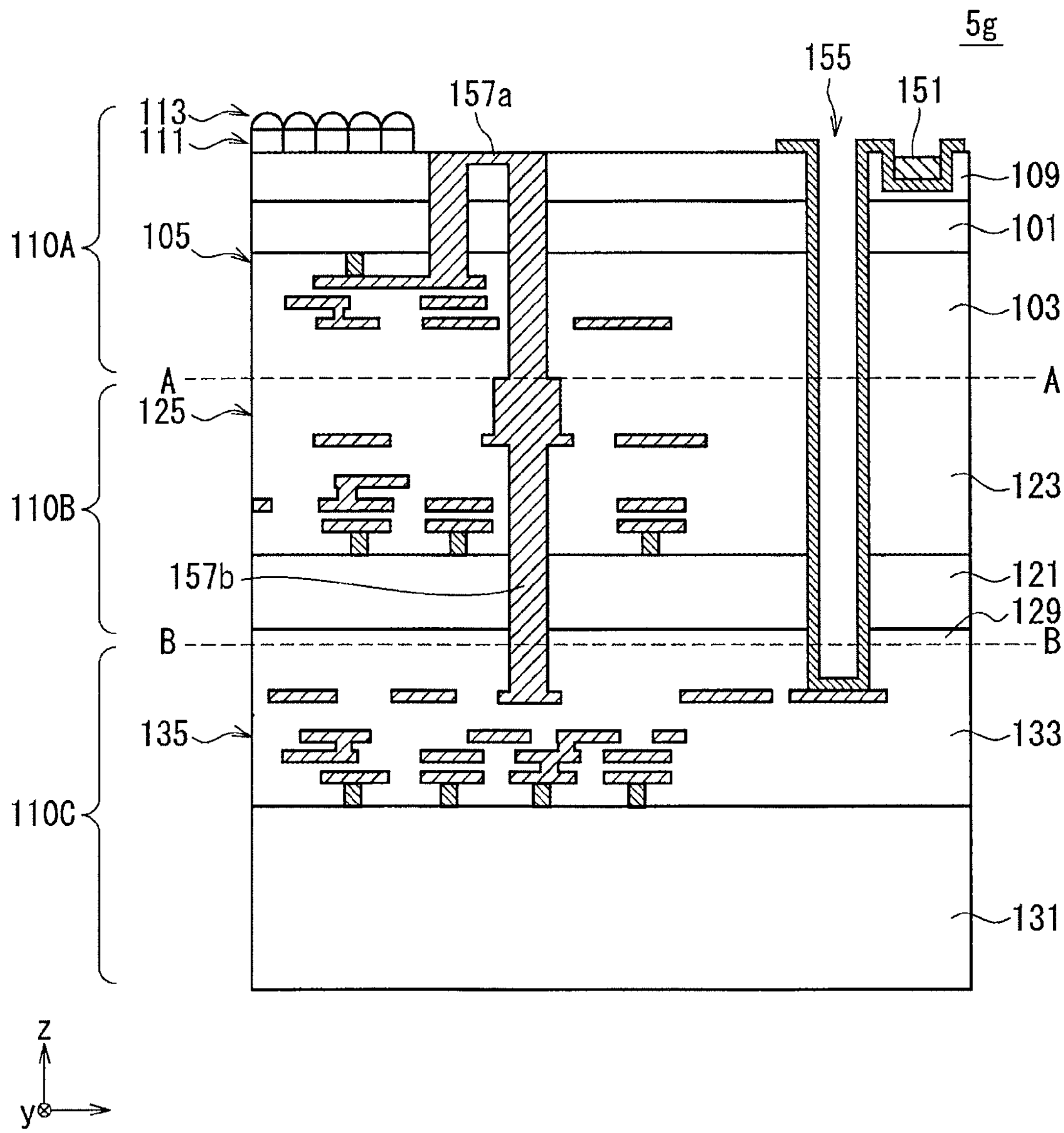
FIG. 9G is a vertical cross-sectional view of a schematic configuration of the solid-state imaging device according to the fourth configuration example of the present embodiment.

A solid-state imaging device Sg illustrated in FIG. 9G corresponds to the solid-state imaging device 5*f* illustrated in FIG. 9F in which the configuration of the lead-out pad structure is changed. Specifically, in the configuration illustrated in FIG. 9G, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 109 on the surface on the back surface side of the first substrate 110A) is provided instead of the non-embedded type lead-out pad structure for the second substrate 110B.

Figure 9H:
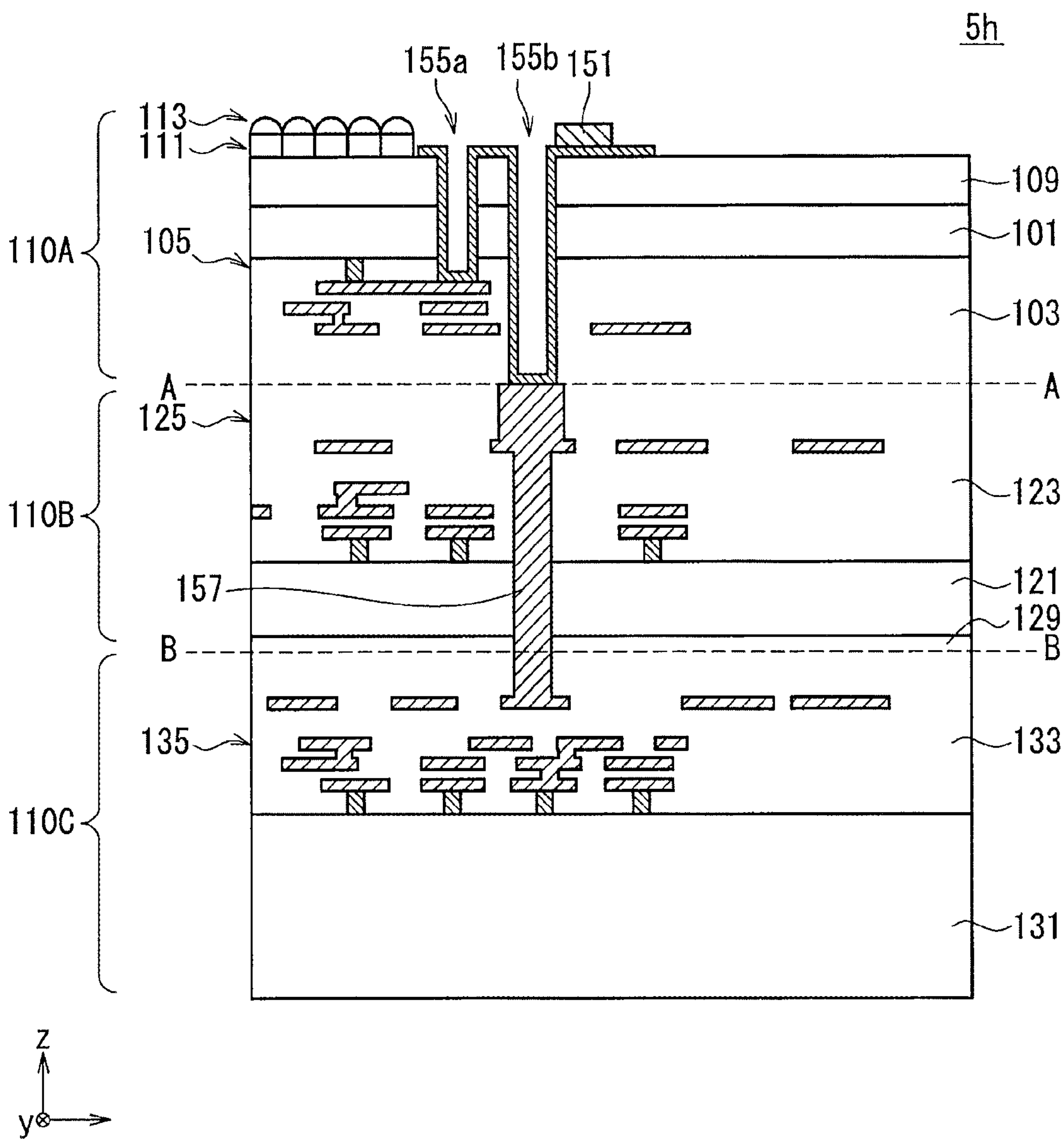
FIG. 9H is a vertical cross-sectional view of a schematic configuration of the solid-state imaging device according to the fourth configuration example of the present embodiment.
Figure 9I:
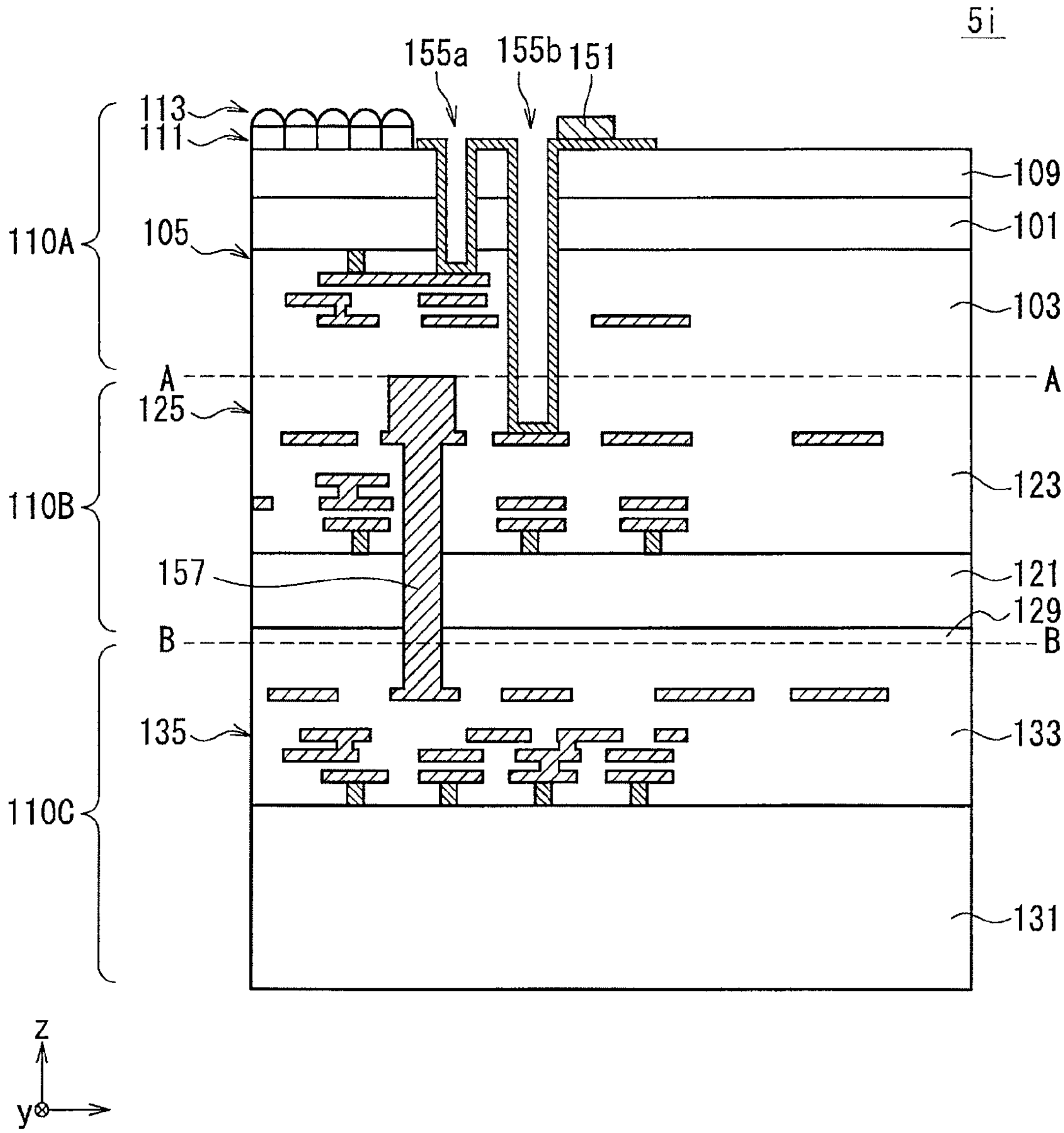
FIG. 9I is a vertical cross-sectional view of a schematic configuration of the solid-state imaging device according to the fourth configuration example of the present embodiment.

A solid-state imaging device 5*h* illustrated in FIG. 9H corresponds to the solid-state imaging device 5*b* illustrated in FIG. 9B in which the non-embedded type lead-out pad structure using the TSV dual-use lead line openings 155*a* and 155*b*(i.e., the TSV dual-use lead line openings 155*a* and 155*b* and the pad 151 on the surface on the back surface side of the first substrate 110A) is provided instead of the TSV 157*a* and the embedded pad structure by changing the embedded type TSV 157*a* to the non-embedded type TSV A solid-state imaging device 5*i* illustrated in FIG. 9I corresponds to the solid-state imaging device 5*d* illustrated in FIG. 9D in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded pad structure by changing the embedded type TSV 157*a* to the non-embedded type TSV.

Figure 9J:
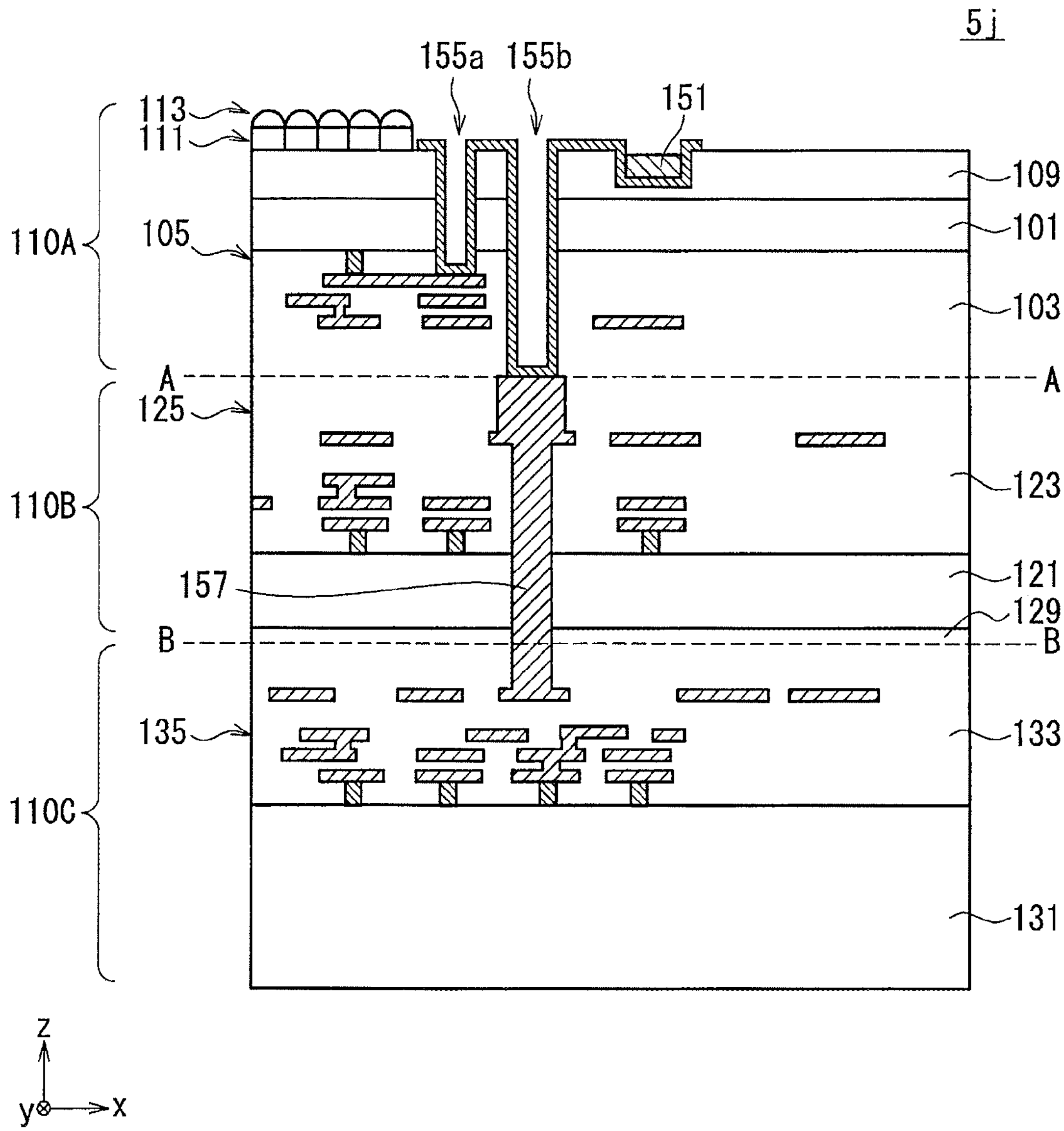
FIG. 9J is a vertical cross-sectional view of a schematic configuration of the solid-state imaging device according to the fourth configuration example of the present embodiment.

A solid-state imaging device 5*j* illustrated in FIG. 9J corresponds to the solid-state imaging device 5*h* illustrated in FIG. 9H in which the non-embedded type lead-out pad structure of the TSV dual-use lead line openings 155*a* and 155*b* is changed to the embedded type lead-out pad structure.

Figure 9K:
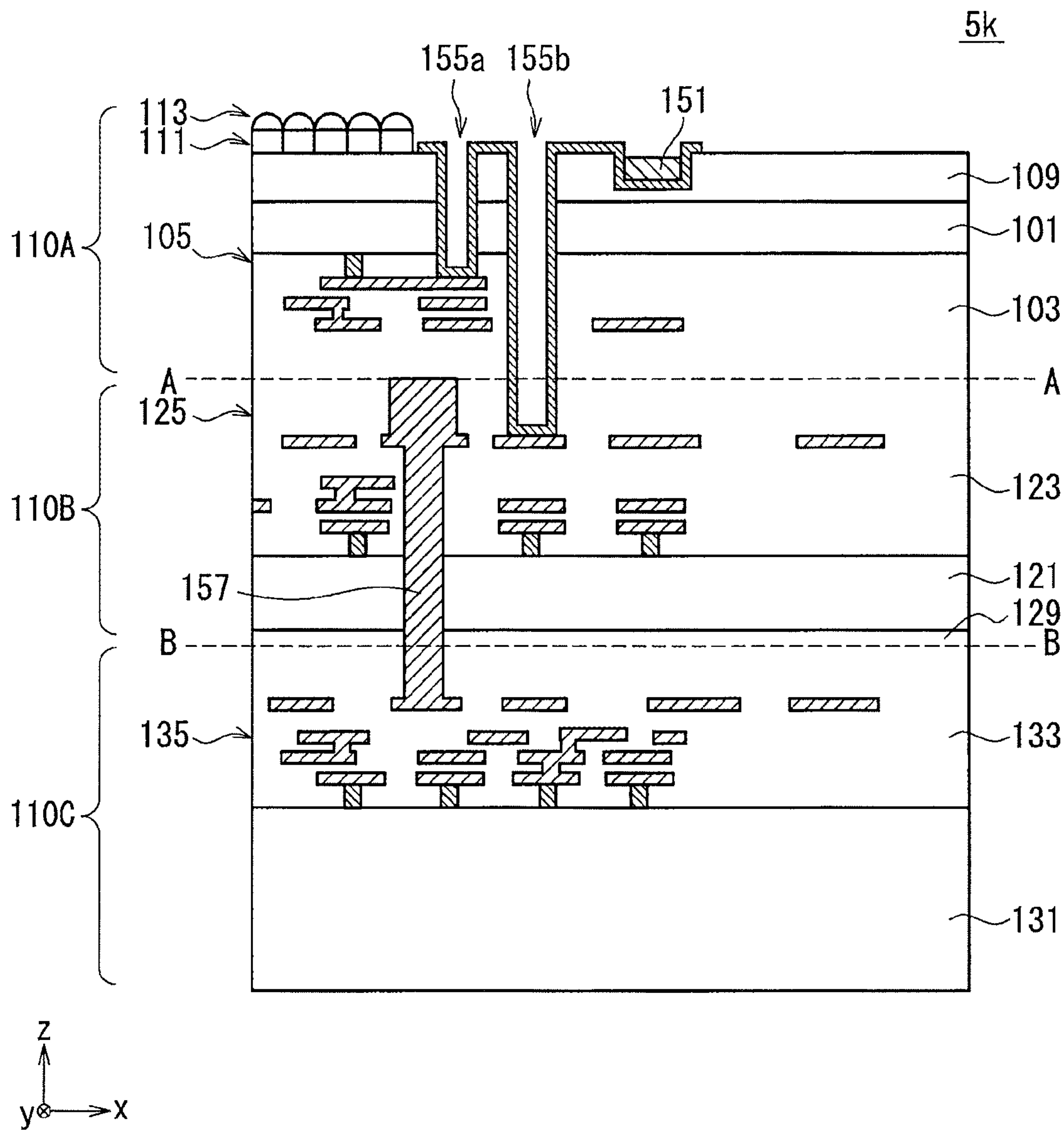
FIG. 9K is a vertical cross-sectional view of a schematic configuration of the solid-state imaging device according to the fourth configuration example of the present embodiment.

A solid-state imaging device 5*k* illustrated in FIG. 9K corresponds to the solid-state imaging device 5*i* illustrated in FIG. 9I in which the non-embedded type lead-out pad structure of the TSV dual-use lead line openings 155*a* and 135*b* is changed to the embedded type lead-out pad structure.

The types of the wiring lines coupled by the twin contact type TSV 157 between two layers and the shared contact type TSV 157 between two layers are not limited, for each of the configurations illustrated in FIGS. 9A to 9K. These TSVs 157 may be each coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In each of the configurations illustrated in FIGS. 9A to 9G the substrate on which the pad 151 is provided is not limited to the illustrated example. In the fourth configuration example, the respective signal lines provided in the first substrate 110A and the second substrate 110B are electrically coupled to each other and the respective power supply lines provided in the first substrate 110A and the second substrate 110B are electrically coupled to each other by one TSV 157*a*. The respective signal lines provided in the second substrate 110B and the third substrate 110C are electrically coupled to each other and the respective power supply lines provided in the second substrate 110B and the third substrate 110C are electrically coupled to each other by the other TSV 157*b*. Accordingly, the pad 151 as the coupling structure may not be provided. Thus, for example, in each of the configurations illustrated in FIGS. 9A to 9G the pad 151 may be provided on any of the substrates 110A, 110B, and 110C to derive a desired signal.

In a case where a lead-out pad structure is provided, the lead-out pad structure may be the non-embedded type or the embedded type. For example, in the configuration illustrated in FIG. 9F, the embedded type lead-out pad structure may be provided instead of the non-embedded type lead-out pad structure. Further, for example, in the configuration illustrated in FIG. 9G the non-embedded type lead-out pad structure may be provided instead of the embedded type lead-out pad structure.

4-5. Fifth Configuration Example

FIGS. 10A to 10G are each a vertical cross-sectional view of a schematic configuration of a solid-state imaging device according to a with configuration example of the present embodiment. The solid-state imaging device according to the present embodiment may have each of the configurations illustrated in FIGS. 10A to 10G.

Figure 10A:
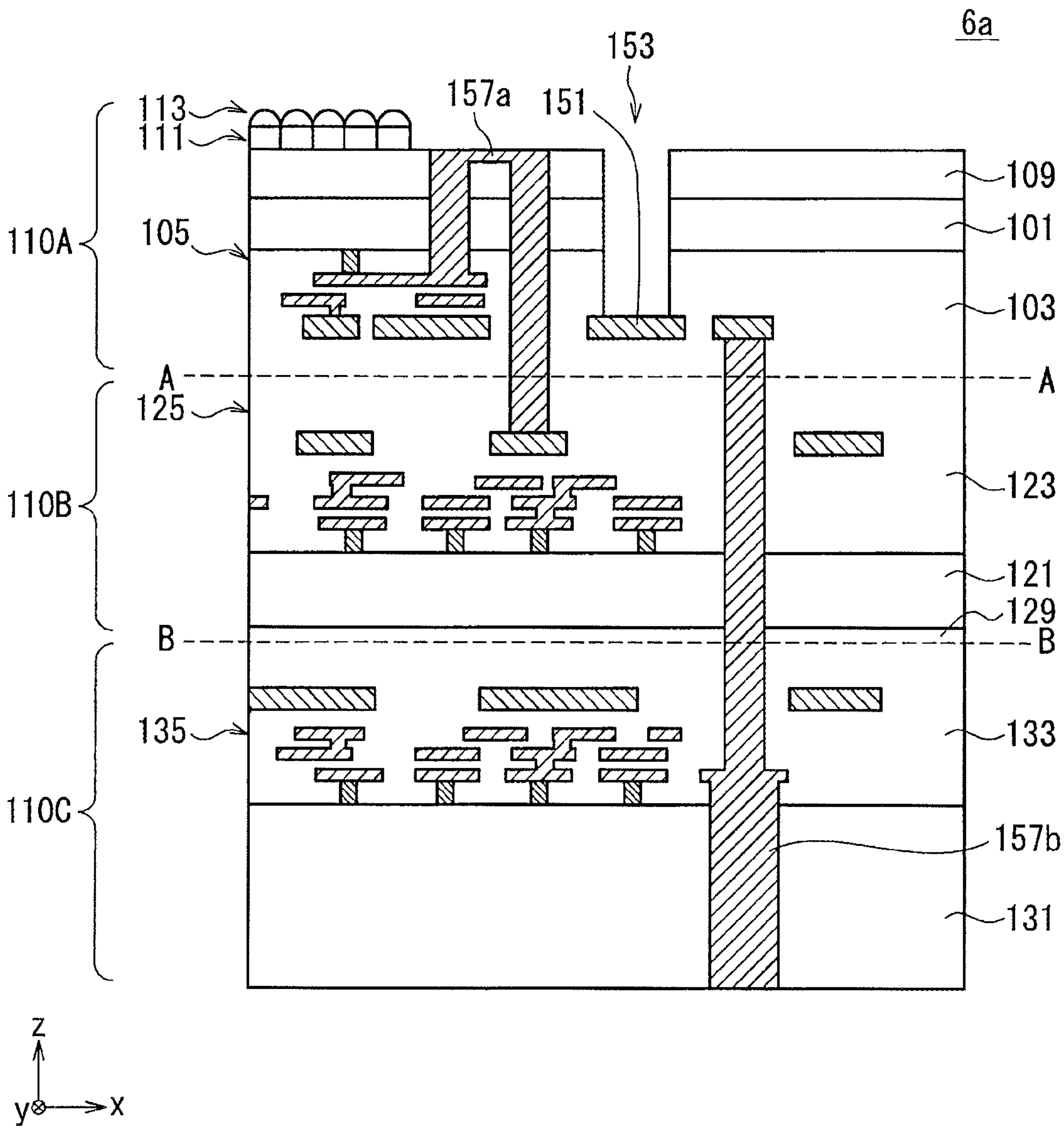
FIG. 10A is a vertical cross-sectional view of a schematic configuration of a solid-state imaging device according to a fifth configuration example of the present embodiment.

A solid-state imaging device 6*a* illustrated in FIG. 10A includes, as coupling structures, the TSV 157*a* of the twin contact type and the embedded type between two layers, the TSV 157*b* of the shared contact type and the embedded type between three layers, and the embedded pad structure for the first substrate 110A (i.e., the pad 151 provided in the multi-layered wiring layer 105 of the first substrate 110A and the pad opening 153 exposing the pad 151).

The TSV 157*a* is formed from the back surface side of the first substrate 110A toward the second substrate 110B, and is so provided as to electrically couple the respective signal lines provided in the first substrate 110A and the second substrate 110B to each other and the respective power supply lines provided in the first substrate 110A and the second substrate 110B to each other. In the configuration illustrated in FIG. 10A, the predetermined wiring line of the first metal wiring layer in the multi-layered wiring layer 105 of the first substrate 110A and the predetermined wiring line of the second metal wiring layer in the multi-layered wiring layer 125 of the second substrate 110B are electrically coupled to each other by the TSV 157*a*. In addition, the TSV 157*b* is formed from the back surface side of the third substrate 110C toward the first substrate 110A, and is so provided as to electrically couple the respective signal lines provided in the first substrate 110A and the third substrate 110C to each other and the respective power supply lines provided in the first substrate 110A and the third substrate 110C to each other. In the configuration illustrated in FIG. 10A, the predetermined wiring line of the second metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*.

Figure 10B:
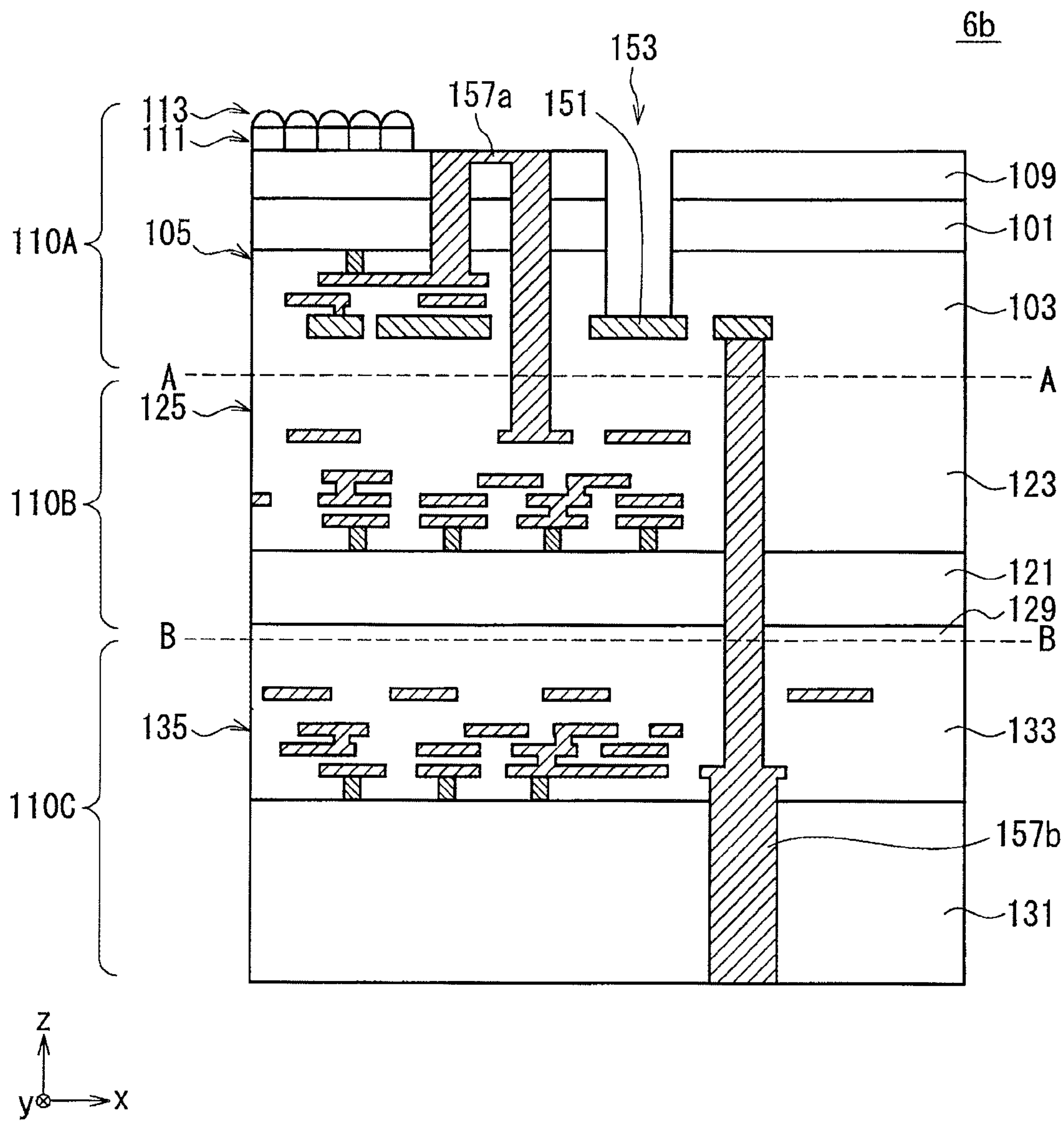
FIG. 10B is a vertical cross-sectional view of a schematic configuration of the solid-state imaging device according to the fifth configuration example of the present embodiment.

A solid-state imaging device 6*b* illustrated in FIG. 10B corresponds to the solid-state imaging device 6*a* illustrated in FIG. 10A in which the types of the wiring lines electrically coupled by the TSV 157*a* are changed. Specifically, in the configuration illustrated in FIG. 10B, the predetermined wiring line of the first metal wiring layer in the multi-layered wiring layer 105 of the first substrate 110A and the predetermined wiring line of the first metal wiring layer in the multi-layered wiring layer 125 of the second substrate 110B are electrically coupled to each other by the TSV 157*a*.

Figure 10C:
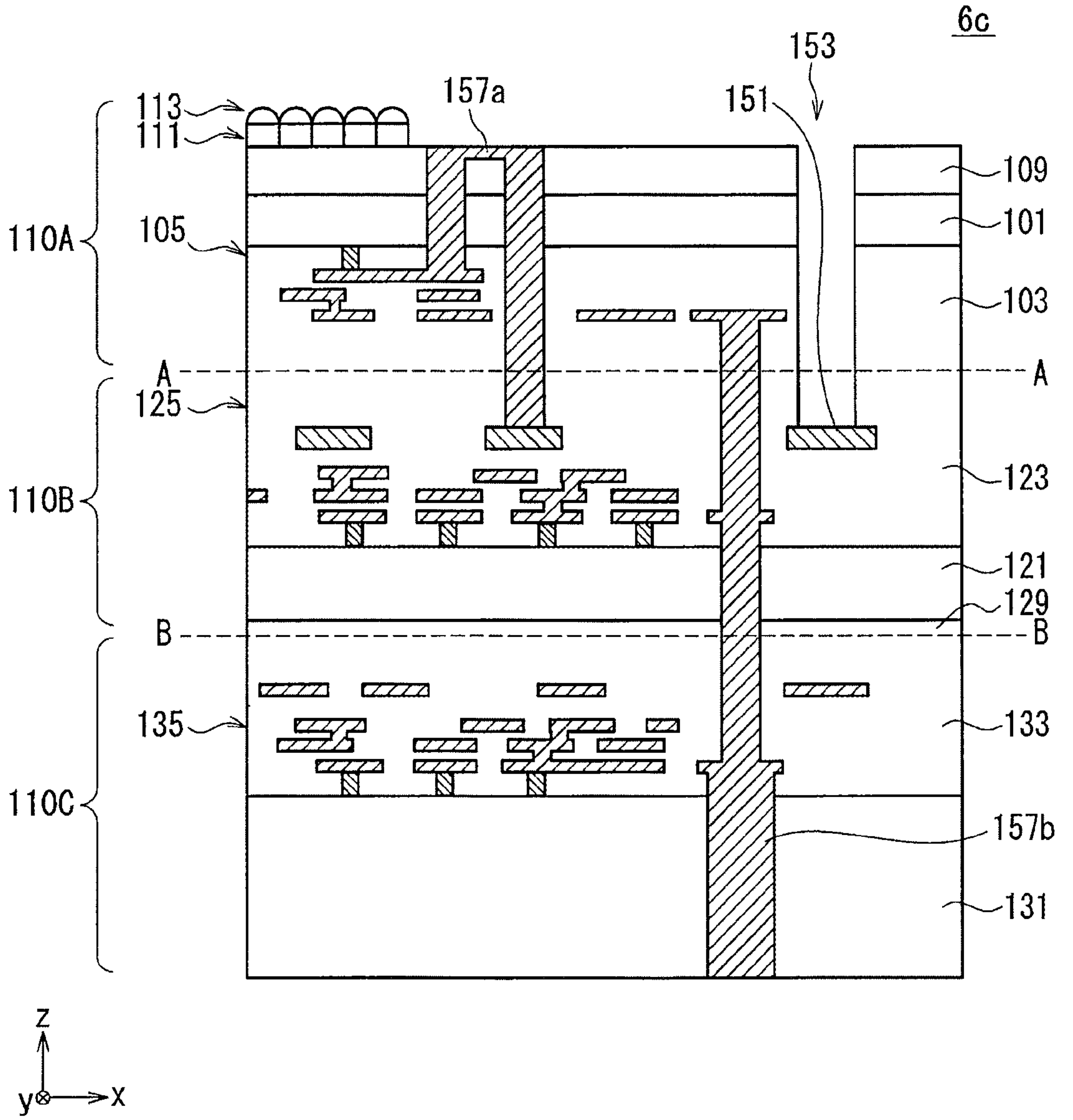
FIG. 10C is a vertical cross-sectional view of a schematic configuration of the solid-state imaging device according to the fifth configuration example of the present embodiment.

A solid-state imaging device 6*c* illustrated in FIG. 10C includes, as coupling structures, the TSV 157*a* of the twin contact type and the embedded type between two layers, the TSV 157*b* of the shared contact type and the embedded type between three layers, and the embedded pad structure for the second substrate 110B (i.e., the pad 151 provided in the multi-layered wiring layer 125 of the second substrate 110B and the pad opening 153 exposing the pad 151).

The TSV 157*a* is formed from the back surface side of the first substrate 110A toward the second substrate 110B, and is so provided as to electrically couple the respective signal lines provided in the first substrate 110A and the second substrate 110B to each other and the respective power supply lines provided in the first substrate 110A and the second substrate 110B to each other. In the configuration illustrated in FIG. 10C, the predetermined wiring line of the first metal wiring layer in the multi-layered wiring layer 105 of the first substrate 110A and the predetermined wiring line of the second metal wiring layer in the multi-layered wiring layer 125 of the second substrate 110B are electrically coupled to each other by the TSV 157*a*. In addition, the TSV 157*b* is formed from the back surface side of the third substrate 110C toward the first substrate 110A, and is so provided as to electrically couple the respective signal lines provided in the first substrate 110A, the second substrate 110, and the third substrate 110C together and the respective power supply lines included in the first substrate 110A, the second substrate 110B, and the third substrate 110C together. In the configuration illustrated in FIG. 10C, the predetermined wiring line of the first metal wiring layer in the multi-layered wiring layer 105 of the first substrate 110A, the predetermined wiring line of the first metal wiring layer in the multi-layered wiring layer 125 of the second substrate 110B, and the predetermined wiring line of the first metal wiring layer in the multi-layered wiring layer 135 of the third substrate 110C are electrically coupled together by the TSV 157*b*.

Figure 10D:
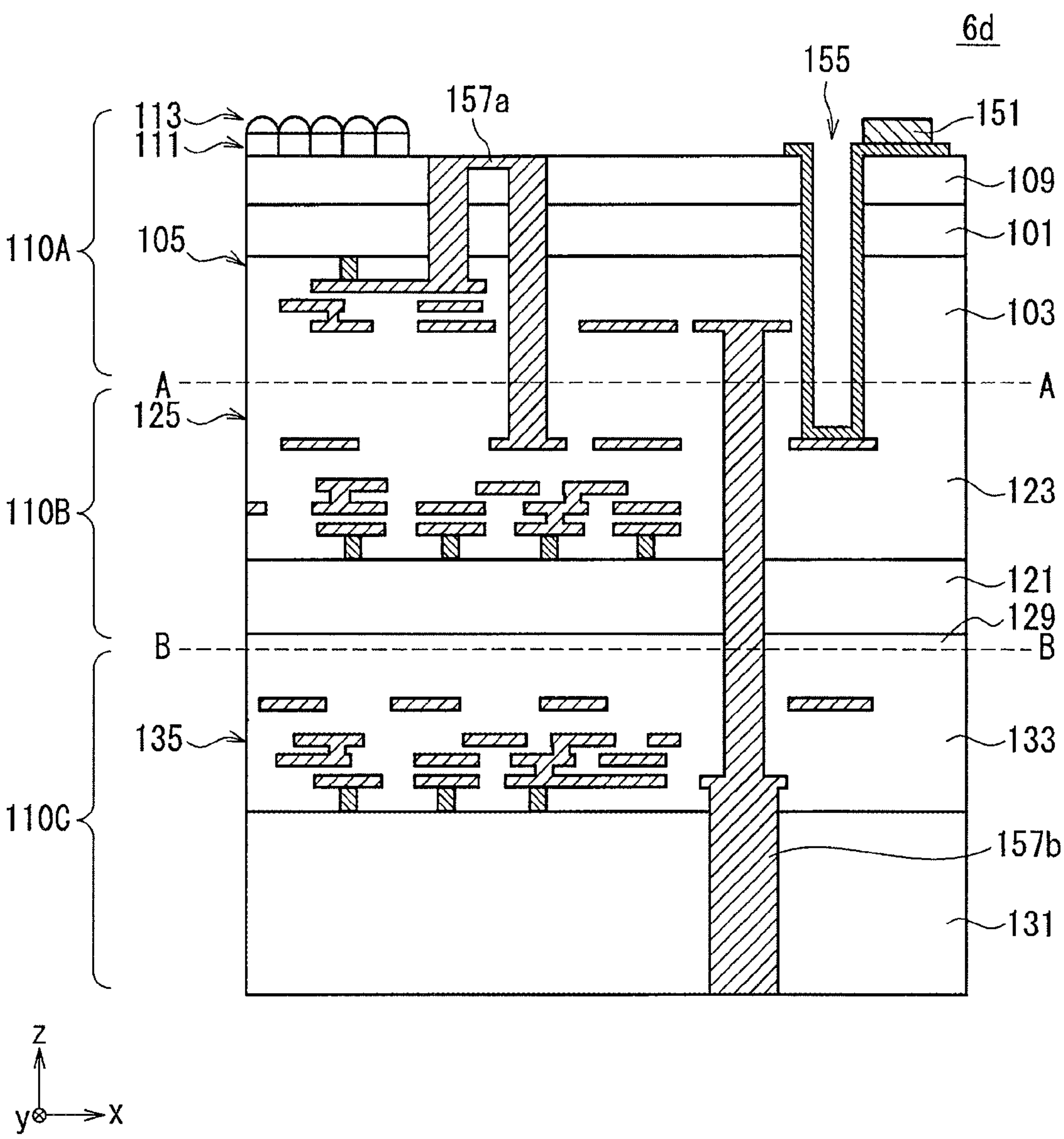
FIG. 10D is a vertical cross-sectional view of a schematic configuration of the solid-state imaging device according to the fifth configuration example of the present embodiment.

A solid-state imaging device 6*d* illustrated in FIG. 10D corresponds to the solid-state imaging device 6*b* illustrated in FIG. 10B in which the embedded pad structure is changed and the types of the wiring lines electrically coupled by the TSV 157*b* are changed. Specifically, in the configuration illustrated in FIG. 10D, the non-embedded type lead-out pad structure for the second substrate 110B (i.e., the lead line opening 153 for the predetermined wiring line in the multi-layered wiring layer 125 of the second substrate 110B and the pad 151 on the surface on the back surface side of the first substrate 110A) is provided instead of the embedded pad structure. In addition, in the configuration illustrated in FIG. 10D, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*.

Figure 10E:
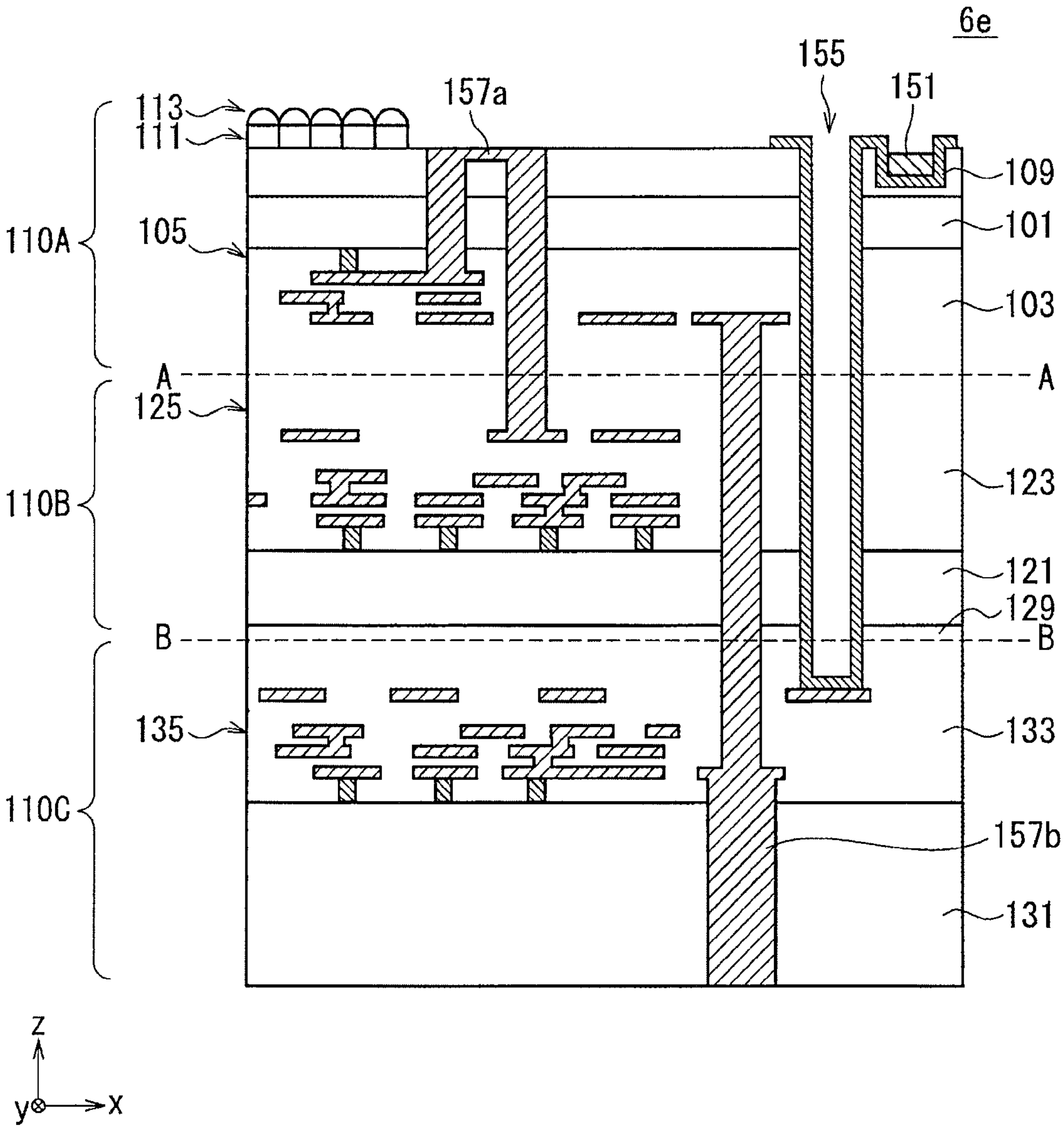
FIG. 10E is a vertical cross-sectional view of a schematic configuration of the solid-state imaging device according to the fifth configuration example of the present embodiment.

A solid-state imaging device 6*e* illustrated in FIG. 10E corresponds to the solid-state imaging device 6*d* illustrated in FIG. 10D in which the configuration of the lead-out pad structure is changed. Specifically, in the configuration illustrated in FIG. 10E, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 109 on the surface on the back surface side of the first substrate 110A) is provided instead of the non-embedded type lead-out pad structure for the second substrate 110B.

Figure 10F:
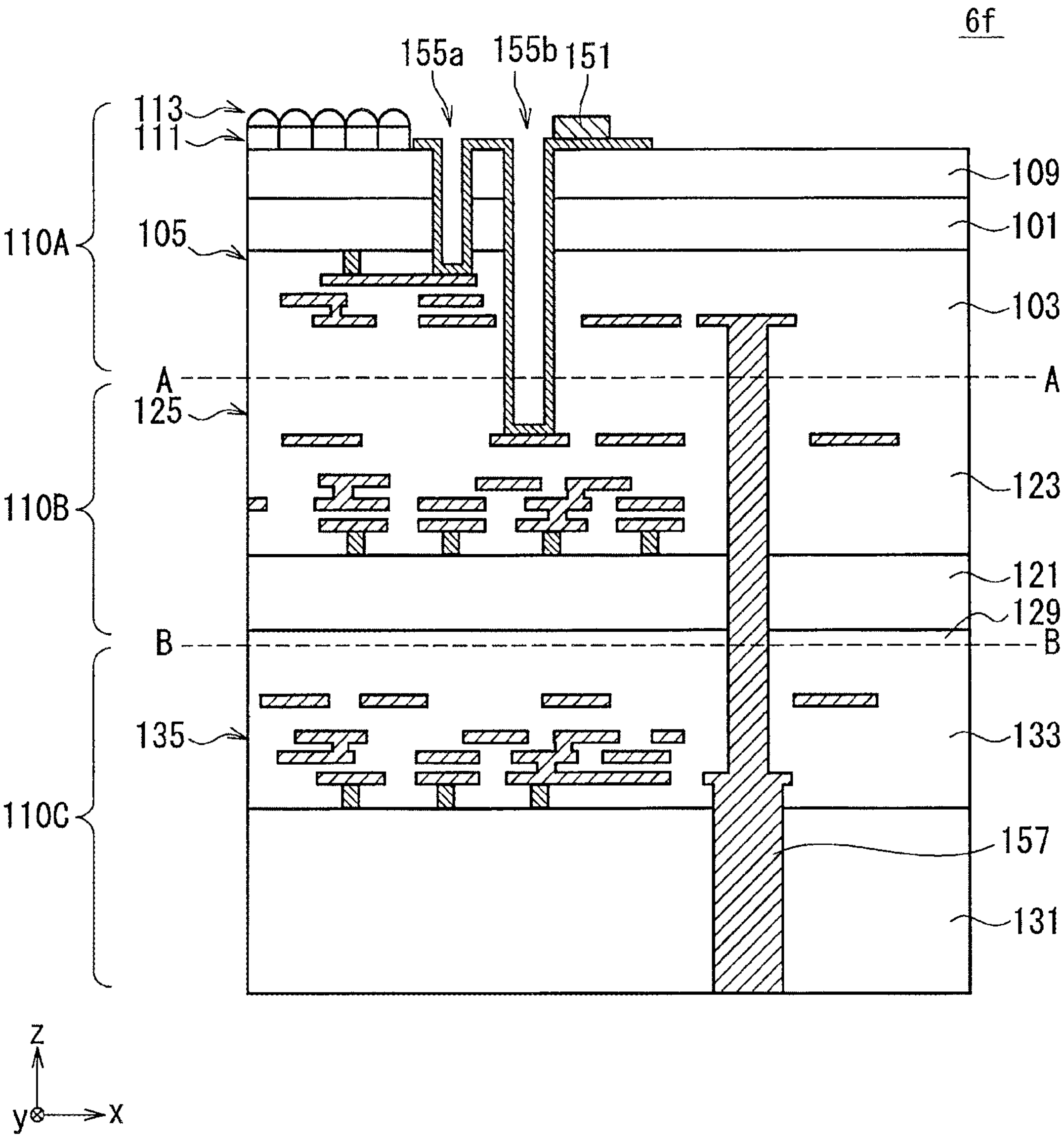
FIG. 10F is a vertical cross-sectional view of a schematic configuration of the solid-state imaging device according to the fifth configuration example of the present embodiment.

A solid-state imaging device 6*f* illustrated in FIG. 10F corresponds to the solid-state imaging device 6*e* illustrated in FIG. 10E in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded type lead-out pad structure by changing the embedded type TSV 157*a* to the non-embedded type TSV.

Figure 10G:
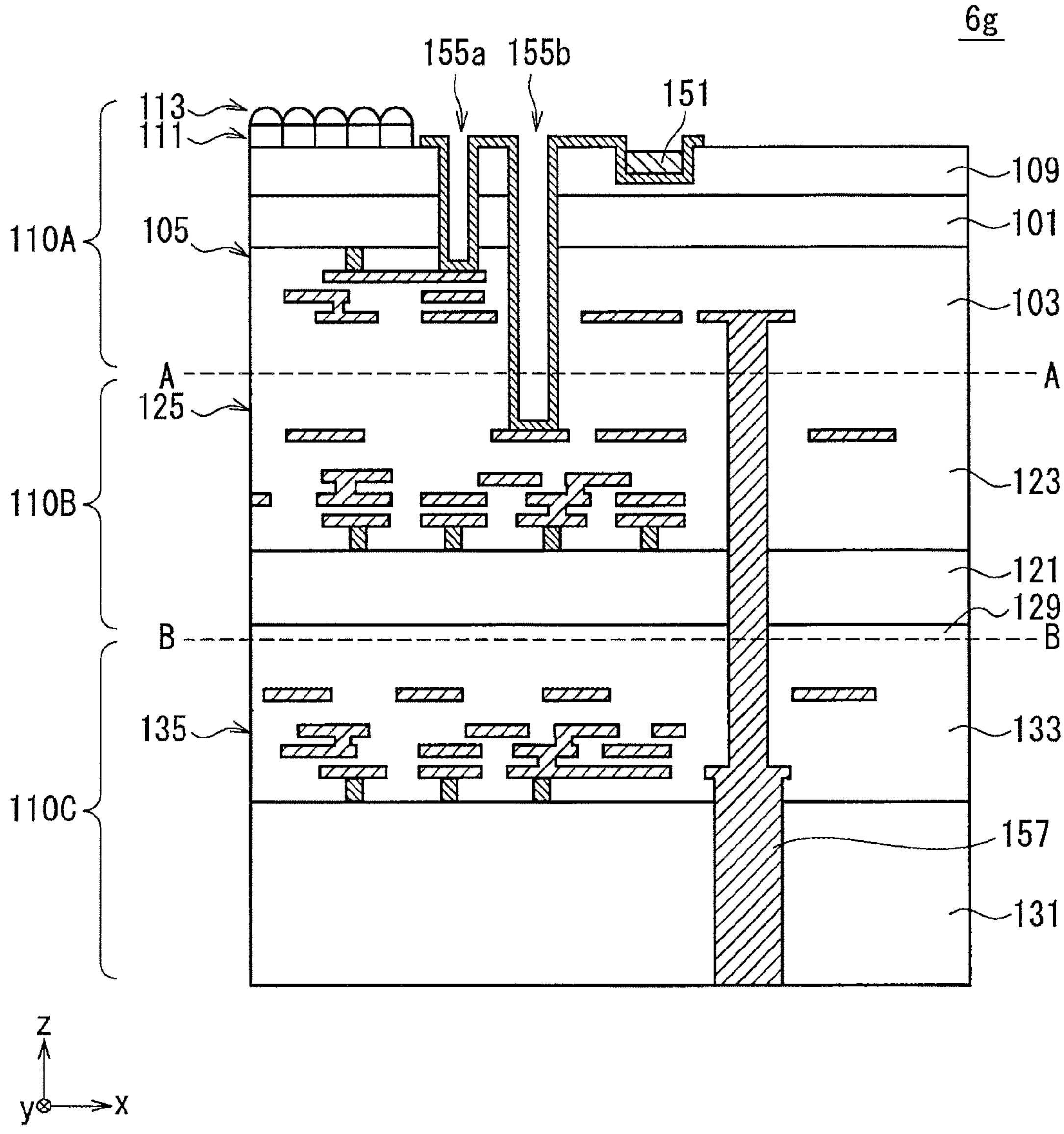
FIG. 10G is a vertical cross-sectional view or a schematic configuration of the solid-state imaging device according to the fifth configuration example of the present embodiment.

A solid-state imaging device 6*g* illustrated in FIG. 10G corresponds to the solid-state imaging device 6*f* illustrated in FIG. 10F in which the non-embedded type lead-out pad structure of the TSV dual-use lead line openings 155*a* and 155*b* is changed to the embedded type lead-out pad structure.

The types of the wiring lines coupled by the twin contact type TSV 157 between two layers and the shared contact type TSV 157 between three layers are not limited, for each of the configurations illustrated in FIGS. 10A to 10G These TSVs 157 may be each coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In each of the configurations illustrated in FIGS. 10A to 10E, the substrate on which the pad 151 is provided is not limited to the illustrated example. In each of these configurations, the respective signal lines provided in the first substrate 110A and the second substrate 110B are electrically coupled to each other and the respective power supply lines provided in the first substrate 110A and the second substrate 110B are electrically coupled to each other by one TSV 157*a*. The respective signal lines provided in the first substrate 110A and the third substrate 110C are at least electrically coupled to each other and the respective power supply lines provided in the first substrate 110A and the third substrate 110C are at least electrically coupled to each other by the other TSV 157*b*. Accordingly, the pad 131 as the coupling structure may not be provided. Thus, for example, in each of the configurations illustrated in FIGS. 10A to 10E, the pad 151 may be provided on any of the substrates 110A. 110B, and 110C to derive a desired signal.

In a case where the lead-out pad structure is provided, the lead-out pad structure may be the non-embedded type or the embedded type. For example, in the configuration illustrated in FIG. 10D, the embedded type lead-out pad structure may be provided instead of the non-embedded type lead-out pad structure. Further, for example, in the configuration illustrated in FIG. 10E, the non-embedded type lead-out pad structure may be provided instead of the embedded type lead-out pad structure.

In each of the configurations illustrated in FIGS. 10A to 10G the TSV 157 of the shared contact type and the embedded type between three layers is formed from the back surface side of the third substrate 110C toward the first substrate 110A, but the present embodiment is not limited to such an example. The TSV 157 may be formed from the back surface side of the first substrate 110A toward the third substrate 110C.

In addition, it is sufficient for the shared contact type TSV 157 between three layers to electrically couple the respective signal lines as well as the respective power supply lines provided in at least two of the first substrate 110A, the second substrate 110B, or the third substrate 110C to each other. The substrates provided with the respective signal lines as well as the respective power supply lines to be electrically coupled to each other by the TSV 157 may be optionally changed.

4-6. Sixth Configuration Example

FIGS. 11A to 11F are each a vertical cross-sectional view of a schematic configuration of a solid-state imaging device according to a sixth configuration example of the present embodiment. The solid-state imaging device according to the present embodiment may have each of the configurations illustrated in FIGS. 11A to 11F.

Figure 11A:
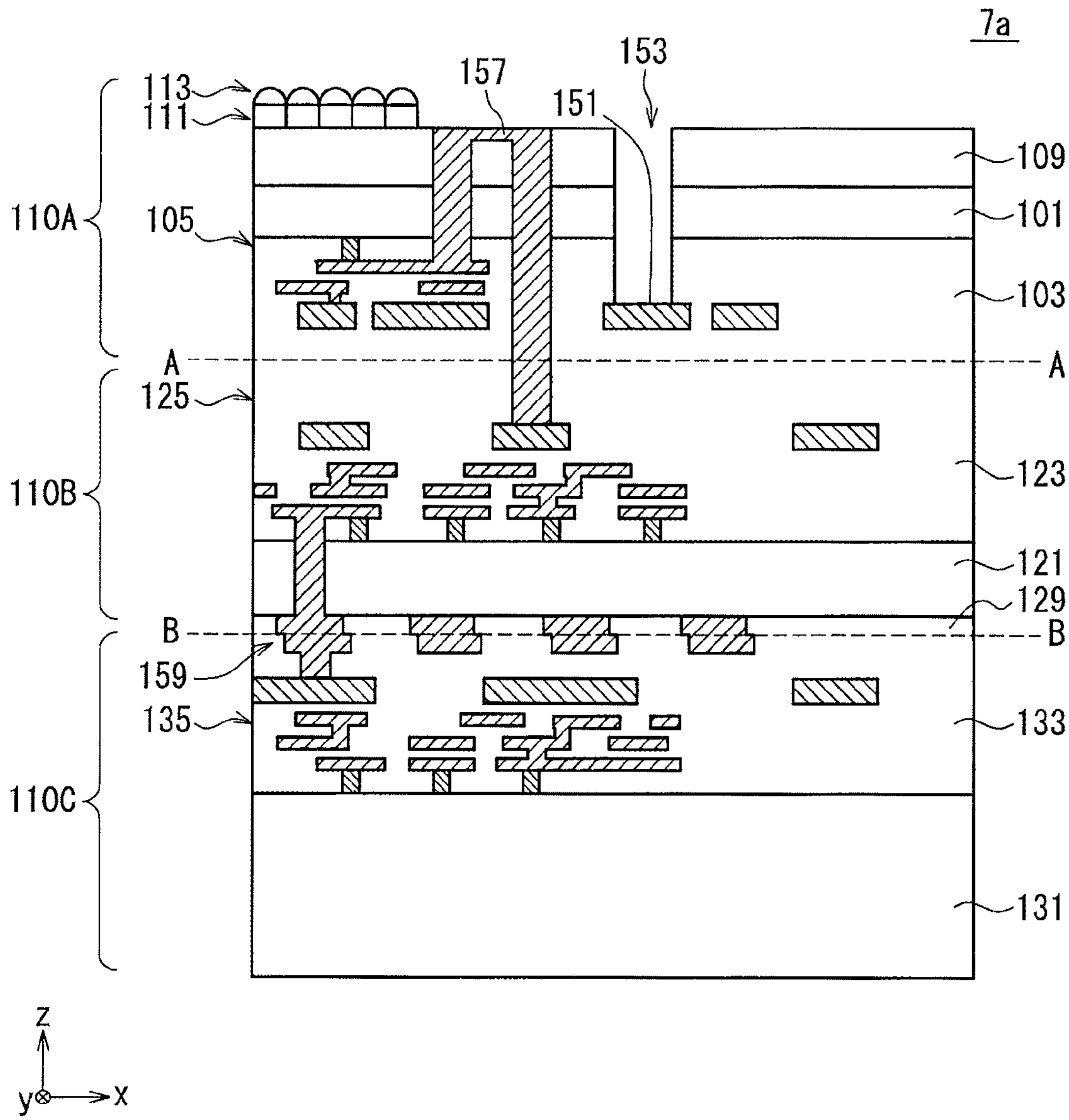
FIG. 11A is a vertical cross-sectional view of a schematic configuration of a solid-state imaging device according to a sixth configuration example of the present embodiment.

The solid-state imaging device 7*a* illustrated in FIG. 11A includes, as coupling structures, the TSV 157 of the twin contact type and the embedded type between two layers, the electrode junction structure 159 provided between the second substrate 110B and the third substrate 110C, and the embedded pad structure for the first substrate 110A (i.e., the pad 151 provided in the multi-layered wiring layer 105 of the first substrate 110A and the pad opening 153 exposing the pad 151.

The TSV 157 is formed from the back surface side of the first substrate 110A toward the second substrate 110B, and is so provided as to electrically couple the respective signal lines provided in the first substrate 110A and the second substrate 110B to each other and the respective power supply lines provided in the first substrate 110A and the second substrate 110B to each other. In the configuration illustrated in FIG. 11A, the predetermined wiring line of the first metal wiring layer in the multi-layered wiring layer 105 of the first substrate 110A and the predetermined wiring line of the second metal wiring layer in the multi-layered wiring layer 125 of the second substrate 110B are electrically coupled to each other by the TSV 157. In addition, the respective signal lines provided in the second substrate 110B and the third substrate 110C are electrically coupled to each other and the respective power supply lines provided in the second substrate 110B and the third substrate 110C are electrically coupled to each other by the electrode junction structure 159.

Here, specifically, the electrode junction structure 159 may be formed by performing heat treatment in a state in which the second substrate 110B and the third substrate 110C are bonded to each other in a manner that an electrode provided on the bonding surface of the second substrate 110B and an electrode provided on the bonding surface of the third substrate 110C are in contact with each other, and by joining the electrodes together. The electrode junction structure 159 includes an electrode formed on the bonding surface of the second substrate 110B, a via for electrically coupling the electrode to the predetermined wiring line in the multi-layered wiring layer 125, an electrode formed on the bonding surface of the third substrate 110C, and a via for electrically coupling the electrode to the predetermined wiring line in the multi-layered wiring layer 135. Note that, at this time, the second substrate 110B and the third substrate 110C are bonded to each other F-to-B, and thus the via provided on the second substrate 110B side is formed as a via penetrating the semiconductor substrate 121 (i.e., TSV).

Figure 11B:
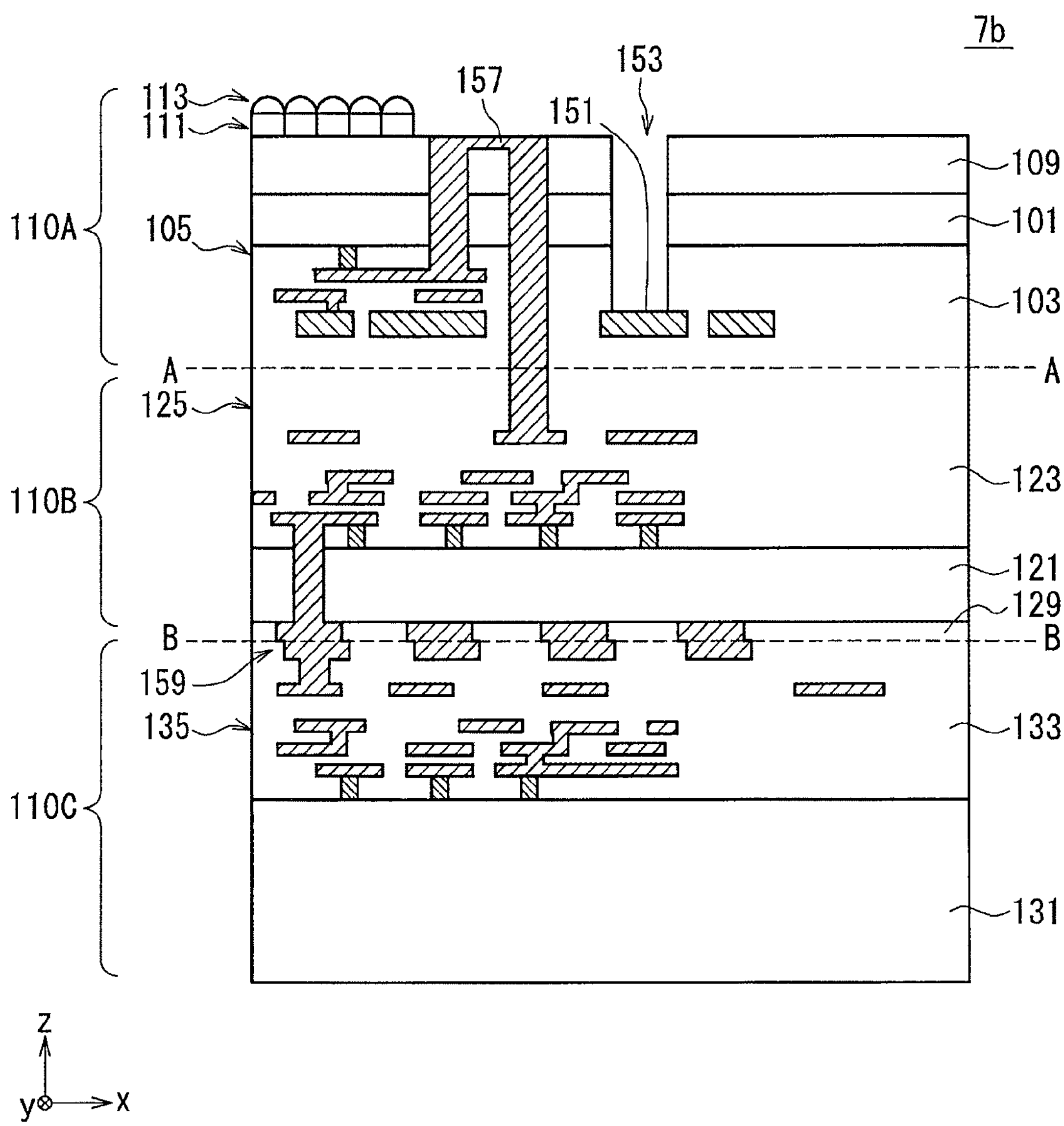
FIG. 11B is a vertical cross-sectional view of a schematic configuration of the solid-state imaging device according to the sixth configuration example of the present embodiment.

A solid-state imaging device 7*b* illustrated in FIG. 11B corresponds to the solid-state imaging device 7*a* illustrated in FIG. 11A in which the types of the wiring lines electrically coupled by the TSV 157 are changed. Specifically, in the configuration illustrated in FIG. 11B, the predetermined wiring line of the first metal wiring layer in the multi-layered wiring layer 105 of the first substrate 110A and the predetermined wiring line of the first metal wiring layer in the multi-layered wiring layer 125 of the second substrate 110B are electrically coupled to each other by the TSV 157.

Figure 11C:
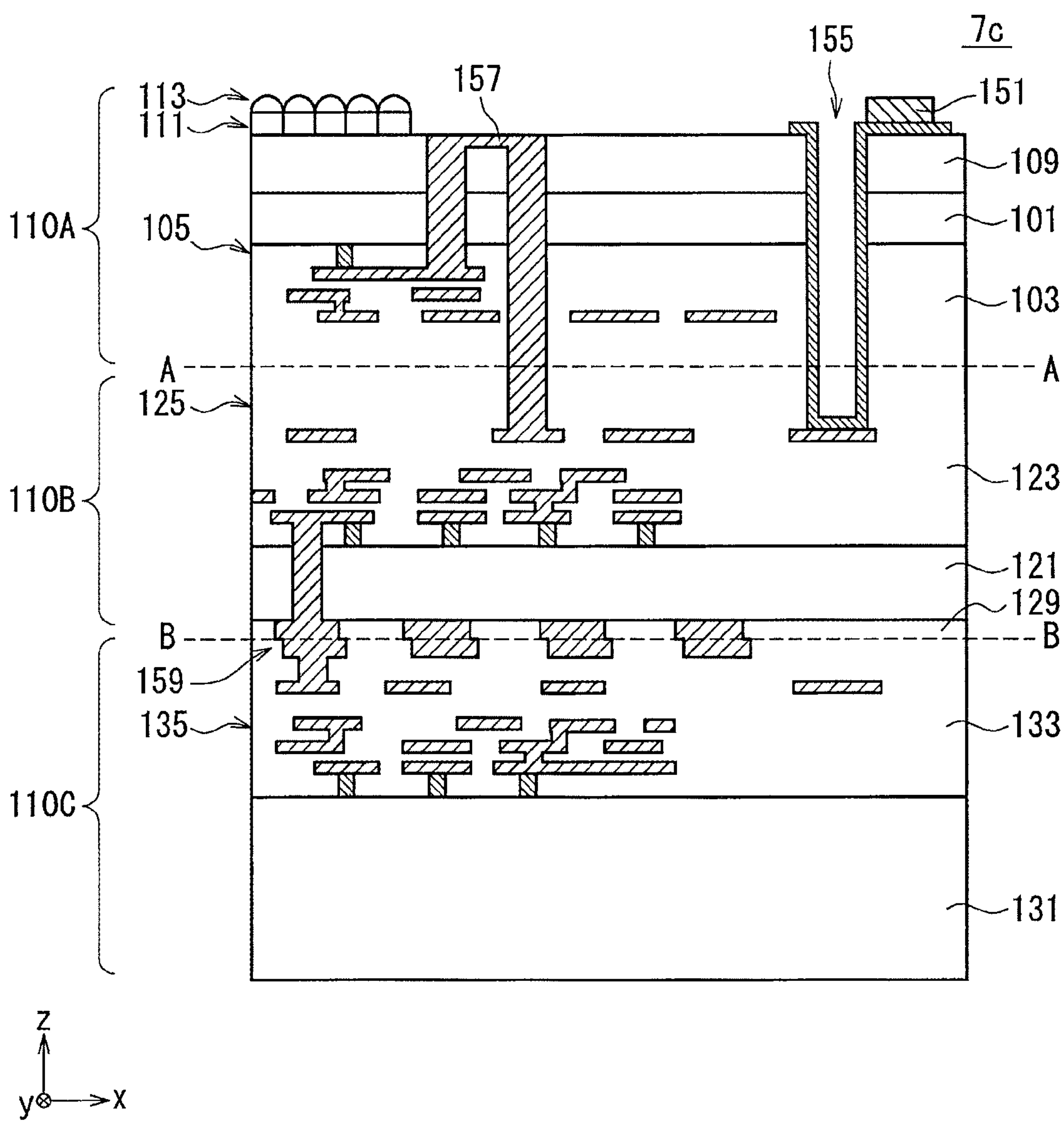
FIG. 11C is a vertical cross-sectional view of a schematic configuration of the solid-state imaging device according to the sixth configuration example of the present embodiment.

A solid-state imaging device 7*c* illustrated in FIG. 11C corresponds to the solid-state imaging device 7*b* illustrated in FIG. 11B in which the embedded-pad structure is changed. Specifically, in the configuration illustrated in FIG. 11C, the non-embedded type lead-out pad structure for the second substrate 110B (i.e., the lead line opening 155 for the predetermined wiring line in the multi-layered wiring layer 125 of the second substrate 110B and the pad 151 on the surface on the back surface side of the first substrate 110A) is provided instead of the embedded pad structure.

Figure 11D:
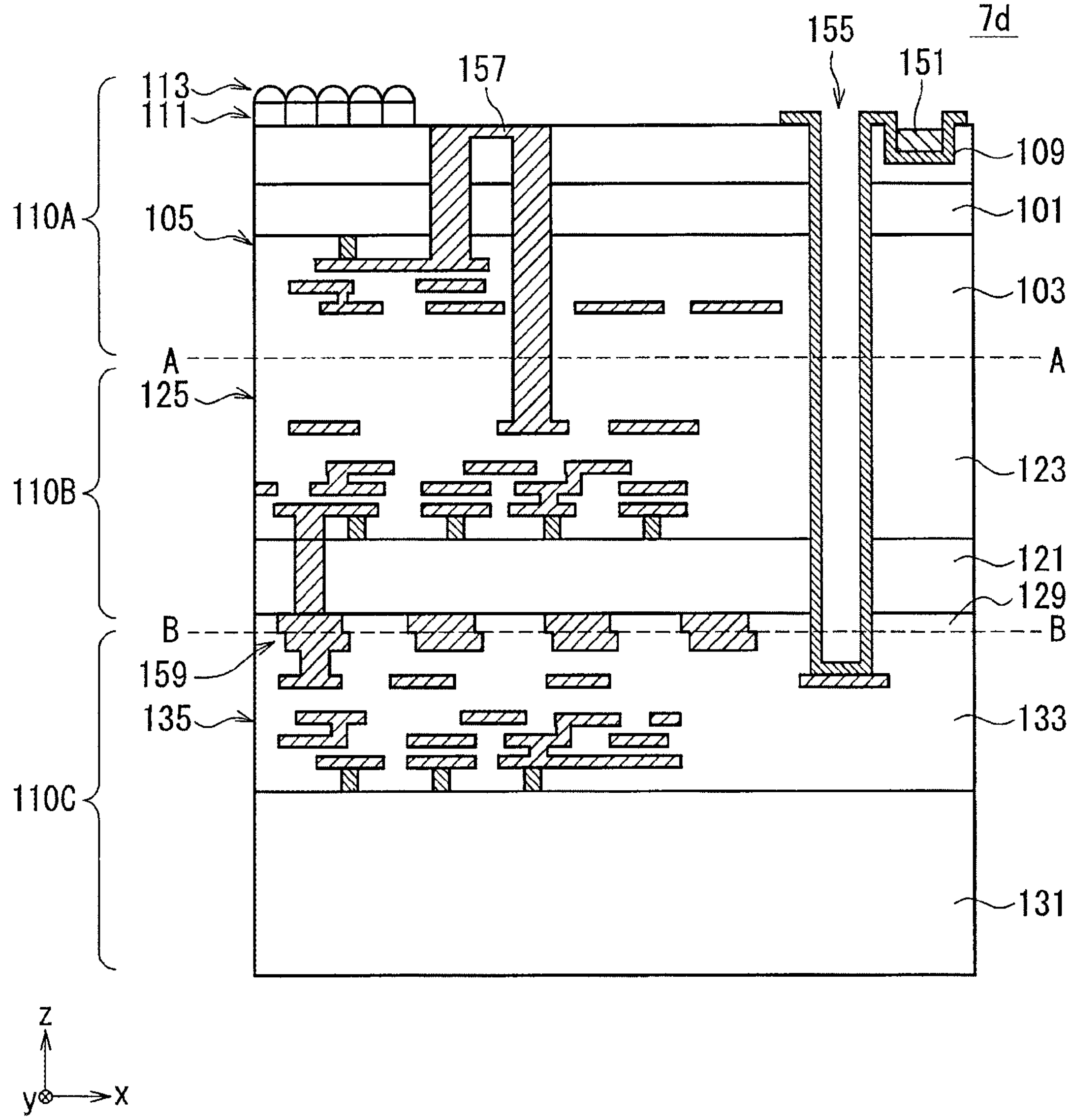
FIG. 11D is a vertical cross-sectional view of a schematic configuration of the solid-state imaging device according to the sixth configuration example of the present embodiment.

A solid-state imaging device 7*d* illustrated in FIG. 11D corresponds to the solid-state imaging device 7*c* illustrated in FIG. 11C in which the configuration of the lead-out pad structure is changed. Specifically, in the configuration illustrated in FIG. 11D, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 109 on the surface on the back surface side of the first substrate 110A) is provided instead of the non-embedded type lead-out pad structure for the second substrate 110B.

Figure 11E:
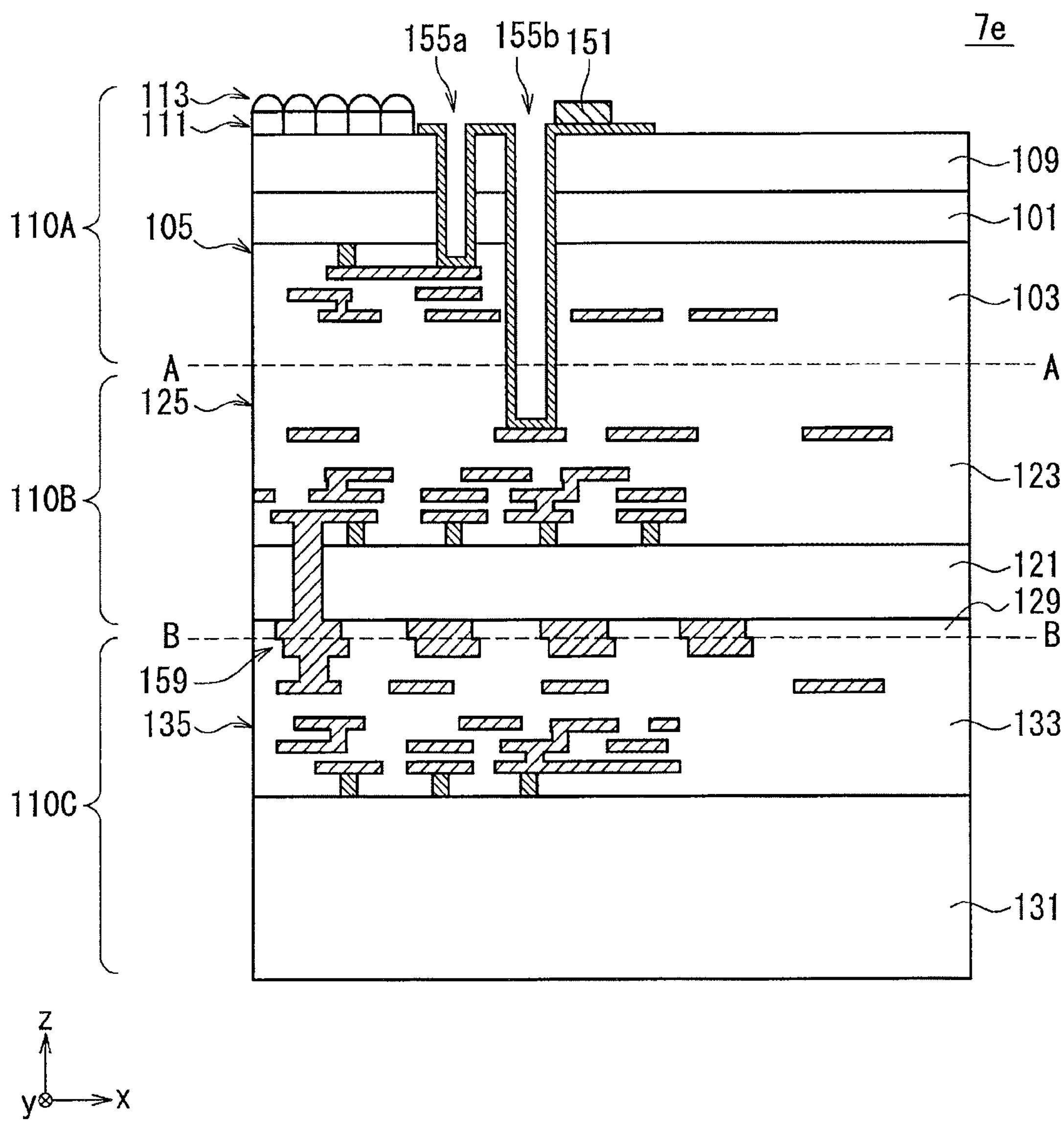
FIG. 11E is a vertical cross-sectional view of a schematic configuration of the solid-state imaging device according to the sixth configuration example of the present embodiment.

A solid-state imaging device 7*e* illustrated in FIG. 11E corresponds to the solid-state imaging device 7*d* illustrated in FIG. 11D in which the non-embedded type lead-out pad structure using the TSV dual-use lead line openings 155*a* and 155*b*(i.e., the TSV dual-use lead line openings 155*a* and 155*b* and the pad 151 on the surface on the back surface side of the first substrate 110A) is provided instead of the TSV 157 and the embedded type lead-out pad structure by changing the embedded type TSV 157 to the non-embedded type TSV.

Figure 11F:
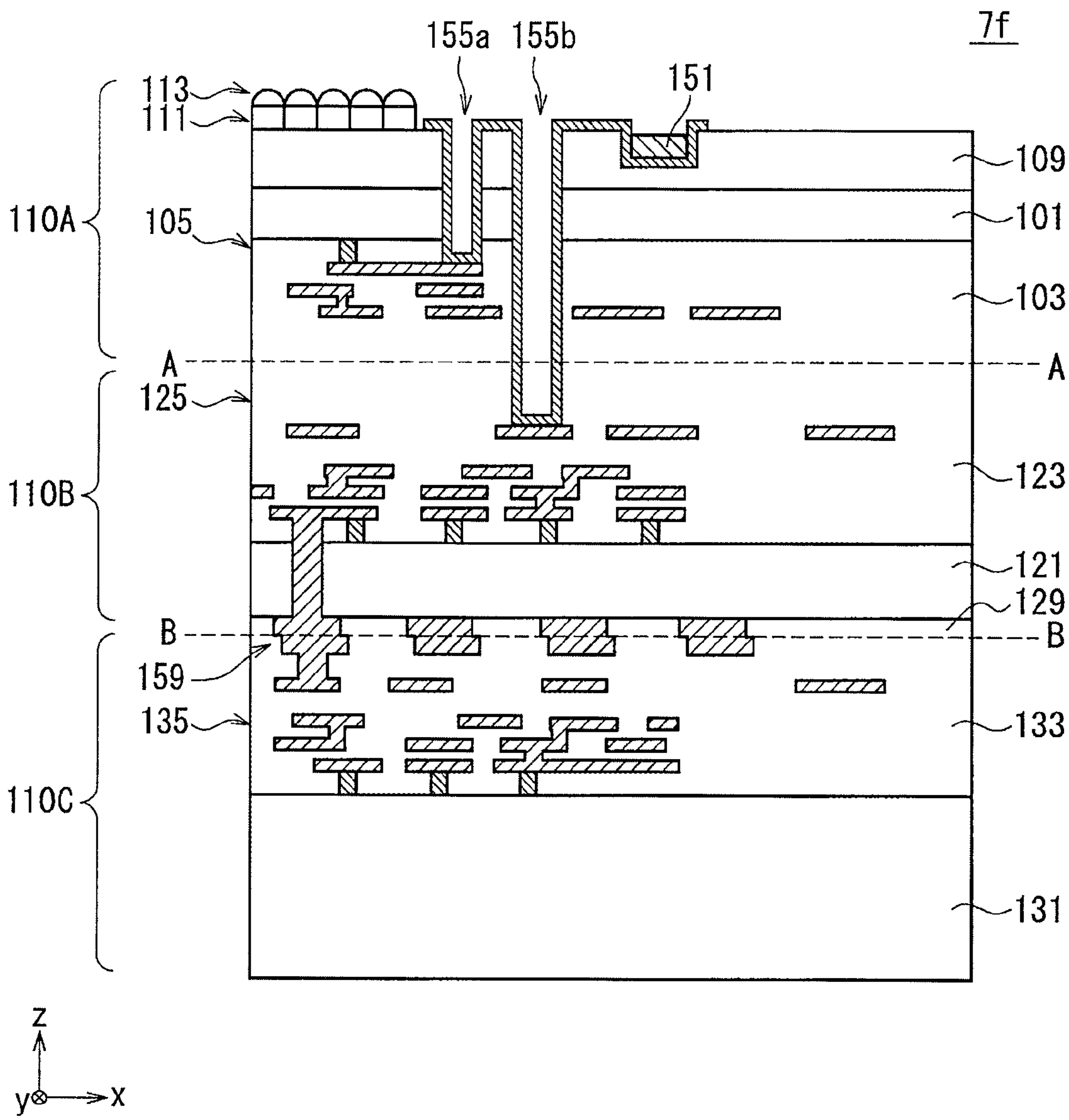
FIG. 11F is a vertical cross-sectional view of a schematic configuration of the solid-state imaging device according to the sixth configuration example of the present embodiment.

A solid-state imaging device 7*f* illustrated in FIG. 11F corresponds to the solid-state imaging device 7*e* illustrated in FIG. 11E in which the non-embedded type lead-out pad structure of the TSV dual-use lead line openings 155*a* and 155*b* is changed to the embedded type lead-out pad structure.

Note that, in each of the configurations illustrated in FIGS. 11A to 11F, the types of the wiring lines coupled by the twin contact type TSV 157 between two layers are not limited. The TSV 157 may be coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In each of the configurations illustrated in FIGS. 11A to 11D, the substrate on which the pad 151 is provided is not limited to the illustrated example. In the sixth configuration example, the respective signal lines provided in the first substrate 110A and the second substrate 110B are electrically coupled to each other and the respective power supply lines provided in the first substrate 110A and the second substrate 110B are electrically coupled to each other by the TSV 157. The respective signal lines provided in the second substrate 110B and the third substrate 110C are electrically coupled to each other and the respective power supply lines provided in the second substrate 110B and the third substrate 110C are electrically coupled to each other by the electrode junction structure 159. Accordingly, the pad 151 as the coupling structure may not be provided. Thus, for example, in each of the configurations illustrated in FIGS. 11A to 11D, the pad 151 may be provided on any of the substrates 110A, 110B, and 110C to derive a desired signal.

Further, in a case where a lead-out pad structure is provided, the lead-out pad structure may be the non-embedded type or the embedded type. For example, in the configuration illustrated in FIG. 11C, the embedded type lead-out pad structure may be provided instead of the non-embedded type lead-out pad structure. Further, for example, in the configuration illustrated in FIG. 11D, the non-embedded type lead-out pad structure may be provided instead of the embedded type lead-out pad structure.

4-7. Seventh Configuration Example

FIGS. 12A to 12L are each a vertical cross-sectional view of a schematic configuration of a solid-state imaging device according to a seventh configuration example of the present embodiment. The solid-state imaging device according to the present embodiment may have each of the configurations illustrated in FIGS. 12A to 12L.

Figure 12A:
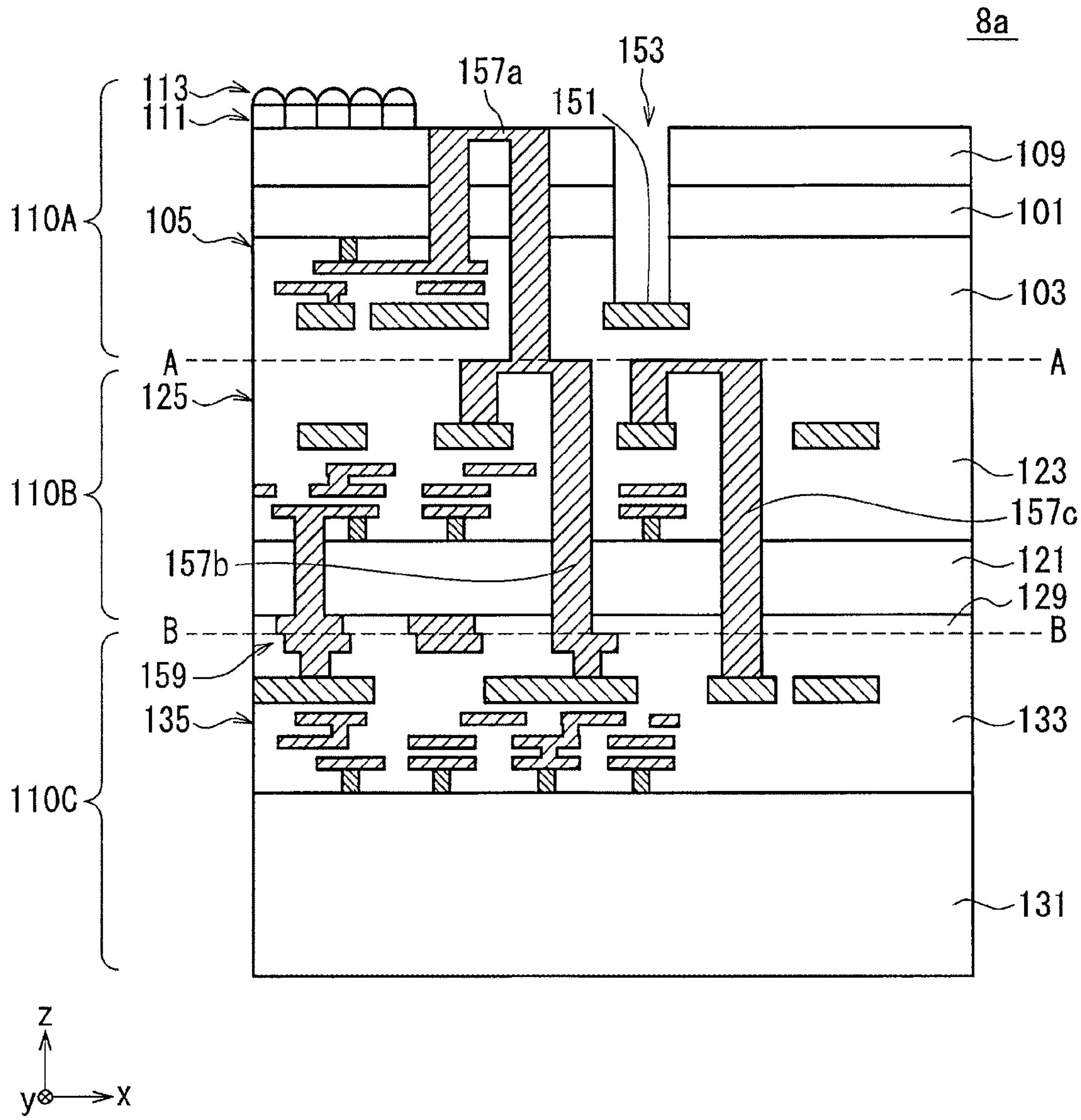
FIG. 12A is a vertical cross-sectional view of a schematic configuration of a solid-state imaging device according to a seventh configuration example of the present embodiment.

A solid-state imaging device 8*a* illustrated in FIG. 12A includes, as coupling structures, the TSVs 157*a*, 157*b*, and 157*c* of the twin contact type and the embedded type between two layers, the electrode junction structure 159 provided between the second substrate 110B and the third substrate 110C, and the embedded pad structure for the first substrate 110A (i.e., the pad 151 provided in the multi-layered wiring layer 105 of the first substrate 110A and the pad opening 153 exposing the pad 151).

The TSV 157*a* is formed from the back surface side of the first substrate 110A toward the second substrate 110B, and is so provided as to electrically couple the respective signal lines provided in the first substrate 110A and the second substrate 110B to each other and the respective power supply lines provided in the first substrate 110A and the second substrate 110B to each other. The TSV 157*b* and 157*c* are each formed from the front surface side of the second substrate 110B toward the third substrate 110C, and are each so provided as to electrically couple the respective signal lines provided in the second substrate 110B and the third substrate 110C to each other and the respective power supply lines provided in the second substrate 1106 and the third substrate 110C to each other. In addition, the respective signal lines provided in the second substrate 110B and the third substrate 110C are electrically coupled to each other and the respective power supply lines provided in the second substrate 110B and the third substrate 110C are electrically coupled to each other by the electrode junction structure 159.

As for the TSVs 157*b* and 157*c*, the TSV 157*b*, one of the two TSVs, is so provided as to electrically couple the predetermined wiring line of the second metal wiring layer in the multi-layered wiring layer 125 of the second substrate 110B and an electrode in the multi-layered wiring layer 135 of the third substrate 110C to each other. The electrode is so formed in the multi-layered wiring layer 135 as to expose the metal surface from the insulating film 133. That is, the electrode is formed in the same manner as the electrode included in the electrode junction structure 159. In the present specification, an electrode, such as the electrode mentioned above, which is so formed as to expose a metal surface from each of the insulating films 103, 123, and 133 in the respective multi-layered wiring layer 105, 125, and 135 in the same manner as the electrode included in the electrode junction structure 159, but which is not included in the electrode junction structure 159 is also referred to as a single-sided electrode for the sake of convenience. Correspondingly, an electrode which is so formed in the multi-layered wiring layers 105, 125, and 135 as to expose a metal surface from the insulating films 103, 123, and 133 and which is included in the electrode junction structure 159 is also referred to as a double-sided electrode for the sake of convenience. That is, in the configuration illustrated in FIG. 12A, the TSV 157*b* is so provided as to electrically couple the predetermined wiring line in the multi-layered wiring layer 125 of the second substrate 110B and a single-sided electrode in the multi-layered wiring layer 135 of the third substrate 110C.

Further, the TSV 157*c*, the other of the two TSVs, is so provided as to electrically couple the predetermined wiring line of the second metal wiring layer in the multi-layered wiring layer 125 of the second substrate 110B and the predetermined wiring line of the second metal wiring layer in the multi-layered wiring layer 135 of the third substrate 110C to each other.

Further, the TSV 157*a* is so provided as to cause one via to be in contact with the predetermined wiring line of the first metallic wiring layer in the multi-layered wiring layer 105 of the first substrate 110A and the other via to be in contact with the upper end of the TSV 157*b*. That is, the TSV 157*a* is so formed as to electrically couple the predetermined wiring line in the multi-layered wiring layer 105 of the first substrate 110A and the TSV 157*b* to each other. Further, the predetermined wiring line in the multi-layered wiring layer 105 of the first substrate 110A, the predetermined wiring lines in the multi-layered wiring layer 125 of the second substrate 110B electrically coupled by the TSV 157*b*, and the single-sided electrode in the multi-layered wiring layer 135 of the third substrate 110C are electrically coupled together by the TSV 157*a*.

Figure 12B:
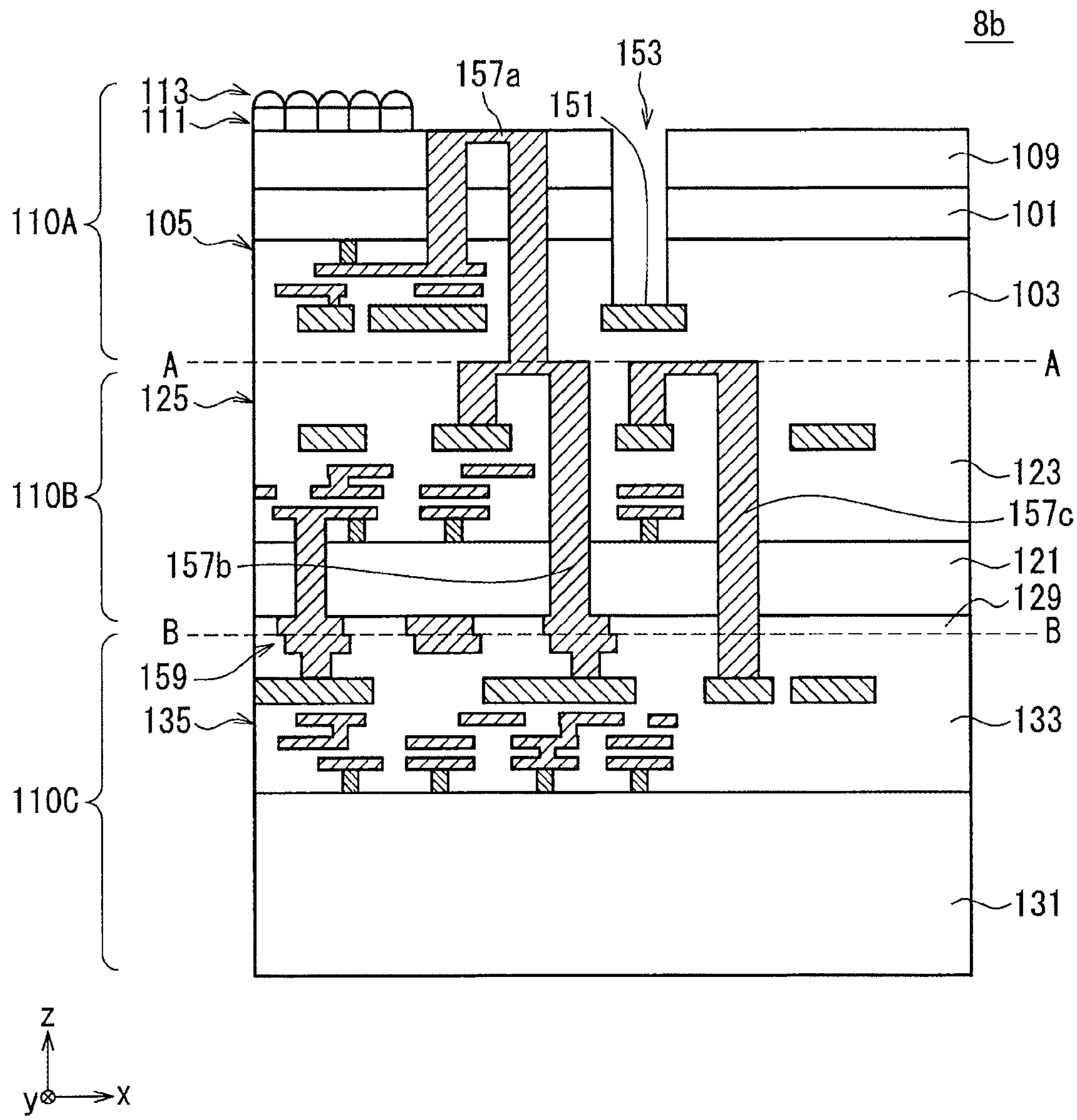
FIG. 12B is a vertical cross-sectional view of a schematic configuration of the solid-state imaging device according to the seventh configuration example of the present embodiment.

A solid-state imaging device Mb illustrated in FIG. 12B corresponds to the solid-state imaging device a illustrated in FIG. 12A in which the TSV 157*b* structure is changed. Specifically, in the configuration illustrated in FIG. 12B, the TSV 157*b* is so provided as to electrically couple the predetermined wiring line of the second metal wiring layer in the multi-layered wiring layer 125 of the second substrate 110B and the double-sided electrode included in the electrode junction structures 159 to each other. That is, in the configuration illustrated in FIG. 12B, the TSV 157*b* also functions as a via included in the electrode junction structures 159.

Figure 12C:
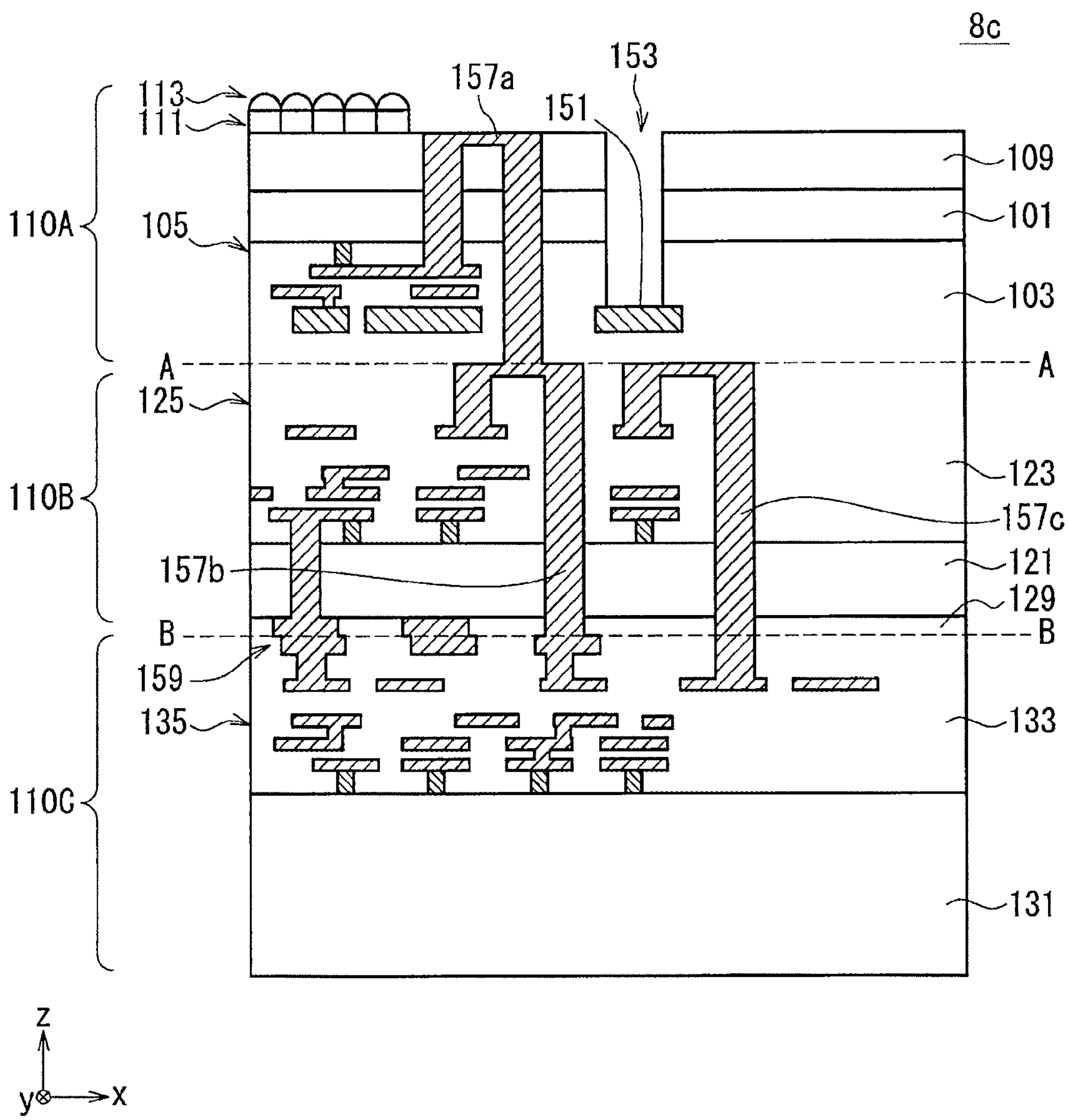
FIG. 12C is a vertical cross-sectional view of a schematic configuration of the solid-state imaging device according to the seventh configuration example of the present embodiment.

A solid-state imaging device c illustrated in FIG. 12C corresponds to the solid-state imaging device a illustrated in FIG. 12A in which the types of the wiring lines electrically coupled by the TSVs 157*b* and 157*c* are changed. Specifically, in the configuration illustrated in FIG. 12C, the predetermined wiring line of the first metal wiring layer in the multi-layered wiring layer 125 of the second substrate 110B and the single-sided electrode in the multi-layered wiring layer 135 of the third substrate 110C are electrically coupled to each other by the TSV 157*b*. In addition, the predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*c*.

Figure 12D:
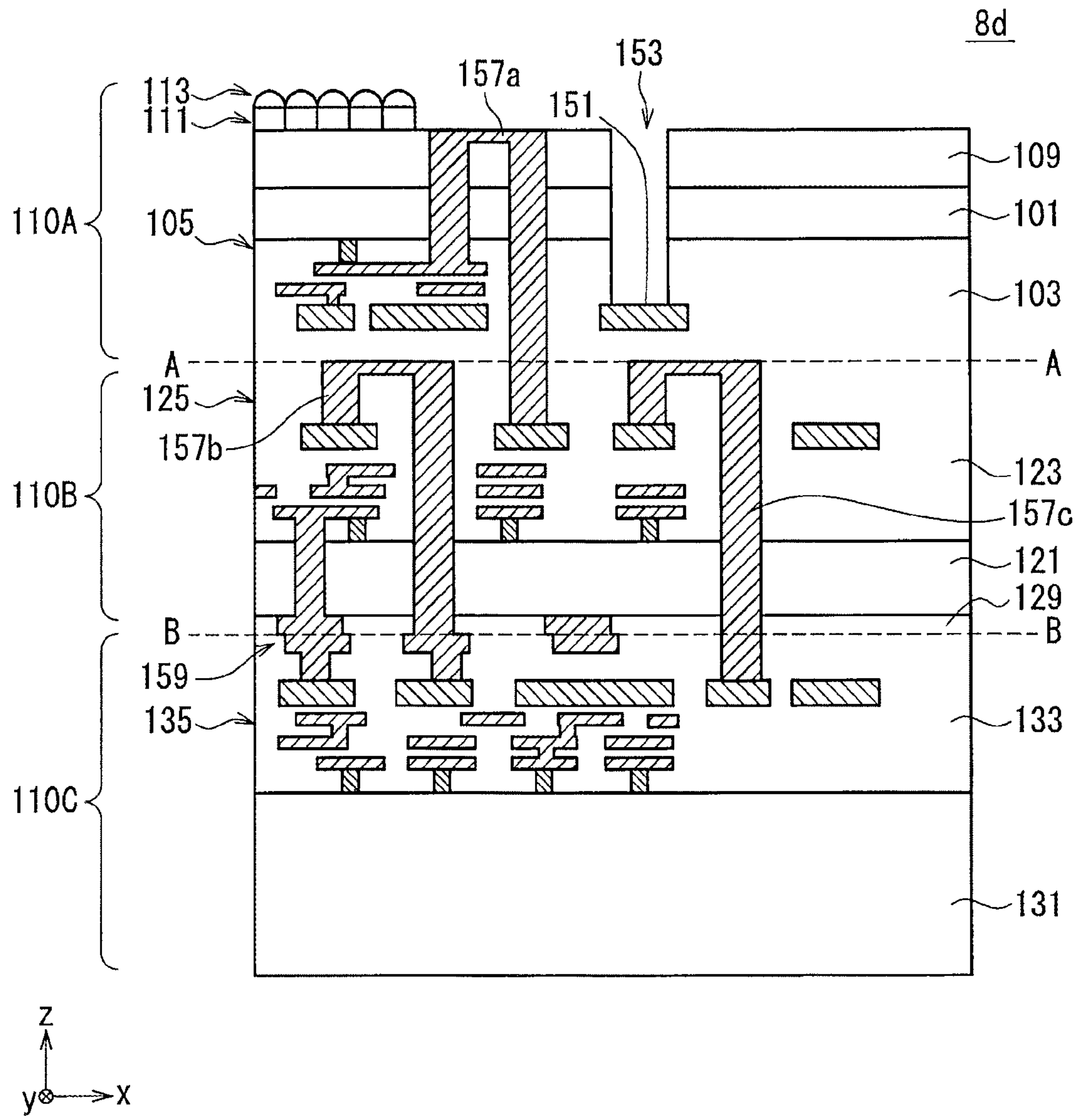
FIG. 12D is a vertical cross-sectional view of a schematic configuration of the solid-state imaging device according to the seventh configuration example of the present embodiment.

A solid-state imaging device d illustrated in FIG. 12D corresponds to the solid-state imaging device Na illustrated in FIG. 12A in which the TSV 157*a* structure is changed. Specifically, in the configuration illustrated in FIG. 12A, the TSV 157*a* is so provided as to electrically couple the predetermined wiring line in the multi-layered wiring layer 105 of the first substrate 110A and the TSV 157*b* to each other. However, in the configuration illustrated in FIG. 12D, the TSV 157*a* is so provided as to electrically couple the predetermined wiring line in the multi-layered wiring layer 105 of the first substrate 110A and the predetermined wiring line in the multi-layered wiring layer 125 of the second substrate 110B to each other. In the configuration illustrated in FIG. 12D, the predetermined wiring line of the first metal wiring layer in the multi-layered wiring layer 105 or the first substrate 110A and the predetermined wiring line of the second metal wiring layer in the multi-layered wiring layer 125 of the second substrate 110B are electrically coupled to each other by the TSV 157*a*.

Figure 12E:
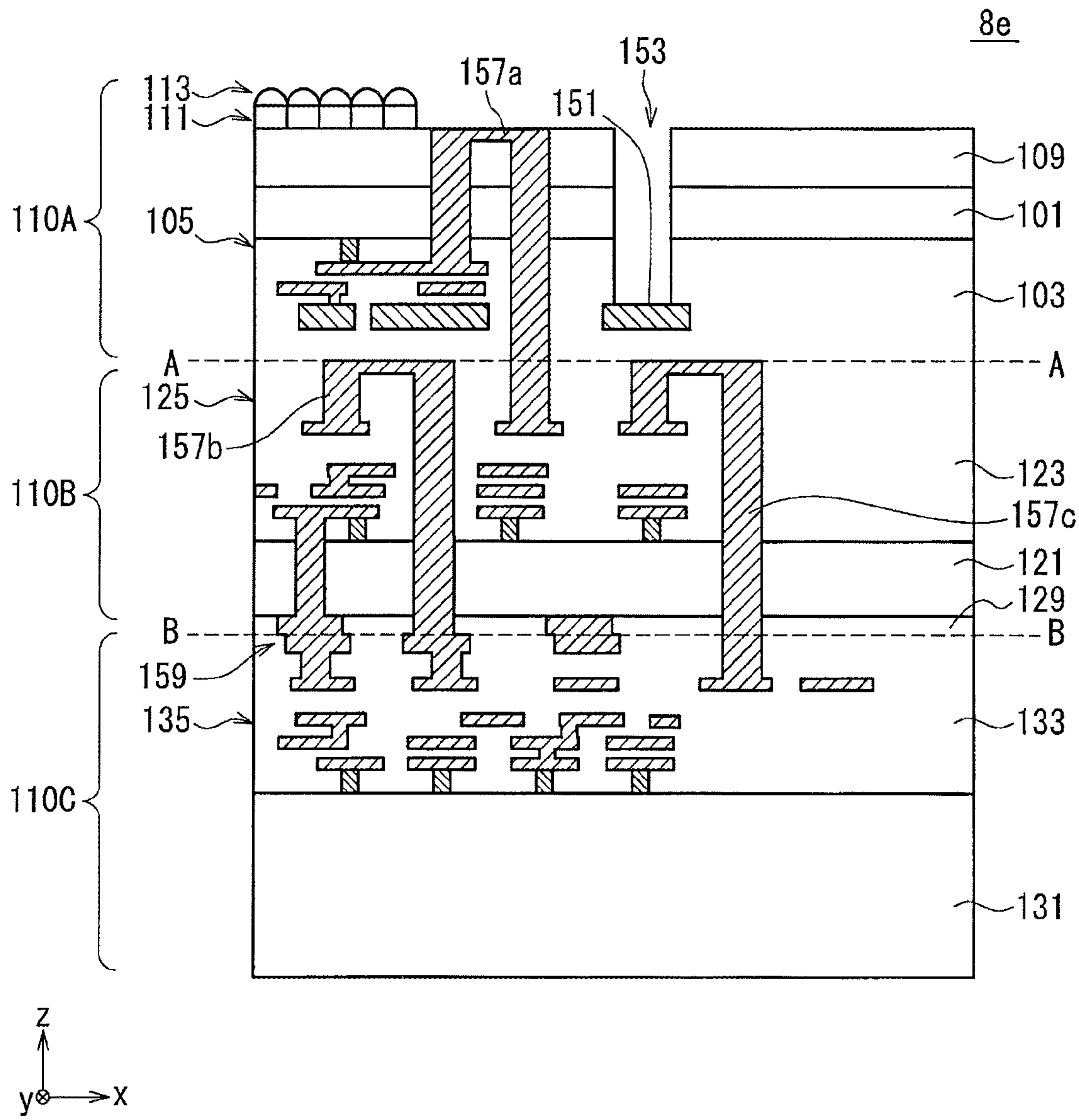
FIG. 12E is a vertical cross-sectional view of a schematic configuration of the solid-state imaging device according to the seventh configuration example of the present embodiment.

A solid-state imaging device 8*e* illustrated in FIG. 12E corresponds to the solid-state imaging device 8*d* illustrated in FIG. 12D in which the types of the wiring lines electrically coupled by the TSV 157*a*, 157*b*, and 157*c* are changed. Specifically, in the configuration illustrated in FIG. 12E, the predetermined wiring line of the first metal wiring layer in the multi-layered wiring layer 105 of the first substrate 110A and the predetermined wiring line of the first metal wiring layer in the multi-layered wiring layer 125 of the second substrate 110B are electrically coupled to each other by the TSV 157*a*. In addition, the predetermined wiring line of the first metal wiring layer in the multi-layered wiring layer 125 of the second substrate 110B and the single-sided electrode in the multi-layered wiring layer 135 of the third substrate 110C are electrically coupled to each other by the TSV 157*b*. In addition, the predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*c*.

Figure 12F:
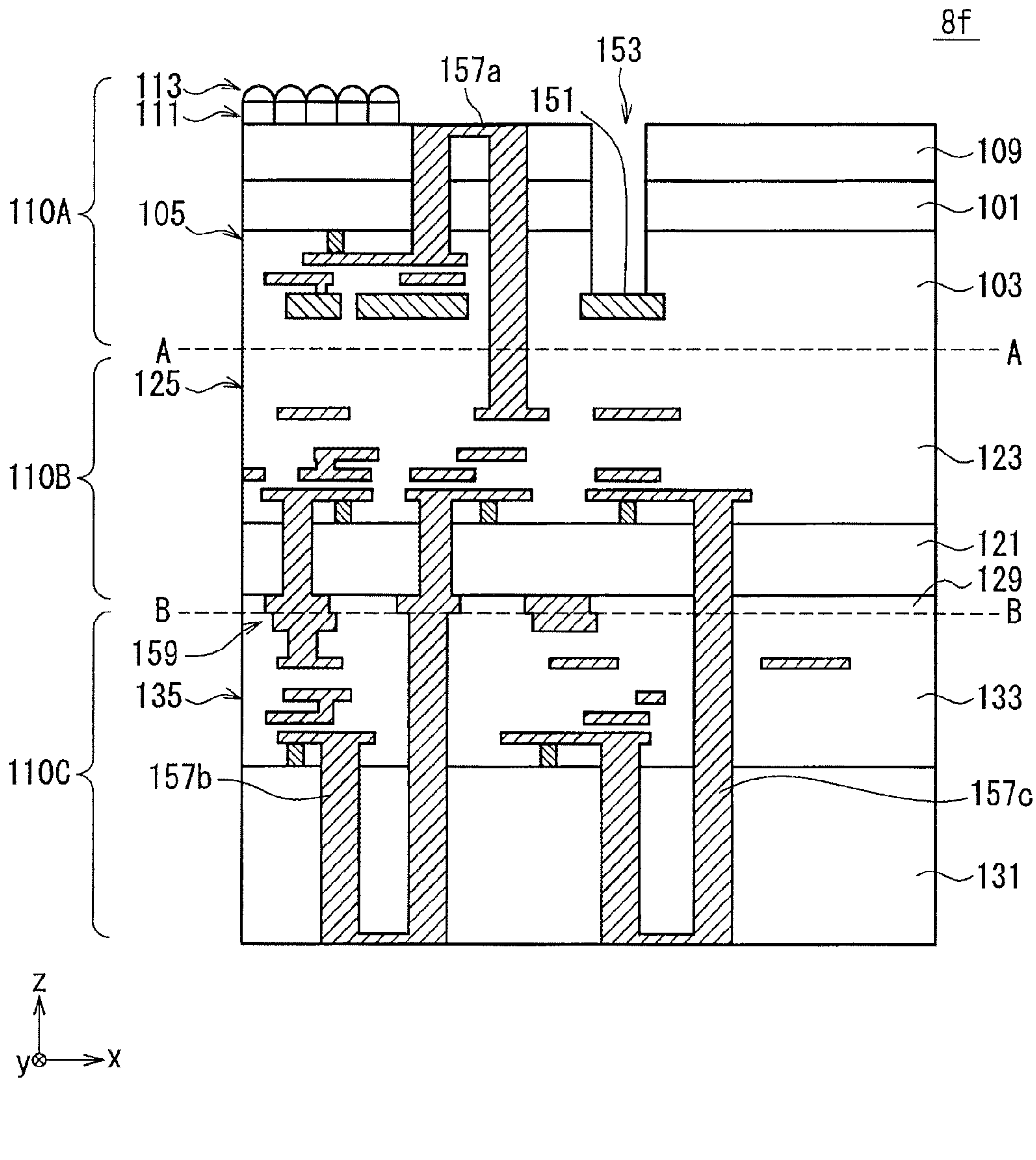
FIG. 12F is a vertical cross-sectional view of a schematic configuration of the solid-state imaging device according to the seventh configuration example of the present embodiment.

A solid-state imaging device 8*f* illustrated in FIG. 12F corresponds to the solid-state imaging device 8*e* illustrated in FIG. 12E in which the configurations of the TSVs 157*b* and 157*c* are changed. Specifically, in the configuration illustrated in FIG. 12F, the TSV 157*b* is formed from the back surface side of the third substrate 110C toward the second substrate 110B, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 12F, a single-sided electrode provided in the insulating film 129 on the back surface side of the second substrate 110B and the predetermined wiring line of the first metallic wiring layer in the multi-layered wiring layer 135 of the third substrate 110C are electrically coupled to each other by the TSV 157*b*. In addition, the TSV 157*c* is formed from the back surface side of the third substrate 110C toward the second substrate 110B, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 12F, the predetermined wiring line of the first metal wiring layer in the multi-layered wiring layer 125 of the second substrate 110 and the predetermined wiring line of the first metal wiring layer in the multi-layered wiring layer 135 of the third substrate 110C are electrically coupled to each other by the TSV 157*c*.

Figure 12G:
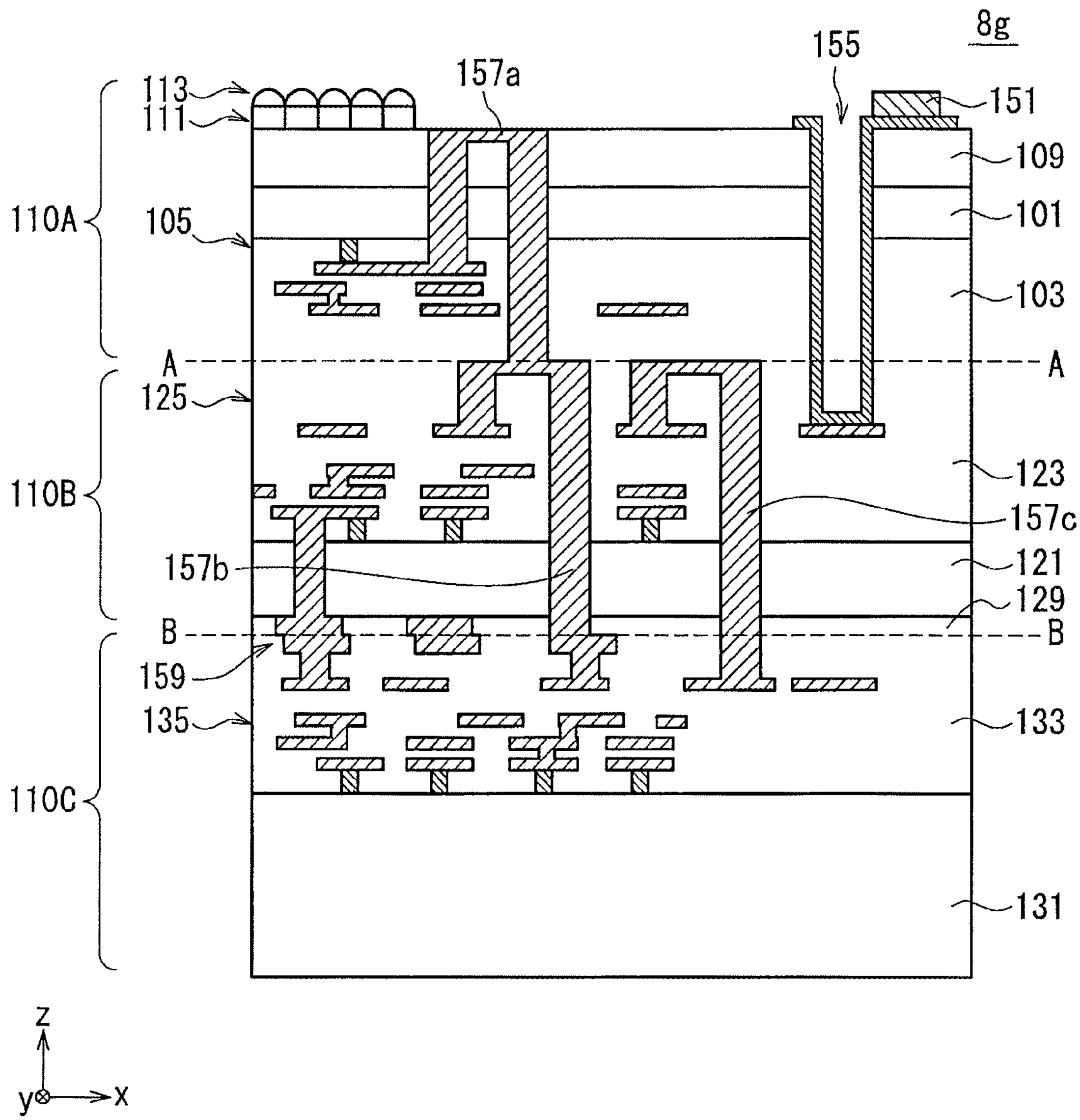
FIG. 12G is a vertical cross-sectional view of a schematic configuration of the solid-state imaging device according to the seventh configuration example of the present embodiment.

A solid-state imaging device 8*g* illustrated in FIG. 12G corresponds to the solid-state imaging device 8*c* illustrated in FIG. 12C in which the embedded-pad structure is changed. Specifically, in the configuration illustrated in FIG. 12G, the non-embedded type lead-out pad structure for the second substrate 110B (i.e., the lead line opening 155 for the predetermined wiring line in the multi-layered wiring layer 125 of the second substrate 110B and the pad 151 on the surface on the back surface side of the first substrate 110A) is provided instead of the embedded pad structure.

Figure 12H:
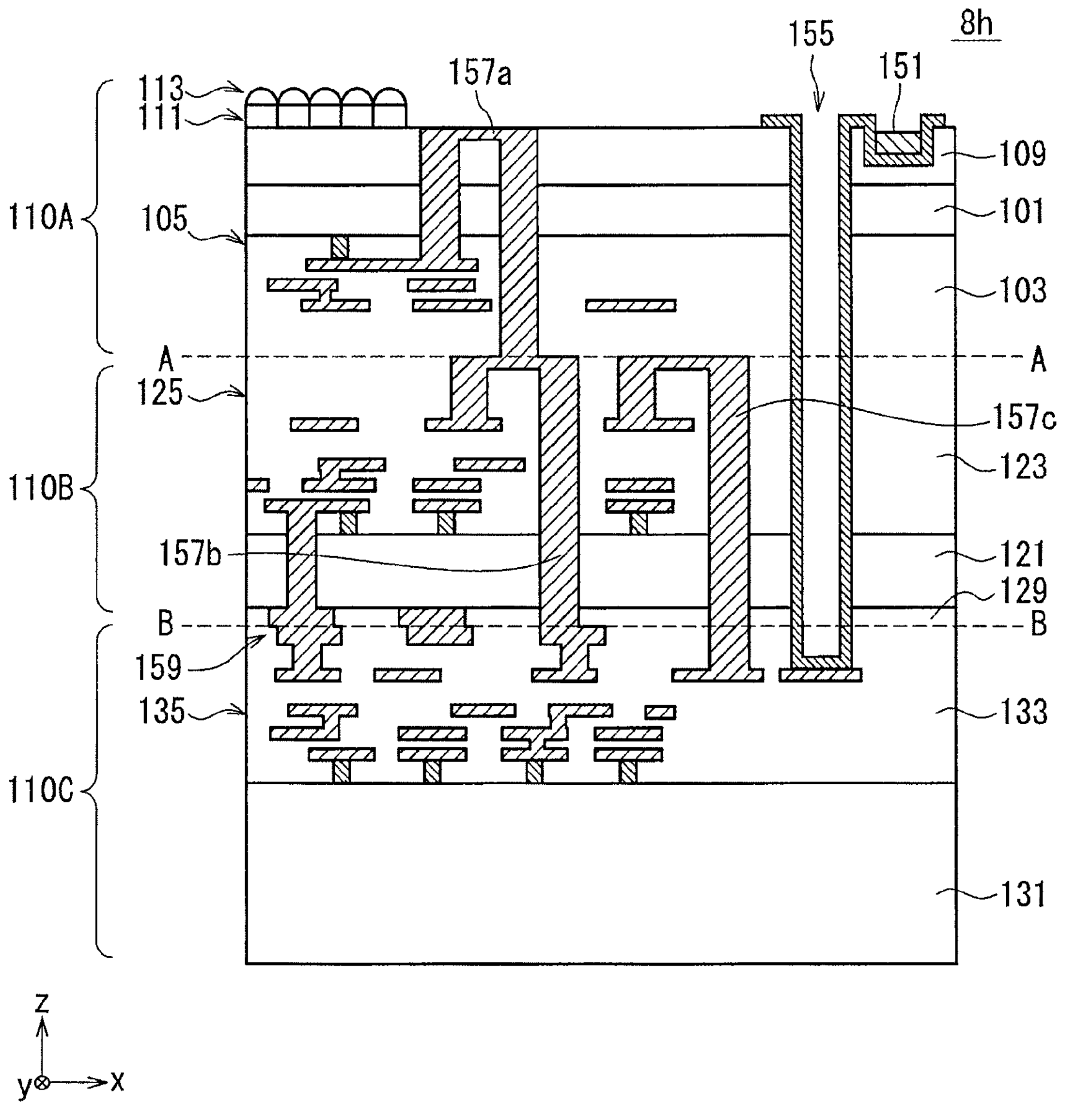
FIG. 12H is a vertical cross-sectional view of a schematic configuration of the solid-state imaging device according to the seventh configuration example of the present embodiment.

A solid-state imaging device 8*h* illustrated in FIG. 12H corresponds to the solid-state imaging device 8*g* illustrated in FIG. 12G in which the configuration of the lead-out pad structure is changed. Specifically, in the configuration illustrated in FIG. 12H, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 109 on the surface on the back surface side of the first substrate 110A) is provided instead of the non-embedded type lead-out pad structure for the second substrate 110B.

Figure 12I:
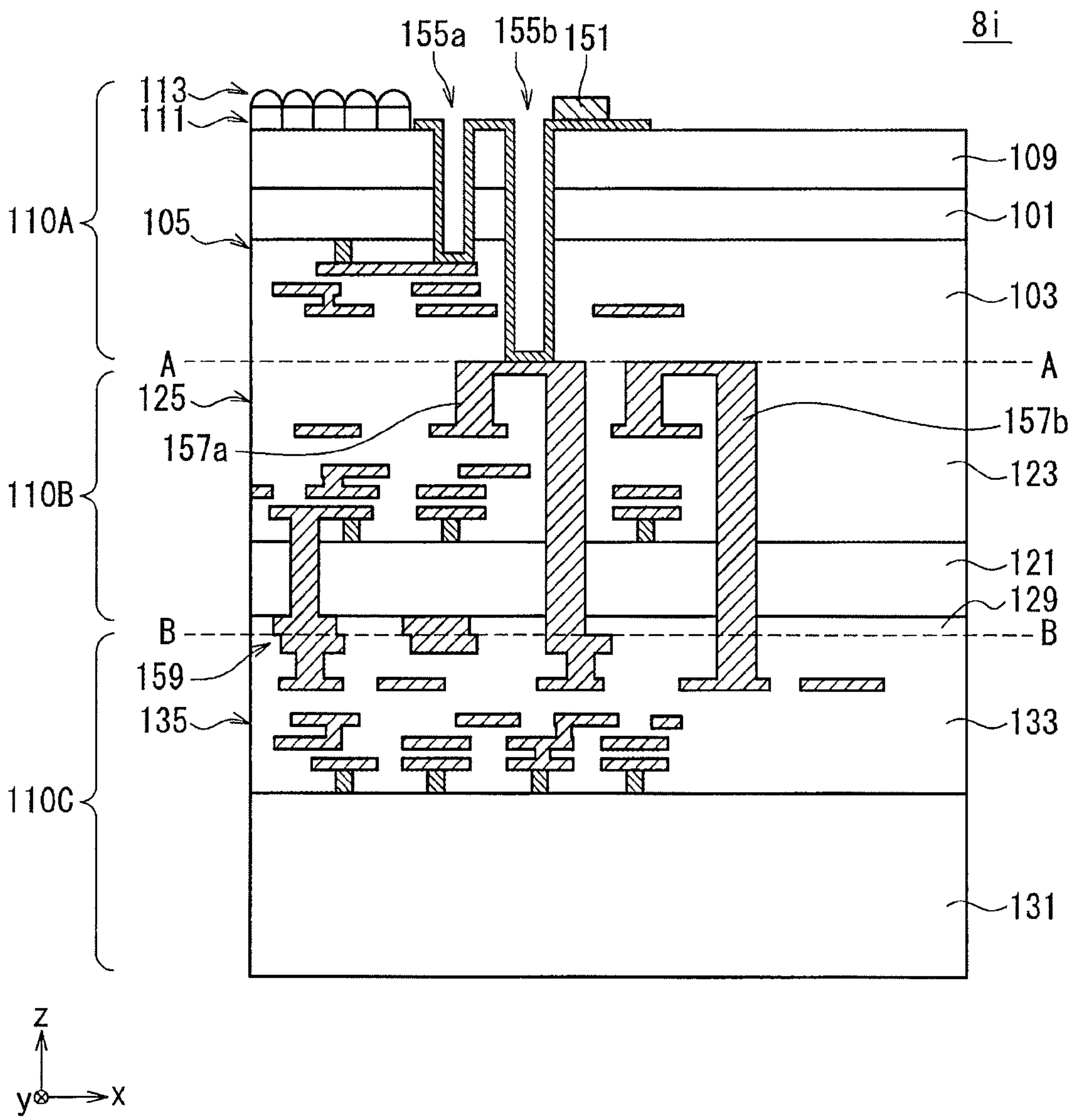
FIG. 12I is a vertical cross-sectional view of a schematic configuration of the solid-state imaging device according to the seventh configuration example of the present embodiment.
Figure 12J:
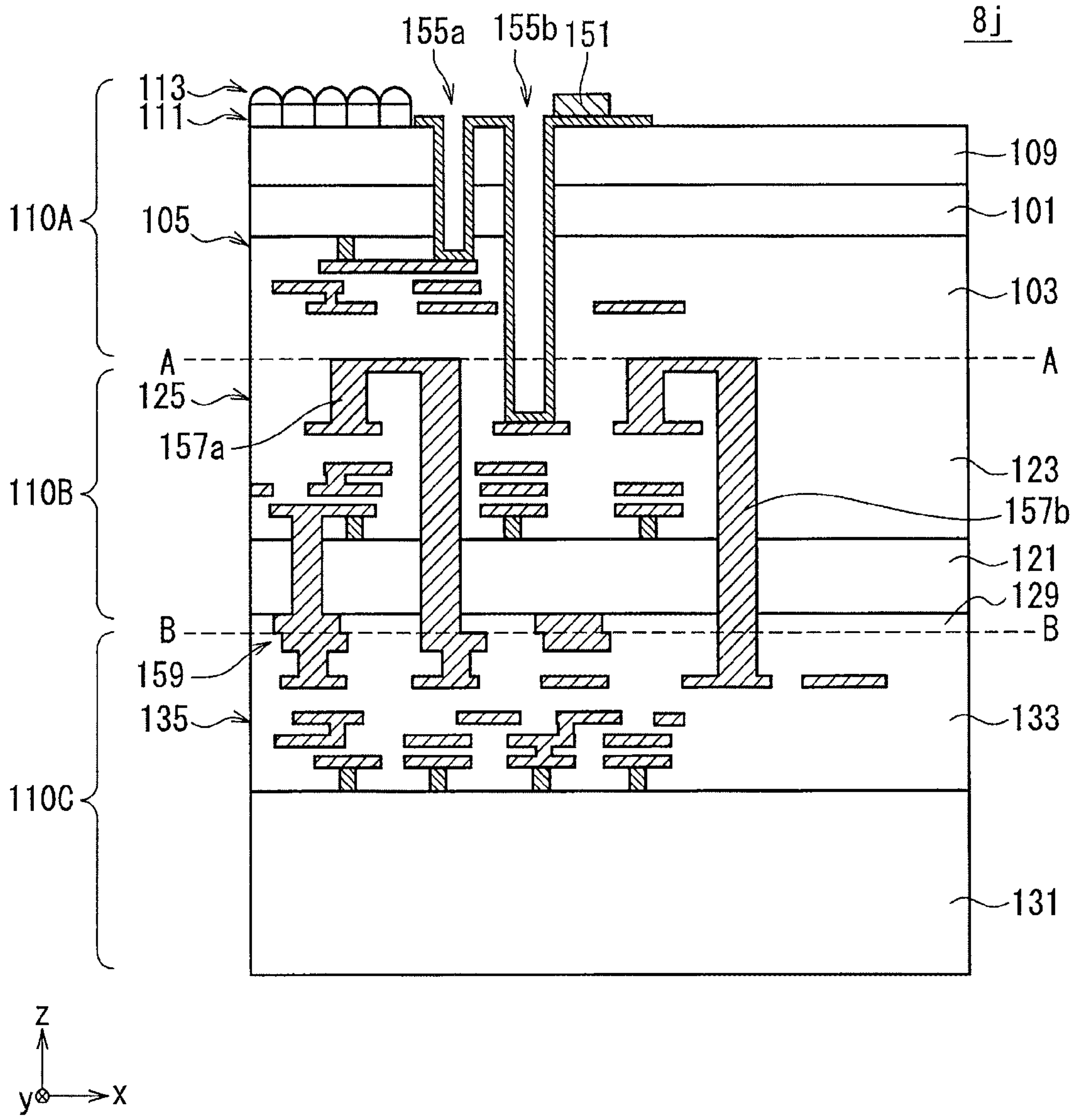
FIG. 12J is a vertical cross-sectional view of a schematic configuration of the solid-state imaging device according to the seventh configuration example of the present embodiment.

A solid-state imaging device 8*i* illustrated in FIG. 12I corresponds to the solid-state imaging device 8*c* illustrated in FIG. 12C in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded pad structure by changing the embedded type TSV 157*a* to the non-embedded type TSV A solid-state imaging device 8*j* illustrated in FIG. 12J corresponds to the solid-state imaging device 8*e* illustrated in FIG. 12E in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded pad structure by changing the embedded type TSV 157*a* to the non-embedded type TSV.

Figure 12K:
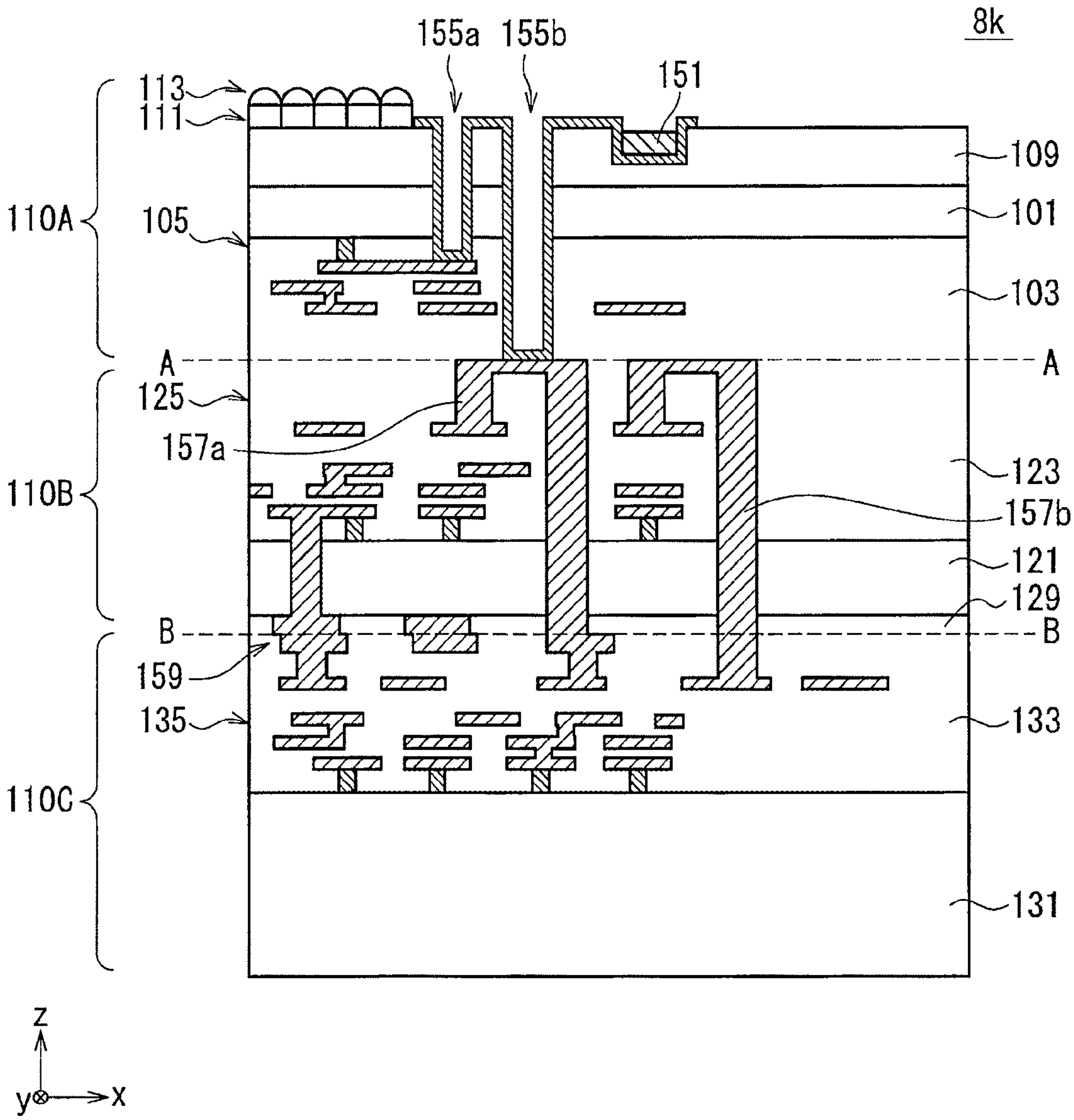
FIG. 12K is a vertical cross-sectional view of a schematic configuration of the solid-state imaging device according to the seventh configuration example of the present embodiment.

A solid-state imaging device 8*k* illustrated in FIG. 12K corresponds to the solid-state imaging device 8*i* illustrated in FIG. 12I in which the non-embedded type lead-out pad structure of the TSV dual-use lead line openings 155*a* and 155*b* is changed to the embedded type lead-out pad structure.

Figure 12L:
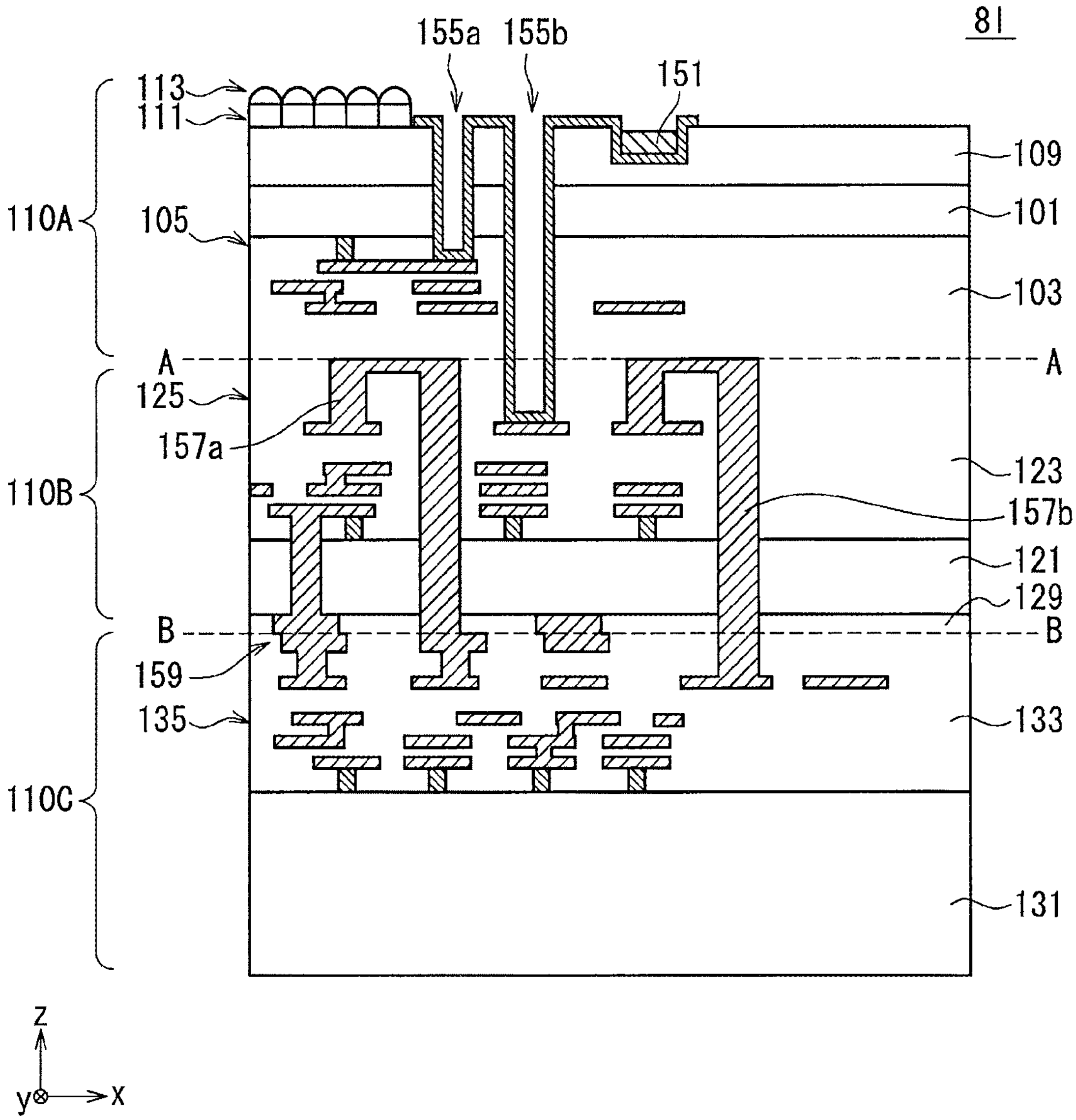
FIG. 12L is a vertical cross-sectional view of a schematic configuration of the solid-state imaging device according to the seventh configuration example of the present embodiment.

A solid-state imaging device 8*l* illustrated in FIG. 12L corresponds to the solid-state imaging device 8*j* illustrated in FIG. 12J in which the non-embedded type lead-out pad structure of the TSV dual-use lead line openings 155*a* and 155*b* is changed to the embedded type lead-out pad structure.

Note that, in each of the configurations illustrated in FIGS. 12A to 12L, the types of the wiring lines coupled by the twin contact type TSV 157 between two layers are not limited. The TSV 157 may be coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

Further, in each of the configurations illustrated in FIGS. 12A to 12H, the substrate on which the pad 151 is provided is not limited to the illustrated example. In the seventh configuration example, the respective signal lines provided in the first substrate 110A and the second substrate 110B are electrically coupled to each other and the respective power supply lines provided in the first substrate 110A and the second substrate 110B are electrically coupled to each other by the TSV 157*a* on one side. The respective signal lines provided in the second substrate 110B and the third substrate 110C are electrically coupled to each other and the respective power supply lines provided in the second substrate 110B and the third substrate 110C are electrically coupled to each other by the TSVs 157*b* and 157*c* and the electrode junction structure 159 on the other side. Accordingly, the pad 151 as the coupling structure may not be provided. Thus, for example, in each of the configurations illustrated in FIGS. 12A to 12H, the pad 151 may be provided on any of the substrates 110A, 110B, and 110C to derive a desired signal.

In a case where the lead-out pad structure is provided, the lead-out pad structure may be the non-embedded type or the embedded type. For example, in the configuration illustrated in FIG. 12G, the embedded type lead-out pad structure may be provided instead of the non-embedded type lead-out pad structure. Further, for example, in the configuration illustrated in FIG. 12H, the non-embedded type lead-out pad structure may be provided instead of the embedded type lead-out pad structure.

In each of the configurations illustrated in FIGS. 12A and 12C to 12L, the TSV 157*b* contacts with the single-sided electrode in the illustrated example, but the present embodiment is not limited to such an example. In each of these configurations, in the same manner as the configuration illustrated in FIG. 12B, the TSV 157*b* may be configured to contact with the double-sided electrode. In a case where the TSV 157*b* is configured to contact with the double-sided electrode, the TSV 157*b* functions as a via included in the electrode junction structures 159.

4-8. Eighth Configuration Example

FIGS. 13A to 13H are each a vertical cross-sectional view of a schematic configuration of a solid-state imaging device according to an eighth configuration example of the present embodiment. The solid-state imaging device according to the present embodiment may have each of the configurations illustrated in FIGS. 13A to 13H.

Figure 13A:
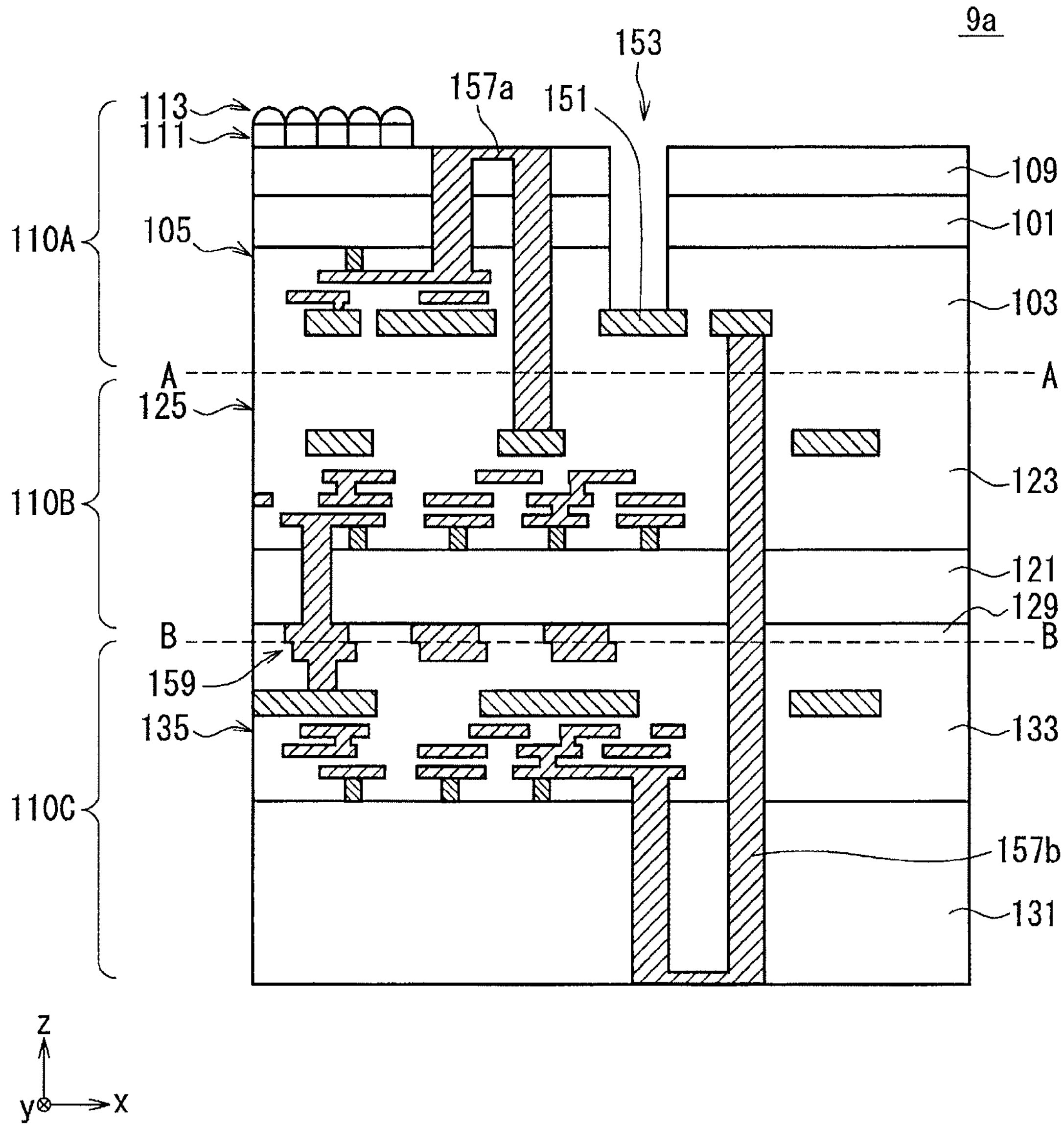
FIG. 13A is a vertical cross-sectional view of a schematic configuration of a solid-state imaging device according to an eighth configuration example of the present embodiment.

A solid-state imaging device 9*a* illustrated in FIG. 13A includes, as coupling structures, the TSV 157*a* of the twin contact type and the embedded type between two layers, the TSV 157*b* of the twin contact type and the embedded type between three layers, the electrode junction structure 159 provided between the second substrate 110B and the third substrate 110C, and the embedded pad structure for the first substrate 110A (i.e., the pad 151 provided in the multi-layered wiring layer 105 of the first substrate 110A and the pad opening 153 exposing the pad 151).

The TSV 157*a* is formed from the back surface side of the first substrate 110A toward the second substrate 110, and is so provided as to electrically couple the respective signal lines provided in the first substrate 110A and the second substrate 110B to each other and the respective power supply lines provided in the first substrate IIDA and the second substrate 110B to each other. In the configuration illustrated in FIG. 13A, the predetermined wiring line of the first metal wiring layer in the multi-layered wiring layer 105 of the first substrate 110A and the predetermined wiring line of the second metal wiring layer in the multi-layered wiring layer 125 of the second substrate 110B are electrically coupled to each other by the TSV 157*a*. In addition, the TSV 157*b* is formed from the back surface side of the third substrate 110C toward the first substrate 110A, and is so provided as to electrically couple the respective signal lines provided in the first substrate 110A and the third substrate 110C to each other and the respective power supply lines provided in the first substrate 110A and the third substrate 110C to each other. In the configuration illustrated in FIG. 13A, the predetermined wiring line of the second metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*. In addition, the respective signal lines provided in the second substrate 110B and the third substrate 110C are electrically coupled to each other and the respective power supply lines provided in the second substrate 110B and the third substrate 110C are electrically coupled to each other by the electrode junction structure 159.

Figure 13B:
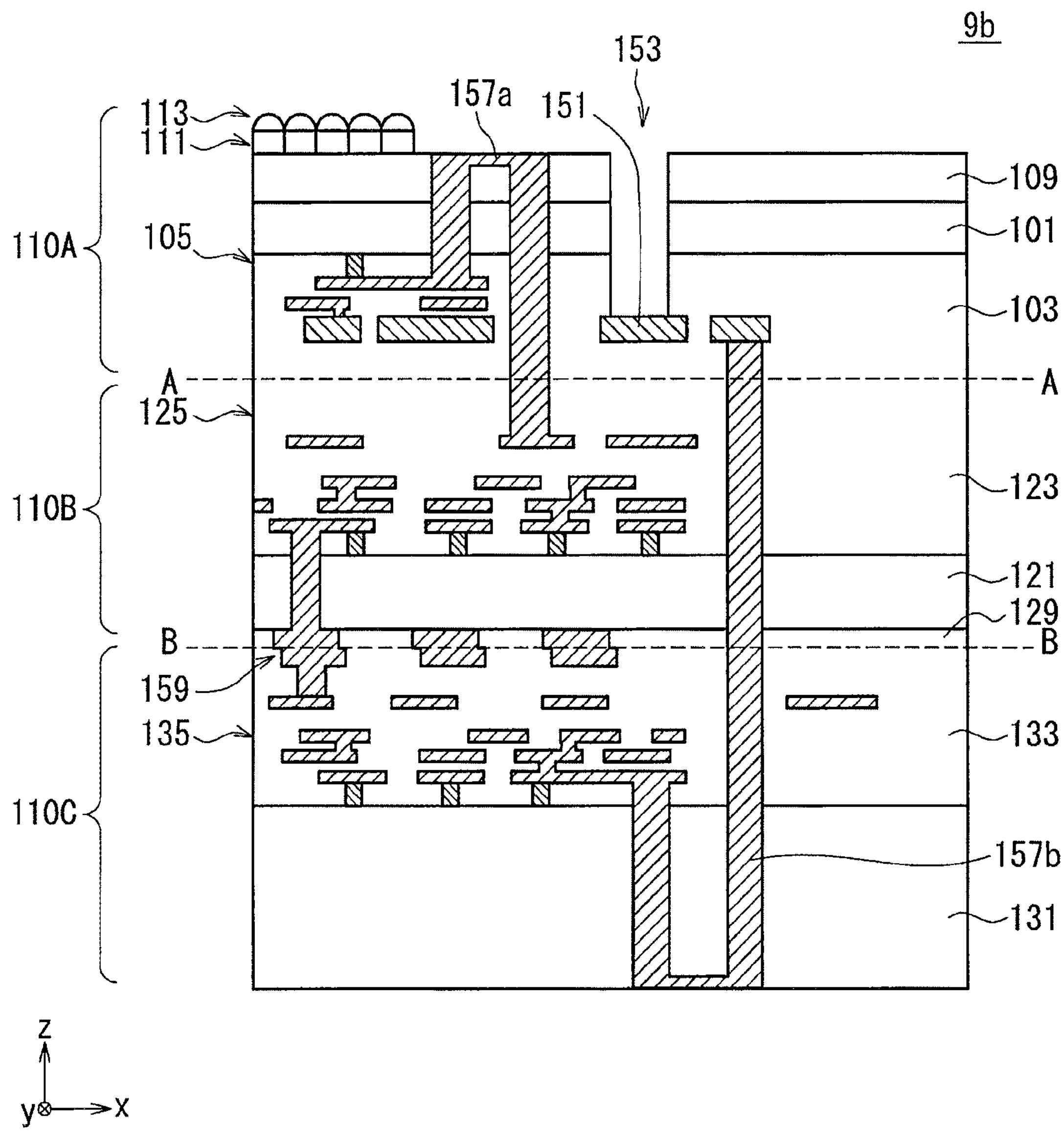
FIG. 13B is a vertical cross-sectional view of a schematic configuration of the solid-state imaging device according to the eighth configuration example of the present embodiment.

A solid-state imaging device 9*b* illustrated in FIG. 13B corresponds to the solid-state imaging device 9*a* illustrated in FIG. 13A in which the types of the wiring lines electrically coupled by the TSV 157*a* are changed. Specifically, in the configuration illustrated in FIG. 13B, the predetermined wiring line of the first metal wiring layer in the multi-layered wiring layer 105 of the first substrate 110A and the predetermined wiring line of the first metal wiring layer in the multi-layered wiring layer 125 of the second substrate 110B are electrically coupled to each other by the TSV 157*a*.

Figure 13C:
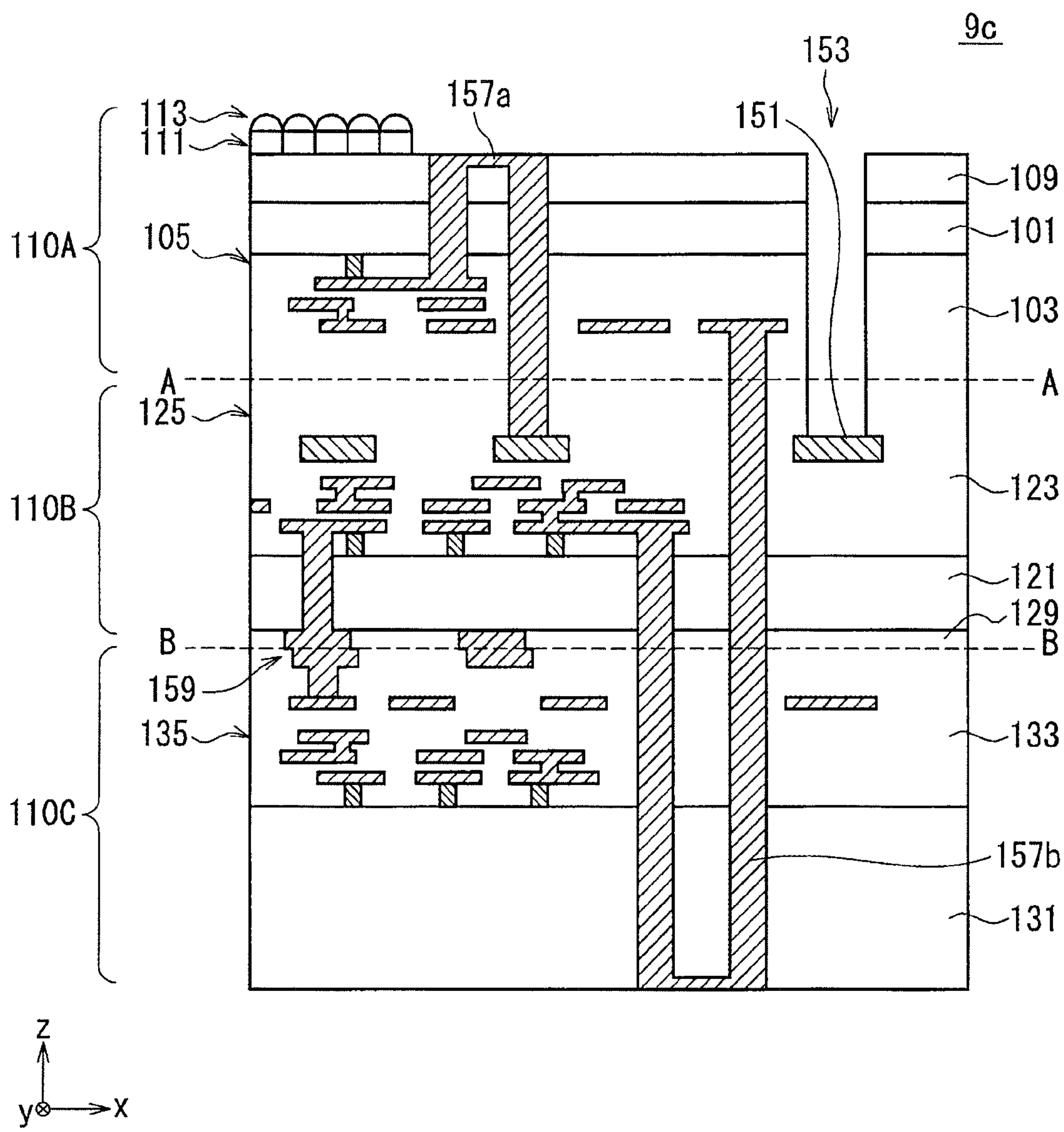
FIG. 13C is a vertical cross-sectional view of a schematic configuration of the solid-state imaging device according to the eighth configuration example of the present embodiment.

A solid-state imaging device 9*c* illustrated in FIG. 13C corresponds to the solid-state imaging device 9*a* illustrated in FIG. 13A in which the TSV 157*b* structure is changed. Specifically, in the configuration illustrated in FIG. 13C, the TSV 157*b* is formed from the back surface side of the third substrate 110C toward the first substrate 110A, and is so provided as to electrically couple the respective signal lines provided in the first substrate 11A and the second substrate 110B to each other and the respective power supply lines provided in the first substrate 110A and the second substrate 110B to each other. In the configuration illustrated in FIG. 13C, the predetermined wiring line of the first metal wiring layer in the multi-layered wiring layer 105 of the first substrate 110A and the predetermined wiring line of the first metal wiring layer in the multi-layered wiring layer 125 of the second substrate 110B are electrically coupled to each other by the TSV 157*b*.

Figure 13D:
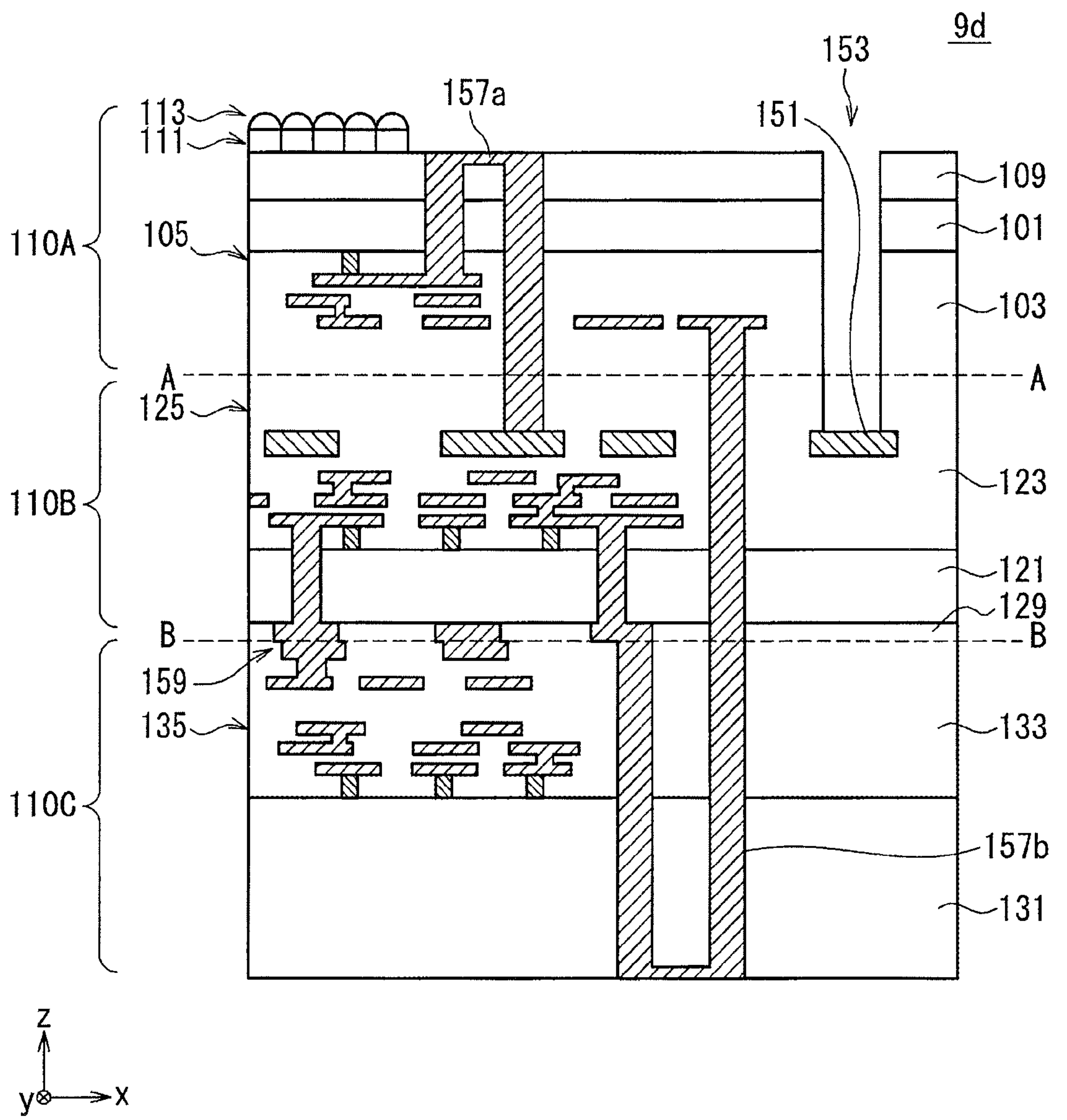
FIG. 13D is a vertical cross-sectional view of a schematic configuration of the solid-state imaging device according to the eighth configuration example of the present embodiment.

A solid-state imaging device 9*d* illustrated in FIG. 13D corresponds to the solid-state imaging device 9*c* illustrated in FIG. 13C in which the TSV 157*b* structure is changed. Specifically, in the configuration illustrated in FIG. 13D, the TSV 157*b* is formed from the back surface side of the third substrate 110C toward the first substrate 110A, and is so provided as to electrically couple the respective signal lines provided in the first substrate 110A and the second substrate 110B to each other and the respective power supply lines provided in the first substrate 110A and the second substrate 110B to each other In the configuration illustrated in FIG. 13D, the predetermined wiring line of the first metal wiring layer in the multi-layered wiring layer 105 of the first substrate 110A and the single-sided electrode provided in the insulating film 129 on the back surface side of the second substrate 110B are electrically coupled to each other by the TSV 157*b*.

Figure 13E:
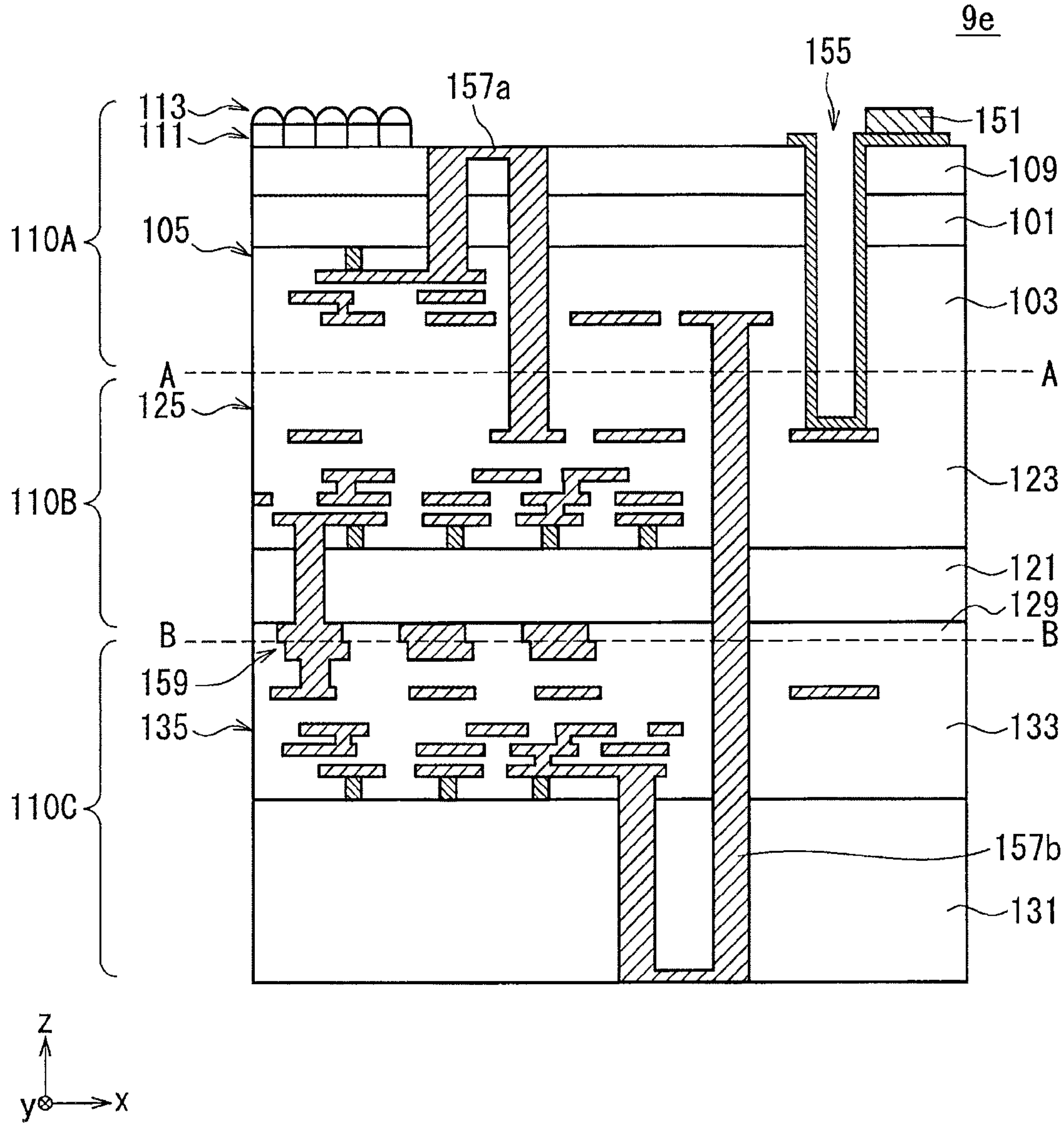
FIG. 13E is a vertical cross-sectional view of a schematic configuration of the solid-state imaging device according to the eighth configuration example of the present embodiment.

A solid-state imaging device 9*e* illustrated in FIG. 13E corresponds to the solid-state imaging device 9*b* illustrated in FIG. 13B in which the embedded pad structure is changed and the types of the wiring lines electrically coupled by the TSV 157*b* are changed. Specifically, in the configuration illustrated in FIG. 13E, the non-embedded type lead-out pad structure for the second substrate 110B (i.e., the lead line opening 155 for the predetermined wiring line in the multi-layered wiring layer 125 of the second substrate 110B and the pad 151 on the surface on the back surface side of the first substrate 110A) is provided instead of the embedded pad structure. In addition, in the configuration illustrated in FIG. 13E, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*.

Figure 13F:
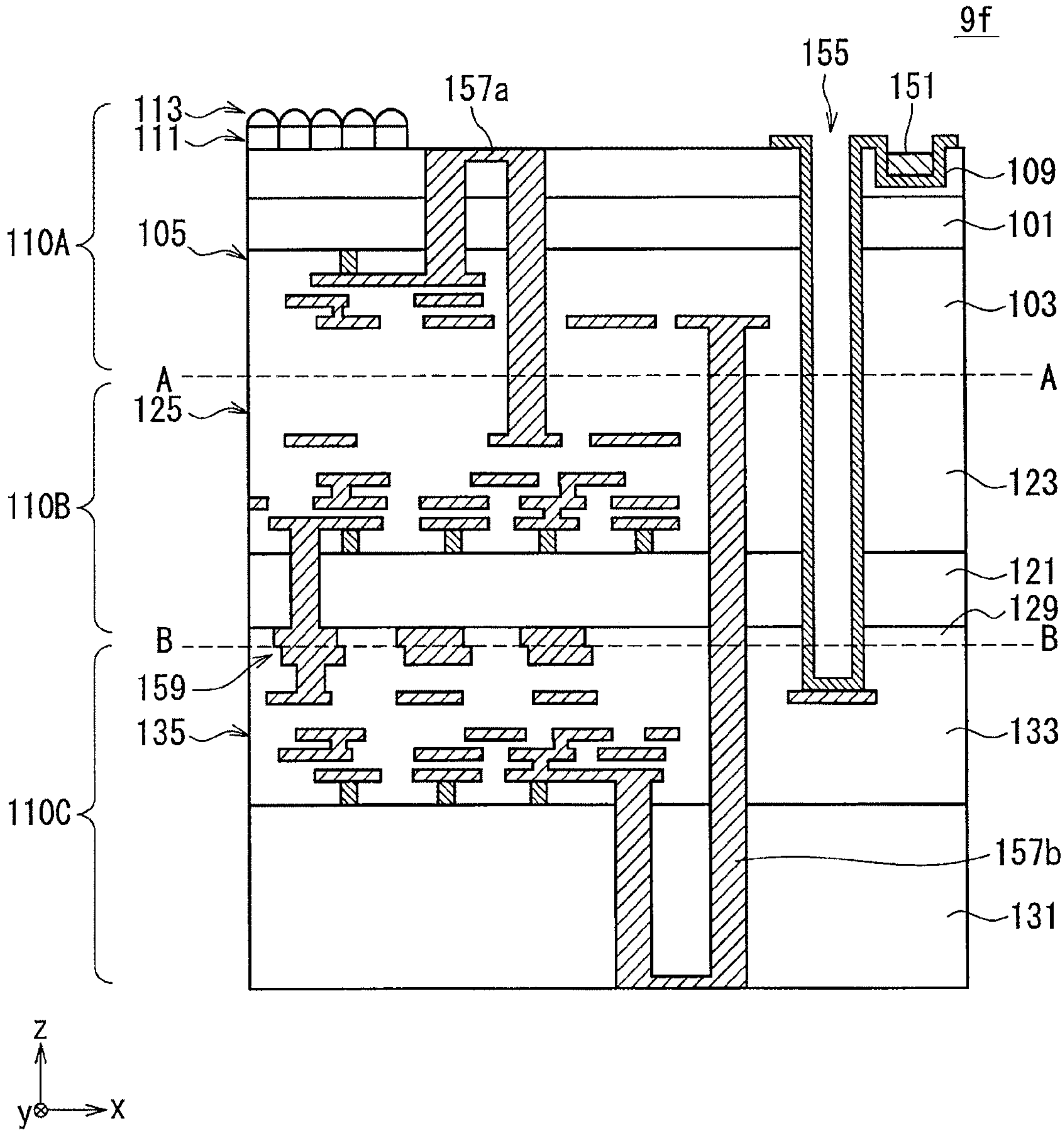
FIG. 13F is a vertical cross-sectional view of a schematic configuration of the solid-state imaging device according to the eighth configuration example of the present embodiment.

A solid-state imaging device 9*f* illustrated in FIG. 13F corresponds to the solid-state imaging device 9*e* illustrated in FIG. 13E in which the configuration of the lead-out pad structure is changed. Specifically, in the configuration illustrated in FIG. 13F, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 109 on the surface on the back surface side of the first substrate 110A) is provided instead of the non-embedded type lead-out pad structure for the second substrate 110B.

Figure 13G:
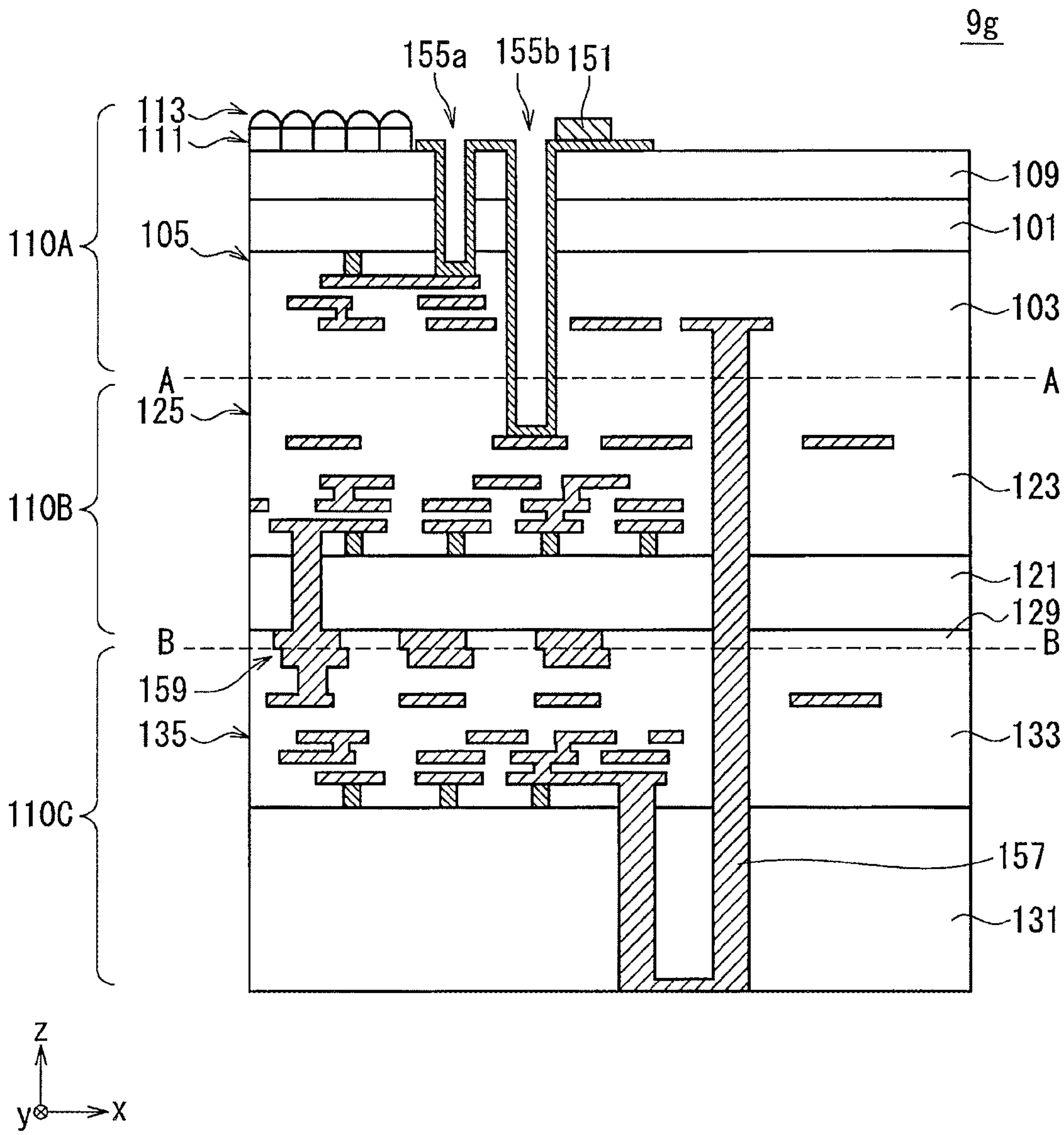
FIG. 13G is a vertical cross-sectional view of a schematic configuration of the solid-state imaging device according to the eighth configuration example of the present embodiment.

A solid-state imaging device 9*g* illustrated in FIG. 13G corresponds to the solid-state imaging device 9*f* illustrated in FIG. 13F in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded type lead-out pad structure by changing the embedded type TSV 157*a* to the non-embedded type TSV.

Figure 13H:
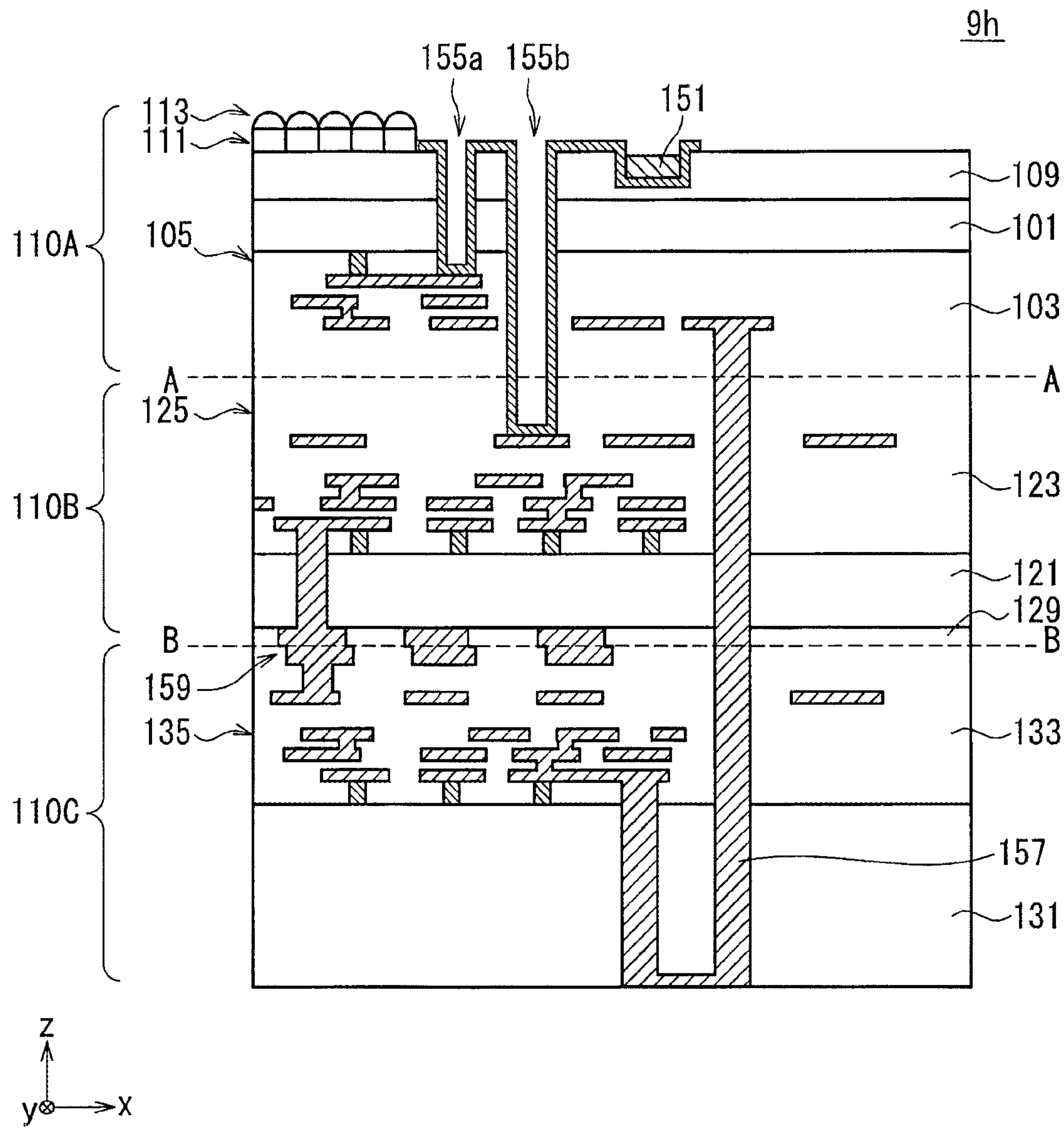
FIG. 13H is a vertical cross-sectional view of a schematic configuration of the solid-state imaging device according to the eighth configuration example of the present embodiment.

A solid-state imaging device 9*h* illustrated in FIG. 13H corresponds to the solid-state imaging device 9*g* illustrated in FIG. 130 in which the non-embedded type lead-out pad structure of the TSV dual-use lead line openings 155*a* and 155*b* is changed to the embedded type lead-out pad structure.

Note that, in each of the configurations illustrated in FIGS. 13A to 13H, the types of the wiring lines coupled by the twin contact type TSVs 157 between two layers and three layers are not limited. These TSVs 157 may be each coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In each of the configurations illustrated in FIGS. 13A to 13F, the substrate on which the pad 151 is provided is not limited to the illustrated example. In each of these configurations, the respective signal lines provided in the first substrate 110A and the second substrate 110B are electrically coupled to each other and the respective power supply lines provided in the first substrate 110A and the second substrate 110B are electrically coupled to each other by the TSV 157*a*. The respective signal lines provided in the second substrate 110B and the third substrate 110C are electrically coupled to each other and the respective power supply lines provided in the second substrate 110B and the third substrate 110C are electrically coupled to each other by the electrode junction structure 159. Accordingly, the pad 151 as the coupling structure may not be provided. Thus, for example, in each of the configurations illustrated in FIGS. 13A to 13F, the pad 151 may be provided on any of the substrates 110A, 110B, and 110C to derive a desired signal.

In a case where a lead-out pad structure is provided, the lead-out pad structure may be the non-embedded type or the embedded type. For example, in the configuration illustrated in FIG. 13E, the embedded type lead-out pad structure may be provided instead of the non-embedded type lead-out pad structure. Further, for example, in the configuration illustrated in FIG. 13F, the non-embedded type lead-out pad structure may be provided instead of the embedded type lead-out pad structure.

In each of the configurations illustrated in FIGS. 13A to 13H, the TSV 157 of the twin contact type and the embedded type between three layers is formed from the back surface side of the third substrate 110C toward the first substrate 110A, but the present embodiment is not limited to such an example. The TSV 157 may be formed from the back surface side of the first substrate 110A toward the third substrate 110C.

In addition, it is sufficient for the twin contact type TSV 157 between three layers to electrically couple the respective signal lines as well as the respective power supply lines provided in two of the first substrate 110A, the second substrate 110B, and the third substrate 110C to each other in accordance with the direction in which the TSV 157 is formed. The substrates provided with the respective signal lines as well as the respective power supply lines to be electrically coupled to each other by the TSV 157 may be optionally changed.

In the configuration illustrated in FIG. 13D, the TSV 157*b* contacts with the single-sided electrode in the illustrated example, but the present embodiment is not limited to such an example. In such a configuration, the TSV 157*b* may be configured to contact with the double-sided electrode. In a case where the TSV 157*b* is configured to contact with the double-sided electrode, the TSV 157*b* functions as a via included in the electrode junction structures 159.

4-9. Ninth Configuration Example

FIGS. 14A to 14K are each a vertical cross-sectional view of a schematic configuration of a solid-state imaging device according to a ninth configuration example of the present embodiment. The solid-state imaging device according to the present embodiment may have each of the configurations illustrated in FIGS. 14A to 14K.

Figure 14A:
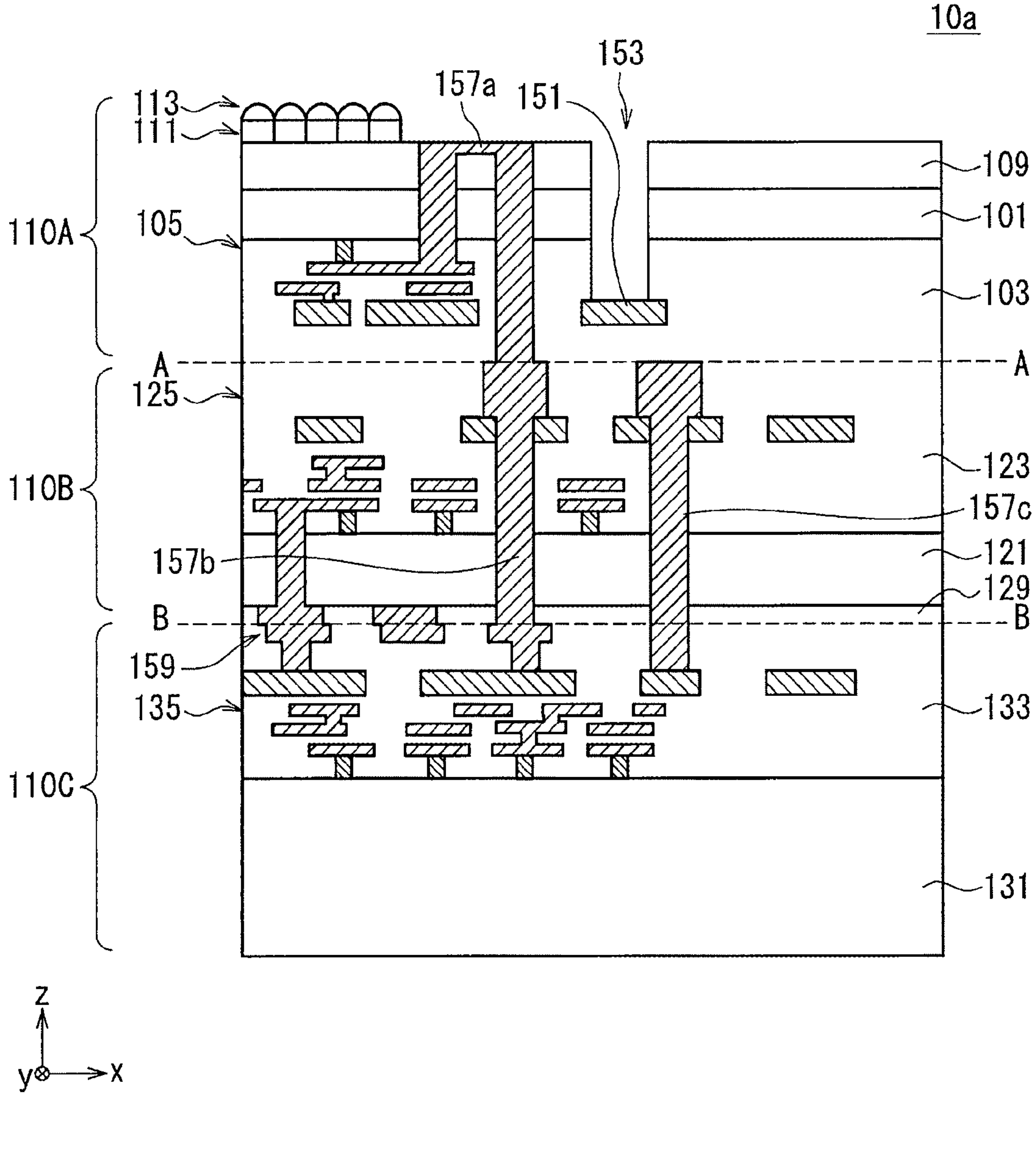
FIG. 14A is a vertical cross-sectional view of a schematic configuration of a solid-state imaging device according to a ninth configuration example of the present embodiment.

A solid-state imaging device 10*a* illustrated in FIG. 14A includes, as coupling structures, the TSV 157*a* of the twin contact type and the embedded type between two layers, the TSV 157*b* of the shared contact type and the embedded type between two layers, the TSV 157*c*, the electrode junction structure 159 provided between the second substrate 110B and the third substrate 110C, and the embedded pad structure for the first substrate 110A (i.e., the pad 151 provided in the multi-layered wiring layer 105 of the first substrate 110A and the pad opening 153 exposing the pad 151).

The TSV 157*a* is formed from the back surface side of the first substrate 110A toward the second substrate 110B, and is so provided as to electrically couple the respective signal lines provided in the first substrate 110A and the second substrate 110B to each other and the respective power supply lines provided in the first substrate 110A and the second substrate 110B to each other. The TSVs 157*b* and 157*c* are each formed from the front surface side of the second substrate 110B toward the third substrate 110C, and are each so provided as to electrically couple the respective signal lines provided in the second substrate 110B and the third substrate 110C to each other and the respective power supply lines provided in the second substrate 110 and the third substrate 110C to each other. In addition, the respective signal lines provided in the second substrate 110B and the third substrate 110C are electrically coupled to each other and the respective power supply lines provided in the second substrate 110B and the third substrate 110C are electrically coupled to each other by the electrode junction structure 159.

As for the TSV 157*b* and the TSV 157*c*, the TSV 157*b*, one of the two TSVs, is so provided as to electrically couple the predetermined wiring line of the second metal wiring layer in the multi-layered wiring layer 125 of the second substrate 110B and the single-sided electrode in the multi-layered wiring layer 135 of the third substrate 110C to each other. In addition, the TSV 157*c*, the other of the two TSVs, is so provided as to electrically couple the predetermined wiring line of the second metal wiring layer in the multi-layered wiring layer 125 of the second substrate 110B and the predetermined wiring line of the second metal wiring layer in the multi-layered wiring layer 135 of the third substrate 110C.

The TSV 157*a* is so provided as to cause one via to be in contact with the predetermined wiring line of the first metallic wiring layer in the multi-layered wiring layer 105 of the first substrate 110A and the other via to be in contact with the upper end of the TSV 157*b*. That is, the TSV 157*a* is so formed as to electrically couple the predetermined wiring line in the multi-layered wiring layer 105 of the first substrate 110A and the TSV 157*b* to each other. Further, the predetermined wiring line in the multi-layered wiring layer 105 of the first substrate 110A, the predetermined wiring lines in the multi-layered wiring layer 125 of the second substrate 110B electrically coupled by the TSV 157*b*, and the single-sided electrode in the multi-layered wiring layer 135 of the third substrate 110C are electrically coupled together by the TSV 157*a*.

Figure 14B:
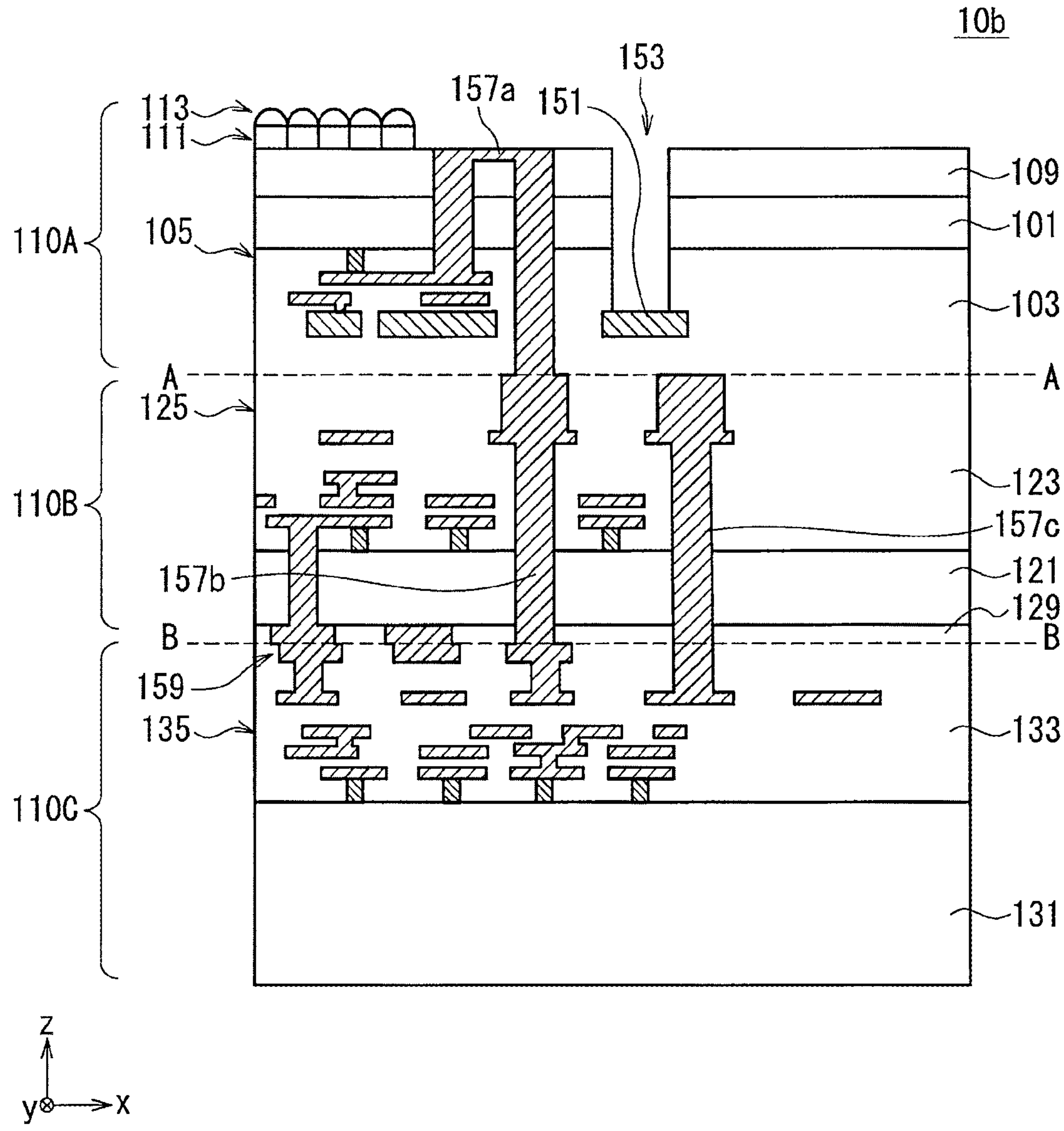
FIG. 14B is a vertical cross-sectional view of a schematic configuration of the solid-state imaging device according to the ninth configuration example of the present embodiment.

A solid-state imaging device 10*b* illustrated in FIG. 14B corresponds to the solid-state imaging device 10*a* illustrated in FIG. 14A in which the types of the wiring lines electrically coupled by the TSVs 157*b* and 157*c* are changed. Specifically, in the configuration illustrated in FIG. 14B, the predetermined wiring line of the first metal wiring layer in the multi-layered wiring layer 125 of the second substrate 110B and the single-sided electrode in the multi-layered wiring layer 135 of the third substrate 110C are electrically coupled to each other by the TSV 157*b*. In addition, the predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*c*.

Figure 14C:
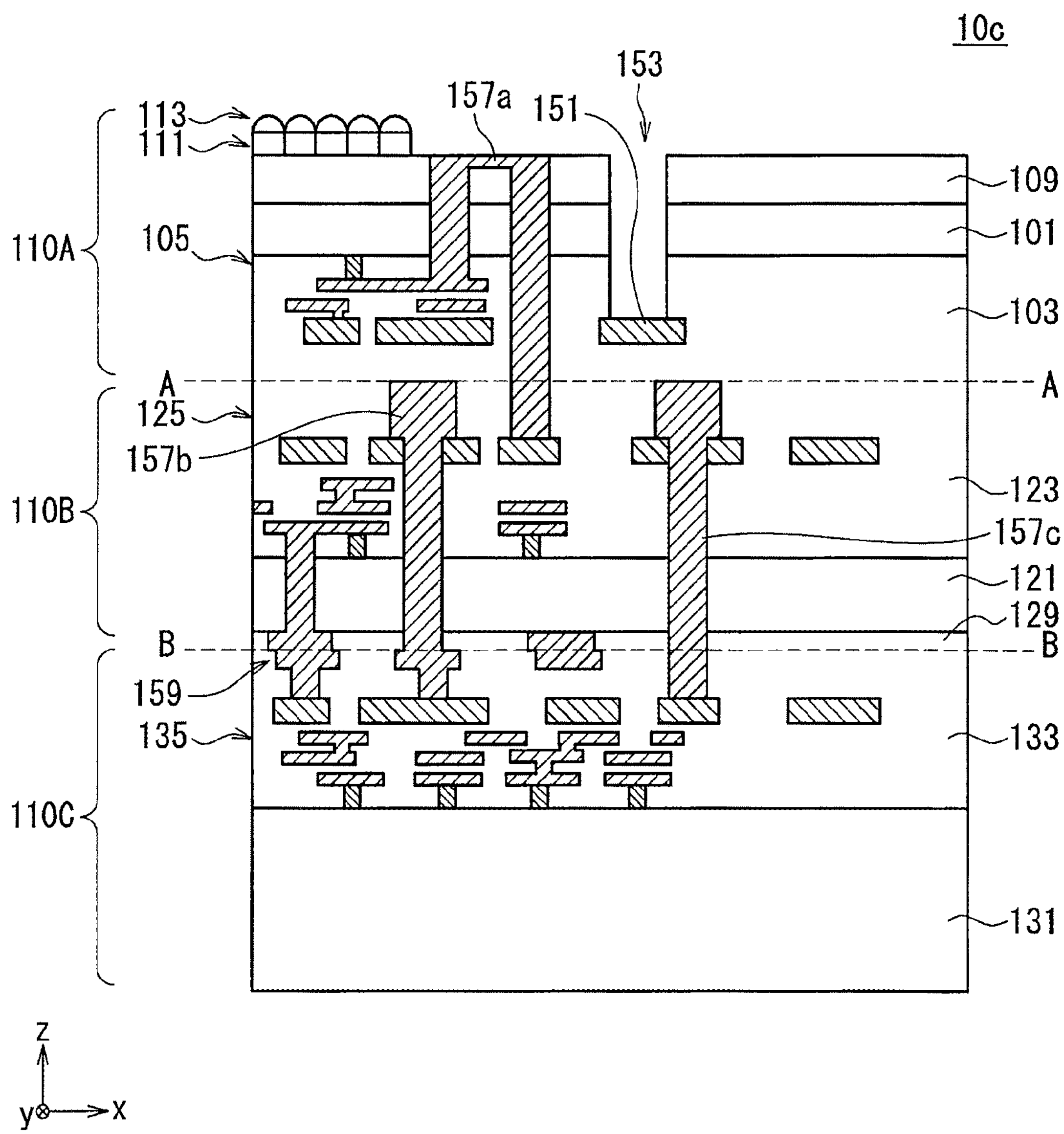
FIG. 14C is a vertical cross-sectional view of a schematic configuration of the solid-state imaging device according to the ninth configuration example of the present embodiment.

A solid-state imaging device 10*c* illustrated in FIG. 14C corresponds to the solid-state imaging device 1*a* illustrated in FIG. 14A in which the TSV 157*a* structure is changed. Specifically, in the configuration illustrated in FIG. 14A, the TSV 157*a* is so provided as to electrically couple the predetermined wiring line in the multi-layered wiring layer 105 of the first substrate 110A and the TSV 157*b* to each other. However, in the configuration illustrated in FIG. 14C, the TSV 157*a* is so provided as to electrically couple the predetermined wiring line in the multi-layered wiring layer 105 of the first substrate 110A to the predetermined wiring line in the multi-layered wiring layer 125 of the second substrate 110B. In the configuration illustrated in FIG. 14C, the predetermined wiring line of the first metal wiring layer in the multi-layered wiring layer 105 of the first substrate 110A and the predetermined wiring line of the second metal wiring layer in the multi-layered wiring layer 125 of the second substrate 110B are electrically coupled to each other by the TSV 157*a*.

Figure 14D:
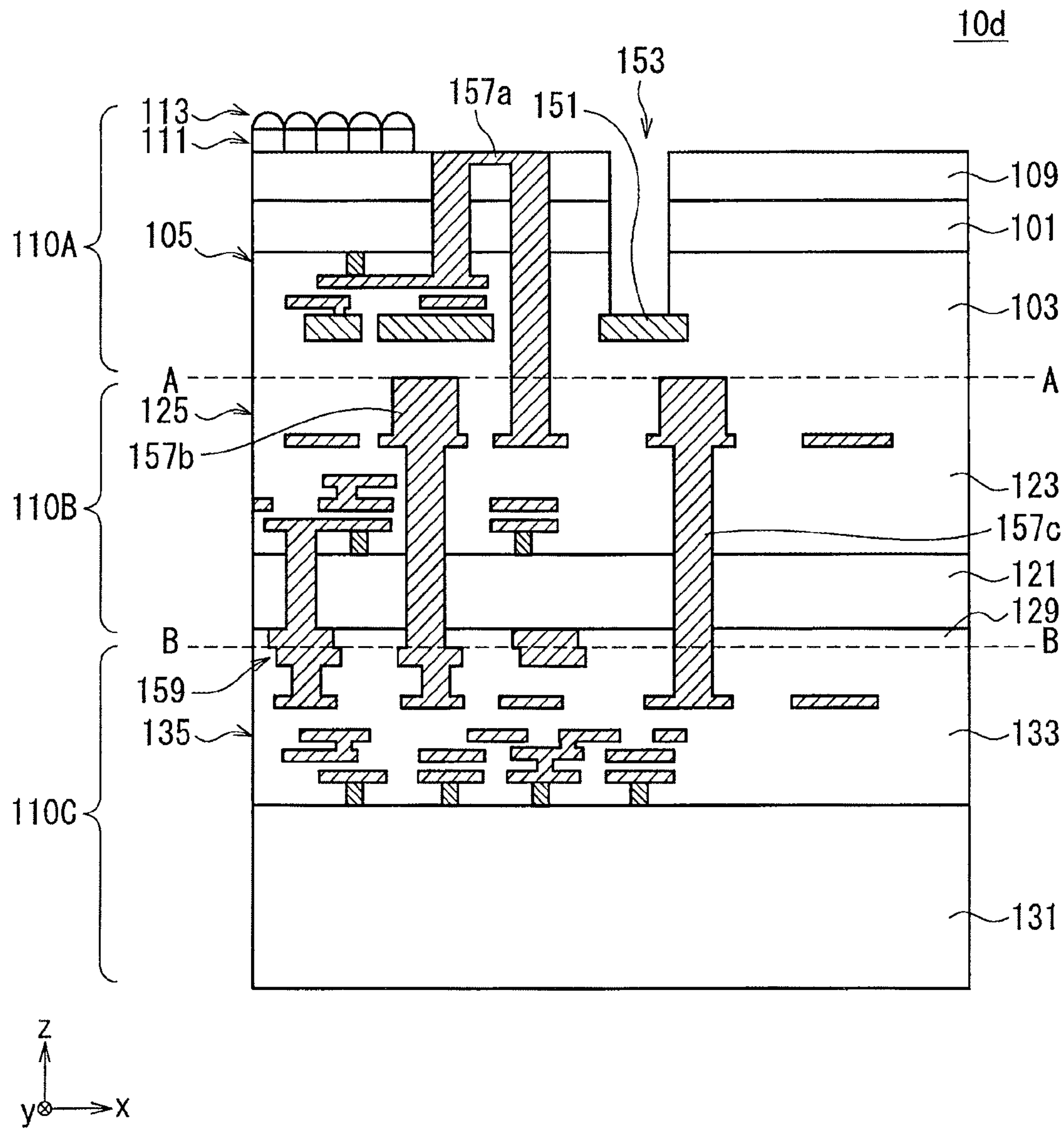
FIG. 14D is a vertical cross-sectional view of a schematic configuration of the solid-state imaging device according to the ninth configuration example of the present embodiment.

A solid-state imaging device 10*d* illustrated in FIG. 14D corresponds to the solid-state imaging device 10*c* illustrated in FIG. 14C in which the types of the wiring lines electrically coupled by the TSVs 157*a*. 157*b*, and 157*c* are changed. Specifically, in the configuration illustrated in FIG. 14D, the predetermined wiring line of the first metal wiring layer in the multi-layered wiring layer 105 of the first substrate 110A and the predetermined wiring line of the first metal wiring layer in the multi-layered wiring layer 125 of the second substrate 110B are electrically coupled to each other by the TSV 157*a*. In addition, the predetermined wiring line of the first metal wiring layer in the multi-layered wiring layer 125 of the second substrate 110B and the single-sided electrode in the multi-layered wiring layer 135 of the third substrate 110C are electrically coupled to each other by the TSV 157*b*. In addition, the predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*c*.

Figure 14E:
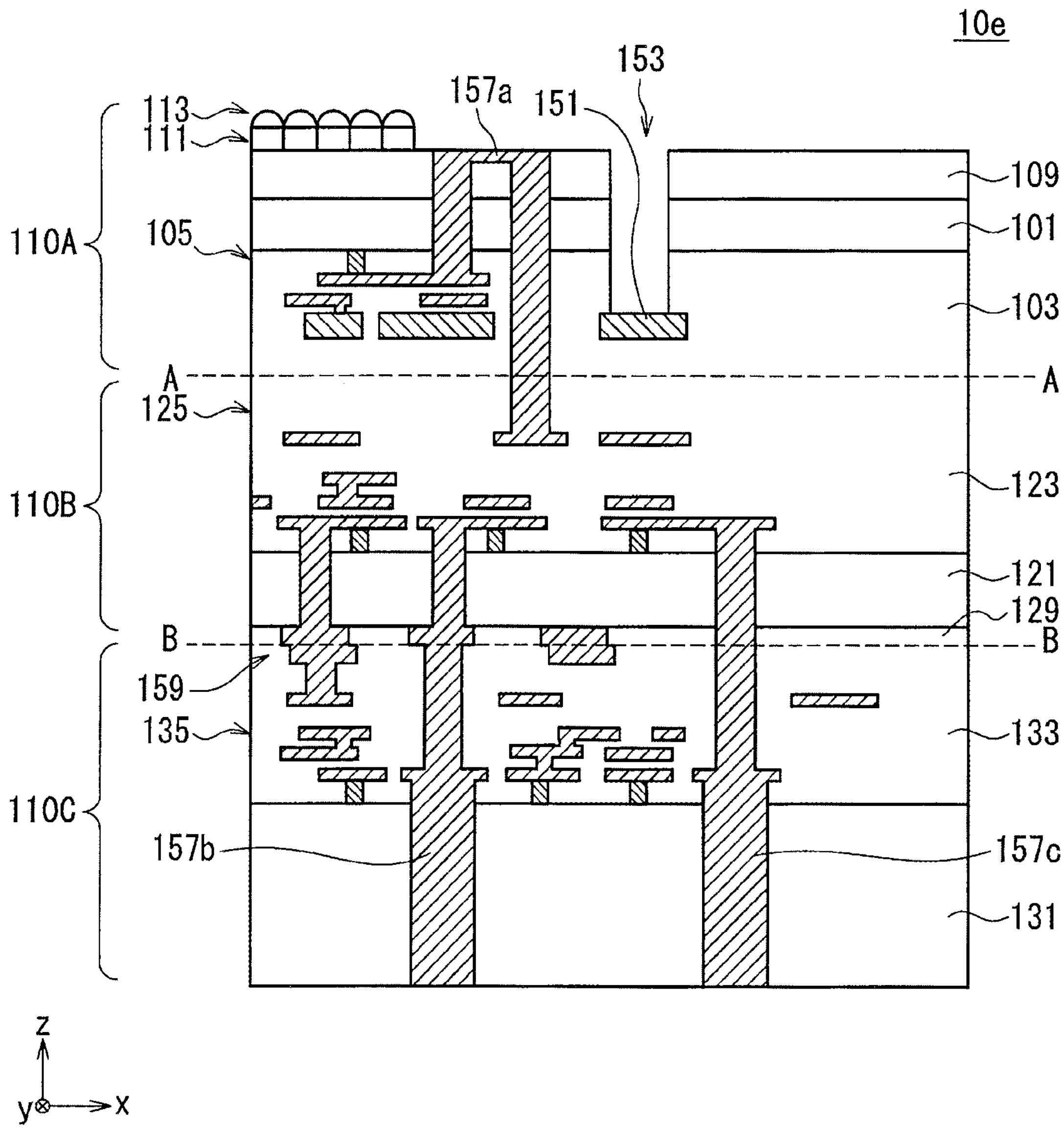
FIG. 14E is a vertical cross-sectional view of a schematic configuration of the solid-state imaging device according to the ninth configuration example of the present embodiment.

A solid-state imaging device 10*e* illustrated in FIG. 14E corresponds to the solid-state imaging device 10*d* illustrated in FIG. 14D in which the configurations of the TSVs 157*b* and 157*c* ae changed. Specifically, in the configuration illustrated in FIG. 14E, the TSV 157*b* is formed from the back surface side of the third substrate 110C toward the second substrate 110B, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 14E, the single-sided electrode provided in the insulating film 129 on the back surface side of the second substrate 110B and the predetermined wiring line of the first metal wiring layer in the multi-layered wiring layer 135 of the third substrate 110C are electrically coupled to each other by the TSV 157*b*. In addition, in the configuration illustrated in FIG. 14E, the TSV 157*c* is formed from the back surface side of the third substrate 110C toward the second substrate 110B, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 14E, the predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*c*.

Figure 14F:
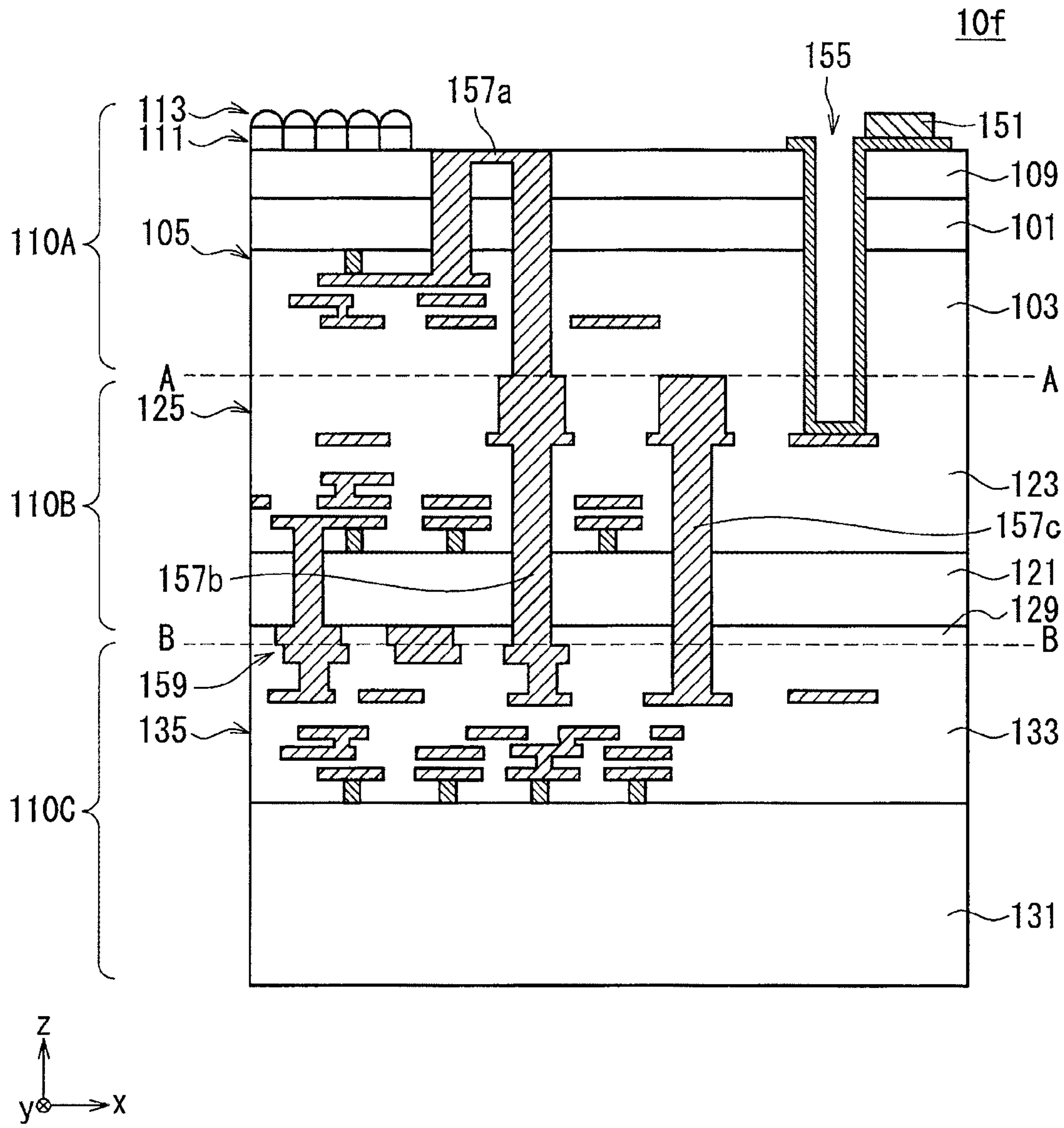
FIG. 14F is a vertical cross-sectional view of a schematic configuration of the solid-state imaging device according to the ninth configuration example of the present embodiment.

A solid-state imaging device 10*f* illustrated in FIG. 14F corresponds to the solid-state imaging device 10*b* illustrated in FIG. 14B in which the embedded pad structure is changed. Specifically, in the configuration illustrated in FIG. 14F, the non-embedded type lead-out pad structure for the second substrate 110B (i.e., the lead line opening 155 for the predetermined wiring line in the multi-layered wiring layer 125 of the second substrate 110B and the pad 151 on the surface on the back surface side of the first substrate 110A) is provided instead of the embedded pad structure.

Figure 14G:
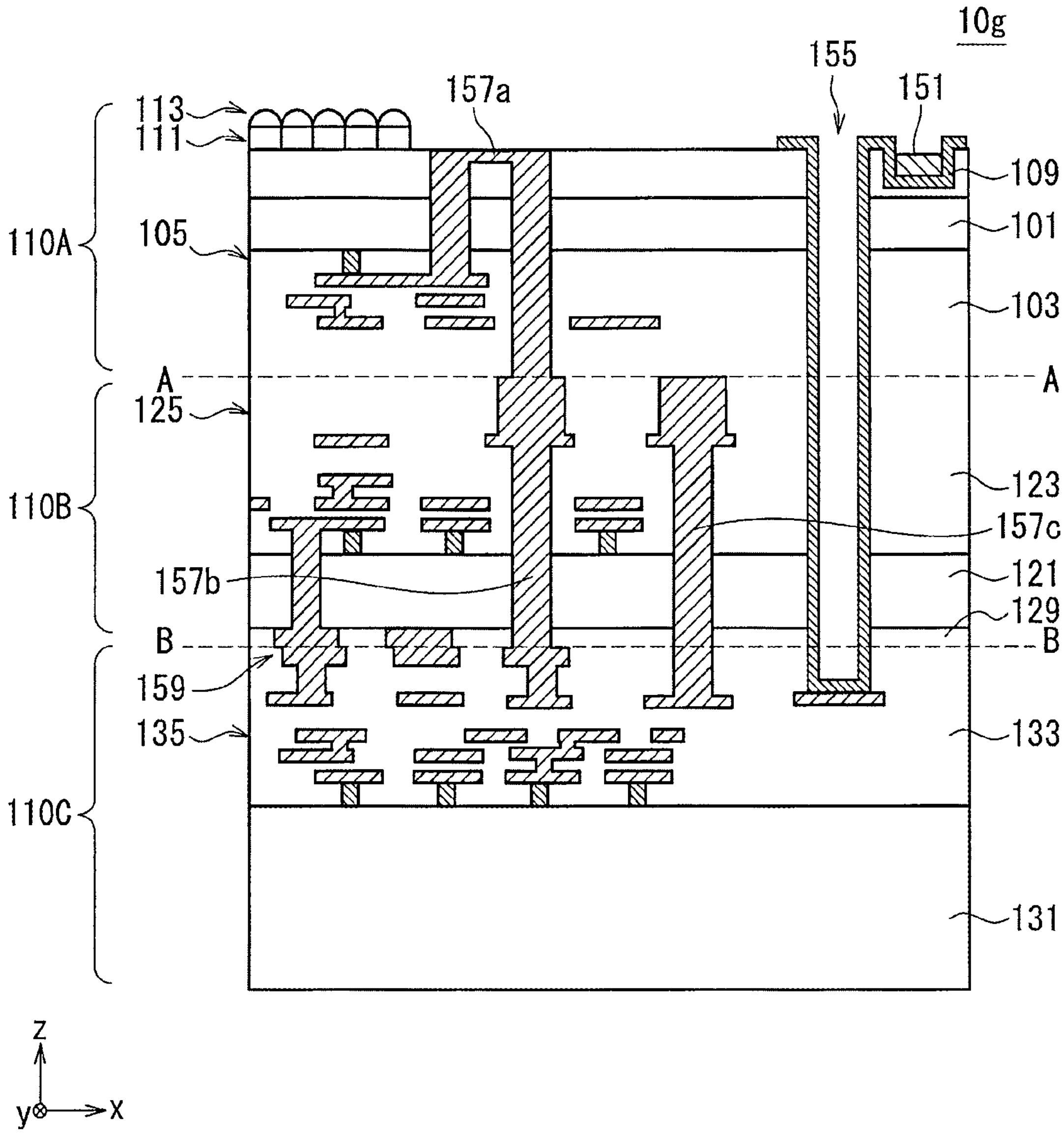
FIG. 14G is a vertical cross-sectional view of a schematic configuration of the solid-state imaging device according to the ninth configuration example of the present embodiment.

A solid-state imaging device 10*g* illustrated in FIG. 14G corresponds to the solid-state imaging device 10*f* illustrated in FIG. 14F in which the configuration of the lead-out pad structure is changed. Specifically, in the configuration illustrated in FIG. 14G, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 109 on the surface on the back surface side of the first substrate 110A) is provided instead of the non-embedded type lead-out pad structure for the second substrate 110B.

Figure 14H:
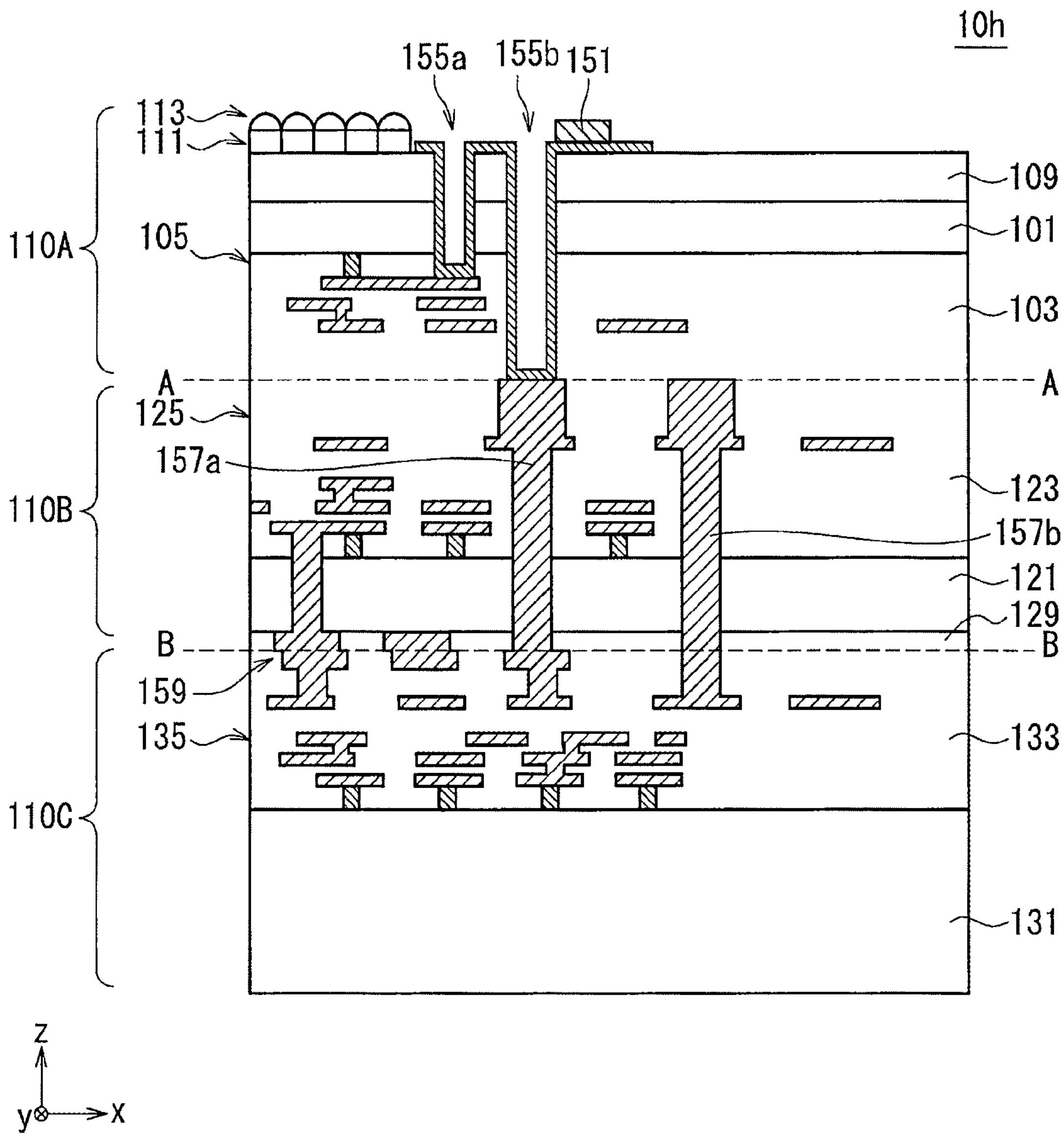
FIG. 14H is a vertical cross-sectional view of a schematic configuration of the solid-state imaging device according to the ninth configuration example of the present embodiment.

A solid-state imaging device 10*h* illustrated in FIG. 14H corresponds to the solid-state imaging device 10*b* illustrated in FIG. 14B in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and embedded pad structure by changing the embedded type TSV 157*a* to the non-embedded type TSV.

Figure 14I:
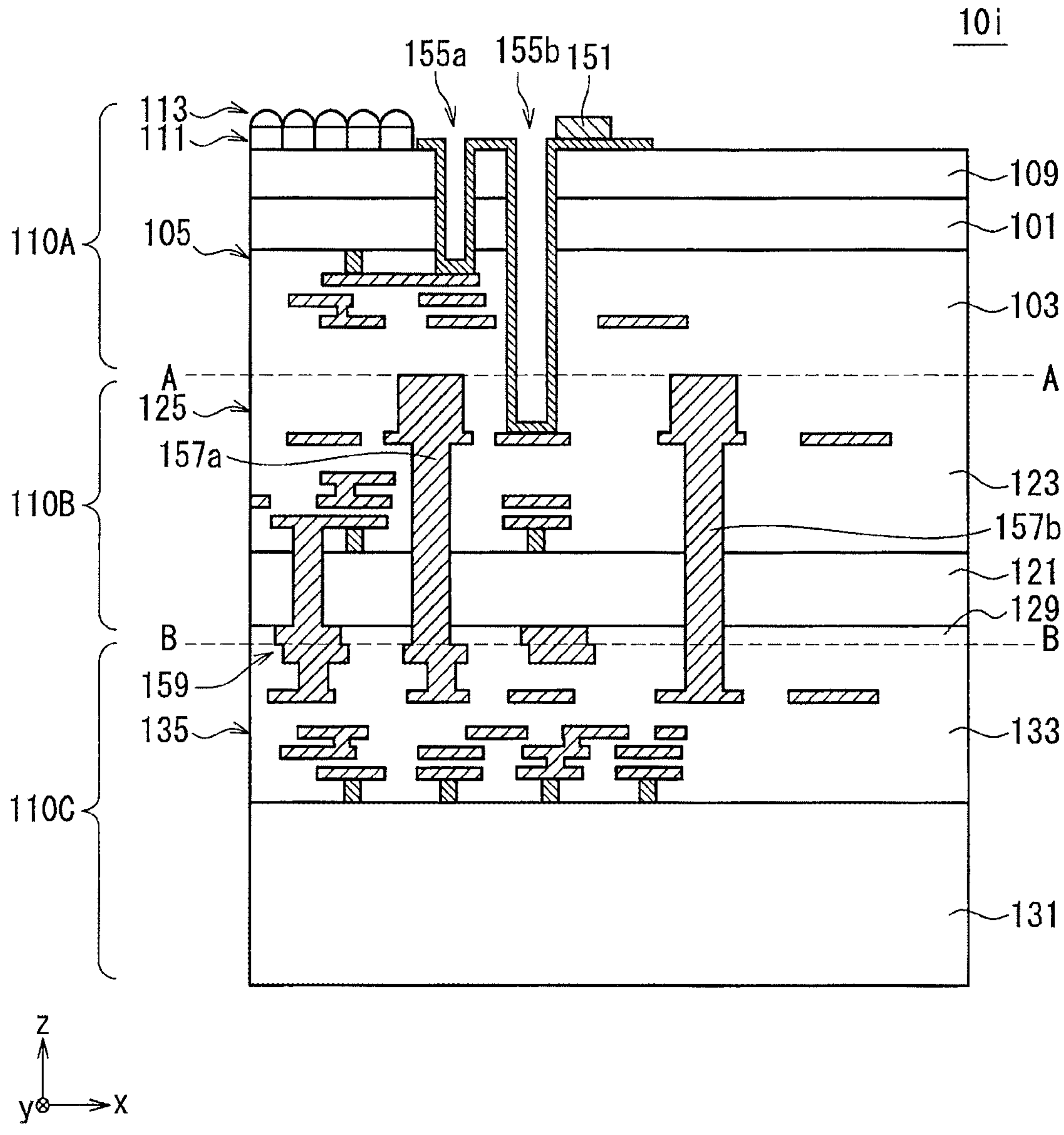
FIG. 14I is a vertical cross-sectional view of a schematic configuration of the solid-state imaging device according to the ninth configuration example of the present embodiment.

A solid-state imaging device 10 illustrated in FIG. 14I corresponds to the solid-state imaging device 10*d* illustrated in FIG. 14D in which the non-embedded type lead-out pad structure using the TSV dual-use lead line openings 155*a* and 155*b* (i.e., the TSV dual-use lead line openings 155*a* and 155*b* and the pad IS on the surface on the back surface side of the first substrate 110A) is provided instead of the TSV 157*a* and the embedded pad structure by changing the embedded type TSV 157*a* to the non-embedded type TSV.

Figure 14J:
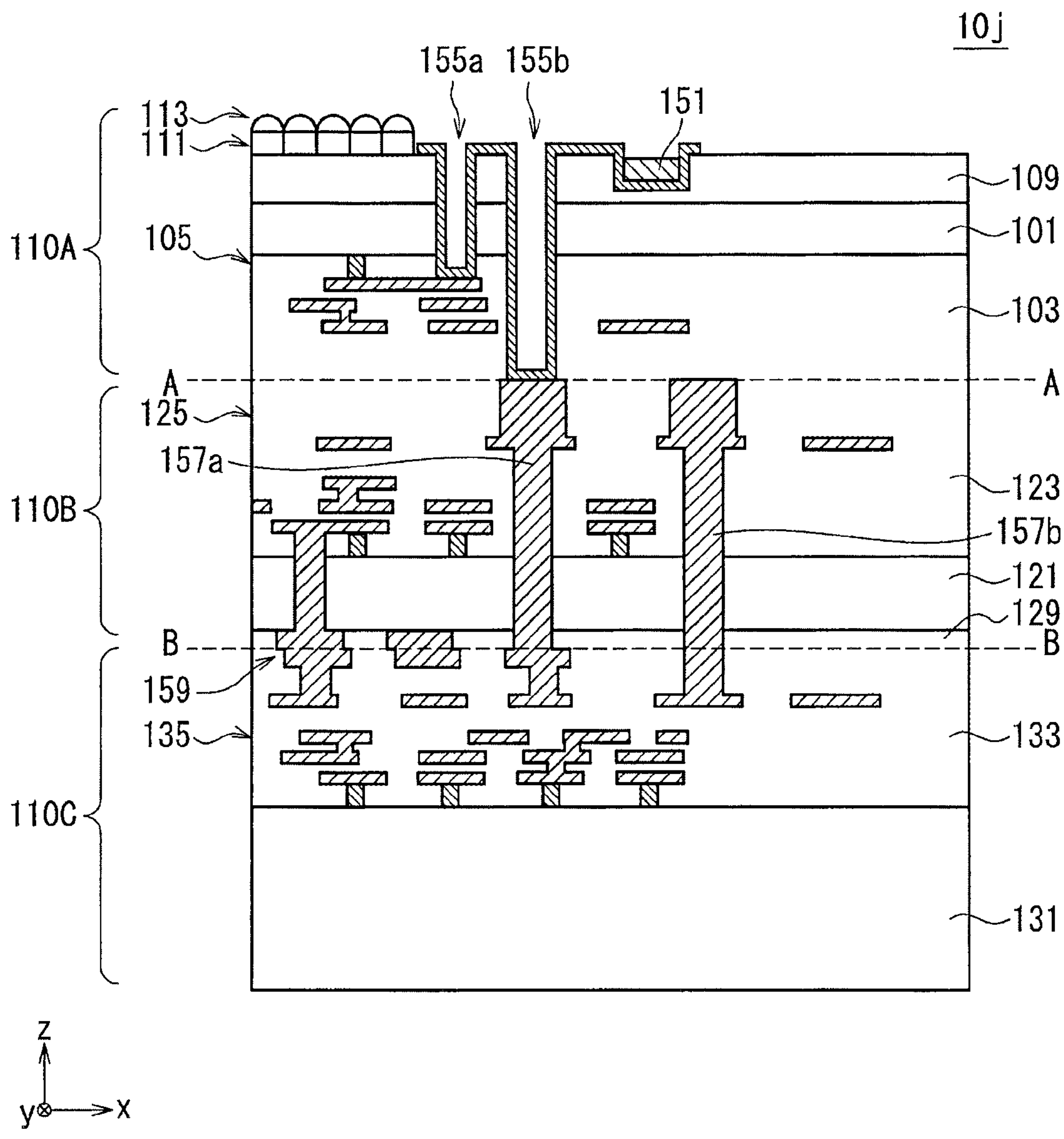
FIG. 14J is a vertical cross-sectional view of a schematic configuration of the solid-state imaging device according to the ninth configuration example of the present embodiment.

A solid-state imaging device 10*j* illustrated in FIG. 14J corresponds to the solid-state imaging device 10*h* illustrated in FIG. 14H in which the non-embedded type lead-out pad structure of the TSV dual-use lead line openings 155*a* and 155*b* is changed to the embedded type lead-out pad structure.

Figure 14K:
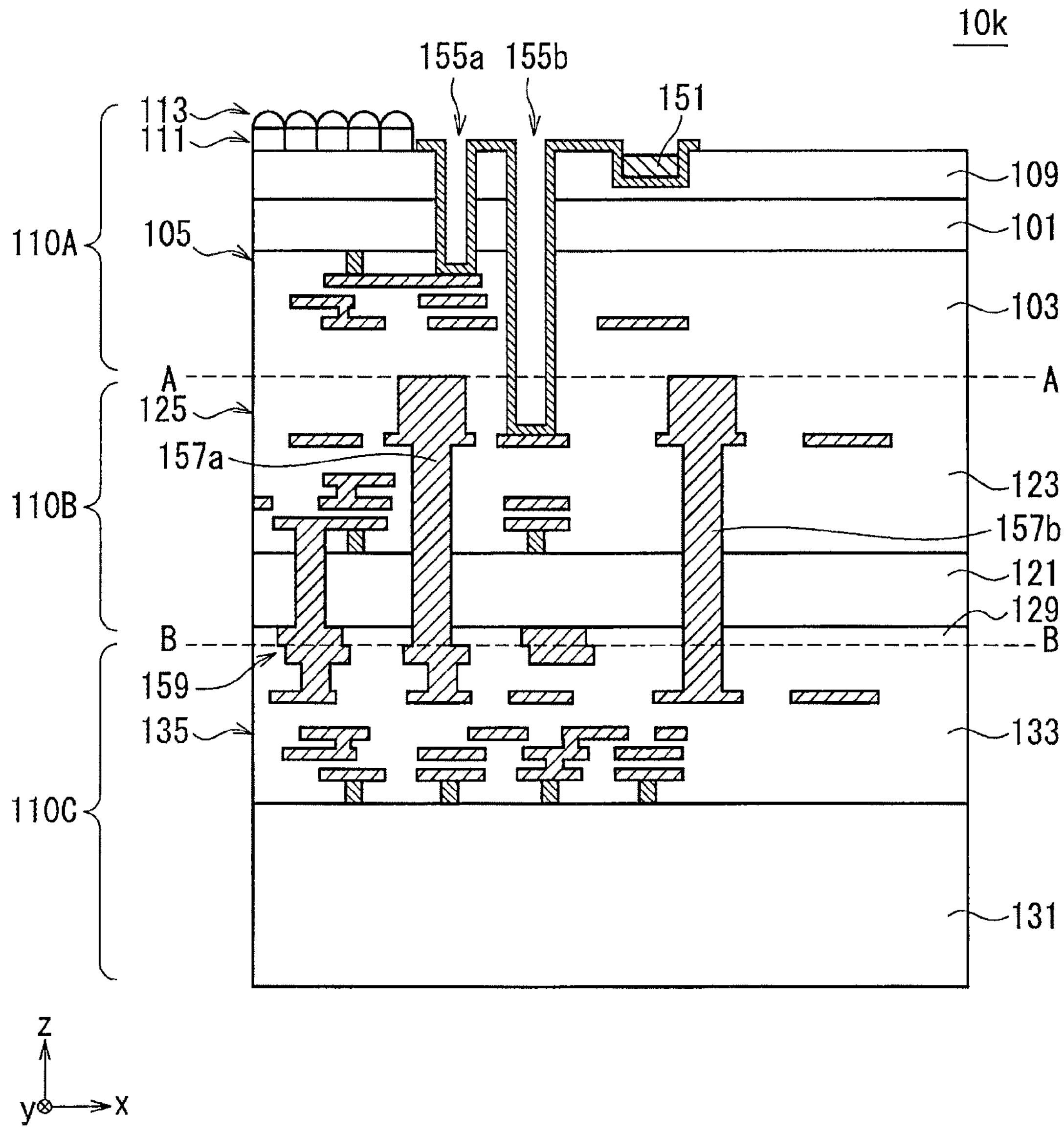
FIG. 14K is a vertical cross-sectional view of a schematic configuration of the solid-state imaging device according to the ninth configuration example of the present embodiment.

A solid-state imaging device 10*k* illustrated in FIG. 14K corresponds to the solid-state imaging device 10*i* illustrated in FIG. 14I in which the non-embedded type lead-out pad structure of the TSV dual-use lead line openings 155*a* and 155*b* is changed to the embedded type lead-out pad structure.

Note that, in each of the configurations illustrated in FIGS. 14A to 14K, the types of the wiring lines coupled by the twin contact type TSV 157 between two layers and the shared contact type TSV 157 between two layers are not limited. These TSVs 157 may be each coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In each of the configurations illustrated in FIGS. 14A to 14G the substrate on which the pad 151 is provided is not limited to the illustrated example. In the ninth configuration example, the respective signal lines provided in the first substrate 110A and the second substrate 110B are electrically coupled to each other and the respective power supply lines provided in the first substrate 110A and the second substrate 110B are electrically coupled to each other by the TSV 157*a*. The respective signal lines provided in the second substrate 110B and the third substrate 110C are electrically coupled to each other and the respective power supply lines provided in the second substrate 110B and the third substrate 110C are electrically coupled to each other by the TSVs 157*b* and 157*c*. Accordingly, the pad 151 as the coupling structure may not be provided. Thus, for example, in each of the configurations illustrated in FIGS. 14A to 14G the pad 151 may be provided on any of the substrates 110A, 110B, and 110C to derive a desired signal.

In a case where a lead-out pad structure is provided, the lead-out pad structure may be the non-embedded type or the embedded type. For example, in the configuration illustrated in FIG. 14F, the embedded type lead-out pad structure may be provided instead of the non-embedded type lead-out pad structure. Further, for example, in the configuration illustrated in FIG. 14G the non-embedded type lead-out pad structure may be provided instead of the embedded type lead-out pad structure.

In each of the configurations illustrated in FIGS. 14A to 14K, the TSV 157*b* contacts with the single-sided electrode in the illustrated example, but the present embodiment is not limited to such an example. In each of these configurations, the TSV 157*b* may be configured to contact with the double-sided electrode. In a case where the TSV 157*b* is configured to contact with the double-sided electrode, the TSV 157*b* functions as a via included in the electrode junction structures 159.

4-10. Tenth Configuration Example

FIGS. 15A to 15G are each a vertical cross-sectional view of a schematic configuration of a solid-state imaging device according to a tenth configuration example of the present embodiment. The solid-state imaging device according to the present embodiment may have each of the configurations illustrated in FIGS. 15A to 15G.

Figure 15A:
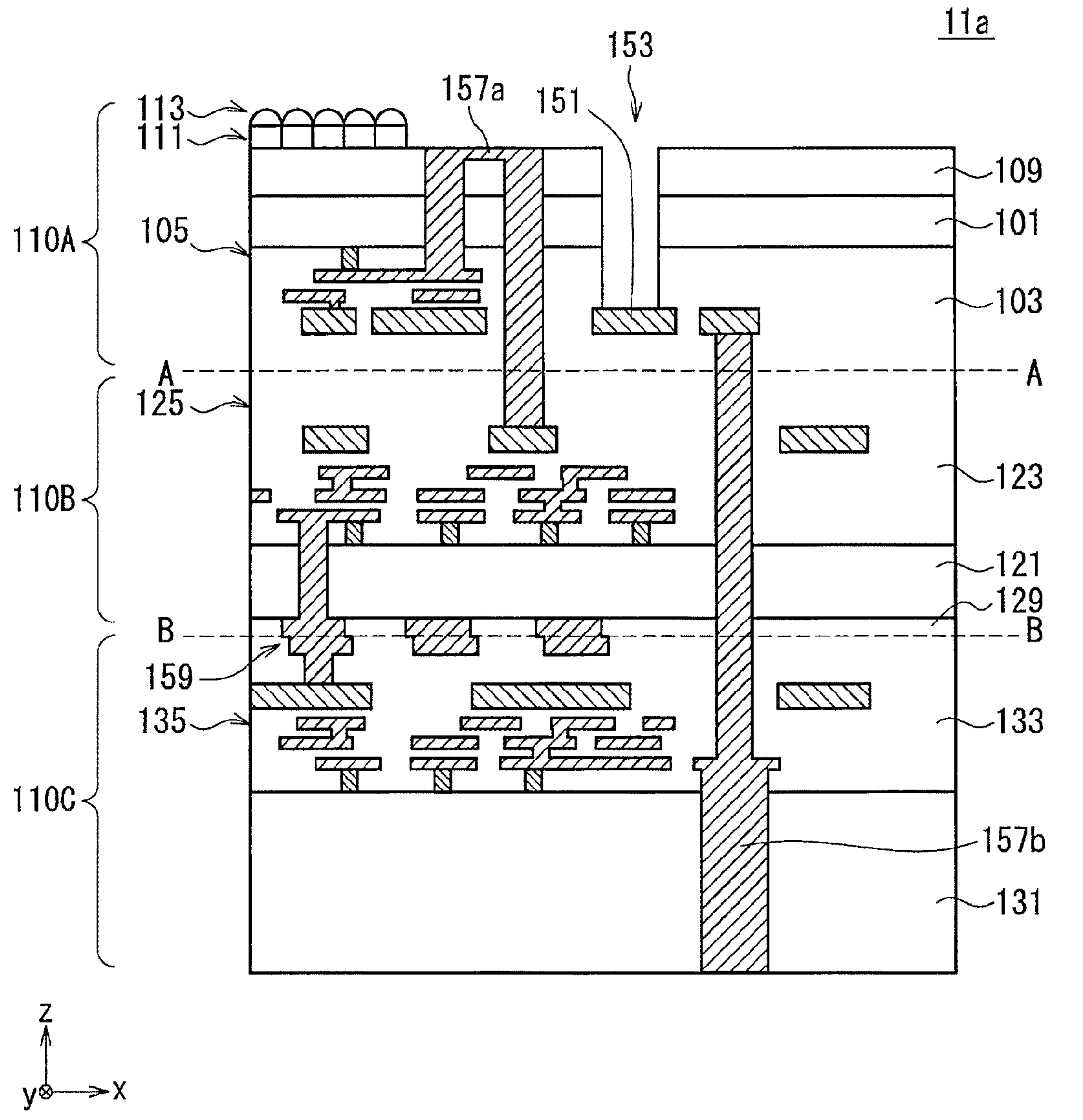
FIG. 15A is a vertical cross-sectional view of a schematic configuration of a solid-state imaging device according to a tenth configuration example of the present embodiment.

A solid-state imaging device 1*a* illustrated in FIG. 15A includes, as coupling structures, the TSV 157*a* of the twin contact type and the embedded type between two layers, the TSV 157*b* of the shared contact type and the embedded type between three layers, the electrode junction structure 159 provided between the second substrate 110B and the third substrate 110C, and the embedded pad structure for the first substrate 110A (i.e., the pad 151 provided in the multi-layered wiring layer 105 of the first substrate 110A and the pad opening 153 exposing the pad 151).

The TSV 157*a* is formed from the back surface side of the first substrate 110A toward the second substrate 110B, and is so provided as to electrically couple the respective signal lines provided in the first substrate 110A and the second substrate 110B to each other and the respective power supply lines provided in the first substrate 110A and the second substrate 110B to each other. In the configuration illustrated in FIG. 15A, the predetermined wiring line of the first metal wiring layer in the multi-layered wiring layer 105 of the rust substrate 110A and the predetermined wiring line of the second metal wiring layer in the multi-layered wiring layer 125 of the second substrate 110B are electrically coupled to each other by the TSV 157*a*. In addition, the TSV 157*b* is formed from the back surface side of the third substrate 110C toward the first substrate 110A, and is so provided as to electrically couple the respective signal lines provided in the first substrate 110A and the third substrate 110C to each other and the respective power supply lines provided in the first substrate 110A and the third substrate 110C to each other. In the configuration illustrated in FIG. 10A, the predetermined wiring line of the second metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*. In addition, the respective signal lines provided in the second substrate 110B and the third substrate 110C are electrically coupled to each other and the respective power supply lines provided in the second substrate 110B and the third substrate 110C are electrically coupled to each other by the electrode junction structure 159.

Figure 15B:
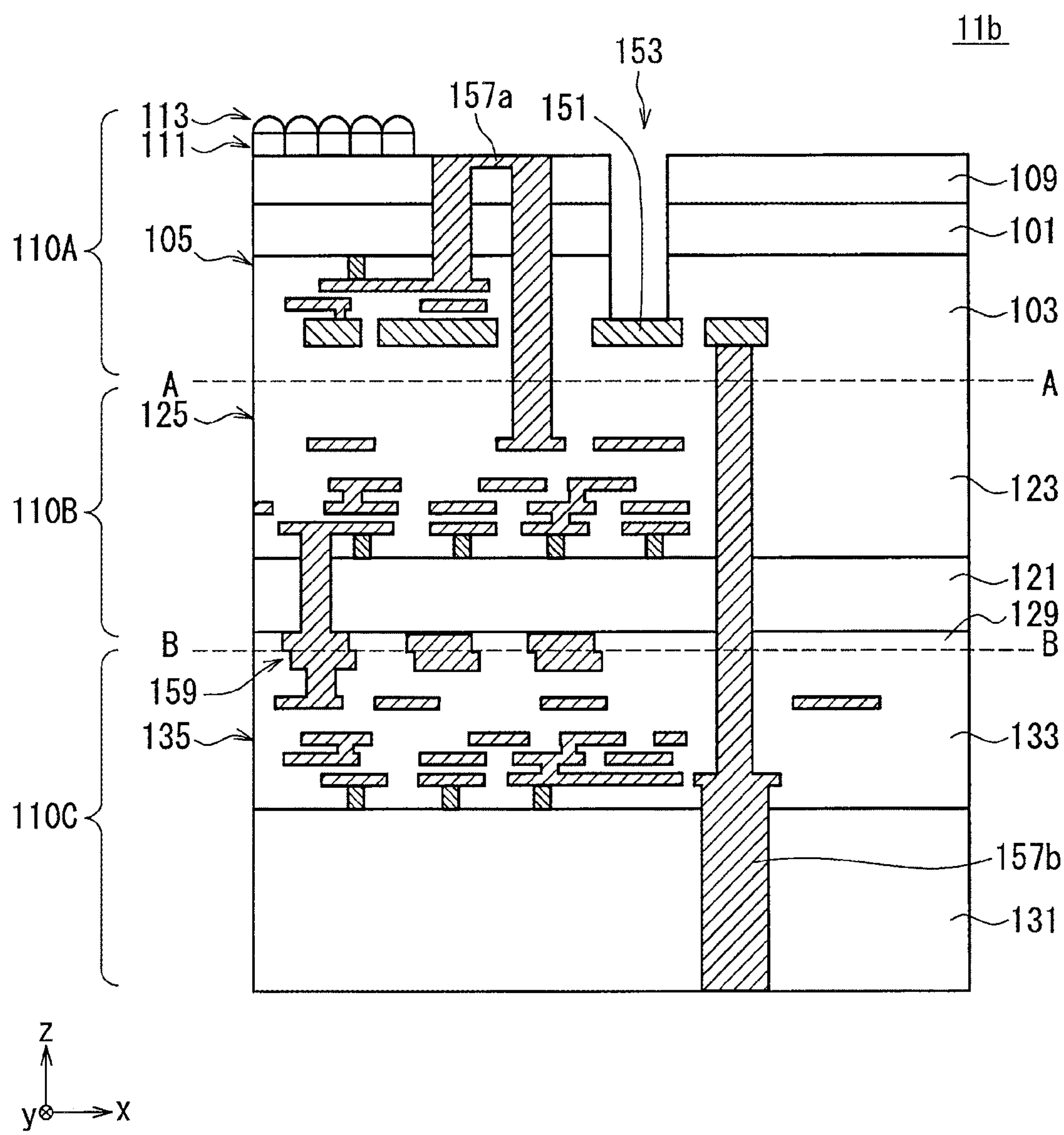
FIG. 15B is a vertical cross-sectional view of a schematic configuration of the solid-state imaging device according to the tenth configuration example of the present embodiment.

A solid-state imaging device 11*b* illustrated in FIG. 15B corresponds to the solid-state imaging device 11*a* illustrated in FIG. 15A in which the types of the wiring lines electrically coupled by the TSV 157*a* are changed. Specifically, in the configuration illustrated in FIG. 15B, the predetermined wiring line of the first metal wiring layer in the multi-layered wiring layer 105 of the first substrate 110A and the predetermined wiring line of the first metal wiring layer in the multi-layered wiring layer 125 of the second substrate 110B are electrically coupled to each other by the TSV 157*a*.

Figure 15C:
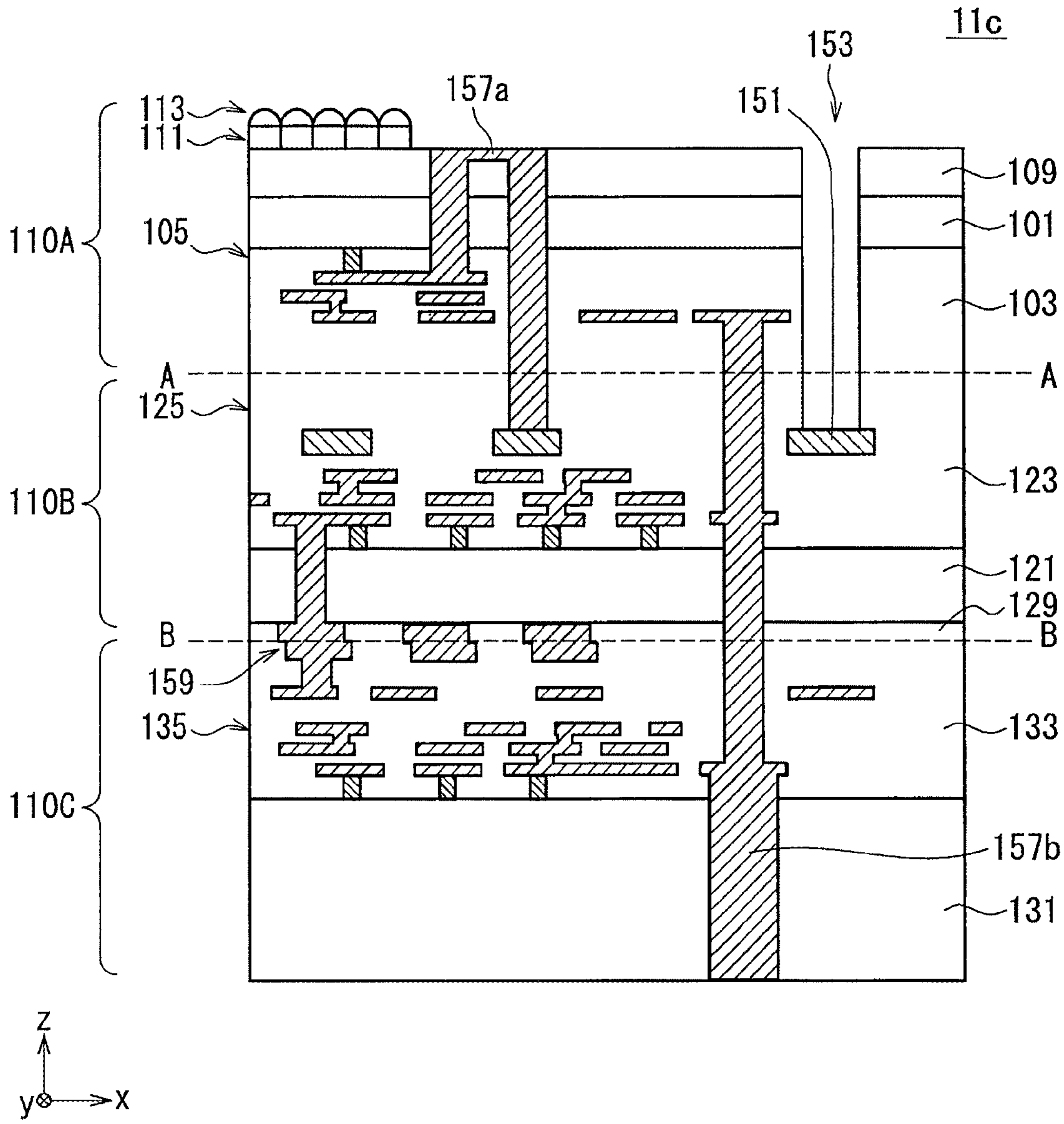
FIG. 15C is a vertical cross-sectional view of a schematic configuration of the solid-state imaging device according to the tenth configuration example of the present embodiment.

A solid-state imaging device 11*c* illustrated in FIG. 15C includes, as coupling structures, the TSV 157*a* of the twin contact type and the embedded type between two layers, the TSV 157*b* of the shared contact type and the embedded type between three layers, the electrode junction structure 159 provided between the second substrate 110B and the third substrate 110C, and the embedded pad structure for the second substrate 110B (i.e., the pad 151 provided in the multi-layered wiring layer 125 of the second substrate 110B and the pad opening 153 exposing the pad 151).

The TSV 157*a* is formed from the back surface side of the first substrate 110A toward the second substrate 110B, and is so provided as to electrically couple the respective signal lines provided in the first substrate 110A and the second substrate 110B to each other and the respective power supply lines provided in the first substrate 110A and the second substrate 110B to each other. In the configuration illustrated in FIG. 15C, the predetermined wiring line of the first metal wiring layer in the multi-layered wiring layer 105 of the first substrate 110A and the predetermined wiring line of the second metal wiring layer in the multi-layered wiring layer 125 of the second substrate 110B are electrically coupled to each other by the TSV 157*a*. In addition, the TSV 157*b* is formed from the back surface side of the third substrate 110C toward the first substrate 110A, and is so provided as to electrically couple the respective signal lines provided in the first substrate 110A, the second substrate 110B, and the third substrate 110C together and the respective power supply lines included in the first substrate 110A, the second substrate 110B, and the third substrate 110C together. In the configuration illustrated in FIG. 15C, the predetermined wiring line of the first metal wiring layer in the multi-layered wiring layer 105 of the first substrate 110A, the predetermined wiring line of the first metal wiring layer in the multi-layered wiring layer 125 of the second substrate 110B, and the predetermined wiring line of the first metal wiring layer in the multi-layered wiring layer 135 of the third substrate 110C are electrically coupled together by the TSV 157*b*. In addition, the respective signal lines provided in the second substrate 110B and the third substrate 110C are electrically coupled to each other and the respective power supply lines provided in the second substrate 110B and the third substrate 110C are electrically coupled to each other by the electrode junction structure 159.

Figure 15D:
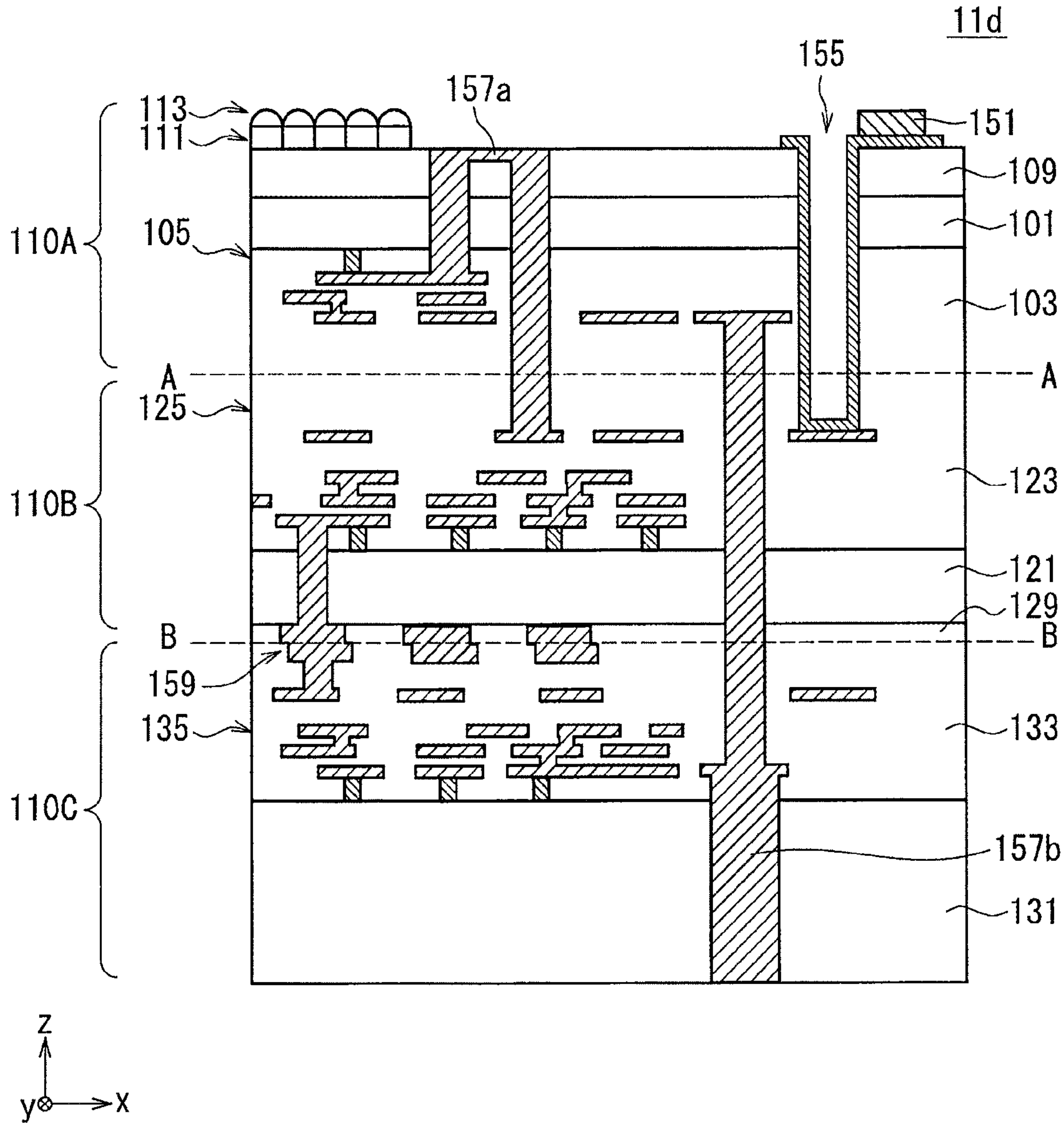
FIG. 15D is a vertical cross-sectional view of a schematic configuration of the solid-state imaging device according to the tenth configuration example of the present embodiment.

A solid-state imaging device 11*d* illustrated in FIG. 15D corresponds to the solid-state imaging device 11*b* illustrated in FIG. 15B in which the embedded pad structure is changed and the types of the wiring lines electrically coupled by the TSV 157*b* are changed. Specifically, in the configuration illustrated in FIG. 15D, the non-embedded type lead-out pad structure for the second substrate 110B (i.e., the lead line opening 155 for the predetermined wiring line in the multi-layered wiring layer 125 of the second substrate 110B and the pad 151 on the surface on the back surface side of the first substrate 110A) is provided instead of the embedded pad structure. In addition, in the configuration illustrated in FIG. 15D, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*.

Figure 15E:
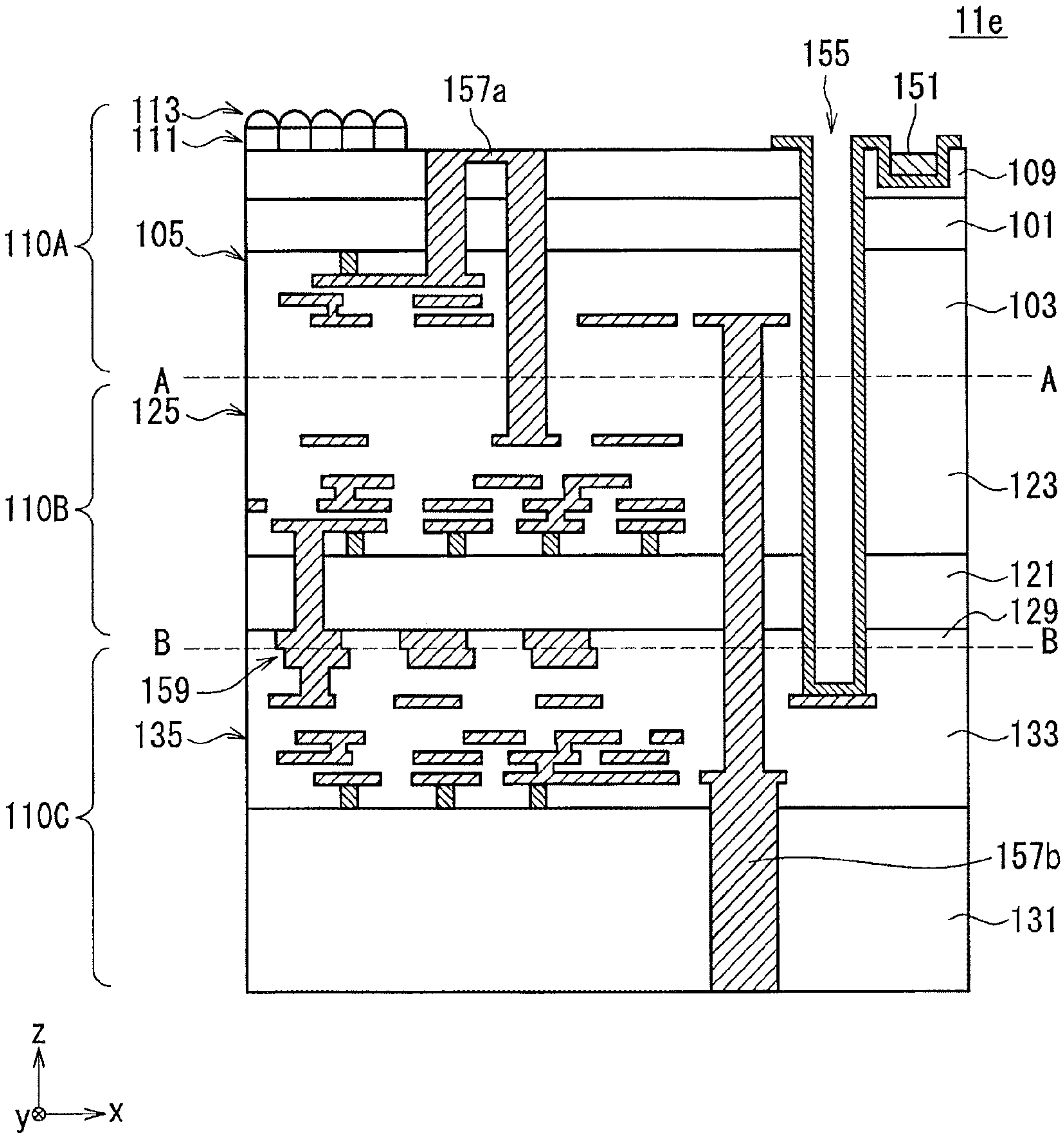
FIG. 15E is a vertical cross-sectional view of a schematic configuration of the solid-state imaging device according to the tenth configuration example of the present embodiment.

A solid-state imaging device 11*e* illustrated in FIG. 15E corresponds to the solid-state imaging device 11*d* illustrated in FIG. 15D in which the configuration of the lead-out pad structure is changed. Specifically, in the configuration illustrated in FIG. 15E, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 109 on the surface on the back surface side of the first substrate 110A) is provided instead of the non-embedded type lead-out pad structure for the second substrate 110B.

Figure 15F:
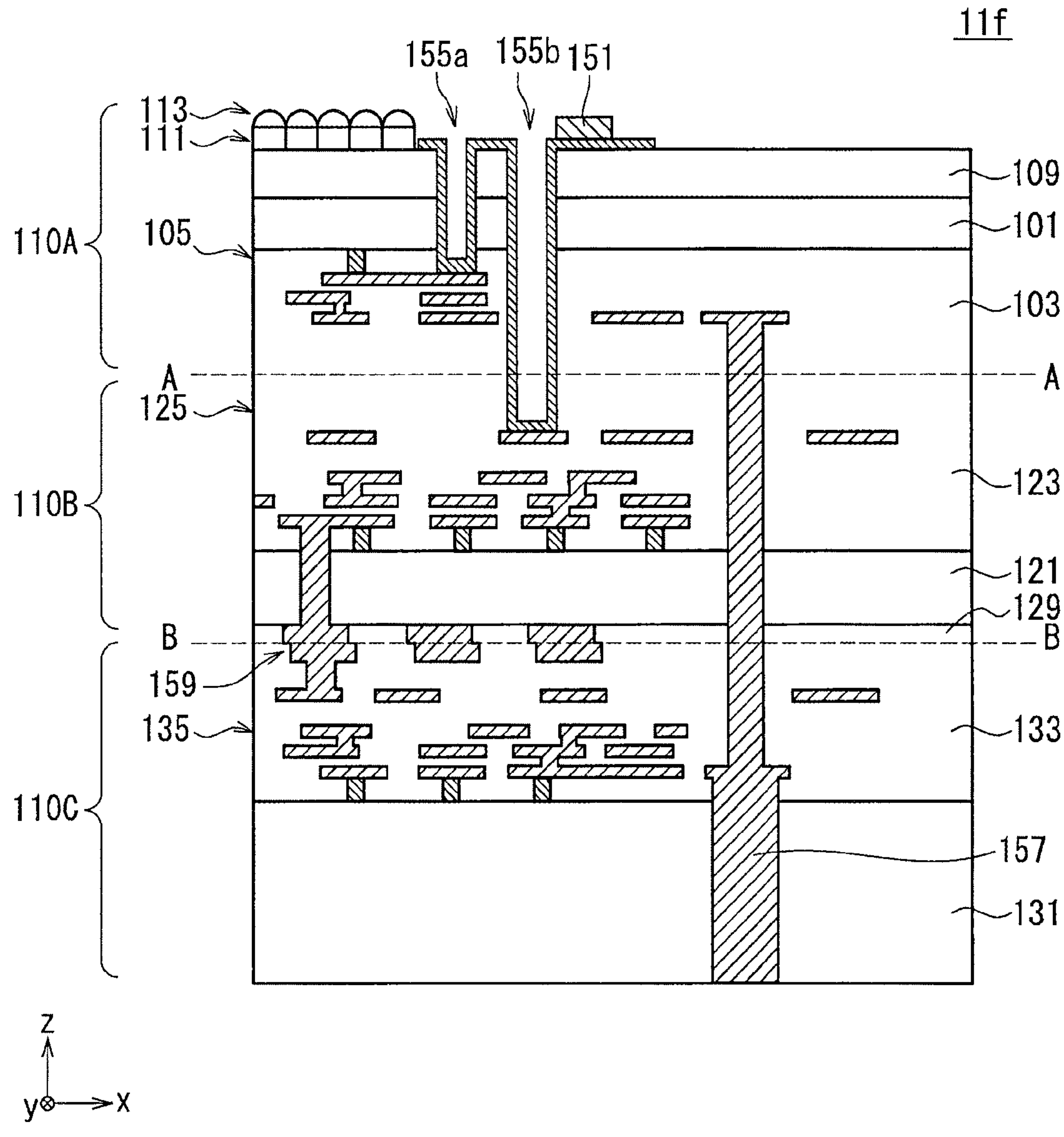
FIG. 15F is a vertical cross-sectional view of a schematic configuration of the solid-state imaging device according to the tenth configuration example of the present embodiment.

A solid-state imaging device 11*f* illustrated in FIG. 15F corresponds to the solid-state imaging device 11*e* illustrated in FIG. 15E in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded type lead-out pad structure by changing the embedded type TSV 157*a* to the non-embedded type TSV.

Figure 15G:
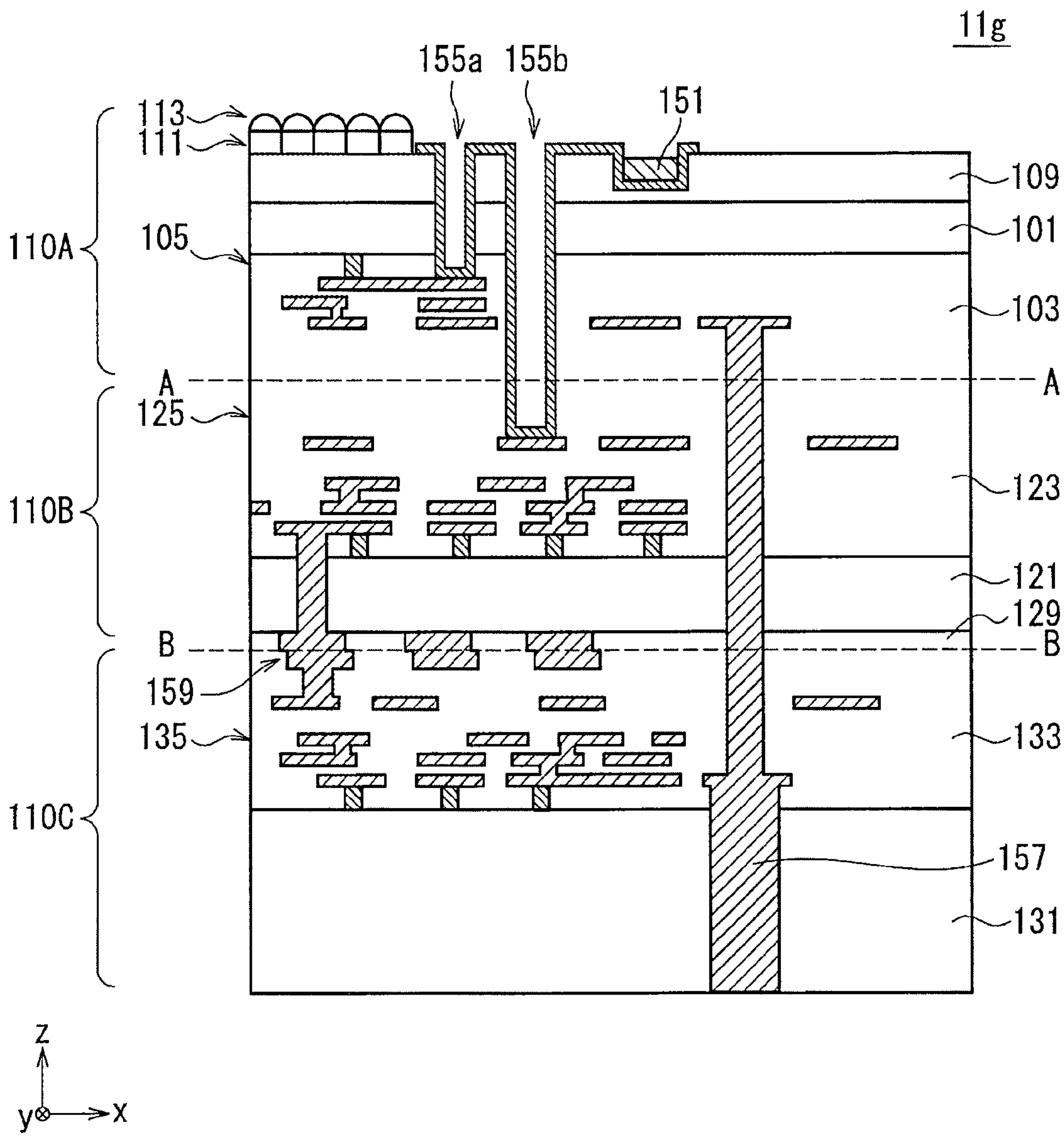
FIG. 15G is a vertical cross-sectional view of a schematic configuration of the solid-state imaging device according to the tenth configuration example of the present embodiment.

A solid-state imaging device 11*g* illustrated in FIG. 15G corresponds to the solid-state imaging device 11*f* illustrated in FIG. 15F in which the non-embedded type lead-out pad structure of the TSV dual-use lead line openings 155*a* and 155*b* is changed to the embedded type lead-out pad structure.

Note that, in each of the configurations illustrated in FIGS. 15A to 15G, the types of the wiring lines coupled by the twin contact type TSV 157 between two layers and the shared contact type TSV 157 between three layers are not limited. These TSVs 157 may be each coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In each of the configurations illustrated in FIGS. 15A to 15E, the substrate on which the pad 151 is provided is not limited to the illustrated example. In each of these configurations, the respective signal lines provided in the first substrate 110A and the second substrate 110B are electrically coupled to each other and the respective power supply lines provided in the first substrate 110A and the second substrate 110B are electrically coupled to each other by one TSV 157*a*. The respective signal lines provided in the first substrate 110A and the third substrate 110C are at least electrically coupled to each other and the respective power supply lines provided in the first substrate 110A and the third substrate 110C are at least electrically coupled to each other by the other TSV 157*b*. The respective signal lines provided in the second substrate 110B and the third substrate 110C are electrically coupled to each other and the respective power supply lines provided in the second substrate 1106 and the third substrate 110C are electrically coupled to each other by the electrode junction structure 159. Accordingly, the pad 151 as the coupling structure may not be provided. Thus, for example, in each of the configurations illustrated in FIGS. 15A to 15E, the pad 151 may be provided on any of the substrates 110A, 110B, and 110C to derive a desired signal.

In a case where a lead-out pad structure is provided, the lead-out pad structure may be the non-embedded type or the embedded type. For example, in the configuration illustrated in FIG. 15D, the embedded type lead-out pad structure may be provided instead of the non-embedded type lead-out pad structure. Further, for example, in the configuration illustrated in FIG. 15E, the non-embedded type lead-out pad structure may be provided instead of the embedded type lead-out pad structure.

In each of the configurations illustrated in FIGS. 15A to 15G the TSV 157 of the shared contact type and the embedded type between three layers is formed from the back surface side of the third substrate 110C toward the first substrate 110A, but the present embodiment is not limited to such an example. The TSV 157 may be formed from the back surface side of the first substrate 110A toward the third substrate 110C.

In addition, it is sufficient for the shared contact type TSV 157 between three layers to electrically couple the respective signal lines as well as the respective power supply lines included in at least two of the first substrate 110A, the second substrate 110B, or the third substrate 110C to each other. The substrates provided with the respective signal lines as well as the respective power supply lines to be electrically coupled to each other by the TSV 157 may be optionally changed.

4-11. Eleventh Configuration Example

FIGS. 16A to 16G are each a vertical cross-sectional view of a schematic configuration of a solid-state imaging device according to an eleventh configuration example of the present embodiment. The solid-state imaging device according to the present embodiment may have each of the configurations illustrated in FIGS. 16A to 16G.

Figure 16A:
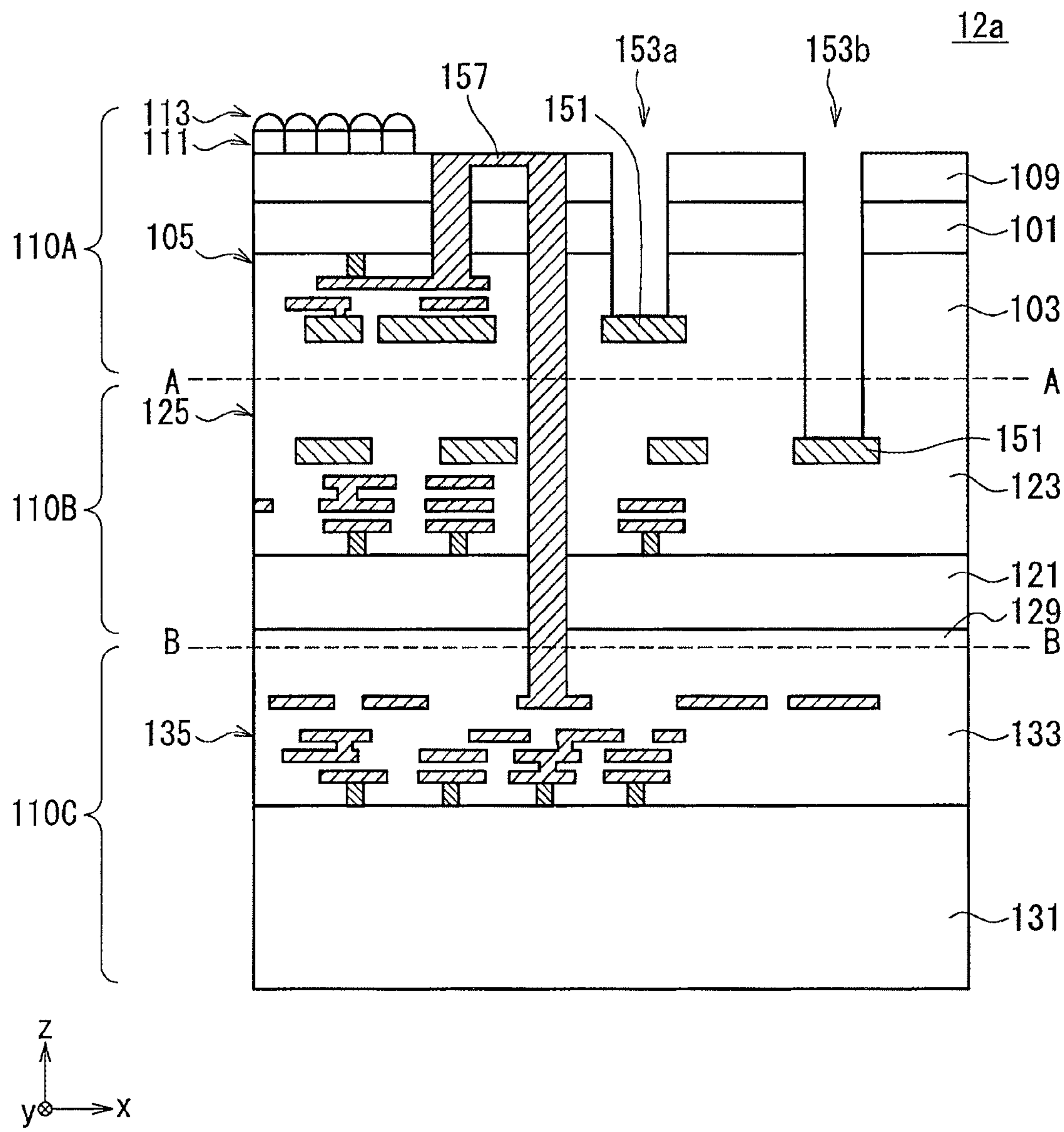
FIG. 16A is a vertical cross-sectional view of a schematic configuration of a solid-state imaging device according to an eleventh configuration example of the present embodiment.

A solid-state imaging device 12*a* illustrated in FIG. 16A includes, as coupling structures, the of the twin contact type TSV 157 and the embedded type between three layers, the embedded pad structure for the first substrate 110A (i.e., the pad 151 provided in the multi-layered wiring layer 105 of the first substrate 110A and the pad opening 153*a* exposing the pad 151), and the embedded pad structure for the second substrate 110B (i.e., the pad 151 provided in the multi-layered wiring layer 125 of the second substrate 110B and the pad opening 153*b* exposing the pad 151). The TSV 157 is formed from the back surface side of the first substrate 110A toward the third substrate 110C, and is so provided as to electrically couple the respective signal lines provided in the first substrate 110A and the third substrate 110C to each other and the respective power supply lines provided in the first substrate 110A and the third substrate 110C to each other. In the configuration illustrated in FIG. 16A, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157. In addition, the respective signal lines provided in the first substrate 110A and the second substrate 110B may be electrically coupled to each other and the respective power supply lines provided in the first substrate 110A and the second substrate 110B may be electrically coupled to each other by the two embedded pad structures.

Figure 16B:
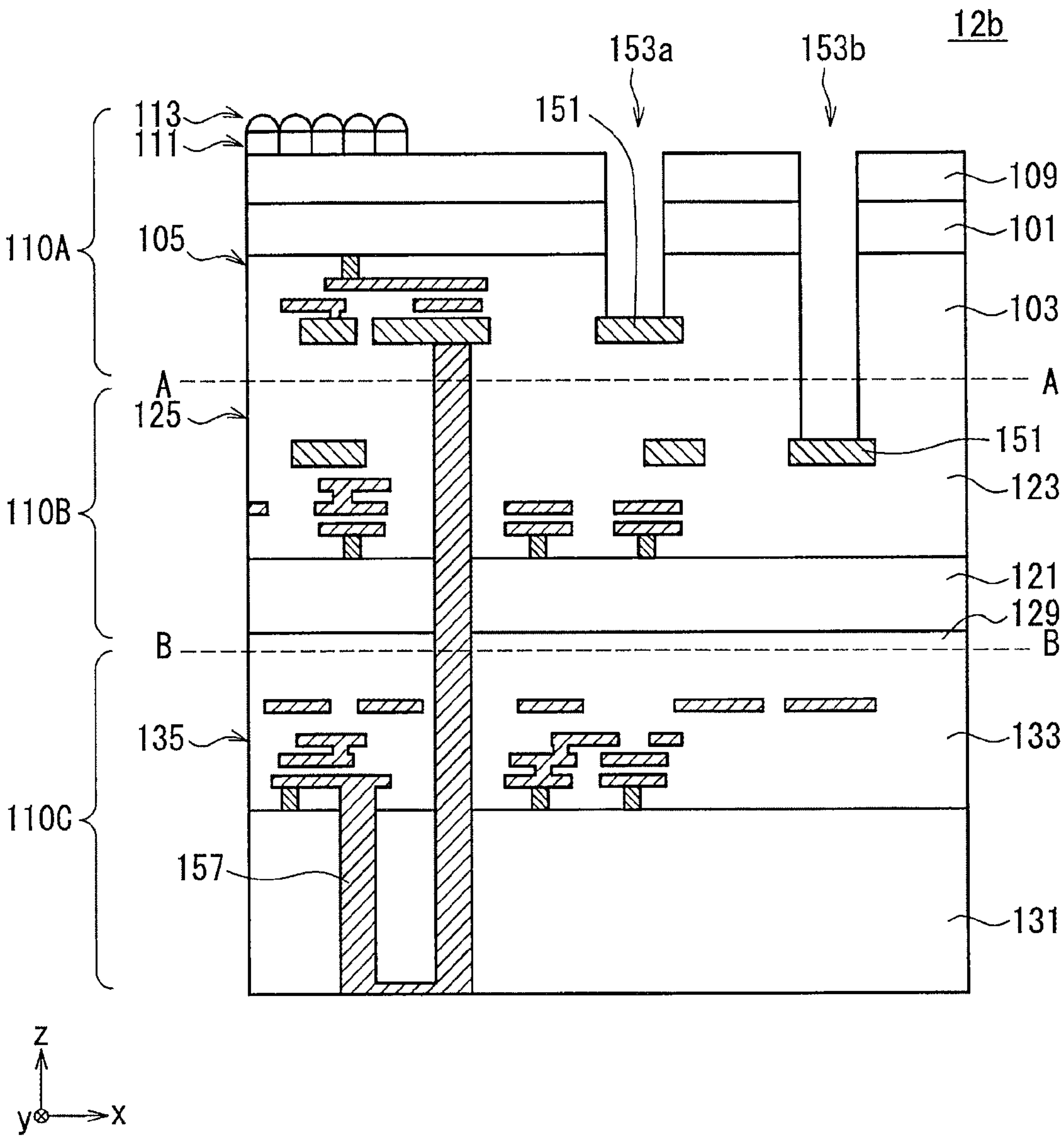
FIG. 16B is a vertical cross-sectional view of a schematic configuration of the solid-state imaging device according to the eleventh configuration example of the present embodiment.

A solid-state imaging device 12*b* illustrated in FIG. 16B corresponds to the solid-state imaging device 12*a* illustrated in FIG. 16A in which the TSV 157 structure is changed. Specifically, in the configuration illustrated in FIG. 16B, the TSV 157 is formed from the back surface side of the third substrate 110C toward the first substrate 110A, and is so provided as to electrically couple the respective signal lines provided in the first substrate 110A and the third substrate 110C to each other and the respective power supply lines provided in the first substrate 110A and the third substrate 110C to each other. In the configuration illustrated in FIG. 16B, the predetermined wiring line of the second metal wiring layer in the multi-layered wiring layer 105 of the first substrate IIDA and the predetermined wiring line of the first metal wiring layer in the multi-layered wiring layer 135 of the third substrate 110C are electrically coupled to each other by the TSV 157.

Figure 16C:
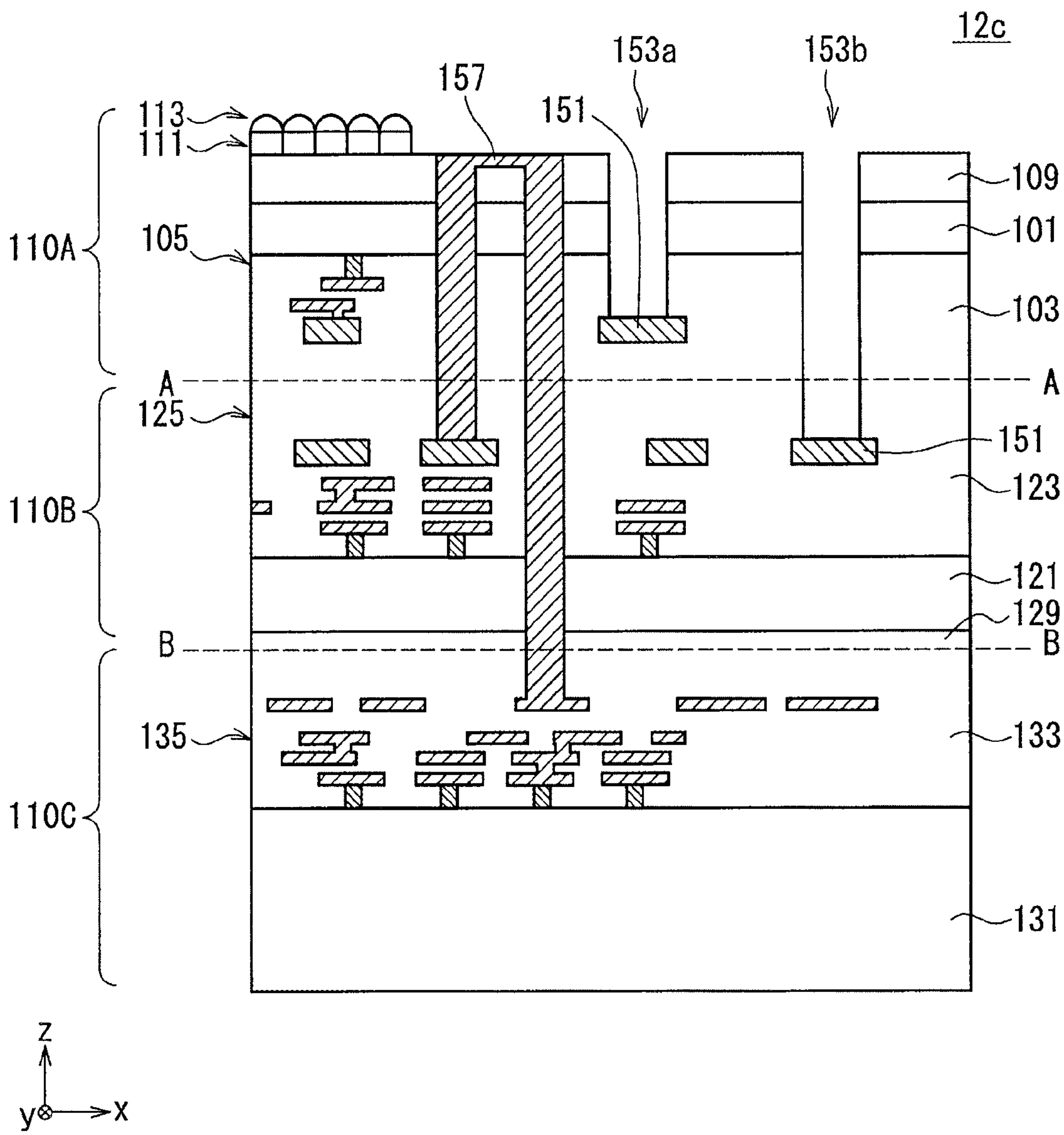
FIG. 16C is a vertical cross-sectional view of a schematic configuration of the solid-state imaging device according to the eleventh configuration example of the present embodiment.

A solid-state imaging device 12*c* illustrated in FIG. 16C corresponds to the solid-state imaging device 12*a* illustrated in FIG. 16A in which the TSV 157 structure is changed. Specifically, in the configuration illustrated in FIG. 16C, the TSV 157 is formed from the back surface side of the first substrate 110A-toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 16C, the predetermined wiring line of the second metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157.

Figure 16D:
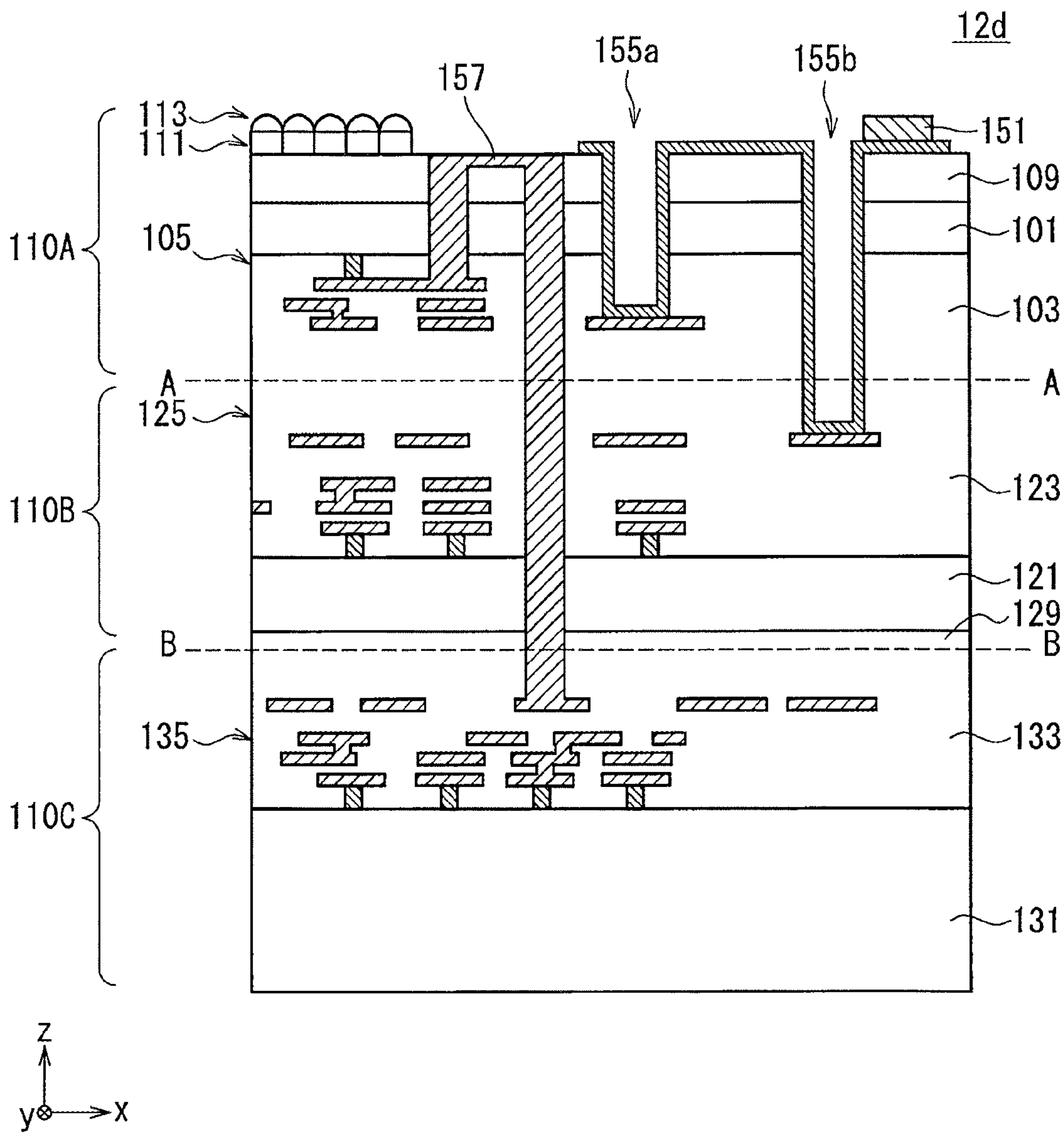
FIG. 16D is a vertical cross-sectional view of a schematic configuration of the solid-state imaging device according to the eleventh configuration example of the present embodiment.

A solid-state imaging device 12*d* illustrated in FIG. 16D corresponds to the solid-state imaging device 12*a* illustrated in FIG. 16A in which the embedded pad structure is changed. Specifically, in the configuration illustrated in FIG. 16D, the non-embedded type lead-out pad structure for the first substrate 110A (i.e., the lead line opening 155*a* for the predetermined wiring line in the multi-layered wiring layer 105 of the first substrate 110A and the pad 151 on the surface on the back surface side of the first substrate 110A) and the non-embedded type lead-out pad structure for the second substrate 110B (i.e., the lead line opening 155*b* for the predetermined wiring line in the multi-layered wiring layer 125 of the second substrate 110 and the pad 151 on the surface on the back surface side of the first substrate 110A) are provided instead of the embedded pad structure. Note that, in the configuration illustrated in FIG. 16D, one pad 151 is shared by the lead line openings 155*a* and 155*b*.

Figure 16E:
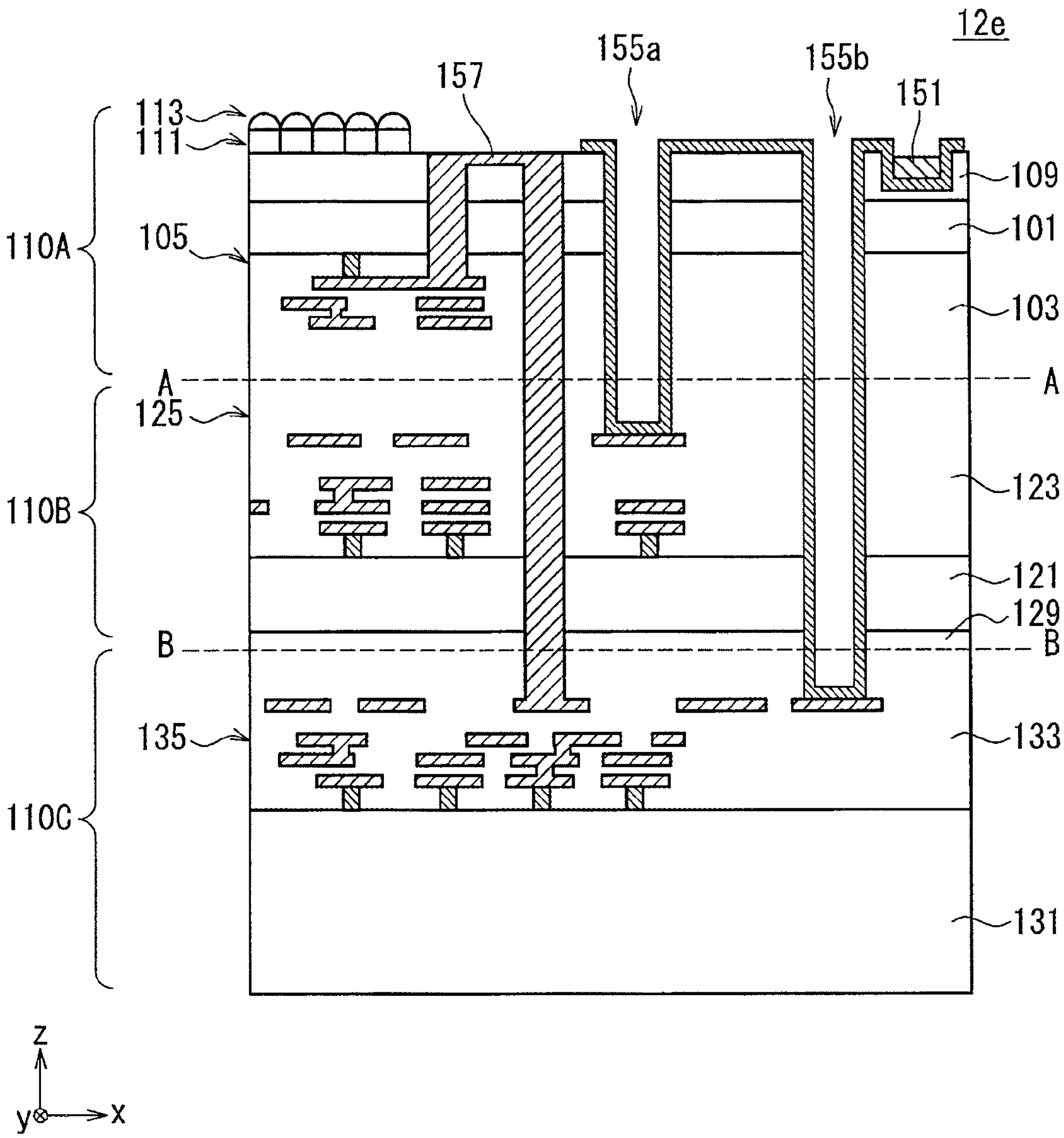
FIG. 16E is a vertical cross-sectional view of a schematic configuration of the solid-state imaging device according to the eleventh configuration example of the present embodiment.

A solid-state imaging device 12*e* illustrated in FIG. 16E corresponds to the solid-state imaging device 12*d* illustrated in FIG. 16D in which the configuration of the lead-out pad structure is changed. Specifically, in the configuration illustrated in FIG. 16E, the embedded type lead-out pad structure for the second substrate 110B (i.e., the lead line opening 155*a* for the predetermined wiring line in the multi-layered wiring layer 125 of the second substrate 110B and the pad 151 formed by being embedded in the insulating film 109 on the surface on the back surface side of the first substrate 110A) and the embedded type lead-out pad structure for the third substrate 110C (i.e., the lead line opening 155*b* for the predetermined wiring line in the multi-layered wiring layer 135 of the third substrate 110C and the pad 151 formed by being embedded in the insulating film 109 on the surface on the back surface side of the first substrate 110A) are provided instead of the non-embedded type lead-out pad structure for the first substrate 110A and the non-embedded type lead-out pad structure for the second substrate 110B. Note that, in the configuration illustrated in FIG. 16E, one pad 151 is shared by the lead line openings 155*a* and 155*b*.

Figure 16F:
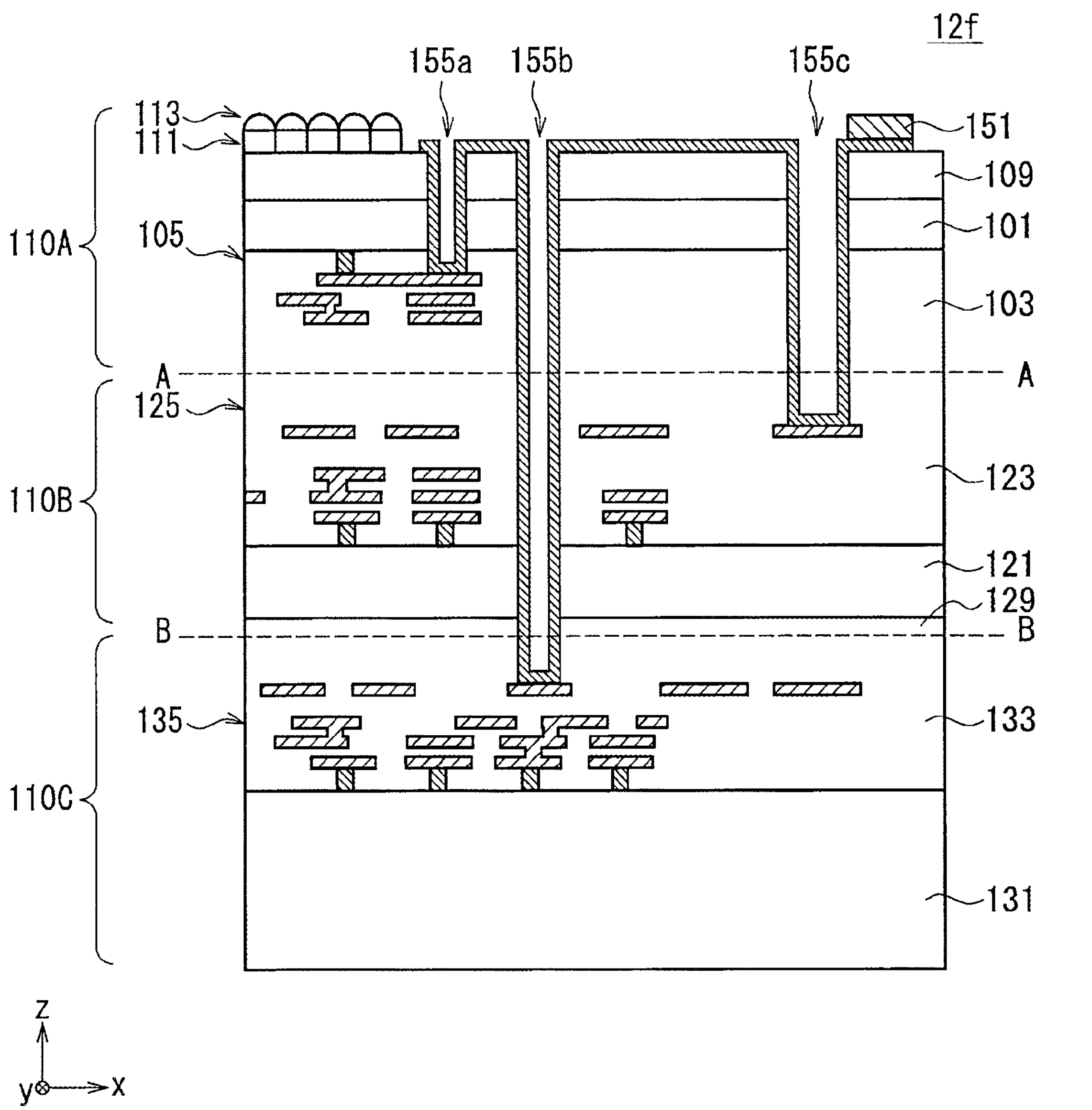
FIG. 16F is a vertical cross-sectional view of a schematic configuration of the solid-state imaging device according to the eleventh configuration example of the present embodiment.

A solid-state imaging device 12*f* illustrated in FIG. 16F corresponds to the solid-state imaging device Re illustrated in FIG. 16E in which the non-embedded type lead-out pad structure using the TSV dual-use lead line openings 155*a* and 155*b* and the lead line opening 155*c* (i.e., the TSV dual-use lead line openings 155*a* and 155*b*, the lead line opening 155*c* and the pad 151 on the surface on the back surface side of the first substrate 110A) is provided instead of the TSV 157 and the lead-out pad structure for the second substrate 110B and the third substrate 110C by changing the embedded type TSV 157 to the non-embedded type TSV and by providing the TSV dual-use lead line openings 155*a* and 155*b* as well as the lead line opening 155*c* for the predetermined wiring line in the multi-layered wiring layer 125 of the second substrate 110B. Note that, in the configuration illustrated in FIG. 16F, one pad 151 is shared by the TSV dual-use lead line openings 155*a* and 155*b* and the lead line opening 155*c*.

Figure 16G:
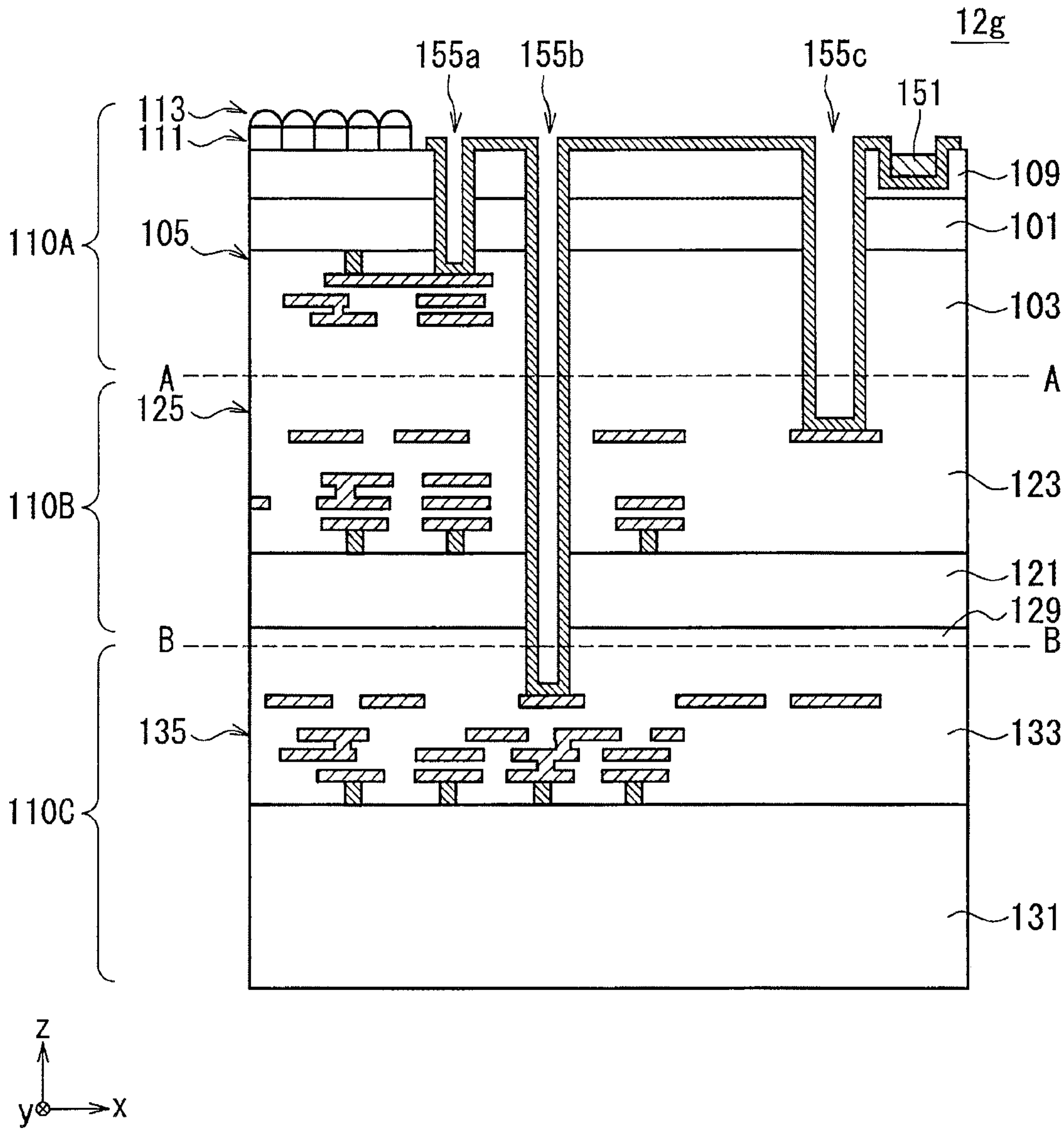
FIG. 16G is a vertical cross-sectional view of a schematic configuration of the solid-state imaging device according to the eleventh configuration example of the present embodiment.

A solid-state imaging device 12*g* illustrated in FIG. 16G corresponds to the solid-state imaging device 12*f* illustrated in FIG. 16F in which the embedded type lead-out pad structure is provided instead of the non-embedded type lead-out pad structure. Note that, in the configuration illustrated in FIG. 16G, one pad 151 is shared by the TSV dual-use lead line openings 155*a* and 155*b* and the lead line opening 155*c*.

Note that, in each of the configurations illustrated in FIGS. 16A to 16G, the types of the wiring lines coupled by the twin contact type TSV 157 between three layers are not limited. The TSV 157 may be coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In each of the configurations illustrated in FIGS. 16A to 16D, the pad 151 is provided on each of the first substrate 110A and the second substrate 110B in the illustrated example, but the present embodiment is not limited to such an example. In each of these configurations, the respective signal lines provided in the first substrate 110A and the third substrate 110C are electrically coupled to each other and the respective power supply lines provided in the first substrate 110A and the third substrate 110C are electrically coupled to each other by the TSV 157. Accordingly, the first substrate 110A and the second substrate 110B or the second substrate 110B and the third substrate 110C each provided with the respective signal lines as well as the respective power supply lines not electrically coupled to each other by the TSV 157 may be each provided with the pad 151 for electrically coupling the respective signal lines to each other and the respective power supply lines to each other. That is, in each of the configurations illustrated in FIGS. 16A to 16D, the pad 151 may be provided on each of the second substrate 110B and the third substrate 110C instead of the illustrated configuration example of the pad 151. Likewise, in the configuration illustrated in FIG. 16E, the pad 151 is provided on each of the second substrate 110B and the third substrate 110C in the illustrated example, but the pad 151 may be provided on each of the first substrate 110A and the second substrate 110B instead.

In each of the configurations illustrated in FIGS. 16D and 16E, one pad 151 is shared by the lead line openings 155*a* and 155*b* in the illustrated example, but the present embodiment is not limited to such an example. In each of these configurations, one pad 151 may be provided for each of the two lead line openings 155*a* and 155*b*. In this case, the films including the electrically-conductive material included in the two lead line openings 155*a* and 155*b* may be so extended on the surface on the back surface side of the first substrate 110A as to be isolated from each other (i.e., so that both are non-conductive).

In each of the configurations illustrated in FIGS. 16F and 16C one pad 151 is shared by the TSV dual-use lead line openings 155*a* and 155*b* and the lead line opening 155*c* in the illustrated example, but the present embodiment is not limited to such an example. In each of these configurations, one pad 151 may be provided for each of the TSV dual-use lead line openings 155*a* and 155*b* (i.e., for the TSV 157) and the lead line opening 155*c*. In this case, the films including the electrically-conductive materials included in the TSV dual-use lead line openings 155*a* and 155*b* and the film including the electrically-conductive material included in the lead line opening 155*c* may be so extended on the surface on the back surface side of the first substrate 110A as to be isolated from each other (i.e., so that both are non-conductive).

Further, in a case where a lead-out pad structure is provided, the lead-out pad structure may be the non-embedded type or the embedded type. For example, in the configuration illustrated in FIG. 16D, the embedded type lead-out pad structure may be provided instead of the non-embedded type lead-out pad structure. Further, for example, in the configuration illustrated in FIG. 16E, the non-embedded type lead-out pad structure may be provided instead of the embedded type lead-out pad structure.

In addition, it is sufficient for the twin contact type TSV 157 between three layers to electrically couple the respective signal lines as well as the respective power supply lines provided in two of the first substrate 110A, the second substrate 110B, and the third substrate 110C to each other in accordance with the direction in which the TSV 157 is formed. The substrates provided with the respective signal lines as well as the respective power supply lines to be electrically coupled to each other by the TSV 157 may be optionally changed.

4-12. Twelfth Configuration Example

FIGS. 17A to 17J are each a vertical cross-sectional view of a schematic configuration of a solid-state imaging device according to a twelfth configuration example of the present embodiment. The solid-state imaging device according to the present embodiment may have each of the configurations illustrated in FIGS. 17A to 17J.

Figure 17A:
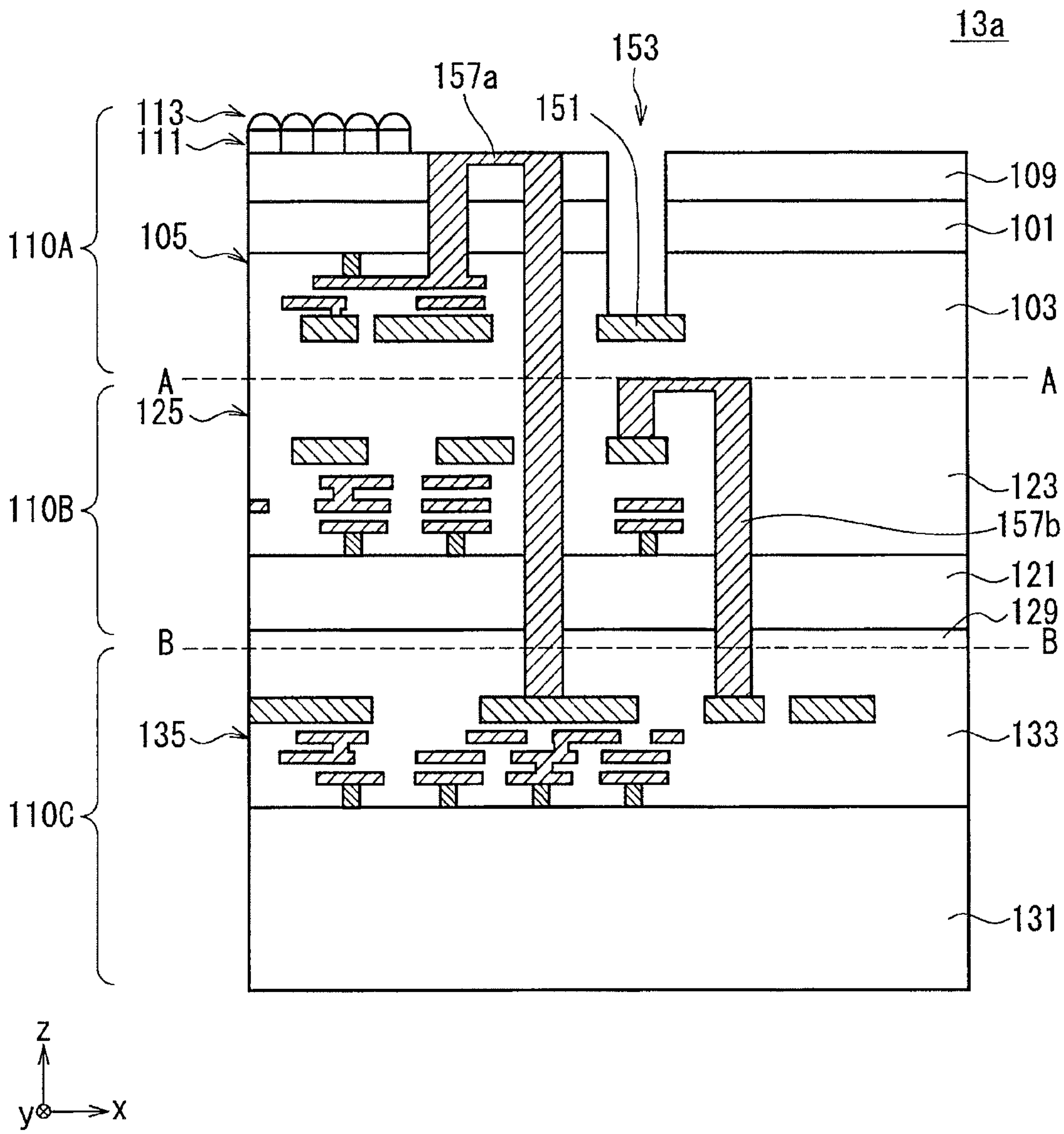
FIG. 17A is a vertical cross-sectional view of a schematic configuration of a solid-state imaging device according to a twelfth configuration example of the present embodiment.

A solid-state imaging device 13*a* illustrated in FIG. 17A includes, as coupling structures, the TSV 157*a* of the twin contact type and the embedded type between three layers, the TSV 157*b* of the twin contact type and the embedded type between two layers, and the embedded pad structure for the first substrate 110A (i.e., the pad 151 provided in the multi-layered wiring layer OS of the first substrate 110A and the pad opening 153 exposing the pad 151).

The TSV 157*a* is formed from the back surface side of the first substrate 110A toward the third substrate 110C, and is so provided as to electrically couple the respective signal lines provided in the first substrate 110A and the third substrate 110C to each other and the respective power supply lines provided in the first substrate 110A and the third substrate 110C to each other. In the configuration illustrated in FIG. 17A, the predetermined wiring line of the first metal wiring layer in the multi-layered wiring layer 105 of the first substrate 110A and the predetermined wiring line of the second metal wiring layer in the multi-layered wiring layer 135 of the third substrate 110C are electrically coupled to each other by the TSV 157*a*. In addition, the TSV 157*b* is formed from the front surface side of the second substrate 110B toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 17A, the predetermined wiring line of the second metal wiring layer in the multi-layered wiring layer 125 of the second substrate 110B and the predetermined wiring line of the second metal wiring layer in the multi-layered wiring layer 135 of the third substrate 110C are electrically coupled to each other by the TSV 157*b*.

Figure 17B:
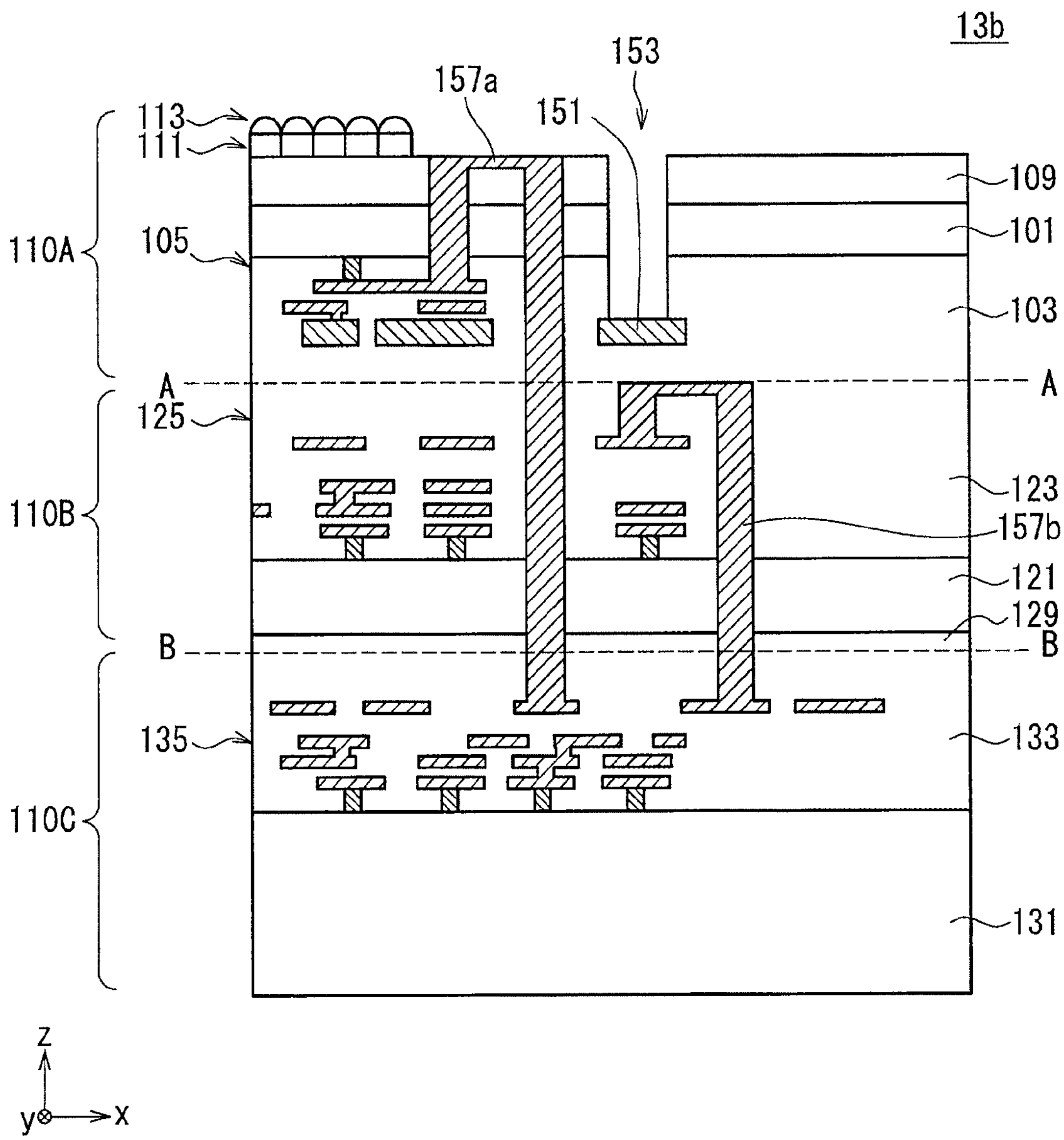
FIG. 17B is a vertical cross-sectional view of a schematic configuration of the solid-state imaging device according to the twelfth configuration example of the present embodiment.

A solid-state imaging device 13*b* illustrated in FIG. 17B corresponds to the solid-state imaging device 13*a* illustrated in FIG. 17A in which the types of the wiring lines electrically coupled by the TSVs 157*a* and 157*b* are changed. Specifically, in the configuration illustrated in FIG. 17B, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*a*. In addition, in the configuration illustrated in FIG. 17B, the predetermined wiring line of the rust metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*.

Figure 17C:
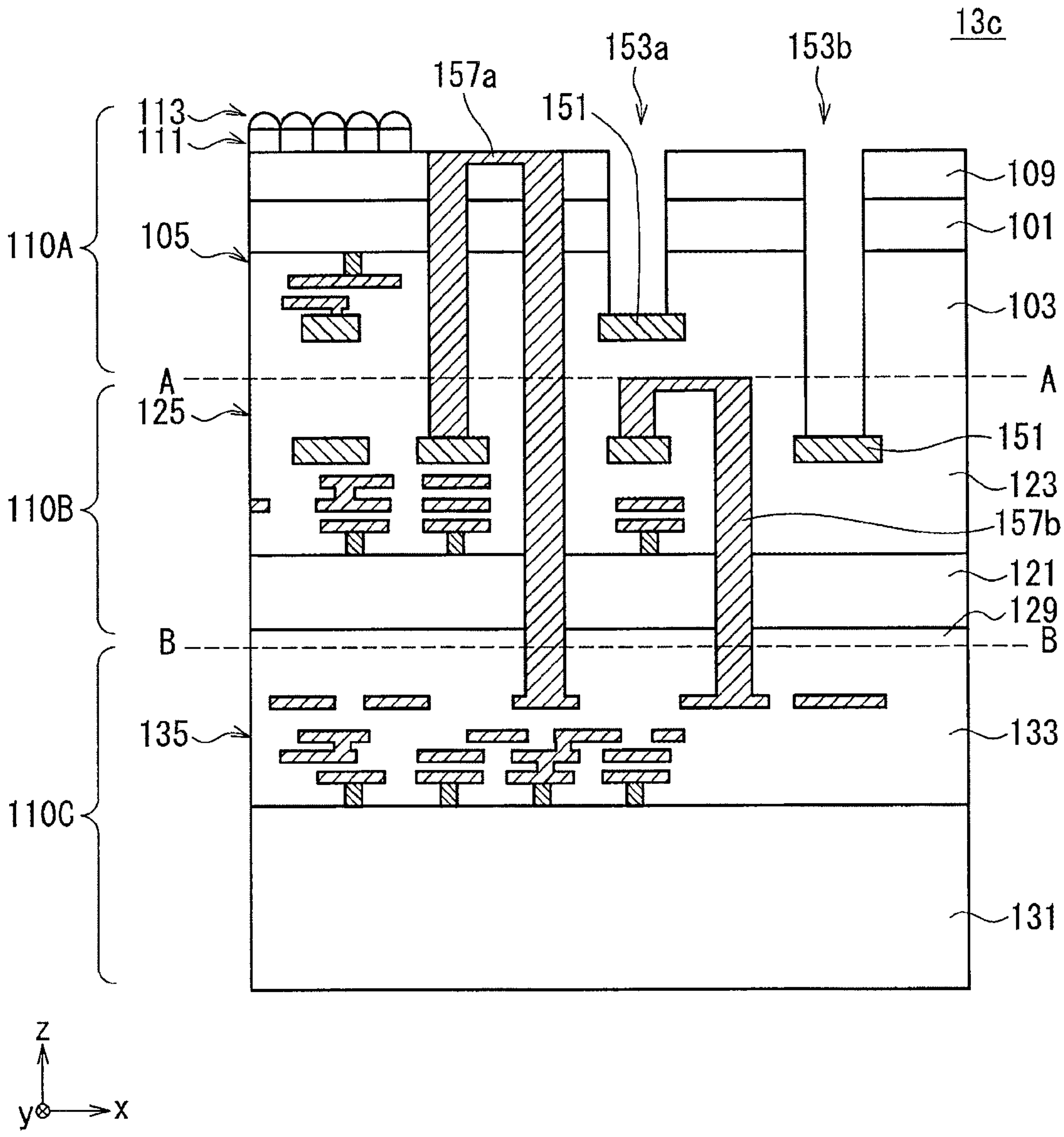
FIG. 17C is a vertical cross-sectional view of a schematic configuration of the solid-state imaging device according to the twelfth configuration example of the present embodiment.

A solid-state imaging device 13*c* illustrated in FIG. 17C includes, as coupling structures, the TSV 157*a* of the twin contact type and the embedded type between three layers, the TSV 157*b* of the twin contact type and the embedded type between two layers, the embedded pad structure for the first substrate 110A (i.e., the pad 151 provided in the multi-layered wiring layer 105 of the first substrate 110A and the pad opening 153*a* exposing the pad 151), and the embedded pad structure for the second substrate 110B (i.e., the pad 151 provided in the multi-layered wiring layer 125 of the second substrate 110B and the pad opening 153*b* exposing the pad 151).

The TSV 157*a* is formed from the back surface side of the first substrate 110A toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 17C, the predetermined wiring line of the second metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*a*. In addition, the TSV 157*b* is formed from the front surface side of the second substrate 110B toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 17C, the predetermined wiring line of the second metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*. In addition, the respective signal lines provided in the first substrate 110A and the second substrate 110B may be electrically coupled to each other and the respective power supply lines provided in the first substrate 110A and the second substrate 110B may be electrically coupled to each other by the two embedded pad structures.

Figure 17D:
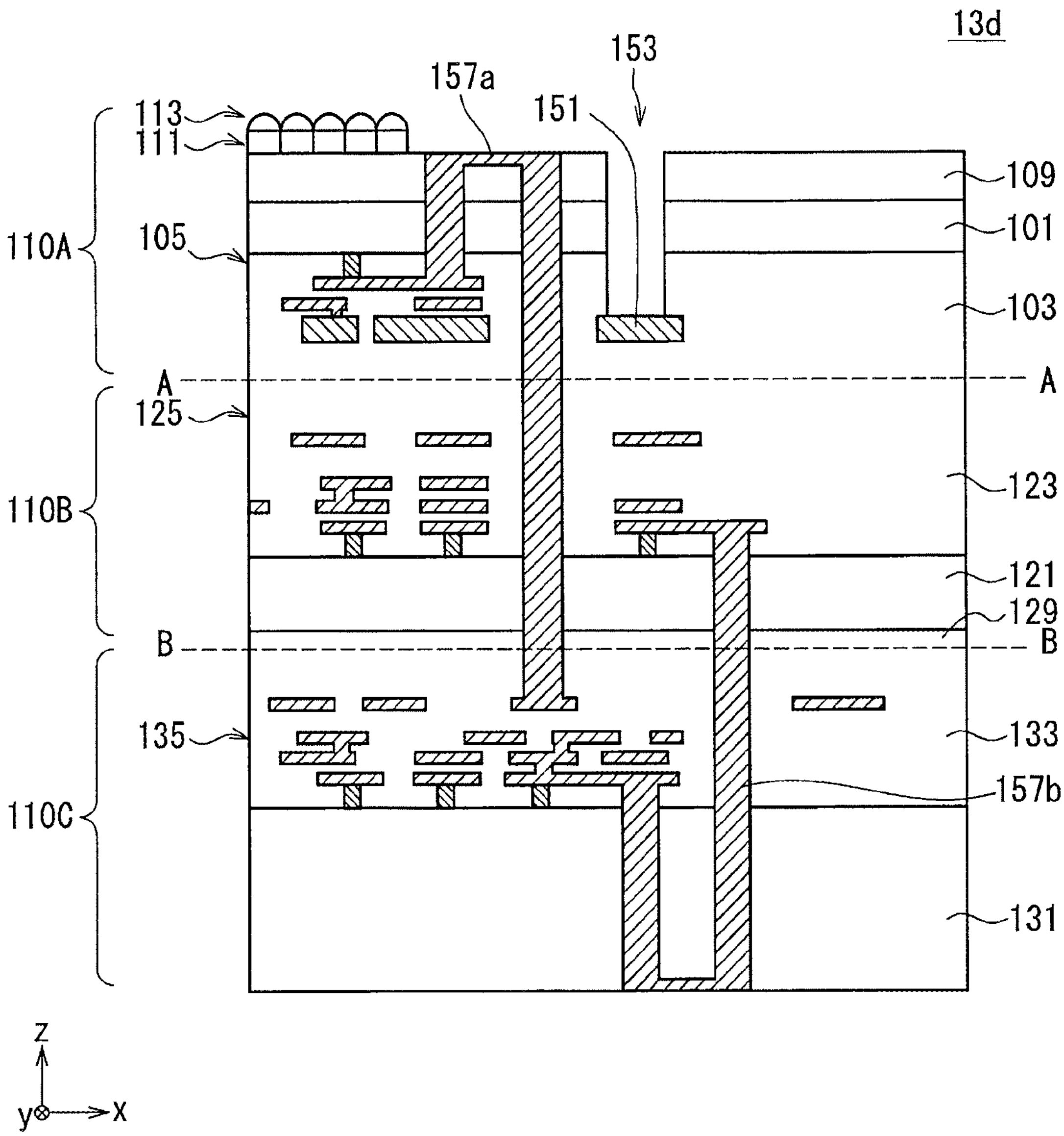
FIG. 17D is a vertical cross-sectional view of a schematic configuration of the solid-state imaging device according to the twelfth configuration example of the present embodiment.

A solid-state imaging device 13*d* illustrated in FIG. 17D corresponds to the solid-state imaging device 13*b* illustrated in FIG. 17B in which the TSV 157*b* structure is changed. Specifically, in the configuration illustrated in FIG. 17D, the TSV 157*b* is formed from the back surface side of the third substrate 110C toward the second substrate 110B, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 17D, the predetermined wiring line of the first metal wiring layer in the multi-layered wiring layer 125 of the second substrate 1106 and the predetermined wiring line of the first metal wiring layer in the multi-layered wiring layer 135 of the third substrate 110C are electrically coupled to each other by the TSV 157*b*.

Figure 17E:
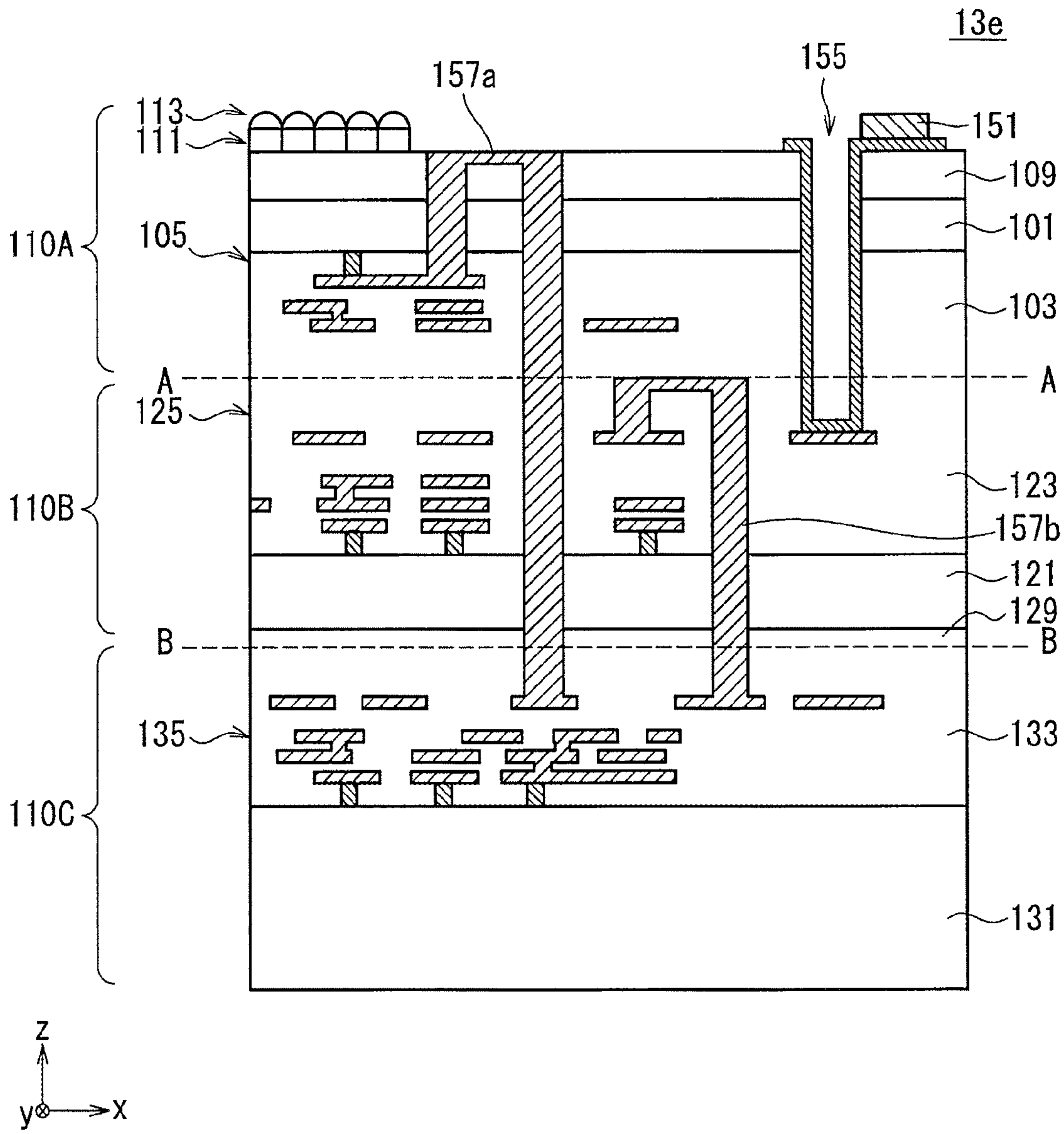
FIG. 17E is a vertical cross-sectional view of a schematic configuration of the solid-state imaging device according to the twelfth configuration example of the present embodiment.

A solid-state imaging device 13*e* illustrated in FIG. 17E corresponds to the solid-state imaging device 13*b* illustrated in FIG. 17B in which the embedded pad structure is changed. Specifically, in the configuration illustrated in FIG. 17E, the non-embedded type lead-out pad structure for the second substrate 110B (i.e., the lead line opening 155 for the predetermined wiring line in the multi-layered wiring layer 125 of the second substrate 110B and the pad 151 on the surface on the back surface side of the first substrate 110A) is provided instead of the embedded pad structure.

Figure 17F:
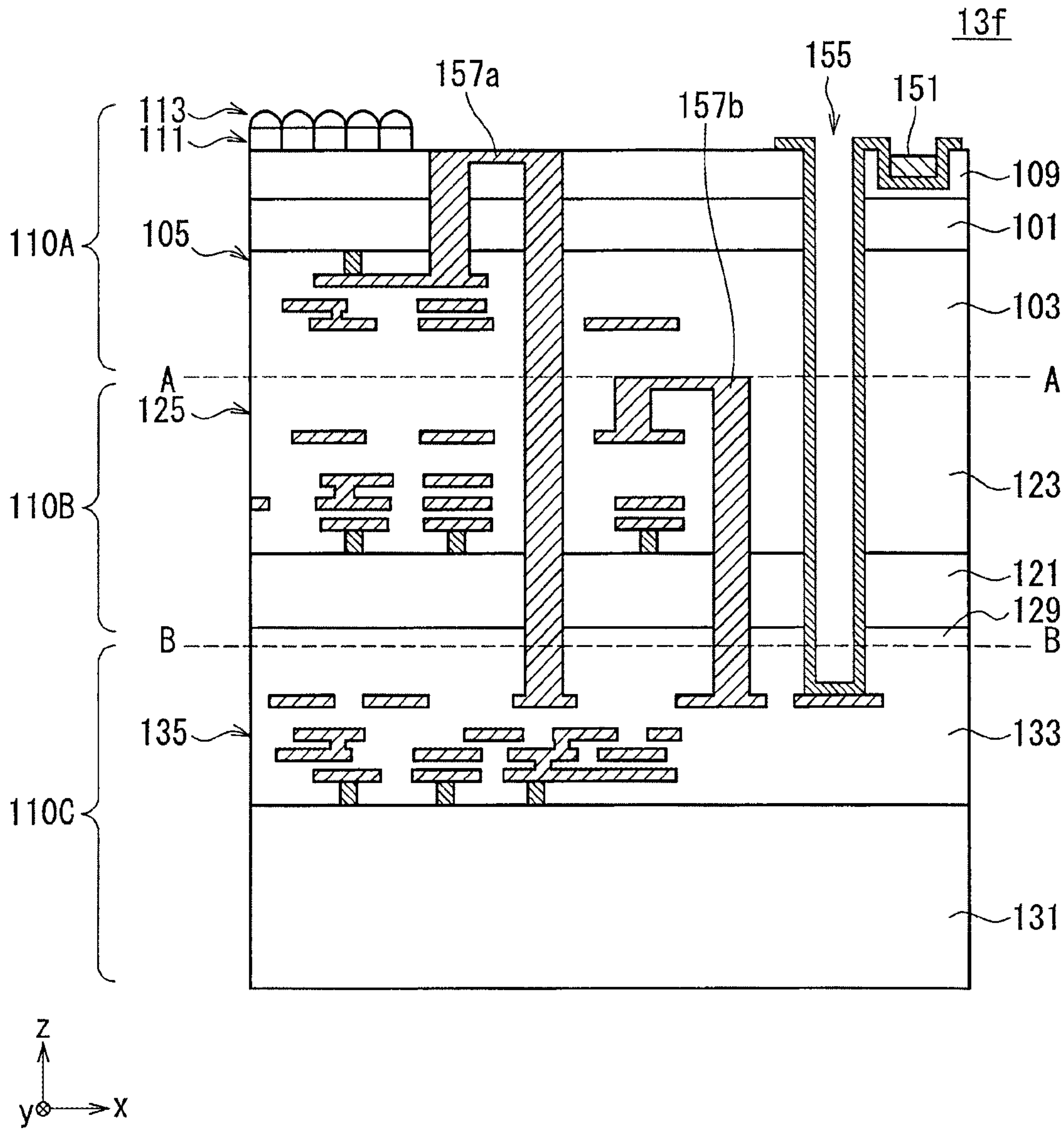
FIG. 17F is a vertical cross-sectional view of a schematic configuration of the solid-state imaging device according to the twelfth configuration example of the present embodiment.

A solid-state imaging device 13*f* illustrated in FIG. 17F corresponds to the solid-state imaging device 13*e* illustrated in FIG. 17E in which the configuration of the lead-out pad structure is changed. Specifically, in the configuration illustrated in FIG. 17F, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 109 on the surface on the back surface side of the first substrate 110A) is provided instead of the non-embedded type lead-out pad structure for the second substrate 110B.

Figure 17G:
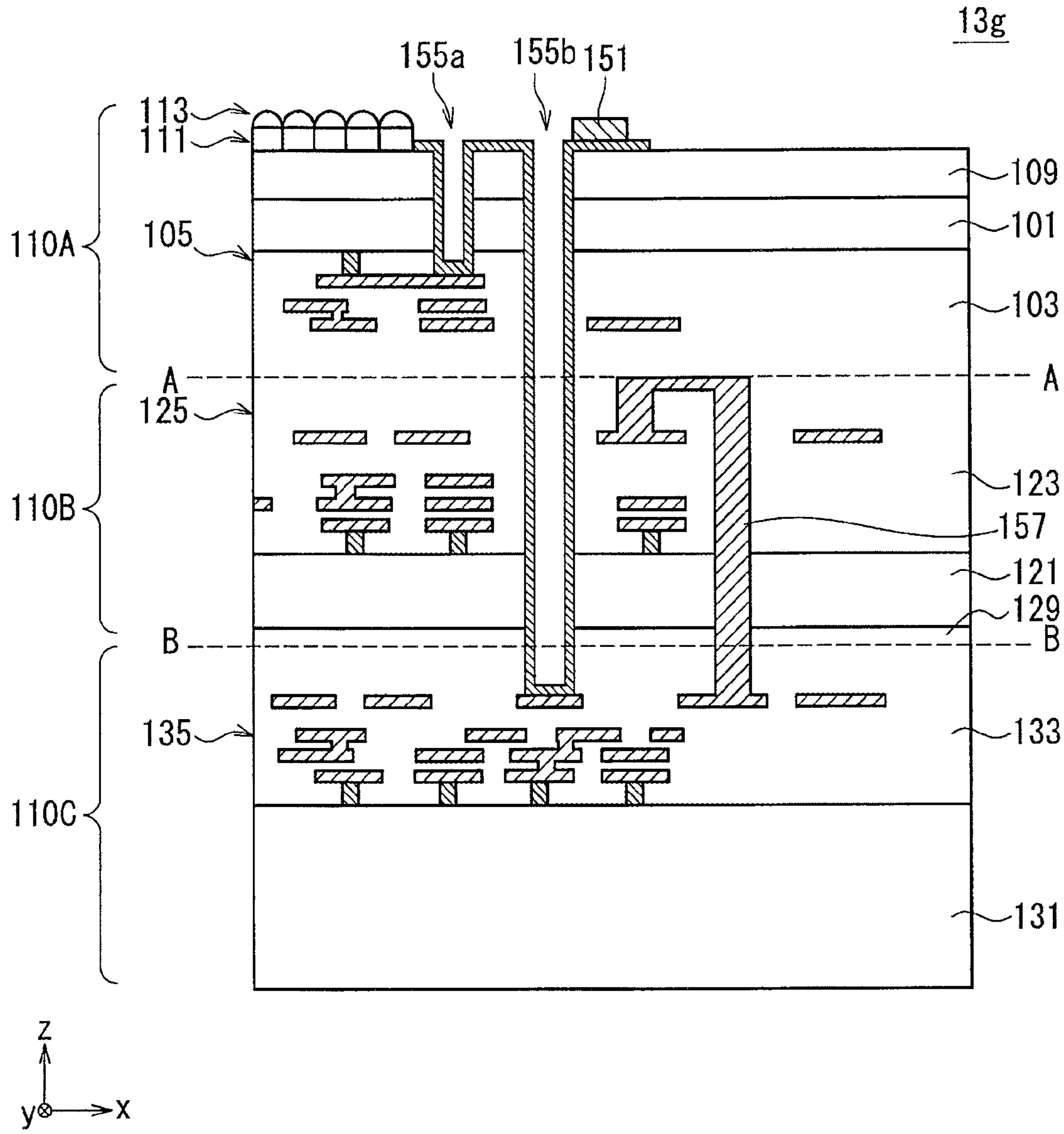
FIG. 17G is a vertical cross-sectional view of a schematic configuration of the solid-state imaging device according to the twelfth configuration example of the present embodiment.

A solid-state imaging device 13*g* illustrated in FIG. 17G corresponds to the solid-state imaging device 13*b* illustrated in FIG. 17B in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded pad structure by changing the embedded type TSV 157*a* to the non-embedded type TSV.

Figure 17H:
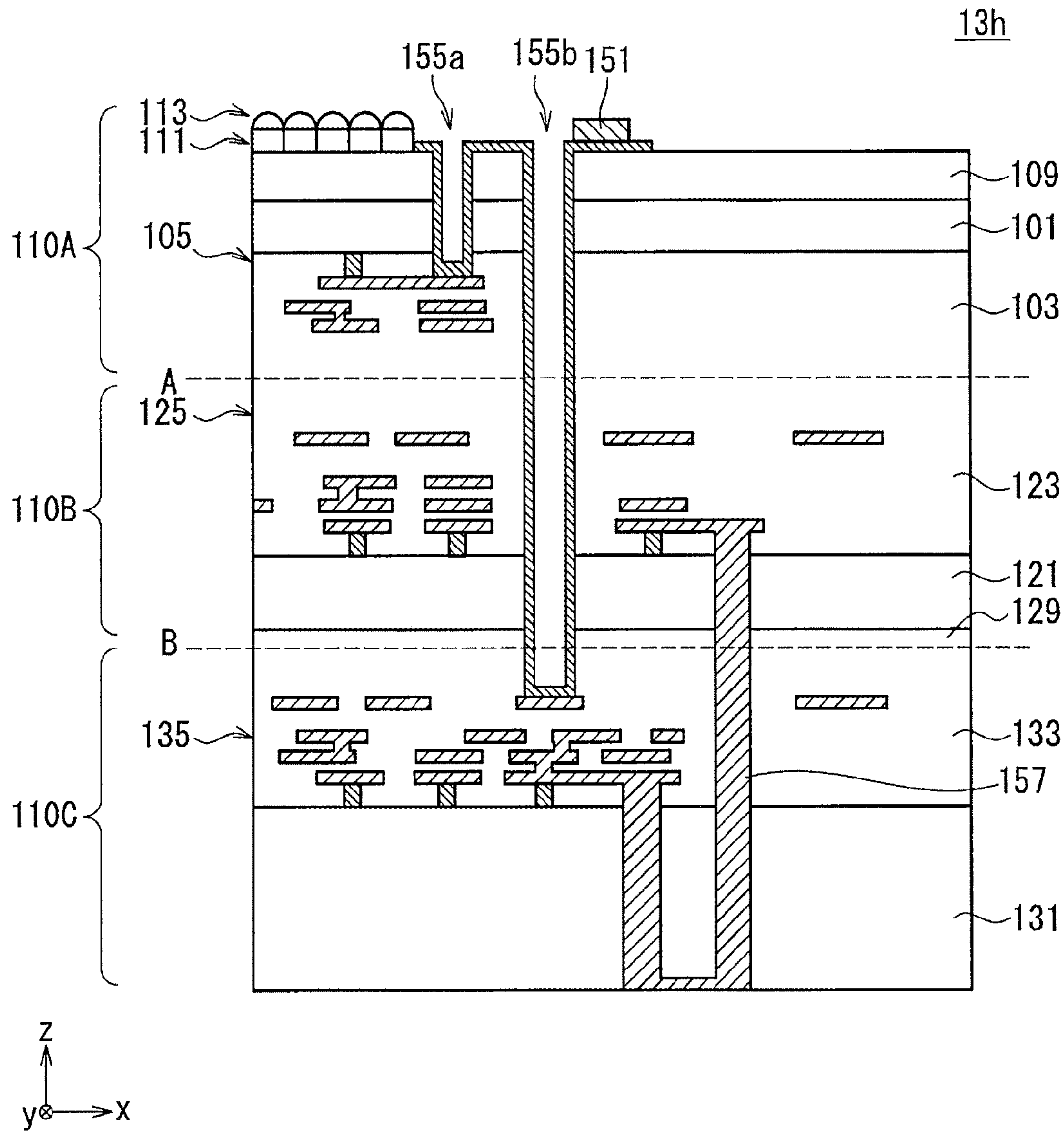
FIG. 17H is a vertical cross-sectional view of a schematic configuration of the solid-state imaging device according to the twelfth configuration example of the present embodiment.

A solid-state imaging device 13*h* illustrated in FIG. 17H corresponds to the solid-state imaging device 13*d* illustrated in FIG. 17D in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded pad structure by changing the embedded type TSV 157*a* to the non-embedded type TSV.

Figure 17I:
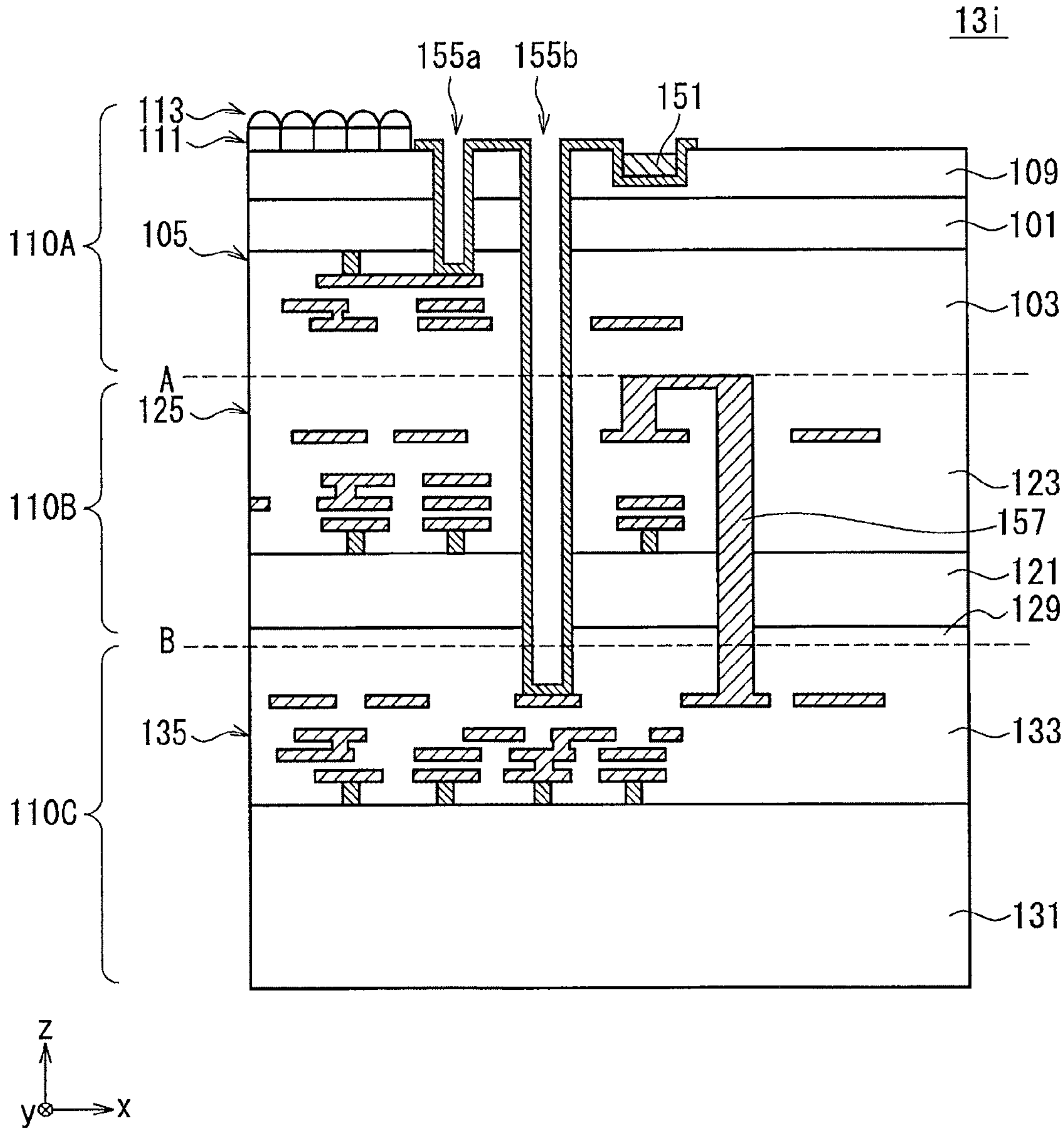
FIG. 17I is a vertical cross-sectional view of a schematic configuration of the solid-state imaging device according to the twelfth configuration example of the present embodiment.

A solid-state imaging device 3I illustrated in FIG. 17I corresponds to the solid-state imaging device 13*g* illustrated in FIG. 17G in which the non-embedded type lead-out pad structure of the TSV dual-use lead line openings 155*a* and 155*b* is changed to the embedded type lead-out pad structure.

Figure 17J:
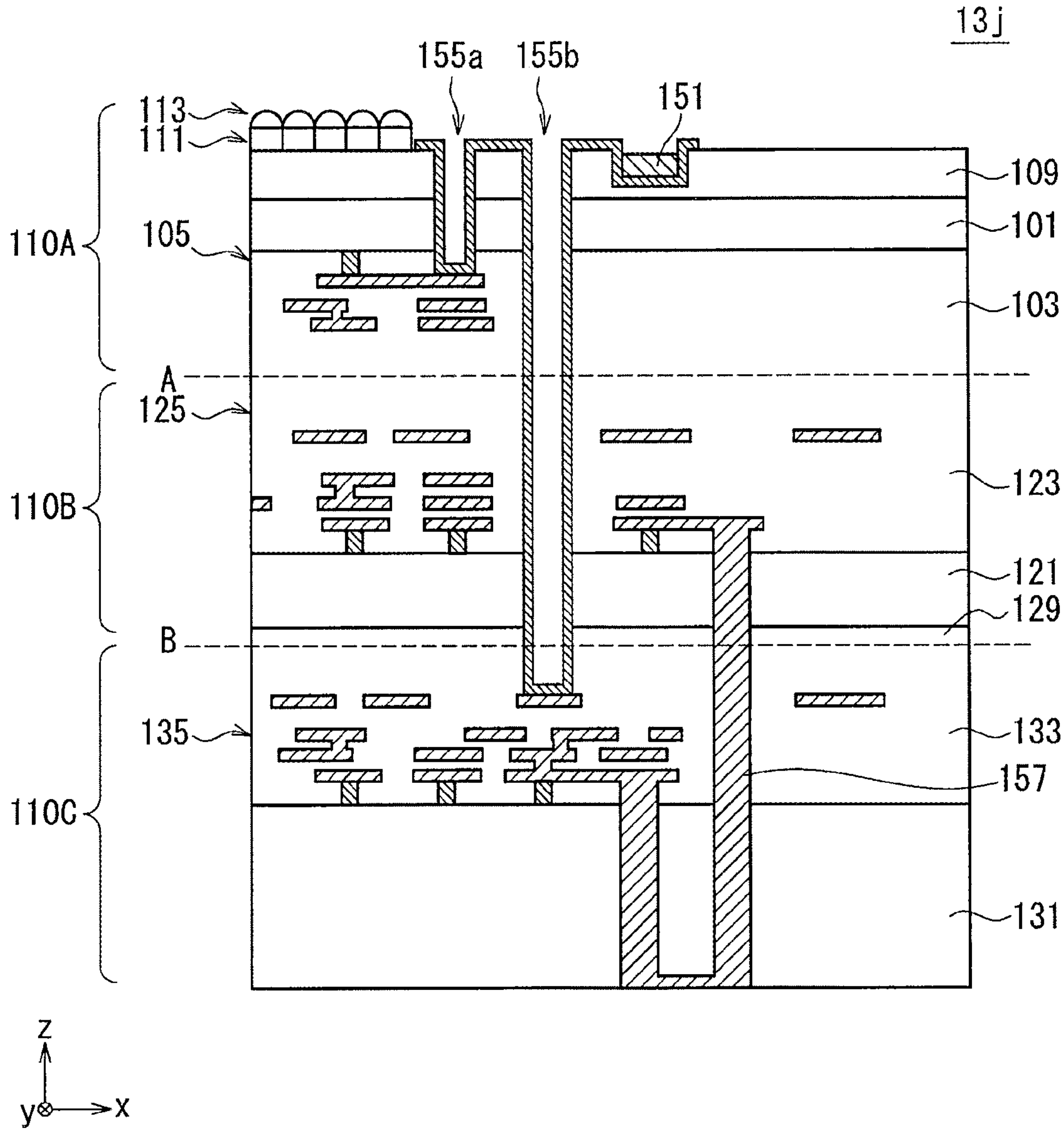
FIG. 17J is a vertical cross-sectional view of a schematic configuration of the solid-state imaging device according to the twelfth configuration example of the present embodiment.

A solid-state imaging device 13*j* illustrated in FIG. 17J corresponds to the solid-state imaging device 13*h* illustrated in FIG. 17H in which the non-embedded type lead-out pad structure of the TSV dual-use lead line openings 155*a* and 155*b* is changed to the embedded type lead-out pad structure.

Note that, in each of the configurations illustrated in FIGS. 17A to 17J, the types of the wiring lines coupled by the twin contact type TSVs 157 between two layers and three layers are not limited. These TSVs 157 may be each coupled to the predetermined wiring line of the first metal wiring layer or may be coupled to the predetermined wiring line or the second metal wiring layer. In addition, each of the multi-layered wiring layers 105, 125, and 135 may include only the first metal wiring layer, may include only the second metal wiring layer, or may include both of them so as to coexist.

In the configuration illustrated in FIG. 17C, the pad 151 is provided on each of the first substrate 110A and the second substrate 110B in the illustrated example, but the present embodiment is not limited to such an example. In this configuration, the respective signal lines provided in the second substrate 110B and the third substrate 110C are electrically coupled to each other and the respective power supply lines provided in the second substrate 110B and the third substrate 110C are electrically coupled to each other by the TSVs 157*a* and 157*b*. Accordingly, the first substrate 110A and the second substrate 110B or the first substrate 110A and the third substrate 110C each provided with the signal lines as well as the power supply lines not electrically coupled to each other by the TSV 157*a* or the TSV 157*b* may be each provided with the pad 151 for electrically coupling the respective signal lines to each other and the respective power supply lines to each other. That is, in each configuration illustrated in FIG. 17C, the pad 151 may be provided on each of the first substrate 110A and the third substrate 110C instead of the illustrated configuration example of the pad 151.

Further, in each of the configurations illustrated in FIGS. 17A, 17B, and 17 D to 17F, the substrate on which the pad 151 is provided is not limited to the illustrated example. In each of these configurations, the respective signal lines provided in the first substrate 110A and the third substrate 110C are electrically coupled to each other and the respective power supply lines provided in the first substrate 110A and the third substrate 110C are electrically coupled to each other by one TSV 157*a*. The respective signal lines provided in the second substrate 110B and the third substrate 110C are electrically coupled to each other and the respective power supply lines provided in the second substrate 110B and the third substrate 110C are electrically coupled to each other by the other TSV 157*b*. Accordingly, the pad 151 as the coupling structure may not be provided. Thus, for example, in each of the configurations illustrated in FIGS. 17A, 17B, and 17 D to 17F, the pad 151 may be provided on any of the substrates 110A, 110B, and 110C to derive a desired signal.

In a case where a lead-out pad structure is provided, the lead-out pad structure may be the non-embedded type or the embedded type. For example, in the configuration illustrated in FIG. 17E, the embedded type lead-out pad structure may be provided instead of the non-embedded type lead-out pad structure. Further, for example, in the configuration illustrated in FIG. 17F, the non-embedded type lead-out pad structure may be provided instead of the embedded type lead-out pad structure.

In addition, it is sufficient for the twin contact type TSV 157 between three layers to electrically couple the respective signal lines as well as the respective power supply lines provided in two of the first substrate IIDA, the second substrate 110B, and the third substrate 110C to each other in accordance with the direction in which the TSV 157 is formed. The substrates to be electrically coupled to each other by the TSV 157 may be optionally changed.

4-13. Thirteenth Configuration Example

FIGS. 18A to 18G are each a vertical cross-sectional view of a schematic configuration of a solid-state imaging device according to a thirteenth configuration example of the present embodiment. The solid-state imaging device according to the present embodiment may have each of the configurations illustrated in FIGS. 18A to 18G.

Figure 18A:
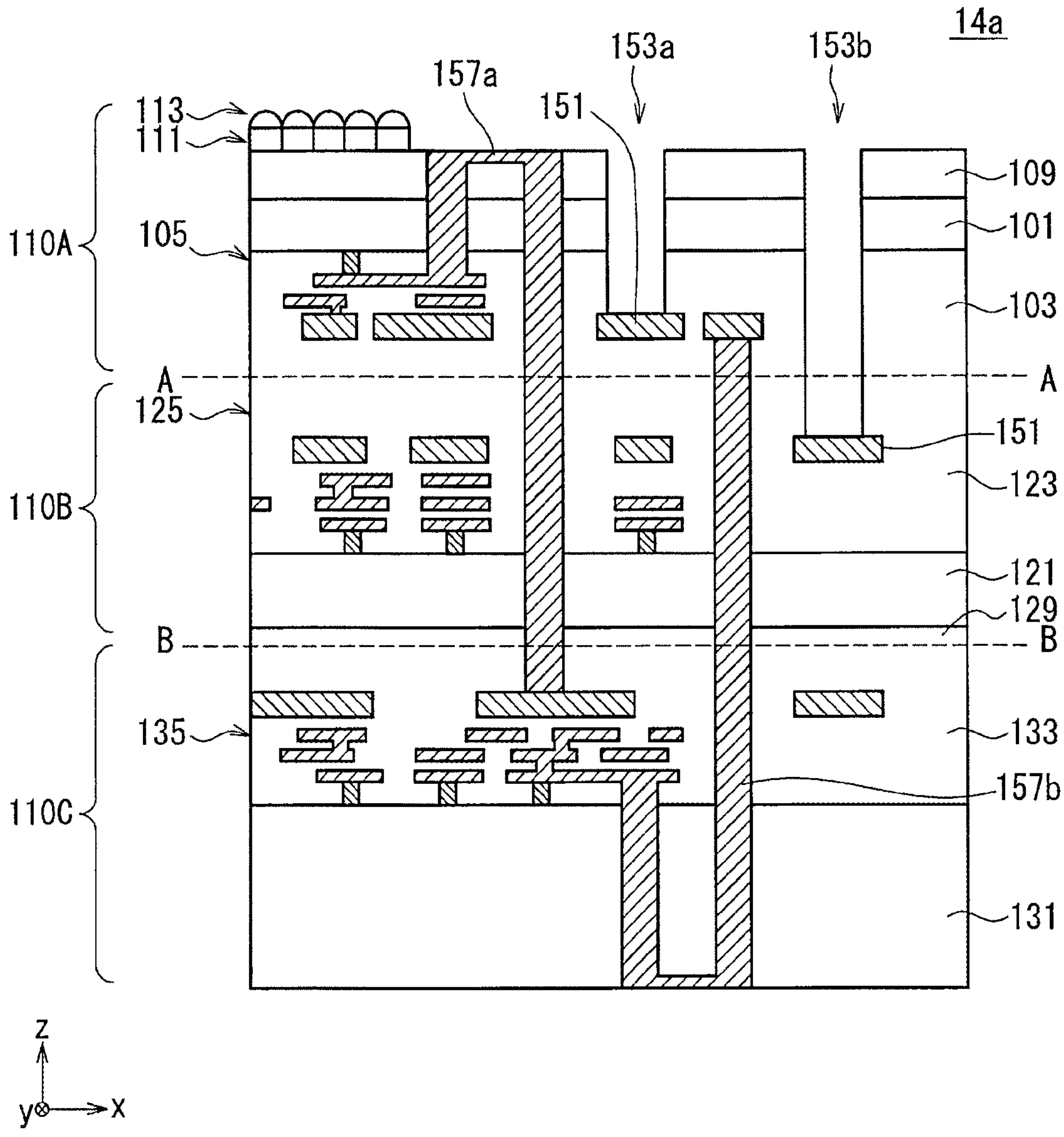
FIG. 18A is a vertical cross-sectional view of a schematic configuration of a solid-state imaging device according to a thirteenth configuration example of the present embodiment.

A solid-state imaging device 14*a* illustrated in FIG. 18A includes, as coupling structures, the TSVs 157*a* and TSV 157*b* of the twin contact type and the embedded type between three layers, the embedded pad structure for the first substrate 110A (i.e., the pad 151 provided in the multi-layered wiring layer 105 of the first substrate 110A and the pad opening 153*a* exposing the pad 151), and the embedded pad structure for the second substrate 110B (i.e., the pad 151 provided in the multi-layered wiring layer 125 of the second substrate 110B and the pad opening 153*b* exposing the pad 151).

The TSV 157*a* is formed from the back surface side of the first substrate 110A toward the third substrate 110C, and is so provided as to electrically couple the respective signal lines provided in the first substrate 110A and the third substrate 110C to each other and the respective power supply lines provided in the first substrate 110A and the third substrate 110C to each other. In the configuration illustrated in FIG. 18A the predetermined wiring line of the first metal wiring layer in the multi-layered wiring layer 105 of the first substrate 110A and the predetermined wiring line of the second metal wiring layer in the multi-layered wiring layer 135 of the third substrate 110C are electrically coupled to each other by the TSV 157*a*. The TSV 157*b* is formed from the back surface side of the third substrate 110C toward the first substrate 110A, and is so provided as to electrically couple the respective signal lines provided in the first substrate 110A and the third substrate 110C to each other and the respective power supply lines included in the first substrate 110A and the third substrate 110C to each other. In the configuration illustrated in FIG. 18A, the predetermined wiring line of the second metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*. In addition, the respective signal lines provided in the first substrate 110A and the second substrate 110B may be electrically coupled to each other and the respective power supply lines provided in the first substrate 110A and the second substrate 110B may be electrically coupled to each other by the two embedded pad structures.

Figure 18B:
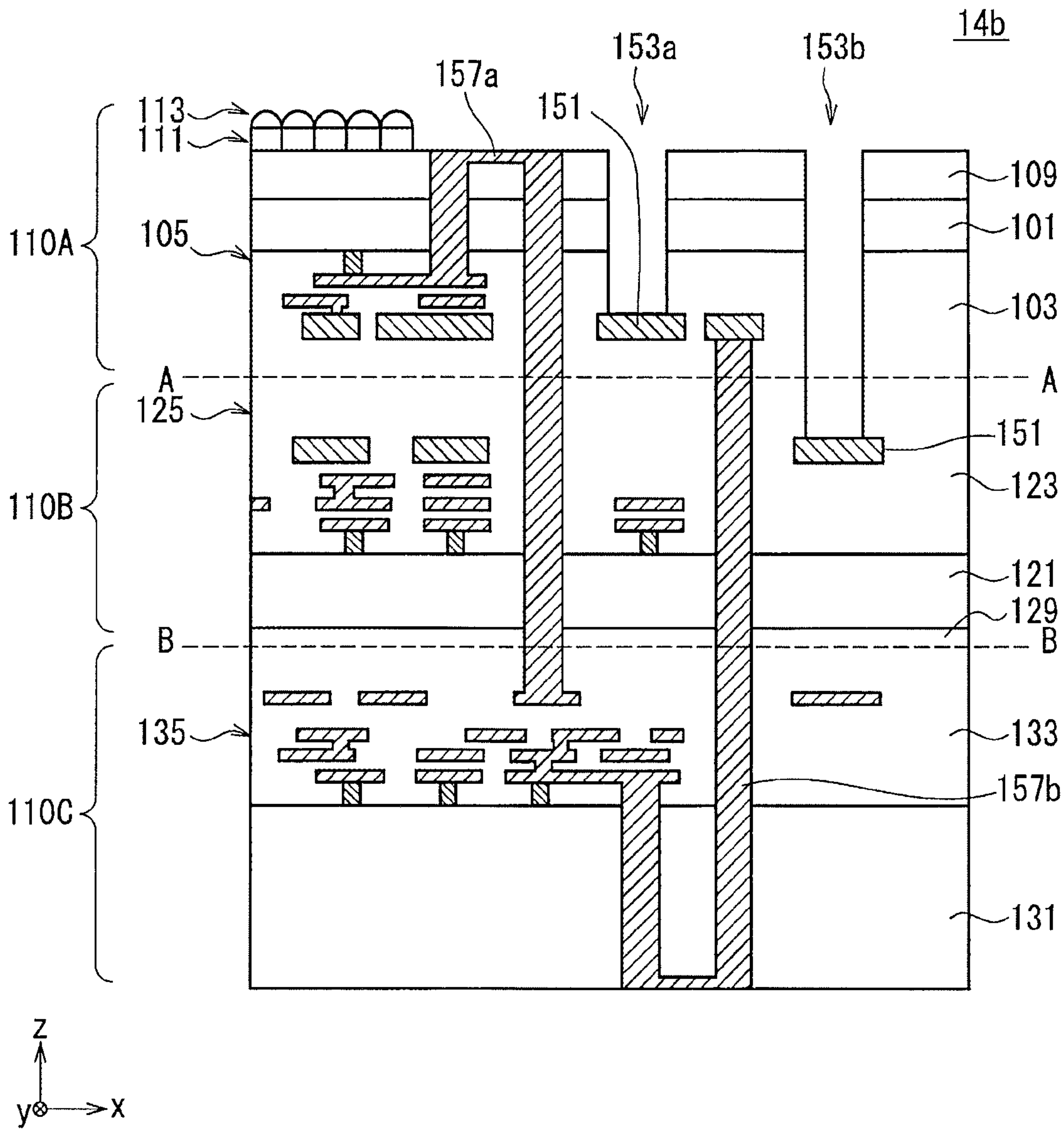
FIG. 18B is a vertical cross-sectional view of a schematic configuration of the solid-state imaging device according to the thirteenth configuration example of the present embodiment.

A solid-state imaging device 14*b* illustrated in FIG. 18B corresponds to the solid-state imaging device 14*a* illustrated in FIG. 18A in which the types of the wiring lines electrically coupled by the TSV 157*a* are changed. Specifically, in the configuration illustrated in FIG. 1B, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*a*.

Figure 18C:
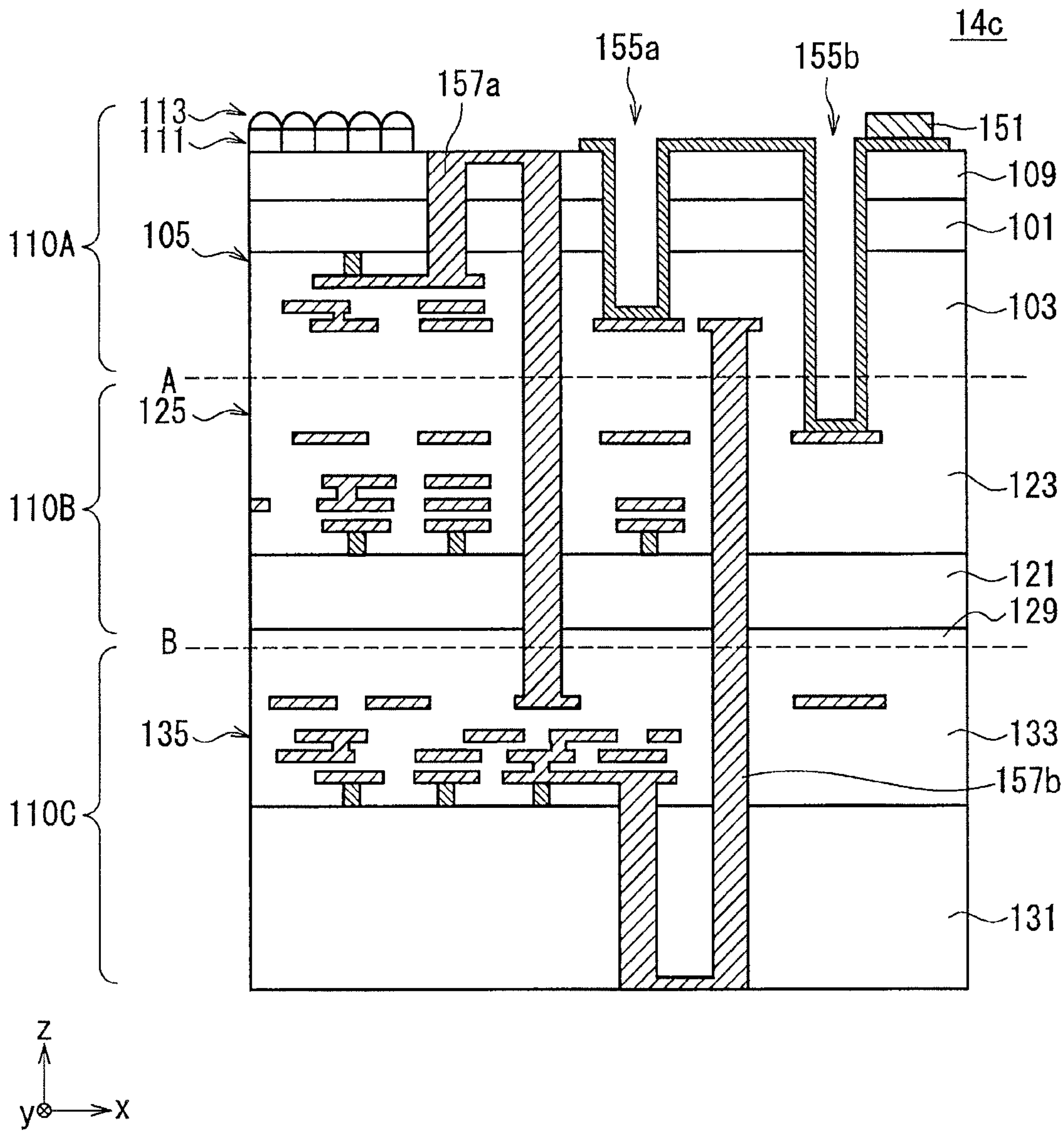
FIG. 18C is a vertical cross-sectional view of a schematic configuration of the solid-state imaging device according to the thirteenth configuration example of the present embodiment.

A solid-state imaging device 14*c* illustrated in FIG. 18C corresponds to the solid-state imaging device 14*b* illustrated in FIG. 18B in which the embedded pad structure is changed and the types of the wiring lines electrically coupled by the TSV 157*b* are changed. Specifically, in the configuration illustrated in FIG. 18C, the non-embedded type lead-out pad structure for the first substrate 110A (i.e., the lead line opening 155*a* for the predetermined wiring line in the multi-layered wiring layer 105 of the first substrate 110A and the pad 151 on the surface on the back surface side of the first substrate 110A) and the non-embedded type lead-out pad structure for the second substrate 110B (i.e., the lead line opening 155*b* for the predetermined wiring line in the multi-layered wiring layer 125 of the second substrate 110 and the pad 151 on the surface on the back surface side of the first substrate 110A) are provided instead of the embedded pad structure. In the configuration illustrated in FIG. 18C, one pad 151 is shared by the lead line openings 155*a* and 155*b*. In addition, in the configuration illustrated in FIG. 18C, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*.

Figure 18D:
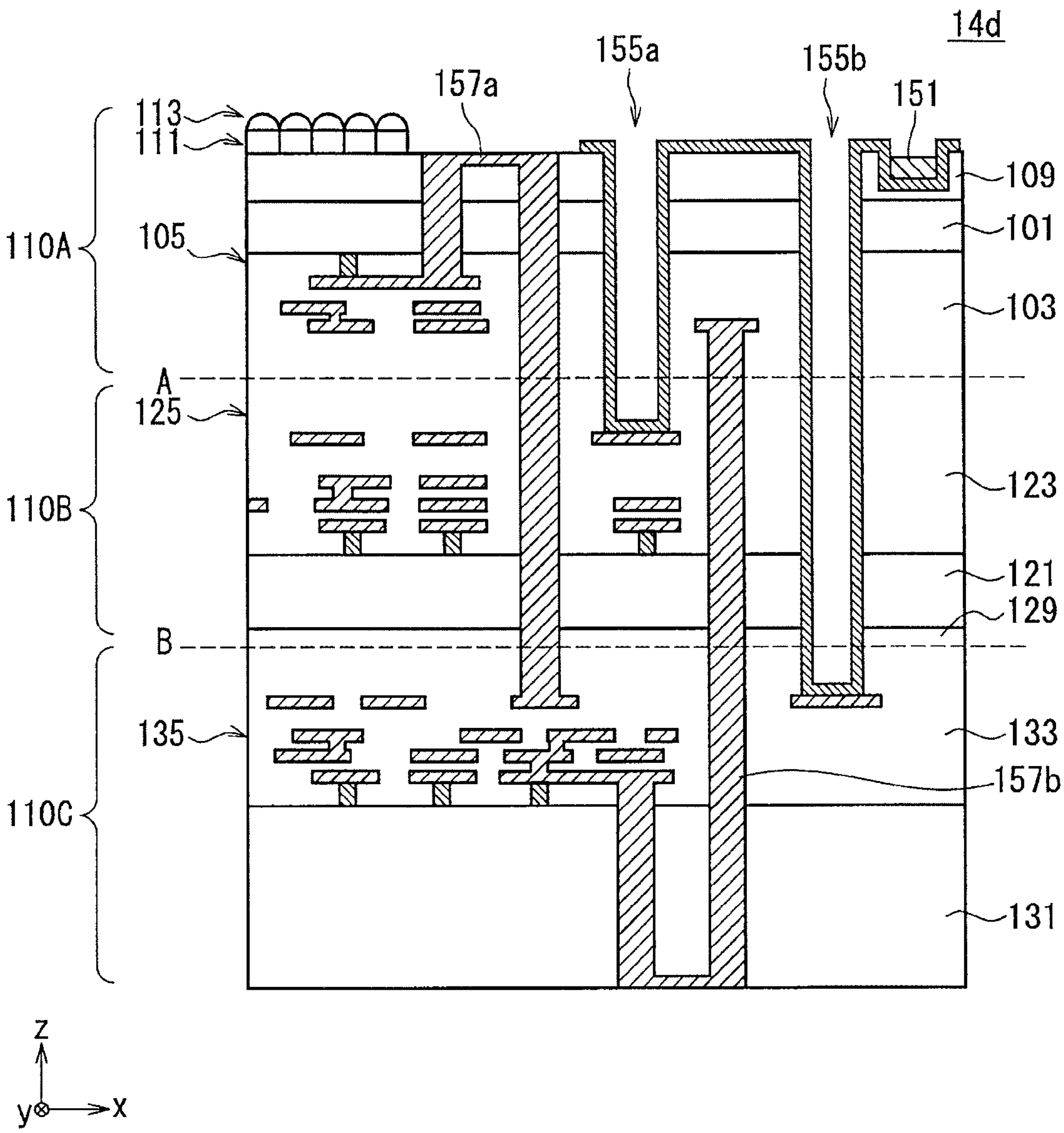

A solid-state imaging device 14*d* illustrated in FIG. 18D corresponds to the solid-state imaging device 14*c* illustrated in FIG. 18C in which the configuration of the lead-out pad structure is changed. Specifically, in the configuration illustrated in FIG. 18D, the embedded type lead-out pad structure for the second substrate 110B (i.e., the lead line opening 155*a* for the predetermined wiring line in the multi-layered wiring layer 125 of the second substrate 110B and the pad 151 formed by being embedded in the insulating film 109 on the surface on the back surface side of the first substrate 110A) and the embedded type lead-out pad structure for the third substrate 110C (i.e., the lead line opening 155*b* for the predetermined wiring line in the multi-layered wiring layer 135 of the third substrate IMC and the pad 151 formed by being embedded in the insulating film 109 on the surface on the back surface side of the first substrate 110A) are provided instead of the non-embedded type lead-out pad structure for the first substrate 110A and the second substrate 110B. In addition, in the configuration illustrated in FIG. 18D, one pad 151 is shared by the lead line openings 155*a* and 155*b*.

Figure 18E:
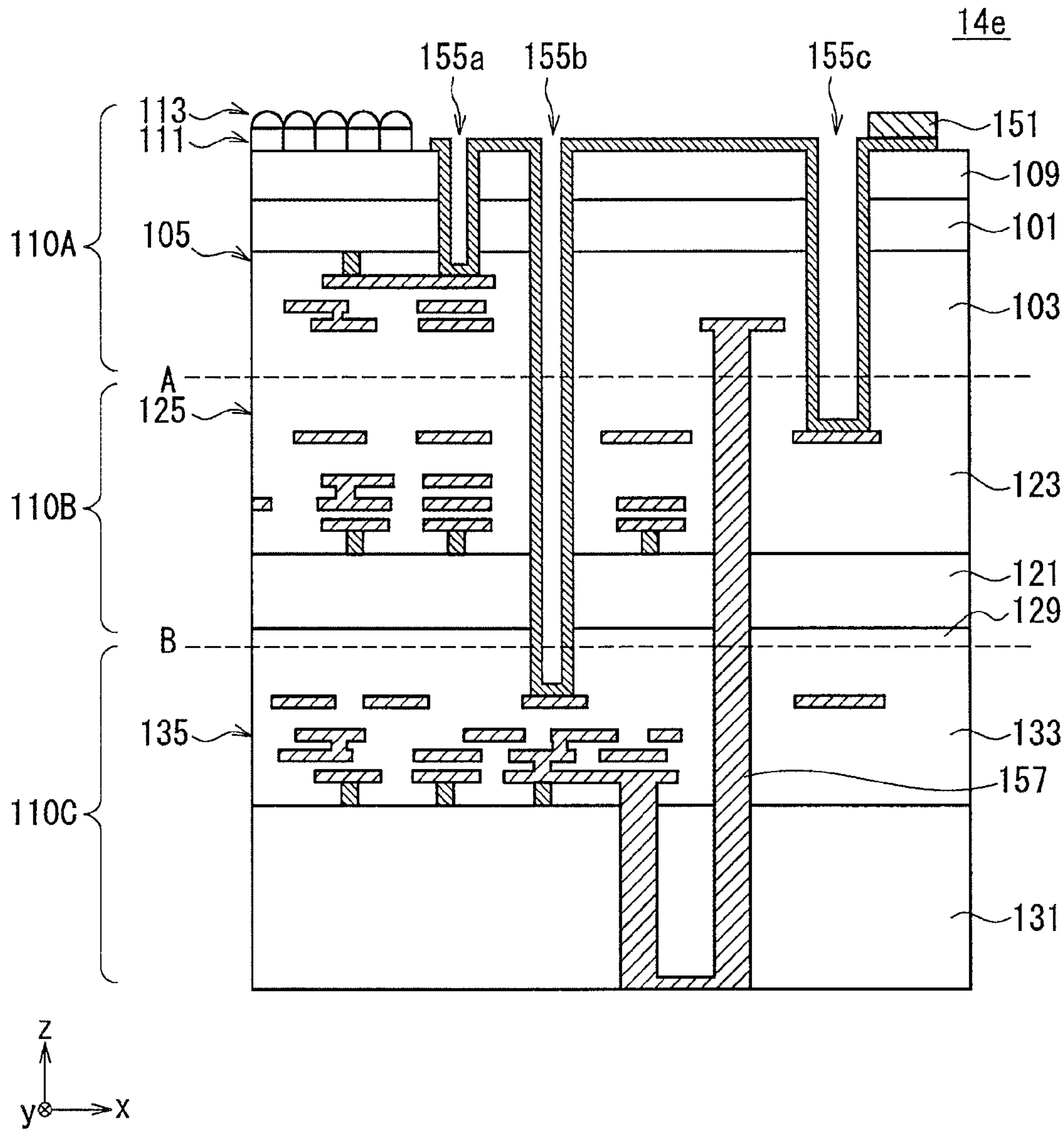

A solid-state imaging device 14*e* illustrated in FIG. 18E corresponds to the solid-state imaging device 14*d* illustrated in FIG. 18D in which the non-embedded type lead-out pad structure using the TSV dual-use lead line openings 155*a* and 155*b* and the lead line opening 155*c* (i.e., the TSV dual-we lead line openings 155*a* and 155*b*, the lead line opening 155*c* and the pad 151 on the surface on the back surface side of the first substrate 110A) is provided instead of the TSV 157*a* and the lead-out pad structure for the second substrate 110B and the third substrate 110C by changing the embedded type TSV 157*a* to the non-embedded type TSV and by providing the TSV dual-use lead line openings 155*a* and 155*b* as well as the lead line opening 155*c* for the predetermined wiring line in the multi-layered wiring layer 125 of the second substrate 110B. Note that, in the configuration illustrated in FIG. 15E, one pad 151 is shared by the TSV dual-use lead line openings 155*a* and 155*b* and the lead line opening 155*c*.

Figure 18F:
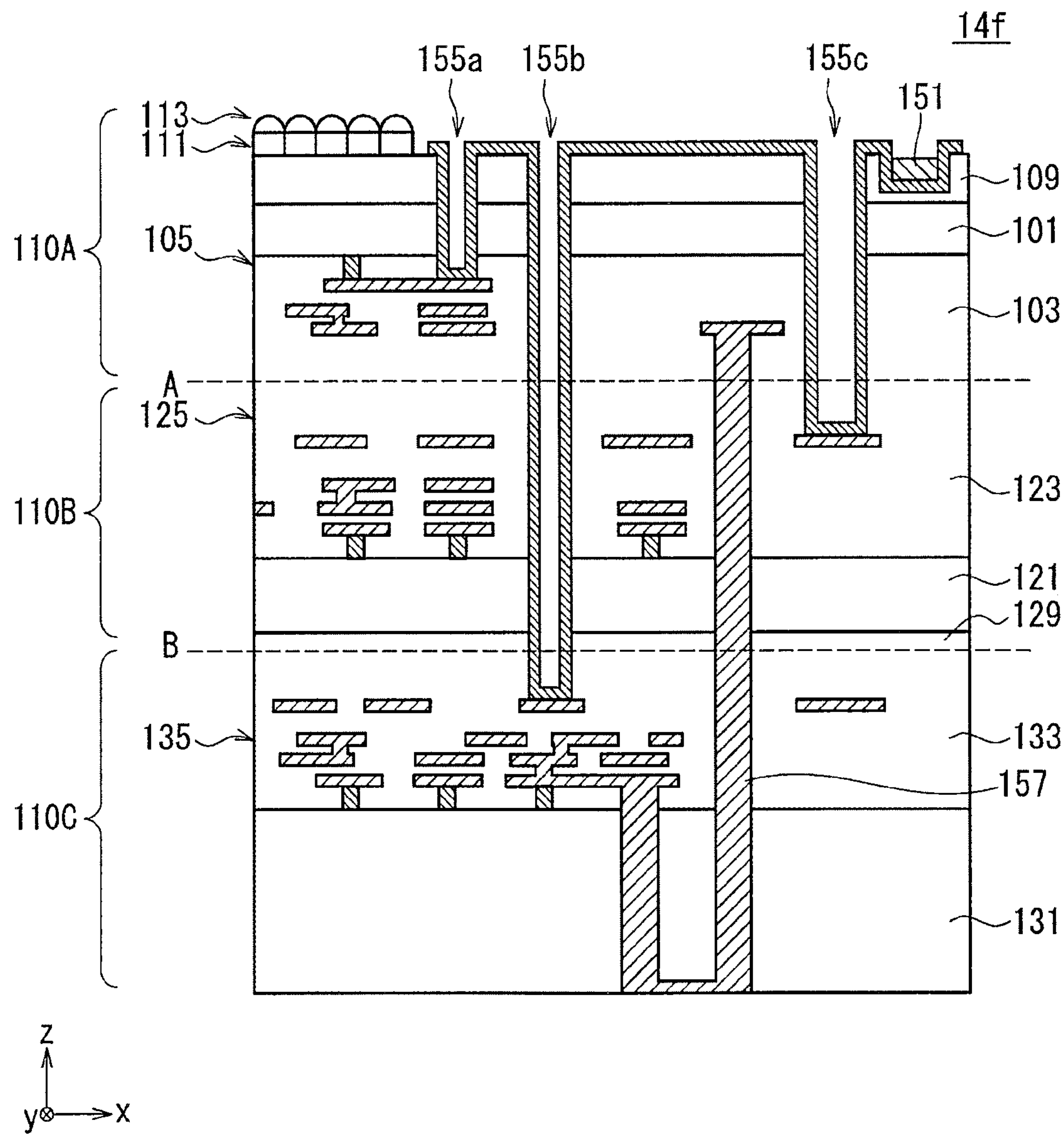

A solid-state imaging device 14*f* illustrated in FIG. 18F corresponds to the solid-state imaging device 14*e* illustrated in FIG. 18E in which the embedded type lead-out pad structure is provided instead of the non-embedded type lead-out pad structure. In the configuration illustrated in FIG. 18F, one pad 151 is shared by the TSV dual-use lead line openings 155*a* and 155*b* and the lead line opening 155*c*.

Figure 18G:
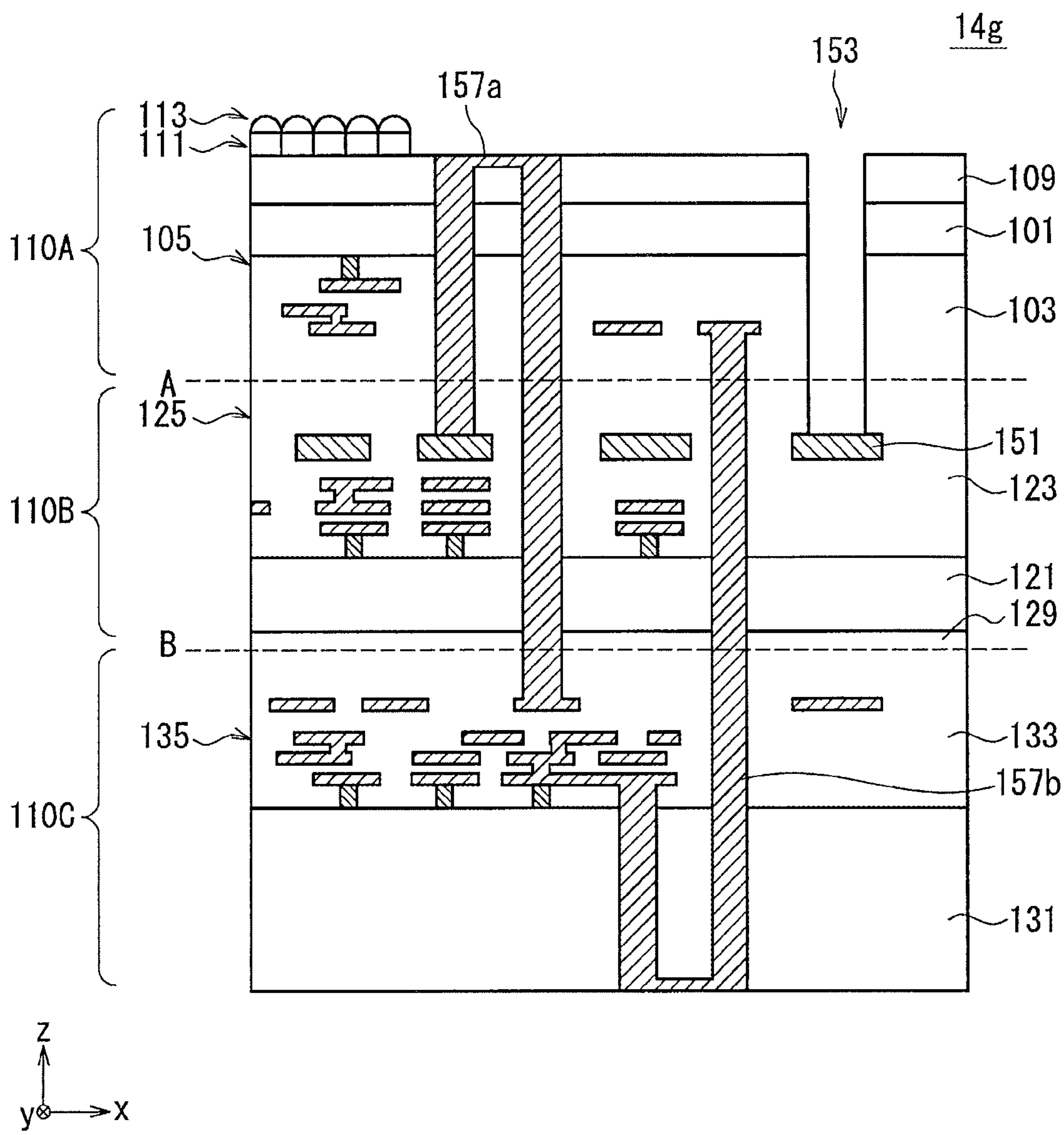

A solid-state imaging device 14*g* illustrated in FIG. 18G includes, as coupling structures, the TSVs 157*a* and 157*b* of the twin contact type and the embedded type between three layers and the embedded pad structure for the second substrate 110B (i.e., the pad 151 provided in the multi-layered wiring layer 125 of the second substrate 110B and the pad opening 153 exposing the pad 151).

The TSV 157*a* is formed from the back surface side of the first substrate IIDA toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 1G the predetermined wiring line of the second metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*a*. In addition, the TSV 157*b* is formed from the back surface side of the third substrate 110C toward the first substrate 110A, and is so provided as to electrically couple the respective signal lines provided in the first substrate 110A and the third substrate 110C to each other and the respective power supply lines included in the first substrate 110A and the third substrate 110C to each other. In the configuration illustrated in FIG. 18G, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*.

Note that, in the configurations illustrated in FIGS. 18A to 18G, the types of the wiring lines coupled by the twin contact type TSV 157 between three layers are not limited. The TSV 157 may be coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In each of the configurations illustrated in FIGS. 18A to 18C, the pad 151 is provided on each of the first substrate 110A and the second substrate 110B in the illustrated example, but the present embodiment is not limited to such an example. In each of these configurations, the respective signal lines provided in the first substrate 110A and the third substrate 110C are electrically coupled to each other and the respective power supply lines provided in the first substrate 110A and the third substrate 110C are electrically coupled to each other by the TSV 157. Accordingly, the first substrate 110A and the second substrate 110B or the second substrate 110B and the third substrate 110C each provided with the respective signal lines as well as the respective power supply lines not electrically coupled to each other by the TSV 157 may be each provided with the pad 151 for electrically coupling the respective signal lines to each other and the respective power supply lines to each other. That is, in each of the configurations illustrated in FIGS. 18A to 18C, the pad 151 may be provided on each of the second substrate 110B and the third substrate 110C instead of the illustrated configuration example of the pad 151. Likewise, in the configuration illustrated in FIG. 18D, the pad 151 is provided on each of the second substrate 110B and the third substrate 110C in the illustrated example, but the pad 151 may be provided on each of the first substrate 110A and the second substrate 110B instead.

In the configuration illustrated in FIG. 18G, the substrate on which the pad 151 is provided is not limited to the illustrated example (second substrate 110B). In this configuration, the respective signal lines provided in the second substrate 110B and the third substrate 110C are electrically coupled to each other and the respective power supply lines provided in the second substrate 110B and the third substrate 110C are electrically coupled to each other by one TSV 157*a*. The respective signal lines provided in the first substrate 110A and the third substrate 110C are electrically coupled to each other and the respective power supply lines provided in the first substrate 110A and the third substrate 110C are electrically coupled to each other by the other TSV 157*b*. Accordingly, the pad 151 as the coupling structure may not be provided. Thus, for example, in the configuration illustrated in FIG. 18G, the pad 151 may be provided on any of the substrates 110A, 110B, and 110C to derive a desired signal.

In addition, in each of the configurations illustrated in FIGS. 18C and 18D, one pad 151 is shared by the lead line openings 155*a* and 155*b* in the illustrated example, but the present embodiment is not limited to such an example. In each of these configurations, one pad 151 may be provided for each of the two lead line openings 155*a* and 155*b*. In this case, the films including the electrically-conductive material included in the two lead line openings 155*a* and 155*b* may be so extended on the surface on the back surface side of the first substrate 110A as to be isolated from each other (i.e., so that both are non-conductive).

In each of the configurations illustrated in FIGS. 18E and 18F, one pad 151 is shared by the TSV dual-use lead line openings 155*a* and 155*b* and the lead line opening 155*c* in the illustrated example, but the present embodiment is not limited to such an example. In each of these configurations, one pad 151 may be provided for each of the TSV dual-use lead line openings 155*a* and 155*b* (i.e., for the TSV 157) and for the lead line opening 155*c*. In this case, the films including the electrically-conductive materials included in the TSV dual-use lead line openings 155*a* and 155*b* and the film including the electrically-conductive material included in the lead line opening 155*c* may be so extended on the surface on the back surface side of the first substrate 110A as to be isolated from each other (i.e., so that both are non-conductive).

In a case where a lead-out pad structure is provided, the lead-out pad structure may be the non-embedded type or the embedded type. For example, in the configuration illustrated in FIG. 18C, the embedded type lead-out pad structure may be provided instead of the non-embedded type lead-out pad structure. Further, for example, in the configuration illustrated in FIG. 18D, the non-embedded type lead-out pad structure may be provided instead of the embedded type lead-out pad structure.

In addition, it is sufficient for the twin contact type TSV 157 between three layers to electrically couple the signal lines as well as the power supply lines provided in two of the first substrate 110A, the second substrate 110B, and the third substrate 110C may be electrically coupled to each other in accordance with the direction in which the TSV 157 is formed. The substrates in which the signal lines as well as the power supply lines are electrically coupled to each other by the TSV 157 may be optionally changed.

4-14. Fourteenth Configuration Example

FIGS. 19A to 19K are each a vertical cross-sectional view of a schematic configuration of a solid-state imaging device according to a fourteenth configuration example of the present embodiment. The solid-state imaging device according to the present embodiment may have each of the configurations illustrated in FIGS. 19A to 19K.

A solid-state imaging device 15*a* illustrated in FIG. 19A includes, as coupling structures, the TSV 157*a* of the twin contact type and the embedded type between three layers, the TSV 157*b* of the shared contact type and the embedded type between two layers, and the embedded pad structure for the first substrate 110A (i.e., the pad 151 provided in the multi-layered wiring layer 105 of the first substrate 110A and the pad opening 153 exposing the pad 151).

The TSV 157*a* is formed from the back surface side of the first substrate 110A toward the third substrate 110C, and is so provided as to electrically couple the respective signal lines provided in the first substrate 110A and the third substrate 110C to each other and the respective power supply lines provided in the first substrate 110A and the third substrate 110C to each other. In the configuration illustrated in FIG. 19A, the predetermined wiring line of the first metal wiring layer in the multi-layered wiring layer 105 of the first substrate 110A and the predetermined wiring line of the second metal wiring layer in the multi-layered wiring layer 133 of the third substrate 110C are electrically coupled to each other by the TSV 157*a*. In addition, the TSV 157*b* is formed from the front surface side of the second substrate 110B toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 19A, the predetermined wiring line of the second metal wiring layer in the multi-layered wiring layer 125 of the second substrate 110B and the predetermined wiring line of the second metal wiring layer in the multi-layered wiring layer 135 of the third substrate 110C are electrically coupled to each other by the TSV 157*b*.

A solid-state imaging device 15*b* illustrated in FIG. 19B corresponds to the solid-state imaging device 15*a* illustrated in FIG. 19A in which the types of the wiring lines electrically coupled by the TSV 157*a* and the TSV 157*b* are changed. Specifically, in the configuration illustrated in FIG. 19B, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*a*. The predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*.

A solid-state imaging device 15*c* illustrated in FIG. 19C includes, as coupling structures, the TSV 157*a* of the twin contact type and the embedded type between three layers, and the TSV 157*b* of the shared contact type and the embedded type between two layers, the embedded pad structure for the first substrate 110A (i.e., the pad 151 provided in the multi-layered wiring layer 105 of the first substrate 110A and the pad opening 153*a* exposing the pad 151), and the embedded pad structure for the second substrate 110B (i.e., the pad 151 provided in the multi-layered wiring layer 125 of the second substrate 110 and the pad opening 153*b* exposing the pad 151).

The TSV 157*b* is formed rom the front surface side of the second substrate 110B toward the third substrate 110C, and is so provided as to electrically couple the respective signal lines provided in the second substrate 110B and the third substrate 110C to each other and the respective power supply lines provided in the second substrate 110C and the third substrate 110C to each other. In the configuration illustrated in FIG. 19C, the predetermined wiring line of the second metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*.

The TSV 157*a* is formed from the back surface side of the first substrate 110A toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 19C, one via of the TSV 157*a* is in contact with the upper end of the TSV 157*b*, and the other via is in contact with the predetermined wiring line of the first metal wiring layer in the multi-layered wiring layer 135 of the third substrate 110C. That is, the TSV 157*a* is so formed as to electrically couple the TSV 157*b* and the predetermined wiring line in the multi-layered wiring layer 135 of the third substrate 110C to each other. Further, the predetermined wiring line in the multi-layered wiring layer 135 of the third substrate 110C, the predetermined wiring line in the multi-layered wiring layer 125 of the second substrate 110B electrically coupled by the TSV 157*b*, and the predetermined wiring line in the multi-layered wiring layer 135 of the third substrate 110C are electrically coupled together by the TSV 157*a*.

In addition, the respective signal lines provided in the first substrate 110A and the second substrate 110B may be electrically coupled to each other and the respective power supply lines provided in the first substrate 110A and the second substrate 110B may be electrically coupled to each other by the two embedded pad structures.

A solid-state imaging device 15*d* illustrated in FIG. 19D corresponds to the solid-state imaging device 15*c* illustrated in FIG. 19C in which the TSV 157*a* structure is changed. Specifically, in the configuration illustrated in FIG. 19C, the TSV 157*a* is so provided as to electrically couple the TSV 157*b* and the predetermined wiring line in the multi-layered wiring layer 135 of the third substrate 110C to each other. However, in the configuration illustrated in FIG. 19D, the TSV 157*a* is so provided as to electrically couple the predetermined wiring line in the multi-layered wiring layer 125 of the second substrate 110B and the predetermined wiring line in the multi-layered wiring layer 135 of the third substrate 110C to each other. In the configuration illustrated in FIG. 19D, the predetermined wiring line of the second metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 17*a*.

A solid-state imaging device 15*e* illustrated in FIG. 19E corresponds to the solid-state imaging device 15*b* illustrated in FIG. 19B in which the TSV 157*b* structure is changed. Specifically, in the configuration illustrated in FIG. 19E, the TSV 157*b* is formed from the back surface side of the third substrate 110C toward the second substrate 110, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 19E, the predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*.

A solid-state imaging device 15*f* illustrated in FIG. 19F corresponds to the solid-state imaging device 5*b* illustrated in FIG. 19B in which the embedded pad structure is changed. Specifically, in the configuration illustrated in FIG. 19F, the non-embedded type lead-out pad structure for the second substrate 110B (i.e., the lead line opening 155 for the predetermined wiring line in the multi-layered wiring layer 125 of the second substrate 110B and the pad 151 on the surface on the back surface side of the first substrate 110A) is provided instead of the embedded pad structure.

A solid-state imaging device 15*g* illustrated in FIG. 19G corresponds to the solid-state imaging device 15*f* illustrated in FIG. 19F in which the configuration of the lead-out pad structure is changed. Specifically, in the configuration illustrated in FIG. 19G, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 109 on the surface on the back surface side of the first substrate 110A) is provided instead of the non-embedded type lead-out pad structure for the second substrate 110B.

A solid-state imaging device 15*h* illustrated in FIG. 19H corresponds to the solid-state imaging device 15*b* illustrated in FIG. 19B in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157A and the embedded pad structure by changing the embedded type TSV 157*a* to the non-embedded type TSV.

A solid-state imaging device 15*i* illustrated in FIG. 19I corresponds to the solid-state imaging device 15*e* illustrated in FIG. 19E in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded pad structure by changing the embedded type TSV 157*a* to the non-embedded type TSV.

A solid-state imaging device 15*j* illustrated in FIG. 19J corresponds to the solid-state imaging device 15*h* illustrated in FIG. 19H in which the non-embedded type lead-out pad structure of the TSV dual-use lead line openings 155*a* and 155*b* is changed to the embedded type lead-out pad structure.

A solid-state imaging device 15*k* illustrated in FIG. 19K corresponds to the solid-state imaging device 15*i* illustrated in FIG. 19I in which the non-embedded type lead-out pad structure of the TSV dual-use lead line openings 155*a* and 155*b* is changed to the embedded type lead-out pad structure.

In each of the configurations illustrated in FIGS. 19A to 19K, the types of the wiring lines coupled by the twin contact type TSV 157 between three layers and the shared contact type TSV 157 between two layers are not limited. These TSVs 157 may be each coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In each of the configurations illustrated in FIGS. 19C and 19D, the pad 151 is provided on each of the first substrate 110A and the second substrate 110B in the illustrated example, but the present embodiment is not limited to such an example. In each of these configurations, the respective signal lines provided in the second substrate 110B and the third substrate 110C are electrically coupled to each other and the respective power supply lines provided in the second substrate 110B and the third substrate 110C are electrically coupled to each other by the TSVs 157*a* and 157*b*. Accordingly, the first substrate 110A and the second substrate 110B or the first substrate 110A and the third substrate 110C in which the signal lines as well as the power supply lines are not electrically coupled to each other by the TSV 157*a* or the TSV 157*b* may be provided with the pad 151 for electrically coupling the respective signal lines to each other and the respective power supply lines to each other. That is, in each of the configurations illustrated in FIGS. 19C and 19D, the pad 151 may be provided on each of the first substrate 110A and the third substrate 110C instead of the illustrated configuration example of the pad 151.

In each of the configurations illustrated in FIGS. 19A, 19B, and 19E to 19G, the substrate on which the pad 151 is provided is not limited to the illustrated example. In each of these configurations, the respective signal lines provided in the first substrate 110A and the third substrate 110C are electrically coupled to each other and the respective power supply lines provided in the first substrate 110A and the third substrate 110C are electrically coupled to each other by one TSV 157*a*. The respective signal lines provided in the second substrate 110B and the third substrate 110C are electrically coupled to each other and the respective power supply lines provided in the second substrate 110B and the third substrate 110C are electrically coupled to each other by the other TSV 157*b*. Accordingly, the pad 151 as the coupling structure may not be provided. Thus, for example, in each of the configurations illustrated in FIGS. 19A, 19B, and 19E to 19G, the pad 151 may be provided on any of the substrates 110A, 110B, and 110C to derive a desired signal.

In a case where a lead-out pad structure is provided, the lead-out pad structure may be the non-embedded type or the embedded type. For example, in the configuration illustrated in FIG. 19F, the embedded type lead-out pad structure may be provided instead of the non-embedded type lead-out pad structure. Further, for example, in the configuration illustrated in FIG. 19G, the non-embedded type lead-out pad structure may be provided instead of the embedded type lead-out pad structure.

In addition, it is sufficient for the twin contact type TSV 157 between three layers to electrically couple the respective signal lines as well as the respective power supply lines provided in two of the first substrate 110A, the second substrate 110B, and the third substrate 110C to each other in accordance with the direction in which the TSV 157 is formed. The substrates provided with the respective signal lines as well as the respective power supply lines to be electrically coupled to each other by the TSV 157 may be optionally changed.

4-15. Fifteenth Example

FIGS. 20A to 20G are each a vertical cross-sectional view of a schematic configuration of a solid-state imaging device according to a fifteenth configuration example of the present embodiment. The solid-state imaging device according to the present embodiment may have each of the configurations illustrated in FIGS. 20A to 20G.

A solid-state imaging device 16*a* illustrated in FIG. 20A includes, as coupling structures, the TSV 157*a* of the twin contact type and the embedded type between three layers, the TSV 157*b* of the shared contact type and the embedded type between three layers, the embedded pad structure for the first substrate 110A (i.e., the pad 151 provided in the multi-layered wiring layer 105 of the first substrate 110A and the pad opening 153*a* exposing the pad 151), and the embedded pad structure for the second substrate 110B (i.e., the pad 151 provided in the multi-layered wiring layer 125 of the second substrate 110B and the pad opening 153*b* exposing the pad 151).

The TSV 157*a* is formed from the back surface side of the first substrate 110A toward the third substrate 110C, and is so provided as to electrically couple the respective signal lines provided in the first substrate 110A and the third substrate 110C to each other and the respective power supply lines provided in the first substrate 110A and the third substrate 110C to each other. In the configuration illustrated in FIG. 20A, the predetermined wiring line of the first metal wiring layer in the multi-layered wiring layer 105 of the first substrate 110A and the predetermined wiring line of the second metal wiring layer in the multi-layered wiring layer 135 of the third substrate 110C are electrically coupled to each other by the TSV 157*a*. In addition, the TSV 157*b* is formed from the back surface side of the third substrate 110C toward the first substrate 110A, and is so provided as to electrically couple the respective signal lines provided in the first substrate 110A and the third substrate 110C to each other and the respective power supply lines included in the first substrate 110A and the third substrate 110C to each other. In the configuration illustrated in FIG. 20A, the predetermined wiring line of the second metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*. In addition, the respective signal lines provided in the first substrate 110A and the second substrate 110B may be electrically coupled to each other and the respective power supply lines provided in the first substrate 110A and the second substrate 110B may be electrically coupled to each other by the two embedded pad structures.

A solid-state imaging device 16 illustrated in FIG. 20B corresponds to the solid-state imaging device 16*a* illustrated in FIG. 20A in which the types of the wiring lines electrically coupled by the TSV 157*a* are changed. Specifically, in the configuration illustrated in FIG. 208, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*a*.

A solid-state imaging device 16*c* illustrated in FIG. 20C corresponds to the solid-state imaging device 16*b* illustrated in FIG. 20B in which the embedded pad structure is changed and the types of the wiring lines electrically coupled by the TSV 157*b* are changed. Specifically, in the configuration illustrated in FIG. 20C, the non-embedded type lead-out pad structure for the first substrate 110A (i.e., the lead line opening 155*a* for the predetermined wiring line in the multi-layered wiring layer 105 of the first substrate 110A and the pad 151 on the surface on the back surface side of the first substrate 110A) and the non-embedded type lead-out pad structure for the second substrate 110B (i.e., the lead line opening 155*b* for the predetermined wiring line in the multi-layered wiring layer 125 of the second substrate 110B and the pad 151 on the surface on the back surface side of the first substrate 110A) are provided instead of the embedded pad structure. Note that, in the configuration illustrated in FIG. 20C, one pad 151 is shared by the lead line openings 155*a* and 155*b*. In the configuration illustrated in FIG. 20C, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*.

A solid-state imaging device 16*d* illustrated in FIG. 20D corresponds to the solid-state imaging device 16*c* illustrated in FIG. 20C in which the configuration of the lead-out pad structure is changed. Specifically, in the configuration illustrated in FIG. 20D, the embedded type lead-out pad structure for the second substrate 110B (i.e., the lead line opening 155*a* for the predetermined wiring line in the multi-layered wiring layer 125 of the second substrate 110B and the pad 151 formed by being embedded in the insulating film 109 on the surface on the back surface side of the first substrate 110A) and the embedded type lead-out pad structure for the third substrate 110C (i.e., the lead line opening 155*b* for the predetermined wiring line in the multi-layered wiring layer 135 of the third substrate 110C and the pad 151 formed by being embedded in the insulating film 109 on the surface on the back surface side of the first substrate 110A) are provided instead of the non-embedded type lead-out pad structure for the first substrate 110A and the second substrate 110B. Note that, in the configuration illustrated in FIG. 20D, one pad 151 is shared by the lead line openings 155*a* and 155*b*.

A solid-state imaging device 16*e* illustrated in FIG. 20E corresponds to the solid-state imaging device 16*d* illustrated in FIG. 20D in which the non-embedded type lead-out pad structure using the TSV dual-use lead line openings 155*a* and 155*b* and the lead line opening 155*c* (i.e., the TSV dual-use lead line openings 155*a* and 155*b*, the lead line opening 155*c*, and the pad 151 on the surface on the back surface side of the first substrate 110A) are provided instead of the lead-out pad structure for the TSV 157*a* and the second substrate 110B and the third substrate 110C by changing the embedded type TSV 157*a* to the non-embedded type TSV and by providing the TSV dual-use lead line openings 155*a* and 155*b* as well as the lead line opening 155*c* for the predetermined wiring line in the multi-layered wiring layer 125 of the second substrate 110B. Note that, in the configuration illustrated in FIG. 20E, one pad 151 is shared by the TSV dual-use lead line openings 155*a* and 155*b* and the lead line opening 155*c*.

A solid-state imaging device 16*f* illustrated in FIG. 20F corresponds to the solid-state imaging device 16*e* illustrated in FIG. 20E in which the embedded type lead-out pad structure is provided instead of the non-embedded type lead-out pad structure. In the configuration illustrated in FIG. 20F, one pad 151 is shared by the TSV dual-use lead line openings 155*a* and 155*b* and the lead line opening 155*c*.

A solid-state imaging device 16*g* illustrated in FIG. 20G includes, as coupling structures, the TSV 157*a* of the twin contact type and the embedded type between three layers, the TSV 157*b* of the shared contact type and the embedded type between three layers, and the embedded pad structure for the second substrate 110B (i.e., the pad 151 provided in the multi-layered wiring layer 125 of the second substrate 110B and the pad opening 153 exposing the pad 151).

The TSV 157*a* is formed from the back surface side of the first substrate 110A toward the third substrate 110C, and is so provided as to electrically couple the respective signal lines provided in the second substrate 110B and the third substrate 110C to each other and the respective power supply lines provided in the second substrate 110B and the third substrate 110C to each other In the configuration illustrated in FIG. 20G the predetermined wiring line of the second metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*a*. The TSV 157*b* is formed from the back surface side of the third substrate 110C toward the first substrate 110A, and is so provided as to electrically couple the respective signal lines provided in the first substrate 110A, the second substrate 110B, and the third substrate 110C together and the respective power supply lines included in the first substrate 110A, the second substrate 110B, and the third substrate 110C together. In the configuration illustrated in FIG. 20G, the predetermined wiring line of the first metal wiring layer in the multi-layered wiring layer 105 of the first substrate 110A, the predetermined wiring line of the first metal wiring layer in the multi-layered wiring layer 125 of the second substrate 110B, and the predetermined wiring line of the first metal wiring layer in the multi-layered wiring layer 135 of the third substrate 110C are electrically coupled together by the TSV 157*b*.

Note that, in each of the configurations illustrated in FIGS. 20A to 20G, the types of the wiring lines coupled by the twin contact type TSV 157 between three layers and the shared contact type TSV 157 between three layers are not limited. These TSVs 157 may be each coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In addition, in each of the configurations illustrated in FIGS. 20A to 20C, the pad 151 is provided on each of the first substrate 110A and the second substrate 110B in the illustrated example, but the present embodiment is not limited to such an example. In each of these configurations, the respective signal lines provided in the first substrate 110A and the third substrate 110C are electrically coupled to each other and the respective power supply lines provided in the first substrate 110A and the third substrate 110C are electrically coupled to each other by the TSVs 157*a* and 157*b*. Accordingly, the first substrate 110A and the second substrate 110B or the second substrate 110B and the third substrate 110C each provided with the signal lines and the power supply lines not electrically coupled to each other by the TSV 157*a* or the TSV 157*b* may be each provided with the pad 151 for electrically coupling the respective signal lines to each other and the respective power supply lines to each other. That is, in each of the configurations illustrated in FIGS. 20A to 20C, the pad 151 may be provided on each of the second substrate 110B and the third substrate 110C instead of the illustrated configuration example of the pad 151. Likewise, in the configuration illustrated in FIG. 20D, in the illustrated example, the pad 151 is provided on each of the second substrate 110B and the third substrate 110C, but the pad 151 may be provided on each of the first substrate 110A and the second substrate 110B instead.

In the configuration illustrated in FIG. 20G the substrate on which the pad 151 is provided is not limited to the illustrated example (second substrate 110B). In this configuration, the respective signal lines provided in the second substrate 110B and the third substrate 110C are electrically coupled to each other and the respective power supply lines provided in the second substrate 110B and the third substrate 110C are electrically coupled to each other by one TSV 157*a*. The respective signal lines provided in the first substrate 110A and the third substrate 110C are at least electrically coupled to each other and the respective power supply lines provided in the first substrate 110A and the third substrate 110C are at least electrically coupled to each other by the other TSV 157*b*. Accordingly, the pad 151 as the coupling structure may not be provided. Thus, for example, in the configuration illustrated in FIG. 20G, the pad 151 may be provided on any of the substrates 110A, 110B, and 110C to derive a desired signal.

In each of the configurations illustrated in FIGS. 20C and 20D, one pad 151 is shared by the lead line openings 155*a* and 155*b* in the illustrated example, but the present embodiment is not limited to such an example. In each of these configurations, one pad 151 may be provided for each of the two lead line openings 155*a* and 155*b*. In this case, the films including the electrically-conductive material included in the two lead line openings 155*a* and 155*b* may be so extended on the surface on the back surface side of the first substrate 110A as to be isolated from each other (i.e., so that both are non-conductive).

In each of the configurations illustrated in FIGS. 20E and 20F, one pad 151 is shared by the TSV dual-use lead line openings 155*a* and 155*b* and the lead line opening 155*c* in the illustrated example, but the present embodiment is not limited to such an example. In each of these configurations, one pad 151 may be provided for each of the TSV dual-use lead line openings 155*a* and 155*b* (i.e., for the TSV 157) and for the lead line opening 155*c*. In this case, the films including the electrically-conductive materials included in the TSV dual-use lead line openings 155*a* and 155*b* and the film including the electrically-conductive material included in the lead line opening 155*c* may be so extended on the surface on the back surface side of the first substrate 110A as to be isolated from each other (i.e., so that both are non-conductive).

In a case where a lead-out pad structure is provided, the lead-out pad structure may be the non-embedded type or the embedded type. For example, in the configuration illustrated in FIG. 20C, the embedded type lead-out pad structure may be provided instead of the non-embedded type lead-out pad structure. Further, for example, in the configuration illustrated in FIG. 20D, the non-embedded type lead-out pad structure may be provided instead of the embedded type lead-out pad structure.

In addition, it is sufficient for the twin contact type TSV 157 between three layers to electrically couple the respective signal lines as well as the respective power supply lines provided in two of the first substrate 110A, the second substrate 110B, and the third substrate 110C to each other in accordance with the direction in which the TSV 157 is formed. The substrates provided with the respective signal lines as well as the respective power supply lines to be electrically coupled to each other by the TSV 157 may be optionally changed.

In addition, it is sufficient for the shared contact type TSV 157 between three layers to electrically couple the respective signal lines as well as the respective power supply lines included in at least two of the first substrate 110A, the second substrate 110B, or the third substrate 110C to each other. The substrates provided with the respective signal lines as well as the respective power supply lines to be electrically coupled to each other by the TSV 157 may be optionally changed.

4-16. Sixteenth Configuration Example

FIGS. 21A to 21M are each a vertical cross-sectional view of a schematic configuration of a solid-state imaging device according to a sixteenth configuration example of the present embodiment. The solid-state imaging device according to the present embodiment may have each of the configurations illustrated in FIGS. 21A to 21M.

A solid-state imaging device 17*a* illustrated in FIG. 21A includes, as coupling structures, the TSV 157 of the twin contact type and the embedded type between three layers, the electrode junction structure 159 provided between the second substrate 110B and the third substrate 110C, and the embedded pad structure for the first substrate 110A (i.e., the pad 151 provided in the multi-layered wiring layer 105 of the first substrate 110A and the pad opening 153 exposing the pad 151).

The TSV 157 is formed from the back surface side of the first substrate 110A toward the third substrate 110C, and is so provided as to electrically couple the respective signal lines provided in the first substrate 110A and the third substrate 110C to each other and the respective power supply lines provided in the first substrate 110A and the third substrate 110C to each other. In the configuration illustrated in FIG. 21A, the predetermined wiring line of the first metal wiring layer in the multi-layered wiring layer 105 of the first substrate 110A and the predetermined wiring line of the second metal wiring layer in the multi-layered wiring layer 135 of the third substrate 110C are electrically coupled to each other by the TSV 157. In addition, the respective signal lines provided in the second substrate 110B and the third substrate 110C are electrically coupled to each other and the respective power supply lines provided in the second substrate 110B and the third substrate 110C are electrically coupled to each other by the electrode junction structure 159.

A solid-state imaging device 17*b* illustrated in FIG. 21B corresponds to the solid-state imaging device 17*a* illustrated in FIG. 21A in which the configuration electrically coupled by the TSV 157 is changed. Specifically, in the configuration illustrated in FIG. 21B, the predetermined wiring line of the first metal wiring layer in the multi-layered wiring layer 105 of the first substrate 110A and the single-sided electrode in the multi-layered wiring layer 135 of the third substrate 110C are electrically coupled to each other by the TSV 157.

A solid-state imaging device 17*c* illustrated in FIG. 21C corresponds to the solid-state imaging device 17*a* illustrated in FIG. 21A in which the types of the wiring lines electrically coupled by the TSV 157 are changed. Specifically, in the configuration illustrated in FIG. 21C, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157.

A solid-state imaging device 17*d* illustrated in FIG. 21D corresponds to the solid-state imaging device 157*c* illustrated in FIG. 21C in which the configuration electrically coupled by the TSV 157 is changed. Specifically, in the configuration illustrated in FIG. 21D, the predetermined wiring line of the first metal wiring layer in the multi-layered wiring layer 105 of the first substrate 110A and the single-sided electrode in the multi-layered wiring layer 135 of the third substrate 110C are electrically coupled to each other by the TSV 157.

A solid-state imaging device 17*e* illustrated in FIG. 21E includes, as coupling structures, the TSV 157 of the twin contact type and the embedded type between three layers, the electrode junction structure 159 provided between the second substrate 110B and the third substrate 110C, the embedded pad structure for the first substrate 110A (i.e., the pad 151 provided in the multi-layered wiring layer 105 of the first substrate 110A and the pad opening 153*a* exposing the pad 151), and the embedded pad structure for the second substrate 110B (i.e., the pad 151 provided in the multi-layered wiring layer 125 of the second substrate 110B and the pad opening 153*b* exposing the pad 151).

The TSV 157 is formed from the back surface side of the first substrate 110A toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 21E, the predetermined wiring line of the second metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157. In addition, the respective signal lines provided in the second substrate 110B and the third substrate 110C are electrically coupled to each other and the respective power supply lines provided in the second substrate 110B and the third substrate 110C are electrically coupled to each other by the electrode junction structure 159. In addition, the respective signal lines provided in the first substrate 110A and the second substrate 110B may be electrically coupled to each other and the respective power supply lines provided in the first substrate 110A and the second substrate 110B may be electrically IRS coupled to each other by the two embedded pad structures.

A solid-state imaging device 17*f* illustrated in FIG. 21F corresponds to the solid-state imaging device 17*c* illustrated in FIG. 21C in which the embedded pad structure is changed. Specifically, in the configuration illustrated in FIG. 21F, the non-embedded type lead-out pad structure for the second substrate 110B (i.e., the lead line opening 155 for the predetermined wiring line in the multi-layered wiring layer 125 of the second substrate 110B and the pad 151 on the surface on the back surface side of the first substrate 110A) is provided instead of the embedded pad structure.

A solid-state imaging device 17*g* illustrated in FIG. 21G corresponds to the solid-state imaging device 17*f* illustrated in FIG. 21F in which the configuration electrically coupled by the TSV 157 is changed. Specifically, in the configuration illustrated in FIG. 21G, the predetermined wiring line of the first metal wiring layer in the multi-layered wiring layer 105 of the first substrate 110A and the single-sided electrode in the multi-layered wiring layer 135 of the third substrate 110C are electrically coupled to each other by the TSV 157.

A solid-state imaging device 17*h* illustrated in FIG. 21H corresponds to the solid-state imaging device 17*f* illustrated in FIG. 21F in which the configuration of the lead-out pad structure is changed. Specifically, in the configuration illustrated in FIG. 21H, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 109 on the surface on the back surface side of the first substrate 110A) is provided instead of the non-embedded type lead-out pad structure for the second substrate 110B.

A solid-state imaging device 17*i* illustrated in FIG. 21I corresponds to the solid-state imaging device 17*h* illustrated in FIG. 21H in which the configuration electrically coupled by the TSV 157 is changed. Specifically, in the configuration illustrated in FIG. 21T, the predetermined wiring line of the first metal wiring layer in the multi-layered wiring layer 105 of the first substrate 110A and the single-sided electrode in the multi-layered wiring layer 135 of the third substrate 110C are electrically coupled to each other by the TSV 157.

A solid-state imaging device 17*j* illustrated in FIG. 21J corresponds to the solid-state imaging device 17*c* illustrated in FIG. 21C in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157 and the embedded pad structure by changing the embedded type TSV 157 to the non-embedded type TSV.

A solid-state imaging device 17*k* illustrated in FIG. 21K corresponds to the solid-state imaging device 17*d* illustrated in FIG. 21D in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157 and the embedded pad structure by changing the embedded type TSV 157 to the non-embedded type TSV.

A solid-state imaging device 17*l* illustrated in FIG. 21L corresponds to the solid-state imaging device 17*j* illustrated in FIG. 21J in which the non-embedded type lead-out pad structure of the TSV dual-use lead line openings 155*a* and 155*b* is changed to the embedded type lead-out pad structure.

A solid-state imaging device 17*m* illustrated in FIG. 21M corresponds to the solid-state imaging device 17*k* illustrated in FIG. 21K in which the non-embedded type lead-out pad structure of the TSV dual-use lead line openings 155*a* and 155*b* is changed to the embedded type lead-out pad structure.

Note that, in each of the configurations illustrated in FIGS. 21A to 21M, the types of the wiring lines coupled by the twin contact type TSV 157 between three layers am not limited. The TSV 137 may be coupled to the predetermined wiring line of the rust metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In the configuration illustrated in FIG. 21E, the pad 151 is provided on each of the rust substrate 110A and the second substrate 110B in the illustrated example, but the present embodiment is not limited to such an example. In this configuration, the respective signal lines provided in the second substrate 110B and the third substrate 110C are electrically coupled to each other and the respective power supply lines provided in the second substrate 110B and the third substrate 110C are electrically coupled to each other by the TSV 157 and the electrode junction structure 159. Accordingly, the first substrate 110A and the second substrate 110B or the first substrate 110A and the third substrate 110C each provided with the signal lines as well as the power supply lines not electrically coupled to each other by the TSV 157 or the electrode junction structure 159 may be each provided with the pad 151 for electrically coupling the respective signal lines to each other and the respective power supply lines to each other. That is, in the configuration illustrated in FIG. 21E, the pad 151 may be provided on each of the first substrate 110A and the third substrate 110C instead of the illustrated configuration example of the pad 151.

In addition, in each of the configurations illustrated in FIGS. 21A to 21D and 21 F to 21I, the substrate on which the pad 131 is provided is not limited to the illustrated example. In each of these configurations, the respective signal lines provided in the first substrate 110A and the third substrate 110C are electrically coupled to each other and the respective power supply lines provided in the first substrate 110A and the third substrate 110C are electrically coupled to each other by the TSV 157. The respective signal lines provided in the second substrate 110B and the third substrate 110C are electrically coupled to each other and the respective power supply lines provided in the second substrate 110B and the third substrate 110C are electrically coupled to each other by the electrode junction structure 159. Accordingly, the pad 151 as the coupling structure may not be provided. Thus, for example, in each of the configurations illustrated in FIGS. 21A to 21D and 21F to 21I, the pad 151 may be provided on any of the substrates 110A, 110B, and 110C to derive a desired signal.

In a case where a lead-out pad structure is provided, the lead-out pad structure may be the non-embedded type or the embedded type. For example, in each of the configurations illustrated in FIGS. 21F and 21G, the embedded type lead-out pad structure may be provided instead of the non-embedded type lead-out pad structure. Further, for example, in each of the configurations illustrated in FIGS. 21H and 21I, the non-embedded type lead-out pad structure may be provided instead of the embedded type lead-out pad structure.

In addition, in each of the configurations illustrated in FIGS. 21B, 21D, 21G, 21I, 21K, and 21M, the TSV 157 and the TSV dual-use lead line openings 155*a* and 155 each contact with the single-sided electrode, but the present embodiment is not limited to such an example. In each of these configurations, the TSV 157 and the TSV dual-use lead openings 155*a* and 155*b* may be each configured to contact with the double-sided electrode. In a case where the TSV 157 and the TSV dual-use lead line openings 155*a* and 155*b* are each configured to contact with the double-sided electrode, the TSV 157 and the TSV dual-use lead line openings 155*a* and 155*b* each function as a via included in the electrode junction structures 159.

In addition, it is sufficient for the twin contact type TSV 157 between three layers to electrically couple the respective signal lines as well as the respective power supply lines provided in two of the first substrate 110A, the second substrate 110B, and the third substrate 110C to each other in accordance with the direction in which the TSV 157 is formed. The substrates provided with the respective signal lines as well as the respective power supply lines to be electrically coupled to each other by the TSV 157 may be optionally changed.

4-17. Seventeenth Configuration Example

FIGS. 22A to 22M are each a vertical cross-sectional view of a schematic configuration of a solid-state imaging device according to a seventeenth configuration example of the present embodiment. The solid-state imaging device according to the present embodiment may have each of the configurations illustrated in FIGS. 22A to 22M.

A solid-state imaging device 18*a* illustrated in FIG. 22A includes, as coupling structures, the TSV 157*a* of the twin contact type and the embedded type between three layers, the TSV 157*b* of the twin contact type and the embedded type between two layers, the electrode junction structure 159 provided between the second substrate 110B and the third substrate 110C, and the embedded pad structure for the first substrate 110A (i.e., the pad 151 provided in the multi-layered wiring layer 105 of the first substrate 110A and the pad opening 153 exposing the pad 151).

The TSV 157*a* is formed from the back surface side of the first substrate 110A toward the third substrate 110C, and is so provided as to electrically couple the respective signal lines provided in the first substrate 110A and the third substrate 110C to each other and the respective power supply lines provided in the first substrate 110A and the third substrate 110C to each other. In the configuration illustrated in FIL 22A, the predetermined wiring line of the first metal wiring layer in the multi-layered wiring layer 105 of the first substrate 110A and the predetermined wiring line of the second metal wiring layer in the multi-layered wiring layer 135 of the third substrate 110C are electrically coupled to each other by the TSV 157*a*. In addition, the TSV 157*b* is formed from the front surface side of the second substrate 110B toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 22A, the predetermined wiring line of the second metal wiring layer in the multi-layered wiring layer 125 of the second substrate 110B and the predetermined wiring line of the second metal wiring layer in the multi-layered wiring layer 135 of the third substrate 110C are electrically coupled to each other by the TSV 157*b*. In addition, the respective signal lines provided in the second substrate 110B and the third substrate 110C are electrically coupled to each other and the respective power supply lines provided in the second substrate 110B and the third substrate 110C are electrically coupled to each other by the electrode junction structure 159.

A solid-state imaging device 1*b* illustrated in FIG. 22B corresponds to the solid-state imaging device 18*a* illustrated in FIG. 22A in which the types of the wiring lines electrically coupled by the TSVs 157*a* and 157*b* are changed. Specifically, in the configuration illustrated in FIG. 22B, the predetermined wiring line of the first metal wiring layer m the multi-layered wiring layer 105 of the first substrate 110A and the predetermined wiring line of the first metal wiring layer in the multi-layered wiring layer 135 of the third substrate 110C are electrically coupled to each other by the TSV 157*a*. In the configuration illustrated in FIG. 22B, the predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*.

A solid-state imaging device 18*c* illustrated in FIG. 22C corresponds to the solid-state imaging device 18*a* illustrated in FIG. 22A in which the configuration electrically coupled by the TSVs 157*a* and 157*b* is changed. Specifically, in the configuration illustrated in FIG. 22C, the predetermined wiring line of the first metal wiring layer in the multi-layered wiring layer 105 of the first substrate 110A and the single-sided electrode in the multi-layered wiring layer 135 of the third substrate 110C are electrically coupled to each other by the TSV 157*a*. In addition, in the configuration illustrated in FIG. 22C, the predetermined wiring line of the second metal wiring layer in the multi-layered wiring layer 125 of the second substrate 110B and the single-sided electrode in the multi-layered wiring layer 135 of the third substrate 110C are electrically coupled to each other by the TSV 157*b*.

A solid-state imaging device 18*d* illustrated in FIG. 22D corresponds to the solid-state imaging device 18*c* illustrated in FIG. 22C in which the configuration of the multi-layered wiring layer 125 of the second substrate 110B and the configuration of the multi-layered wiring layer 135 of the third substrate 110C are changed. Specifically, in the configuration illustrated in FIG. 22C, each of the multi-layered wiring layer 125 and the multi-layered wiring layer 135 is so configured as to allow the first metal wiring layer and the second metal wiring layer to coexist. However, in the configuration illustrated in FIG. 22D, the multi-layered wiring layer 125 and the multi-layered wiring layer 135 each include only the first metal wiring layer. Further, in the configuration illustrated in FIG. 22D, in accordance with a change in the configuration of the multi-layered wiring layer 125 of the second substrate 110B, the types of the wiring line electrically coupled to the solid-state imaging device 18*c* illustrated in FIG. 22C by the TSV 157*b* are also changed. Specifically, in the configuration illustrated in FIG. 22D, the predetermined wiring line of the first metal wiring layer in the multi-layered wiring layer 125 of the second substrate 110 and the single-sided electrode in the multi-layered wiring layer 135 of the third substrate 110C are electrically coupled to each other by the TSV 157*b*.

A solid-state imaging device 18*e* illustrated in FIG. 22E includes, as coupling structures, the TSV 157*a* of the twin contact type and the embedded type between three layers, the TSV 157*b* of the twin contact type and the embedded type between two layers, the embedded pad structure for the first substrate 110A (i.e., the pad 151 provided in the multi-layered wiring layer 105 of the first substrate 110A and the pad opening 153*a* exposing the pad 151), and the embedded pad structure for the second substrate 110B (i.e., the pad 151 provided in the multi-layered wiring layer 125 of the second substrate 110B and the pad opening 153*b* exposing the pad 151).

The TSV 157*a* is formed from the back surface side of the first substrate 110A toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 22E, the predetermined wiring line of the second metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*a*. In addition, the TSV 157*b* is formed from the front surface side of the second substrate 110B toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 22E, the predetermined wiring line of the second metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*. In addition, the respective signal lines provided in the first substrate 110A and the second substrate 110B may be electrically coupled to each other and the respective power supply lines provided in the first substrate 110A and the second substrate 110B may be electrically coupled to each other by the two embedded pad structures.

A solid-state imaging device 18*f* illustrated in FIG. 22F corresponds to the solid-state imaging device 18*e* illustrated in FIG. 22E in which the configuration electrically coupled by the TSVs 157*a* and 157*b* is changed. Specifically, in the configuration illustrated in FIG. 22F, the predetermined wiring line of the second metal wiring layer in the multi-layered wiring layer 125 of the second substrate 110B and the single-sided electrode in the multi-layered wiring layer 135 of the third substrate 110C are electrically coupled to each other by the TSV 157*a*. In addition, in the configuration illustrated in FIG. 22F, the predetermined wiring line of the second metal wiring layer in the multi-layered wiring layer 125 of the second substrate 110B and the single-sided electrode in the multi-layered wiring layer 135 of the third substrate 110C are electrically coupled to each other by the TSV 157*b*.

A solid-state imaging device 18*g* illustrated in FIG. 22G corresponds to the solid-state imaging device 18*b* illustrated in FIG. 22B in which the TSV 157*b* structure is changed. Specifically, in the configuration illustrated in FIG. 22G, the TSV 157*b* is formed from the back surface side of the third substrate 110C toward the second substrate 110B, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 22G, the predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*.

A solid-slate imaging device 18*h* illustrated in FIG. 22H corresponds to the solid-state imaging device 18*b* illustrated in FIG. 22B in which the embedded pad structure is changed. Specifically, in the configuration illustrated in FIG. 22H, the non-embedded type lead-out pad structure for the second substrate 110B (i.e., the lead line opening 155 for the predetermined wiring line in the multi-layered wiring layer 125 of the second substrate 110B and the pad 151 on the surface on the back surface side of the first substrate 110A) is provided instead of the embedded pad structure.

A solid-state imaging device 18*i* illustrated in FIG. 22I corresponds to the solid-state imaging device 18*h* illustrated in FIG. 22H in which the configuration of the lead-out pad structure is changed. Specifically, in the configuration illustrated in FIG. 22I, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 10 on the surface on the back surface side of the first substrate 110A) is provided instead of the non-embedded type lead-out pad structure for the second substrate 110B.

A solid-state imaging device 18*j* illustrated in FIG. 22J corresponds to the solid-state imaging device 18*b* illustrated in FIG. 22B in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded pad structure by changing the embedded type TSV 157*a* to the non-embedded type TSV.

A solid-state imaging device 18*k* illustrated in FIG. 22K corresponds to the solid-state imaging device 18*g* illustrated in FIG. 22G in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded pad structure by changing the embedded type TSV 157*a* to the non-embedded type TSV.

A solid-state imaging device 18*l* illustrated in FIG. 22L corresponds to the solid-state imaging device 18*j* illustrated in FIG. 22J in which the non-embedded type lead-out pad structure of the TSV dual-use lead line openings 155*a* and 155*b* is changed to the embedded type lead-out pad structure.

A solid-state imaging device 18*m* illustrated in FIG. 22M corresponds to the solid-state imaging device 18*k* illustrated in FIG. 22K in which the non-embedded type lead-out pad structure of the TSV dual-use lead line openings 155*a* and 155*b* is changed to the embedded type lead-out pad structure.

Note that, in each of the configurations illustrated in FIGS. 22A to 22M, the types of the wiring lines coupled by the twin contact type TSVs 157 between two layers and three layers are not limited. These TSVs 157 may be each coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In each of the configurations illustrated in FIGS. 22E and 22F, the pad 151 is provided on each of the first substrate 110A and the second substrate 110B in the illustrated example, but the present embodiment is not limited to such an example. In each of these configurations, the respective signal lines provided in the second substrate 110B and the third substrate 110C are electrically coupled to each other and the respective power supply lines provided in the second substrate 110B and the third substrate 110C are electrically coupled to each other by the TSVs 157*a* and 157*b* and the electrode junction structure 159. Accordingly, the first substrate 110A and the second substrate 110B or the first substrate 110A and the third substrate 110C each provided with the signal lines as well as the power supply lines not electrically coupled to each other by the TSV 157*a* or the TSV 157*b* and the electrode junction structure 159 may be each provided with the pad 151 for electrically coupling the respective signal lines to each other and the respective power supply lines to each other. That is, in each of the configurations illustrated in FIGS. 22E and 22F, the pad 151 may be provided on each of the first substrate 110A and the third substrate 110C instead of the illustrated configuration example of the pad 151.

In addition, in each of the configurations illustrated in FIGS. 22A to 22D and FIGS. 22G to 22I, the substrate on which the pad 151 is provided is not limited to the illustrated example. In each of these configurations, the respective signal lines provided in the first substrate 110A and the third substrate 110C are electrically coupled to each other and the respective power supply lines provided in the first substrate 110A and the third substrate 110C are electrically coupled to each other by the TSV 157*a*. The respective signal lines provided in the second substrate 110B and the third substrate 110C are electrically coupled to each other and the respective power supply lines provided in the second substrate 110B and the third substrate 110C are electrically coupled to each other by the TSV 157*b* and the electrode junction structure 159. Accordingly, the pad 151 as the coupling structure may not be provided. Thus, for example, in each of the configurations illustrated in FIGS. 22A to 22D and 22G to 22I, the pad 151 may be provided on any of the substrates 110A, 110B, and 110C to derive a desired signal.

In a case where a lead-out pad structure is provided, the lead-out pad structure may be the non-embedded type or the embedded type. For example, in the configuration illustrated in FIG. 22H, the embedded type lead-out pad structure may be provided instead of the non-embedded type lead-out pad structure. Further, for example, in the configuration illustrated in FIG. 22I, the non-embedded type lead-out pad structure may be provided instead of the embedded type lead-out pad structure.

In each of the configurations illustrated in FIGS. 22C, 22D, and 22F, the TSV 157*a* contacts with the single-sided electrode, but the present embodiment is not limited to such an example. In each of these configurations, the TSV 157*a* may be configured to contact with the double-sided electrode. In a case where the TSV 157*a* is configured to contact with the double-sided electrode, the TSV 157*a* functions as a via included in the electrode junction structures 159.

In addition, it is sufficient for the twin contact type TSV 157 between three layers to electrically couple the respective signal lines as well as the respective power supply lines provided in two of the first substrate 110A, the second substrate 110B, and the third substrate 110C to each other in accordance with the direction in which the TSV 157 is formed. The substrates provided with the respective signal lines as well as the respective power supply lines to be electrically coupled to each other by the TSV 157 may be optionally changed.

4-18. Eighteenth Configuration Example 18

FIGS. 23A to 23K are each a vertical cross-sectional view of a schematic configuration of a solid-state imaging device according to an eighteenth configuration example of the present embodiment. The solid-state imaging device according to the present embodiment may have each of the configurations illustrated in FIGS. 23A to 23K.

A solid-state imaging device 19*a* illustrated in FIG. 23A includes, as coupling structures, the TSVs 157*a* and 157*b* of the twin contact type and the embedded type between three layers, the electrode junction structure 159 provided between the second substrate 110B and the third substrate 110C, and the embedded pad structure for the first substrate 110A (i.e., the pad 151 provided in the multi-layered wiring layer 105 of the first substrate 110A and the pad opening 153 exposing the pad 151).

The TSV 157*a* is formed from the back surface side of the first substrate 110A toward the third substrate 110C, and is so provided as to electrically couple the respective signal lines provided in the first substrate 110A and the third substrate 110C to each other and the respective power supply lines provided in the first substrate 110A and the third substrate 110C to each other. In the configuration illustrated in FIG. 23A, the predetermined wiring line of the first metal wiring layer in the multi-layered wiring layer 105 of the first substrate 110A and the predetermined wiring line of the second metal wiring layer in the multi-layered wiring layer 135 of the third substrate 110C are electrically coupled to each other by the TSV 157*a*. In addition, the TSV 157*b* is formed from the back surface side of the third substrate 110C toward the first substrate 110A, and is so provided as to electrically couple the respective signal lines provided in the first substrate 110A and the third substrate 110C to each other and the respective power supply lines included in the first substrate 110A and the third substrate 110C to each other. In the configuration illustrated in FIG. 23A, the predetermined wiring line of the second metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*. In addition, the respective signal lines provided in the second substrate 110B and the third substrate 110C are electrically coupled to each other and the respective power supply lines provided in the second substrate 110B and the third substrate 110C are electrically coupled to each other by the electrode junction structure 159.

A solid-state imaging device 19*b* illustrated in FIG. 23B corresponds to the solid-state imaging device 19*a* illustrated in FIG. 23A in which the types of the wiring lines electrically coupled by the TSV 157*a* are changed. Specifically, in the configuration illustrated in FIG. 23B, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*a*.

A solid-state imaging device 19*e* illustrated in FIG. 23C corresponds to the solid-state imaging device 19*b* illustrated in FIG. 23B in which the configuration electrically coupled by the TSV 157*a* is changed. Specifically, in the configuration illustrated in FIG. 23C, the predetermined wiring line of the first metal wiring layer in the multi-layered wiring layer 105 of the first substrate 110A and the single-sided electrode in the multi-layered wiring layer 135 of the third substrate 110C are electrically coupled to each other by the TSV 157*a*.

A solid-state imaging device 19*d* illustrated in FIG. 23D corresponds to the solid-state imaging device 19*b* illustrated in FIG. 23B in which the embedded pad structure is changed and the types of the wiring lines electrically coupled by the TSV 157*b* are changed. Specifically, in the configuration illustrated in FIG. 23D, the non-embedded type lead-out pad structure for the second substrate 110B (i.e., the lead line opening 155 for the predetermined wiring line in the multi-layered wiring layer 125 of the second substrate 110B and the pad 151 on the surface on the back surface side of the first substrate 110A) is provided instead of the embedded pad structure. In addition, in the configuration illustrated in FIG. 23D, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*.

A solid-state imaging device 19*e* illustrated in FIG. 23E corresponds to the solid-state imaging device 19*d* illustrated in FIG. 23D in which the configuration of the lead-out pad structure is changed. Specifically, in the configuration illustrated in FIG. 23E, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 109 on the surface on the back surface side of the first substrate 110A) is provided instead of the non-embedded type lead-out pad structure for the second substrate 110B.

A solid-state imaging device 19*f* illustrated in FIG. 23F corresponds to the solid-state imaging device 19*b* illustrated in FIG. 23B in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded pad structure by changing the embedded type TSV 157*a* to the non-embedded type TSV. In addition, the solid-state imaging device 19*f* illustrated in FIG. 23F corresponds to the solid-state imaging device 19*b* illustrated in FIG. 23B in which the types of the wiring lines electrically coupled by the TSV 157*b* are further changed. Specifically, in the configuration illustrated in FIG. 23F, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157.

A solid-state imaging device 19*g* illustrated in FIG. 23G corresponds to the solid-state imaging device 19*c* illustrated in FIG. 23C in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded pad structure by changing the embedded type TSV 157*a* to the non-embedded type TSV. In addition, the solid-state imaging device 19*g* illustrated in FIG. 23G corresponds to the solid-state imaging device 19*c* illustrated in FIG. 23C in which the types of the wiring lines electrically coupled by the TSV 157*b* are further changed. Specifically, in the configuration illustrated in FIG. 23G, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157.

A solid-state imaging device 19*h* illustrated in FIG. 23H corresponds to the solid-state imaging device 19*f* illustrated in FIG. 23F in which the non-embedded type lead-out pad structure of the TSV dual-use lead line openings 155*a* and 155*b* is changed to the embedded type lead-out pad structure.

A solid-state imaging device 19*i* illustrated in FIG. 23I corresponds to the solid-state imaging device 19*g* illustrated in FIG. 23G in which the non-embedded type lead-out pad structure of the TSV dual-use lead line openings 155*a* and 155*b* is changed to the embedded type lead-out pad structure.

A solid-state imaging device 19*j* illustrated in FIG. 23J includes, as coupling structures, the TSVs 157*a* and 157*b* of the twin contact type and the embedded type between three layers, the electrode junction structure 159 provided between the second substrate 110B and the third substrate 110C, and the embedded pad structure for the second substrate 110B (i.e., the pad 151 provided in the multi-layered wiring layer 125 of the second substrate 110B and the pad opening 153 exposing the pad 151).

The TSV 157*a* is formed from the back surface side of the first substrate 110A toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 23J, the predetermined wiring line of the second metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*a*. In addition, the TSV 157*b* is formed from the back surface side of the third substrate 110C toward the first substrate 110A, and is so provided as to electrically couple the respective signal lines provided in the first substrate 110A and the third substrate 110C to each other and the respective power supply lines included in the first substrate 110A and the third substrate 110C to each other. In the configuration illustrated in FIG. 23J, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*. In addition, the respective signal lines provided in the second substrate 110B and the third substrate 110C are electrically coupled to each other and the respective power supply lines provided in the second substrate 110B and the third substrate 110C are electrically coupled to each other by the electrode junction structure 159.

A solid-state imaging device 19*k* illustrated in FIG. 23K corresponds to the solid-state imaging device 19*j* illustrated in FIG. 23J in which the configuration electrically coupled by the TSV 157*a* is changed. Specifically, in the configuration illustrated in FIG. 23K, the predetermined wiring line of the second metal wiring layer in the multi-layered wiring layer 125 of the second substrate 110B and the single-sided electrode in the multi-layered wiring layer 135 of the third substrate 110C are electrically coupled to each other by the TSV 157*a*.

Note that, in each of the configurations illustrated in FIGS. 23A to 23K, the types of the wiring lines coupled by the twin contact type TSV 157 between three layers are not limited. The TSV 157 may be coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In each of the configurations illustrated in FIGS. 23A to 23E, 23J, and 23K, the substrate on which the pad 151 is provided is not limited to the illustrated example. In each of these configurations, the respective signal lines provided in the first substrate 110A and the third substrate 110C are electrically coupled to each other and the respective power supply lines provided in the first substrate 110A and the third substrate 110C are electrically coupled to each other by the TSV 157*b*. The respective signal lines provided in the second substrate 110B and the third substrate 110C are electrically coupled to each other and the respective power supply lines provided in the second substrate 110B and the third substrate 110C are electrically coupled to each other by the electrode junction structure 159. Accordingly, the pad 151 as the coupling structure may not be provided. Thus, for example, in each of the configurations illustrated in FIGS. 23A to 23E, 23J, and 23K, the pad 151 may be provided on any of the substrates 110A, 110B, and 110C to derive a desired signal.

In a case where a lead-out pad structure is provided, the lead-out pad structure may be the non-embedded type or the embedded type. For example, in the configuration illustrated in FIG. 23D, the embedded type lead-out pad structure may be provided instead of the non-embedded type lead-out pad structure. Further, for example, in the configuration illustrated in FIG. 23E, the non-embedded type lead-out pad structure may be provided instead of the embedded type lead-out pad structure.

In each of the configurations illustrated in FIG. 23C, FIG. 23G, FIG. 23I, and FIG. 23K, the TSV 157*a* and the TSV dual-use lead line openings 155*a* and 155*b* each contact with the single-sided electrode, but the present embodiment is not limited to such an example. In each of these configurations, the TSV 157*a* and the TSV dual-use lead openings 155*a* and 155*b* may be configured to contact with the double-sided electrode. In a case where the TSV 157*a* and the TSV dual-use lead line openings 155*a* and 155*b* are each configured to contact with the double-sided electrode, the TSV 157*a* and the TSV dual-use lead line openings 155*a* and 155*b* each function as a via included in the electrode junction structures 159.

In addition, it is sufficient for the twin contact type TSV 157 between three layers to electrically couple the respective signal lines as well as the respective power supply lines provided in two of the first substrate 110A, the second substrate 110B, and the third substrate 110C to each other in accordance with the direction in which the TSV 157 is formed. The substrates provided with the respective signal lines as well as the respective power supply lines to be electrically coupled to each other by the TSV 157 may be optionally changed.

4-19. Nineteenth Configuration Example

FIGS. 24A to 24M are each a vertical cross-sectional view of a schematic configuration of a solid-state imaging device according to a nineteenth configuration example of the present embodiment. The solid-state imaging device according to the present embodiment may have each of the configurations illustrated in FIGS. 24A to 24M.

A solid-state imaging device 20*a* illustrated in FIG. 24A includes, as coupling structures, the TSV 157*a* of the twin contact type and the embedded type between three layers, the TSV 157*b* of the shared contact type and the embedded type between two layers, the electrode junction structure 159 provided between the second substrate 110B and the third substrate 110C, and the embedded pad structure for the first substrate 110A (i.e., the pad 151 provided in the multi-layered wiring layer 105 of the first substrate 110A and the pad opening 153 exposing the pad 151).

The TSV 157*a* is formed from the back surface side of the first substrate 110A toward the third substrate 110C, and is so provided as to electrically couple the respective signal lines provided in the first substrate 110A and the third substrate 110C to each other and the respective power supply lines provided in the first substrate 110A and the third substrate 110C to each other. In the configuration illustrated in FIG. 24A, the predetermined wiring line of the first metal wiring layer in the multi-layered wiring layer 105 of the first substrate 110A and the predetermined wiring line of the second metal wiring layer in the multi-layered wiring layer 135 of the third substrate 110C are electrically coupled to each other by the TSV 157*a*. In addition, the TSV 157*b* is formed from the front surface side of the second substrate 110B toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 24A, the predetermined wiring line of the second metal wiring layer in the multi-layered wiring layer 125 of the second substrate 110B and the predetermined wiring line of the second metal wiring layer in the multi-layered wiring layer 135 of the third substrate 110C are electrically coupled to each other by the TSV 157*b*. In addition, the respective signal lines provided in the second substrate 110B and the third substrate 110C are electrically coupled to each other and the respective power supply lines provided in the second substrate 110B and the third substrate 110C are electrically coupled to each other by the electrode junction structure 159.

A solid-state imaging device 20*b* illustrated in FIG. 24B corresponds to the solid-state imaging device 20*a* illustrated in FIG. 24A in which the types of the wiring lines electrically coupled by the TSVs 157*a* and 157*b* are changed. Specifically, in the configuration illustrated in FIG. 24B, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*a*. In addition, in the configuration illustrated in FIG. 24I, the predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*.

A solid-state imaging device 20*c* illustrated in FIG. 24C corresponds to the solid-state imaging device 20*a* illustrated in FIG. 24A in which the configuration electrically coupled by the TSVs 157*a* and 157*b* is changed. Specifically, in the configuration illustrated in FIG. 24C, the predetermined wiring line of the first metal wiring layer in the multi-layered wiring layer 105 of the first substrate 110A and the single-sided electrode in the multi-layered wiring layer 135 of the third substrate 110C are electrically coupled to each other by the TSV 157*a*. In the configuration illustrated in FIG. 24C, the predetermined wiring line of the second metal wiring layer in the multi-layered wiring layer 125 of the second substrate 110B and the single-sided electrode in the multi-layered wiring layer 135 of the third substrate 110C are electrically coupled to each other by the TSV 157*b*.

A solid-state imaging device 20*d* illustrated in FIG. 24D corresponds to the solid-state imaging device 20*c* illustrated in FIG. 24C in which the configuration of the multi-layered wiring layer 125 of the second substrate 110B and the configuration of the multi-layered wiring layer 135 of the third substrate 110C are changed. Specifically, in the configuration illustrated in FIG. 24C, each of the multi-layered wiring layer 125 and the multi-layered wiring layer 135 is so configured as to allow the first metal wiring layer and the second metal wiring layer to coexist. However, in the configuration illustrated in FIG. 24D, the multi-layered wiring layer 125 and the multi-layered wiring layer 135 each include only the first metal wiring layer. Further, in the configuration illustrated in FIG. 24D, in accordance with the change in the configuration of the multi-layered wiring layer 125 of the second substrate 110B, the types of the wiring lines electrically coupled to the solid-state imaging device 20*c* illustrated in FIG. 24C by the TSV 157*b* are also changed. Specifically, in the configuration illustrated in FIG. 24D, the predetermined wiring line of the first metal wiring layer in the multi-layered wiring layer 125 of the second substrate 110B and the single-sided electrode in the multi-layered wiring layer 135 of the third substrate 110C are electrically coupled to each other by the TSV 157*b*.

A solid-state imaging device 20*e* illustrated in FIG. 24E includes, as coupling structures, the TSV 157*a* of the twin contact type and the embedded type between three layers, the TSV 157*b* of the shared contact type and the embedded type between two layers, the electrode junction structure 159 provided between the second substrate 110B and the third substrate 110C, the embedded pad structure for the first substrate 110A (i.e., the pad 151 provided in the multi-layered wiring layer 105 of the first substrate 110A and the pad opening 153*a* exposing the pad 151), the embedded pad structure for the second substrate 110B (i.e., the pad 151 provided in the multi-layered wiring layer 125 of the second substrate 110B and the pad opening 153*b* exposing the pad 151).

The TSV 157*b* is formed from the front surface side of the second substrate 110B toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 24E, the predetermined wiring line of the second metal wiring layer in the multi-layered wiring layer 125 of the second substrate 110B and the single-sided electrode in the multi-layered wiring layer 135 of the third substrate 110C are electrically coupled to each other by the TSV 157*b*.

The TSV 157*a* is formed from the back surface side of the first substrate 110A toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 24E, one via of the TSV 157*a* is in contact with the upper end of the TSV 157*b*, and the other via is in contact with the single-sided electrode in the multi-layered wiring layer 135 of the third substrate 110C. That is, the TSV 157*a* is so formed as to electrically couple the TSV 157*b* and the single-sided electrode in the multi-layered wiring layer 135 of the third substrate 110C to each other. Further, the single-sided electrode in the multi-layered wiring layer 135 of the third substrate 110C, the predetermined wiring line in the multi-layered wiring layer 125 of the second substrate 110B electrically coupled by the TSV 157*b*, and the single-sided electrode in the multi-layered wiring layer 135 of the third substrate 110C are electrically coupled together by the TSV 157*a*.

In addition, the respective signal lines provided in the first substrate 110A and the second substrate 110B may be electrically coupled to each other and the respective power supply lines provided in the first substrate IIDA and the second substrate 110B may be electrically coupled to each other by the two embedded pad structures.

A solid-state imaging device 20*f* illustrated in FIG. 24F includes, as coupling structures, the TSV 157*a* of the twin contact type and the embedded type between three layers, the TSV 157*b* of the shared contact type and the embedded type between two layers, the embedded pad structure for the first substrate 110A (i.e., the pad 151 provided in the multi-layered wiring layer 105 of the first substrate 110A and the pad opening 153*a* exposing the pad 151), and the embedded pad structure for the second substrate 110B (i.e., the pad 151 provided in the multi-layered wiring layer 125 of the second substrate 110B and the pad opening 153*b* exposing the pad 151).

The TSV 157*a* is formed from the back surface side of the first substrate 110A toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 24F, the predetermined wiring line of the second metal wiring layer in the multi-layered wiring layer 125 of the second substrate 110B and the single-sided electrode in the multi-layered wiring layer 135 of the third substrate 110C are electrically coupled to each other by the TSV 157*a*. In addition, the TSV 157*b* is formed from the front surface side of the second substrate 110B toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 24F, the predetermined wiring line of the second metal wiring layer in the multi-layered wiring layer 125 of the second substrate 110B and the single-sided electrode in the multi-layered wiring layer 135 of the third substrate 110C are electrically coupled to each other by the TSV 157*b*. In addition, the respective signal lines provided in the first substrate 110A and the second substrate 110B may be electrically coupled to each other and the respective power supply lines provided in the first substrate 110A and the second substrate 110B may be electrically coupled to each other by the two embedded pad structures.

A solid-state imaging device 20*g* illustrated in FIG. 24G corresponds to the solid-state imaging device 20*a* illustrated in FIG. 24A in which the TSV 157*b* structure is changed. Specifically, in the configuration illustrated in FIG. 24G the TSV 157*b* is formed from the back surface side of the third substrate 110C toward the second substrate 110B and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 24G the predetermined wiring line of the first metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*b*.

A solid-state imaging device 20*h* illustrated in FIG. 24H corresponds to the solid-state imaging device 20*b* illustrated in FIG. 24B in which the embedded pad structure is changed. Specifically, in the configuration illustrated in FIG. 24H, the non-embedded type lead-out pad structure for the second substrate 110B (i.e., the lead line opening 155 for the predetermined wiring line in the multi-layered wiring layer 125 of the second substrate 110B and the pad 151 on the surface on the back surface side of the first substrate 110A) is provided instead of the embedded pad structure.

A solid-state imaging device 20*i* illustrated in FIG. 24I corresponds to the solid-state imaging device 20*h* illustrated in FIG. 24H in which the configuration of the lead-out pad structure is changed. Specifically, in the configuration illustrated in FIG. 24I, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 109 on the surface on the back surface side of the first substrate 110A) is provided instead of the non-embedded type lead-out pad structure for the second substrate 110B.

A solid-state imaging device 20*j* illustrated in FIG. 24J corresponds to the solid-state imaging device 20*b* illustrated in FIG. 24B in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and embedded pad structure by changing the embedded type TSV 157*a* to the non-embedded type TSV.

A solid-state imaging device 20*k* illustrated in FIG. 24K corresponds to the solid-state imaging device 20*j* illustrated in FIG. 24J in which the TSV 157 structure is changed. Specifically, in the configuration illustrated in FIG. 24K, the TSV 157 is formed from the back surface side of the third substrate 110C toward the second substrate 110B, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 24K, the predetermined wiring line of the first metal wiring layer in the multi-layered wiring layer 125 of the second substrate 110 and the predetermined wiring line of the first metal wiring layer in the multi-layered wiring layer 135 of the third substrate 110C are electrically coupled to each other by the TSV 157.

A solid-state imaging device 20*l* illustrated in FIG. 24L corresponds to the solid-state imaging device 20*j* illustrated in FIG. 24J in which the non-embedded type lead-out pad structure of the TSV dual-use lead line openings 155*a* and 155*b* is changed to the embedded type lead-out pad structure.

A solid-state imaging device 20*m* illustrated in FIG. 24M corresponds to the solid-state imaging device 20*k* illustrated in FIG. 24K in which the non-embedded type lead-out pad structure of the TSV dual-use lead line openings 155*a* and 155*b* is changed to the embedded type lead-out pad structure.

Note that, in each of the configurations illustrated in FIGS. 24A to 24M, the types of the wiring lines coupled by the twin contact type TSV 157 between three layers and the shared contact type TSV 157 between two layers are not limited. These TSVs 157 may be each coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In addition, in each of the configurations illustrated in FIGS. 24E and 24F, the pad 151 is provided on each of the first substrate 110A and the second substrate 110B in the illustrated example, but the present embodiment is not limited to such an example. In each of these configurations, the respective signal lines provided in the second substrate 110B and the third substrate 110C are electrically coupled to each other and the respective power supply lines provided in the second substrate 110B and the third substrate 110C are electrically coupled to each other by the TSVs 157*a* and 157*b* and the electrode junction structure 159. Accordingly, the first substrate 110A and the second substrate 110B or the first substrate 110A and the third substrate 110C each provided with the signal lines as well as the power supply lines not electrically coupled to each other by the TSV 157*a* or the TSV 157*b* and the electrode junction structure 159 may be each provided with the pad 151 for electrically coupling the respective signal lines to each other and the respective power supply lines to each other. That is, in each of the configurations illustrated in FIGS. 24E and 24F, the pad 151 may be provided on each of the first substrate IIDA and the third substrate 110C instead of the illustrated configuration example of the pad 151.

In each of the configurations illustrated in FIGS. 24A to 24D and FIGS. 24G to 24I, the substrate on which the pad 151 is provided is not limited to the illustrated example. In each of these configurations, the respective signal lines provided in the first substrate 110A and the third substrate 110C are electrically coupled to each other and the respective power supply lines provided in the first substrate 110A and the third substrate 110C are electrically coupled to each other by the TSV 157*a*. The respective signal lines provided in the second substrate 110B and the third substrate 110C are electrically coupled to each other and the respective power supply lines provided in the second substrate 110B and the third substrate 110C are electrically coupled to each other by the TSV 157*b* and the electrode junction structure 159. Accordingly, the pad 151 as the coupling structure may not be provided. Thus, for example, in each of the configurations illustrated in FIGS. 24A to 24D and 24G to 24I, the pad 151 may be provided on any of the substrates 110A, 110B, and 110C to derive a desired signal.

In a case where a lead-out pad structure is provided, the lead-out pad structure may be the non-embedded type or the embedded type. For example, in the configuration illustrated in FIG. 24H, the embedded type lead-out pad structure may be provided instead of the non-embedded type lead-out pad structure. Further, for example, in the configuration illustrated in FIG. 24I, the non-embedded type lead-out pad structure may be provided instead of the embedded type lead-out pad structure.

In addition, in each of the configurations illustrated in FIGS. 24C, 24D, 24E, and 24F, the TSVs 157*a* and 157*b* each contact with the single-sided electrode, but the present embodiment is not limited to such an example. In each of these configurations, the TSVs 157*a* and 157*b* may be each configured to contact with the double-sided electrode. In a case where the TSVs 157*a* and 157*b* are each configured to contact with the double-sided electrode, the TSVs 157*a* and 157*b* each function as a via included in the electrode junction structures 159.

In addition, it is sufficient for the twin contact type TSV 157 between three layers to electrically couple the respective signal lines as well as the respective power supply lines provided in two of the first substrate 110A, the second substrate 110B, and the third substrate 110C to each other in accordance with the direction in which the TSV 157 is formed. The substrates provided with the respective signal lines as well as the respective power supply lines to be electrically coupled to each other by the TSV 157 may be optionally changed.

4-20. Twentieth Configuration Example

FIGS. 25A to 25K are each a vertical cross-sectional view of a schematic configuration of a solid-state imaging device according to a twentieth configuration example of the present embodiment. The solid-state imaging device according to the present embodiment may have each of the configurations illustrated in FIGS. 25A to 25K.

A solid-state imaging device 21*a* illustrated in FIG. 25A includes, as coupling structures, the TSV 157*a* of the twin contact type and the embedded type between three layers, the TSV 157*b* of the shared contact type and the embedded type between three layers, the electrode junction structure 159 provided between the second substrate 110B and the third substrate 110C, and the embedded pad structure for the first substrate 110A (i.e., the pad 151 provided in the multi-layered wiring layer 105 of the first substrate 110A and the pad opening 153 exposing the pad 151).

The TSV 157*a* is formed from the back surface side of the first substrate 110A toward the third substrate 110C, and is so provided as to electrically couple the respective signal lines provided in the first substrate IIDA and the third substrate 110C to each other and the respective power supply lines provided in the first substrate 110A and the third substrate 110C to each other. In the configuration illustrated in FIG. 25A, the predetermined wiring line of the first metal wiring layer in the multi-layered wiring layer 105 of the first substrate 110A and the predetermined wiring line of the second metal wiring layer in the multi-layered wiring layer 135 of the third substrate 110C are electrically coupled to each other by the TSV 157*a*. In addition, the TSV 157*b* is formed from the back surface side of the third substrate 110C toward the first substrate 110A, and is so provided as to electrically couple the respective signal lines provided in the first substrate 110A and the third substrate 110C to each other and the respective power supply lines provided in the first substrate 110A and the third substrate 110C to each other. In the configuration illustrated in FIG. 25A, the predetermined wiring line of the second metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*. In addition, the respective signal lines provided in the second substrate 110B and the third substrate 110C are electrically coupled to each other and the respective power supply lines provided in the second substrate 110B and the third substrate 110C are eclectically coupled to each other by the electrode junction structure 159.

A solid-state imaging device 21*b* illustrated in FIG. 25B corresponds to the solid-state imaging device 21*a* illustrated in FIG. 25A in which the types of the wiring lines electrically coupled by the TSV 157*a* are changed. Specifically, in the configuration illustrated in FIG. 25B, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*a*.

A solid-state imaging device 21*c* illustrated in FIG. 25C corresponds to the solid-state imaging device 21*b* illustrated in FIG. 25B in which the configuration electrically coupled by the TSV 157*a* is changed. Specifically, in the configuration illustrated in FIG. 25C, the predetermined wiring line of the first metal wiring layer in the multi-layered wiring layer 105 of the first substrate 110A and the single-sided electrode in the multi-layered wiring layer 135 of the third substrate 110C are electrically coupled to each other by the TSV 157*a*.

A solid-state imaging device 2*d* illustrated in FIG. 25D corresponds to the solid-state imaging device 21*b* illustrated in FIG. 25B in which the embedded pad structure is changed and the types of the wiring lines electrically coupled by the TSV 157*b* are changed. Specifically, in the configuration illustrated in FIG. 25D, the non-embedded type lead-out pad structure for the second substrate 110B (i.e., the lead line opening 155 for the predetermined wiring line in the multi-layered wiring layer 125 of the second substrate 110B and the pad 151 on the surface on the back surface side of the first substrate 110A) is provided instead of the embedded pad structure. In addition, in the configuration illustrated in FIG. 25D, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157*b*.

A solid-state imaging device 21*e* illustrated in FIG. 25E corresponds to the solid-state imaging device 21*d* illustrated in FIG. 25D in which the configuration of the lead-out pad structure is changed. Specifically, in the configuration illustrated in FIG. 25E, the embedded type lead-out pad structure for the third substrate 110C (i.e., the lead line opening 155 for the predetermined wiring line in the multi-layered wiring layer 135 of the third substrate 110C and the pad 151 formed by being embedded in the insulating film 109 on the surface on the back surface side of the first substrate 110A) is provided instead of the non-embedded type lead-out pad structure for the second substrate 110B.

A solid-state imaging device 21*f* illustrated in FIG. 25F corresponds to the solid-state imaging device 21*b* illustrated in FIG. 25B in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded pad structure by changing the embedded type TSV 157*a* to the non-embedded type TSV. In addition, the solid-state imaging device 21*f* illustrated in FIG. 25F corresponds to the solid-state imaging device 21*b* illustrated in FIG. 25B in which the types of the wiring lines electrically coupled by the TSV 157*b* are further changed. Specifically, in the configuration illustrated in FIG. 25F, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157.

A solid-state imaging device 21*g* illustrated in FIG. 25G corresponds to the solid-state imaging device 21*c* illustrated in FIG. 25C in which the non-embedded type lead-out pad structure using the TSV dual-use lead line openings 155*a* and 155*b* (i.e., the TSV dual-use lead line openings 155*a* and 155*b* and the pad 151 on the surface on the back surface side of the first substrate 110A) is provided instead of the TSV 157*a* and the embedded pad structure by changing the embedded type TSV 157*a* to the non-embedded type TSV. In addition, the solid-state imaging device 21*g* illustrated in FIG. 25G corresponds to the solid-state imaging device 21*c* illustrated in FIG. 25C in which the types of the wiring lines electrically coupled by the TSV 157 are further changed. Specifically, in the configuration illustrated in FIG. 25G, the predetermined wiring line of the first metal wiring layer in the multi-layered wiring layer 105 of the first substrate 110A and the predetermined wiring line of the first metal wiring layer in the multi-layered wiring layer 135 of the third substrate 110C are electrically coupled to each other by the TSV 157.

A solid-state imaging device 21*h* illustrated in FIG. 25H corresponds to the solid-state imaging device 21*f* illustrated in FIG. 25F in which the non-embedded type lead-out pad structure of the TSV dual-use lead line openings 155*a* and 155*b* is changed to the embedded type lead-out pad structure.

A solid-state imaging device 21*i* illustrated in FIG. 25I corresponds to the solid-state imaging device 21*g* illustrated in FIG. 25G in which the non-embedded type lead-out pad structure of the TSV dual-use lead line openings 155*a* and 155*b* is changed to the embedded type lead-out pad structure.

A solid-state imaging device 21*j* illustrated in FIG. 25J includes, as coupling structures, the TSV 157*a* or the twin contact type and the embedded type between three layers, the TSV 157*b* of the shared contact type and the embedded type between three layers, the electrode junction structure 159 provided between the second substrate 110B and the third substrate 110C, and the embedded pad structure for the second substrate 110B (i.e., the pad 151 provided in the multi-layered wiring layer 125 of the second substrate 110B and the pad opening 153 exposing the pad 151).

The TSV 157*a* is formed from the back surface side or the first substrate 110A toward the third substrate 110C, and is so provided as to electrically couple the respective signal lines provided in the second substrate 110B and the third substrate 110C to each other and the respective power supply lines provided in the second substrate 110B and the third substrate 110C to each other. In the configuration illustrated in FIG. 25J, the predetermined wiring line of the second metal wiring layer in the multi-layered wiring layer 125 of the second substrate 110B and the predetermined wiring line of the first metal wiring layer in the multi-layered wiring layer 135 of the third substrate 110C are electrically coupled to each other by the TSV 157*a*. In addition, the TSV 157*b* is formed rom the back surface side of the third substrate 110C toward the first substrate 110A, and is so provided as to electrically couple the respective signal lines provided in the first substrate 110A, the second substrate 110B, and the third substrate 110C together and the respective power supply lines included in the first substrate 110A, the second substrate 110B, and the third substrate 110C together. In the configuration illustrated in FIG. 25J, the predetermined wiring line of the first metal wiring layer in the multi-layered wiring layer 105 of the first substrate 110A, the predetermined wiring line of the first metal wiring layer in the multi-layered wiring layer 125 of the second substrate 110B, and the predetermined wiring line of the first metal wiring layer in the multi-layered wiring layer 135 of the third substrate 110C are electrically coupled together by the TSV 157*b*. In addition, the respective signal lines provided in the second substrate 110B and the third substrate 110C are electrically coupled to each other and the respective power supply lines provided in the second substrate 110B and the third substrate 110C are electrically coupled to each other by the electrode junction structure 159.

A solid-state imaging device 21*k* illustrated in FIG. 25K corresponds to the solid-state imaging device 21*j* illustrated in FIG. 25J in which the configuration electrically coupled by the TSV 157*a* is changed. Specifically, in the configuration illustrated in FIG. 25K, the predetermined wiring line of the second metal wiring layer in the multi-layered wiring layer 125 of the second substrate 110B and the single-sided electrode in the multi-layered wiring layer 135 of the third substrate 110C are electrically coupled to each other by the TSV 157*a*.

Note that, in each of the configurations illustrated in FIGS. 25A to 25K, the types of the wiring lines coupled by the twin contact type TSV 157 between three layers and the shared contact type TSV 157 between three layers are not limited. These TSVs 157 may be each coupled to the predetermined wiring line of the first metal wiring layer or may be coupled to the predetermined wiring line of the second metal wiring layer. In addition, each of the multi-layered wiring layers 105, 125, and 135 may include only the first metal wiring layer, may include only the second metal wiring layer, or may include both of them so as to coexist.

In addition, in each of the configurations illustrated in FIGS. 25A to 25E, 25J, and 25K, the substrate on which the pad 151 is provided is not limited to the illustrated example. In each of these configurations, the respective signal lines provided in the first substrate 110A and the third substrate 110C are electrically coupled to each other and the respective power supply lines provided in the first substrate 110A and the third substrate 110C are electrically coupled to each other by the TSV 157*b*. The respective signal lines provided in the second substrate 110B and the third substrate 110C are electrically coupled to each other and the respective power supply lines provided in the second substrate 110B and the third substrate 110C are electrically coupled to each other by the electrode junction structure 159. Accordingly, the pad 151 as the coupling structure may not be provided. Thus, for example, in each of the configurations illustrated in FIGS. 25A to 25E, 25J, and 25K, the pad 151 may be provided on any of the substrates 110A, 110B, and 110C to derive a desired signal.

In a case where a lead-out pad structure is provided, the lead-out pad structure may be the non-embedded type or the embedded type. For example, in the configuration illustrated in FIG. 25D, the embedded type lead-out pad structure may be provided instead of the non-embedded type lead-out pad structure. Further, for example, in the configuration illustrated in FIG. 25E, the non-embedded type lead-out pad structure may be provided instead of the embedded type lead-out pad structure.

In addition, in each of the configurations illustrated in FIGS. 25C, 25G, 25I, and 25K, the TSV 157*a* and the TSV dual-use lead line openings 155*a* and 155*b* each contact with the single-sided electrode, but the present embodiment is not limited to such an example. In each of these configurations, the TSV 157*a* and the TSV dual-use lead openings 155*a* and 155*b* may be each configured to contact with the double-sided electrode. In a case where the TSV 157*a* and the TSV dual-use lead line openings 155*a* and 155*b* are each configured to contact with the double-sided electrode, the TSV 157*a* and the TSV dual-use lead line openings 155*a* and 155*b* each function as a via included in the electrode junction structures 159.

In addition, it is sufficient for the twin contact type TSV 157 between three layers to electrically couple the respective signal lines as well as the respective power supply lines provided in two of the first substrate 110A, the second substrate 110B, and the third substrate 110C to each other in accordance with the direction in which the TSV 157 is formed. The substrates provided with the respective signal lines as well as the respective power supply lines to be electrically coupled to each other by the TSV 157 may be optionally changed.

In addition, it is sufficient for the shared contact type TSV 157 between three layers to electrically couple the respective signal lines as well as the respective power supply lines included in at least two of the first substrate 110A, the second substrate 110B, or the third substrate 110C to each other. The substrates provided with the respective signal lines as well as the respective power supply lines to be electrically coupled to each other by the TSV 157 may be optionally changed.

4-21. Summary

In the foregoing, some configuration examples of the solid-state imaging device according to the present embodiment have been described.

Note that, in the second to fourth configuration examples, the seventh to tenth configuration examples, the twelfth to fourteenth configuration examples, and the seventeenth to twentieth configuration examples among the configuration examples described above, it is possible to form the TSV 157 to allow the upper end to be exposed on the back surface side of the third substrate 110C. It is possible for the upper ends thus exposed of the TSV 157 to function as an electrode for electrically coupling the solid-state imaging device to the outside. For example, a solder bump or the like may be provided on the exposed upper end of the TSV 157 to electrically couple the solid-state imaging device and an external device to each other through the solder bump or the like.

Further, in each of the configuration examples described above, when the pad 151 is provided on each of the substrates 110A, 110B, and 110C, either the embedded pad structure or the lead-out pad structure may be applied. In addition, either the non-embedded type lead-out pad structure or the embedded type lead-out pad structure may be applied to the lead-out pad structure.

5. Application Examples (Application to Electronic Apparatus)

Application examples of the solid-state imaging devices 1 to 21*k* according to the present embodiment described above are described. Several examples of an electronic apparatus to which the solid-state imaging devices 1 to 21*k* may be applied are described here.

FIG. 26A is a diagram illustrating the appearance of a smartphone that is an example of the electronic apparatus to which the solid-state imaging devices 1 to 21*k* according to the present embodiment may be applied. As illustrated in FIG. 26A, a smartphone 901 includes an operation unit 903 that includes a button to receive an operation input made by a user, a display unit 905 that displays various kinds of information, and an imaging unit (not illustrated) that is provided in a housing and electronically shoots an image of an object to be observed. The imaging unit may include the solid-state imaging devices 1 to 21*k*.

Each of FIGS. 26B and 26C is a diagram illustrating the appearance of a digital camera that is another example of the electronic apparatus to which the solid-state imaging devices 1 to 21*k* according to the present embodiment may be applied. FIG. 26B illustrates the appearance of a digital camera 911 as viewed from the front (subject side), and FIG. 26C illustrates the appearance of the digital camera 911 as viewed from the back. As illustrated in FIGS. 26B and 26C, the digital camera 911 includes a main body (camera body) 913, an interchangeable lens unit 915, a grip unit 917 that is grasped by a user at the time of shooting, a monitor 919 that displays various kinds of information, an EVF 921 that displays a through image observed by a user at the time of shooting, and an imaging unit (not illustrated) that is provided in a housing and electronically shoots an image of an object to be observed. The imaging unit may include the solid-state imaging devices 1 to 21*k*.

Several examples of the electronic apparatus to which the solid-state imaging devices 1 to 21*k* according to the present embodiment may be applied have been described above. Note that the electronic apparatus to which the solid-state imaging devices 1 to 21*k* may be applied is not limited to those exemplified above, but the solid-state imaging devices 1 to 21*k* are applicable as imaging units mounted on any electronic apparatus such as a video camera, a spectacle-type wearable device, an HMD (Head Mounted Display), a tablet PC, or a game console.

(Application to Another Structure of Solid-State Imaging Device)

Note that the technology according to the present disclosure may be applied to the solid-state imaging device illustrated in FIG. 27A. FIG. 27A is a cross-sectional view of a configuration example of a solid-state imaging device to which the technology according to the present disclosure may be applied.

In the solid-state imaging device, a PD (photodiode) 20019 receives incident light 20001 coming from the back surface (upper surface in the diagram) side of a semiconductor substrate 20018. Above the PD 20019, a planarization film 20013, a CF (color filer) 20012, and a microlens 20011 are provided. The incident light 20001 sequentially passing through the respective units is received by a light-receiving surface 20017, and is subjected to photoelectric conversion.

For example, in the PD 20019, an n-type semiconductor region 20020 is formed as a charge accumulation region that accumulates charges (electrons). In the PD 20019, the n-type semiconductor region 20020 is provided inside p-type semiconductor regions 20016 and 20041 of the semiconductor substrate 20018. The front surface (lower surface) side of the semiconductor substrate 20018 of the n-type semiconductor region 20020 is provided with the p-type semiconductor region 20041 having higher impurity concentration than that of the back surface (upper surface) side. That is, the PD 20019 has an HAD (Hole-Accumulation Diode) structure, and the p-type semiconductor regions 20016 and 20041 are formed to suppress the generation of dark currents at the respective interfaces with the upper surface side and lower surface side of the n-type semiconductor region 20020.

A pixel separation unit 20030 that electrically separates a plurality of pixels 20010 from each other is provided inside the semiconductor substrate 20018, and the PD 20019 is provided to a region defined by this pixel separation unit 20030. In the diagram, in a case where the solid-state imaging device is viewed from the upper surface side, the pixel separation unit 20030 is formed in the shape of a grid to be interposed between the plurality of pixels 20010, for example, and the PD 20019 is formed in a region defined by this pixel separation unit 20030.

In each PD 20019, the anode is grounded. In the solid-state imaging device, signal charges (e.g., electrons) accumulated by the PD 20019 are read out through a transfer Tr (MOS FET) or the like that is not illustrated, and outputted as electric signals to a VSL (vertical signal line) that is not illustrated.

A wiring layer 20050 is provided to the front surface (lower surface) of the semiconductor substrate 20018 that is opposed to the back surface (upper surface) provided with the respective units such as a light-shielding film 20014, the CF 20012, and the microlens 20011.

The wiring layer 20050 includes a wiring line 20051 and an insulating layer 20052. The wiring line 20051 is formed in the insulating layer 20052, and electrically coupled to each element. The wiring layer 20050 is a so-called multi-layered wiring layer, and is formed by alternately stacking interlayer insulating films and the wiring lines 20051 a plurality of times. The interlayer insulating films are included in the insulating layer 20052. Here, as the wiring lines 20051, wiring lines to a Tr such as the transfer Tr for reading out charges from the PD 20019, and respective wiring lines such as the VSL are stacked with the insulating layer 20052 interposed therebetween The wiring layer 20050 is provided with a support substrate 20061 on the surface opposite to the side on which the PD 20019 is provided. For example, a substrate including a silicon semiconductor and having a thickness of several hundreds of μm is provided as the support substrate 20061.

The light-shielding film 20014 is provided to the back surface (upper surface in the diagram) side of the semiconductor substrate 20018.

The light-shielding film 20014 is configured to block a portion of the incident light 20001 from above the semiconductor substrate 20018 toward the back surface of the semiconductor substrate 20018.

The light-shielding film 20014 is provided above the pixel separation unit 20030 provided inside the semiconductor substrate 20018. Here, the light-shielding film 20014 is provided to protrude in the shape of a projection with the insulating film 20015 such as a silicon oxide film interposed between the light-shielding film 20014 and the back surface (upper surface) of the semiconductor substrate 20018. In contrast, to make the incident light 20001 enter the PD 20019, the light-shielding film 20014 is not provided, but there is an opening above the PD 20019 provided inside the semiconductor substrate 2001R.

That is, in a case where the solid-state imaging device is viewed from the upper surface side in the diagram, the light-shielding film 20014 has a grid shape in a plan view, and an opening through which the incident light 20001 passes to the light-receiving surface 20017 is formed.

The light-shielding film 20014 includes a light-shielding material that blocks light. For example, titanium (Ti) films and tungsten (W) films are sequentially stacked to form the light-shielding film 20014. In addition, it is possible to form the light-shielding film 20014 by sequentially stacking, for example, titanium nitride (TiN) films and tungsten (W) films.

The light-shielding film 20014 is covered with the planarization film 20013. The planarization film 20013 is formed using an insulating material that transmits light.

The pixel separation unit 20030 includes a groove 20031, a fixed-charge film 20032, and an insulating film 20033.

The fixed-charge film 20032 is formed on the back surface (upper surface) side of the semiconductor substrate 20018 to cover the groove 20031 that defines the space between the plurality of pixels 20010.

Specifically, the fixed-charge film 20032 is provided to cover the inner surface of the groove 20031 formed on the back surface (upper surface) side of the semiconductor substrate 20018 with a predetermined thickness. The insulating film 20033 is then provided to be embedded in (loaded into) the inside of the groove 20031 covered with the fixed-charge film 20032.

Here, the fixed-charge film 20032 is formed using a high dielectric material having a negative fixed charge to form a positive-charge (hole) accumulation region at the interface with the semiconductor substrate 20018 and suppress the generation of dark currents. The fixed-charge film 20032 is formed to have a negative fixed charge. This causes the negative fixed charge to apply an electric field to the interface with the semiconductor substrate 2001, and forms a positive-charge (hole) accumulation region.

It is possible to form the fixed-charge film 20032 by using, for example, a hafnium oxide film ($HfO_2$ film). In addition, it is possible to form the fixed-charge film 20032 to cause the fixed-charge film 20032 to additionally include at least one of oxides of hafnium, zirconium, aluminum, tantalum, titanium, magnesium, yttrium, lanthanide elements, or the like, for example.

In addition, the technology according to the present disclosure may be applied to the solid-state imaging device illustrated in FIG. 27B. FIG. 27B illustrates a schematic configuration of a solid-state imaging device to which the technology according to the present disclosure may be applied.

A solid-state imaging device 30001 includes an imaging unit (so-called pixel unit) 30003 in which a plurality of pixels 30002 is regularly arranged two-dimensionally, and peripheral circuits, that is, a vertical driving unit 30004, a horizontal transfer unit 30005, and an output unit 30006 disposed around the imaging unit 30003. The pixels 30002 each include a photodiode 30021 that is one photoelectric conversion element, and a plurality of pixel transistors (MOS transistors) Tr1, Tr2, Tr3, and Tr4.

The photodiode 30021 has a region in which signal charges photoelectrically converted by using incoming light and generated by the photoelectric conversion are accumulated. In this example, the plurality of pixel transistors includes the four MOS transistors of a transfer transistor Tr1, a reset transistor Tr2, an amplifying transistor Tr3, and a selection transistor Tr4. The transfer transistor Tr1 is a transistor that reads out the signal charges accumulated in the photodiode 30021 into a floating diffusion (FD) region 30022 described below. The reset transistor Tr2 is a transistor for setting a prescribed value as the electric potential of the FD region 30022. The amplifying transistor Tr3 is a transistor for electrically amplifying the signal charges read out to the FD region 30022. The selection transistor Tr4 is a transistor for selecting one row of pixels and reading out a pixel signal to the vertical signal line 30008.

Note that, although not illustrated, it is also possible to include the three transistors excluding the selection transistor Tr4 and the photodiode PD in a pixel.

In the circuit configuration of the pixel 30002, the source of the transfer transistor Tr1 is coupled to the photodiode 30021, and the drain thereof is coupled to the source of the reset transistor Tr2. The FD region 30022 (corresponding to the drain region of the transfer transistor and the source region of the reset transistor) serving as a charge-to-voltage conversion means between the transfer transistor Tr1 and the reset transistor Tr2 is coupled to the gate of the amplifying transistor Tr3. The source of the amplifying transistor Tr3 is coupled to the drain of the selection transistor Tr4. The drain of the reset transistor Tr2 and the drain of the amplifying transistor Tr3 are coupled to a power supply voltage supplying unit. In addition, the source of the selection transistor Tr4 is coupled to the vertical signal line 3000.

Row reset signals φRST commonly applied to the gates of the reset transistors Tr2 of the pixels arranged in one row, row transfer signals φTRG commonly applied in the same manner to the gates of the transfer transistors Tr1 of the pixels in one row, and row select signals φSEL commonly applied in the same manner to the gates of the selection transistors Tr4 in one row are each supplied from the vertical driving unit 30004.

The horizontal transfer unit 30005 includes an amplifier or analog/digital converter (ADC) coupled to the vertical signal line 30008 of each column, which is, in this example, an analog/digital converter 30009, a column selection circuit (switch means) 30007, and a horizontal transfer line (e.g., bus wiring including the same number of wiring lines as the number of data bit lines) 30010. The output unit 30006 includes an amplifier or an analog/digital converter and/or a signal processing circuit, which is, in this example, a signal processing circuit 30011 that processes an output from the horizontal transfer line 30010, and an output buffer 30012.

In this solid-state imaging device 30001, the signals of the pixels 30002 in each row are subjected to analog/digital conversion by each analog/digital converter 30009, read out through the sequentially selected column selection circuit 30007 into horizontal transfer lines 30010, and horizontally transferred sequentially. The image data read out to the horizontal transfer line 30010 is outputted by the output buffer 30012 through the signal processing circuit 30011.

As the general operation of the pixel 3002, the gate of the transfer transistor Tr and the gate of the reset transistor Tr2 are first turned on to empty all the charges in the photodiode 30021. The gate of the transfer transistor Tr1 and the gate of the res transistor Tr2 are then turned off to accumulate charges. Next, the gate of the reset transistor Tr2 is turned on immediately before the charges of the photodiode 30021 are read out, and the electric potential of the FD region 30022 is reset. Afterwards, the gate of the reset transistor Tr2 is turned off and the gate of the transfer transistor Tr1 is turned on to transfer the charges from the photodiodes 30021 to the FD region 30022. The amplifying transistor Tr3 electrically amplifies signal charges in response to the application of the charges to the gate. Meanwhile, only the selection transistor Tr4 in a pixel to be read is turned on at the time of FD resetting immediately before the reading, and an image signal, subjected to charge-to-voltage conversion, from the amplifying transistor Tr3 in the pixel is read out to the vertical signal line 30008.

Other structural examples of a solid-state imaging device to which the technology according to the present disclosure may be applied have been described above.

(Example of Application to Camera)

The solid-state imaging device described above is applicable to an electronic apparatus such as a camera system such as a digital camera or a video camera, a mobile phone having an imaging function, or another device having an imaging function, for example. As a configuration example of the electronic apparatus, the following describes a camera as an example. FIG. 27C is an explanatory diagram illustrating a configuration example of a video camera to which the technology according to the present disclosure may be applied.

A camera 10000 in this example includes a solid-state imaging device 10001, an optical system 10012 that guides incident light to a light-receiving sensor unit of the solid-state imaging device 10001, a shutter device 10003 provided between the solid-state imaging device 10001 and the optical system 10002, and a drive circuit 10004 that drives the solid-state imaging device 10001. Further, the camera 10000 includes a signal processing circuit 10005 that processes an output signal of the solid-state imaging device 10001.

The optical system (optical lenses) 10002 forms an image of image light (incident light) from a subject on an imaging surface (not illustrated) of the solid-state imaging device 10001. This causes signal charges to be accumulated in the solid-state imaging device 10001 for a predetermined period. Note that the optical system 10002 may include an optical lens group including a plurality of optical lenses. In addition, the shutter device 10003 controls a light irradiating period and a light shielding period of incident light on the solid-state imaging device 10001.

The drive circuit 10004 supplies drive signals to the solid-state imaging device 10001 and the shutter device 10003. The drive circuit 10004 then controls the operation of the solid-state imaging device 10001, and output signals to the signal processing circuit 10005 and the shutter operation of the shutter device 10003 on the basis of the supplied drive signals. That is, in this example, the operation of transferring signals from the solid-state imaging device 10001 to the signal processing circuit 10005 is performed on the basis of drive signals (timing signals) supplied from the drive circuit 10004.

The signal processing circuit 10005 performs various kinds of signal processing on the signals transferred from the solid-state imaging device 10001. The signals (AV-SIGNAL) subjected to the various kinds of signal processing are stored in a storage medium (not illustrated) such as a memory, or outputted to a monitor (not illustrated).

An example of the camera to which the technology according to the present disclosure may be applied has been described above.

(Example of Application to Endoscopic Surgery System)

For example, the technology according to the present disclosure may be applied to an endoscopic surgery system.

FIG. 27D is a view depicting an example of a schematic configuration of an endoscopic surgery system to which the technology according to an embodiment of the present disclosure (present technology) can be applied.

In FIG. 27D, a state is illustrated in which a surgeon (medical doctor) 11131 is using an endoscopic surgery system 110) to perform surgery for a patient 11132 on a patient bed 1133. As depicted, the endoscopic surgery system 11000 includes an endoscope 11000, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11100. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 27E is a block diagram depicting an example of a functional configuration of the camera head 11102 and the CCU 11201 depicted in FIG. 27D.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 1140 which connects the camera bead 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the present disclosure may be applied has been described above. The technology according to the present disclosure may be applied to, for example, the image pickup unit 11402 of the camera head 11102 out of the components described above. Applying the technology according to the present disclosure to the image pickup unit 11402 makes it possible to obtain a clearer image of a surgical region. This allows a surgeon to check the surgical region with certainty.

Note that the endoscopic surgery system has been described here as an example, but the technology according to the present disclosure may be additionally applied to, for example, a microscopic surgery system or the like.

(Example of Application to Mobile Body)

For example, the technology according to the present disclosure may be implemented as a device mounted on any type of mobile body such as an automobile, an electric vehicle, a hybrid electric vehicle, a motorcycle, a bicycle, a personal mobility, an airplane, a drone, a vessel, or a robot.

FIG. 27F is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 27F, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 1204U may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 27F, an audio speaker 12061, a display section 12062, and an instrument panel 12063 are illustrated as the output device. The display section 12062 may, for example, include at least one of an on-board display and a head-up display.

FIG. 27G is a diagram depicting an example of the installation position of the imaging section 12031.

In FIG. 27G, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 1022 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 1262 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure may be applied has been described above. The technology according to the present disclosure may be applied to the imaging section 12031 and the like out of the components described above. Applying the technology according to the present disclosure to the imaging section 12031 makes it possible to obtain a captured image that is easier to see. This makes it possible to decrease fatigue of a driver. In addition, it is possible to obtain a captured image that is easier to recognize, which makes it possible to improve the accuracy of driving assistance.

6. Supplement

The preferred embodiments of the present disclosure have been described above with reference to the accompanying drawings, whilst the present disclosure is not limited to the above examples. It is obvious that a person having ordinary skill in the art may find various alterations or modifications within the scope of the technical idea set forth in the appended claims, and it should be understood that these alterations and modifications naturally come under the technical scope of the present disclosure.

For example, the respective configurations of the solid-state imaging device according to the present embodiment described above (for example, the respective configurations of the solid-state imaging devices 1 to 21*k* illustrated in FIG. 1 and FIG. 6A to FIG. 25E) may be combined with one another to a possible extent. A solid-state imaging device configured by thus combining the respective configurations may also be included in the solid-state imaging device according to the present embodiment.

The configuration of each of the solid-state imaging devices according to the present embodiment described above is merely an example of the technology according to the present disclosure. The present disclosure may provide, as another embodiment, a solid-state imaging device having various coupling structures that are not included in the above-described embodiment.

Further, the effects described herein are merely illustrative or exemplary, and are not limitative. That is, the technology according to the present disclosure may achieve, in addition to or in place of the above effects, other effects that are obvious to those skilled in the art from the description of the present specification.

Note that the technical scope of the present disclosure also includes the following configurations.

(1)

A solid-state imaging device including:

a first substrate including a first semiconductor substrate and a first multi-layered wiring layer stacked on the first semiconductor substrate, the first semiconductor substrate having a pixel unit formed thereon, the pixel unit having pixels arranged thereon;

a second substrate including a second semiconductor substrate and a second multi-layered wiring layer stacked on the second semiconductor substrate, the second semiconductor substrate having a circuit formed thereon, the circuit having a predetermined function; and a third substrate including a third semiconductor substrate and a third multi-layered wiring layer stacked on the third semiconductor substrate, the third semiconductor substrate having a circuit formed thereon, the circuit having a predetermined function, the first substrate, the second substrate, and the third substrate being stacked in this order, the first substrate and the second substrate being bonded together in a manner that the first multi-layered wiring layer and the second multi-layered wiring layer are opposed to each other, a first coupling structure including a via, the first coupling structure electrically coupling two of the first substrate, the second substrate, and the third substrate to each other, the via having a structure in which electrically-conductive materials are embedded in one through hole and another through hole, or a structure in which films including electrically-conductive materials are formed on inner walls of the through holes, the one through hole being provided to expose a first wiring line included in one of the first multi-layered wiring layer, the second multi-layered wiring layer, and the third multi-layered wiring layer, the other through hole being provided to expose a second wiring line included in one of multi-layered wiring layers other than the multi-layered wiring layer that includes the first wiring line, out of the first multi-layered wiring layer, the second multi-layered wiring layer, and the third multi-layered wiring layer.

(2)

The solid-state imaging device according to (1), further including a second coupling structure for electrically coupling the second substrate and the third substrate to each other, in which the second coupling structure includes an opening provided by penetrating at least the first substrate from a back surface side of the first substrate to expose a predetermined wiring line in the second multi-layered wiring layer, and an opening provided by penetrating at least the first substrate and the second substrate from the back surface side of the first substrate to expose a predetermined wiring line in the third multi-layered wiring layer.

(3)

The solid-state imaging device according to (2), in which the predetermined wiring line in the second multi-layered wiring layer that is exposed by the opening and the predetermined wiring line in the third multi-layered wiring layer that is exposed by the opening include pads that function as I/O units.

(4)

The solid-state imaging device according to (2), in which pads that function as I/O units exist on a surface on the back surface side of the first substrate, a film including an electrically-conductive material is formed on an inner wall of the opening, and the predetermined wiring line in the second multi-layered wiring layer that is exposed by the opening and the predetermined wiring line in the third multi-layered wiring layer that is exposed by the opening are electrically coupled to the pads by the electrically-conductive material.

(5)

The solid-state imaging device according to (4), in which the predetermined wiring line in the second multi-layered wiring layer and the predetermined wiring line in the third multi-layered wiring layer are electrically coupled to the same pad by the electrically-conductive material.

(6)

The solid-state imaging device according to (4), in which the predetermined wiring line in the second multi-layered wiring layer and the predetermined wiring line in the third multi-layered wiring layer are electrically coupled to the pads by the electrically-conductive material, the pads being different from each other.

(7)

The solid-state imaging device according to any one of (1) to (6), further including the second coupling structure for electrically coupling the second substrate and the third substrate to each other, in which the second substrate and the third substrate are bonded together in a manner that the second semiconductor substrate and the third multi-layered wiring layer are opposed to each other, and the second coupling structure includes a via provided by penetrating at least the second substrate from a front surface side of the second substrate, the via electrically coupling the predetermined wiring line in the second multi-layered wiring layer and the predetermined wiring line in the third multi-layered wiring layer to each other, or a via provided by penetrating at least the third substrate from a back surface side of the third substrate, the via electrically coupling the predetermined wiring line in the second multi-layered wiring layer and the predetermined wiring line in the third multi-layered wiring layer to each other.

(8)

The solid-state imaging device according to (7), in which the via of the second coupling structure has a structure in which electrically-conductive materials are embedded in a first through hole that exposes the predetermined wiring line in the second multi-layered wiring layer and in a second through hole that exposes the predetermined wiring line in the third multi-layered wiring layer and is different from the first through hole, or a structure in which films including electrically-conductive materials are formed on inner walls of the first through hole and the second through hole.

(9)

The solid-state imaging device according to (7), in which the via of the second coupling structure has a structure in which an electrically-conductive material is embedded in one through hole provided to expose a portion of the predetermined wiring line in the second multi-layered wiring layer and to expose the predetermined wiring line in the third multi-layered wiring layer or in one through hole provided to expose a portion of the predetermined wiring line in the third multi-layered wiring layer and to expose the predetermined wiring line in the second multi-layered wiring layer, or a structure in which a film including an electrically-conductive material is formed on an inner wall of the through hole.

(10)

The solid-state imaging device according to any one of (1) to (9), further including a third coupling structure for electrically coupling the first substrate and the third substrate to each other, in which the second substrate and the third substrate are bonded together in a manner that the second semiconductor substrate and the third multi-layered wiring layer are opposed to each other, and the third coupling structure includes a via provided by penetrating at least the first substrate and the second substrate from the back surface side of the first substrate, the via electrically coupling a predetermined wiring line in the first multi-layered wiring layer and the predetermined wiring line in the third multi-layered wiring layer to each other, or a via provided by penetrating at least the third substrate and the second substrate from the back surface side of the third substrate, the via electrically coupling the predetermined wiring line in the first multi-layered wiring layer and the predetermined wiring line in the third multi-layered wiring layer to each other.

(11)

The solid-state imaging device according to (10), in which the via of the third coupling structure has a structure in which electrically-conductive materials are embedded in a first through hole that exposes the predetermined wiring line in the first multi-layered wiring layer and in a second through hole that exposes the predetermined wiring line in the third multi-layered wiring layer and is different from the first through hole, or a structure in which films including electrically-conductive materials are formed on inner walls of the first through hole and the second through hole.

(12)

The solid-state imaging device according to (10), in which the via of the third coupling structure has a structure in which an electrically-conductive material is embedded in one through hole provided to expose a portion of the predetermined wiring line in the first multi-layered wiring layer and to expose the predetermined wiring line in the third multi-layered wiring layer or in one through hole provided to expose a portion of the predetermined wiring line in the third multi-layered wiring layer and to expose the predetermined wiring line in the first multi-layered wiring layer, or a structure in which a film including an electrically-conductive material is formed on an inner wall of the through hole.

(13)

The solid-state imaging device according to any one of (1) to (12), further including a second coupling structure for electrically coupling the second substrate and the third substrate to each other, in which the second coupling structure exists on bonding surfaces of the second substrate and the third substrate, and includes an electrode junction structure in which electrodes formed on the respective bonding surfaces are joined to each other in direct contact with each other.

(14)

The solid-state imaging device according to any one of (1) to (13), in which the second substrate and the third substrate include at least one of a logic circuit or a memory circuit, the logic circuit executing various kinds of signal processing related to an operation of the solid-state imaging device, the memory circuit temporarily holding a pixel signal acquired by each of the pixels of the first substrate.

(15)

An electronic apparatus including a solid-state imaging device that electronically shoots an image of an object to be observed, the solid-state imaging device including a first substrate including a first semiconductor substrate and a first multi-layered wiring layer stacked on the first semiconductor substrate, the first semiconductor substrate having a pixel unit formed thereon, the pixel unit having pixels arranged thereon, a second substrate including a second semiconductor substrate and a second multi-layered wiring layer stacked on the second semiconductor substrate, the second semiconductor substrate having a circuit formed thereon, the circuit having a predetermined function, and a third substrate including a third semiconductor substrate and a third multi-layered wiring layer stacked on the third semiconductor substrate, the third semiconductor substrate having a circuit formed thereon, the circuit having a predetermined function, the first substrate, the second substrate, and the third substrate being stacked in this order, the first substrate and the second substrate being bonded together in a manner that the first multi-layered wiring layer and the second multi-layered wiring layer are opposed to each other, a first coupling structure including a via, the first coupling structure electrically coupling two of the first substrate, the second substrate, and the third substrate to each other, the via having a structure in which electrically-conductive materials are embedded in one through hole and another through hole, or a structure in which films including electrically-conductive materials are formed on inner walls of the through holes, the one through bole being provided to expose a first wiring line included in one of the first multi-layered wiring layer, the second multi-layered wiring layer, and the third multi-layered wiring layer, the other through hole being provided to expose a second wiring line included in one of multi-layered wiring layers other than the multi-layered wiring layer that includes the first wiring line, out of the first multi-layered wiring layer, the second multi-layered wiring layer, and the third multi-layered wiring layer.

REFERENCE NUMERALS LIST

1, 1*a* to 1*c*, 2*a* to 2*e*, 3*a* to 3*k*. 4*a* to 4*g*, 5*a* to 5*k*, 6*a* to 6*g*, 7*a* to 7*f*, 8*a* to 8*l*, 9*a* to 9*h*, 10*a* to 10*k*, 11*a* to 11*g*, 12*a* to 12*g*, 13*a* to 13*j*, 14*a* to 14*f*, 15*a* to 15*k*, 16*a* to 16*g*, 17*a* to 17*m*, 18*a* to 18*m*, 19*a* to 19*k*, 20*a* to 20*m*, 21*a* to 21*k* solid-state imaging device
101, 121, 131 semiconductor substrate
103, 109, 123, 129, 133 insulating film
105, 125, 135 multi-layered wiring layer
110A first substrate
110B second substrate
110C third substrate 111 CF layer
113 ML array
151 pad
153, 153*a*, 153*b*, 153*c* pad opening
155, 155*a*, 155*b*, 155*c* lead line opening
157, 157*a*, 157*b* TSV
159 electrode junction structure
901 smartphone (electronic apparatus)
911 digital camera (electronic apparatus)

What is claimed is:

1. A solid-state imaging device comprising:
a first structure including a first semiconductor substrate and a first multi-layered wiring layer stacked on the first semiconductor substrate, the first semiconductor substrate having a pixel unit, the pixel unit having pixels;
a second structure including a second semiconductor substrate and a second multi-layered wiring layer stacked on the second semiconductor substrate, the second semiconductor substrate having a first circuit; and
a third structure including a third semiconductor substrate and a third multi-layered wiring layer stacked on the third semiconductor substrate, the third semiconductor substrate having a second circuit,
the first structure, the second structure, and the third structure being stacked,
the first substrate and the second substrate being bonded together such that the first multi-layered wiring layer and the second multi-layered wiring layer are opposed to each other,
a first coupling structure including a first via, the first coupling structure electrically coupling the first structure and the second structure to each other,
the first via having a structure in which electrically conductive materials is included in a first through hole and a second through hole, the first through hole being provided to expose a first wiring line included in the first multi-layered wiring layer, the second through hole being provided to expose a second wiring line included in the second multi-layered wiring layer,
a second coupling structure including a second via, the second coupling structure electrically coupling the first structure and the third structure to each other,
the second via having a structure in which electrically conductive material is included in a third through hole and a fourth through hole, the third through hole being provided to expose a third wiring line included in the first multi-layered wiring layer, the fourth through hole being provided to expose a fourth wiring line included in the third multi-layered wiring layer.

2. The solid-state imaging device according to claim 1, further comprising:
a third coupling structure for electrically coupling the second structure and the third structure to each other, wherein the third coupling structure includes a first opening provided by penetrating at least the first structure from a back surface side of the first structure to expose a fifth wiring line in the second multi-layered wiring layer, and a second opening provided by penetrating at least the first structure and the second structure from the back surface side of the first structure to expose a sixth wiring line in the third multi-layered wiring layer.

3. The solid-state imaging device according to claim 2, wherein the fifth wiring line in the second multi-layered wiring layer that is exposed by the first opening and the sixth wiring line in the third multi-layered wiring layer that is exposed by the second opening comprise pads that function as I/O units.

4. The solid-state imaging device according to claim 2, wherein
pads that function as I/O units exist on a surface on the back surface side of the first structure,
an electrically conductive material formed in the first and second openings, and
the fifth wiring line in the second multi-layered wiring layer that is exposed by the first opening and the sixth wiring line in the third multi-layered wiring layer that is exposed by the second opening are electrically coupled to the pads by the electrically conductive material in the first and second openings.

5. The solid-state imaging device according to claim 4, wherein the fifth wiring line in the second multi-layered wiring layer and the sixth wiring line in the third multi-layered wiring layer are electrically coupled to the same pad by the electrically conductive material in the first and second openings.

6. The solid-state imaging device according to claim 4, wherein the fifth wiring line in the second multi-layered wiring layer and the sixth wiring line in the third multi-layered wiring layer are electrically coupled to the pads by the electrically conductive material in the first and second openings, the pads being different from each other.

7. The solid-state imaging device according to claim 1, further comprising:
a third coupling structure for electrically coupling the second structure and the third structure to each other, wherein
the second structure and the third structure are bonded together in a manner that the second semiconductor substrate and the third multi-layered wiring layer are opposed to each other, and
the third coupling structure includes a third via provided by penetrating at least the second structure from a front surface side of the second structure, the third via electrically coupling a predetermined fifth wiring line in the second multi-layered wiring layer and a predetermined sixth wiring line in the third multi-layered wiring layer to each other, or a fourth via provided by penetrating at least the third structure from a back surface side of the third structure, the fourth via electrically coupling the predetermined fifth wiring line in the second multi-layered wiring layer and the sixth wiring line in the third multi-layered wiring layer to each other.

8. The solid-state imaging device according to claim 7, wherein the third via has a structure in which electrically conductive material is included in a fifth through hole that exposes the fifth wiring line in the second multi-layered wiring layer and in a sixth through hole that exposes the sixth wiring line in the third multi-layered wiring layer and is different from the fifth through hole.

9. The solid-state imaging device according to claim 7, wherein the third via has a structure in which an electrically conductive material is included in the fifth through hole provided to expose a portion of the fifth wiring line in the second multi-layered wiring layer and to expose the sixth wiring line in the third multi-layered wiring layer.

10. The solid-state imaging device according to claim 1, wherein the second structure and the third structure are bonded together in a manner that the second semiconductor substrate and the third multi-layered wiring layer are opposed to each other.

11. The solid-state imaging device according to claim 1, further comprising a third coupling structure for electrically coupling the second structure and the third structure to each other, wherein the third coupling structure exists on bonding surfaces of the second structure and the third structure, and includes an electrode junction structure in which electrodes formed on the respective bonding surfaces are joined to each other in direct contact with each other.

12. The solid-state imaging device according to claim 1, wherein the second structure and the third structure include at least one of a logic circuit or a memory circuit, the logic circuit executing various kinds of signal processing related to an operation of the solid-state imaging device, the memory circuit temporarily holding a pixel signal acquired by each of the pixels of the first structure.

13. An electronic apparatus comprising:

a solid-state imaging device that electronically shoots an image of an object to be observed, the solid-state imaging device including:

a first structure including a first semiconductor substrate and a first multi-layered wiring layer stacked on the first semiconductor substrate, the first semiconductor substrate having a pixel unit formed thereon, the pixel unit having pixels arranged thereon;

a second structure including a second semiconductor substrate and a second multi-layered wiring layer stacked on the second semiconductor substrate, the second semiconductor substrate having a first circuit; and a third structure including a third semiconductor substrate and a third multi-layered wiring layer stacked on the third semiconductor substrate, the third semiconductor substrate having a second circuit, the first structure, the second structure, and the third structure being stacked in this order, the first structure and the second structure being bonded together such that the first multi-layered wiring layer and the second multi-layered wiring layer are opposed to each other, a first coupling structure including a first via, the first coupling structure electrically coupling the first structure and the second structure to each other, the first via having a structure in which electrically conductive material is included in a first through hole and a second through hole, the first through hole being provided to expose a first wiring line included in the first multi-layered wiring layer, the second through hole being provided to expose a second wiring line included in the second multi-layered wiring layer, a second coupling structure including a second via, the second coupling structure electrically coupling the first structure and the third structure to each other, the second via having a structure in which electrically conductive material is included in a third through hole and a fourth through hole, the third through hole being provided to expose a third wiring line included in the first multi-layered wiring layer, the fourth through hole being provided to expose a fourth wiring line included in the third multi-layered wiring layer.

* * * * *